US010439759B2

(12) United States Patent
Chen et al.

(10) Patent No.: US 10,439,759 B2
(45) Date of Patent: Oct. 8, 2019

(54) COMMUNICATION METHOD AND APPARATUS

(71) Applicant: HUAWEI TECHNOLOGIES CO., LTD., Shenzhen, Guangdong (CN)

(72) Inventors: Ying Chen, Hangzhou (CN); Gongzheng Zhang, Hangzhou (CN); Lingchen Huang, Hangzhou (CN); Rong Li, Hangzhou (CN); Huazi Zhang, Hangzhou (CN); Hejia Luo, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/239,910

(22) Filed: Jan. 4, 2019

(65) Prior Publication Data

US 2019/0207709 A1 Jul. 4, 2019

Related U.S. Application Data

(63) Continuation of application No. PCT/CN2018/080393, filed on Mar. 24, 2018.

(30) Foreign Application Priority Data

Mar. 24, 2017 (CN) .......................... 2017 1 0184322
May 24, 2017 (CN) .......................... 2017 1 0374785

(51) Int. Cl.
*H04L 1/00* (2006.01)

(52) U.S. Cl.
CPC .......... *H04L 1/0057* (2013.01); *H04L 1/0013* (2013.01); *H04L 1/0041* (2013.01); *H04L 1/0061* (2013.01)

(58) Field of Classification Search
CPC ..... H04L 1/009; H04L 1/0041; H04L 1/0057; H04L 1/0061; H04L 1/0013;
(Continued)

(56) References Cited

U.S. PATENT DOCUMENTS

2014/0208183 A1 7/2014 Mahdavifar et al.
2016/0079999 A1 3/2016 Shen et al.
(Continued)

FOREIGN PATENT DOCUMENTS

CN 101599934 A 12/2009
CN 102164025 A 8/2011
(Continued)

OTHER PUBLICATIONS

El-Khanny et al., Relaxed Polar codes, Jan. 2017, IEEE, trans. on info. theory, pp. 1 to 15.*
(Continued)

*Primary Examiner* — Shelly A Chase
(74) *Attorney, Agent, or Firm* — Fish & Richardson P.C.

(57) ABSTRACT

Embodiments of this application provides a communication method in a wireless communication network. A communication device obtains an information bit sequence and obtain a first sequence, wherein the first sequence comprises sequence numbers of N channels ordered in ascending order of channel reliability, wherein N is 1024 and wherein a channel whose sequence number is 0, a channel whose sequence number is 1, and a channel whose sequence number is 2 are ordered in ascending order of channel reliability; then polar encode the information bits based on the first sequence to obtain an encoded bit sequence and output the encoded bit sequence.

16 Claims, 3 Drawing Sheets

(58) Field of Classification Search
CPC .... H04L 1/0064; H04L 1/0009; H03M 13/13; H03M 13/31; H03M 13/2927; H03M 13/3746; H03M 13/2906
See application file for complete search history.

(56) References Cited

U.S. PATENT DOCUMENTS

| | | | | |
|---|---|---|---|---|
| 2016/0241355 | A1* | 8/2016 | Mahdavifar | H04L 1/009 |
| 2016/0285479 | A1 | 9/2016 | El-Khamy et al. | |
| 2017/0077954 | A1* | 3/2017 | Shen | H03M 13/13 |
| 2018/0351579 | A1* | 12/2018 | Hong | H03M 13/13 |

FOREIGN PATENT DOCUMENTS

| | | | |
|---|---|---|---|
| CN | 103023618 | A | 4/2013 |
| CN | 103024369 | A | 4/2013 |
| CN | 103986932 | A | 8/2014 |
| CN | 104219019 | A | 12/2014 |
| CN | 104918063 | A | 9/2015 |
| CN | 105611543 | A | 5/2016 |
| CN | 105680882 | A | 6/2016 |
| CN | 105743621 | A | 7/2016 |
| CN | 105811998 | A | 7/2016 |
| CN | 106027068 | A | 10/2016 |
| CN | 106506079 | A | 3/2017 |

OTHER PUBLICATIONS

Li, Guiping, Channel polarization and research development of polar codes, Dec. 2014, International Journal of Innovative Computing, Inforation and Control, vol. 10, No. 6, pp. 2051 to 2065.*

Chao et al., Deep learning in encoding and decoding of polar codes, 2018, IOP publishing, Journal of Physics: Conference Series, pp. 1 to 7.*

R1-1608862 Huawei, HiSilicon,"Polar Code Construction for NR",3GPP TSG RAN WG1 Meeting #86bis,Lisbon, Portugal, Oct. 10-14, 2016,total 8 pages.

Chinese Office Action issued in Chinese Application No. 201810348244 dated Feb. 20, 2019, 8 pages.

International Search Report and Written Opinion issued in International Application No. PCT/CN2018/080393 dated Jun. 13, 2018, 13 pages.

Notification to Grant Patent issued in Chinese Application No. 201810348244.7 dated Apr. 26, 2019, 6 pages.

* cited by examiner

COMMUNICATION METHOD AND APPARATUS

CROSS-REFERENCE TO RELATED APPLICATIONS

This application is a continuation of International Application No. PCT/CN PCT/CN2018/080393, filed on Mar. 24, 2018, which claims priority to Chinese Patent Application No. 201710374785.2, filed on May 24, 2017 and Chinese Patent Application No. 201710184322.X, filed on Mar. 24, 2017. The disclosures of the aforementioned patent applications are hereby incorporated by reference in their entireties.

TECHNICAL FIELD

Embodiments of the application relate to the communications field, and more specifically, to a communication method and apparatus.

BACKGROUND

Polar codes are a new type of channel coding proposed by Professor Arikan of Turkey in 2008. The polar code is designed based on channel polarization, and is the first constructive coding scheme that can be proved through a strict mathematical method to achieve a channel capacity. The polar code is a linear block code. Its generator matrix is $F_N$, and its encoding process is $x_1^N=u_1^N F_N$, where $u_1^N=(u_1, u_2, \ldots, u_N)$ is a binary row vector with a length of N (N is called a mother code length), $F_N$ is an N×N matrix, and $F_N=F_2^{\otimes(\log_2(N))}$, where $$F_2 = \begin{bmatrix} 1 & 0 \\ 1 & 1 \end{bmatrix},$$

and $F_2^{\otimes(\log_2(N))}$ is defined as a Kronecker product of $\log_2 N$ matrices $F_2$.

In the encoding process of the polar code, some bits in $u_1^N$ are used to carry information, and are referred to as information bits, and an index set of these bits is denoted as I; and the other bits are set to fixed values that are pre-agreed on by a receive end and a transmit end, and are referred to as frozen bits, and an index set of the frozen bits is represented by $I^c$, a complement of I. The information bit index set I is selected by using the following method: obtaining, by using a polar code construction algorithm, a channel error probability $P_e^{(i)}$ or a channel capacity estimation $C^{(i)}$ corresponding to a bit with a sequence number i, and selecting K sequence numbers with smallest $P_e^{(i)}$ values or largest $C^{(i)}$ values, to construct the set I.

The channel error probability $P_e^{(i)}$ or the channel capacity estimation $C^{(i)}$ is related to channel reliability. Usually, the channel reliability may be calculated by using formula (1):

$$W_1^{2^i} = \left[W_1^{2^{i-1}}, W_{2^{i-1}+1}^{2^i}\right], W_1^2 = [01] \quad (1)$$

where $W_{2^{i-1}+1}^{2^i}=W_1^{2^{i-1}}+\beta_i$, $\beta_i=(2^{i-1})^{1/4}$, $W_1^{2^i}$ is channel reliability of a channel sequence number 1-to-$2^i$, and i is a channel sequence number.

In addition, the channel reliability may alternatively be calculated by using formula (2):

$$W_i = \sum_{j=0}^{n-1} B_j * 2^{j*\frac{1}{4}} \quad (2)$$

where $i \triangleq B_{n-1}B_{n-2} \ldots B_0$, $B_j \in \{0,1\}$, $j \in \{0,1, \ldots n-1\}$, and $B_{n-1}B_{n-2} \ldots B_0$ is a binary representation of i.

After the channel reliability is calculated in the foregoing manner, an obtained channel sequence is fixed, and therefore a determined position set of information bits is relatively monotonous.

SUMMARY

Embodiments of this application provides an encoding method and apparatus, a decoding method and apparatus, and a device, to resolve a technical problem that a determined position set of information bits is relatively monotonous.

According to a first aspect, embodiments of this application provides an encoding method, including:

obtaining, by a transmit device, a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted;

determining, by the transmit device, a position set based on the target construction sequence, where the position set is used to indicate positions of an information bit sequence on the channels;

encoding, by the transmit device, a to-be-encoded information bit sequence based on the position set, to obtain an encoded bit sequence; and sending, by the transmit device, the encoded bit sequence to a receive device.

In this solution, the transmit device, that is, an encoder, may be a network device or may be a terminal, and accordingly, the receive device, that is, a decoder, may be a terminal or may be a network device. This solution may be used for information exchange between a terminal and a network device, or may be applied to information exchange between terminals, and this is not limited in this solution.

In addition, embodiments of this application further provide a construction sequence used for determining coding positions of information bits. The construction sequence includes a sorted sequence and/or a quantized sequence, the sorted sequence is a sequence obtained after sequence numbers of channels are sorted based on channel reliability, and the quantized sequence is obtained after results of channel reliability normalization are sorted.

Different mother code lengths correspond to different sorted sequences and/or quantized sequences.

In an encoding process, the transmit device obtains the target construction sequence, and determines the position set based on the target construction sequence, to encode the information bit sequence, so that a position set of information bits can be determined more flexibly.

In a specific implementation, the target construction sequence is a construction sequence obtained from a plurality of construction sequences.

In this solution, when there are a plurality of construction sequences, the transmit device obtains one of the plurality of construction sequences as the target construction sequence. The receive device obtains the target construction sequence from the plurality of construction sequences in a same manner. The transmit device and the receive device may agree on one or more target construction sequences based on related parameters such as a code length and a code rate.

In a specific implementation, the plurality of construction sequences are sequences determined based on reliability of a plurality of channels that is calculated based on a mother code length and a preset coding parameter.

In a specific implementation, the reliability is calculated based on a formula $$W_i = \sum_{j=0}^{n-1} \beta_j * \beta^j,$$

where $W_i$ is reliability of an $i^{th}$ channel, $j \in \{0,1, \ldots n-1\}$, $n=\log_2 N$, N is the mother code length, $B_j \in \{0,1\}$, β is a constant, and a value range of β is 1 to 1.62.

In this solution, the value range of β may be 1 to 1.62. Optionally, when the value range of β is within 1.16 to 1.21, calculated channel reliability is relatively accurate. In a possible implementation, when a value of β is selected from 1.1870 to 1.2000 in steps of 0.0001, calculated channel reliability is even more accurate.

In a specific implementation, the position set is P channels with highest reliability that are selected from the sorted sequence, and P is greater than or equal to a bit quantity of the information bits.

In this solution, after reliability of each channel is calculated, the channels may be sorted based on the reliability of the channels, for example, the channels are sorted in descending order of the reliability, or the channels are sorted in ascending order of the reliability, and the P channels with the highest reliability are selected as positions of the information bits.

In a specific implementation, the position set is L channels with highest reliability that are selected from the quantized sequence, and L is greater than or equal to a bit quantity of the information bits.

In this solution, after reliability of each channel is calculated, the reliability of the channels is normalized. It is defined that the normalized quantized sequence is obtained by quantizing the reliability from 1 or 0 with precision of 1, and the L channels with the highest reliability are selected from the processed sequence as positions of the information bits.

In a specific implementation, if the mother code length is 64, the sorted sequence is: $Q1_1^{64}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

In a specific implementation, if the mother code length is 64, the sorted sequence is: $Q2_1^{64}$=[1, 2, 3, 5, 9, 17, 33, 4, 6, 7, 10, 11, 18, 13, 19, 34, 21, 35, 25, 37, 8, 41, 12, 49, 14, 20, 15, 22, 36, 23, 26, 38, 27, 39, 42, 29, 43, 50, 45, 51, 16, 53, 24, 57, 28, 40, 30, 44, 31, 46, 52, 47, 54, 55, 58, 59, 61, 32, 48, 56, 60, 62, 63, 64].

In a specific implementation, if the mother code length is 64, the sorted sequence is: $Q3_1^{64}$=[1, 2, 3, 5, 9, 17, 4, 33, 6, 7, 10, 11, 18, 13, 19, 34, 21, 35, 25, 8, 37, 12, 41, 14, 20, 49, 15, 22, 36, 23, 26, 38, 27, 39, 42, 29, 43, 50, 16, 45, 51, 24, 53, 28, 57, 40, 30, 44, 31, 46, 52, 47, 54, 55, 58, 59, 32, 61, 48, 56, 60, 62, 63, 64].

In a specific implementation, if the mother code length is 64, the sorted sequence is: $Q4_1^{64}$=[1, 2, 3, 5, 9, 17, 4, 6, 33, 7, 10, 11, 18, 13, 19, 34, 21, 8, 35, 25, 37, 12, 14, 41, 20, 15, 22, 49, 36, 23, 26, 38, 27, 39, 42, 29, 16, 43, 50, 45, 24, 51, 53, 28, 40, 30, 57, 44, 31, 46, 52, 47, 54, 55, 58, 32, 59, 61, 48, 56, 60, 62, 63, 64].

In a specific implementation, if the mother code length is 64, the sorted sequence is: $Q5_1^{64}$=[1, 2, 3, 5, 9, 17, 4, 6, 33, 7, 10, 11, 18, 13, 19, 34, 21, 8, 35, 25, 12, 37, 14, 41, 20, 15, 22, 49, 36, 23, 26, 38, 27, 39, 42, 29, 16, 43, 50, 45, 24, 51, 28, 53, 40, 30, 57, 44, 31, 46, 52, 47, 54, 55, 58, 32, 59, 61, 48, 56, 60, 62, 63, 64].

In a specific implementation, if the mother code length is 64, the sorted sequence is: $Q6_1^{64}$=[1, 2, 3, 5, 9, 17, 4, 6, 33, 7, 10, 11, 18, 13, 19, 34, 21, 8, 35, 25, 12, 37, 14, 20, 41, 15, 22, 49, 36, 23, 26, 38, 27, 39, 42, 29, 16, 43, 50, 24, 45, 51, 28, 53, 40, 30, 57, 44, 31, 46, 52, 47, 54, 55, 58, 32, 59, 61, 48, 56, 60, 62, 63, 64].

In a specific implementation, if the mother code length is 64, the quantized sequence is: $Z1_1^{64}$=[1, 2, 3, 7, 4, 9, 10, 19, 5, 11, 12, 22, 14, 24, 26, 38, 6, 13, 15, 25, 17, 28, 30, 42, 20, 31, 33, 44, 36, 47, 49, 57, 8, 16, 18, 29, 21, 32, 34, 45, 23, 35, 37, 48, 40, 50, 52, 59, 27, 39, 41, 51, 43, 53, 54, 60, 46, 55, 56, 61, 58, 62, 63, 64].

In a specific implementation, if the mother code length is 64, the quantized sequence is: $Z2_1^{64}$=[1, 2, 3, 8, 4, 9, 10, 21, 5, 11, 12, 23, 14, 24, 27, 40, 6, 13, 15, 26, 17, 28, 30, 43, 19, 31, 33, 45, 36, 47, 49, 58, 7, 16, 18, 29, 20, 32, 34, 46, 22, 35, 37, 48, 39, 50, 52, 59, 25, 38, 41, 51, 42, 53, 54, 60, 44, 55, 56, 61, 57, 62, 63, 64].

In a specific implementation, if the mother code length is 64, the quantized sequence is: $Z3_1^{64}$=[1, 2, 3, 7, 4, 9, 10, 20, 5, 11, 12, 22, 14, 24, 27, 39, 6, 13, 15, 25, 17, 28, 30, 42, 19, 31, 33, 44, 36, 47, 49, 57, 8, 16, 18, 29, 21, 32, 34, 46, 23, 35, 37, 48, 40, 50, 52, 59, 26, 38, 41, 51, 43, 53, 54, 60, 45, 55, 56, 61, 58, 62, 63, 64].

In a specific implementation, if the mother code length is 64, the quantized sequence is: $Z4_1^{64}$=[1, 2, 3, 7, 4, 8, 10, 18, 5, 11, 12, 22, 14, 23, 26, 37, 6, 13, 15, 25, 17, 27, 30, 41, 20, 31, 33, 44, 36, 46, 49, 56, 9, 16, 19, 29, 21, 32, 34, 45, 24, 35, 38, 48, 40, 50, 52, 59, 28, 39, 42, 51, 43, 53, 54, 60, 47, 55, 57, 61, 58, 62, 63, 64].

In a specific implementation, if the mother code length is 64, the quantized sequence is: $Z5_1^{64}$=[1, 2, 3, 7, 4, 8, 10, 18, 5, 11, 12, 21, 14, 23, 26, 37, 6, 13, 15, 25, 17, 27, 30, 41, 20, 31, 33, 43, 36, 46, 49, 56, 9, 16, 19, 29, 22, 32, 34, 45, 24, 35, 38, 48, 40, 50, 52, 59, 28, 39, 42, 51, 44, 53, 54, 60, 47, 55, 57, 61, 58, 62, 63, 64].

In a specific implementation, if the mother code length is 64, the quantized sequence is: $Z6_1^{64}$=[1, 2, 3, 7, 4, 8, 10, 18, 5, 11, 12, 21, 14, 23, 26, 37, 6, 13, 15, 24, 17, 27, 30, 40, 20, 31, 33, 43, 36, 46, 49, 56, 9, 16, 19, 29, 22, 32, 34, 45, 25, 35, 38, 48, 41, 50, 52, 59, 28, 39, 42, 51, 44, 53, 54, 60, 47, 55, 57, 61, 58, 62, 63, 64].

In the foregoing solutions, sequences are described by using decimal examples, and certainly, the sequences may be represented in a binary, octal, or hexadecimal form.

In a specific implementation, if the mother code length is 1024 and there are 1024 channels, a channel whose sequence number is 0, a channel whose sequence number is 1, and a channel whose sequence number is 2 are ordered in ascending order of channel reliability, with the first channel in the sorted sequence corresponding to the smallest reliability value.

In a specific implementation, some of the 1024 channels further comply with one or more of the following rules:

a channel whose sequence number is 4 in the sorted sequence is the fourth one of channel reliability in ascending order; or a channel whose sequence number is 9 in the sorted sequence is the eleventh one in the of channel reliability in ascending order; or a channel whose sequence number is 1005 in the sorted sequence is the sixteenth one of channel reliability of channel reliability in descending order; or a channel whose sequence number is 1014 in the sorted sequence is the eleventh one of channel reliability in descending order; or a channel whose sequence number is 1015 in the sorted sequence is the fifth one of channel reliability in descending order; or a channel whose sequence number is 1019 in the sorted sequence is the fourth one of channel reliability in descending order; or a channel whose sequence number is 1021 in the sorted sequence is the third one of channel reliability in descending order; or a channel whose sequence number is 1022 in the sorted sequence in the sorted sequence is the second one of channel reliability in descending order; or a channel whose sequence number is 1023 is the first one of channel reliability in descending order.

In the foregoing solutions, the channels are numbed from 0. In actual application, the channels may be numbered from 1. Certainly, the channels may also be numbered from another number.

According to a second aspect, embodiments of this application provides a decoding method, including:

obtaining, by a receive device, a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted;

determining, by the receive device, a position set based on the target construction sequence, where the position set is used to indicate positions of an information bit sequence on the channels;

receiving, by the receive device, an encoded bit sequence; and decoding, by the receive device, the encoded bit sequence based on the position set, to obtain an information bit sequence.

Corresponding to an encoder, the receive device may be a network device or may be a terminal.

In a decoding process, the receive device receives the target construction sequence, and determines the position set based on the target construction sequence, to decode the encoded information bit sequence.

In a specific implementation, the target construction sequence is a construction sequence obtained from a plurality of construction sequences.

In this solution, when there are a plurality of construction sequences, a transmit device obtains one of the plurality of construction sequences as the target construction sequence. The receive device obtains the target construction sequence from the plurality of construction sequences in a same manner. The transmit device and the receive device may agree on one or more target construction sequences based on related parameters such as a code length and a code rate.

In a specific implementation, the plurality of construction sequences are sequences determined based on reliability of a plurality of channels that is calculated based on a mother code length and a preset coding parameter.

In a specific implementation, the reliability is calculated based on a formula $$W_i = \sum_{j=0}^{n-1} \beta_j * \beta^j,$$

where $W_i$ is reliability of an $i^{th}$ channel, $j \in \{0,1, \ldots, n-1\}$, $n=\log_2 N$, N is the mother code length, $B_j \in \{0,1\}$, β is a constant, and a value range of β is 1 to 1.62.

In this solution, the value range of β may be 1 to 1.62. Optionally, when the value range of β is within 1.16 to 1.21, calculated channel reliability is relatively accurate. In a possible implementation, when a value of β is selected from 1.1870 to 1.2000 in steps of 0.0001, calculated channel reliability is even more accurate.

In a specific implementation, the position set is P channels with highest reliability that are selected from the sorted sequence, and P is greater than or equal to a bit quantity of the information bits.

In this solution, after reliability of each channel is calculated, the channels may be sorted based on the reliability of the channels, for example, the channels are sorted in descending order of the reliability, or the channels are sorted in ascending order of the reliability, and the P channels with the highest reliability are selected as positions of the information bits.

In a specific implementation, the position set is L channels with highest reliability that are selected from the quantized sequence, and L is greater than or equal to a bit quantity of the information bits.

In this solution, after reliability of each channel is calculated, the reliability of the channels is normalized, it is defined that the normalized quantized sequence is obtained by quantizing the reliability from 1 or 0 with precision of 1, and the L channels with the highest reliability are selected from a processed sequence as positions of the information bits.

In a specific implementation, if the mother code length is 64, the sorted sequence is any one of $Q1_1^{64}$, $Q2_1^{64}$, $Q3_1^{64}$, $Q4_1^{64}$, $Q5_1^{64}$, and $Q6_1^{64}$, and for a specific form of the sorted sequence, refer to the description in the foregoing implementation.

In a specific implementation, if the mother code length is 64, the quantized sequence is any one of $Z1_1^{64}$, $Z2_1^{64}$, $Z3_1^{64}$, $Z4_1^{64}$, $Z5_1^{64}$, and $Z6_1^{64}$, and for a specific form of the quantized sequence, refer to the description in the foregoing implementation.

In the foregoing solutions, sequences are described by using decimal examples, and certainly, the sequences may be represented in a binary, octal, or hexadecimal form.

In a specific implementation, if the mother code length is 1024 and there are 1024 channels, a channel whose sequence number is 0, a channel whose sequence number is 1, and a channel whose sequence number is 2 are arranged are ordered in ascending order of channel reliability, a channel whose sequence number is 0 has the smallest channel reliability.

In a specific implementation, some of the 1024 channels further comply with one or more of the following rules:

a channel whose sequence number is 4 in the sorted sequence is the fourth one of channel reliability in ascending order; or a channel whose sequence number is 9 in the sorted sequence is the eleventh one of channel reliability in ascending order; or a channel whose sequence number is 1005 in the sorted sequence is the sixteenth one of channel reliability in descending order; or a channel whose sequence number is 1014 in the sorted sequence is the eleventh one of channel reliability in descending order; or a channel whose sequence number is 1015 in the sorted sequence is the fifth one of channel reliability in descending order; or a channel whose sequence number is 1019 in the sorted sequence is the fourth one of channel reliability in descending order; or a channel whose sequence number is 1021 in the sorted sequence is the third one of channel reliability in descending order; or a channel whose sequence number is 1022 in the sorted sequence is the second one of channel reliability in descending order; or a channel whose sequence number is 1023 in the sorted sequence is the first one of channel reliability in descending order.

According to a third aspect, embodiments of this application provides an encoding apparatus, including:

a processing module, configured to obtain a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted; where the processing module is further configured to determine a position set based on the target construction sequence, where the position set is used to indicate positions of an information bit sequence on the channels; and the processing module is further configured to encode a the information bit sequence based on the position set, to obtain an encoded bit sequence; and the sending module, configured to send the encoded bit sequence to a receive device.

In a specific implementation, the target construction sequence is a construction sequence obtained from a plurality of construction sequences.

In a specific implementation, the plurality of construction sequences are sequences determined based on reliability of a plurality of channels that is calculated based on a mother code length and a preset coding parameter.

In a specific implementation, the channel reliability is calculated based on a formula $$W_i = \sum_{j=0}^{n-1} \beta_j * \beta^j,$$

where $W_i$ is reliability of an $i^{th}$ channel, $j \in \{0, 1, \ldots n-1\}$, $n = \log_2 N$, N is the mother code length, $B_j \in \{0,1\}$, β is a constant, and a value range of β is 1 to 1.62.

In a specific implementation, the position set is P channels with highest reliability that are selected from the sorted sequence, and P is greater than or equal to a bit quantity of the information bits.

In a specific implementation, the position set is L channels with highest reliability that are selected from the quantized sequence, and L is greater than or equal to a bit quantity of the information bits.

In a specific implementation, if the mother code length is 64, the sorted sequence is any one of $Q1_1^{64}$, $Q2_1^{64}$, $Q3_1^{64}$, $Q4_1^{64}$, $Q5_1^{64}$, and $Q6_1^{64}$, and for a specific form of the sorted sequence, refer to the description in the foregoing method embodiment.

In a specific implementation, if the mother code length is 64, the quantized sequence is any one of $Z1_1^{64}$, $Z2_1^{64}$, $Z3_1^{64}$, $Z4_1^{64}$, $Z5_1^{64}$, and $Z6_1^{64}$, and for a specific form of the quantized sequence, refer to the description in the foregoing implementation.

In a specific implementation, if the mother code length is 1024 and there are 1024 channels, a channel whose sequence number is 0, a channel whose sequence number is 1, and a channel whose sequence number is 2 are ordered in ascending order, with the channel whose sequence number is 0 has the smallest channel reliability.

Some of the 1024 channels further comply with one or more of the following rules:

a channel whose sequence number is 4 in the sorted sequence is the fourth one of the channel reliability in ascending order; or a channel whose sequence number is 9 in the sorted sequence is the eleventh one of the channel reliability in ascending order; or a channel whose sequence number is 1005 in the sorted sequence is the sixteenth one of the channel reliability in descending order; or a channel whose sequence number is 1014 in the sorted sequence is the eleventh one of the channel reliability in descending order; or a channel whose sequence number is 1015 in the sorted sequence is the fifth one of the channel reliability in descending order; or a channel whose sequence number is 1019 in the sorted sequence is the fourth one of the channel reliability in descending order; or a channel whose sequence number is 1021 in the sorted sequence is the third one of the channel reliability in descending order; or a channel whose sequence number is 1022 in the sorted sequence is the second one of the channel reliability in descending order; or a channel whose sequence number is 1023 in the sorted sequence is the first one of the channel reliability in descending order.

According to a fourth aspect, embodiments of this application provides a decoding apparatus, including:

a processing module, configured to obtain a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted; where the processing module is further configured to determine a position set based on the target construction sequence, where the position set is used to indicate positions of an information bit sequence on the channels; and a receiving module, configured to receive an encoded bit sequence; where the processing module is further configured to decode the encoded bit sequence based on the position set, to obtain an information bit sequence.

In a specific implementation, the target construction sequence is a construction sequence obtained from a plurality of construction sequences.

In a specific implementation, the plurality of construction sequences are sequences determined based on reliability of a plurality of channels that is calculated based on a mother code length and a preset coding parameter.

In a specific implementation, the reliability is calculated based on a formula $$W_i = \sum_{j=0}^{n-1} B_j * \beta^j,$$

where $W_i$ is reliability of an $i^{th}$ channel, $j \in \{0,1, \ldots, n-1\}$, $n=\log_2 N$, N is the mother code length, $B_j \in \{0,1\}$, β is a constant, and a value range of β is 1 to 1.62.

In a specific implementation, the position set is P channels with highest reliability that are selected from the sorted sequence, and P is greater than or equal to a bit quantity of the information bits.

In a specific implementation, the position set is L channels with highest reliability that are selected from the quantized sequence, and L is greater than or equal to a bit quantity of the information bits.

In a specific implementation, if the mother code length is 64, the sorted sequence is any one of $Q1_1^{64}$, $Q2_1^{64}$, $Q3_1^{64}$, $Q4_1^{64}$, $Q5_1^{64}$, and $Q6_1^{64}$, and for a specific form of the sorted sequence, refer to the description in the foregoing implementation.

The numbers 1, 2, 3, 4, 5, and 6 after the letter "Q" are merely used to indicate different sequences, and have no specific meanings.

In a specific implementation, if the mother code length is 64, the quantized sequence is any one of $Z1_1^{64}$, $Z2_1^{64}$, $Z3_1^{64}$, $Z4_1^{64}$, $Z5_1^{64}$, and $Z6_1^{64}$, and for a specific form of the quantized sequence, refer to the description in the foregoing implementation.

The numbers 1, 2, 3, 4, 5, and 6 after the letter "Z" are merely used to indicate different sequences, and have no specific meanings.

In a specific implementation, if the mother code length is 1024 and there are 1024 channels, a channel whose sequence number is 0, a channel whose sequence number is 1, and a channel whose sequence number is 2 are ordered in ascending order of channel reliability, with the first channel in the sorted sequence corresponding to the smallest reliability value.

Optionally, some of the 1024 channels further comply with one or more of the following rules:

a channel whose sequence number is 4 in the sorted sequence is the fourth one of channel reliability in ascending order; or a channel whose sequence number is 9 in the sorted sequence is the eleventh one of channel reliability in ascending order; or a channel whose sequence number is 1005 in the sorted sequence is the sixteenth one of channel reliability in descending order; or a channel whose sequence number is 1014 in the sorted sequence is the eleventh one of channel reliability in descending order; or a channel whose sequence number is 1015 in the sorted sequence is the fifth one of channel reliability in descending order; or a channel whose sequence number is 1019 in the sorted sequence is the fourth one of channel reliability in descending order; or a channel whose sequence number is 1021 in the sorted sequence is the third one in descending order; or a channel whose sequence number is 1022 in the sorted sequence is the second one of channel reliability in descending order; or a channel whose sequence number is 1023 in the sorted sequence is the first one in of channel reliability in descending order.

When the mother code length is less than 1024, the sorted sequence or the quantized sequence may be a subset of the foregoing sorted sequence or quantized sequence whose mother code length is 1024. For example, the subset may be selected sequentially or not sequentially from the sorted sequence or quantized sequence whose mother code length is 1024.

It should be understood that during implementation of the foregoing encoding apparatus or decoding apparatus, the processing module may be specifically implemented as a processor, the sending module may be implemented as a transmitter, and the receiving module may be implemented as a receiver.

According to a fifth aspect, embodiments of this application provides a transmit device, including a memory, a processor, a transmitter, and a computer program, where the computer program is stored in the memory, and the processor runs the computer program to perform the encoding method according to the first aspect or the implementations of the first aspect.

During specific implementation of the transmit device, there is at least one processor, configured to execute an executable instruction, that is, the computer program, stored in the memory. Therefore, the transmit device performs, through data exchange between a communications interface and a receive device, the encoding method provided in the first aspect or implementations of the first aspect, and optionally, the memory may be further integrated in the processor.

According to a sixth aspect, embodiments of this application provides a receive device, including a memory, a processor, a receiver, and a computer program, where the computer program is stored in the memory, and the processor runs the computer program to perform the decoding method according to the second aspect or the implementations of the second aspect.

During specific implementation of the receive device, there is at least one processor, configured to execute an executable instruction, that is, the computer program, stored in the memory. Therefore, the receive device performs, through data exchange between a communications interface and a transmit device, the decoding method provided in the second aspect or implementations of the second aspect, and optionally, the memory may be further integrated in the processor.

According to a seventh aspect, embodiments of this application provides a storage medium, including a readable storage medium and a computer program, where the computer program is configured to implement the encoding method provided in any implementation of the first aspect.

According to an eighth aspect, embodiments of this application provides a storage medium, including a readable storage medium and a computer program, where the computer program is configured to implement the decoding method provided in any implementation of the second aspect.

According to a ninth aspect, embodiments of this application provides a program product, where the program product includes a computer program (that is, an executable instruction), and the computer program is stored in a readable storage medium. At least one processor of a transmit device may read the computer program from the readable storage medium, and the at least one processor executes the computer program, so that the transmit device implements the encoding method provided in the first aspect or the implementations of the first aspect.

According to a tenth aspect, embodiments of this application provides a program product, where the program product includes a computer program (that is, an executable instruction), and the computer program is stored in a readable storage medium. At least one processor of a receive device may read the computer program from the readable storage medium, and the at least one processor executes the computer program, so that the receive device implements the decoding method provided in the second aspect or the implementations of the second aspect.

According to the encoding method and apparatus, the decoding method and apparatus, and the device that are provided in embodiments of this application, in an encoding process, the transmit device obtains the target construction sequence, and determines the position set of the information bits based on the target construction sequence, and then encodes the to-be-encoded information bit sequence based on the position set. During corresponding decoding, the same position set may be used to decode the received bit sequence. Because the construction sequence may be obtained from a plurality of construction sequences, a form of the construction sequence is diversified, so that the position set of the information bits is selected more flexibly.

DESCRIPTION OF EMBODIMENTS

The technical solutions of embodiments of this application may be applied to a 5G communications system or a future communications system, and may also be applied to various other wireless communications systems, such as the Global System for Mobile Communications (GSM), a Code Division Multiple Access (CDMA) system, a Wideband Code Division Multiple Access (WCDMA) system, a General Packet Radio Service GPRS), a Long Term Evolution LTE) system, an LTE Frequency Division Duplex FDD) system, an LTE Time Division Duplex (TDD) system, and a Universal Mobile Telecommunication System (UMTS).

Figure 1:
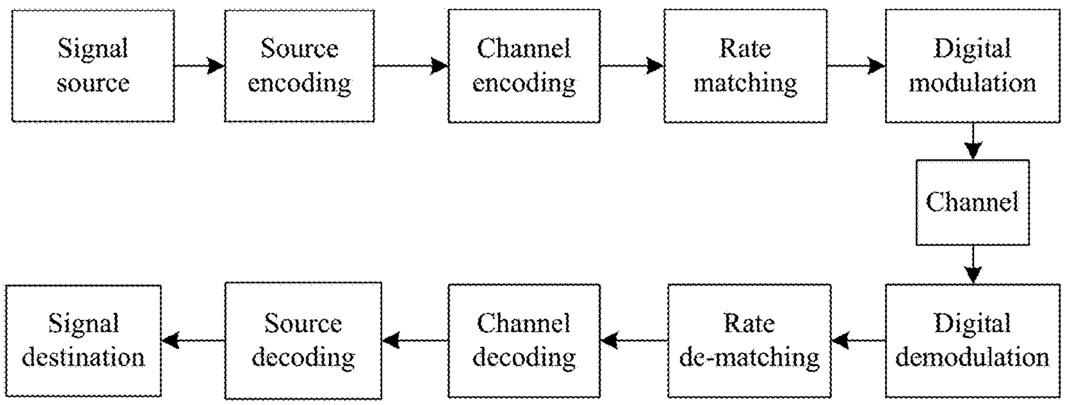
FIG. 1 is a schematic diagram of a basic wireless communication process between a transmitting end and a receiving end.

FIG. 1 is a schematic diagram of a basic wireless communication process. As shown in FIG. 1, at a transmit end, a signal is sent from a signal source after source encoding, channel encoding, rate matching, and digital modulation are successively performed. At a receive end, a signal is output to a signal destination after digital demodulation, rate dematching, channel decoding, and source decoding are successively performed. A polar code may be used in channel encoding, while SC decoding, SCL decoding, or the like may be used during channel decoding.

In an encoding process of the polar code, channel reliability needs to be determined, and information bits and frozen bits are placed at corresponding positions based on the channel reliability, so as to perform correct encoding. A calculation manner for determining the channel reliability is as follows:

$$W_1{}^{2^i}=[W_1{}^{2^{i-1}},W_{2^{i-1}+1}{}^{2^i}],\ W_1{}^2=[01] \tag{1}$$

where $$W_{2^{i-1}+1}^{2^i} = W_1^{2^{i-1}} + \beta_i,\ B_i = (2^{i-1})^{1/4},$$

$W_1{}^{2^i}$ is 1-to-$2^i$ reliability of a channel sequence number, and i is a channel sequence number. In addition, the channel reliability may alternatively be calculated by using formula (2):

$$W_i = \sum_{j=0}^{n-1} \beta_j * 2^{j*\frac{1}{4}} \tag{2}$$

where $i \triangleq B_{n-1}B_{n-2} \ldots B_0$, $B_j \in \{0,1\}$, $j \in \{0,1, \ldots, n-1\}$, and $B_{n-1}B_{n-2} \ldots B_0$ is a binary representation of i.

In addition, expressions such as a polarization weight, an error probability, and a polarized channel capacity that can describe relative reliability of a polarized channel are collectively described as reliability in embodiments of this application.

However, after the channel reliability is calculated in the foregoing manner, a sorted sequence obtained after sequence numbers of channels are sorted based on the channel reliability and a quantized sequence obtained after results of channel reliability normalization are sorted are both relatively fixed and monotonous, and therefore a position set of information bits is also relatively monotonous.

In view of the foregoing problem, embodiments of this application provides a technical solution that can resolve the foregoing problem that a determined position set of information bits is relatively fixed and monotonous. An encoding method and a decoding method provided in embodiments of this application are described in detail below with reference to the accompanying drawings.

Figure 2:
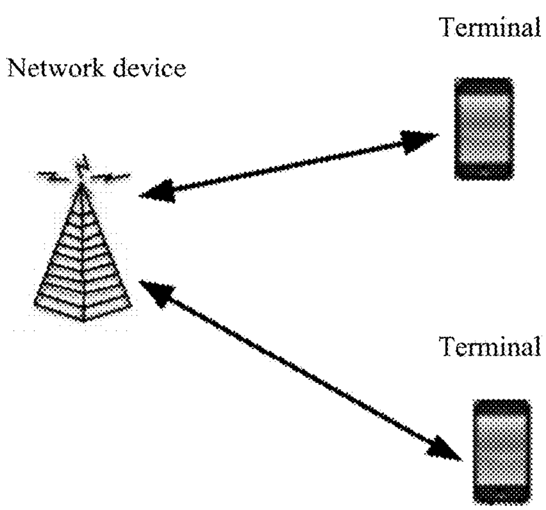
FIG. 2 is a block diagram of an application system of an encoding method and a decoding method according to embodiments of this application.

FIG. 2 is a schematic diagram of an application system of the encoding method and the decoding method according to embodiments of this application. As shown in FIG. 2, this solution is used in a process of information exchange between a network device and a terminal. An encoder may be the network device or the terminal, and correspondingly, a decoder may be the terminal or the network device. Optionally, this solution may also be applied to a process of information exchange between terminals. This is not limited in this solution.

Figure 3:
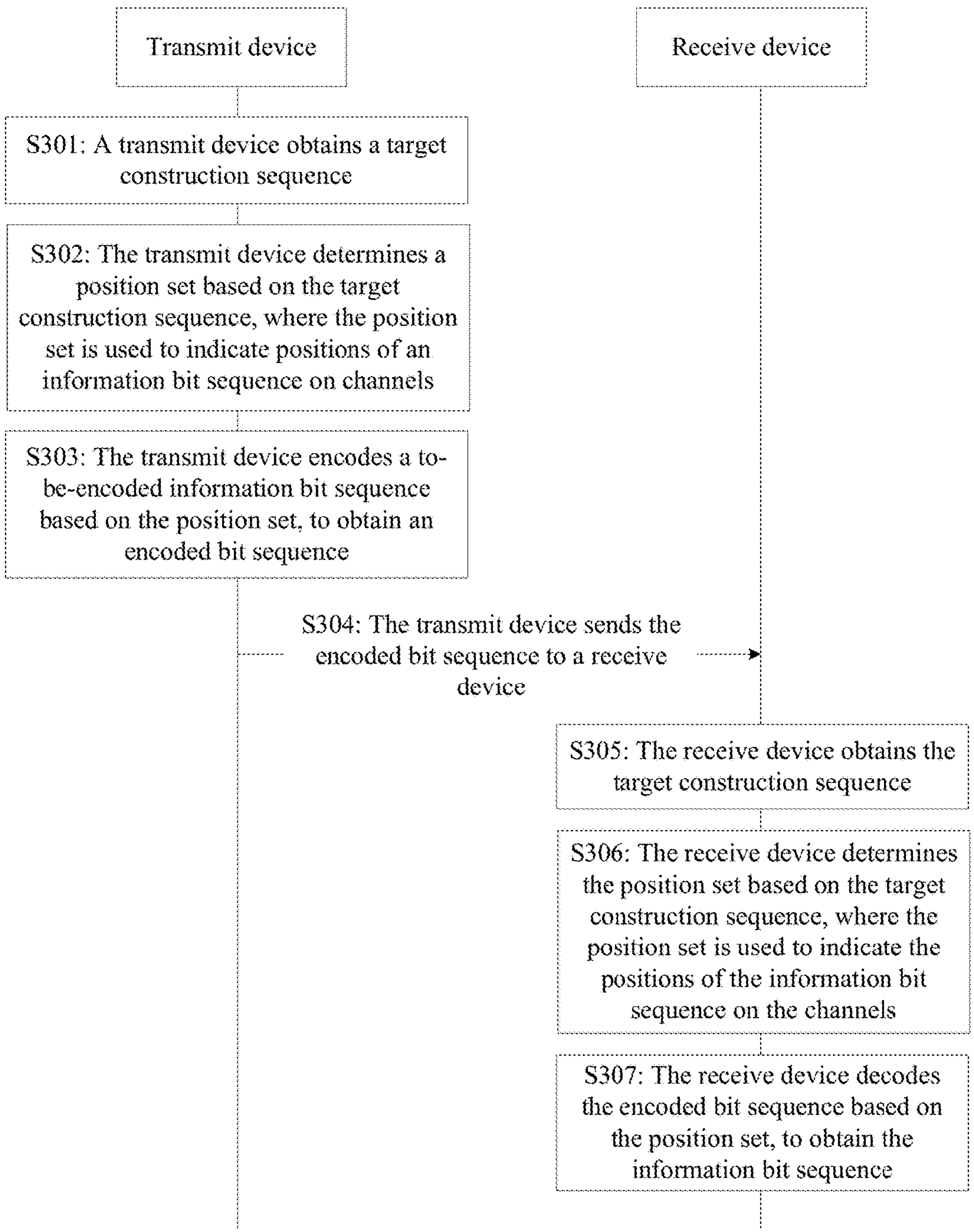
FIG. 3 is an interaction flowchart of an encoding method and a decoding method according to embodiments of this application.

FIG. 3 is an interaction flowchart of the encoding method and the decoding method according to embodiments of this application. As shown in FIG. 3, specific implementation steps of the encoding method and the decoding method are as follows.

S301: A transmit device obtains a target construction sequence.

The target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted.

S302: The transmit device determines a position set based on the target construction sequence, where the position set is used to indicate positions of an information bit sequence on channels.

In the foregoing steps, when the transmit device needs to send information, the transmit device first needs to obtain an information bit sequence, and determine channel positions of information bits based on the obtained target construction sequence. For example, when there are 64 channels, bits in an information bit sequence 111 are respectively on a first channel, a third channel, and a sixteenth channel.

In addition, when the construction sequence includes only the sorted sequence, the transmit device determines the position set based only on the sorted sequence; when the construction sequence includes only the quantized sequence, the transmit device determines the position set based only on the quantized sequence; and when the construction sequence includes the sorted sequence and the quantized sequence, the transmit device determines the position set separately based on the sorted sequence and the quantized sequence.

Optionally, there may be one construction sequence, and the one construction sequence is the target construction sequence. Optionally, there may be a plurality of construction sequences, and in this case, the transmit device obtains one of the plurality of construction sequences as the target construction sequence.

When there are a plurality of construction sequences, a receive device obtains the target construction sequence from the plurality of construction sequences in a same manner. The transmit device and the receive device may agree on one or more target construction sequences based on related parameters such as a code length and a code rate.

Optionally, the plurality of construction sequences are sequences determined based on reliability of a plurality of channels that is calculated based on a mother code length and a preset coding parameter.

Specifically, the reliability may be calculated based on formula (3):

$$W_i = \sum_{j=0}^{n-1} \beta_j * \beta^j \tag{3}$$

where $W_i$ is reliability of an $i^{th}$ channel, $j \in \{0,1, \ldots n-1\}$, $n=\log_2 N$, N is the mother code length, $B_j \in \{0,1\}$, β is a constant, and a value range of β is 1 to 1.62, where j, $B_j$, and β are preset coding parameters. In addition, the value range of β is 1 to 1.62. Optionally, when the value range of β is within 1.16 to 1.21, calculated channel reliability is relatively accurate. In a possible implementation, when a value of β is selected from 1.1870 to 1.2000 in steps of 0.0001, calculated channel reliability is even more accurate.

In addition, the reliability may be calculated based on another algorithm provided that reliability of each channel can be calculated. A specific manner for determining the reliability is not limited in this embodiment.

In an implementation, the position set of the information bits is P channels with highest reliability that are selected from the sorted sequence, and P is greater than or equal to a bit quantity of the information bits.

Specifically, after the reliability of each channel is calculated based on formula (3), the channels may be sorted based on the channel reliability, for example, channel reliability in descending order, or in ascending order, and the P channels with the highest channel reliability are selected as positions of the information bits. In addition, P may be the bit quantity of the information bits, or may be a bit quantity of the information bits and check bits. The check bit may be, for example, a cyclic redundancy check (CRC) or parity check (PC) bit. Therefore, P is an integer that is greater than or equal to the bit quantity of the information bits. For example, a maximum mother code length is 64. When $\beta=2^{1/4}$, a sorted sequence obtained in ascending order of channel reliability is: $Q1_1^{64}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64]. If there are five information bits, a $56^{th}$ channel, a $60^{th}$ channel, a $62^{nd}$ channel, a $63^{rd}$ channel, and a $64^{th}$ channel are selected as positions of the information bits.

In another implementation, the position set of the information bits is L channels with highest channel reliability that are selected from the quantized sequence, and L is greater than or equal to a bit quantity of the information bits.

Specifically, after the reliability of each channel is calculated based on formula (3), the reliability of the channels is normalized. It is defined that the normalized quantized sequence is obtained by quantizing the reliability from 1 or 0 with precision of 1. The L channels with the highest reliability are selected from the processed sequence as positions of the information bits. In addition, L may be the bit quantity of the information bits, or may be a bit quantity of the information bits and check bits. The check bit may be, for example, a CRC or parity check bit. Therefore, L is an integer that is greater than or equal to the bit quantity of the information bits. For example, when N=64, after the reliability of all the channels is quantized, an obtained sequence is: $Z1_1^{64}$=[1, 2, 3, 7, 4, 9, 10, 19, 5, 11, 12, 22, 14, 24, 26, 38, 6, 13, 15, 25, 17, 28, 30, 42, 20, 31, 33, 44, 36, 47, 49, 57, 8, 16, 18, 29, 21, 32, 34, 45, 23, 35, 37, 48, 40, 50, 52, 59, 27, 39, 41, 51, 43, 53, 54, 60, 46, 55, 56, 61, 58, 62, 63, 64], to represent relative reliability of a first channel to a $64^{th}$ channel. For example, Z1(4)=7 and Z1(5)=4 indicate that reliability of the fourth channel is 7 and reliability of the fifth channel is 4. Positions with highest reliability may be selected as the positions of the information bits based on the quantized sequence.

S303: The transmit device encodes the information bit sequence based on the position set, to obtain an encoded bit sequence.

Figure 4:
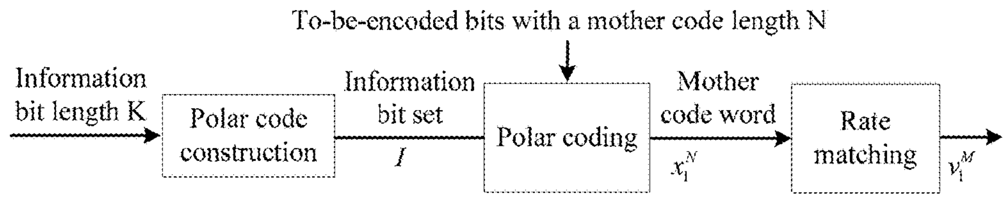
FIG. 4 is a structural block diagram of an encoding module.

FIG. 4 is a structural block diagram of an encoding module. As shown in FIG. 4, before encoding of a polar code, a target position set I of the information bits is first selected by using a polar code construction module. The polar code construction module includes generation of the sorted sequence or the quantization sequence and a determining process of the position set of the information bits. In embodiments of this application, the target position set I of the information bits is obtained, and then polar coding is performed based on the to-be-encoded bits and the target position set I of the information bits to obtain the encoded bit sequence, and finally, rate matching is performed based on a target code length.

S304: The transmit device sends the encoded bit sequence to a receive device.

In this embodiment, after obtaining the position set, the transmit device encodes the information bit sequence based on the positions of the information bits on the channels, and sends the obtained encoded bit sequence.

The receive device receives the encoded bit sequence sent by the transmit device.

S305: The receive device obtains the target construction sequence.

The target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted.

S306: The receive device determines the position set based on the target construction sequence, where the position set is used to indicate the positions of the information bit sequence on the channels.

S307: The receive device decodes the encoded bit sequence based on the position set, to obtain the information bit sequence.

In this embodiment, after obtaining the target construction sequence and determining the position set based on the target construction sequence, the receive device decodes the received encoded bit sequence based on the position set, to obtain the information bit sequence.

In addition, depending on different lengths of the encoded bit sequence, the receive device may first perform S305 and S306, and then receive the encoded bit sequence sent by the transmit device; or the receive device may first receive the encoded bit sequence sent by the transmit device, and then perform S305 and S306. An order of these steps is not limited in embodiments of this application.

According to the encoding method and the decoding method provided in this embodiment, in an encoding process, the transmit device obtains the target construction sequence, and determines the position set of the information bits based on the target construction sequence, and then encodes the information bit sequence based on the position set. During corresponding decoding, the same position set may be used to decode the received the information bit sequence. Because the construction sequence may be obtained from a plurality of construction sequences, a form of the construction sequence is diversified, so that the position set of the information bits is selected more flexibly.

Sorted sequences obtained when the mother code length is 64 and different values are selected for β are listed below. The position set obtained by the transmit device and the receive device is a subset of the sorted sequence. When the mother code length is less than 64, the sorted sequence and the quantized sequence are subsets of the following sequences, and are not listed herein. In addition, sequences in this embodiment are described by using decimal examples, and certainly, the sequences may be represented in a binary, octal, or hexadecimal form.

It should be noted that reliability of channels may be sorted in descending order or in ascending order. The following sequences indicate only a relationship between relative reliability of the channels, and a specific representation form of reliability is not limited in this embodiment.

If the mother code length is 64, there are 64 channels, and the channels are numbered from 1, a sorted sequence is:

$Q1_1^{64}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64];

$Q2_1^{64}$=[1, 2, 3, 5, 9, 17, 33, 4, 6, 7, 10, 11, 18, 13, 19, 34, 21, 35, 25, 37, 8, 41, 12, 49, 14, 20, 15, 22, 36, 23, 26, 38, 27, 39, 42, 29, 43, 50, 45, 51, 16, 53, 24, 57, 28, 40, 30, 44, 31, 46, 52, 47, 54, 55, 58, 59, 61, 32, 48, 56, 60, 62, 63, 64];

$Q3_1^{64}$=[1, 2, 3, 5, 9, 17, 4, 33, 6, 7, 10, 11, 18, 13, 19, 34, 21, 35, 25, 8, 37, 12, 41, 14, 20, 49, 15, 22, 36, 23, 26, 38, 27, 39, 42, 29, 43, 50, 16, 45, 51, 24, 53, 28, 57, 40, 30, 44, 31, 46, 52, 47, 54, 55, 58, 59, 32, 61, 48, 56, 60, 62, 63, 64];

$Q4_1^{64}$=[1, 2, 3, 5, 9, 17, 4, 6, 33, 7, 10, 11, 18, 13, 19, 34, 21, 8, 35, 25, 37, 12, 14, 41, 20, 15, 22, 49, 36, 23, 26, 38, 27, 39, 42, 29, 16, 43, 50, 45, 24, 51, 53, 28, 40, 30, 57, 44, 31, 46, 52, 47, 54, 55, 58, 32, 59, 61, 48, 56, 60, 62, 63, 64];

$Q5_1^{64}$=[1, 2, 3, 5, 9, 17, 4, 6, 33, 7, 10, 11, 18, 13, 19, 34, 21, 8, 35, 25, 12, 37, 14, 41, 20, 15, 22, 49, 36, 23, 26, 38, 27, 39, 42, 29, 16, 43, 50, 45, 24, 51, 28, 53, 40, 30, 57, 44, 31, 46, 52, 47, 54, 55, 58, 32, 59, 61, 48, 56, 60, 62, 63, 64]; or $Q6_1^{64}$=[1, 2, 3, 5, 9, 17, 4, 6, 33, 7, 10, 11, 18, 13, 19, 34, 21, 8, 35, 25, 12, 37, 14, 20, 41, 15, 22, 49, 36, 23, 26, 38, 27, 39, 42, 29, 16, 43, 50, 24, 45, 51, 28, 53, 40, 30, 57, 44, 31, 46, 52, 47, 54, 55, 58, 32, 59, 61, 48, 56, 60, 62, 63, 64].

The numbers 1, 2, 3, 4, 5, and 6 after the letter "Q" are merely used to indicate different sequences, and have no specific meanings.

Sorted sequences obtained when the mother code length is 1024 and different values are selected for β are listed below. The position set obtained by the transmit device and the receive device is a subset of the sorted sequence. When the mother code length is less than 1024, the sorted sequence is a subset of the following sequences, and is not listed herein. In addition, sequences in this embodiment are described by using decimal examples, and certainly, the sequences may be represented in a binary, octal, or hexadecimal form.

It should be noted that reliability of channels may be sorted in descending order or in ascending order. The following sequences indicate only a relationship between relative reliability of the channels, and a specific representation form of reliability is not limited in this embodiment.

If the mother code length is 1024, there are 1024 channels, and the channels are numbered from 0, a sorted sequence may be any one of the following:

$Q1_1^{1024}$=[0, 1, 2, 4, 8, 16, 3, 32, 5, 6, 9, 64, 10, 17, 12, 18, 128, 33, 20, 34, 24, 7, 36, 65, 256, 11, 66, 40, 13, 68, 19, 129, 48, 14, 72, 21, 130, 512, 35, 22, 132, 25, 80, 37, 257, 26, 136, 38, 67, 258, 41, 96, 28, 69, 144, 42, 260, 49, 15, 70, 44, 73, 131, 264, 50, 513, 160, 74, 23, 133, 514, 52, 81, 272, 76, 134, 27, 516, 82, 137, 192, 56, 39, 259, 97, 29, 138, 288, 84, 520, 145, 43, 261, 98, 30, 140, 88, 71, 146, 262, 45, 528, 100, 265, 51, 320, 161, 148, 46, 75, 266, 515, 104, 53, 162, 273, 544, 77, 152, 135, 268, 54, 517, 83, 164, 274, 193, 57, 384, 112, 78, 518, 139, 289, 85, 194, 58, 521, 276, 576, 168, 99, 31, 290, 86, 141, 522, 196, 60, 89, 147, 280, 263, 529, 101, 176, 142, 292, 321, 524, 90, 200, 149, 47, 530, 102, 267, 640, 322, 105, 163, 296, 92, 150, 545, 532, 153, 269, 208, 106, 55, 324, 165, 275, 546, 385, 113, 79, 154, 304, 270, 536, 519, 108, 166, 195, 59, 328, 277, 548, 386, 114, 577, 169, 768, 224, 156, 291, 87, 523, 278, 197, 61, 578, 170, 388, 116, 281, 552, 336, 177, 143, 293, 198, 62, 525, 91, 580, 172, 282, 201, 531, 392, 120, 103, 178, 641, 294, 323, 560, 526, 297, 93, 202, 151, 352, 284, 584, 533, 642, 180, 209, 107, 325, 400, 298, 94, 547, 204, 534, 155, 305, 271, 644, 210, 537, 326, 109, 592, 184, 167, 300, 329, 549, 387, 115, 306, 769, 225, 157, 538, 416, 212, 110, 648, 330, 279, 550, 579, 171, 389, 117, 770, 226, 158, 553, 308, 337, 608, 540, 216, 199, 63, 332, 390, 118, 581, 173, 283, 656, 554, 772, 228, 338, 393, 121, 179, 448, 312, 295, 561, 527, 582, 174, 203, 353, 285, 556, 394, 122, 585, 340, 643, 776, 232, 181, 562, 401, 299, 95, 672, 354, 286, 205, 586, 535, 396, 124, 182, 645, 211, 344, 327, 564, 402, 593, 185, 301, 784, 240, 206, 356, 588, 307, 646, 539, 417, 213, 111, 594, 186, 649, 404, 302, 331, 704, 568, 551, 771, 227, 159, 360, 309, 418, 214, 609, 541, 650, 800, 596, 188, 217, 333, 408, 391, 119, 657, 555, 310, 773, 229, 339, 610, 542, 420, 449, 313, 652, 218, 368, 334, 600, 583, 175, 658, 774, 230, 557, 395, 123, 341, 612, 450, 314, 777, 233, 563, 832, 424, 220, 673, 355, 287, 660, 558, 587, 342, 397, 125, 778, 234, 183, 452, 316, 345, 616, 565, 403, 674, 785, 241, 207, 357, 432, 398, 126, 589, 664, 647, 780, 236, 346, 566, 595, 187, 456, 405, 303, 676, 786, 242, 705, 569, 358, 896, 624, 590, 361, 419, 215, 348, 651, 406, 801, 597, 189, 706, 570, 788, 244, 409, 680, 464, 362, 311, 611, 543, 421, 802, 598, 190, 653, 219, 369, 335, 708, 572, 410, 601, 659, 792, 775, 248, 231, 364, 422, 613, 451, 315, 688, 654, 804, 370, 833, 425, 221, 602, 480, 412, 712, 661, 559, 343, 614, 779, 235, 453, 317, 834, 426, 222, 617, 372, 675, 808, 604, 662, 433, 399, 127, 665, 454, 318, 781, 237, 347, 720, 618, 567, 836, 428, 457, 677, 787, 243, 376, 359, 434, 897, 625, 591, 666, 816, 782, 238, 349, 620, 458, 407, 678, 707, 571, 840, 789, 245, 898, 626, 681, 436, 465, 363, 736, 668, 350, 803, 599, 191, 460, 790, 246, 709, 573, 411, 682, 900, 628, 466, 793, 249, 365, 848, 440, 423, 689, 655, 805, 371, 710, 574, 603, 481, 413, 684, 794, 250, 713, 468, 366, 904, 632, 615, 690, 806, 835, 427, 223, 373, 482, 414, 809, 605, 714, 663, 864, 796, 252, 472, 455, 319, 692, 721, 619, 374, 837, 429, 912, 810, 606, 484, 377, 716, 435, 667, 817, 783, 239, 722, 838, 430, 621, 459, 696, 679, 812, 378, 841, 899, 627, 488, 437, 818, 737, 669, 351, 928, 724, 622, 461, 842, 791, 247, 380, 683, 438, 901, 629, 467, 738, 670, 820, 849, 441, 496, 462, 728, 711, 575, 844, 902, 630, 685, 795, 251, 469, 367, 740, 850, 442, 905, 633, 691, 960, 824, 807, 483, 415, 686, 715, 470, 865, 797, 253, 906, 634, 852, 444, 473, 744, 693, 375, 913, 811, 607, 485, 866, 798, 254, 717, 908, 636, 474, 694, 723, 856, 839, 431, 914, 697, 486, 813, 379, 752, 718, 868, 489, 819, 476, 929, 725, 623, 698, 916, 814, 843, 381, 490, 439, 739, 671, 872, 821, 930, 726, 497, 463, 700, 729, 382, 845, 920, 903, 631, 492, 822, 741, 851, 443, 932, 498, 961, 825, 730, 880, 846, 687, 471, 742, 907, 635, 853, 445, 962, 826, 745, 500, 936, 732, 867, 799, 255, 854, 446, 909, 637, 475, 746, 695, 964, 828, 857, 915, 504, 487, 753, 719, 869, 944, 910, 638, 477, 748, 858, 699, 968, 917, 815, 754, 870, 491, 478, 873, 931, 727, 860, 918, 701, 383, 756, 921, 493, 976, 874, 823, 933, 499, 702, 731, 881, 847, 922, 494, 760, 743, 876, 934, 963, 827, 501, 882, 937, 733, 992, 924, 855, 447, 747, 502, 965, 829, 938, 734, 884, 505, 945, 911, 639, 966, 830, 749, 859, 940, 506, 969, 755, 888, 871, 946, 479, 750, 861, 970, 919, 508, 757, 948, 977, 875, 862, 703, 972, 758, 923, 495, 978, 761, 877, 952, 935, 883, 993, 925, 762, 980, 878, 503, 939, 735, 885, 994, 926, 764, 984, 967, 831, 886, 941, 507, 996, 889, 947, 751, 942, 971, 509, 890, 1000, 949, 863, 510, 973, 759, 892, 950, 979, 953, 1008, 974, 763, 981, 879, 954, 995, 927, 982, 765, 956, 985, 887, 997, 766, 986, 943, 998, 891, 1001, 988, 511, 893, 1002, 951, 1009, 975, 894, 1004, 955, 1010, 983, 957, 1012, 767, 958, 987, 1016, 999, 989, 1003, 990, 895, 1005, 1011, 1006, 1013, 959, 1014, 1017, 1018, 991, 1020, 1007, 1015, 1019, 1021, 1022, 1023];

$Q2_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 258, 41, 28, 96, 69, 42, 144, 260, 15, 49, 70, 44, 73, 131, 264, 50, 513, 160, 23, 74, 133, 514, 52, 81, 272, 76, 134, 27, 516, 82, 137, 39, 56, 192, 259, 29, 97, 138, 84, 288, 520, 43, 145, 261, 30, 98, 140, 71, 88, 146, 262, 45, 528, 100, 265, 51, 320, 161, 46, 148, 75, 266, 515, 53, 104, 162, 273, 544, 77, 135, 152, 268, 54, 517, 83, 164, 274, 57, 193, 78, 112, 384, 518, 139, 85, 289, 58, 194, 521, 276, 168, 576, 31, 99, 86, 290, 141, 522, 60, 196, 89, 147, 263, 280, 529, 101, 142, 176, 292, 321, 524, 90, 47, 149, 200, 530, 102, 267, 640, 322, 105, 163, 92, 296, 150, 545, 532, 153, 269, 55, 106, 208, 324, 165, 275, 546, 79, 113, 385, 154, 270, 304, 519, 536, 108, 166, 59, 195, 277, 328, 548, 114, 386, 169, 577, 156, 224, 768, 87, 291, 523, 278, 61, 197, 170, 578, 116, 388, 281, 552, 336, 143, 177, 293, 62, 198, 525, 91, 172, 580, 282, 201, 531, 103, 120, 392, 178, 641, 294, 323, 526, 560, 93, 297, 151, 202, 284, 352, 533, 584, 642, 180, 107, 209, 325, 94, 298, 400, 547, 204, 534, 155, 271, 305, 644, 210, 537, 326, 109, 167, 184, 592, 300, 329, 549, 115, 387, 306, 157, 225, 769, 538, 110, 212, 416, 648, 279, 330, 550, 171, 579, 117, 389, 158, 226, 770, 553, 308, 337, 540, 608, 63, 199, 216, 332, 118, 390, 173, 581, 283, 554, 656, 228, 772, 338, 121, 393, 179, 295, 312, 448, 527, 561, 174, 582, 203, 285, 353, 556, 122, 394, 585, 340, 643, 181, 232, 776, 562, 95, 299, 401, 672, 286, 354, 205, 535, 586, 124, 396, 182, 645, 211, 327, 344, 564, 402, 185, 593, 301, 206, 240, 784, 356, 588, 307, 646, 539, 111, 213, 417, 186, 594, 649, 302, 404, 331, 551, 568, 704, 159, 227, 771, 309, 360, 214, 418, 541, 609, 650, 188, 596, 800, 217, 333, 119, 391, 408, 555, 657, 310, 229, 773, 339, 542, 610, 420, 313, 449, 652, 218, 334, 368, 175, 583, 600, 658, 230, 774, 557, 123, 395, 341, 612, 314, 450, 233, 777, 563, 220, 424, 832, 673, 287, 355, 558, 660, 587, 342, 125, 397, 183, 234, 778, 316, 452, 345, 565, 616, 403, 674, 207, 241, 785, 357, 126, 398, 432, 589, 647, 664, 236, 780, 346, 566, 187, 595, 303, 405, 456, 676, 242, 786, 569, 705, 358, 590, 624, 896, 361, 215, 419, 348, 651, 406, 189, 597, 801, 570, 706, 244, 788, 409, 680, 311, 362, 464, 543, 611, 421, 190, 598, 802, 653, 219, 335, 369, 572, 708, 410, 601, 659, 231, 248, 775, 792, 364, 422, 613, 315, 451, 654, 688, 804, 370, 221, 425, 833, 602, 412, 480, 559, 661, 712, 343, 614, 235, 779, 317, 453, 222, 426, 834, 617, 372, 675, 604, 808, 662, 127, 399, 433, 665, 318, 454, 237, 781, 347, 567, 618, 720, 428, 836, 457, 677, 243, 787, 359, 376, 434, 591, 625, 897, 666, 238, 782, 816, 349, 620, 407, 458, 678, 571, 707, 245, 789, 840, 626, 898, 681, 436, 363, 465, 668, 736, 350, 191, 599, 803, 460, 246, 790, 573, 709, 411, 682, 628, 900, 466, 249, 793, 365, 423, 440, 848, 655, 689, 805, 371, 574, 710, 603, 413, 481, 684, 250, 794, 713, 366, 468, 615, 632, 904, 690, 806, 223, 427, 835, 373, 414, 482, 605, 809, 663, 714, 252, 796, 864, 319, 455, 472, 692, 619, 721, 374, 429, 837, 606, 810, 912, 484, 377, 716, 435, 667, 239, 783, 817, 722, 430, 838, 621, 459, 679, 696, 812, 378, 841, 627, 899, 437, 488, 818, 669, 737, 351, 622, 724, 928, 461, 247, 791, 842, 380, 683, 438, 629, 901, 467, 670, 738, 820, 441, 849, 462, 496, 575, 711, 728, 844, 630, 902, 685, 251, 795, 367, 469, 740, 442, 850, 633, 905, 691, 807, 824, 960, 415, 483, 686, 715, 470, 253, 797, 865, 634, 906, 444, 852, 473, 693, 744, 375, 607, 811, 913, 485, 254, 798, 866, 717, 636, 908, 474, 694, 723, 431, 839, 856, 914, 697, 486, 813, 379, 718, 752, 868, 489, 819, 476, 623, 725, 929, 698, 814, 916, 843, 381, 439, 490, 671, 739, 821, 872, 726, 930, 463, 497, 700, 729, 382, 845, 631, 903, 920, 492, 822, 741, 443, 851, 932, 498, 825, 961, 730, 846, 880, 687, 471, 742, 635, 907, 445, 853, 826, 962, 745, 500, 732, 936, 255, 799, 867, 446, 854, 637, 909, 475, 695, 746, 828, 964, 857, 915, 487, 504, 719, 753, 869, 638, 910, 944, 477, 748, 858, 699, 815, 917, 968, 754, 870, 491, 478, 873, 727, 931, 860, 918, 701, 383, 756, 921, 493, 823, 874, 976, 933, 499, 702, 731, 847, 881, 922, 494, 743, 760, 876, 934, 827, 963, 501, 882, 733, 937, 924, 992, 447, 855, 747, 502, 829, 965, 734, 938, 884, 505, 639, 911, 945, 830, 966, 749, 859, 940, 506, 969, 755, 871, 888, 946, 479, 750, 861, 919, 970, 508, 757, 948, 875, 977, 862, 703, 972, 758, 923, 495, 978, 761, 877, 935, 952, 883, 925, 993, 762, 878, 980, 503, 735, 939, 885, 926, 994, 764, 831, 967, 984, 886, 941, 507, 996, 889, 947, 751, 942, 971, 509, 890, 949, 1000, 863, 510, 973, 759, 892, 950, 979, 953, 974, 1008, 763, 879, 981, 954, 927, 995, 982, 765, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q3_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 290, 141, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 580, 282, 201, 531, 103, 120, 392, 178, 641, 294, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 306, 157, 225, 769, 538, 110, 212, 416, 648, 279, 330, 550, 171, 579, 117, 389, 158, 226, 553, 770, 308, 337, 540, 608, 63, 199, 216, 332, 118, 173, 390, 581, 283, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 354, 205, 535, 586, 124, 396, 182, 211, 645, 327, 344, 564, 185, 402, 593, 301, 206, 240, 784, 356, 588, 307, 646, 539, 111, 213, 417, 186, 594, 649, 302, 404, 331, 551, 568, 704, 159, 227, 771, 309, 360, 214, 418, 541, 609, 650, 188, 596, 800, 217, 333, 119, 391, 408, 555, 657, 310, 229, 339, 773, 542, 610, 420, 313, 449, 218, 652, 334, 368, 175, 583, 600, 658, 230, 123, 557, 774, 395, 341, 612, 314, 233, 450, 777, 563, 220, 424, 832, 673, 287, 355, 558, 660, 587, 125, 342, 397, 183, 234, 778, 316, 452, 345, 565, 616, 403, 674, 207, 241, 785, 357, 126, 398, 432, 589, 647, 664, 236, 346, 780, 566, 187, 595, 303, 405, 456, 242, 676, 569, 786, 705, 358, 590, 624, 896, 361, 215, 419, 348, 651, 189, 406, 597, 801, 570, 706, 244, 788, 409, 680, 311, 362, 464, 543, 611, 421, 190, 598, 802, 219, 653, 335, 369, 572, 708, 410, 601, 659, 231, 248, 775, 792, 364, 422, 613, 315, 451, 654, 688, 370, 804, 221, 425, 833, 602, 412, 480, 559, 661, 712, 343, 614, 235, 779, 317, 453, 222, 426, 617, 834, 372, 675, 604, 808, 662, 127, 399, 433, 665, 318, 237, 454, 347, 781, 567, 618, 720, 428, 836, 457, 243, 677, 787, 359, 376, 434, 591, 625, 897, 666, 238, 782, 816, 349, 620, 407, 458, 678, 571, 707, 245, 789, 840, 626, 681, 898, 436, 363, 465, 668, 736, 350, 191, 599, 803, 460, 246, 573, 790, 709, 411, 682, 628, 249, 466, 900, 793, 365, 423, 440, 848, 655, 689, 371, 805, 574, 710, 603, 413, 481, 250, 684, 794, 713, 366, 468, 615, 632, 904, 690, 806, 223, 427, 835, 373, 414, 482, 605, 809, 663, 714, 252, 796, 864, 319, 455, 472, 692, 619, 721, 374, 429, 837, 606, 810, 912, 484, 377, 716, 435, 667, 239, 783, 817, 722, 430, 621, 838, 459, 679, 696, 378, 812, 841, 627, 899, 437, 488, 818, 669, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 740, 442, 633, 850, 905, 691, 807, 824, 960, 415, 483, 686, 715, 253, 470, 797, 865, 634, 906, 444, 852, 473, 693, 744, 375, 607, 811, 913, 485, 254, 798, 866, 717, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 729, 382, 845, 631, 903, 920, 492, 822, 741, 443, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 882, 733, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q4_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 282, 580, 201, 531, 103, 120, 392, 178, 641, 294, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 157, 306, 225, 769, 538, 110, 212, 416, 648, 279, 330, 550, 171, 579, 117, 389, 158, 226, 553, 770, 308, 337, 540, 608, 63, 199, 216, 332, 118, 173, 390, 283, 581, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 205, 354, 535, 586, 124, 396, 182, 211, 645, 327, 344, 564, 185, 402, 593, 301, 206, 240, 784, 356, 588, 307, 646, 539, 111, 213, 417, 186, 594, 649, 302, 404, 331, 551, 568, 704, 159, 227, 771, 309, 360, 214, 418, 541, 609, 650, 188, 596, 217, 800, 333, 119, 391, 408, 555, 657, 310, 229, 339, 773, 542, 610, 420, 313, 449, 218, 652, 334, 368, 175, 583, 600, 658, 230, 123, 557, 774, 395, 341, 314, 612, 233, 450, 777, 563, 220, 424, 832, 673, 287, 355, 558, 660, 587, 125, 342, 397, 183, 234, 778, 316, 452, 345, 565, 616, 403, 674, 207, 241, 785, 357, 126, 398, 432, 589, 647, 664, 236, 346, 780, 566, 187, 595, 303, 405, 456, 242, 676, 569, 786, 705, 358, 590, 624, 896, 361, 215, 419, 348, 651, 189, 406, 597, 801, 570, 706, 244, 788, 409, 680, 311, 362, 464, 543, 611, 421, 190, 598, 219, 653, 802, 335, 369, 572, 410, 708, 601, 659, 231, 248, 775, 792, 364, 422, 315, 613, 451, 654, 688, 221, 370, 804, 425, 833, 602, 412, 480, 559, 661, 712, 343, 614, 235, 779, 317, 453, 222, 426, 617, 834, 372, 675, 604, 808, 662, 127, 399, 433, 665, 318, 237, 454, 347, 781, 567, 618, 720, 428, 836, 457, 243, 677, 787, 359, 376, 434, 591, 625, 897, 666, 238, 782, 816, 349, 620, 407, 458, 678, 571, 707, 245, 789, 840, 626, 681, 898, 436, 363, 465, 668, 736, 350, 191, 599, 803, 460, 246, 573, 790, 411, 709, 682, 628, 249, 466, 900, 793, 365, 423, 440, 848, 655, 689, 371, 805, 574, 710, 603, 413, 481, 250, 684, 794, 713, 366, 468, 615, 632, 904, 690, 223, 806, 427, 835, 373, 414, 482, 605, 809, 663, 714, 252, 796, 864, 319, 455, 472, 692, 619, 721, 374, 429, 837, 606, 810, 912, 484, 377, 716, 435, 667, 239, 783, 817, 722, 430, 621, 838, 459, 679, 696, 378, 812, 841, 627, 899, 437, 488, 669, 818, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 442, 740, 633, 850, 905, 691, 807, 824, 960, 415, 483, 686, 715, 253, 470, 797, 865, 634, 906, 444, 852, 473, 693, 744, 375, 607, 811, 913, 485, 254, 798, 717, 866, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 729, 382, 845, 631, 903, 920, 492, 822, 443, 741, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q5_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 282, 580, 201, 531, 103, 120, 392, 178, 641, 294, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 157, 306, 225, 769, 538, 110, 212, 416, 648, 279, 330, 550, 171, 579, 117, 389, 158, 226, 553, 770, 308, 337, 540, 608, 63, 199, 216, 332, 118, 173, 390, 283, 581, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 205, 354, 535, 586, 124, 396, 182, 211, 645, 327, 344, 564, 185, 402, 593, 301, 206, 240, 784, 356, 307, 588, 646, 539, 111, 213, 417, 186, 594, 649, 302, 404, 331, 551, 568, 704, 159, 227, 771, 309, 360, 214, 418, 541, 609, 650, 188, 596, 217, 800, 333, 119, 391, 408, 555, 657, 310, 229, 339, 773, 542, 610, 420, 313, 449, 218, 652, 334, 368, 175, 583, 600, 658, 230, 123, 557, 774, 395, 341, 314, 612, 233, 450, 777, 563, 220, 424, 832, 673, 287, 355, 558, 660, 587, 125, 342, 397, 183, 234, 778, 316, 452, 345, 565, 616, 403, 674, 207, 241, 785, 357, 126, 398, 432, 589, 647, 664, 236, 346, 780, 566, 187, 595, 303, 405, 456, 242, 676, 569, 786, 705, 358, 590, 624, 896, 361, 215, 419, 348, 651, 189, 406, 597, 801, 570, 706, 244, 788, 409, 680, 311, 362, 464, 543, 611, 421, 190, 598, 219, 653, 802, 335, 369, 572, 410, 708, 601, 659, 231, 248, 775, 792, 364, 422, 315, 613, 451, 654, 688, 221, 370, 804, 425, 833, 602, 412, 480, 559, 661, 712, 343, 614, 235, 779, 317, 453, 222, 426, 617, 834, 372, 675, 604, 808, 662, 127, 399, 433, 665, 318, 237, 454, 347, 781, 567, 618, 720, 428, 836, 457, 243, 677, 787, 359, 376, 434, 591, 625, 897, 666, 238, 782, 816, 349, 620, 407, 458, 678, 571, 707, 245, 789, 840, 626, 681, 898, 436, 363, 465, 668, 736, 350, 191, 599, 803, 460, 246, 573, 790, 411, 709, 682, 628, 249, 466, 900, 793, 365, 423, 440, 848, 655, 689, 371, 805, 574, 710, 603, 413, 481, 250, 684, 794, 713, 366, 468, 615, 632, 904, 690, 223, 806, 427, 835, 373, 414, 482, 605, 809, 663, 714, 252, 796, 864, 319, 455, 472, 692, 619, 721, 374, 429, 837, 606, 810, 912, 484, 377, 435, 716, 667, 239, 783, 817, 722, 430, 621, 838, 459, 679, 696, 378, 812, 841, 627, 899, 437, 488, 669, 818, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 442, 740, 633, 850, 905, 691, 807, 824, 960, 415, 483, 686, 715, 253, 470, 797, 865, 634, 906, 444, 852, 473, 693, 744, 375, 607, 811, 913, 485, 254, 798, 717, 866, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 729, 382, 845, 631, 903, 920, 492, 822, 443, 741, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q6_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 282, 580, 201, 531, 103, 120, 392, 178, 641, 294, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 157, 306, 225, 769, 538, 110, 212, 416, 648, 279, 330, 550, 171, 579, 117, 389, 158, 226, 553, 770, 308, 337, 540, 608, 63, 199, 216, 332, 118, 173, 390, 283, 581, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 205, 354, 535, 586, 124, 396, 182, 211, 645, 327, 344, 564, 185, 402, 593, 301, 206, 240, 784, 356, 307, 588, 646, 539, 111, 213, 417, 186, 594, 649, 302, 404, 331, 551, 568, 704, 159, 227, 771, 309, 360, 214, 541, 418, 609, 650, 188, 596, 217, 800, 333, 119, 391, 408, 555, 657, 310, 229, 339, 773, 542, 610, 420, 313, 449, 218, 652, 334, 368, 175, 583, 600, 658, 230, 123, 557, 774, 395, 341, 314, 612, 233, 450, 777, 563, 220, 424, 832, 673, 287, 355, 558, 660, 587, 125, 342, 397, 183, 234, 778, 316, 452, 345, 565, 403, 616, 674, 207, 241, 785, 357, 126, 398, 432, 589, 647, 664, 236, 346, 780, 566, 187, 595, 303, 405, 456, 242, 676, 569, 786, 705, 358, 590, 624, 896, 361, 215, 419, 348, 651, 189, 406, 597, 801, 570, 706, 244, 788, 409, 680, 311, 362, 464, 543, 611, 421, 190, 598, 219, 653, 802, 335, 369, 572, 410, 708, 601, 659, 231, 248, 775, 792, 364, 422, 315, 613, 451, 654, 688, 221, 370, 804, 425, 833, 602, 412, 480, 559, 661, 712, 343, 614, 235, 779, 317, 453, 222, 426, 617, 834, 372, 675, 604, 808, 662, 127, 399, 433, 665, 318, 237, 454, 347, 781, 567, 618, 720, 428, 836, 457, 243, 677, 787, 359, 376, 434, 591, 625, 897, 666, 238, 782, 816, 349, 407, 620, 458, 678, 571, 707, 245, 789, 840, 626, 681, 898, 436, 363, 465, 668, 736, 350, 191, 599, 803, 460, 246, 573, 790, 411, 709, 682, 628, 249, 466, 900, 793, 365, 423, 440, 848, 655, 689, 371, 805, 574, 710, 603, 413, 481, 250, 684, 794, 713, 366, 468, 615, 632, 904, 690, 223, 806, 427, 835, 373, 414, 605, 482, 809, 663, 714, 252, 796, 864, 319, 455, 472, 692, 619, 721, 374, 429, 837, 606, 810, 912, 484, 377, 435, 716, 667, 239, 783, 817, 722, 430, 621, 838, 459, 679, 696, 378, 812, 841, 627, 899, 437, 488, 669, 818, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 442, 740, 633, 850, 905, 691, 807, 824, 960, 415, 483, 686, 715, 253, 470, 797, 865, 634, 906, 444, 852, 473, 693, 744, 375, 607, 811, 913, 485, 254, 798, 717, 866, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 729, 382, 845, 631, 903, 920, 492, 822, 443, 741, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q7_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 282, 580, 201, 531, 103, 120, 392, 178, 294, 641, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 157, 306, 225, 769, 538, 110, 212, 416, 648, 279, 330, 550, 171, 579, 117, 389, 158, 226, 553, 770, 308, 337, 540, 608, 63, 199, 216, 332, 118, 173, 390, 283, 581, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 205, 354, 535, 586, 124, 396, 182, 211, 645, 327, 344, 564, 185, 402, 593, 301, 206, 240, 784, 356, 307, 588, 646, 539, 111, 213, 417, 186, 594, 302, 649, 404, 331, 551, 568, 704, 159, 227, 771, 309, 360, 214, 541, 418, 609, 650, 188, 596, 217, 800, 333, 119, 391, 408, 555, 310, 657, 229, 339, 773, 542, 610, 420, 313, 449, 218, 652, 334, 368, 175, 583, 600, 658, 230, 123, 557, 774, 395, 341, 314, 612, 233, 450, 777, 563, 220, 424, 832, 673, 287, 355, 558, 660, 587, 125, 342, 397, 183, 234, 778, 316, 452, 345, 565, 403, 616, 674, 207, 241, 785, 357, 126, 398, 432, 589, 647, 664, 236, 346, 780, 566, 187, 595, 303, 405, 456, 242, 676, 569, 786, 358, 705, 590, 624, 896, 361, 215, 419, 348, 651, 189, 406, 597, 801, 570, 706, 244, 788, 409, 680, 311, 362, 464, 543, 611, 421, 190, 598, 219, 653, 802, 335, 369, 572, 410, 708, 601, 659, 231, 248, 775, 792, 364, 422, 315, 613, 451, 654, 688, 221, 370, 804, 425, 833, 602, 412, 480, 559, 661, 712, 343, 614, 235, 779, 317, 453, 222, 426, 617, 834, 372, 675, 604, 808, 662, 127, 399, 433, 318, 665, 237, 454, 347, 781, 567, 618, 720, 428, 836, 457, 243, 677, 787, 359, 376, 434, 591, 625, 897, 666, 238, 782, 816, 349, 407, 620, 458, 678, 571, 707, 245, 789, 840, 626, 681, 898, 436, 363, 465, 668, 736, 350, 191, 599, 803, 460, 246, 573, 790, 411, 709, 682, 628, 249, 466, 900, 793, 365, 423, 440, 848, 655, 689, 371, 805, 574, 710, 603, 413, 481, 250, 684, 794, 366, 713, 468, 615, 632, 904, 690, 223, 806, 427, 835, 373, 414, 605, 482, 809, 663, 714, 252, 796, 864, 319, 455, 472, 692, 619, 374, 721, 429, 837, 606, 810, 912, 484, 377, 435, 716, 667, 239, 783, 817, 722, 430, 621, 838, 459, 679, 696, 378, 812, 841, 627, 899, 437, 488, 669, 818, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 442, 740, 633, 850, 905, 691, 807, 824, 960, 415, 483, 686, 715, 253, 470, 797, 865, 634, 906, 444, 852, 473, 693, 744, 375, 607, 811, 913, 485, 254, 798, 717, 866, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 382, 729, 845, 631, 903, 920, 492, 822, 443, 741, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q8_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 516, 137, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 518, 139, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 532, 153, 269, 55, 106, 208, 324, 165, 275, 546, 79, 113, 385, 154, 270, 304, 519, 536, 108, 166, 59, 195, 277, 328, 114, 548, 169, 386, 577, 156, 224, 768, 87, 291, 523, 61, 278, 197, 170, 578, 116, 388, 281, 552, 336, 143, 177, 293, 62, 198, 91, 525, 172, 282, 580, 201, 531, 103, 120, 392, 178, 294, 641, 323, 526, 560, 93, 297, 151, 202, 284, 352, 533, 584, 642, 180, 107, 209, 325, 94, 298, 400, 547, 204, 534, 155, 271, 305, 210, 644, 537, 109, 326, 167, 184, 592, 300, 329, 115, 549, 387, 157, 306, 225, 769, 538, 110, 212, 416, 648, 279, 330, 550, 171, 579, 117, 389, 158, 226, 553, 770, 308, 337, 540, 608, 63, 199, 216, 332, 118, 173, 390, 283, 581, 554, 656, 228, 121, 338, 772, 393, 179, 295, 312, 448, 527, 561, 174, 582, 203, 285, 353, 122, 556, 394, 585, 340, 643, 181, 232, 776, 562, 95, 299, 401, 672, 286, 205, 354, 535, 586, 124, 396, 182, 211, 645, 327, 344, 564, 185, 402, 593, 301, 206, 240, 784, 356, 307, 588, 646, 539, 111, 213, 417, 186, 594, 302, 649, 404, 331, 551, 568, 704, 159, 227, 771, 309, 360, 214, 541, 418, 609, 650, 188, 596, 217, 800, 333, 119, 391, 408, 555, 310, 657, 229, 339, 773, 542, 610, 420, 313, 449, 218, 652, 334, 368, 175, 583, 600, 658, 230, 123, 557, 774, 395, 341, 314, 612, 233, 450, 777, 563, 220, 424, 832, 673, 287, 355, 558, 660, 587, 125, 342, 397, 183, 234, 778, 316, 452, 345, 565, 403, 616, 674, 207, 241, 785, 357, 126, 398, 589, 432, 647, 664, 236, 346, 780, 566, 187, 595, 303, 405, 456, 242, 676, 569, 786, 358, 705, 590, 624, 896, 361, 215, 419, 348, 651, 189, 406, 597, 801, 570, 706, 244, 788, 409, 680, 311, 362, 464, 543, 611, 421, 190, 598, 219, 653, 802, 335, 369, 572, 410, 708, 601, 659, 231, 248, 775, 792, 364, 422, 315, 613, 451, 654, 688, 221, 370, 804, 425, 833, 602, 412, 480, 559, 661, 712, 343, 614, 235, 779, 317, 453, 222, 426, 617, 834, 372, 675, 604, 808, 662, 127, 399, 433, 318, 665, 237, 454, 347, 781, 567, 618, 720, 428, 836, 457, 243, 677, 787, 359, 376, 591, 434, 625, 897, 666, 238, 782, 816, 349, 407, 620, 458, 678, 571, 707, 245, 789, 840, 626, 681, 898, 436, 363, 465, 668, 736, 350, 191, 599, 803, 460, 246, 573, 790, 411, 709, 682, 628, 249, 466, 900, 793, 365, 423, 440, 848, 655, 689, 371, 805, 574, 710, 603, 413, 481, 250, 684, 794, 366, 713, 468, 615, 632, 904, 690, 223, 806, 427, 835, 373, 414, 605, 482, 809, 663, 714, 252, 796, 864, 319, 455, 472, 692, 619, 374, 721, 429, 837, 606, 810, 912, 484, 377, 435, 716, 667, 239, 783, 817, 722, 430, 621, 838, 459, 679, 696, 378, 812, 841, 627, 899, 437, 488, 669, 818, 737, 351, 622, 724, 928, 461, 247, 791, 842, 380, 683, 438, 629, 467, 901, 670, 738, 820, 441, 849, 462, 496, 575, 711, 728, 844, 630, 251, 685, 902, 795, 367, 469, 442, 740, 633, 850, 905, 691, 807, 824, 960, 415, 483, 686, 715, 253, 470, 797, 865, 634, 906, 444, 852, 473, 693, 744, 375, 607, 811, 913, 485, 254, 798, 717, 866, 636, 474, 908, 694, 723, 431, 839, 856, 697, 914, 486, 379, 813, 718, 752, 868, 489, 819, 476, 623, 725, 929, 698, 814, 916, 843, 381, 439, 490, 671, 739, 821, 872, 726, 930, 463, 497, 700, 382, 729, 845, 631, 903, 920, 492, 822, 443, 741, 851, 498, 932, 825, 961, 730, 846, 880, 687, 471, 742, 635, 907, 445, 853, 826, 745, 962, 500, 732, 936, 255, 799, 867, 446, 637, 854, 475, 909, 695, 746, 828, 964, 857, 915, 487, 504, 719, 753, 869, 638, 910, 944, 477, 748, 858, 699, 815, 917, 968, 754, 870, 491, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 884, 505, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 886, 507, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q9_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 137, 516, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 139, 518, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 153, 532, 269, 55, 106, 208, 324, 165, 275, 546, 79, 113, 385, 154, 270, 304, 519, 536, 108, 166, 59, 195, 277, 328, 114, 169, 548, 386, 577, 156, 224, 768, 87, 291, 523, 61, 278, 197, 170, 578, 116, 388, 281, 552, 336, 143, 177, 293, 62, 198, 91, 525, 172, 282, 201, 580, 531, 103, 120, 392, 178, 294, 641, 323, 526, 560, 93, 297, 151, 202, 284, 352, 533, 584, 642, 180, 107, 209, 325, 94, 298, 400, 547, 204, 155, 534, 271, 305, 210, 644, 537, 109, 326, 167, 184, 592, 300, 329, 115, 549, 387, 157, 306, 225, 769, 538, 110, 212, 416, 648, 279, 330, 171, 550, 579, 117, 389, 158, 226, 553, 770, 308, 337, 540, 608, 63, 199, 216, 332, 118, 173, 390, 283, 581, 554, 656, 228, 121, 338, 393, 772, 179, 295, 312, 448, 527, 561, 174, 203, 582, 285, 353, 122, 556, 394, 585, 340, 643, 181, 232, 776, 562, 95, 299, 401, 672, 286, 205, 354, 535, 586, 124, 396, 182, 211, 645, 327, 344, 185, 564, 402, 593, 301, 206, 240, 784, 356, 307, 588, 646, 539, 111, 213, 417, 186, 594, 302, 649, 404, 331, 551, 568, 704, 159, 227, 771, 309, 360, 214, 541, 418, 609, 650, 188, 217, 596, 800, 333, 119, 391, 408, 555, 310, 657, 229, 339, 773, 542, 610, 420, 313, 449, 218, 652, 334, 368, 175, 583, 600, 658, 230, 123, 557, 395, 774, 341, 314, 233, 612, 450, 777, 563, 220, 424, 832, 673, 287, 355, 558, 660, 587, 125, 342, 397, 183, 234, 778, 316, 452, 345, 565, 403, 616, 674, 207, 241, 785, 357, 126, 398, 589, 432, 647, 664, 236, 346, 780, 187, 566, 595, 303, 405, 456, 242, 676, 569, 786, 358, 705, 590, 624, 896, 361, 215, 419, 348, 651, 189, 406, 597, 801, 570, 706, 244, 409, 788, 680, 311, 362, 464, 543, 611, 421, 190, 219, 598, 653, 802, 335, 369, 572, 410, 708, 601, 659, 231, 248, 775, 792, 364, 422, 315, 613, 451, 654, 688, 221, 370, 425, 804, 833, 602, 412, 480, 559, 661, 712, 343, 235, 614, 779, 317, 453, 222, 426, 617, 834, 372, 675, 604, 808, 662, 127, 399, 433, 318, 665, 237, 454, 347, 781, 567, 618, 720, 428, 457, 836, 243, 677, 787, 359, 376, 591, 434, 625, 897, 666, 238, 782, 816, 349, 407, 620, 458, 678, 571, 707, 245, 789, 840, 626, 681, 898, 436, 363, 465, 668, 736, 350, 191, 599, 803, 460, 246, 573, 411, 790, 709, 682, 249, 628, 466, 900, 793, 365, 423, 440, 848, 655, 689, 371, 805, 574, 710, 603, 413, 481, 250, 684, 794, 366, 713, 468, 615, 632, 904, 690, 223, 427, 806, 835, 373, 414, 605, 482, 809, 663, 714, 252, 796, 864, 319, 455, 472, 692, 619, 374, 721, 429, 837, 606, 810, 912, 484, 377, 435, 716, 667, 239, 783, 817, 722, 430, 621, 459, 838, 679, 696, 378, 812, 841, 627, 899, 437, 488, 669, 818, 737, 351, 622, 724, 928, 461, 247, 791, 842, 380, 683, 438, 629, 467, 901, 670, 738, 441, 820, 849, 462, 496, 575, 711, 728, 844, 251, 630, 685, 902, 795, 367, 469, 442, 740, 633, 850, 905, 691, 807, 824, 960, 415, 483, 686, 715, 253, 470, 797, 865, 634, 906, 444, 473, 852, 693, 744, 375, 607, 811, 913, 485, 254, 798, 717, 866, 636, 474, 908, 694, 723, 431, 839, 856, 697, 914, 486, 379, 813, 718, 752, 489, 868, 819, 476, 623, 725, 929, 698, 814, 916, 843, 381, 439, 490, 671, 739, 821, 872, 726, 930, 463, 497, 700, 382, 729, 845, 631, 903, 920, 492, 443, 822, 741, 851, 498, 932, 825, 961, 730, 846, 880, 687, 471, 742, 635, 907, 445, 853, 826, 745, 962, 500, 732, 936, 255, 799, 867, 446, 637, 475, 854, 909, 695, 746, 828, 964, 857, 915, 487, 504, 719, 753, 869, 638, 910, 944, 477, 748, 858, 699, 815, 917, 968, 754, 491, 870, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 505, 884, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 507, 886, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q1_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 257, 26, 136, 38, 67, 41, 258, 28, 96, 69, 42, 144, 260, 15, 49, 70, 44, 73, 131, 264, 50, 513, 160, 23, 74, 133, 514, 52, 81, 272, 76, 134, 27, 82, 137, 516, 39, 56, 192, 259, 29, 97, 138, 84, 288, 520, 43, 145, 261, 30, 98, 140, 71, 88, 146, 45, 262, 528, 100, 265, 51, 320, 161, 46, 148, 75, 266, 515, 53, 104, 162, 273, 544, 77, 135, 152, 268, 54, 83, 517, 164, 57, 274, 193, 78, 112, 384, 139, 518, 85, 289, 58, 194, 521, 276, 168, 576, 31, 99, 86, 141, 290, 522, 60, 196, 89, 147, 263, 280, 529, 101, 142, 176, 292, 321, 90, 524, 47, 149, 200, 530, 102, 267, 640, 105, 322, 163, 92, 296, 150, 545, 153, 532, 269, 55, 106, 208, 324, 165, 275, 546, 79, 113, 385, 154, 270, 304, 519, 536, 108, 166, 59, 195, 277, 328, 114, 169, 548, 386, 577, 156, 224, 768, 87, 291, 523, 61, 278, 197, 170, 578, 116, 388, 281, 552, 143, 336, 177, 293, 62, 198, 91, 525, 172, 282, 201, 580, 531, 103, 120, 392, 178, 294, 641, 323, 526, 560, 93, 297, 151, 202, 284, 352, 533, 584, 642, 180, 107, 209, 325, 94, 298, 400, 547, 204, 155, 534, 271, 305, 210, 644, 537, 109, 326, 167, 184, 592, 300, 329, 115, 549, 387, 157, 306, 225, 769, 538, 110, 212, 416, 648, 279, 330, 171, 550, 579, 117, 389, 158, 226, 553, 770, 308, 337, 540, 608, 63, 199, 216, 332, 118, 173, 390, 283, 581, 554, 656, 228, 121, 338, 393, 772, 179, 295, 312, 448, 527, 561, 174, 203, 582, 285, 353, 122, 556, 394, 585, 340, 643, 181, 232, 776, 562, 95, 299, 401, 286, 672, 205, 354, 535, 586, 124, 396, 182, 211, 645, 327, 344, 185, 564, 402, 593, 301, 206, 240, 784, 356, 307, 588, 646, 539, 111, 213, 417, 186, 594, 302, 649, 404, 331, 551, 568, 704, 159, 227, 771, 309, 360, 214, 541, 418, 609, 650, 188, 217, 596, 800, 333, 119, 391, 408, 555, 310, 657, 229, 339, 773, 542, 610, 420, 313, 449, 218, 652, 334, 175, 368, 583, 600, 658, 230, 123, 557, 395, 774, 341, 314, 233, 612, 450, 777, 563, 220, 424, 832, 287, 673, 355, 558, 660, 587, 125, 342, 397, 183, 234, 778, 316, 452, 345, 565, 403, 616, 674, 207, 241, 785, 357, 126, 398, 589, 432, 647, 664, 236, 346, 780, 187, 566, 595, 303, 405, 456, 242, 676, 569, 786, 358, 705, 590, 624, 896, 361, 215, 419, 348, 651, 189, 406, 597, 801, 570, 706, 244, 409, 788, 680, 311, 362, 464, 543, 611, 421, 190, 219, 598, 653, 802, 335, 369, 572, 410, 708, 601, 659, 231, 248, 775, 792, 364, 422, 315, 613, 451, 654, 688, 221, 370, 425, 804, 833, 602, 412, 480, 559, 661, 712, 343, 235, 614, 779, 317, 453, 222, 426, 617, 834, 372, 675, 604, 808, 662, 127, 399, 433, 318, 665, 237, 454, 347, 781, 567, 618, 720, 428, 457, 836, 243, 677, 787, 359, 376, 591, 434, 625, 897, 666, 238, 782, 816, 349, 407, 620, 458, 678, 571, 707, 245, 789, 840, 626, 681, 898, 436, 363, 465, 668, 350, 736, 191, 599, 803, 460, 246, 573, 411, 790, 709, 682, 249, 628, 466, 900, 793, 365, 423, 440, 655, 848, 689, 371, 805, 574, 710, 603, 413, 481, 250, 684, 794, 366, 713, 468, 615, 632, 904, 690, 223, 427, 806, 835, 373, 414, 605, 482, 809, 663, 714, 252, 796, 864, 319, 455, 472, 692, 619, 374, 721, 429, 837, 606, 810, 912, 484, 377, 435, 716, 667, 239, 783, 817, 722, 430, 621, 459, 838, 679, 696, 378, 812, 841, 627, 899, 437, 488, 669, 818, 351, 737, 622, 724, 928, 461, 247, 791, 842, 380, 683, 438, 629, 467, 901, 670, 738, 441, 820, 849, 462, 496, 575, 711, 728, 844, 251, 630, 685, 902, 795, 367, 469, 442, 740, 633, 850, 905, 691, 807, 824, 960, 415, 483, 686, 715, 253, 470, 797, 865, 634, 906, 444, 473, 852, 693, 744, 375, 607, 811, 913, 485, 254, 798, 717, 866, 636, 474, 908, 694, 723, 431, 839, 856, 697, 914, 486, 379, 813, 718, 752, 489, 868, 819, 476, 623, 725, 929, 698, 814, 916, 843, 381, 439, 490, 671, 739, 821, 872, 726, 930, 463, 497, 700, 382, 729, 845, 631, 903, 920, 492, 443, 822, 741, 851, 498, 932, 825, 961, 730, 846, 687, 880, 471, 742, 635, 907, 445, 853, 826, 745, 962, 500, 732, 936, 255, 799, 867, 446, 637, 475, 854, 909, 695, 746, 828, 964, 857, 915, 487, 504, 719, 753, 869, 638, 910, 944, 477, 748, 858, 699, 815, 917, 968, 754, 491, 870, 478, 873, 727, 931, 860, 701, 918, 383, 756, 921, 493, 823, 874, 976, 499, 933, 702, 731, 847, 881, 922, 494, 743, 760, 876, 934, 827, 963, 501, 733, 882, 937, 924, 992, 447, 855, 747, 502, 829, 965, 734, 938, 505, 884, 639, 911, 945, 830, 749, 966, 859, 506, 940, 969, 755, 871, 888, 946, 479, 750, 861, 919, 970, 508, 757, 948, 875, 977, 862, 703, 972, 758, 923, 495, 761, 978, 877, 935, 952, 883, 925, 993, 762, 878, 980, 503, 735, 939, 885, 926, 994, 764, 831, 967, 984, 507, 886, 941, 996, 889, 947, 751, 942, 971, 509, 890, 949, 1000, 863, 510, 973, 759, 892, 950, 979, 953, 974, 1008, 763, 879, 981, 954, 927, 995, 765, 982, 956, 985, 887, 997, 766, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q11_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 132, 25, 80, 37, 26, 257, 136, 38, 67, 41, 258, 28, 96, 69, 42, 144, 260, 15, 49, 70, 44, 73, 131, 264, 50, 513, 160, 23, 74, 133, 52, 514, 81, 272, 76, 134, 27, 82, 137, 516, 39, 56, 192, 259, 29, 97, 138, 84, 288, 520, 43, 145, 30, 261, 98, 140, 71, 88, 146, 45, 262, 528, 100, 265, 51, 320, 161, 46, 148, 75, 266, 53, 515, 104, 162, 273, 544, 77, 135, 152, 268, 54, 83, 517, 164, 57, 274, 193, 78, 112, 384, 139, 518, 85, 58, 289, 194, 521, 276, 168, 576, 31, 99, 86, 141, 290, 60, 522, 196, 89, 147, 263, 280, 529, 101, 142, 176, 292, 90, 321, 524, 47, 149, 200, 530, 102, 267, 640, 105, 322, 163, 92, 296, 150, 545, 153, 532, 269, 55, 106, 208, 324, 165, 275, 546, 79, 113, 154, 385, 270, 304, 519, 536, 108, 166, 59, 195, 277, 328, 114, 169, 548, 386, 577, 156, 224, 768, 87, 291, 61, 523, 278, 197, 170, 116, 578, 388, 281, 552, 143, 336, 177, 62, 293, 198, 91, 525, 172, 282, 201, 580, 531, 103, 120, 392, 178, 294, 641, 323, 526, 560, 93, 297, 151, 202, 284, 352, 533, 584, 180, 642, 107, 209, 94, 325, 298, 400, 547, 204, 155, 534, 271, 305, 210, 644, 537, 109, 326, 167, 184, 592, 300, 329, 115, 549, 387, 157, 306, 225, 538, 110, 769, 212, 416, 279, 648, 330, 171, 550, 117, 579, 158, 389, 226, 553, 308, 770, 337, 540, 608, 63, 199, 216, 332, 118, 173, 390, 283, 581, 554, 656, 228, 121, 338, 393, 179, 772, 295, 312, 448, 527, 561, 174, 203, 582, 285, 122, 353, 556, 394, 585, 340, 181, 643, 232, 776, 562, 95, 299, 401, 286, 672, 205, 354, 535, 124, 586, 396, 182, 211, 645, 327, 344, 185, 564, 402, 593, 301, 206, 240, 784, 356, 307, 588, 646, 539, 111, 213, 186, 417, 594, 302, 649, 404, 331, 551, 568, 704, 159, 227, 309, 771, 360, 214, 541, 418, 609, 188, 650, 217, 596, 800, 333, 119, 391, 408, 555, 310, 657, 229, 339, 542, 773, 610, 420, 313, 218, 449, 652, 334, 175, 368, 583, 600, 658, 230, 123, 557, 395, 774, 341, 314, 233, 612, 450, 777, 563, 220, 424, 832, 287, 673, 355, 558, 660, 125, 587, 342, 397, 183, 234, 316, 778, 452, 345, 565, 403, 616, 674, 207, 241, 126, 785, 357, 398, 589, 432, 647, 664, 236, 346, 187, 780, 566, 595, 303, 405, 456, 242, 676, 569, 786, 358, 705, 590, 624, 896, 361, 215, 419, 348, 189, 651, 406, 597, 570, 801, 244, 706, 409, 788, 311, 680, 362, 464, 543, 611, 190, 421, 219, 598, 653, 802, 335, 369, 572, 410, 708, 601, 659, 231, 248, 775, 792, 364, 422, 315, 613, 451, 654, 688, 221, 370, 425, 804, 602, 833, 412, 480, 559, 661, 343, 712, 235, 614, 317, 779, 222, 453, 426, 617, 372, 834, 675, 604, 808, 662, 127, 399, 433, 318, 665, 237, 454, 347, 781, 567, 618, 720, 428, 457, 243, 836, 677, 787, 359, 376, 591, 434, 625, 666, 238, 897, 782, 816, 349, 407, 620, 458, 678, 571, 245, 707, 789, 840, 626, 681, 436, 898, 363, 465, 668, 350, 736, 191, 599, 803, 460, 246, 573, 411, 790, 709, 682, 249, 628, 466, 900, 793, 365, 423, 440, 655, 848, 689, 371, 574, 805, 710, 603, 413, 250, 481, 684, 794, 366, 713, 468, 615, 632, 904, 690, 223, 427, 806, 373, 835, 414, 605, 482, 809, 663, 252, 714, 796, 864, 319, 455, 472, 692, 619, 374, 721, 429, 606, 837, 810, 912, 484, 377, 435, 716, 667, 239, 783, 817, 722, 430, 621, 459, 838, 679, 696, 378, 812, 841, 627, 437, 899, 488, 669, 818, 351, 737, 622, 724, 928, 461, 247, 791, 380, 842, 683, 438, 629, 467, 670, 901, 738, 441, 820, 849, 462, 496, 575, 711, 728, 251, 844, 630, 685, 902, 795, 367, 469, 442, 740, 633, 850, 905, 691, 807, 824, 960, 415, 483, 686, 253, 715, 470, 797, 634, 865, 444, 906, 473, 852, 693, 375, 744, 607, 811, 254, 913, 485, 798, 717, 866, 636, 474, 908, 694, 723, 431, 839, 856, 697, 914, 486, 379, 813, 718, 752, 489, 868, 819, 476, 623, 725, 698, 929, 814, 916, 381, 843, 439, 490, 671, 739, 821, 872, 726, 930, 463, 497, 700, 382, 729, 845, 631, 903, 920, 492, 443, 822, 741, 851, 498, 932, 825, 730, 961, 846, 687, 880, 471, 742, 635, 445, 907, 853, 826, 745, 500, 962, 732, 936, 255, 799, 867, 446, 637, 475, 854, 909, 695, 746, 828, 964, 857, 915, 487, 504, 719, 753, 638, 869, 910, 944, 477, 748, 858, 699, 815, 917, 968, 754, 491, 870, 478, 873, 727, 931, 860, 701, 918, 383, 756, 921, 493, 823, 874, 976, 499, 702, 933, 731, 847, 881, 922, 494, 743, 760, 876, 934, 827, 501, 963, 733, 882, 937, 924, 992, 447, 855, 747, 502, 829, 734, 965, 938, 505, 884, 639, 911, 945, 830, 749, 966, 859, 506, 940, 969, 755, 871, 888, 946, 479, 750, 861, 919, 508, 970, 757, 948, 875, 977, 862, 703, 972, 758, 923, 495, 761, 978, 877, 935, 952, 883, 925, 762, 993, 878, 980, 503, 735, 939, 885, 926, 994, 764, 831, 967, 984, 507, 886, 941, 996, 889, 947, 751, 942, 509, 971, 890, 949, 1000, 863, 510, 973, 759, 892, 950, 979, 953, 974, 1008, 763, 879, 981, 954, 927, 995, 765, 982, 956, 985, 887, 766, 997, 986, 943, 998, 891, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q12_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 516, 39, 56, 192, 259, 29, 97, 138, 84, 288, 520, 43, 145, 30, 261, 98, 140, 71, 88, 146, 45, 262, 100, 528, 51, 265, 320, 161, 46, 148, 75, 266, 53, 515, 104, 162, 273, 544, 77, 135, 152, 54, 268, 83, 517, 57, 164, 274, 193, 78, 112, 384, 139, 518, 85, 58, 289, 194, 521, 276, 168, 576, 31, 99, 86, 141, 290, 60, 522, 89, 196, 147, 263, 280, 101, 529, 142, 176, 292, 90, 321, 524, 47, 149, 200, 102, 530, 267, 105, 640, 322, 163, 92, 296, 150, 545, 153, 532, 55, 269, 106, 208, 324, 165, 275, 546, 79, 113, 154, 385, 270, 304, 519, 108, 536, 59, 166, 195, 277, 114, 328, 169, 548, 386, 577, 156, 224, 768, 87, 291, 61, 523, 278, 197, 170, 116, 578, 281, 388, 552, 143, 336, 177, 62, 293, 91, 198, 525, 172, 282, 201, 580, 103, 531, 120, 178, 392, 294, 641, 323, 526, 560, 93, 297, 151, 202, 284, 352, 533, 584, 180, 107, 642, 209, 94, 325, 298, 400, 547, 204, 155, 534, 271, 305, 210, 109, 537, 644, 326, 167, 184, 592, 300, 115, 329, 549, 387, 157, 306, 225, 110, 538, 769, 212, 416, 279, 648, 330, 171, 550, 117, 579, 158, 389, 226, 553, 308, 770, 337, 540, 608, 63, 199, 216, 118, 332, 173, 283, 390, 581, 554, 121, 228, 656, 338, 179, 393, 772, 295, 312, 448, 527, 561, 174, 203, 582, 285, 122, 353, 556, 394, 585, 340, 181, 643, 232, 562, 776, 95, 299, 401, 286, 672, 205, 354, 535, 124, 586, 182, 396, 211, 645, 327, 344, 185, 564, 402, 593, 301, 206, 240, 356, 784, 307, 588, 111, 539, 646, 213, 186, 417, 594, 302, 649, 404, 331, 551, 568, 704, 159, 227, 309, 771, 360, 214, 541, 418, 609, 188, 650, 217, 596, 800, 119, 333, 391, 408, 555, 310, 229, 657, 339, 542, 773, 610, 313, 420, 218, 449, 652, 334, 175, 368, 583, 600, 123, 230, 658, 557, 395, 774, 341, 314, 233, 612, 450, 563, 777, 220, 424, 832, 287, 673, 355, 558, 125, 660, 587, 342, 183, 397, 234, 316, 778, 345, 452, 565, 403, 616, 674, 207, 241, 126, 357, 785, 398, 589, 432, 647, 236, 664, 346, 187, 566, 780, 595, 303, 405, 242, 456, 569, 676, 358, 786, 705, 590, 624, 361, 896, 215, 419, 348, 189, 651, 406, 597, 570, 801, 244, 706, 409, 788, 311, 680, 362, 464, 543, 611, 190, 421, 219, 598, 653, 802, 335, 369, 572, 410, 601, 708, 231, 659, 248, 775, 364, 792, 315, 422, 613, 451, 654, 688, 221, 370, 425, 804, 602, 833, 412, 480, 559, 661, 343, 712, 235, 614, 317, 779, 222, 453, 426, 617, 372, 834, 675, 604, 808, 127, 662, 399, 433, 318, 237, 665, 347, 454, 567, 781, 618, 720, 428, 243, 457, 836, 677, 359, 787, 376, 591, 434, 625, 238, 666, 897, 782, 816, 349, 407, 620, 458, 571, 678, 245, 707, 789, 626, 840, 681, 436, 363, 898, 465, 668, 350, 736, 191, 599, 803, 246, 460, 573, 411, 790, 709, 682, 249, 628, 466, 365, 793, 900, 423, 440, 655, 848, 689, 371, 574, 805, 603, 710, 413, 250, 481, 684, 366, 794, 713, 468, 615, 632, 690, 904, 223, 427, 806, 373, 835, 414, 605, 482, 809, 663, 252, 714, 796, 864, 319, 455, 472, 692, 619, 374, 721, 429, 606, 837, 810, 377, 484, 912, 435, 716, 239, 667, 783, 817, 722, 430, 621, 459, 838, 679, 696, 378, 812, 627, 841, 437, 899, 488, 669, 818, 351, 737, 622, 724, 928, 247, 461, 791, 380, 842, 683, 438, 629, 467, 670, 901, 738, 441, 820, 849, 462, 496, 575, 711, 728, 251, 630, 844, 685, 367, 795, 902, 469, 442, 633, 740, 850, 691, 905, 807, 824, 960, 415, 483, 686, 253, 715, 470, 797, 634, 865, 444, 906, 473, 852, 693, 375, 744, 607, 811, 254, 485, 913, 798, 717, 866, 636, 474, 694, 908, 723, 431, 839, 856, 697, 379, 486, 914, 813, 718, 752, 489, 868, 819, 476, 623, 725, 698, 929, 814, 381, 916, 843, 439, 490, 671, 739, 821, 872, 726, 930, 463, 497, 700, 382, 729, 631, 845, 903, 492, 920, 443, 822, 741, 851, 498, 825, 932, 730, 961, 846, 687, 880, 471, 635, 742, 445, 907, 853, 826, 745, 500, 962, 732, 936, 255, 799, 867, 446, 637, 475, 854, 695, 909, 746, 828, 857, 964, 487, 915, 504, 719, 753, 638, 869, 910, 944, 477, 748, 858, 699, 815, 917, 754, 968, 491, 870, 478, 873, 727, 931, 860, 701, 383, 918, 756, 493, 921, 823, 874, 976, 499, 702, 933, 731, 847, 881, 494, 922, 743, 760, 876, 827, 934, 501, 963, 733, 882, 937, 924, 992, 447, 855, 747, 502, 829, 734, 965, 938, 505, 884, 639, 911, 945, 830, 749, 859, 966, 506, 940, 755, 969, 871, 888, 946, 479, 750, 861, 919, 508, 970, 757, 948, 875, 977, 862, 703, 758, 972, 495, 923, 761, 978, 877, 935, 952, 883, 925, 762, 993, 878, 980, 503, 735, 939, 885, 926, 994, 764, 831, 967, 984, 507, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q13_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 516, 39, 56, 192, 259, 29, 97, 138, 84, 288, 520, 43, 145, 30, 261, 98, 140, 71, 88, 146, 45, 262, 100, 528, 51, 265, 320, 161, 46, 148, 75, 266, 53, 515, 104, 162, 273, 544, 77, 135, 152, 54, 268, 83, 517, 57, 164, 274, 193, 78, 112, 384, 139, 518, 85, 58, 289, 194, 521, 276, 168, 576, 31, 99, 86, 141, 290, 60, 522, 89, 196, 147, 263, 280, 101, 529, 142, 176, 292, 90, 321, 524, 47, 149, 200, 102, 530, 267, 105, 640, 322, 163, 92, 296, 150, 545, 153, 532, 55, 269, 106, 208, 324, 165, 275, 546, 79, 113, 154, 385, 270, 304, 519, 108, 536, 59, 166, 195, 277, 114, 328, 169, 548, 386, 577, 156, 224, 87, 768, 291, 61, 523, 278, 197, 170, 116, 578, 281, 388, 552, 143, 336, 177, 62, 293, 91, 198, 525, 172, 282, 201, 580, 103, 531, 120, 178, 392, 294, 641, 323, 526, 560, 93, 297, 151, 202, 284, 352, 533, 584, 180, 107, 642, 209, 94, 325, 298, 400, 547, 204, 155, 534, 271, 305, 210, 109, 537, 644, 326, 167, 184, 592, 300, 115, 329, 549, 387, 157, 306, 225, 110, 538, 769, 212, 416, 279, 648, 330, 171, 550, 117, 579, 158, 389, 226, 553, 308, 770, 337, 540, 608, 63, 199, 216, 118, 332, 173, 283, 390, 581, 554, 121, 228, 656, 338, 179, 393, 772, 295, 312, 527, 448, 561, 174, 203, 582, 285, 122, 353, 556, 394, 585, 340, 181, 643, 232, 562, 95, 776, 299, 401, 286, 672, 205, 354, 535, 124, 586, 182, 396, 211, 645, 327, 344, 185, 564, 402, 593, 301, 206, 240, 356, 784, 307, 588, 111, 539, 646, 213, 186, 417, 594, 302, 649, 404, 331, 551, 568, 704, 159, 227, 309, 771, 360, 214, 541, 418, 609, 188, 650, 217, 596, 119, 800, 333, 391, 408, 555, 310, 229, 657, 339, 542, 773, 610, 313, 420, 218, 449, 652, 334, 175, 368, 583, 600, 123, 230, 658, 557, 395, 774, 341, 314, 233, 612, 450, 563, 777, 220, 424, 832, 287, 673, 355, 558, 125, 660, 587, 342, 183, 397, 234, 316, 778, 345, 452, 565, 403, 616, 674, 207, 241, 126, 357, 785, 398, 589, 432, 647, 236, 664, 346, 187, 566, 780, 595, 303, 405, 242, 456, 569, 676, 358, 786, 705, 590, 624, 361, 215, 896, 419, 348, 189, 651, 406, 597, 570, 801, 244, 706, 409, 788, 311, 680, 362, 543, 464, 611, 190, 421, 219, 598, 653, 802, 335, 369, 572, 410, 601, 708, 231, 659, 248, 775, 364, 792, 315, 422, 613, 451, 654, 688, 221, 370, 425, 804, 602, 833, 412, 559, 480, 661, 343, 712, 235, 614, 317, 779, 222, 453, 426, 617, 372, 834, 675, 604, 127, 808, 662, 399, 433, 318, 237, 665, 347, 454, 567, 781, 618, 720, 428, 243, 457, 836, 677, 359, 787, 376, 591, 434, 625, 238, 666, 897, 782, 816, 349, 407, 620, 458, 571, 678, 245, 707, 789, 626, 840, 681, 436, 363, 898, 465, 668, 350, 736, 191, 599, 803, 246, 460, 573, 411, 790, 709, 682, 249, 628, 466, 365, 793, 900, 423, 440, 655, 848, 689, 371, 574, 805, 603, 710, 413, 250, 481, 684, 366, 794, 713, 468, 615, 632, 690, 223, 904, 427, 806, 373, 835, 414, 605, 482, 809, 663, 252, 714, 796, 864, 319, 455, 472, 692, 619, 374, 721, 429, 606, 837, 810, 377, 484, 912, 435, 716, 239, 667, 783, 817, 722, 430, 621, 459, 838, 679, 696, 378, 812, 627, 841, 437, 899, 488, 669, 818, 351, 737, 622, 724, 247, 928, 461, 791, 380, 842, 683, 438, 629, 467, 670, 901, 738, 441, 820, 849, 462, 575, 496, 711, 728, 251, 630, 844, 685, 367, 795, 902, 469, 442, 633, 740, 850, 691, 905, 807, 824, 960, 415, 483, 686, 253, 715, 470, 797, 634, 865, 444, 906, 473, 852, 693, 375, 744, 607, 811, 254, 485, 913, 798, 717, 866, 636, 474, 694, 908, 723, 431, 839, 856, 697, 379, 486, 914, 813, 718, 752, 489, 868, 819, 476, 623, 725, 698, 929, 814, 381, 916, 843, 439, 490, 671, 739, 821, 872, 726, 930, 463, 497, 700, 382, 729, 631, 845, 903, 492, 920, 443, 822, 741, 851, 498, 825, 932, 730, 961, 846, 687, 880, 471, 635, 742, 445, 907, 853, 826, 745, 500, 962, 732, 255, 936, 799, 867, 446, 637, 475, 854, 695, 909, 746, 828, 857, 964, 487, 915, 504, 719, 753, 638, 869, 910, 944, 477, 748, 858, 699, 815, 917, 754, 968, 491, 870, 478, 873, 727, 931, 860, 701, 383, 918, 756, 493, 921, 823, 874, 976, 499, 702, 933, 731, 847, 881, 494, 922, 743, 760, 876, 827, 934, 501, 963, 733, 882, 937, 924, 992, 447, 855, 747, 502, 829, 734, 965, 938, 505, 884, 639, 911, 945, 830, 749, 859, 966, 506, 940, 755, 969, 871, 888, 946, 479, 750, 861, 919, 508, 970, 757, 948, 875, 977, 862, 703, 758, 972, 495, 923, 761, 978, 877, 935, 952, 883, 925, 762, 993, 878, 980, 503, 735, 939, 885, 926, 994, 764, 831, 967, 984, 507, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q14_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 516, 39, 56, 192, 259, 29, 97, 138, 84, 288, 520, 43, 145, 30, 261, 98, 140, 71, 88, 146, 45, 262, 100, 528, 51, 265, 320, 161, 46, 148, 75, 266, 53, 515, 104, 162, 273, 77, 544, 135, 152, 54, 268, 83, 517, 57, 164, 274, 193, 78, 112, 384, 139, 518, 85, 58, 289, 194, 521, 276, 168, 31, 576, 99, 86, 141, 290, 60, 522, 89, 196, 147, 263, 280, 101, 529, 142, 176, 292, 90, 321, 524, 47, 149, 200, 102, 530, 267, 105, 640, 322, 163, 92, 296, 150, 545, 153, 532, 55, 269, 106, 208, 324, 165, 275, 79, 546, 113, 154, 385, 270, 304, 519, 108, 536, 59, 166, 195, 277, 114, 328, 169, 548, 386, 577, 156, 224, 87, 768, 291, 61, 523, 278, 197, 170, 116, 578, 281, 388, 552, 143, 336, 177, 62, 293, 91, 198, 525, 172, 282, 201, 580, 103, 531, 120, 178, 392, 294, 641, 323, 526, 93, 560, 297, 151, 202, 284, 352, 533, 584, 180, 107, 642, 209, 94, 325, 298, 400, 547, 204, 155, 534, 271, 305, 210, 109, 537, 644, 326, 167, 184, 592, 300, 115, 329, 549, 387, 157, 306, 225, 110, 538, 769, 212, 416, 279, 648, 330, 171, 550, 117, 579, 158, 389, 226, 553, 308, 770, 337, 540, 63, 608, 199, 216, 118, 332, 173, 283, 390, 581, 554, 121, 228, 656, 338, 179, 393, 772, 295, 312, 527, 448, 561, 174, 203, 582, 285, 122, 353, 556, 394, 585, 340, 181, 643, 232, 95, 562, 776, 299, 401, 286, 205, 672, 354, 535, 124, 586, 182, 396, 211, 645, 327, 344, 185, 564, 402, 593, 301, 206, 240, 356, 784, 307, 588, 111, 539, 646, 213, 186, 417, 594, 302, 649, 404, 331, 551, 568, 159, 704, 227, 309, 771, 360, 214, 541, 418, 609, 188, 650, 217, 596, 119, 333, 800, 391, 408, 555, 310, 229, 657, 339, 542, 773, 610, 313, 420, 218, 449, 652, 334, 175, 368, 583, 600, 123, 230, 658, 557, 395, 774, 341, 314, 233, 612, 450, 563, 777, 220, 424, 287, 832, 673, 355, 558, 125, 660, 587, 342, 183, 397, 234, 316, 778, 345, 452, 565, 403, 616, 207, 674, 241, 126, 357, 785, 398, 589, 432, 647, 236, 664, 346, 187, 566, 780, 595, 303, 405, 242, 456, 569, 676, 358, 786, 705, 590, 624, 361, 215, 896, 419, 348, 189, 651, 406, 597, 570, 801, 244, 706, 409, 788, 311, 680, 362, 543, 464, 611, 190, 421, 219, 598, 653, 335, 802, 369, 572, 410, 601, 708, 231, 659, 248, 775, 364, 792, 315, 422, 613, 451, 654, 221, 688, 370, 425, 804, 602, 833, 412, 559, 480, 661, 343, 712, 235, 614, 317, 779, 222, 453, 426, 617, 372, 834, 675, 604, 127, 808, 662, 399, 433, 318, 237, 665, 347, 454, 567, 781, 618, 720, 428, 243, 457, 836, 677, 359, 787, 376, 591, 434, 625, 238, 666, 897, 782, 349, 816, 407, 620, 458, 571, 678, 245, 707, 789, 626, 840, 681, 436, 363, 898, 465, 668, 350, 191, 736, 599, 803, 246, 460, 573, 411, 790, 709, 682, 249, 628, 466, 365, 793, 900, 423, 440, 655, 848, 689, 371, 574, 805, 603, 710, 413, 250, 481, 684, 366, 794, 713, 468, 615, 632, 223, 690, 904, 427, 806, 373, 835, 414, 605, 482, 809, 663, 252, 714, 796, 319, 864, 455, 472, 692, 619, 374, 721, 429, 606, 837, 810, 377, 484, 912, 435, 716, 239, 667, 783, 817, 722, 430, 621, 459, 838, 679, 696, 378, 812, 627, 841, 437, 899, 488, 669, 351, 818, 737, 622, 724, 247, 461, 928, 791, 380, 842, 683, 438, 629, 467, 670, 901, 738, 441, 820, 849, 462, 575, 496, 711, 728, 251, 630, 844, 685, 367, 795, 902, 469, 442, 633, 740, 850, 691, 905, 807, 824, 415, 960, 483, 686, 253, 715, 470, 797, 634, 865, 444, 906, 473, 852, 693, 375, 744, 607, 811, 254, 485, 913, 798, 717, 866, 636, 474, 694, 908, 723, 431, 839, 856, 697, 379, 486, 914, 813, 718, 752, 489, 868, 819, 476, 623, 725, 698, 929, 814, 381, 916, 843, 439, 490, 671, 739, 821, 872, 726, 463, 930, 497, 700, 382, 729, 631, 845, 903, 492, 920, 443, 822, 741, 851, 498, 825, 932, 730, 961, 846, 687, 880, 471, 635, 742, 445, 907, 853, 826, 745, 500, 962, 732, 255, 936, 799, 867, 446, 637, 475, 854, 695, 909, 746, 828, 857, 964, 487, 915, 504, 719, 753, 638, 869, 910, 477, 944, 748, 858, 699, 815, 917, 754, 968, 491, 870, 478, 873, 727, 931, 860, 701, 383, 918, 756, 493, 921, 823, 874, 976, 499, 702, 933, 731, 847, 881, 494, 922, 743, 760, 876, 827, 934, 501, 963, 733, 882, 937, 924, 447, 992, 855, 747, 502, 829, 734, 965, 938, 505, 884, 639, 911, 945, 830, 749, 859, 966, 506, 940, 755, 969, 871, 888, 479, 946, 750, 861, 919, 508, 970, 757, 948, 875, 977, 862, 703, 758, 972, 495, 923, 761, 978, 877, 935, 952, 883, 925, 762, 993, 878, 980, 503, 735, 939, 885, 926, 994, 764, 831, 967, 984, 507, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q15_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 516, 39, 56, 192, 259, 29, 97, 138, 84, 288, 520, 43, 145, 30, 261, 98, 140, 71, 88, 146, 45, 262, 100, 528, 51, 265, 320, 161, 46, 75, 148, 266, 53, 515, 104, 162, 273, 77, 544, 135, 152, 54, 268, 83, 517, 57, 164, 274, 193, 78, 112, 384, 139, 518, 85, 58, 289, 194, 521, 276, 168, 31, 576, 99, 86, 141, 290, 60, 522, 89, 196, 147, 263, 280, 101, 529, 142, 176, 292, 90, 321, 524, 47, 149, 200, 102, 530, 267, 105, 640, 322, 163, 92, 150, 296, 545, 153, 532, 55, 269, 106, 208, 324, 165, 275, 79, 546, 113, 154, 385, 270, 304, 519, 108, 536, 59, 166, 195, 277, 114, 328, 169, 548, 386, 577, 156, 224, 87, 768, 291, 61, 523, 278, 197, 170, 116, 578, 281, 388, 552, 143, 336, 177, 62, 293, 91, 198, 525, 172, 282, 201, 580, 103, 531, 120, 178, 392, 294, 641, 323, 526, 93, 560, 151, 297, 202, 284, 352, 533, 584, 107, 180, 642, 209, 94, 325, 298, 400, 547, 204, 155, 534, 271, 305, 210, 109, 537, 644, 326, 167, 184, 300, 592, 115, 329, 549, 387, 157, 306, 225, 110, 538, 769, 212, 416, 279, 648, 330, 171, 550, 117, 579, 158, 389, 226, 553, 308, 770, 337, 540, 63, 608, 199, 216, 118, 332, 173, 283, 390, 581, 554, 121, 228, 656, 338, 179, 393, 772, 295, 312, 527, 448, 561, 174, 203, 582, 285, 122, 353, 556, 394, 585, 340, 181, 643, 232, 95, 562, 776, 299, 401, 286, 205, 672, 354, 535, 124, 586, 182, 396, 211, 645, 327, 344, 185, 564, 402, 301, 593, 206, 240, 356, 784, 307, 588, 111, 539, 646, 213, 186, 417, 302, 594, 649, 331, 404, 551, 568, 159, 704, 227, 309, 771, 214, 360, 541, 418, 609, 188, 650, 217, 596, 119, 333, 800, 391, 408, 555, 310, 229, 657, 339, 542, 773, 610, 313, 420, 218, 449, 652, 334, 175, 368, 583, 600, 123, 230, 658, 557, 395, 774, 341, 314, 233, 612, 450, 563, 777, 220, 424, 287, 832, 673, 355, 558, 125, 587, 660, 342, 183, 397, 234, 316, 778, 345, 452, 565, 403, 616, 207, 674, 241, 126, 357, 785, 398, 589, 432, 647, 236, 664, 346, 187, 566, 780, 303, 595, 405, 242, 456, 569, 676, 358, 786, 705, 590, 624, 215, 361, 896, 419, 348, 189, 651, 406, 597, 570, 801, 244, 706, 409, 788, 311, 680, 362, 543, 464, 611, 190, 421, 219, 598, 653, 335, 802, 369, 572, 410, 601, 708, 231, 659, 248, 775, 364, 792, 315, 422, 613, 451, 654, 221, 688, 370, 425, 804, 602, 833, 412, 559, 480, 661, 343, 712, 235, 614, 317, 779, 222, 453, 426, 617, 372, 834, 675, 604, 127, 662, 808, 399, 433, 318, 237, 665, 347, 454, 567, 781, 618, 428, 720, 243, 457, 836, 677, 359, 787, 376, 591, 434, 625, 238, 666, 897, 782, 349, 816, 407, 620, 458, 571, 678, 245, 707, 789, 626, 840, 681, 363, 436, 898, 465, 668, 350, 191, 736, 599, 803, 246, 460, 573, 411, 790, 709, 682, 249, 628, 466, 365, 793, 900, 423, 440, 655, 848, 689, 371, 574, 805, 603, 710, 413, 250, 481, 684, 366, 794, 713, 468, 615, 632, 223, 690, 904, 427, 806, 373, 835, 414, 605, 482, 663, 809, 252, 714, 796, 319, 864, 455, 472, 619, 692, 374, 429, 721, 606, 837, 810, 377, 484, 912, 435, 716, 239, 667, 783, 817, 430, 722, 621, 459, 838, 679, 696, 378, 812, 627, 841, 437, 899, 488, 669, 351, 818, 737, 622, 724, 247, 461, 928, 791, 380, 842, 683, 438, 629, 467, 670, 901, 738, 441, 820, 849, 462, 575, 496, 711, 728, 251, 630, 844, 685, 367, 795, 902, 469, 442, 633, 740, 850, 691, 905, 807, 824, 415, 960, 483, 686, 253, 715, 470, 797, 634, 865, 444, 906, 473, 852, 693, 375, 744, 607, 811, 254, 485, 913, 798, 717, 866, 636, 474, 694, 908, 431, 723, 839, 856, 697, 379, 486, 914, 813, 718, 752, 489, 868, 819, 476, 623, 725, 698, 929, 814, 381, 843, 916, 439, 490, 671, 739, 821, 726, 872, 463, 930, 497, 700, 382, 729, 631, 845, 903, 492, 920, 443, 822, 741, 851, 498, 825, 932, 730, 961, 846, 687, 880, 471, 635, 742, 445, 907, 853, 826, 745, 500, 962, 732, 255, 936, 799, 867, 446, 637, 475, 854, 695, 909, 746, 828, 857, 964, 487, 915, 504, 719, 753, 638, 869, 910, 477, 944, 748, 858, 699, 815, 917, 754, 968, 491, 870, 478, 727, 873, 931, 860, 701, 383, 918, 756, 493, 921, 823, 874, 976, 499, 702, 933, 731, 847, 881, 494, 922, 743, 760, 876, 827, 934, 501, 963, 733, 882, 937, 924, 447, 992, 855, 747, 502, 829, 734, 965, 938, 505, 884, 639, 911, 945, 830, 749, 859, 966, 506, 940, 755, 969, 871, 888, 479, 946, 750, 861, 919, 508, 970, 757, 875, 948, 977, 862, 703, 758, 972, 495, 923, 761, 978, 877, 935, 952, 883, 925, 762, 993, 878, 980, 503, 735, 939, 885, 926, 994, 764, 831, 967, 984, 507, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q16_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 512, 35, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 516, 39, 56, 192, 259, 29, 97, 138, 84, 288, 520, 43, 145, 30, 261, 98, 140, 71, 88, 146, 45, 262, 100, 528, 51, 265, 320, 161, 46, 75, 148, 266, 53, 515, 104, 162, 273, 77, 544, 135, 152, 54, 268, 83, 517, 57, 164, 274, 193, 78, 112, 384, 139, 518, 85, 58, 289, 194, 521, 276, 168, 31, 576, 99, 86, 141, 290, 60, 522, 89, 196, 147, 263, 280, 101, 529, 142, 176, 292, 90, 321, 524, 47, 149, 200, 102, 530, 267, 105, 640, 322, 163, 92, 150, 296, 545, 153, 532, 55, 269, 106, 208, 324, 165, 275, 79, 546, 113, 154, 385, 270, 304, 519, 108, 536, 59, 166, 195, 277, 114, 328, 169, 548, 386, 577, 156, 224, 87, 768, 291, 61, 523, 278, 197, 170, 116, 578, 281, 388, 552, 143, 336, 177, 62, 293, 91, 198, 525, 172, 282, 201, 580, 103, 531, 120, 178, 392, 294, 641, 323, 526, 93, 560, 151, 297, 202, 284, 352, 533, 584, 107, 180, 642, 209, 94, 325, 298, 400, 547, 204, 155, 534, 271, 305, 210, 109, 537, 644, 326, 167, 184, 300, 592, 115, 329, 549, 387, 157, 306, 225, 110, 538, 212, 769, 416, 279, 648, 330, 171, 550, 117, 579, 158, 389, 226, 553, 308, 770, 337, 540, 63, 608, 199, 216, 118, 332, 173, 283, 390, 581, 554, 121, 228, 656, 338, 179, 393, 772, 295, 312, 527, 448, 561, 174, 203, 582, 285, 122, 353, 556, 394, 585, 340, 181, 643, 232, 95, 562, 776, 299, 401, 286, 205, 672, 354, 535, 124, 586, 182, 396, 211, 645, 327, 344, 185, 564, 402, 301, 593, 206, 240, 356, 784, 307, 588, 111, 539, 646, 213, 186, 417, 302, 594, 649, 331, 404, 551, 568, 159, 704, 227, 309, 214, 771, 360, 541, 418, 609, 188, 650, 217, 596, 119, 333, 800, 391, 408, 555, 310, 229, 657, 339, 542, 773, 610, 313, 420, 218, 449, 652, 334, 175, 368, 583, 600, 123, 230, 658, 557, 395, 774, 341, 314, 233, 612, 450, 563, 220, 777, 424, 287, 832, 673, 355, 558, 125, 587, 660, 342, 183, 397, 234, 316, 778, 345, 452, 565, 403, 616, 207, 674, 241, 126, 357, 785, 398, 589, 432, 647, 236, 664, 346, 187, 566, 780, 303, 595, 405, 242, 456, 569, 676, 358, 786, 705, 590, 624, 215, 361, 896, 419, 348, 189, 651, 406, 597, 570, 244, 801, 706, 409, 788, 311, 680, 362, 543, 464, 611, 190, 421, 219, 598, 653, 335, 802, 369, 572, 410, 601, 708, 231, 659, 248, 775, 364, 792, 315, 422, 613, 451, 654, 221, 688, 370, 425, 804, 602, 833, 412, 559, 480, 661, 343, 712, 235, 614, 317, 222, 779, 453, 426, 617, 372, 834, 675, 604, 127, 662, 808, 399, 433, 318, 237, 665, 347, 454, 567, 781, 618, 428, 720, 243, 457, 836, 677, 359, 787, 376, 591, 434, 625, 238, 666, 897, 782, 349, 816, 407, 620, 458, 571, 678, 245, 707, 789, 626, 840, 681, 363, 436, 898, 465, 668, 350, 191, 736, 599, 246, 803, 460, 573, 411, 790, 709, 682, 249, 628, 466, 365, 793, 900, 423, 440, 655, 848, 689, 371, 574, 805, 603, 710, 413, 250, 481, 684, 366, 794, 713, 468, 615, 632, 223, 690, 904, 427, 806, 373, 835, 414, 605, 482, 663, 252, 809, 714, 796, 319, 864, 455, 472, 619, 692, 374, 429, 721, 606, 837, 810, 377, 484, 912, 435, 716, 239, 667, 783, 817, 430, 722, 621, 459, 838, 679, 696, 378, 812, 627, 841, 437, 899, 488, 669, 351, 818, 737, 622, 724, 247, 461, 928, 791, 380, 842, 683, 438, 629, 467, 670, 901, 738, 441, 820, 849, 462, 575, 496, 711, 728, 251, 630, 844, 685, 367, 795, 902, 469, 442, 633, 740, 850, 691, 905, 807, 824, 415, 960, 483, 686, 253, 715, 470, 797, 634, 865, 444, 906, 473, 852, 693, 375, 744, 607, 254, 811, 485, 913, 798, 717, 866, 636, 474, 694, 908, 431, 723, 839, 856, 697, 379, 486, 914, 813, 718, 752, 489, 868, 819, 476, 623, 725, 698, 929, 814, 381, 843, 916, 439, 490, 671, 739, 821, 726, 872, 463, 930, 497, 700, 382, 729, 631, 845, 903, 492, 920, 443, 822, 741, 851, 498, 825, 932, 730, 961, 846, 687, 880, 471, 635, 742, 445, 907, 853, 826, 745, 500, 962, 732, 255, 936, 799, 867, 446, 637, 475, 854, 695, 909, 746, 828, 857, 964, 487, 915, 504, 719, 753, 638, 869, 910, 477, 944, 748, 858, 699, 815, 917, 754, 968, 491, 870, 478, 727, 873, 931, 860, 701, 383, 918, 756, 493, 921, 823, 874, 976, 499, 702, 933, 731, 847, 881, 494, 922, 743, 760, 876, 827, 934, 501, 963, 733, 882, 937, 924, 447, 992, 855, 747, 502, 829, 734, 965, 938, 505, 884, 639, 911, 945, 830, 749, 859, 966, 506, 940, 755, 969, 871, 888, 479, 946, 750, 861, 919, 508, 970, 757, 875, 948, 977, 862, 703, 758, 972, 495, 923, 761, 978, 877, 935, 952, 883, 925, 762, 993, 878, 980, 503, 735, 939, 885, 926, 994, 764, 831, 967, 984, 507, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 988, 511, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q17_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 514, 81, 272, 76, 27, 134, 82, 137, 39, 516, 56, 192, 259, 29, 97, 138, 84, 288, 43, 520, 145, 30, 261, 98, 140, 71, 88, 146, 45, 262, 100, 51, 528, 265, 161, 320, 46, 75, 148, 266, 53, 515, 104, 162, 273, 77, 544, 135, 152, 54, 268, 83, 517, 57, 164, 274, 193, 78, 112, 384, 139, 518, 85, 58, 289, 194, 521, 276, 168, 31, 99, 576, 86, 141, 290, 60, 522, 89, 196, 147, 263, 280, 101, 529, 142, 176, 292, 90, 321, 47, 524, 149, 200, 102, 530, 267, 105, 163, 322, 640, 92, 150, 296, 545, 153, 55, 532, 269, 106, 208, 165, 324, 275, 79, 546, 113, 154, 385, 270, 304, 519, 108, 59, 536, 166, 195, 277, 114, 169, 328, 548, 386, 577, 156, 224, 87, 291, 768, 61, 523, 278, 197, 170, 116, 578, 281, 388, 552, 143, 177, 336, 62, 293, 91, 198, 525, 172, 282, 201, 103, 580, 531, 120, 178, 392, 294, 323, 641, 526, 93, 560, 151, 297, 202, 284, 352, 533, 107, 584, 180, 642, 209, 94, 325, 298, 400, 547, 204, 155, 534, 271, 305, 210, 109, 537, 167, 326, 644, 184, 300, 115, 592, 329, 549, 387, 157, 306, 225, 110, 538, 212, 769, 416, 279, 171, 330, 648, 550, 117, 579, 158, 389, 226, 553, 308, 770, 337, 63, 540, 608, 199, 216, 118, 173, 332, 283, 390, 581, 554, 121, 228, 179, 338, 656, 393, 295, 772, 312, 527, 448, 561, 174, 203, 582, 285, 122, 353, 556, 394, 585, 181, 340, 643, 232, 95, 562, 299, 776, 401, 286, 205, 354, 672, 535, 124, 586, 182, 396, 211, 327, 645, 185, 344, 564, 402, 301, 593, 206, 240, 356, 307, 784, 111, 588, 539, 646, 213, 186, 417, 302, 594, 331, 649, 404, 551, 568, 159, 227, 704, 309, 214, 771, 360, 541, 418, 609, 188, 650, 217, 119, 596, 333, 800, 391, 408, 555, 310, 229, 339, 657, 542, 773, 610, 313, 420, 218, 449, 175, 334, 652, 368, 583, 123, 600, 230, 658, 557, 395, 774, 341, 314, 233, 612, 450, 563, 220, 777, 424, 287, 355, 673, 832, 558, 125, 587, 183, 342, 660, 397, 234, 316, 778, 345, 452, 565, 403, 616, 207, 674, 241, 126, 357, 785, 398, 589, 432, 647, 236, 187, 346, 664, 566, 303, 780, 595, 405, 242, 456, 569, 358, 676, 786, 705, 590, 624, 215, 361, 419, 896, 189, 348, 651, 406, 597, 570, 244, 801, 706, 409, 311, 788, 362, 680, 543, 464, 611, 190, 421, 219, 598, 335, 653, 802, 369, 572, 410, 601, 231, 708, 659, 248, 775, 364, 315, 792, 422, 613, 451, 654, 221, 370, 688, 425, 804, 602, 833, 412, 559, 480, 343, 661, 235, 712, 614, 317, 222, 779, 453, 426, 617, 372, 675, 834, 127, 604, 662, 808, 399, 433, 318, 237, 347, 665, 454, 567, 781, 618, 428, 243, 720, 457, 359, 677, 836, 787, 376, 591, 434, 625, 238, 666, 897, 782, 349, 816, 407, 620, 458, 571, 678, 245, 707, 789, 626, 363, 681, 840, 436, 898, 465, 191, 350, 668, 736, 599, 246, 803, 460, 573, 411, 790, 709, 682, 249, 628, 466, 365, 793, 423, 900, 440, 655, 371, 689, 848, 574, 805, 603, 710, 413, 250, 481, 366, 684, 794, 713, 468, 615, 632, 223, 690, 427, 904, 806, 373, 835, 414, 605, 482, 663, 252, 809, 714, 319, 796, 864, 455, 472, 619, 374, 692, 429, 721, 606, 837, 810, 377, 484, 435, 912, 239, 716, 667, 783, 817, 430, 722, 621, 459, 679, 838, 378, 696, 812, 627, 841, 437, 899, 488, 351, 669, 818, 737, 622, 247, 724, 461, 928, 791, 380, 683, 842, 438, 629, 467, 670, 901, 738, 441, 820, 849, 462, 575, 496, 711, 251, 728, 630, 367, 685, 844, 795, 902, 469, 442, 633, 740, 691, 850, 905, 807, 824, 415, 483, 960, 686, 253, 715, 470, 797, 634, 865, 444, 906, 473, 375, 693, 852, 744, 607, 254, 811, 485, 913, 798, 717, 866, 636, 474, 694, 431, 908, 723, 839, 379, 697, 856, 486, 914, 813, 718, 752, 489, 868, 819, 476, 623, 725, 698, 929, 814, 381, 843, 439, 916, 490, 671, 739, 821, 726, 872, 463, 930, 497, 382, 700, 729, 631, 845, 903, 492, 443, 920, 822, 741, 851, 498, 825, 932, 730, 961, 687, 846, 880, 471, 635, 742, 445, 907, 853, 826, 745, 500, 962, 255, 732, 936, 799, 867, 446, 637, 475, 695, 854, 909, 746, 828, 857, 487, 964, 915, 504, 719, 753, 638, 869, 910, 477, 944, 748, 699, 858, 815, 917, 754, 491, 968, 870, 478, 727, 873, 931, 383, 701, 860, 918, 756, 493, 921, 823, 874, 499, 976, 702, 933, 731, 847, 881, 494, 922, 743, 760, 876, 827, 934, 501, 963, 733, 882, 937, 447, 924, 992, 855, 747, 502, 829, 734, 965, 938, 505, 884, 639, 911, 945, 830, 749, 859, 966, 506, 940, 755, 969, 871, 888, 479, 946, 750, 861, 919, 508, 970, 757, 875, 948, 977, 703, 862, 758, 495, 972, 923, 761, 978, 877, 935, 952, 883, 925, 762, 993, 878, 503, 980, 735, 939, 885, 926, 994, 764, 831, 967, 507, 984, 886, 941, 889, 996, 947, 751, 942, 509, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q18_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 146, 45, 262, 100, 51, 528, 265, 161, 320, 46, 75, 148, 266, 53, 515, 104, 162, 273, 77, 544, 135, 152, 54, 268, 83, 517, 57, 164, 274, 193, 78, 112, 384, 139, 85, 518, 58, 289, 194, 521, 276, 168, 31, 99, 576, 86, 141, 290, 60, 89, 522, 196, 147, 263, 280, 101, 529, 142, 176, 292, 90, 321, 47, 524, 149, 200, 102, 530, 267, 105, 163, 322, 640, 92, 150, 296, 545, 153, 55, 532, 269, 106, 208, 165, 324, 275, 79, 113, 546, 154, 385, 270, 304, 519, 108, 59, 536, 166, 195, 277, 114, 169, 328, 548, 386, 156, 577, 224, 87, 291, 768, 61, 523, 278, 197, 170, 116, 578, 281, 388, 552, 143, 177, 336, 62, 293, 91, 198, 525, 172, 282, 201, 103, 580, 531, 120, 178, 392, 294, 323, 641, 93, 526, 560, 151, 297, 202, 284, 352, 533, 107, 584, 180, 209, 642, 94, 325, 298, 400, 547, 204, 155, 534, 271, 305, 210, 109, 537, 167, 326, 644, 184, 300, 115, 592, 329, 549, 387, 157, 306, 225, 110, 538, 212, 769, 416, 279, 171, 330, 648, 117, 550, 158, 579, 389, 226, 553, 308, 337, 770, 63, 540, 608, 199, 216, 118, 173, 332, 283, 390, 581, 121, 554, 228, 179, 338, 656, 393, 295, 772, 312, 527, 448, 561, 174, 203, 582, 285, 122, 353, 556, 394, 585, 181, 340, 643, 232, 95, 562, 299, 776, 401, 286, 205, 354, 672, 535, 124, 586, 182, 396, 211, 327, 645, 185, 344, 564, 402, 301, 593, 206, 240, 356, 307, 784, 111, 588, 539, 213, 646, 186, 417, 302, 594, 331, 649, 404, 551, 568, 159, 227, 704, 309, 214, 771, 360, 541, 418, 188, 609, 217, 650, 119, 596, 333, 800, 391, 408, 555, 310, 229, 339, 657, 542, 773, 610, 313, 420, 218, 449, 175, 334, 652, 368, 583, 123, 600, 230, 658, 557, 395, 341, 774, 314, 233, 612, 450, 563, 220, 777, 424, 287, 355, 673, 832, 125, 558, 587, 183, 342, 660, 397, 234, 316, 345, 778, 452, 565, 403, 616, 207, 241, 674, 126, 357, 785, 398, 589, 432, 647, 236, 187, 346, 664, 566, 303, 780, 595, 405, 242, 456, 569, 358, 676, 786, 705, 590, 624, 215, 361, 419, 896, 189, 348, 651, 406, 597, 570, 244, 801, 706, 409, 311, 788, 362, 680, 543, 464, 190, 611, 421, 219, 598, 335, 653, 369, 802, 572, 410, 601, 231, 708, 659, 248, 775, 364, 315, 792, 422, 613, 451, 221, 654, 370, 688, 425, 804, 602, 412, 833, 559, 480, 343, 661, 235, 712, 614, 317, 222, 779, 453, 426, 617, 372, 675, 834, 127, 604, 662, 808, 399, 433, 318, 237, 347, 665, 454, 567, 781, 618, 428, 243, 720, 457, 359, 677, 836, 787, 376, 591, 434, 625, 238, 666, 897, 349, 782, 816, 407, 620, 458, 571, 245, 678, 707, 789, 626, 363, 681, 840, 436, 465, 898, 191, 350, 668, 736, 599, 246, 803, 460, 573, 411, 790, 709, 249, 682, 628, 466, 365, 793, 423, 900, 440, 655, 371, 689, 848, 574, 805, 603, 710, 413, 250, 481, 366, 684, 794, 713, 468, 615, 632, 223, 690, 427, 904, 373, 806, 414, 835, 605, 482, 663, 252, 809, 714, 319, 796, 864, 455, 472, 619, 374, 692, 429, 721, 606, 837, 377, 810, 484, 435, 912, 239, 716, 667, 783, 817, 430, 722, 621, 459, 679, 838, 378, 696, 812, 627, 841, 437, 899, 488, 351, 669, 818, 737, 622, 247, 724, 461, 928, 791, 380, 683, 842, 438, 629, 467, 670, 901, 738, 441, 820, 849, 462, 575, 496, 711, 251, 728, 630, 367, 685, 844, 795, 469, 902, 442, 633, 740, 691, 850, 905, 807, 824, 415, 483, 960, 253, 686, 715, 470, 797, 634, 444, 865, 473, 906, 375, 693, 852, 744, 607, 254, 811, 485, 913, 798, 717, 866, 636, 474, 694, 431, 908, 723, 839, 379, 697, 856, 486, 914, 813, 718, 752, 489, 868, 819, 476, 623, 725, 698, 929, 381, 814, 843, 439, 916, 490, 671, 739, 821, 726, 872, 463, 497, 930, 382, 700, 729, 631, 845, 903, 492, 443, 920, 822, 741, 851, 498, 825, 932, 730, 961, 687, 846, 880, 471, 635, 742, 445, 907, 853, 826, 745, 500, 962, 255, 732, 936, 799, 446, 867, 637, 475, 695, 854, 909, 746, 828, 857, 487, 964, 915, 504, 719, 753, 638, 869, 477, 910, 944, 748, 699, 858, 815, 917, 754, 491, 968, 870, 478, 727, 873, 931, 383, 701, 860, 918, 756, 493, 921, 823, 874, 499, 976, 702, 933, 731, 847, 881, 494, 922, 743, 760, 876, 827, 501, 934, 963, 733, 882, 937, 447, 924, 992, 855, 747, 502, 829, 734, 965, 505, 938, 884, 639, 911, 945, 830, 749, 859, 966, 506, 940, 755, 969, 871, 888, 479, 946, 750, 861, 919, 508, 970, 757, 875, 948, 977, 703, 862, 758, 495, 972, 923, 761, 978, 877, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q19_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 146, 45, 262, 100, 51, 528, 265, 161, 320, 46, 75, 148, 266, 53, 515, 104, 162, 273, 77, 135, 544, 152, 54, 268, 83, 517, 57, 164, 274, 193, 78, 112, 384, 139, 85, 518, 58, 289, 194, 521, 276, 168, 31, 99, 576, 86, 141, 290, 60, 89, 522, 196, 147, 263, 280, 101, 529, 142, 176, 292, 90, 321, 47, 524, 149, 200, 102, 530, 267, 105, 163, 322, 640, 92, 150, 296, 545, 153, 55, 532, 269, 106, 208, 165, 324, 275, 79, 113, 546, 154, 385, 270, 304, 519, 108, 59, 536, 166, 195, 277, 114, 169, 328, 548, 386, 156, 577, 224, 87, 291, 768, 61, 523, 278, 197, 170, 116, 578, 281, 388, 143, 552, 177, 336, 62, 293, 91, 198, 525, 172, 282, 201, 103, 580, 531, 120, 178, 392, 294, 323, 641, 93, 526, 151, 560, 297, 202, 284, 352, 533, 107, 584, 180, 209, 642, 94, 325, 298, 400, 547, 204, 155, 534, 271, 305, 210, 109, 537, 167, 326, 644, 184, 300, 115, 592, 329, 549, 387, 157, 306, 225, 110, 538, 212, 769, 416, 279, 171, 330, 648, 117, 550, 158, 579, 389, 226, 553, 308, 337, 770, 63, 540, 199, 608, 216, 118, 173, 332, 283, 390, 581, 121, 554, 228, 179, 338, 656, 393, 295, 772, 312, 527, 448, 561, 174, 203, 582, 285, 122, 353, 556, 394, 585, 181, 340, 643, 232, 95, 562, 299, 776, 401, 286, 205, 354, 672, 535, 124, 586, 182, 396, 211, 327, 645, 185, 344, 564, 402, 301, 593, 206, 240, 356, 307, 784, 111, 588, 539, 213, 646, 186, 417, 302, 594, 331, 649, 404, 551, 159, 568, 227, 704, 309, 214, 771, 360, 541, 418, 188, 609, 217, 650, 119, 596, 333, 391, 800, 408, 555, 310, 229, 339, 657, 542, 773, 610, 313, 420, 218, 449, 175, 334, 652, 368, 583, 123, 600, 230, 658, 557, 395, 341, 774, 314, 233, 612, 450, 563, 220, 777, 424, 287, 355, 673, 832, 125, 558, 587, 183, 342, 660, 397, 234, 316, 345, 778, 452, 565, 403, 207, 616, 241, 674, 126, 357, 785, 398, 589, 432, 647, 236, 187, 346, 664, 566, 303, 780, 595, 405, 242, 456, 569, 358, 676, 786, 705, 590, 215, 624, 361, 419, 896, 189, 348, 651, 406, 597, 570, 244, 801, 706, 409, 311, 788, 362, 680, 543, 464, 190, 611, 421, 219, 598, 335, 653, 369, 802, 572, 410, 601, 231, 708, 659, 248, 775, 364, 315, 792, 422, 613, 451, 221, 654, 370, 688, 425, 804, 602, 412, 833, 559, 480, 343, 661, 235, 712, 614, 317, 222, 779, 453, 426, 617, 372, 675, 834, 127, 604, 662, 399, 808, 433, 318, 237, 347, 665, 454, 567, 781, 618, 428, 243, 720, 457, 359, 677, 836, 787, 376, 591, 434, 625, 238, 666, 897, 349, 782, 407, 816, 620, 458, 571, 245, 678, 707, 789, 626, 363, 681, 840, 436, 465, 898, 191, 350, 668, 736, 599, 246, 803, 460, 573, 411, 790, 709, 249, 682, 628, 466, 365, 793, 423, 900, 440, 655, 371, 689, 848, 574, 805, 603, 710, 413, 250, 481, 366, 684, 794, 713, 468, 615, 223, 632, 690, 427, 904, 373, 806, 414, 835, 605, 482, 663, 252, 809, 714, 319, 796, 455, 864, 472, 619, 374, 692, 429, 721, 606, 837, 377, 810, 484, 435, 912, 239, 716, 667, 783, 817, 430, 722, 621, 459, 679, 838, 378, 696, 812, 627, 841, 437, 899, 488, 351, 669, 818, 737, 622, 247, 724, 461, 928, 791, 380, 683, 842, 438, 629, 467, 670, 901, 738, 441, 820, 849, 462, 575, 496, 711, 251, 728, 630, 367, 685, 844, 795, 469, 902, 442, 633, 740, 691, 850, 905, 807, 415, 824, 483, 960, 253, 686, 715, 470, 797, 634, 444, 865, 473, 906, 375, 693, 852, 744, 607, 254, 811, 485, 913, 798, 717, 866, 636, 474, 694, 431, 908, 723, 839, 379, 697, 856, 486, 914, 813, 718, 752, 489, 868, 819, 476, 623, 725, 698, 929, 381, 814, 843, 439, 916, 490, 671, 739, 821, 726, 463, 872, 497, 930, 382, 700, 729, 631, 845, 903, 492, 443, 920, 822, 741, 851, 498, 825, 932, 730, 961, 687, 846, 471, 880, 635, 742, 445, 907, 853, 826, 745, 500, 962, 255, 732, 936, 799, 446, 867, 637, 475, 695, 854, 909, 746, 828, 857, 487, 964, 915, 504, 719, 753, 638, 869, 477, 910, 944, 748, 699, 858, 815, 917, 754, 491, 968, 870, 478, 727, 873, 931, 383, 701, 860, 918, 756, 493, 921, 823, 874, 499, 976, 702, 933, 731, 847, 881, 494, 922, 743, 760, 876, 827, 501, 934, 963, 733, 882, 937, 447, 924, 992, 855, 747, 502, 829, 734, 965, 505, 938, 884, 639, 911, 945, 830, 749, 859, 966, 506, 940, 755, 969, 871, 479, 888, 946, 750, 861, 919, 508, 970, 757, 875, 948, 977, 703, 862, 758, 495, 972, 923, 761, 978, 877, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q20_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 528, 265, 161, 320, 46, 75, 148, 266, 53, 515, 104, 162, 273, 77, 135, 544, 152, 54, 268, 83, 517, 57, 164, 274, 193, 78, 112, 384, 139, 85, 518, 58, 289, 194, 521, 276, 168, 31, 99, 576, 86, 141, 290, 60, 89, 522, 196, 147, 263, 280, 101, 142, 529, 176, 90, 292, 321, 47, 524, 149, 200, 102, 530, 267, 105, 163, 322, 640, 92, 150, 296, 545, 153, 55, 532, 269, 106, 208, 165, 324, 275, 79, 113, 546, 154, 385, 270, 304, 519, 108, 59, 536, 166, 195, 277, 114, 169, 328, 548, 386, 156, 577, 224, 87, 291, 61, 768, 523, 278, 197, 170, 116, 578, 281, 388, 143, 552, 177, 336, 62, 91, 293, 198, 525, 172, 282, 201, 103, 580, 531, 120, 178, 392, 294, 323, 641, 93, 526, 151, 560, 297, 202, 284, 352, 533, 107, 180, 584, 209, 642, 94, 325, 298, 400, 547, 204, 155, 534, 271, 305, 109, 210, 537, 167, 326, 644, 184, 300, 115, 592, 329, 549, 387, 157, 306, 225, 110, 538, 212, 769, 416, 279, 171, 330, 648, 117, 550, 158, 579, 389, 226, 553, 308, 337, 63, 770, 540, 199, 608, 216, 118, 173, 332, 283, 390, 581, 121, 554, 228, 179, 338, 656, 393, 295, 772, 312, 527, 448, 174, 561, 203, 582, 285, 122, 353, 556, 394, 181, 585, 340, 643, 232, 95, 562, 299, 776, 401, 286, 205, 354, 672, 535, 124, 182, 586, 396, 211, 327, 645, 185, 344, 564, 301, 402, 206, 593, 240, 356, 307, 784, 111, 588, 539, 213, 646, 186, 417, 302, 594, 331, 649, 404, 551, 159, 568, 227, 704, 309, 214, 771, 360, 541, 418, 188, 609, 217, 650, 119, 596, 333, 391, 800, 408, 555, 310, 229, 339, 657, 542, 773, 610, 313, 218, 420, 449, 175, 334, 652, 368, 583, 123, 600, 230, 557, 658, 395, 341, 774, 314, 233, 612, 450, 563, 220, 777, 424, 287, 355, 673, 125, 832, 558, 183, 587, 342, 660, 397, 234, 316, 345, 778, 452, 565, 403, 207, 616, 241, 674, 126, 357, 398, 785, 589, 432, 647, 236, 187, 346, 664, 566, 303, 780, 595, 405, 242, 456, 569, 358, 676, 786, 705, 590, 215, 624, 361, 419, 189, 896, 348, 651, 406, 597, 570, 244, 801, 706, 409, 311, 788, 362, 680, 543, 464, 190, 611, 219, 421, 598, 335, 653, 369, 802, 572, 410, 601, 231, 708, 659, 248, 775, 364, 315, 792, 422, 613, 451, 221, 654, 370, 688, 425, 602, 804, 412, 833, 559, 480, 343, 661, 235, 712, 614, 317, 222, 779, 453, 426, 617, 372, 675, 127, 834, 604, 662, 399, 808, 433, 318, 237, 347, 665, 454, 567, 781, 618, 428, 243, 720, 457, 359, 677, 836, 787, 376, 591, 434, 238, 625, 666, 897, 349, 782, 407, 816, 620, 458, 571, 245, 678, 707, 789, 626, 363, 681, 436, 840, 465, 191, 898, 350, 668, 736, 599, 246, 803, 460, 573, 411, 790, 709, 249, 682, 628, 365, 466, 793, 423, 900, 440, 655, 371, 689, 848, 574, 603, 805, 710, 413, 250, 481, 366, 684, 794, 713, 468, 615, 223, 632, 690, 427, 904, 373, 806, 414, 835, 605, 482, 663, 252, 809, 714, 319, 796, 455, 864, 472, 619, 374, 692, 429, 721, 606, 837, 377, 810, 484, 435, 912, 239, 716, 667, 783, 430, 817, 621, 722, 459, 679, 838, 378, 696, 812, 627, 437, 841, 899, 488, 351, 669, 818, 737, 622, 247, 724, 461, 928, 791, 380, 683, 438, 842, 629, 467, 670, 901, 738, 441, 820, 462, 849, 575, 496, 711, 251, 728, 630, 367, 685, 844, 795, 469, 902, 442, 633, 740, 691, 850, 905, 807, 415, 824, 483, 253, 960, 686, 715, 470, 797, 634, 444, 865, 473, 906, 375, 693, 852, 744, 607, 254, 811, 485, 913, 798, 717, 866, 636, 474, 694, 431, 908, 723, 839, 379, 697, 856, 486, 813, 914, 718, 752, 489, 868, 819, 476, 623, 725, 698, 929, 381, 814, 439, 843, 916, 490, 671, 739, 821, 726, 463, 872, 497, 930, 382, 700, 729, 631, 845, 903, 492, 443, 920, 822, 741, 851, 498, 825, 730, 932, 961, 687, 846, 471, 880, 635, 742, 445, 907, 853, 826, 745, 500, 255, 962, 732, 936, 799, 446, 867, 637, 475, 695, 854, 909, 746, 828, 857, 487, 964, 915, 504, 719, 753, 638, 869, 477, 910, 944, 748, 699, 858, 815, 917, 754, 491, 968, 870, 478, 727, 873, 931, 383, 701, 860, 918, 756, 493, 921, 823, 874, 499, 976, 702, 731, 933, 847, 494, 881, 922, 743, 760, 876, 827, 501, 934, 963, 733, 882, 937, 447, 924, 992, 855, 747, 502, 829, 734, 965, 505, 938, 884, 639, 911, 945, 830, 749, 859, 966, 506, 940, 755, 969, 871, 479, 888, 946, 750, 861, 919, 508, 970, 757, 875, 948, 977, 703, 862, 758, 495, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q21_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 160, 23, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 528, 265, 161, 320, 46, 75, 148, 266, 53, 515, 104, 162, 273, 77, 135, 544, 152, 54, 268, 83, 517, 57, 164, 274, 193, 78, 112, 384, 139, 85, 518, 58, 289, 194, 521, 276, 168, 31, 99, 576, 86, 141, 290, 60, 89, 522, 196, 147, 263, 280, 101, 142, 529, 176, 90, 292, 321, 47, 524, 149, 200, 102, 530, 267, 105, 163, 322, 640, 92, 150, 296, 545, 153, 55, 532, 269, 106, 208, 165, 324, 275, 79, 113, 546, 154, 385, 270, 304, 519, 108, 59, 536, 166, 195, 277, 114, 169, 328, 548, 386, 156, 577, 224, 87, 291, 61, 768, 523, 278, 197, 170, 116, 578, 281, 388, 143, 552, 177, 336, 62, 91, 293, 198, 525, 172, 282, 201, 103, 580, 531, 120, 178, 392, 294, 323, 641, 93, 526, 151, 560, 297, 202, 284, 352, 533, 107, 180, 584, 209, 642, 94, 325, 298, 400, 547, 204, 155, 534, 271, 305, 109, 210, 537, 167, 326, 644, 184, 300, 115, 592, 329, 549, 387, 157, 306, 225, 110, 538, 212, 769, 416, 279, 171, 330, 648, 117, 550, 158, 579, 389, 226, 553, 308, 337, 63, 770, 540, 199, 608, 216, 118, 173, 332, 283, 390, 581, 121, 554, 228, 179, 338, 656, 393, 295, 772, 312, 527, 448, 174, 561, 203, 582, 285, 122, 353, 556, 394, 181, 585, 340, 643, 232, 95, 562, 299, 776, 401, 286, 205, 354, 672, 535, 124, 182, 586, 396, 211, 327, 645, 185, 344, 564, 301, 402, 206, 593, 240, 356, 307, 111, 784, 588, 539, 213, 646, 186, 417, 302, 594, 331, 649, 404, 551, 159, 568, 227, 704, 309, 214, 771, 360, 541, 418, 188, 609, 217, 650, 119, 596, 333, 391, 800, 408, 555, 310, 229, 339, 657, 542, 773, 610, 313, 218, 420, 449, 175, 334, 652, 368, 583, 123, 600, 230, 557, 658, 395, 341, 774, 314, 233, 612, 450, 563, 220, 777, 424, 287, 355, 673, 125, 832, 558, 183, 587, 342, 660, 397, 234, 316, 345, 778, 452, 565, 403, 207, 616, 241, 674, 126, 357, 398, 785, 589, 432, 647, 236, 187, 346, 664, 566, 303, 780, 595, 405, 242, 456, 569, 358, 676, 786, 705, 590, 215, 624, 361, 419, 189, 896, 348, 651, 406, 597, 570, 244, 801, 706, 409, 311, 788, 362, 680, 543, 464, 190, 611, 219, 421, 598, 335, 653, 369, 802, 572, 410, 601, 231, 708, 659, 248, 775, 364, 315, 792, 422, 613, 451, 221, 654, 370, 688, 425, 602, 804, 412, 833, 559, 480, 343, 661, 235, 712, 614, 317, 222, 779, 453, 426, 617, 372, 675, 127, 834, 604, 662, 399, 808, 433, 318, 237, 347, 665, 454, 567, 781, 618, 428, 243, 720, 457, 359, 677, 836, 787, 376, 591, 434, 238, 625, 666, 897, 349, 782, 407, 816, 620, 458, 571, 245, 678, 707, 789, 626, 363, 681, 436, 840, 465, 191, 898, 350, 668, 736, 599, 246, 803, 460, 573, 411, 790, 709, 249, 682, 628, 365, 466, 793, 423, 900, 440, 655, 371, 689, 848, 574, 603, 805, 710, 413, 250, 481, 366, 684, 794, 713, 468, 615, 223, 632, 690, 427, 904, 373, 806, 414, 835, 605, 482, 663, 252, 809, 714, 319, 796, 455, 864, 472, 619, 374, 692, 429, 721, 606, 837, 377, 810, 484, 435, 239, 912, 716, 667, 783, 430, 817, 621, 722, 459, 679, 838, 378, 696, 812, 627, 437, 841, 899, 488, 351, 669, 818, 737, 622, 247, 724, 461, 928, 791, 380, 683, 438, 842, 629, 467, 670, 901, 738, 441, 820, 462, 849, 575, 496, 711, 251, 728, 630, 367, 685, 844, 795, 469, 902, 442, 633, 740, 691, 850, 905, 807, 415, 824, 483, 253, 960, 686, 715, 470, 797, 634, 444, 865, 473, 906, 375, 693, 852, 744, 607, 254, 811, 485, 913, 798, 717, 866, 636, 474, 694, 431, 908, 723, 839, 379, 697, 856, 486, 813, 914, 718, 752, 489, 868, 819, 476, 623, 725, 698, 929, 381, 814, 439, 843, 916, 490, 671, 739, 821, 726, 463, 872, 497, 930, 382, 700, 729, 631, 845, 903, 492, 443, 920, 822, 741, 851, 498, 825, 730, 932, 961, 687, 846, 471, 880, 635, 742, 445, 907, 853, 826, 745, 500, 255, 962, 732, 936, 799, 446, 867, 637, 475, 695, 854, 909, 746, 828, 857, 487, 964, 915, 504, 719, 753, 638, 869, 477, 910, 944, 748, 699, 858, 815, 917, 754, 491, 968, 870, 478, 727, 873, 931, 383, 701, 860, 918, 756, 493, 921, 823, 874, 499, 976, 702, 731, 933, 847, 494, 881, 922, 743, 760, 876, 827, 501, 934, 963, 733, 882, 937, 447, 924, 992, 855, 747, 502, 829, 734, 965, 505, 938, 884, 639, 911, 945, 830, 749, 859, 966, 506, 940, 755, 969, 871, 479, 888, 946, 750, 861, 919, 508, 970, 757, 875, 948, 977, 703, 862, 758, 495, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 1000, 863, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q22_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 23, 160, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 528, 265, 161, 46, 320, 75, 148, 266, 53, 104, 515, 162, 273, 77, 135, 544, 152, 54, 268, 83, 517, 57, 164, 274, 193, 78, 112, 384, 139, 85, 518, 58, 289, 194, 521, 276, 31, 168, 99, 576, 86, 141, 290, 60, 89, 522, 196, 147, 263, 280, 101, 142, 529, 176, 90, 292, 47, 321, 524, 149, 200, 102, 530, 267, 105, 163, 322, 92, 640, 150, 296, 545, 153, 55, 532, 269, 106, 208, 165, 324, 275, 79, 113, 546, 154, 385, 270, 304, 108, 519, 59, 536, 166, 195, 277, 114, 169, 328, 548, 386, 156, 577, 87, 224, 291, 61, 768, 523, 278, 197, 170, 116, 281, 578, 388, 143, 552, 177, 62, 336, 91, 293, 198, 525, 172, 282, 201, 103, 580, 120, 531, 178, 392, 294, 323, 93, 641, 526, 151, 560, 297, 202, 284, 352, 533, 107, 180, 584, 209, 94, 642, 325, 298, 400, 547, 204, 155, 534, 271, 305, 109, 210, 537, 167, 326, 644, 184, 300, 115, 592, 329, 549, 387, 157, 306, 225, 110, 538, 212, 769, 279, 416, 171, 330, 648, 117, 550, 158, 579, 389, 226, 553, 308, 63, 337, 770, 540, 199, 608, 216, 118, 173, 332, 283, 390, 581, 121, 554, 228, 179, 338, 656, 393, 295, 772, 312, 527, 174, 448, 561, 203, 285, 582, 122, 353, 556, 394, 181, 585, 340, 95, 232, 643, 562, 299, 776, 401, 286, 205, 354, 124, 535, 672, 182, 586, 396, 211, 327, 645, 185, 344, 564, 301, 402, 206, 593, 240, 356, 307, 111, 784, 588, 539, 213, 646, 186, 417, 302, 594, 331, 649, 404, 551, 159, 568, 227, 704, 309, 214, 360, 771, 541, 418, 188, 609, 217, 650, 119, 596, 333, 391, 800, 408, 555, 310, 229, 339, 657, 542, 773, 313, 610, 218, 420, 175, 449, 334, 652, 368, 583, 123, 600, 230, 557, 658, 395, 341, 774, 314, 233, 612, 450, 563, 220, 777, 287, 424, 355, 125, 673, 558, 832, 183, 587, 342, 660, 397, 234, 316, 345, 778, 452, 565, 403, 207, 616, 241, 126, 674, 357, 398, 785, 589, 432, 236, 647, 187, 346, 664, 566, 303, 780, 595, 405, 242, 456, 569, 358, 676, 786, 705, 590, 215, 624, 361, 419, 189, 348, 896, 651, 406, 597, 570, 244, 801, 409, 706, 311, 788, 362, 543, 680, 190, 464, 611, 219, 421, 598, 335, 653, 369, 802, 572, 410, 601, 231, 708, 248, 659, 364, 775, 315, 792, 422, 613, 451, 221, 654, 370, 688, 425, 602, 804, 412, 559, 833, 343, 480, 661, 235, 712, 317, 614, 222, 779, 453, 426, 617, 372, 127, 675, 834, 604, 662, 399, 808, 433, 318, 237, 347, 665, 454, 567, 781, 618, 428, 243, 720, 457, 359, 677, 836, 376, 787, 591, 434, 238, 625, 666, 349, 897, 782, 407, 816, 620, 458, 571, 245, 678, 707, 789, 626, 363, 681, 436, 840, 191, 465, 350, 898, 668, 599, 736, 246, 803, 460, 573, 411, 790, 709, 249, 682, 628, 365, 466, 793, 423, 900, 440, 655, 371, 689, 574, 848, 603, 805, 413, 710, 250, 481, 366, 684, 794, 713, 468, 615, 223, 632, 690, 427, 904, 373, 806, 414, 835, 605, 482, 252, 663, 809, 714, 319, 796, 455, 864, 472, 619, 374, 692, 429, 721, 606, 837, 377, 810, 484, 435, 239, 912, 716, 667, 783, 430, 817, 621, 722, 459, 679, 838, 378, 696, 812, 627, 437, 841, 351, 488, 899, 669, 818, 737, 622, 247, 724, 461, 380, 791, 928, 683, 438, 842, 629, 467, 670, 901, 441, 738, 820, 462, 575, 849, 496, 711, 251, 728, 630, 367, 685, 844, 795, 469, 902, 442, 633, 740, 691, 850, 905, 807, 415, 824, 483, 253, 686, 960, 715, 470, 797, 634, 444, 865, 473, 906, 375, 693, 852, 607, 744, 254, 811, 485, 913, 798, 717, 866, 636, 474, 694, 431, 908, 723, 839, 379, 697, 856, 486, 813, 914, 718, 752, 489, 868, 819, 476, 623, 725, 698, 381, 929, 814, 439, 843, 916, 490, 671, 739, 821, 726, 463, 872, 497, 382, 930, 700, 729, 631, 845, 492, 903, 443, 920, 822, 741, 851, 498, 825, 730, 932, 687, 961, 846, 471, 880, 635, 445, 742, 907, 853, 826, 745, 500, 255, 962, 732, 799, 936, 446, 867, 637, 475, 695, 854, 909, 746, 828, 857, 487, 964, 504, 915, 719, 753, 638, 869, 477, 910, 944, 748, 699, 858, 815, 917, 754, 491, 968, 870, 478, 727, 873, 383, 931, 701, 860, 918, 756, 493, 921, 823, 874, 499, 702, 976, 731, 933, 847, 494, 881, 922, 743, 760, 876, 827, 501, 934, 963, 733, 882, 937, 447, 924, 855, 992, 747, 502, 829, 734, 965, 505, 938, 884, 639, 911, 945, 830, 749, 859, 966, 506, 940, 755, 969, 871, 479, 888, 946, 750, 861, 508, 919, 970, 757, 875, 948, 703, 977, 862, 758, 495, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 863, 1000, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q23_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 23, 160, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 528, 265, 161, 46, 320, 75, 148, 266, 53, 104, 515, 162, 273, 77, 135, 544, 152, 54, 268, 83, 517, 57, 164, 274, 193, 78, 112, 384, 139, 85, 518, 58, 289, 194, 521, 276, 31, 168, 99, 576, 86, 141, 290, 60, 89, 522, 196, 147, 263, 280, 101, 142, 529, 176, 90, 292, 47, 321, 524, 149, 200, 102, 530, 267, 105, 163, 322, 92, 640, 150, 296, 545, 153, 55, 532, 269, 106, 208, 165, 324, 275, 79, 113, 546, 154, 385, 270, 304, 108, 519, 59, 536, 166, 195, 277, 114, 169, 328, 548, 386, 156, 577, 87, 224, 291, 61, 768, 523, 278, 197, 170, 116, 281, 578, 388, 143, 552, 177, 62, 336, 91, 293, 198, 525, 172, 282, 201, 103, 580, 120, 531, 178, 392, 294, 323, 93, 641, 526, 151, 560, 297, 202, 284, 352, 533, 107, 180, 584, 209, 94, 642, 325, 298, 400, 547, 204, 155, 534, 271, 305, 109, 210, 537, 167, 326, 644, 184, 300, 115, 592, 329, 549, 387, 157, 306, 225, 110, 538, 212, 769, 279, 416, 171, 330, 117, 648, 550, 158, 579, 389, 226, 553, 308, 63, 337, 770, 540, 199, 608, 216, 118, 173, 332, 283, 390, 581, 121, 554, 228, 179, 338, 656, 393, 295, 772, 312, 527, 174, 448, 561, 203, 285, 582, 122, 353, 556, 394, 181, 585, 340, 95, 232, 643, 562, 299, 776, 401, 286, 205, 354, 124, 535, 672, 182, 586, 396, 211, 327, 645, 185, 344, 564, 301, 402, 206, 593, 240, 356, 307, 111, 784, 588, 539, 213, 646, 186, 417, 302, 594, 331, 649, 404, 551, 159, 568, 227, 704, 309, 214, 360, 771, 541, 418, 188, 609, 217, 119, 650, 596, 333, 391, 800, 408, 555, 310, 229, 339, 657, 542, 773, 313, 610, 218, 420, 175, 449, 334, 652, 368, 583, 123, 600, 230, 557, 658, 395, 341, 774, 314, 233, 612, 450, 563, 220, 777, 287, 424, 355, 125, 673, 558, 832, 183, 587, 342, 660, 397, 234, 316, 345, 778, 452, 565, 403, 207, 616, 241, 126, 674, 357, 398, 785, 589, 432, 236, 647, 187, 346, 664, 566, 303, 780, 595, 405, 242, 456, 569, 358, 676, 786, 705, 590, 215, 624, 361, 419, 189, 348, 896, 651, 406, 597, 570, 244, 801, 409, 706, 311, 788, 362, 543, 680, 190, 464, 611, 219, 421, 598, 335, 653, 369, 802, 572, 410, 601, 231, 708, 248, 659, 364, 775, 315, 792, 422, 613, 451, 221, 654, 370, 688, 425, 602, 804, 412, 559, 833, 343, 480, 661, 235, 712, 317, 614, 222, 779, 453, 426, 617, 372, 127, 675, 834, 604, 662, 399, 808, 433, 318, 237, 347, 665, 454, 567, 781, 618, 428, 243, 720, 457, 359, 677, 836, 376, 787, 591, 434, 238, 625, 666, 349, 897, 782, 407, 816, 620, 458, 571, 245, 678, 707, 789, 626, 363, 681, 436, 840, 191, 465, 350, 898, 668, 599, 736, 246, 803, 460, 573, 411, 790, 709, 249, 682, 628, 365, 466, 793, 423, 900, 440, 655, 371, 689, 574, 848, 603, 805, 413, 710, 250, 481, 366, 684, 794, 713, 468, 615, 223, 632, 690, 427, 373, 904, 806, 414, 835, 605, 482, 252, 663, 809, 714, 319, 796, 455, 864, 472, 619, 374, 692, 429, 721, 606, 837, 377, 810, 484, 435, 239, 912, 716, 667, 783, 430, 817, 621, 722, 459, 679, 838, 378, 696, 812, 627, 437, 841, 351, 488, 899, 669, 818, 737, 622, 247, 724, 461, 380, 791, 928, 683, 438, 842, 629, 467, 670, 901, 441, 738, 820, 462, 575, 849, 496, 711, 251, 728, 630, 367, 685, 844, 795, 469, 902, 442, 633, 740, 691, 850, 905, 807, 415, 824, 483, 253, 686, 960, 715, 470, 797, 634, 444, 865, 473, 375, 906, 693, 852, 607, 744, 254, 811, 485, 913, 798, 717, 866, 636, 474, 694, 431, 908, 723, 839, 379, 697, 856, 486, 813, 914, 718, 752, 489, 868, 819, 476, 623, 725, 698, 381, 929, 814, 439, 843, 916, 490, 671, 739, 821, 726, 463, 872, 497, 382, 930, 700, 729, 631, 845, 492, 903, 443, 920, 822, 741, 851, 498, 825, 730, 932, 687, 961, 846, 471, 880, 635, 445, 742, 907, 853, 826, 745, 500, 255, 962, 732, 799, 936, 446, 867, 637, 475, 695, 854, 909, 746, 828, 857, 487, 964, 504, 915, 719, 753, 638, 869, 477, 910, 944, 748, 699, 858, 815, 917, 754, 491, 968, 870, 478, 727, 873, 383, 931, 701, 860, 918, 756, 493, 921, 823, 874, 499, 702, 976, 731, 933, 847, 494, 881, 922, 743, 760, 876, 827, 501, 934, 963, 733, 882, 937, 447, 924, 855, 992, 747, 502, 829, 734, 965, 505, 938, 884, 639, 911, 945, 830, 749, 859, 966, 506, 940, 755, 969, 871, 479, 888, 946, 750, 861, 508, 919, 970, 757, 875, 948, 703, 977, 862, 758, 495, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 863, 1000, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q24_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 23, 160, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 528, 265, 161, 46, 320, 75, 148, 266, 53, 104, 515, 162, 273, 77, 135, 544, 152, 54, 83, 268, 517, 57, 164, 274, 193, 78, 112, 384, 139, 85, 518, 58, 289, 194, 521, 276, 31, 168, 99, 576, 86, 141, 290, 60, 89, 522, 196, 147, 263, 280, 101, 142, 529, 176, 90, 292, 47, 321, 524, 149, 200, 102, 530, 267, 105, 163, 322, 92, 640, 150, 296, 545, 153, 55, 532, 269, 106, 208, 165, 324, 275, 79, 113, 546, 154, 385, 270, 304, 108, 519, 59, 166, 536, 195, 277, 114, 169, 328, 548, 386, 156, 577, 87, 224, 291, 61, 768, 523, 278, 197, 170, 116, 281, 578, 388, 143, 552, 177, 62, 336, 91, 293, 198, 525, 172, 282, 201, 103, 580, 120, 531, 178, 392, 294, 323, 93, 641, 526, 151, 560, 297, 202, 284, 352, 533, 107, 180, 584, 209, 94, 642, 325, 298, 400, 547, 204, 155, 534, 271, 305, 109, 210, 167, 537, 326, 644, 184, 115, 300, 592, 329, 549, 387, 157, 306, 225, 110, 538, 212, 769, 279, 416, 171, 330, 117, 648, 550, 158, 579, 389, 226, 553, 308, 63, 337, 770, 540, 199, 608, 216, 118, 173, 332, 283, 390, 581, 121, 554, 228, 179, 338, 656, 393, 295, 772, 312, 527, 174, 561, 448, 203, 285, 582, 122, 353, 556, 394, 181, 585, 340, 95, 232, 643, 562, 299, 776, 401, 286, 205, 354, 124, 535, 672, 182, 586, 211, 396, 327, 645, 185, 344, 564, 301, 402, 206, 593, 240, 356, 307, 111, 784, 588, 539, 213, 646, 186, 417, 302, 594, 331, 649, 404, 551, 159, 568, 227, 704, 309, 214, 360, 771, 541, 418, 188, 609, 217, 119, 650, 596, 333, 391, 800, 408, 555, 310, 229, 339, 657, 542, 773, 313, 610, 218, 420, 175, 449, 334, 652, 368, 583, 123, 230, 600, 557, 658, 395, 341, 774, 314, 233, 612, 563, 450, 220, 777, 287, 424, 355, 125, 673, 558, 832, 183, 587, 342, 660, 397, 234, 316, 345, 778, 565, 452, 403, 207, 616, 241, 126, 674, 357, 398, 785, 589, 432, 236, 647, 187, 346, 664, 566, 303, 595, 780, 405, 242, 569, 456, 358, 676, 786, 705, 590, 215, 624, 361, 419, 189, 348, 896, 651, 406, 597, 570, 244, 801, 409, 706, 311, 788, 362, 543, 680, 190, 464, 611, 219, 421, 598, 335, 653, 369, 802, 572, 410, 231, 601, 708, 248, 659, 364, 775, 315, 422, 792, 613, 451, 221, 654, 370, 688, 425, 602, 804, 412, 559, 833, 343, 480, 661, 235, 712, 317, 614, 222, 779, 453, 426, 617, 372, 127, 675, 834, 604, 662, 399, 808, 433, 318, 237, 347, 665, 567, 454, 781, 618, 243, 428, 720, 457, 359, 677, 836, 376, 787, 591, 434, 238, 625, 666, 349, 897, 782, 407, 816, 620, 571, 458, 245, 678, 707, 789, 626, 363, 681, 436, 840, 191, 465, 350, 898, 668, 599, 736, 246, 803, 573, 460, 411, 790, 709, 249, 682, 628, 365, 466, 423, 793, 900, 440, 655, 371, 689, 574, 848, 603, 805, 413, 710, 250, 481, 366, 684, 794, 713, 468, 615, 223, 632, 690, 427, 373, 904, 806, 414, 835, 605, 482, 252, 663, 809, 714, 319, 796, 455, 864, 472, 619, 374, 692, 429, 721, 606, 837, 377, 810, 484, 435, 239, 912, 716, 667, 783, 430, 817, 621, 722, 459, 679, 838, 378, 696, 627, 812, 437, 841, 351, 488, 899, 669, 818, 737, 622, 247, 724, 461, 380, 791, 928, 683, 438, 842, 629, 467, 670, 901, 441, 738, 820, 575, 462, 849, 496, 711, 251, 728, 630, 367, 685, 844, 795, 469, 902, 442, 633, 740, 691, 850, 905, 807, 415, 824, 483, 253, 686, 960, 715, 470, 797, 634, 444, 865, 473, 375, 906, 693, 852, 607, 744, 254, 811, 485, 913, 798, 717, 866, 636, 474, 694, 431, 723, 908, 839, 379, 697, 486, 856, 813, 914, 718, 752, 489, 868, 819, 476, 623, 725, 698, 381, 929, 814, 439, 843, 916, 490, 671, 739, 821, 726, 463, 872, 497, 382, 930, 700, 729, 631, 845, 492, 903, 443, 920, 822, 741, 851, 498, 825, 730, 932, 687, 961, 846, 471, 880, 635, 445, 742, 907, 853, 826, 745, 500, 255, 962, 732, 799, 936, 446, 867, 637, 475, 695, 854, 909, 746, 828, 487, 857, 964, 504, 915, 719, 753, 638, 869, 477, 910, 944, 748, 699, 858, 815, 917, 754, 491, 968, 870, 478, 727, 873, 383, 931, 701, 860, 918, 756, 493, 921, 823, 874, 499, 702, 976, 731, 933, 847, 494, 881, 922, 743, 760, 876, 827, 501, 934, 963, 733, 882, 937, 447, 924, 855, 992, 747, 502, 829, 734, 965, 505, 938, 884, 639, 911, 945, 830, 749, 859, 966, 506, 755, 940, 969, 871, 479, 888, 946, 750, 861, 508, 919, 970, 757, 875, 948, 703, 977, 862, 758, 495, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 863, 1000, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q25_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 129, 14, 48, 21, 72, 130, 35, 512, 22, 25, 132, 80, 37, 26, 257, 136, 38, 67, 41, 258, 28, 96, 69, 42, 144, 260, 15, 49, 70, 44, 73, 131, 50, 264, 513, 23, 160, 74, 133, 52, 81, 514, 272, 76, 27, 134, 82, 137, 39, 516, 56, 192, 259, 29, 97, 138, 84, 288, 43, 520, 145, 30, 261, 98, 140, 71, 88, 45, 146, 262, 100, 51, 265, 528, 161, 46, 320, 75, 148, 266, 53, 104, 515, 162, 273, 77, 135, 544, 152, 54, 83, 268, 517, 57, 164, 274, 193, 78, 112, 384, 139, 85, 518, 58, 289, 194, 521, 276, 31, 168, 99, 576, 86, 141, 290, 60, 89, 522, 196, 147, 263, 280, 101, 142, 529, 176, 90, 292, 47, 321, 524, 149, 200, 102, 267, 530, 105, 163, 322, 92, 640, 150, 296, 545, 153, 55, 269, 532, 106, 208, 165, 324, 275, 79, 113, 546, 154, 385, 270, 304, 108, 519, 59, 166, 536, 195, 277, 114, 169, 328, 548, 386, 156, 577, 87, 224, 291, 61, 768, 523, 278, 197, 170, 116, 281, 578, 388, 143, 552, 177, 62, 336, 91, 293, 198, 525, 172, 282, 201, 103, 580, 120, 531, 178, 392, 294, 323, 93, 641, 526, 151, 297, 560, 202, 284, 352, 533, 107, 180, 584, 209, 94, 642, 325, 298, 400, 547, 204, 155, 271, 534, 305, 109, 210, 167, 537, 326, 644, 184, 115, 300, 329, 592, 549, 387, 157, 306, 225, 110, 538, 212, 769, 279, 416, 171, 330, 117, 648, 550, 158, 579, 389, 226, 553, 308, 63, 337, 770, 540, 199, 608, 216, 118, 173, 332, 283, 390, 581, 121, 554, 228, 179, 338, 393, 656, 295, 772, 312, 527, 174, 561, 448, 203, 285, 582, 122, 353, 556, 394, 181, 585, 340, 95, 232, 643, 299, 562, 776, 401, 286, 205, 354, 124, 535, 672, 182, 586, 211, 396, 327, 645, 185, 344, 301, 564, 402, 206, 593, 240, 356, 307, 111, 784, 588, 539, 213, 646, 186, 417, 302, 331, 594, 649, 404, 551, 159, 568, 227, 309, 704, 214, 360, 771, 541, 418, 188, 609, 217, 119, 650, 333, 596, 391, 800, 408, 555, 310, 229, 339, 657, 542, 773, 313, 610, 218, 420, 175, 449, 334, 652, 368, 583, 123, 230, 600, 557, 395, 658, 341, 774, 314, 233, 612, 563, 450, 220, 777, 287, 424, 355, 125, 673, 558, 183, 832, 587, 342, 397, 660, 234, 316, 345, 778, 565, 452, 403, 207, 616, 241, 126, 674, 357, 398, 785, 589, 432, 236, 647, 187, 346, 664, 303, 566, 595, 780, 405, 242, 569, 456, 358, 676, 786, 705, 590, 215, 361, 624, 419, 189, 348, 896, 651, 406, 597, 570, 244, 801, 409, 311, 706, 788, 362, 543, 680, 190, 464, 611, 219, 421, 335, 598, 653, 369, 802, 572, 410, 231, 601, 708, 248, 659, 364, 775, 315, 422, 792, 613, 451, 221, 654, 370, 425, 688, 602, 804, 412, 559, 833, 343, 480, 661, 235, 317, 712, 614, 222, 779, 453, 426, 617, 372, 127, 675, 834, 604, 399, 662, 808, 433, 318, 237, 347, 665, 567, 454, 781, 618, 243, 428, 457, 720, 359, 677, 836, 376, 787, 591, 434, 238, 625, 666, 349, 897, 782, 407, 816, 620, 571, 458, 245, 678, 707, 789, 363, 626, 681, 436, 191, 840, 465, 350, 898, 668, 599, 736, 246, 803, 573, 460, 411, 790, 709, 249, 682, 365, 628, 466, 423, 793, 900, 440, 655, 371, 689, 574, 848, 603, 805, 413, 710, 250, 481, 366, 684, 794, 713, 468, 615, 223, 632, 427, 690, 373, 904, 806, 414, 835, 605, 482, 252, 663, 809, 319, 714, 796, 455, 864, 472, 619, 374, 429, 692, 721, 606, 837, 377, 810, 484, 435, 239, 912, 716, 667, 783, 430, 817, 621, 459, 722, 679, 838, 378, 696, 627, 812, 437, 841, 351, 488, 899, 669, 818, 737, 622, 247, 461, 724, 380, 791, 928, 683, 438, 842, 629, 467, 670, 901, 441, 738, 820, 575, 462, 849, 496, 711, 251, 728, 367, 630, 685, 844, 795, 469, 902, 442, 633, 740, 691, 850, 905, 807, 415, 824, 483, 253, 686, 960, 715, 470, 797, 634, 444, 865, 473, 375, 906, 693, 852, 607, 744, 254, 811, 485, 913, 798, 717, 866, 636, 474, 431, 694, 723, 908, 839, 379, 697, 486, 856, 813, 914, 718, 489, 752, 868, 819, 476, 623, 725, 698, 381, 929, 814, 439, 843, 916, 490, 671, 739, 821, 463, 726, 872, 497, 382, 930, 700, 729, 631, 845, 492, 903, 443, 920, 822, 741, 851, 498, 825, 730, 932, 687, 961, 846, 471, 880, 635, 445, 742, 907, 853, 826, 745, 500, 255, 962, 732, 799, 936, 446, 867, 637, 475, 695, 854, 909, 746, 828, 487, 857, 964, 504, 915, 719, 753, 638, 869, 477, 910, 944, 748, 699, 858, 815, 917, 491, 754, 968, 870, 478, 727, 873, 383, 931, 701, 860, 918, 493, 756, 921, 823, 874, 499, 702, 976, 731, 933, 847, 494, 881, 922, 743, 760, 876, 827, 501, 934, 963, 733, 882, 937, 447, 924, 855, 992, 747, 502, 829, 734, 965, 505, 938, 884, 639, 911, 945, 830, 749, 859, 966, 506, 755, 940, 969, 871, 479, 888, 946, 750, 861, 508, 919, 970, 757, 875, 948, 703, 977, 862, 495, 758, 972, 923, 761, 877, 978, 935, 952, 883, 925, 762, 993, 878, 503, 980, 735, 939, 885, 926, 994, 764, 831, 967, 507, 984, 886, 941, 889, 996, 947, 751, 509, 942, 971, 890, 949, 863, 1000, 510, 759, 973, 892, 950, 979, 953, 974, 1008, 763, 879, 981, 954, 927, 995, 765, 982, 956, 985, 887, 766, 997, 986, 943, 891, 998, 1001, 511, 988, 893, 951, 1002, 975, 1009, 894, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q26_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 14, 129, 48, 21, 72, 130, 35, 512, 22, 25, 132, 80, 37, 26, 257, 136, 38, 67, 41, 28, 258, 96, 69, 42, 144, 260, 15, 49, 70, 44, 73, 131, 50, 264, 513, 23, 160, 74, 133, 52, 81, 514, 272, 76, 27, 134, 82, 137, 39, 56, 516, 192, 29, 259, 97, 138, 84, 288, 43, 520, 30, 145, 261, 98, 140, 71, 88, 45, 146, 262, 100, 51, 265, 528, 46, 161, 320, 75, 148, 266, 53, 104, 515, 162, 273, 77, 135, 544, 152, 54, 83, 268, 57, 517, 164, 274, 78, 193, 112, 384, 139, 85, 58, 518, 289, 194, 521, 276, 31, 168, 99, 576, 86, 141, 60, 290, 89, 522, 196, 147, 263, 280, 101, 142, 529, 176, 90, 292, 47, 321, 524, 149, 200, 102, 267, 530, 105, 163, 92, 322, 640, 150, 296, 545, 153, 55, 269, 532, 106, 208, 165, 324, 275, 79, 113, 546, 154, 270, 385, 304, 108, 59, 519, 166, 536, 195, 277, 114, 169, 328, 548, 156, 386, 577, 87, 224, 61, 291, 768, 523, 278, 197, 170, 116, 281, 578, 388, 143, 552, 62, 177, 336, 91, 293, 198, 525, 172, 282, 201, 103, 120, 580, 531, 178, 392, 294, 93, 323, 526, 641, 151, 297, 560, 202, 284, 352, 533, 107, 180, 584, 94, 209, 642, 325, 298, 400, 547, 204, 155, 271, 534, 305, 109, 210, 167, 537, 326, 184, 644, 115, 300, 329, 592, 549, 157, 387, 306, 110, 225, 538, 212, 769, 279, 416, 171, 330, 117, 648, 550, 158, 579, 389, 226, 553, 308, 63, 337, 540, 770, 199, 608, 216, 118, 173, 332, 283, 390, 121, 581, 554, 228, 179, 338, 393, 656, 295, 312, 772, 527, 174, 561, 448, 203, 285, 122, 582, 353, 556, 394, 181, 585, 340, 95, 232, 643, 299, 562, 776, 286, 401, 205, 124, 354, 535, 672, 182, 586, 211, 396, 327, 185, 645, 344, 301, 564, 402, 206, 593, 240, 356, 307, 111, 784, 588, 539, 213, 186, 646, 302, 417, 331, 594, 649, 404, 551, 159, 568, 227, 309, 704, 214, 360, 541, 771, 188, 418, 609, 217, 119, 650, 333, 596, 391, 800, 408, 555, 310, 229, 339, 542, 657, 313, 773, 610, 218, 420, 175, 334, 449, 652, 368, 123, 583, 230, 600, 557, 395, 658, 341, 314, 774, 233, 612, 563, 220, 450, 777, 287, 424, 125, 355, 558, 673, 183, 832, 587, 342, 397, 660, 234, 316, 345, 778, 565, 452, 403, 207, 616, 126, 241, 674, 357, 398, 785, 589, 432, 236, 187, 647, 346, 664, 303, 566, 595, 780, 405, 242, 569, 456, 358, 676, 786, 590, 705, 215, 361, 624, 189, 419, 348, 896, 651, 406, 597, 570, 244, 801, 409, 311, 706, 788, 362, 543, 680, 190, 464, 611, 219, 421, 335, 598, 653, 369, 572, 802, 410, 231, 601, 248, 708, 659, 364, 315, 775, 422, 792, 613, 221, 451, 654, 370, 425, 688, 602, 804, 412, 559, 833, 343, 480, 661, 235, 317, 712, 614, 222, 779, 453, 426, 617, 372, 127, 675, 604, 834, 399, 662, 808, 318, 433, 237, 347, 665, 567, 454, 781, 618, 243, 428, 457, 720, 359, 677, 376, 836, 787, 591, 434, 238, 625, 666, 349, 782, 897, 407, 816, 620, 571, 458, 245, 678, 707, 789, 363, 626, 681, 436, 191, 840, 350, 465, 668, 898, 599, 736, 246, 573, 803, 460, 411, 790, 249, 709, 682, 365, 628, 466, 423, 793, 440, 900, 655, 371, 574, 689, 848, 603, 805, 413, 250, 710, 366, 481, 684, 794, 713, 468, 615, 223, 632, 427, 690, 373, 904, 806, 414, 605, 835, 252, 482, 663, 809, 319, 714, 796, 455, 864, 472, 619, 374, 429, 692, 606, 721, 377, 837, 810, 484, 435, 239, 912, 716, 667, 783, 430, 817, 621, 459, 722, 679, 378, 838, 696, 627, 812, 437, 841, 351, 488, 669, 899, 818, 622, 737, 247, 461, 724, 380, 791, 928, 683, 438, 842, 629, 467, 670, 441, 901, 738, 820, 575, 462, 849, 496, 251, 711, 728, 367, 630, 685, 844, 795, 469, 442, 902, 633, 740, 691, 850, 905, 807, 415, 824, 253, 483, 686, 960, 715, 470, 797, 634, 444, 865, 473, 375, 906, 693, 852, 607, 744, 254, 811, 485, 798, 913, 717, 636, 866, 474, 431, 694, 723, 908, 379, 839, 697, 486, 856, 813, 914, 718, 489, 752, 868, 819, 476, 623, 725, 698, 381, 814, 929, 439, 843, 916, 490, 671, 739, 821, 463, 726, 872, 382, 497, 700, 930, 729, 631, 845, 492, 443, 903, 920, 822, 741, 851, 498, 825, 730, 932, 687, 846, 961, 471, 880, 635, 445, 742, 907, 853, 826, 745, 500, 255, 732, 962, 799, 936, 446, 637, 867, 475, 695, 854, 909, 746, 828, 487, 857, 504, 964, 915, 719, 638, 753, 869, 477, 910, 944, 748, 699, 858, 815, 917, 491, 754, 968, 870, 478, 727, 873, 383, 701, 931, 860, 918, 493, 756, 921, 823, 874, 499, 702, 976, 731, 933, 847, 494, 881, 922, 743, 760, 876, 827, 501, 934, 733, 963, 882, 937, 447, 924, 855, 992, 747, 502, 829, 734, 505, 965, 938, 884, 639, 911, 830, 945, 749, 859, 506, 966, 755, 940, 969, 871, 479, 888, 946, 750, 861, 508, 919, 970, 757, 875, 948, 703, 862, 977, 495, 758, 972, 923, 761, 877, 978, 935, 952, 883, 925, 762, 878, 993, 503, 980, 735, 939, 885, 926, 764, 994, 831, 507, 967, 984, 886, 941, 889, 996, 947, 751, 509, 942, 971, 890, 949, 863, 1000, 510, 759, 973, 892, 950, 979, 953, 974, 1008, 763, 879, 981, 954, 927, 765, 995, 982, 956, 985, 887, 766, 997, 986, 943, 891, 998, 1001, 511, 988, 893, 951, 1002, 975, 894, 1009, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

Q27$_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 14, 129, 48, 21, 72, 130, 35, 512, 22, 25, 132, 80, 37, 26, 257, 136, 38, 67, 41, 28, 258, 96, 69, 42, 144, 260, 15, 49, 70, 44, 73, 131, 50, 264, 513, 23, 160, 74, 133, 52, 81, 514, 272, 76, 27, 134, 82, 137, 39, 56, 516, 192, 29, 259, 97, 138, 84, 288, 43, 520, 30, 145, 261, 98, 140, 71, 88, 45, 146, 262, 100, 51, 265, 528, 46, 161, 320, 75, 148, 266, 53, 104, 515, 162, 273, 77, 135, 544, 152, 54, 83, 268, 57, 517, 164, 274, 78, 193, 112, 384, 139, 85, 58, 518, 289, 194, 521, 276, 31, 168, 99, 576, 86, 141, 60, 290, 89, 522, 196, 147, 263, 280, 101, 142, 529, 176, 90, 292, 47, 321, 524, 149, 200, 102, 267, 530, 105, 163, 92, 322, 640, 150, 296, 545, 153, 55, 269, 532, 106, 208, 165, 324, 275, 79, 113, 546, 154, 270, 385, 304, 108, 59, 519, 166, 536, 195, 277, 114, 169, 328, 548, 156, 386, 577, 87, 224, 61, 291, 768, 523, 278, 197, 170, 116, 281, 578, 388, 143, 552, 62, 177, 336, 91, 293, 198, 525, 172, 282, 201, 103, 120, 580, 531, 178, 392, 294, 93, 323, 526, 641, 151, 297, 560, 202, 284, 352, 533, 107, 180, 584, 94, 209, 642, 325, 298, 400, 547, 204, 155, 271, 534, 305, 109, 210, 167, 537, 326, 184, 644, 115, 300, 329, 592, 549, 157, 387, 306, 110, 225, 538, 212, 769, 279, 416, 171, 330, 117, 648, 550, 158, 579, 389, 226, 553, 308, 63, 337, 540, 770, 199, 608, 216, 118, 173, 332, 283, 390, 121, 581, 554, 228, 179, 338, 393, 295, 656, 312, 772, 527, 174, 561, 448, 203, 285, 122, 582, 353, 556, 394, 181, 585, 340, 95, 232, 643, 299, 562, 776, 286, 401, 205, 124, 354, 535, 672, 182, 586, 211, 396, 327, 185, 645, 344, 301, 564, 402, 206, 593, 240, 356, 307, 111, 784, 588, 539, 213, 186, 646, 302, 417, 331, 594, 649, 404, 551, 159, 568, 227, 309, 704, 214, 360, 541, 771, 188, 418, 609, 217, 119, 650, 333, 596, 391, 800, 408, 555, 310, 229, 339, 542, 657, 313, 773, 610, 218, 420, 175, 334, 449, 652, 368, 123, 583, 230, 600, 557, 395, 658, 341, 314, 774, 233, 612, 563, 220, 450, 777, 287, 424, 125, 355, 558, 673, 183, 832, 587, 342, 397, 660, 234, 316, 345, 778, 565, 452, 403, 207, 616, 126, 241, 674, 357, 398, 785, 589, 432, 236, 187, 647, 346, 303, 664, 566, 595, 780, 405, 242, 569, 456, 358, 676, 786, 590, 705, 215, 361, 624, 189, 419, 348, 896, 651, 406, 597, 570, 244, 801, 409, 311, 706, 788, 362, 543, 680, 190, 464, 611, 219, 421, 335, 598, 653, 369, 572, 802, 410, 231, 601, 248, 708, 659, 364, 315, 775, 422, 792, 613, 221, 451, 654, 370, 425, 688, 602, 804, 412, 559, 833, 343, 480, 661, 235, 317, 712, 614, 222, 779, 453, 426, 617, 372, 127, 675, 604, 834, 399, 662, 808, 318, 433, 237, 347, 665, 567, 454, 781, 618, 243, 428, 457, 359, 720, 677, 376, 836, 787, 591, 434, 238, 625, 666, 349, 782, 897, 407, 816, 620, 571, 458, 245, 678, 707, 789, 363, 626, 681, 436, 191, 840, 350, 465, 668, 898, 599, 736, 246, 573, 803, 460, 411, 790, 249, 709, 682, 365, 628, 466, 423, 793, 440, 900, 655, 371, 574, 689, 848, 603, 805, 413, 250, 710, 366, 481, 684, 794, 713, 468, 615, 223, 632, 427, 690, 373, 904, 806, 414, 605, 835, 252, 482, 663, 809, 319, 714, 796, 455, 864, 472, 619, 374, 429, 692, 606, 721, 377, 837, 810, 484, 435, 239, 912, 716, 667, 783, 430, 817, 621, 459, 722, 679, 378, 838, 696, 627, 812, 437, 841, 351, 488, 669, 899, 818, 622, 737, 247, 461, 724, 380, 791, 928, 683, 438, 842, 629, 467, 670, 441, 901, 738, 820, 575, 462, 849, 496, 251, 711, 367, 728, 630, 685, 844, 795, 469, 442, 902, 633, 740, 691, 850, 905, 807, 415, 824, 253, 483, 686, 960, 715, 470, 797, 634, 444, 865, 473, 375, 906, 693, 852, 607, 744, 254, 811, 485, 798, 913, 717, 636, 866, 474, 431, 694, 723, 908, 379, 839, 697, 486, 856, 813, 914, 718, 489, 752, 868, 819, 476, 623, 725, 698, 381, 814, 929, 439, 843, 916, 490, 671, 739, 821, 463, 726, 872, 382, 497, 700, 930, 729, 631, 845, 492, 443, 903, 920, 822, 741, 851, 498, 825, 730, 932, 687, 846, 961, 471, 880, 635, 445, 742, 907, 853, 826, 745, 500, 255, 732, 962, 799, 936, 446, 637, 867, 475, 695, 854, 909, 746, 828, 487, 857, 504, 964, 915, 719, 638, 753, 869, 477, 910, 944, 748, 699, 858, 815, 917, 491, 754, 968, 870, 478, 727, 873, 383, 701, 931, 860, 918, 493, 756, 921, 823, 874, 499, 702, 976, 731, 933, 847, 494, 881, 922, 743, 760, 876, 827, 501, 934, 733, 963, 882, 937, 447, 924, 855, 992, 747, 502, 829, 734, 505, 965, 938, 884, 639, 911, 830, 945, 749, 859, 506, 966, 755, 940, 969, 871, 479, 888, 946, 750, 861, 508, 919, 970, 757, 875, 948, 703, 862, 977, 495, 758, 972, 923, 761, 877, 978, 935, 952, 883, 925, 762, 878, 993, 503, 980, 735, 939, 885, 926, 764, 994, 831, 507, 967, 984, 886, 941, 889, 996, 947, 751, 509, 942, 971, 890, 949, 863, 1000, 510, 759, 973, 892, 950, 979, 953, 974, 1008, 763, 879, 981, 954, 927, 765, 995, 982, 956, 985, 887, 766, 997, 986, 943, 891, 998, 1001, 511, 988, 893, 951, 1002, 975, 894, 1009, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

Q28$_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 14, 129, 48, 21, 72, 130, 35, 512, 22, 25, 132, 80, 37, 26, 257, 136, 38, 67, 41, 28, 258, 96, 69, 42, 144, 260, 15, 49, 70, 44, 73, 131, 50, 264, 513, 23, 160, 74, 133, 52, 81, 514, 272, 76, 27, 134, 82, 137, 39, 56, 516, 192, 29, 259, 97, 138, 84, 288, 43, 520, 30, 145, 261, 98, 140, 71, 88, 45, 146, 262, 100, 51, 265, 528, 46, 161, 320, 75, 148, 266, 53, 104, 515, 162, 273, 77, 135, 544, 152, 54, 83, 268, 57, 517, 164, 274, 78, 193, 112, 384, 139, 85, 58, 518, 289, 194, 521, 276, 31, 168, 99, 576, 86, 141, 60, 290, 89, 522, 196, 147, 263, 280, 101, 142, 529, 176, 90, 292, 47, 321, 524, 149, 200, 102, 267, 530, 105, 163, 92, 322, 640, 150, 296, 545, 153, 55, 269, 532, 106, 208, 165, 324, 275, 79, 113, 546, 154, 270, 385, 304, 108, 59, 519, 166, 536, 195, 277, 114, 169, 328, 548, 156, 386, 577, 87, 224, 61, 291, 768, 523, 278, 197, 170, 116, 281, 578, 388, 143, 552, 62, 177, 336, 91, 293, 198, 525, 172, 282, 201, 103, 120, 580, 531, 178, 392, 294, 93, 323, 526, 641, 151, 297, 560, 202, 284, 352, 533, 107, 180, 584, 94, 209, 642, 325, 298, 400, 547, 204, 155, 271, 534, 305, 109, 210, 167, 537, 326, 184, 644, 115, 300, 329, 592, 549, 157, 387, 306, 110, 225, 538, 212, 769, 279, 416, 171, 330, 117, 648, 550, 158, 579, 389, 226, 553, 308, 63, 337, 540, 770, 199, 608, 216, 118, 173, 332, 283, 390, 121, 581, 554, 228, 179, 338, 393, 295, 656, 312, 772, 527, 174, 561, 448, 203, 285, 122, 582, 353, 556, 394, 181, 585, 340, 95, 232, 643, 299, 562, 776, 286, 401, 205, 124, 354, 535, 672, 182, 586, 211, 396, 327, 185, 645, 344, 301, 564, 402, 206, 593, 240, 356, 307, 111, 784, 588, 539, 213, 186, 646, 302, 417, 331, 594, 649, 404, 551, 159, 568, 227, 309, 704, 214, 360, 541, 771, 188, 418, 609, 217, 119, 650, 333, 596, 391, 800, 408, 555, 310, 229, 339, 542, 657, 313, 773, 610, 218, 420, 175, 334, 449, 652, 368, 123, 583, 230, 600, 557, 395, 658, 341, 314, 233, 774, 612, 563, 220, 450, 777, 287, 424, 125, 355, 558, 673, 183, 832, 587, 342, 397, 660, 234, 316, 345, 778, 565, 452, 403, 207, 616, 126, 241, 674, 357, 398, 785, 589, 432, 236, 187, 647, 346, 303, 664, 566, 595, 780, 405, 242, 569, 456, 358, 676, 786, 590, 705, 215, 361, 624, 189, 419, 348, 896, 651, 406, 597, 570, 244, 801, 409, 311, 706, 788, 362, 543, 680, 190, 464, 611, 219, 421, 335, 598, 653, 369, 572, 802, 410, 231, 601, 248, 708, 659, 364, 315, 775, 422, 792, 613, 221, 451, 654, 370, 425, 688, 602, 804, 412, 559, 833, 343, 480, 661, 235, 317, 712, 614, 222, 779, 453, 426, 617, 372, 127, 675, 604, 834, 399, 662, 808, 318, 433, 237, 347, 665, 567, 454, 781, 618, 243, 428, 457, 359, 720, 677, 376, 836, 787, 591, 434, 238, 625, 666, 349, 782, 897, 407, 816, 620, 571, 458, 245, 678, 707, 789, 363, 626, 681, 436, 191, 840, 350, 465, 668, 898, 599, 736, 246, 573, 803, 460, 411, 249, 790, 709, 682, 365, 628, 466, 423, 793, 440, 900, 655, 371, 574, 689, 848, 603, 805, 413, 250, 710, 366, 481, 684, 794, 713, 468, 615, 223, 632, 427, 690, 373, 904, 806, 414, 605, 835, 252, 482, 663, 809, 319, 714, 796, 455, 864, 472, 619, 374, 429, 692, 606, 721, 377, 837, 810, 484, 435, 239, 912, 716, 667, 783, 430, 817, 621, 459, 722, 679, 378, 838, 696, 627, 812, 437, 841, 351, 488, 669, 899, 818, 622, 737, 247, 461, 724, 380, 791, 928, 683, 438, 842, 629, 467, 670, 441, 901, 738, 820, 575, 462, 849, 496, 251, 711, 367, 728, 630, 685, 844, 795, 469, 442, 902, 633, 740, 691, 850, 905, 807, 415, 824, 253, 483, 686, 960, 715, 470, 797, 634, 444, 865, 473, 375, 906, 693, 852, 607, 744, 254, 811, 485, 798, 913, 717, 636, 866, 474, 431, 694, 723, 908, 379, 839, 697, 486, 856, 813, 914, 718, 489, 752, 868, 819, 476, 623, 725, 698, 381, 814, 929, 439, 843, 916, 490, 671, 739, 821, 463, 726, 872, 382, 497, 700, 930, 729, 631, 845, 492, 443, 903, 920, 822, 741, 851, 498, 825, 730, 932, 687, 846, 961, 471, 880, 635, 445, 742, 907, 853, 826, 745, 500, 255, 732, 962, 799, 936, 446, 637, 867, 475, 695, 854, 909, 746, 828, 487, 857, 504, 964, 915, 719, 638, 753, 869, 477, 910, 944, 748, 699, 858, 815, 917, 491, 754, 968, 870, 478, 727, 873, 383, 701, 931, 860, 918, 493, 756, 921, 823, 874, 499, 702, 976, 731, 933, 847, 494, 881, 922, 743, 760, 876, 827, 501, 934, 733, 963, 882, 937, 447, 924, 855, 992, 747, 502, 829, 734, 505, 965, 938, 884, 639, 911, 830, 945, 749, 859, 506, 966, 755, 940, 969, 871, 479, 888, 946, 750, 861, 508, 919, 970, 757, 875, 948, 703, 862, 977, 495, 758, 972, 923, 761, 877, 978, 935, 952, 883, 925, 762, 878, 993, 503, 980, 735, 939, 885, 926, 764, 994, 831, 507, 967, 984, 886, 941, 889, 996, 947, 751, 509, 942, 971, 890, 949, 863, 1000, 510, 759, 973, 892, 950, 979, 953, 974, 1008, 763, 879, 981, 954, 927, 765, 995, 982, 956, 985, 887, 766, 997, 986, 943, 891, 998, 1001, 511, 988, 893, 951, 1002, 975, 894, 1009, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q29_1^{1024}$=[0, 1, 2, 4, 8, 16, 3, 32, 5, 6, 9, 64, 10, 17, 12, 18, 128, 33, 20, 34, 7, 24, 36, 65, 256, 11, 66, 40, 13, 68, 19, 14, 129, 48, 21, 72, 130, 35, 512, 22, 25, 132, 80, 37, 26, 257, 136, 38, 67, 41, 28, 258, 96, 69, 42, 144, 260, 15, 49, 70, 44, 73, 131, 50, 264, 513, 23, 160, 74, 133, 52, 81, 514, 272, 76, 27, 134, 82, 137, 39, 56, 516, 192, 29, 259, 97, 138, 84, 288, 43, 520, 30, 145, 261, 98, 140, 71, 88, 45, 146, 262, 100, 51, 265, 528, 46, 161, 320, 75, 148, 53, 266, 104, 515, 162, 273, 77, 135, 544, 152, 54, 83, 268, 57, 517, 164, 274, 78, 193, 112, 384, 139, 85, 58, 518, 289, 194, 521, 276, 31, 168, 99, 576, 86, 141, 60, 290, 89, 522, 196, 147, 263, 280, 101, 142, 529, 176, 90, 292, 47, 321, 524, 149, 200, 102, 267, 530, 105, 163, 92, 322, 640, 150, 296, 545, 153, 55, 269, 106, 532, 208, 165, 324, 275, 79, 113, 546, 154, 270, 385, 304, 108, 59, 519, 166, 536, 195, 277, 114, 169, 328, 548, 156, 386, 577, 87, 224, 61, 291, 768, 523, 278, 197, 170, 116, 281, 578, 388, 143, 552, 62, 177, 336, 91, 293, 198, 525, 172, 282, 201, 103, 120, 580, 531, 178, 392, 294, 93, 323, 526, 641, 151, 297, 560, 202, 284, 352, 107, 533, 180, 584, 94, 209, 642, 325, 298, 400, 547, 204, 155, 271, 534, 305, 109, 210, 167, 537, 326, 184, 644, 115, 300, 329, 592, 549, 157, 387, 306, 110, 225, 538, 212, 769, 279, 416, 171, 117, 330, 648, 550, 158, 579, 389, 226, 553, 308, 63, 337, 540, 770, 199, 608, 216, 118, 173, 332, 283, 390, 121, 581, 554, 228, 179, 338, 393, 295, 656, 312, 772, 527, 174, 561, 448, 203, 285, 122, 582, 353, 556, 181, 394, 585, 340, 95, 232, 643, 299, 562, 776, 286, 401, 205, 124, 354, 535, 672, 182, 586, 211, 396, 327, 185, 645, 344, 301, 564, 402, 206, 593, 240, 356, 307, 111, 784, 588, 539, 213, 186, 646, 302, 417, 331, 594, 649, 404, 551, 159, 568, 227, 309, 704, 214, 360, 541, 771, 188, 418, 609, 217, 119, 650, 333, 596, 391, 800, 408, 555, 310, 229, 339, 542, 657, 313, 773, 610, 218, 420, 175, 334, 449, 652, 368, 123, 583, 230, 600, 557, 395, 658, 341, 314, 233, 774, 612, 563, 220, 450, 777, 287, 424, 125, 355, 558, 673, 183, 832, 587, 342, 397, 234, 660, 316, 345, 565, 778, 452, 403, 207, 616, 126, 241, 674, 357, 398, 785, 589, 432, 236, 187, 647, 346, 303, 664, 566, 595, 780, 405, 242, 569, 456, 358, 676, 786, 590, 705, 215, 361, 624, 189, 419, 348, 896, 651, 406, 597, 570, 244, 801, 409, 311, 706, 362, 788, 543, 680, 190, 464, 611, 219, 421, 335, 598, 653, 369, 572, 802, 410, 231, 601, 248, 708, 659, 364, 315, 775, 422, 792, 613, 221, 451, 654, 370, 425, 688, 602, 804, 412, 559, 833, 343, 480, 235, 661, 317, 712, 614, 222, 779, 453, 426, 617, 372, 127, 675, 604, 834, 399, 662, 808, 318, 433, 237, 347, 665, 567, 454, 781, 618, 243, 428, 457, 359, 720, 677, 376, 836, 787, 591, 434, 238, 625, 666, 349, 782, 897, 407, 816, 620, 571, 245, 458, 678, 707, 363, 789, 626, 681, 436, 191, 840, 350, 465, 668, 898, 599, 736, 246, 573, 803, 460, 411, 249, 790, 709, 682, 365, 628, 466, 423, 793, 440, 900, 655, 371, 574, 689, 848, 603, 805, 413, 250, 710, 366, 481, 684, 794, 713, 468, 615, 223, 632, 427, 690, 373, 904, 806, 414, 605, 835, 252, 482, 663, 809, 319, 714, 796, 455, 864, 472, 619, 374, 429, 692, 606, 721, 377, 837, 810, 484, 435, 239, 912, 716, 667, 783, 430, 817, 621, 459, 722, 679, 378, 838, 696, 627, 812, 437, 841, 351, 488, 669, 899, 818, 622, 737, 247, 461, 724, 380, 791, 928, 683, 438, 629, 842, 467, 670, 441, 901, 738, 820, 575, 462, 849, 496, 251, 711, 367, 728, 630, 685, 844, 795, 469, 442, 902, 633, 740, 691, 850, 905, 807, 415, 824, 253, 483, 686, 960, 715, 470, 797, 634, 444, 865, 473, 375, 693, 906, 852, 607, 744, 254, 811, 485, 798, 913, 717, 636, 866, 474, 431, 694, 723, 908, 379, 839, 697, 486, 856, 813, 914, 718, 489, 752, 868, 819, 476, 623, 725, 698, 381, 814, 929, 439, 843, 490, 916, 671, 739, 821, 463, 726, 872, 382, 497, 700, 930, 729, 631, 845, 492, 443, 903, 920, 822, 741, 851, 498, 825, 730, 932, 687, 846, 961, 471, 880, 635, 445, 742, 907, 853, 826, 745, 500, 255, 732, 962, 799, 936, 446, 637, 867, 475, 695, 854, 909, 746, 828, 487, 857, 504, 964, 915, 719, 638, 753, 869, 477, 910, 944, 748, 699, 858, 815, 491, 917, 754, 968, 870, 478, 727, 873, 383, 701, 931, 860, 918, 493, 756, 921, 823, 874, 499, 702, 976, 731, 933, 847, 494, 881, 922, 743, 760, 876, 827, 501, 934, 733, 963, 882, 937, 447, 924, 855, 992, 747, 502, 829, 734, 505, 965, 938, 884, 639, 911, 830, 945, 749, 859, 506, 966, 755, 940, 969, 871, 479, 888, 946, 750, 861, 508, 919, 757, 970, 875, 948, 703, 862, 977, 495, 758, 972, 923, 761, 877, 978, 935, 952, 883, 925, 762, 878, 993, 503, 980, 735, 939, 885, 926, 764, 994, 831, 507, 967, 984, 886, 941, 889, 996, 947, 751, 509, 942, 971, 890, 949, 863, 1000, 510, 759, 973, 892, 950, 979, 953, 974, 1008, 763, 879, 981, 954, 927, 765, 995, 982, 956, 985, 887, 766, 997, 986, 943, 891, 998, 1001, 511, 988, 893, 951, 1002, 975, 894, 1009, 1004, 955, 1010, 983, 957, 1012, 767, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q30_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 520, 145, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 522, 147, 196, 263, 280, 101, 142, 529, 176, 90, 47, 292, 321, 524, 149, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 768, 197, 170, 116, 281, 578, 143, 388, 62, 552, 177, 91, 336, 293, 198, 525, 172, 282, 103, 201, 120, 531, 580, 178, 294, 392, 93, 323, 526, 151, 641, 297, 560, 202, 284, 107, 352, 533, 180, 94, 584, 209, 642, 325, 298, 155, 204, 547, 400, 271, 534, 109, 305, 210, 167, 537, 326, 184, 644, 115, 300, 329, 592, 157, 549, 387, 110, 306, 225, 538, 212, 279, 769, 171, 416, 117, 330, 158, 550, 648, 579, 389, 226, 63, 308, 553, 337, 540, 770, 199, 118, 216, 608, 173, 283, 332, 390, 121, 581, 554, 179, 228, 338, 295, 393, 656, 312, 527, 772, 174, 561, 203, 448, 285, 122, 582, 353, 556, 181, 394, 95, 340, 585, 232, 643, 299, 562, 286, 776, 205, 401, 124, 354, 535, 182, 672, 586, 211, 396, 327, 185, 645, 344, 301, 564, 206, 402, 593, 240, 111, 307, 356, 539, 588, 784, 213, 186, 646, 302, 417, 331, 594, 159, 551, 404, 649, 568, 227, 309, 214, 704, 360, 541, 771, 188, 418, 119, 217, 609, 650, 333, 596, 391, 310, 555, 408, 800, 229, 339, 542, 657, 313, 773, 218, 610, 175, 420, 334, 449, 652, 123, 368, 583, 230, 600, 557, 395, 658, 341, 314, 233, 774, 220, 563, 612, 450, 287, 777, 424, 125, 355, 558, 183, 673, 342, 587, 832, 397, 234, 660, 316, 345, 565, 778, 207, 403, 452, 126, 616, 241, 674, 357, 398, 589, 785, 187, 236, 432, 647, 346, 303, 566, 664, 595, 780, 405, 242, 569, 358, 456, 676, 590, 786, 215, 705, 361, 624, 189, 419, 348, 406, 651, 896, 597, 570, 244, 311, 409, 801, 706, 362, 543, 788, 190, 680, 219, 611, 464, 421, 335, 598, 653, 369, 572, 410, 802, 231, 601, 248, 659, 708, 315, 364, 775, 422, 792, 221, 613, 451, 654, 370, 425, 688, 602, 559, 412, 804, 343, 833, 235, 480, 661, 317, 222, 614, 712, 779, 453, 426, 127, 372, 617, 675, 604, 834, 399, 662, 318, 808, 237, 433, 347, 567, 665, 454, 781, 618, 243, 428, 359, 457, 720, 677, 376, 591, 787, 836, 238, 434, 625, 666, 349, 782, 407, 897, 571, 620, 816, 245, 458, 678, 707, 363, 789, 626, 191, 436, 681, 350, 840, 465, 668, 898, 599, 246, 736, 573, 411, 460, 803, 249, 790, 709, 682, 365, 628, 466, 423, 793, 440, 655, 900, 371, 574, 689, 603, 848, 413, 805, 250, 710, 366, 481, 684, 794, 223, 615, 468, 713, 632, 427, 690, 373, 414, 806, 904, 605, 835, 252, 482, 663, 319, 809, 714, 796, 455, 374, 619, 472, 864, 429, 692, 606, 721, 377, 837, 810, 239, 435, 484, 667, 716, 912, 783, 430, 621, 817, 459, 722, 679, 378, 838, 696, 627, 812, 437, 351, 841, 488, 669, 899, 622, 818, 247, 737, 461, 724, 380, 791, 438, 683, 928, 629, 842, 467, 670, 441, 901, 738, 575, 820, 462, 849, 251, 496, 711, 367, 630, 728, 685, 795, 844, 469, 442, 902, 633, 691, 740, 850, 415, 807, 905, 824, 253, 483, 686, 470, 715, 960, 797, 634, 444, 375, 473, 865, 693, 906, 607, 852, 254, 744, 811, 485, 798, 717, 913, 636, 474, 866, 431, 694, 723, 908, 379, 839, 697, 486, 856, 813, 718, 914, 489, 752, 623, 476, 819, 868, 725, 698, 381, 814, 439, 929, 843, 490, 671, 916, 739, 821, 463, 726, 382, 872, 497, 700, 930, 631, 729, 845, 443, 492, 903, 822, 920, 741, 851, 498, 825, 730, 687, 932, 846, 471, 961, 635, 880, 445, 742, 907, 853, 826, 255, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 874, 499, 702, 731, 976, 933, 847, 494, 881, 922, 743, 760, 827, 876, 501, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 878, 503, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q31_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 520, 145, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 522, 147, 196, 263, 280, 101, 142, 529, 176, 90, 47, 292, 321, 524, 149, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 578, 143, 388, 62, 552, 177, 91, 336, 293, 198, 525, 172, 282, 103, 201, 120, 531, 580, 178, 294, 392, 93, 323, 526, 151, 641, 297, 560, 202, 284, 107, 533, 352, 180, 94, 584, 209, 642, 325, 298, 155, 204, 547, 400, 271, 534, 109, 305, 210, 167, 537, 326, 184, 644, 115, 300, 329, 592, 157, 549, 387, 110, 306, 225, 538, 212, 279, 769, 171, 416, 117, 330, 158, 550, 648, 579, 389, 226, 63, 308, 553, 337, 540, 199, 770, 118, 216, 608, 173, 283, 332, 390, 121, 581, 554, 179, 228, 338, 295, 393, 656, 312, 527, 772, 174, 561, 203, 448, 285, 122, 582, 353, 556, 181, 394, 95, 340, 585, 232, 643, 299, 562, 286, 205, 776, 401, 124, 535, 354, 182, 672, 586, 211, 396, 327, 185, 645, 344, 301, 564, 206, 402, 593, 240, 111, 307, 356, 539, 588, 213, 784, 186, 646, 302, 417, 331, 594, 159, 551, 404, 649, 568, 227, 309, 214, 704, 541, 360, 771, 188, 418, 119, 217, 609, 650, 333, 596, 391, 310, 555, 408, 229, 800, 339, 542, 657, 313, 773, 218, 610, 175, 420, 334, 449, 652, 123, 368, 583, 230, 600, 557, 395, 658, 341, 314, 233, 774, 220, 563, 612, 450, 287, 777, 424, 125, 355, 558, 183, 673, 342, 587, 832, 397, 234, 660, 316, 345, 565, 207, 778, 403, 452, 126, 616, 241, 674, 357, 398, 589, 785, 187, 236, 432, 647, 346, 303, 566, 664, 595, 780, 405, 242, 569, 358, 456, 676, 590, 215, 786, 705, 361, 624, 189, 419, 348, 406, 651, 896, 597, 570, 244, 311, 409, 801, 706, 543, 362, 788, 190, 680, 219, 611, 464, 421, 335, 598, 653, 369, 572, 410, 231, 802, 601, 248, 659, 708, 315, 364, 775, 422, 221, 792, 613, 451, 654, 370, 425, 688, 602, 559, 412, 804, 343, 833, 235, 661, 480, 317, 222, 614, 712, 779, 453, 426, 127, 372, 617, 675, 604, 834, 399, 662, 318, 237, 808, 433, 347, 567, 665, 454, 781, 618, 243, 428, 359, 457, 720, 677, 376, 591, 787, 836, 238, 434, 625, 666, 349, 782, 407, 897, 571, 620, 245, 816, 458, 678, 707, 363, 789, 626, 191, 436, 681, 350, 840, 465, 668, 898, 599, 246, 736, 573, 411, 460, 803, 249, 790, 709, 682, 365, 628, 466, 423, 793, 440, 655, 900, 371, 574, 689, 603, 848, 413, 805, 250, 710, 366, 481, 684, 223, 794, 615, 468, 713, 632, 427, 690, 373, 414, 806, 904, 605, 835, 252, 663, 482, 319, 809, 714, 796, 455, 374, 619, 472, 864, 429, 692, 606, 721, 377, 837, 239, 810, 435, 484, 667, 716, 912, 783, 430, 621, 817, 459, 722, 679, 378, 838, 696, 627, 812, 437, 351, 841, 669, 488, 899, 622, 247, 818, 737, 461, 724, 380, 791, 438, 683, 928, 629, 842, 467, 670, 441, 901, 738, 575, 820, 462, 849, 251, 496, 711, 367, 630, 728, 685, 795, 844, 469, 442, 902, 633, 691, 740, 850, 415, 807, 905, 253, 824, 483, 686, 470, 715, 960, 797, 634, 444, 375, 473, 865, 693, 906, 607, 852, 254, 744, 811, 485, 798, 717, 913, 636, 474, 866, 431, 694, 723, 908, 379, 839, 697, 486, 856, 813, 718, 914, 489, 752, 623, 476, 819, 868, 725, 698, 381, 814, 439, 929, 843, 671, 490, 916, 739, 821, 463, 726, 382, 872, 497, 700, 930, 631, 729, 845, 443, 492, 903, 822, 920, 741, 851, 498, 825, 730, 687, 932, 846, 471, 961, 635, 880, 445, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 874, 499, 702, 731, 976, 933, 847, 494, 881, 922, 743, 760, 827, 876, 501, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 878, 503, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q32_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 520, 145, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 522, 147, 196, 263, 280, 101, 142, 529, 176, 90, 47, 292, 321, 524, 149, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 578, 143, 388, 62, 552, 177, 91, 336, 293, 198, 525, 172, 282, 103, 201, 120, 531, 580, 178, 294, 392, 93, 323, 526, 151, 641, 297, 560, 202, 284, 107, 533, 352, 180, 94, 584, 209, 642, 325, 298, 155, 204, 547, 400, 271, 534, 109, 305, 210, 167, 537, 326, 184, 644, 115, 300, 329, 592, 157, 549, 387, 110, 306, 225, 538, 212, 279, 769, 171, 416, 117, 330, 158, 550, 648, 579, 389, 226, 63, 308, 553, 337, 540, 199, 770, 118, 216, 608, 173, 283, 332, 390, 121, 581, 554, 179, 228, 338, 295, 393, 656, 312, 527, 772, 174, 561, 203, 448, 285, 122, 582, 353, 556, 181, 394, 95, 340, 585, 232, 643, 299, 562, 286, 205, 776, 401, 124, 535, 354, 182, 672, 586, 211, 396, 327, 185, 645, 344, 301, 564, 206, 402, 593, 240, 111, 307, 356, 539, 588, 213, 784, 186, 646, 302, 417, 331, 594, 159, 551, 404, 649, 568, 227, 309, 214, 704, 541, 360, 771, 188, 418, 119, 217, 609, 650, 333, 596, 391, 310, 555, 408, 229, 800, 339, 542, 657, 313, 218, 773, 610, 175, 420, 334, 449, 652, 123, 368, 583, 230, 600, 557, 395, 658, 341, 314, 233, 774, 220, 563, 612, 450, 287, 777, 424, 125, 355, 558, 183, 673, 342, 587, 832, 397, 234, 660, 316, 345, 565, 207, 778, 403, 452, 126, 616, 241, 674, 357, 398, 589, 785, 187, 236, 432, 647, 346, 303, 566, 664, 595, 780, 405, 242, 569, 358, 456, 676, 590, 215, 786, 705, 361, 624, 189, 419, 348, 406, 651, 896, 597, 570, 244, 311, 409, 801, 706, 543, 362, 788, 190, 680, 219, 611, 464, 421, 335, 598, 653, 369, 572, 410, 231, 802, 601, 248, 659, 708, 315, 364, 775, 422, 221, 792, 613, 451, 654, 370, 425, 688, 602, 559, 412, 804, 343, 833, 235, 661, 480, 317, 222, 614, 712, 779, 453, 426, 127, 372, 617, 675, 604, 834, 399, 662, 318, 237, 808, 433, 347, 567, 665, 454, 781, 618, 243, 428, 359, 457, 720, 677, 376, 591, 787, 836, 238, 434, 625, 666, 349, 782, 407, 897, 571, 620, 245, 816, 458, 678, 707, 363, 789, 626, 191, 436, 681, 350, 840, 465, 668, 898, 599, 246, 736, 573, 411, 460, 803, 249, 790, 709, 682, 365, 628, 466, 423, 793, 440, 655, 900, 371, 574, 689, 603, 848, 413, 250, 805, 710, 366, 481, 684, 223, 794, 615, 468, 713, 632, 427, 690, 373, 414, 806, 904, 605, 835, 252, 663, 482, 319, 809, 714, 796, 455, 374, 619, 472, 864, 429, 692, 606, 721, 377, 837, 239, 810, 435, 484, 667, 716, 912, 783, 430, 621, 817, 459, 722, 679, 378, 838, 696, 627, 812, 437, 351, 841, 669, 488, 899, 622, 247, 818, 737, 461, 724, 380, 791, 438, 683, 928, 629, 842, 467, 670, 441, 901, 738, 575, 820, 462, 849, 251, 496, 711, 367, 630, 728, 685, 795, 844, 469, 442, 902, 633, 691, 740, 850, 415, 807, 905, 253, 824, 483, 686, 470, 715, 960, 797, 634, 444, 375, 473, 865, 693, 906, 607, 852, 254, 744, 811, 485, 798, 717, 913, 636, 474, 866, 431, 694, 723, 908, 379, 839, 697, 486, 856, 813, 718, 914, 489, 752, 623, 476, 819, 868, 725, 698, 381, 814, 439, 929, 843, 671, 490, 916, 739, 821, 463, 726, 382, 872, 497, 700, 930, 631, 729, 845, 443, 492, 903, 822, 920, 741, 851, 498, 825, 730, 687, 932, 846, 471, 961, 635, 880, 445, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 874, 499, 702, 731, 976, 933, 847, 494, 881, 922, 743, 760, 827, 876, 501, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 878, 503, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q33_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 147, 522, 196, 263, 280, 101, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 578, 143, 388, 62, 177, 552, 91, 336, 293, 198, 525, 172, 282, 103, 201, 120, 531, 580, 178, 294, 392, 93, 323, 151, 526, 641, 297, 560, 202, 284, 107, 533, 352, 180, 94, 209, 584, 642, 325, 298, 155, 204, 547, 400, 271, 534, 109, 305, 210, 167, 537, 326, 184, 644, 115, 300, 329, 592, 157, 549, 387, 110, 306, 225, 538, 212, 279, 769, 171, 416, 117, 330, 158, 550, 648, 579, 389, 226, 63, 308, 553, 337, 540, 199, 770, 118, 216, 608, 173, 283, 332, 390, 121, 581, 179, 554, 228, 338, 295, 393, 656, 312, 527, 772, 174, 561, 203, 448, 285, 122, 582, 353, 181, 556, 394, 95, 340, 585, 232, 643, 299, 562, 286, 205, 401, 776, 124, 535, 354, 182, 672, 211, 586, 396, 327, 185, 645, 344, 301, 564, 206, 402, 593, 240, 111, 307, 356, 539, 213, 588, 784, 186, 646, 302, 417, 331, 594, 159, 551, 404, 649, 568, 227, 309, 214, 704, 541, 360, 771, 188, 418, 119, 217, 609, 650, 333, 596, 391, 310, 555, 408, 229, 800, 339, 542, 657, 313, 218, 773, 610, 175, 420, 334, 449, 652, 123, 368, 583, 230, 600, 557, 395, 658, 341, 314, 233, 774, 220, 563, 612, 450, 287, 777, 424, 125, 355, 183, 558, 673, 342, 587, 832, 397, 234, 660, 316, 345, 565, 207, 403, 778, 452, 126, 241, 616, 674, 357, 398, 589, 785, 187, 236, 432, 647, 346, 303, 566, 664, 595, 405, 780, 242, 569, 358, 456, 676, 215, 590, 786, 705, 361, 624, 189, 419, 348, 406, 651, 896, 597, 570, 244, 311, 409, 801, 706, 543, 362, 788, 190, 680, 219, 611, 464, 421, 335, 598, 653, 369, 572, 410, 231, 802, 601, 248, 659, 708, 315, 364, 775, 422, 221, 792, 613, 451, 654, 370, 425, 688, 602, 559, 412, 804, 343, 833, 235, 661, 480, 317, 222, 614, 712, 779, 453, 426, 127, 372, 617, 675, 604, 834, 399, 662, 318, 237, 433, 808, 347, 567, 665, 454, 781, 243, 618, 428, 359, 457, 720, 677, 376, 591, 787, 836, 238, 434, 625, 666, 349, 407, 782, 897, 571, 245, 620, 816, 458, 678, 707, 363, 789, 626, 191, 436, 681, 350, 465, 840, 668, 898, 599, 246, 736, 573, 411, 460, 803, 249, 790, 709, 682, 365, 628, 466, 423, 793, 440, 655, 900, 371, 574, 689, 603, 848, 413, 250, 805, 710, 366, 481, 684, 223, 794, 615, 468, 713, 632, 427, 690, 373, 414, 806, 904, 605, 835, 252, 663, 482, 319, 809, 714, 796, 455, 374, 619, 472, 864, 429, 692, 606, 721, 377, 837, 239, 435, 810, 484, 667, 716, 912, 783, 430, 621, 817, 459, 722, 679, 378, 838, 696, 627, 437, 812, 351, 841, 669, 488, 899, 247, 622, 818, 737, 461, 724, 380, 791, 438, 683, 928, 629, 467, 842, 670, 441, 901, 738, 575, 820, 462, 849, 251, 496, 711, 367, 630, 728, 685, 795, 469, 844, 442, 902, 633, 691, 740, 850, 415, 807, 905, 253, 824, 483, 686, 470, 715, 960, 797, 634, 444, 375, 473, 865, 693, 906, 607, 852, 254, 744, 811, 485, 798, 717, 913, 636, 474, 866, 431, 694, 723, 908, 379, 839, 697, 486, 856, 813, 718, 914, 489, 752, 623, 476, 819, 868, 725, 698, 381, 439, 814, 929, 843, 671, 490, 916, 739, 821, 463, 726, 382, 497, 872, 700, 930, 631, 729, 845, 443, 492, 903, 822, 920, 741, 851, 498, 825, 730, 687, 932, 471, 846, 961, 635, 880, 445, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 922, 743, 760, 827, 501, 876, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q34_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 578, 143, 388, 62, 177, 552, 91, 336, 293, 198, 525, 172, 103, 282, 201, 120, 531, 580, 178, 294, 392, 93, 323, 151, 526, 641, 297, 202, 560, 284, 107, 533, 352, 180, 94, 209, 584, 642, 325, 298, 155, 204, 547, 400, 271, 534, 109, 305, 210, 167, 537, 326, 184, 644, 115, 300, 329, 592, 157, 549, 387, 110, 306, 225, 538, 212, 279, 769, 171, 416, 117, 330, 158, 550, 648, 579, 389, 226, 63, 308, 553, 337, 540, 199, 770, 118, 216, 608, 173, 283, 332, 390, 121, 581, 179, 554, 228, 338, 295, 393, 656, 312, 527, 772, 174, 203, 561, 448, 285, 122, 582, 353, 181, 556, 394, 95, 340, 585, 232, 643, 299, 562, 286, 205, 401, 776, 124, 535, 354, 182, 672, 211, 586, 396, 327, 185, 645, 344, 301, 206, 564, 402, 593, 240, 111, 307, 356, 539, 213, 588, 784, 186, 646, 302, 417, 331, 594, 159, 551, 404, 649, 568, 227, 309, 214, 704, 541, 360, 771, 188, 418, 119, 217, 609, 650, 333, 596, 391, 310, 555, 229, 408, 800, 339, 542, 657, 313, 218, 773, 610, 175, 420, 334, 449, 652, 123, 368, 583, 230, 600, 557, 395, 658, 341, 314, 233, 774, 220, 563, 612, 450, 287, 777, 424, 125, 355, 183, 558, 673, 342, 587, 832, 397, 234, 660, 316, 345, 207, 565, 403, 778, 452, 126, 241, 616, 674, 357, 398, 589, 785, 187, 236, 432, 647, 346, 303, 566, 664, 595, 405, 780, 242, 569, 358, 456, 676, 215, 590, 786, 705, 361, 624, 189, 419, 348, 406, 651, 896, 597, 570, 244, 311, 409, 801, 706, 543, 362, 788, 190, 680, 219, 611, 464, 421, 335, 598, 653, 369, 572, 231, 410, 802, 601, 248, 659, 708, 315, 364, 775, 422, 221, 613, 792, 451, 654, 370, 425, 688, 602, 559, 412, 804, 343, 833, 235, 661, 480, 317, 222, 614, 712, 779, 453, 426, 127, 372, 617, 675, 604, 834, 399, 662, 318, 237, 433, 808, 347, 567, 665, 454, 781, 243, 618, 428, 359, 457, 720, 677, 376, 591, 787, 836, 238, 434, 625, 666, 349, 407, 782, 897, 571, 245, 620, 458, 816, 678, 707, 363, 789, 626, 191, 436, 681, 350, 465, 840, 668, 898, 599, 246, 736, 573, 411, 460, 803, 249, 790, 709, 682, 365, 628, 466, 423, 793, 440, 655, 900, 371, 574, 689, 603, 848, 413, 250, 805, 710, 366, 481, 684, 223, 615, 794, 468, 713, 632, 427, 690, 373, 414, 806, 904, 605, 835, 252, 663, 482, 319, 809, 714, 796, 455, 374, 619, 472, 864, 429, 692, 606, 721, 377, 837, 239, 435, 810, 484, 667, 716, 912, 783, 430, 621, 459, 817, 722, 679, 378, 838, 696, 627, 437, 812, 351, 841, 669, 488, 899, 247, 622, 818, 737, 461, 724, 380, 791, 438, 683, 928, 629, 467, 842, 670, 441, 901, 738, 575, 462, 820, 849, 251, 496, 711, 367, 630, 728, 685, 795, 469, 844, 442, 902, 633, 691, 740, 850, 415, 807, 905, 253, 824, 483, 686, 470, 715, 960, 797, 634, 444, 375, 473, 865, 693, 906, 607, 852, 254, 744, 811, 485, 798, 717, 913, 636, 474, 866, 431, 694, 723, 908, 379, 839, 697, 486, 856, 813, 718, 914, 489, 752, 623, 476, 819, 868, 725, 698, 381, 439, 814, 929, 843, 671, 490, 916, 739, 463, 821, 726, 382, 497, 872, 700, 930, 631, 729, 845, 443, 492, 903, 822, 741, 920, 851, 498, 825, 730, 687, 932, 471, 846, 961, 635, 880, 445, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q35_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 576, 141, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 578, 143, 388, 62, 177, 552, 91, 336, 293, 198, 525, 172, 103, 282, 201, 120, 531, 580, 178, 294, 392, 93, 323, 151, 526, 641, 297, 202, 560, 284, 107, 533, 352, 180, 94, 209, 584, 642, 325, 298, 155, 204, 547, 400, 271, 534, 109, 305, 210, 167, 537, 326, 184, 115, 644, 300, 329, 592, 157, 549, 387, 110, 306, 225, 538, 212, 279, 769, 171, 416, 117, 330, 158, 550, 648, 579, 389, 226, 63, 308, 553, 337, 540, 199, 770, 118, 216, 608, 173, 283, 332, 121, 390, 581, 179, 554, 228, 338, 295, 393, 656, 312, 527, 772, 174, 203, 561, 448, 285, 122, 582, 353, 181, 556, 394, 95, 340, 585, 232, 643, 299, 562, 286, 205, 401, 776, 124, 535, 354, 182, 672, 211, 586, 396, 327, 185, 645, 344, 301, 206, 564, 402, 593, 240, 111, 307, 356, 539, 213, 588, 784, 186, 646, 302, 417, 331, 594, 159, 551, 404, 649, 568, 227, 309, 214, 704, 541, 360, 771, 188, 418, 119, 217, 609, 650, 333, 596, 391, 310, 555, 229, 408, 800, 339, 542, 657, 313, 218, 773, 610, 175, 420, 334, 449, 123, 652, 368, 583, 230, 600, 557, 395, 658, 341, 314, 233, 774, 220, 563, 612, 450, 287, 777, 424, 125, 355, 183, 558, 673, 342, 587, 832, 397, 234, 660, 316, 345, 207, 565, 403, 778, 452, 126, 241, 616, 674, 357, 398, 589, 785, 187, 236, 432, 647, 346, 303, 566, 664, 595, 405, 242, 780, 569, 358, 456, 676, 215, 590, 786, 705, 361, 624, 189, 419, 348, 406, 651, 896, 597, 570, 244, 311, 409, 801, 706, 543, 362, 788, 190, 680, 219, 611, 464, 421, 335, 598, 653, 369, 572, 231, 410, 802, 601, 248, 659, 708, 315, 364, 775, 422, 221, 613, 792, 451, 654, 370, 425, 688, 602, 559, 412, 804, 343, 833, 235, 661, 480, 317, 222, 614, 712, 779, 453, 426, 127, 372, 617, 675, 604, 834, 399, 662, 318, 237, 433, 808, 347, 567, 665, 454, 243, 781, 618, 428, 359, 457, 720, 677, 376, 591, 787, 836, 238, 434, 625, 666, 349, 407, 782, 897, 571, 245, 620, 458, 816, 678, 707, 363, 789, 626, 191, 436, 681, 350, 465, 840, 668, 898, 599, 246, 736, 573, 411, 460, 803, 249, 790, 709, 682, 365, 628, 466, 423, 793, 440, 655, 371, 900, 574, 689, 603, 848, 413, 250, 805, 710, 366, 481, 684, 223, 615, 794, 468, 713, 632, 427, 690, 373, 414, 806, 904, 605, 835, 252, 663, 482, 319, 809, 714, 796, 455, 374, 619, 472, 864, 429, 692, 606, 721, 377, 837, 239, 435, 810, 484, 667, 716, 912, 783, 430, 621, 459, 817, 722, 679, 378, 838, 696, 627, 437, 812, 351, 841, 669, 488, 899, 247, 622, 818, 737, 461, 724, 380, 791, 438, 683, 928, 629, 467, 842, 670, 441, 901, 738, 575, 462, 820, 849, 251, 496, 711, 367, 630, 728, 685, 795, 469, 844, 442, 633, 902, 691, 740, 850, 415, 807, 905, 253, 824, 483, 686, 470, 715, 960, 797, 634, 444, 375, 473, 865, 693, 906, 607, 852, 254, 744, 811, 485, 798, 717, 913, 636, 474, 866, 431, 694, 723, 379, 908, 839, 697, 486, 856, 813, 718, 914, 489, 752, 623, 476, 819, 868, 725, 698, 381, 439, 814, 929, 843, 671, 490, 916, 739, 463, 821, 726, 382, 497, 872, 700, 930, 631, 729, 845, 443, 492, 903, 822, 741, 920, 851, 498, 825, 730, 687, 932, 471, 846, 961, 635, 880, 445, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 882, 447, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q36_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 384, 85, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 386, 87, 577, 224, 61, 291, 278, 523, 197, 768, 170, 116, 281, 143, 578, 388, 62, 177, 552, 91, 336, 293, 198, 525, 172, 103, 282, 201, 120, 531, 580, 178, 294, 392, 93, 323, 151, 526, 641, 297, 202, 560, 284, 107, 533, 352, 180, 94, 209, 584, 642, 325, 298, 155, 204, 547, 400, 271, 534, 109, 305, 210, 167, 537, 326, 184, 115, 644, 300, 329, 157, 592, 549, 387, 110, 306, 225, 538, 212, 279, 769, 171, 416, 117, 330, 158, 550, 648, 579, 389, 226, 63, 308, 553, 337, 540, 199, 770, 118, 216, 173, 608, 283, 332, 121, 390, 581, 179, 554, 228, 338, 295, 393, 656, 312, 527, 772, 174, 203, 561, 448, 285, 122, 582, 353, 181, 556, 394, 95, 340, 585, 232, 643, 299, 562, 286, 205, 401, 776, 124, 535, 354, 182, 672, 211, 586, 396, 327, 185, 645, 344, 301, 206, 564, 402, 593, 240, 111, 307, 356, 539, 213, 588, 784, 186, 646, 302, 417, 331, 159, 594, 551, 404, 649, 568, 227, 309, 214, 704, 541, 360, 188, 771, 418, 119, 217, 609, 650, 333, 596, 391, 310, 555, 229, 408, 800, 339, 542, 657, 313, 218, 773, 175, 610, 420, 334, 449, 123, 652, 368, 583, 230, 600, 557, 395, 658, 341, 314, 233, 774, 220, 563, 612, 450, 287, 777, 424, 125, 355, 183, 558, 673, 342, 587, 397, 832, 234, 660, 316, 345, 207, 565, 403, 778, 452, 126, 241, 616, 674, 357, 398, 589, 785, 187, 236, 432, 647, 346, 303, 566, 664, 595, 405, 242, 780, 569, 358, 456, 676, 215, 590, 786, 705, 361, 189, 624, 419, 348, 406, 651, 896, 597, 570, 244, 311, 409, 801, 706, 543, 362, 788, 190, 680, 219, 611, 464, 421, 335, 598, 653, 369, 572, 231, 410, 802, 601, 248, 659, 708, 315, 364, 775, 422, 221, 613, 792, 451, 654, 370, 425, 688, 602, 559, 412, 804, 343, 833, 235, 661, 480, 317, 222, 614, 712, 779, 453, 426, 127, 372, 617, 675, 604, 399, 834, 662, 318, 237, 433, 808, 347, 567, 665, 454, 243, 781, 618, 428, 359, 457, 720, 677, 376, 591, 787, 836, 238, 434, 625, 666, 349, 407, 782, 897, 571, 245, 620, 458, 816, 678, 707, 363, 789, 191, 626, 436, 681, 350, 465, 840, 668, 898, 599, 246, 736, 573, 411, 460, 803, 249, 790, 709, 682, 365, 628, 466, 423, 793, 440, 655, 371, 900, 574, 689, 603, 413, 848, 250, 805, 710, 366, 481, 684, 223, 615, 794, 468, 713, 632, 427, 690, 373, 414, 806, 904, 605, 252, 835, 663, 482, 319, 809, 714, 796, 455, 374, 619, 472, 429, 864, 692, 606, 721, 377, 837, 239, 435, 810, 484, 667, 716, 912, 783, 430, 621, 459, 817, 722, 679, 378, 838, 696, 627, 437, 812, 351, 841, 669, 488, 899, 247, 622, 818, 737, 461, 724, 380, 791, 438, 683, 928, 629, 467, 842, 670, 441, 901, 738, 575, 462, 820, 849, 251, 496, 711, 367, 630, 728, 685, 795, 469, 844, 442, 633, 902, 691, 740, 415, 850, 807, 905, 253, 824, 483, 686, 470, 715, 960, 797, 634, 444, 375, 473, 865, 693, 906, 607, 852, 254, 744, 811, 485, 798, 717, 913, 636, 474, 431, 866, 694, 723, 379, 908, 839, 697, 486, 856, 813, 718, 914, 489, 752, 623, 476, 819, 868, 725, 698, 381, 439, 814, 929, 843, 671, 490, 916, 739, 463, 821, 726, 382, 497, 872, 700, 930, 631, 729, 845, 443, 492, 903, 822, 741, 920, 851, 498, 825, 730, 687, 932, 471, 846, 961, 635, 445, 880, 742, 907, 853, 255, 826, 500, 745, 732, 962, 799, 446, 936, 637, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 938, 639, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q37_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 85, 384, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 87, 386, 577, 224, 61, 291, 278, 523, 197, 170, 768, 116, 281, 143, 578, 388, 62, 177, 552, 91, 336, 293, 198, 525, 172, 103, 282, 201, 120, 531, 580, 178, 294, 93, 392, 323, 151, 526, 641, 297, 202, 560, 284, 107, 533, 352, 180, 94, 209, 584, 642, 325, 298, 155, 204, 547, 400, 271, 534, 109, 305, 210, 167, 537, 326, 184, 115, 644, 300, 329, 157, 592, 549, 387, 110, 306, 225, 538, 212, 279, 171, 769, 117, 416, 330, 158, 550, 648, 579, 389, 226, 63, 308, 553, 337, 540, 199, 770, 118, 216, 173, 608, 283, 332, 121, 390, 581, 179, 554, 228, 338, 295, 393, 656, 312, 527, 174, 772, 203, 561, 448, 285, 122, 582, 353, 181, 556, 95, 394, 340, 585, 232, 643, 299, 562, 286, 205, 401, 776, 124, 535, 354, 182, 672, 211, 586, 396, 327, 185, 645, 344, 301, 206, 564, 402, 593, 240, 111, 307, 356, 539, 213, 588, 186, 784, 646, 302, 417, 331, 159, 594, 551, 404, 649, 568, 227, 309, 214, 704, 541, 360, 188, 771, 119, 418, 217, 609, 650, 333, 596, 391, 310, 555, 229, 408, 800, 339, 542, 657, 313, 218, 175, 773, 610, 420, 334, 449, 123, 652, 368, 583, 230, 600, 557, 395, 658, 341, 314, 233, 774, 220, 563, 612, 450, 287, 777, 125, 424, 355, 183, 558, 673, 342, 587, 397, 234, 832, 660, 316, 345, 207, 565, 403, 778, 452, 126, 241, 616, 674, 357, 398, 589, 187, 785, 236, 432, 647, 346, 303, 566, 664, 595, 405, 242, 780, 569, 358, 456, 676, 215, 590, 786, 705, 361, 189, 624, 419, 348, 406, 651, 597, 896, 570, 244, 311, 409, 801, 706, 543, 362, 190, 788, 680, 219, 611, 464, 421, 335, 598, 653, 369, 572, 231, 410, 802, 601, 248, 659, 708, 315, 364, 775, 422, 221, 613, 792, 451, 654, 370, 425, 688, 602, 559, 412, 804, 343, 235, 833, 661, 480, 317, 222, 614, 712, 779, 453, 127, 426, 372, 617, 675, 604, 399, 834, 662, 318, 237, 433, 808, 347, 567, 665, 454, 243, 781, 618, 428, 359, 457, 720, 677, 376, 591, 787, 238, 836, 434, 625, 666, 349, 407, 782, 897, 571, 245, 620, 458, 816, 678, 707, 363, 191, 789, 626, 436, 681, 350, 465, 840, 668, 599, 898, 246, 736, 573, 411, 460, 803, 249, 790, 709, 682, 365, 628, 466, 423, 793, 440, 655, 371, 900, 574, 689, 603, 413, 250, 848, 805, 710, 366, 481, 684, 223, 615, 794, 468, 713, 632, 427, 690, 373, 414, 806, 605, 904, 252, 835, 663, 482, 319, 809, 714, 796, 455, 374, 619, 472, 429, 864, 692, 606, 721, 377, 239, 837, 435, 810, 484, 667, 716, 912, 783, 430, 621, 459, 817, 722, 679, 378, 838, 696, 627, 437, 812, 351, 841, 669, 488, 899, 247, 622, 818, 737, 461, 724, 380, 791, 438, 683, 629, 928, 467, 842, 670, 441, 901, 738, 575, 462, 820, 251, 849, 496, 711, 367, 630, 728, 685, 795, 469, 844, 442, 633, 902, 691, 740, 415, 850, 807, 905, 253, 824, 483, 686, 470, 715, 960, 797, 634, 444, 375, 473, 865, 693, 607, 906, 254, 852, 744, 811, 485, 798, 717, 913, 636, 474, 431, 866, 694, 723, 379, 908, 839, 697, 486, 856, 813, 718, 914, 489, 752, 623, 476, 819, 868, 725, 698, 381, 439, 814, 929, 843, 671, 490, 916, 739, 463, 821, 726, 382, 497, 872, 700, 631, 930, 729, 845, 443, 492, 903, 822, 741, 920, 851, 498, 825, 730, 687, 932, 471, 846, 961, 635, 445, 880, 742, 907, 255, 853, 826, 500, 745, 732, 962, 799, 446, 637, 936, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 639, 938, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q38_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 544, 83, 268, 57, 517, 164, 78, 274, 193, 112, 139, 85, 384, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 536, 195, 277, 114, 169, 328, 156, 548, 87, 386, 577, 224, 61, 291, 278, 523, 197, 170, 768, 116, 281, 143, 578, 388, 62, 177, 552, 91, 336, 293, 198, 525, 172, 103, 282, 201, 120, 531, 580, 178, 294, 93, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 538, 212, 279, 171, 769, 117, 416, 330, 158, 550, 648, 579, 389, 226, 63, 308, 553, 337, 540, 199, 770, 118, 216, 173, 608, 283, 332, 121, 390, 581, 179, 554, 228, 338, 295, 393, 656, 312, 527, 174, 772, 203, 561, 448, 285, 122, 582, 353, 181, 556, 95, 394, 340, 585, 232, 643, 299, 562, 286, 205, 401, 776, 124, 535, 354, 182, 672, 211, 586, 396, 327, 185, 645, 344, 301, 206, 564, 402, 593, 240, 111, 307, 356, 539, 213, 588, 186, 784, 646, 302, 417, 331, 159, 594, 551, 404, 649, 568, 227, 309, 214, 704, 541, 360, 188, 771, 119, 418, 217, 609, 333, 650, 596, 391, 310, 555, 229, 408, 800, 339, 542, 657, 313, 218, 175, 773, 610, 420, 334, 449, 123, 652, 368, 583, 230, 600, 557, 395, 341, 658, 314, 233, 774, 220, 563, 612, 450, 287, 777, 125, 424, 355, 183, 558, 673, 342, 587, 397, 234, 832, 660, 316, 345, 207, 565, 403, 778, 452, 126, 241, 616, 357, 674, 398, 589, 187, 785, 236, 432, 647, 346, 303, 566, 664, 595, 405, 242, 780, 569, 358, 456, 676, 215, 590, 786, 705, 361, 189, 624, 419, 348, 406, 651, 597, 896, 570, 244, 311, 409, 801, 706, 543, 362, 190, 788, 680, 219, 611, 464, 421, 335, 598, 653, 369, 572, 231, 410, 802, 601, 248, 659, 708, 315, 364, 775, 422, 221, 613, 792, 451, 654, 370, 425, 688, 602, 559, 412, 804, 343, 235, 833, 661, 480, 317, 222, 614, 712, 779, 453, 127, 426, 372, 617, 675, 604, 399, 834, 662, 318, 237, 433, 808, 347, 567, 665, 454, 243, 781, 618, 428, 359, 457, 720, 677, 376, 591, 787, 238, 836, 434, 625, 349, 666, 407, 782, 897, 571, 245, 620, 458, 816, 678, 707, 363, 191, 789, 626, 436, 681, 350, 465, 840, 668, 599, 898, 246, 736, 573, 411, 460, 803, 249, 790, 709, 365, 682, 628, 466, 423, 793, 440, 655, 371, 900, 574, 689, 603, 413, 250, 848, 805, 710, 366, 481, 684, 223, 615, 794, 468, 713, 632, 427, 373, 690, 414, 806, 605, 904, 252, 835, 663, 482, 319, 809, 714, 796, 455, 374, 619, 472, 429, 864, 692, 606, 721, 377, 239, 837, 435, 810, 484, 667, 716, 912, 783, 430, 621, 459, 817, 722, 679, 378, 838, 696, 627, 437, 812, 351, 841, 669, 488, 899, 247, 622, 818, 737, 461, 724, 380, 791, 438, 683, 629, 928, 467, 842, 670, 441, 901, 738, 575, 462, 820, 251, 849, 496, 711, 367, 630, 728, 685, 795, 469, 844, 442, 633, 902, 691, 740, 415, 850, 807, 905, 253, 824, 483, 686, 470, 715, 960, 797, 634, 444, 375, 473, 865, 693, 607, 906, 254, 852, 744, 811, 485, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 930, 729, 845, 443, 492, 903, 822, 741, 920, 851, 498, 825, 730, 687, 932, 471, 846, 961, 635, 445, 880, 742, 907, 255, 853, 826, 500, 745, 732, 962, 799, 446, 637, 936, 475, 867, 695, 854, 909, 746, 828, 487, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 639, 938, 884, 911, 830, 749, 945, 859, 506, 966, 755, 940, 479, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q39_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 384, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 195, 536, 277, 114, 169, 328, 156, 87, 548, 386, 577, 224, 61, 291, 278, 523, 197, 170, 768, 116, 281, 143, 578, 388, 62, 177, 91, 552, 336, 293, 198, 525, 172, 103, 282, 201, 120, 531, 580, 178, 294, 93, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 538, 212, 279, 171, 769, 117, 416, 330, 158, 550, 648, 579, 389, 226, 63, 308, 553, 337, 199, 540, 770, 118, 216, 173, 608, 283, 332, 121, 390, 581, 179, 554, 228, 338, 295, 393, 656, 312, 527, 174, 772, 203, 561, 448, 285, 122, 582, 353, 181, 95, 556, 394, 340, 585, 232, 643, 299, 562, 286, 205, 401, 776, 124, 535, 354, 182, 211, 672, 586, 396, 327, 185, 645, 344, 301, 206, 564, 402, 593, 240, 111, 307, 356, 539, 213, 588, 186, 784, 646, 302, 417, 331, 159, 594, 551, 404, 649, 227, 568, 309, 214, 704, 541, 360, 188, 771, 119, 418, 217, 609, 333, 650, 596, 391, 310, 555, 229, 408, 339, 800, 542, 657, 313, 218, 175, 773, 610, 420, 334, 449, 123, 652, 368, 583, 230, 600, 557, 395, 341, 658, 314, 233, 774, 220, 563, 612, 450, 287, 777, 125, 424, 355, 183, 558, 673, 342, 587, 397, 234, 832, 660, 316, 345, 207, 565, 403, 778, 452, 126, 241, 616, 357, 674, 398, 589, 187, 785, 236, 432, 647, 346, 303, 566, 664, 595, 405, 242, 780, 569, 358, 456, 215, 676, 590, 786, 705, 361, 189, 624, 419, 348, 406, 651, 597, 896, 570, 244, 311, 409, 801, 706, 543, 362, 190, 788, 219, 680, 611, 464, 421, 335, 598, 653, 369, 231, 572, 410, 802, 601, 248, 659, 315, 708, 364, 775, 422, 221, 613, 451, 792, 654, 370, 425, 688, 602, 559, 412, 343, 804, 235, 833, 661, 480, 317, 222, 614, 712, 779, 453, 127, 426, 372, 617, 675, 604, 399, 834, 662, 318, 237, 433, 347, 808, 567, 665, 454, 243, 781, 618, 428, 359, 457, 720, 677, 376, 591, 787, 238, 836, 434, 625, 349, 666, 407, 782, 897, 571, 245, 620, 458, 816, 678, 707, 363, 191, 789, 626, 436, 681, 350, 465, 840, 668, 599, 898, 246, 736, 573, 411, 460, 803, 249, 790, 709, 365, 682, 628, 466, 423, 793, 440, 655, 371, 900, 574, 689, 603, 413, 250, 848, 805, 710, 366, 481, 223, 684, 615, 794, 468, 713, 632, 427, 373, 690, 414, 806, 605, 904, 252, 835, 663, 482, 319, 809, 714, 455, 796, 374, 619, 472, 429, 864, 692, 606, 721, 377, 239, 837, 435, 810, 484, 667, 716, 912, 783, 430, 621, 459, 817, 722, 679, 378, 838, 696, 627, 437, 351, 812, 841, 669, 488, 899, 247, 622, 818, 737, 461, 724, 380, 791, 438, 683, 629, 467, 928, 842, 670, 441, 901, 738, 575, 462, 820, 251, 849, 496, 711, 367, 630, 728, 685, 795, 469, 844, 442, 633, 902, 691, 740, 415, 850, 807, 905, 253, 483, 824, 686, 470, 715, 960, 797, 634, 444, 375, 473, 865, 693, 607, 906, 254, 852, 744, 811, 485, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 930, 729, 845, 443, 492, 903, 822, 741, 920, 851, 498, 825, 730, 687, 471, 932, 846, 961, 635, 445, 880, 742, 907, 255, 853, 826, 500, 745, 732, 962, 799, 446, 637, 475, 936, 867, 695, 854, 909, 746, 487, 828, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 639, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q4_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 384, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 195, 536, 277, 114, 169, 328, 156, 87, 548, 386, 577, 224, 61, 291, 278, 523, 197, 170, 768, 116, 281, 143, 578, 388, 62, 177, 91, 552, 336, 293, 198, 525, 172, 103, 282, 201, 120, 531, 580, 178, 294, 93, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 538, 212, 279, 171, 769, 117, 416, 330, 158, 550, 648, 579, 389, 226, 63, 308, 553, 337, 199, 540, 770, 118, 216, 173, 608, 283, 332, 121, 390, 581, 179, 554, 228, 338, 295, 393, 656, 312, 527, 174, 772, 203, 561, 448, 285, 122, 582, 353, 181, 95, 556, 394, 340, 585, 232, 643, 299, 562, 286, 205, 401, 776, 124, 535, 354, 182, 211, 672, 586, 396, 327, 185, 645, 344, 301, 206, 564, 402, 593, 240, 111, 307, 356, 539, 213, 588, 186, 784, 646, 302, 417, 331, 159, 594, 551, 404, 649, 227, 568, 309, 214, 704, 541, 360, 188, 771, 119, 418, 217, 609, 333, 650, 596, 391, 310, 555, 229, 408, 339, 800, 542, 657, 313, 218, 175, 773, 610, 420, 334, 449, 123, 652, 368, 583, 230, 600, 557, 395, 341, 658, 314, 233, 774, 220, 563, 612, 450, 287, 777, 125, 424, 355, 183, 558, 673, 342, 587, 397, 234, 832, 660, 316, 345, 207, 565, 403, 778, 452, 126, 241, 616, 357, 674, 398, 589, 187, 236, 785, 432, 647, 346, 303, 566, 664, 595, 405, 242, 780, 569, 358, 456, 215, 676, 590, 786, 705, 361, 189, 624, 419, 348, 406, 651, 597, 896, 570, 244, 311, 409, 801, 706, 543, 362, 190, 788, 219, 680, 611, 464, 421, 335, 598, 653, 369, 231, 572, 410, 802, 601, 248, 659, 315, 708, 364, 775, 422, 221, 613, 451, 792, 654, 370, 425, 688, 602, 559, 412, 343, 804, 235, 833, 661, 480, 317, 222, 614, 712, 779, 453, 127, 426, 372, 617, 675, 604, 399, 834, 662, 318, 237, 433, 347, 808, 567, 665, 454, 243, 781, 618, 428, 359, 457, 720, 677, 376, 591, 238, 787, 836, 434, 625, 349, 666, 407, 782, 897, 571, 245, 620, 458, 816, 678, 707, 363, 191, 789, 626, 436, 681, 350, 465, 840, 668, 599, 898, 246, 736, 573, 411, 460, 803, 249, 790, 709, 365, 682, 628, 466, 423, 793, 440, 655, 371, 900, 574, 689, 603, 413, 250, 848, 805, 710, 366, 481, 223, 684, 615, 794, 468, 713, 632, 427, 373, 690, 414, 806, 605, 904, 252, 835, 663, 482, 319, 809, 714, 455, 796, 374, 619, 472, 429, 864, 692, 606, 721, 377, 239, 837, 435, 810, 484, 667, 716, 912, 783, 430, 621, 459, 817, 722, 679, 378, 838, 696, 627, 437, 351, 812, 841, 669, 488, 899, 247, 622, 818, 737, 461, 724, 380, 791, 438, 683, 629, 467, 928, 842, 670, 441, 901, 738, 575, 462, 820, 251, 849, 496, 711, 367, 630, 728, 685, 795, 469, 844, 442, 633, 902, 691, 740, 415, 850, 807, 905, 253, 483, 824, 686, 470, 715, 960, 797, 634, 444, 375, 473, 865, 693, 607, 906, 254, 852, 744, 811, 485, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 930, 729, 845, 443, 492, 903, 822, 741, 920, 851, 498, 825, 730, 687, 471, 932, 846, 961, 635, 445, 880, 742, 907, 255, 853, 826, 500, 745, 732, 962, 799, 446, 637, 475, 936, 867, 695, 854, 909, 746, 487, 828, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 639, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q41_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 192, 29, 259, 97, 138, 84, 43, 288, 30, 145, 520, 261, 98, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 384, 58, 518, 289, 194, 31, 276, 521, 168, 99, 86, 141, 576, 60, 290, 89, 147, 522, 196, 263, 101, 280, 142, 529, 176, 90, 47, 292, 321, 149, 524, 102, 200, 267, 530, 105, 163, 92, 322, 150, 640, 296, 55, 153, 545, 269, 106, 532, 208, 165, 79, 275, 324, 113, 154, 546, 270, 385, 59, 108, 304, 519, 166, 195, 536, 277, 114, 169, 328, 156, 87, 548, 386, 577, 224, 61, 291, 278, 523, 197, 170, 768, 116, 281, 143, 578, 388, 62, 177, 91, 552, 336, 293, 198, 525, 172, 103, 282, 201, 120, 531, 580, 178, 294, 93, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 538, 212, 279, 171, 769, 117, 416, 330, 158, 550, 648, 579, 389, 226, 63, 308, 553, 337, 199, 540, 770, 118, 216, 173, 608, 283, 332, 121, 390, 581, 179, 554, 228, 338, 295, 393, 656, 312, 527, 174, 772, 203, 561, 448, 285, 122, 582, 353, 181, 95, 556, 394, 340, 585, 232, 643, 299, 562, 286, 205, 401, 776, 124, 535, 354, 182, 211, 672, 586, 396, 327, 185, 645, 344, 301, 206, 564, 402, 593, 240, 111, 307, 356, 539, 213, 588, 186, 784, 646, 302, 417, 331, 159, 594, 551, 404, 649, 227, 568, 309, 214, 704, 541, 360, 188, 771, 119, 418, 217, 609, 333, 650, 596, 391, 310, 555, 229, 408, 339, 800, 542, 657, 313, 218, 175, 773, 610, 420, 334, 449, 123, 652, 368, 583, 230, 600, 557, 395, 341, 658, 314, 233, 774, 220, 563, 612, 450, 287, 777, 125, 424, 355, 183, 558, 342, 673, 587, 397, 234, 832, 660, 316, 345, 207, 565, 403, 778, 452, 126, 241, 616, 357, 674, 398, 589, 187, 236, 785, 432, 647, 346, 303, 566, 664, 595, 405, 242, 780, 569, 358, 456, 215, 676, 590, 786, 705, 361, 189, 624, 419, 348, 406, 651, 597, 896, 570, 244, 311, 409, 801, 706, 543, 362, 190, 788, 219, 680, 611, 464, 421, 335, 598, 653, 369, 231, 572, 410, 802, 601, 248, 659, 315, 708, 364, 775, 422, 221, 613, 451, 792, 654, 370, 425, 688, 602, 559, 412, 343, 804, 235, 833, 661, 480, 317, 222, 614, 712, 779, 453, 127, 426, 372, 617, 675, 604, 399, 834, 662, 318, 237, 433, 347, 808, 567, 665, 454, 243, 781, 618, 428, 359, 457, 720, 677, 376, 591, 238, 787, 836, 434, 625, 349, 666, 407, 782, 897, 571, 245, 620, 458, 816, 678, 707, 363, 191, 789, 626, 436, 350, 681, 465, 840, 668, 599, 898, 246, 736, 573, 411, 460, 803, 249, 790, 709, 365, 682, 628, 466, 423, 793, 440, 655, 371, 900, 574, 689, 603, 413, 250, 848, 805, 710, 366, 481, 223, 684, 615, 794, 468, 713, 632, 427, 373, 690, 414, 806, 605, 904, 252, 835, 663, 482, 319, 809, 714, 455, 796, 374, 619, 472, 429, 864, 692, 606, 721, 377, 239, 837, 435, 810, 484, 667, 716, 912, 783, 430, 621, 459, 817, 722, 679, 378, 838, 696, 627, 437, 351, 812, 841, 669, 488, 899, 247, 622, 818, 737, 461, 724, 380, 791, 438, 683, 629, 467, 928, 842, 670, 441, 901, 738, 575, 462, 820, 251, 849, 496, 711, 367, 630, 728, 685, 795, 469, 844, 442, 633, 902, 691, 740, 415, 850, 807, 905, 253, 483, 824, 686, 470, 715, 960, 797, 634, 444, 375, 473, 865, 693, 607, 906, 254, 852, 744, 811, 485, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 930, 729, 845, 443, 492, 903, 822, 741, 920, 851, 498, 825, 730, 687, 471, 932, 846, 961, 635, 445, 880, 742, 907, 255, 853, 826, 500, 745, 732, 962, 799, 446, 637, 475, 936, 867, 695, 854, 909, 746, 487, 828, 857, 504, 719, 915, 964, 638, 753, 477, 869, 910, 699, 748, 944, 858, 815, 491, 917, 754, 478, 870, 968, 727, 383, 873, 701, 931, 860, 918, 493, 756, 823, 921, 499, 874, 702, 731, 976, 933, 847, 494, 881, 743, 922, 760, 827, 501, 876, 934, 733, 963, 447, 882, 937, 924, 855, 502, 747, 992, 829, 734, 505, 965, 639, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 925, 762, 503, 878, 993, 735, 980, 939, 885, 926, 764, 994, 831, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q42_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 29, 192, 259, 97, 138, 84, 43, 288, 30, 145, 520, 98, 261, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 58, 384, 518, 289, 31, 194, 276, 521, 168, 99, 86, 141, 576, 60, 89, 290, 147, 196, 522, 263, 101, 280, 142, 529, 176, 90, 47, 292, 321, 149, 524, 102, 200, 267, 530, 105, 163, 92, 322, 150, 640, 296, 55, 153, 545, 106, 269, 532, 208, 165, 79, 275, 324, 113, 154, 546, 270, 59, 385, 108, 304, 519, 166, 195, 536, 114, 277, 169, 328, 156, 87, 548, 386, 577, 61, 224, 291, 278, 197, 523, 170, 116, 768, 281, 143, 578, 62, 388, 177, 91, 552, 336, 293, 198, 525, 172, 103, 282, 201, 120, 531, 178, 580, 93, 294, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 212, 538, 279, 171, 117, 769, 416, 330, 158, 550, 648, 579, 63, 226, 389, 308, 553, 337, 199, 540, 118, 770, 216, 173, 608, 283, 332, 121, 390, 179, 581, 228, 554, 338, 295, 393, 656, 312, 527, 174, 772, 203, 561, 122, 285, 448, 582, 353, 181, 95, 556, 394, 340, 585, 232, 643, 299, 562, 286, 205, 401, 124, 776, 535, 354, 182, 211, 672, 586, 396, 327, 185, 645, 344, 301, 206, 564, 402, 593, 240, 111, 307, 356, 213, 539, 186, 588, 784, 646, 302, 417, 331, 159, 594, 551, 404, 649, 227, 568, 309, 214, 541, 704, 360, 188, 119, 771, 217, 418, 609, 333, 650, 596, 391, 310, 229, 555, 408, 339, 800, 542, 657, 313, 218, 175, 610, 773, 420, 334, 123, 449, 652, 368, 583, 230, 600, 557, 395, 341, 658, 314, 233, 774, 220, 563, 612, 287, 450, 125, 777, 424, 355, 183, 558, 342, 673, 587, 234, 397, 832, 660, 316, 345, 207, 565, 403, 126, 452, 778, 241, 616, 357, 674, 398, 187, 589, 236, 785, 432, 647, 346, 303, 566, 664, 595, 242, 405, 780, 569, 358, 456, 215, 676, 590, 786, 705, 361, 189, 624, 419, 348, 406, 651, 597, 244, 570, 896, 311, 409, 801, 543, 706, 362, 190, 788, 219, 680, 611, 464, 421, 335, 598, 653, 369, 231, 572, 410, 601, 802, 248, 659, 315, 708, 364, 775, 221, 422, 613, 451, 792, 654, 370, 425, 688, 602, 559, 412, 343, 804, 235, 833, 661, 317, 480, 222, 614, 712, 127, 453, 779, 426, 372, 617, 675, 604, 399, 834, 662, 318, 237, 433, 347, 808, 567, 665, 454, 243, 618, 781, 428, 359, 457, 720, 677, 376, 591, 238, 787, 434, 836, 625, 349, 666, 407, 782, 245, 571, 897, 620, 458, 816, 678, 707, 363, 191, 626, 789, 436, 350, 681, 465, 840, 668, 599, 246, 898, 573, 736, 411, 460, 803, 249, 790, 709, 365, 682, 628, 466, 423, 793, 440, 655, 371, 574, 900, 689, 603, 250, 413, 848, 805, 710, 366, 481, 223, 684, 615, 468, 794, 713, 632, 427, 373, 690, 414, 605, 806, 252, 904, 835, 663, 319, 482, 809, 714, 455, 796, 374, 619, 472, 429, 864, 692, 606, 721, 377, 239, 435, 837, 484, 810, 667, 716, 912, 783, 430, 621, 459, 817, 722, 679, 378, 838, 696, 627, 437, 351, 812, 841, 669, 488, 247, 899, 622, 818, 737, 461, 724, 380, 791, 438, 683, 629, 467, 928, 842, 670, 441, 575, 738, 901, 462, 820, 251, 849, 496, 711, 367, 630, 728, 685, 469, 795, 442, 844, 633, 902, 691, 740, 415, 850, 807, 253, 905, 483, 824, 686, 470, 715, 634, 797, 960, 444, 375, 473, 865, 693, 607, 254, 906, 852, 744, 485, 811, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 729, 930, 443, 845, 492, 903, 822, 741, 920, 851, 498, 825, 730, 687, 471, 932, 846, 635, 961, 445, 880, 742, 255, 907, 853, 500, 826, 745, 732, 799, 962, 446, 637, 475, 936, 867, 695, 854, 746, 909, 487, 828, 857, 504, 719, 915, 638, 964, 753, 477, 869, 910, 699, 748, 944, 858, 815, 491, 754, 917, 478, 870, 968, 727, 383, 873, 701, 931, 860, 918, 493, 756, 823, 921, 499, 874, 702, 731, 976, 933, 847, 494, 881, 743, 922, 760, 501, 827, 876, 733, 934, 963, 447, 882, 937, 924, 855, 502, 747, 829, 992, 734, 505, 639, 965, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 762, 925, 503, 878, 993, 735, 980, 939, 885, 926, 764, 831, 994, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q43_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 29, 192, 259, 97, 138, 84, 43, 288, 30, 145, 520, 98, 261, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 58, 384, 518, 289, 31, 194, 276, 521, 168, 99, 86, 141, 576, 60, 89, 290, 147, 196, 522, 263, 101, 280, 142, 529, 176, 90, 47, 292, 321, 149, 524, 102, 200, 267, 530, 105, 163, 92, 322, 150, 640, 296, 55, 153, 545, 106, 269, 532, 208, 165, 79, 275, 324, 113, 154, 546, 270, 59, 385, 108, 304, 519, 166, 195, 536, 114, 277, 169, 328, 156, 87, 548, 386, 577, 61, 224, 291, 278, 197, 523, 170, 116, 768, 281, 143, 578, 62, 388, 177, 91, 552, 336, 293, 198, 525, 172, 103, 282, 201, 120, 531, 178, 580, 93, 294, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 212, 538, 279, 171, 117, 769, 416, 330, 158, 550, 648, 579, 63, 226, 389, 308, 553, 337, 199, 540, 118, 770, 216, 173, 283, 608, 332, 121, 390, 179, 581, 228, 554, 338, 295, 393, 656, 312, 527, 174, 772, 203, 561, 122, 285, 448, 582, 353, 181, 95, 556, 394, 340, 585, 232, 643, 299, 562, 286, 205, 401, 124, 776, 535, 354, 182, 211, 672, 586, 396, 327, 185, 645, 344, 301, 206, 564, 402, 593, 240, 111, 307, 356, 213, 539, 186, 588, 784, 646, 302, 417, 331, 159, 594, 551, 404, 649, 227, 568, 309, 214, 541, 704, 360, 188, 119, 771, 217, 418, 609, 333, 650, 596, 391, 310, 229, 555, 408, 339, 800, 542, 657, 313, 218, 175, 610, 773, 420, 334, 123, 449, 652, 368, 583, 230, 600, 557, 395, 341, 658, 314, 233, 774, 220, 563, 287, 612, 450, 125, 777, 424, 355, 183, 558, 342, 673, 587, 234, 397, 832, 660, 316, 345, 207, 565, 403, 126, 452, 778, 241, 616, 357, 674, 398, 187, 589, 236, 785, 432, 647, 346, 303, 566, 664, 595, 242, 405, 780, 569, 358, 456, 215, 676, 590, 786, 705, 361, 189, 624, 419, 348, 406, 651, 597, 244, 570, 896, 311, 409, 801, 543, 706, 362, 190, 788, 219, 680, 611, 464, 421, 335, 598, 653, 369, 231, 572, 410, 601, 802, 248, 659, 315, 708, 364, 775, 221, 422, 613, 451, 792, 654, 370, 425, 688, 602, 559, 412, 343, 804, 235, 833, 661, 317, 480, 222, 614, 712, 127, 453, 779, 426, 372, 617, 675, 604, 399, 834, 662, 318, 237, 433, 347, 808, 567, 665, 454, 243, 618, 781, 428, 359, 457, 720, 677, 376, 591, 238, 787, 434, 836, 625, 349, 666, 407, 782, 245, 571, 897, 620, 458, 816, 678, 707, 363, 191, 626, 789, 436, 350, 681, 465, 840, 668, 599, 246, 898, 573, 411, 736, 460, 803, 249, 790, 709, 365, 682, 628, 466, 423, 793, 440, 655, 371, 574, 900, 689, 603, 250, 413, 848, 805, 710, 366, 481, 223, 684, 615, 468, 794, 713, 632, 427, 373, 690, 414, 605, 806, 252, 904, 835, 663, 319, 482, 809, 714, 455, 796, 374, 619, 472, 429, 864, 692, 606, 721, 377, 239, 435, 837, 484, 810, 667, 716, 912, 783, 430, 621, 459, 817, 722, 679, 378, 838, 696, 627, 437, 351, 812, 841, 669, 488, 247, 899, 622, 818, 737, 461, 724, 380, 791, 438, 683, 629, 467, 928, 842, 670, 441, 575, 738, 901, 462, 820, 251, 849, 496, 711, 367, 630, 728, 685, 469, 795, 442, 844, 633, 902, 691, 415, 740, 850, 807, 253, 905, 483, 824, 686, 470, 715, 634, 797, 960, 444, 375, 473, 865, 693, 607, 254, 906, 852, 744, 485, 811, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 729, 930, 443, 845, 492, 903, 822, 741, 920, 851, 498, 825, 730, 687, 471, 932, 846, 635, 961, 445, 880, 742, 255, 907, 853, 500, 826, 745, 732, 799, 962, 446, 637, 475, 936, 867, 695, 854, 746, 909, 487, 828, 857, 504, 719, 915, 638, 964, 753, 477, 869, 910, 699, 748, 944, 858, 815, 491, 754, 917, 478, 870, 968, 727, 383, 873, 701, 931, 860, 918, 493, 756, 823, 921, 499, 874, 702, 731, 976, 933, 847, 494, 881, 743, 922, 760, 501, 827, 876, 733, 934, 963, 447, 882, 937, 924, 855, 502, 747, 829, 992, 734, 505, 639, 965, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 762, 925, 503, 878, 993, 735, 980, 939, 885, 926, 764, 831, 994, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q44_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 80, 37, 26, 257, 38, 136, 67, 41, 28, 258, 96, 69, 42, 144, 15, 260, 49, 70, 44, 73, 131, 50, 264, 23, 513, 160, 74, 133, 52, 81, 514, 27, 76, 272, 134, 82, 39, 137, 56, 516, 29, 192, 259, 97, 138, 84, 43, 288, 30, 145, 520, 98, 261, 140, 71, 88, 45, 146, 262, 51, 100, 265, 528, 46, 161, 75, 320, 148, 53, 266, 104, 515, 162, 77, 273, 135, 54, 152, 83, 544, 268, 57, 517, 164, 78, 274, 193, 112, 139, 85, 58, 384, 518, 289, 31, 194, 276, 521, 168, 99, 86, 141, 576, 60, 89, 290, 147, 196, 522, 263, 101, 280, 142, 529, 176, 90, 47, 292, 321, 149, 524, 102, 200, 267, 530, 105, 163, 92, 322, 150, 640, 296, 55, 153, 545, 106, 269, 532, 208, 165, 79, 275, 324, 113, 154, 546, 270, 59, 385, 108, 304, 519, 166, 195, 536, 114, 277, 169, 328, 156, 87, 548, 386, 577, 61, 224, 291, 278, 197, 523, 170, 116, 768, 281, 143, 578, 62, 388, 177, 91, 552, 336, 293, 198, 525, 172, 103, 282, 201, 120, 531, 178, 580, 93, 294, 392, 323, 151, 526, 641, 297, 202, 560, 284, 107, 533, 352, 180, 94, 209, 584, 325, 642, 298, 155, 204, 547, 400, 271, 534, 109, 305, 210, 167, 537, 326, 184, 115, 644, 300, 329, 157, 592, 549, 387, 110, 306, 225, 212, 538, 279, 171, 117, 769, 416, 330, 158, 550, 648, 579, 63, 226, 389, 308, 553, 337, 199, 540, 118, 770, 216, 173, 283, 608, 332, 121, 390, 179, 581, 228, 554, 338, 295, 393, 656, 312, 527, 174, 203, 772, 561, 122, 285, 448, 582, 353, 181, 95, 556, 394, 340, 585, 232, 643, 299, 562, 286, 205, 401, 124, 776, 535, 354, 182, 211, 672, 586, 396, 327, 185, 645, 344, 301, 206, 564, 402, 593, 240, 111, 307, 356, 213, 539, 186, 588, 784, 646, 302, 417, 331, 159, 594, 551, 404, 649, 227, 568, 309, 214, 541, 704, 360, 188, 119, 771, 217, 418, 609, 333, 650, 596, 391, 310, 229, 555, 408, 339, 800, 542, 657, 313, 218, 175, 610, 773, 420, 334, 123, 449, 652, 368, 583, 230, 600, 557, 395, 341, 658, 314, 233, 774, 220, 563, 287, 612, 450, 125, 777, 424, 355, 183, 558, 342, 673, 587, 234, 397, 832, 660, 316, 345, 207, 565, 403, 126, 452, 778, 241, 616, 357, 674, 398, 187, 589, 236, 785, 432, 647, 346, 303, 566, 664, 595, 242, 405, 780, 569, 358, 456, 215, 676, 590, 786, 705, 361, 189, 624, 419, 348, 406, 651, 597, 244, 570, 896, 311, 409, 801, 543, 706, 362, 190, 219, 788, 680, 611, 464, 421, 335, 598, 653, 369, 231, 572, 410, 601, 802, 248, 659, 315, 708, 364, 775, 221, 422, 613, 451, 792, 654, 370, 425, 688, 602, 559, 412, 343, 235, 804, 833, 661, 317, 480, 222, 614, 712, 127, 453, 779, 426, 372, 617, 675, 604, 399, 834, 662, 318, 237, 433, 347, 808, 567, 665, 454, 243, 618, 781, 428, 359, 457, 720, 677, 376, 591, 238, 787, 434, 836, 625, 349, 666, 407, 782, 245, 571, 897, 620, 458, 816, 678, 707, 363, 191, 626, 789, 436, 350, 681, 465, 840, 668, 599, 246, 898, 573, 411, 736, 460, 803, 249, 790, 709, 365, 682, 628, 466, 423, 793, 440, 655, 371, 574, 900, 689, 603, 250, 413, 848, 805, 710, 366, 481, 223, 684, 615, 468, 794, 713, 632, 427, 373, 690, 414, 605, 806, 252, 904, 835, 663, 319, 482, 809, 714, 455, 796, 374, 619, 472, 429, 864, 692, 606, 721, 377, 239, 435, 837, 484, 810, 667, 716, 912, 783, 430, 621, 459, 817, 722, 679, 378, 838, 696, 627, 437, 351, 812, 841, 669, 488, 247, 899, 622, 818, 737, 461, 724, 380, 791, 438, 683, 629, 467, 928, 842, 670, 441, 575, 738, 901, 462, 251, 820, 849, 496, 711, 367, 630, 728, 685, 469, 795, 442, 844, 633, 902, 691, 415, 740, 850, 807, 253, 905, 483, 824, 686, 470, 715, 634, 797, 960, 444, 375, 473, 865, 693, 607, 254, 906, 852, 744, 485, 811, 798, 717, 913, 636, 474, 431, 866, 694, 723, 379, 908, 839, 697, 486, 856, 813, 718, 914, 489, 752, 623, 476, 819, 868, 725, 381, 698, 439, 814, 929, 843, 671, 490, 916, 739, 463, 821, 726, 382, 497, 872, 700, 631, 729, 930, 443, 845, 492, 903, 822, 741, 920, 851, 498, 825, 730, 687, 471, 932, 846, 635, 961, 445, 880, 742, 255, 907, 853, 500, 826, 745, 732, 799, 962, 446, 637, 475, 936, 867, 695, 854, 746, 909, 487, 828, 857, 504, 719, 915, 638, 964, 753, 477, 869, 910, 699, 748, 944, 858, 815, 491, 754, 917, 478, 870, 968, 727, 383, 873, 701, 931, 860, 918, 493, 756, 823, 921, 499, 874, 702, 731, 976, 933, 847, 494, 881, 743, 922, 760, 501, 827, 876, 733, 934, 963, 447, 882, 937, 924, 855, 502, 747, 829, 992, 734, 505, 639, 965, 938, 884, 911, 830, 749, 945, 859, 506, 966, 755, 479, 940, 871, 969, 888, 750, 946, 861, 508, 919, 757, 970, 875, 703, 948, 862, 977, 495, 758, 923, 972, 761, 877, 978, 935, 952, 883, 762, 925, 503, 878, 993, 735, 980, 939, 885, 926, 764, 831, 994, 507, 967, 886, 984, 941, 889, 751, 947, 996, 509, 942, 971, 890, 949, 863, 510, 1000, 759, 973, 892, 950, 979, 953, 974, 763, 1008, 879, 981, 954, 927, 765, 995, 982, 956, 887, 985, 766, 997, 986, 943, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q45_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 264, 23, 513, 74, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 528, 46, 75, 161, 148, 320, 53, 266, 104, 515, 162, 77, 273, 135, 54, 152, 83, 544, 268, 57, 517, 78, 164, 274, 193, 112, 139, 85, 58, 384, 518, 31, 289, 194, 276, 521, 168, 99, 86, 141, 60, 576, 89, 290, 147, 196, 522, 263, 101, 280, 142, 529, 47, 90, 176, 292, 149, 321, 524, 102, 200, 267, 530, 105, 163, 92, 150, 322, 296, 640, 55, 153, 545, 106, 269, 532, 79, 165, 208, 275, 324, 113, 154, 546, 270, 59, 385, 108, 519, 304, 166, 195, 536, 114, 277, 169, 156, 328, 87, 548, 386, 61, 577, 224, 291, 278, 197, 523, 170, 116, 768, 281, 143, 62, 578, 388, 91, 177, 552, 293, 336, 198, 525, 172, 103, 282, 201, 120, 531, 178, 580, 93, 294, 392, 151, 323, 526, 297, 641, 202, 560, 284, 107, 533, 94, 180, 352, 209, 584, 325, 298, 642, 155, 204, 547, 271, 400, 534, 109, 305, 167, 210, 537, 326, 184, 115, 300, 644, 157, 329, 549, 592, 387, 110, 306, 225, 212, 538, 279, 171, 117, 769, 158, 330, 416, 550, 648, 63, 579, 226, 389, 308, 553, 337, 199, 540, 118, 770, 173, 216, 283, 608, 332, 121, 390, 179, 581, 228, 554, 295, 338, 393, 527, 312, 656, 174, 203, 772, 561, 122, 285, 448, 582, 95, 181, 353, 556, 394, 340, 585, 232, 299, 643, 562, 286, 205, 401, 124, 776, 535, 182, 354, 211, 586, 672, 396, 327, 185, 301, 344, 645, 206, 564, 402, 593, 111, 240, 307, 356, 213, 539, 186, 588, 784, 302, 646, 159, 331, 417, 551, 594, 404, 649, 227, 568, 309, 214, 541, 188, 360, 704, 119, 771, 217, 418, 609, 333, 650, 596, 391, 310, 229, 555, 408, 339, 542, 800, 313, 657, 175, 218, 610, 773, 334, 420, 123, 449, 652, 583, 368, 230, 557, 600, 395, 341, 314, 658, 233, 774, 220, 563, 287, 612, 450, 125, 777, 424, 183, 355, 558, 342, 587, 673, 234, 397, 316, 660, 832, 345, 207, 565, 403, 126, 452, 778, 241, 616, 357, 674, 398, 187, 589, 236, 785, 303, 346, 647, 432, 566, 664, 595, 242, 405, 780, 569, 358, 456, 215, 590, 676, 786, 189, 361, 705, 624, 419, 348, 406, 651, 597, 244, 570, 896, 311, 409, 543, 801, 190, 362, 706, 219, 788, 680, 611, 335, 421, 464, 598, 653, 369, 231, 572, 410, 601, 802, 248, 315, 659, 364, 708, 775, 221, 422, 613, 451, 792, 654, 370, 425, 559, 602, 688, 412, 343, 235, 804, 317, 661, 833, 222, 480, 614, 712, 127, 453, 779, 426, 372, 617, 675, 604, 399, 318, 662, 834, 237, 347, 433, 808, 567, 665, 454, 243, 618, 781, 428, 359, 457, 591, 376, 677, 720, 238, 787, 434, 836, 625, 349, 666, 407, 782, 245, 571, 897, 620, 458, 816, 678, 191, 363, 707, 626, 789, 350, 436, 681, 465, 668, 840, 599, 246, 898, 573, 411, 736, 460, 803, 249, 790, 365, 709, 682, 628, 423, 466, 793, 655, 440, 371, 574, 900, 603, 689, 250, 413, 805, 848, 366, 710, 223, 481, 684, 615, 468, 794, 713, 632, 427, 373, 690, 414, 605, 806, 252, 904, 319, 663, 835, 482, 809, 714, 455, 796, 374, 619, 429, 472, 606, 692, 864, 377, 721, 239, 435, 837, 484, 810, 667, 716, 783, 912, 430, 621, 459, 817, 378, 679, 722, 838, 696, 627, 351, 437, 812, 669, 841, 488, 247, 899, 622, 818, 737, 461, 380, 724, 791, 438, 683, 629, 467, 670, 842, 928, 441, 575, 738, 901, 462, 251, 820, 849, 367, 711, 496, 630, 685, 728, 469, 795, 442, 844, 633, 902, 691, 415, 740, 807, 850, 253, 905, 483, 824, 686, 470, 715, 634, 797, 444, 960, 375, 473, 607, 693, 865, 254, 906, 852, 744, 485, 811, 798, 717, 913, 636, 431, 474, 694, 866, 379, 723, 908, 839, 697, 486, 813, 856, 718, 914, 489, 623, 752, 476, 819, 868, 381, 725, 698, 439, 814, 671, 843, 929, 490, 916, 739, 463, 821, 382, 726, 497, 700, 872, 631, 729, 930, 443, 845, 492, 903, 822, 741, 920, 851, 498, 825, 687, 730, 471, 846, 932, 635, 445, 961, 880, 742, 255, 907, 853, 500, 826, 745, 732, 799, 446, 962, 637, 475, 936, 695, 867, 854, 746, 909, 487, 828, 857, 719, 504, 915, 638, 964, 753, 477, 869, 910, 699, 748, 815, 858, 944, 491, 754, 917, 478, 870, 968, 383, 727, 701, 873, 931, 860, 918, 493, 756, 823, 921, 499, 702, 874, 731, 847, 933, 976, 494, 881, 743, 922, 760, 501, 827, 876, 733, 934, 447, 963, 882, 937, 924, 855, 502, 747, 829, 734, 992, 505, 639, 965, 938, 884, 911, 830, 749, 859, 945, 506, 966, 755, 479, 940, 871, 969, 888, 750, 946, 861, 508, 919, 757, 970, 703, 875, 862, 948, 977, 495, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 949, 510, 1000, 759, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q46_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 264, 23, 513, 74, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 528, 46, 75, 161, 148, 320, 53, 266, 104, 515, 162, 77, 273, 135, 54, 152, 83, 544, 268, 57, 517, 78, 164, 274, 193, 112, 139, 85, 58, 384, 518, 31, 289, 194, 276, 521, 168, 99, 86, 141, 60, 576, 89, 290, 147, 196, 522, 263, 101, 280, 142, 529, 47, 90, 176, 292, 149, 321, 524, 102, 200, 267, 530, 105, 163, 92, 150, 322, 296, 55, 640, 153, 545, 106, 269, 532, 79, 165, 208, 275, 324, 113, 154, 546, 270, 59, 108, 385, 519, 304, 166, 195, 536, 114, 277, 169, 156, 328, 87, 548, 386, 61, 577, 224, 291, 278, 197, 523, 170, 116, 768, 281, 143, 62, 578, 388, 91, 177, 552, 293, 336, 198, 525, 172, 103, 282, 201, 120, 531, 178, 580, 93, 294, 392, 151, 323, 526, 297, 641, 202, 560, 284, 107, 533, 94, 180, 352, 209, 584, 325, 298, 642, 155, 204, 547, 271, 400, 534, 109, 305, 167, 210, 537, 326, 184, 115, 300, 644, 157, 329, 549, 592, 110, 387, 306, 225, 212, 538, 279, 171, 117, 769, 158, 330, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 656, 174, 203, 772, 561, 122, 285, 448, 582, 95, 181, 353, 556, 394, 340, 585, 232, 299, 643, 562, 286, 205, 124, 401, 776, 535, 182, 354, 211, 586, 672, 396, 327, 185, 301, 344, 645, 206, 564, 402, 593, 111, 240, 307, 356, 213, 539, 186, 588, 784, 302, 646, 159, 331, 417, 551, 594, 404, 649, 227, 568, 309, 214, 541, 188, 360, 119, 704, 217, 771, 418, 609, 333, 650, 596, 391, 310, 229, 555, 408, 339, 542, 800, 313, 657, 175, 218, 610, 773, 334, 420, 123, 449, 652, 583, 368, 230, 557, 600, 395, 341, 314, 658, 233, 220, 774, 563, 287, 612, 450, 125, 777, 424, 183, 355, 558, 342, 587, 673, 234, 397, 316, 660, 832, 345, 207, 565, 126, 403, 452, 778, 241, 616, 357, 674, 398, 187, 589, 236, 785, 303, 346, 647, 432, 566, 664, 595, 242, 405, 780, 569, 358, 456, 215, 590, 676, 189, 786, 361, 705, 624, 419, 348, 406, 651, 597, 244, 570, 311, 896, 409, 543, 801, 190, 362, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 661, 833, 222, 480, 614, 127, 712, 453, 779, 426, 372, 617, 675, 604, 399, 318, 662, 237, 834, 347, 433, 808, 567, 665, 454, 243, 618, 781, 428, 359, 457, 591, 376, 677, 720, 238, 787, 434, 836, 625, 349, 666, 407, 782, 245, 571, 620, 897, 458, 816, 678, 191, 363, 707, 626, 789, 350, 436, 681, 465, 668, 840, 599, 246, 898, 573, 411, 736, 460, 249, 803, 790, 365, 709, 682, 628, 423, 466, 793, 655, 440, 371, 574, 900, 603, 689, 250, 413, 805, 848, 366, 710, 223, 481, 684, 615, 468, 794, 713, 632, 427, 373, 690, 414, 605, 252, 806, 319, 904, 663, 835, 482, 809, 714, 455, 796, 374, 619, 429, 472, 606, 692, 864, 377, 721, 239, 435, 837, 484, 810, 667, 716, 783, 912, 430, 621, 459, 817, 378, 679, 722, 838, 696, 627, 351, 437, 812, 669, 841, 488, 247, 622, 899, 818, 737, 461, 380, 724, 791, 438, 683, 629, 467, 670, 842, 928, 441, 575, 738, 901, 462, 251, 820, 849, 367, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 693, 865, 254, 906, 852, 744, 485, 811, 798, 717, 636, 913, 431, 474, 694, 866, 379, 723, 908, 839, 697, 486, 813, 856, 718, 914, 489, 623, 752, 476, 819, 868, 381, 725, 698, 439, 814, 671, 843, 929, 490, 916, 739, 463, 821, 382, 726, 497, 700, 872, 631, 729, 930, 443, 845, 492, 903, 822, 741, 920, 851, 498, 825, 687, 730, 471, 846, 932, 635, 445, 961, 880, 742, 255, 907, 853, 500, 826, 745, 732, 799, 446, 962, 637, 475, 936, 695, 867, 854, 746, 909, 487, 828, 857, 719, 504, 638, 915, 964, 753, 477, 869, 910, 699, 748, 815, 858, 944, 491, 754, 917, 478, 870, 383, 968, 727, 701, 873, 931, 860, 918, 493, 756, 823, 921, 499, 702, 874, 731, 847, 933, 976, 494, 881, 743, 922, 760, 501, 827, 876, 733, 934, 447, 963, 882, 937, 924, 855, 502, 747, 829, 734, 992, 505, 639, 965, 938, 884, 911, 830, 749, 859, 945, 506, 966, 755, 479, 940, 871, 969, 888, 750, 946, 861, 508, 919, 757, 970, 703, 875, 862, 948, 977, 495, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 949, 510, 1000, 759, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q47_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 264, 23, 513, 74, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 528, 46, 75, 161, 148, 320, 53, 266, 104, 515, 162, 77, 273, 135, 54, 152, 83, 544, 268, 57, 517, 78, 164, 274, 193, 112, 139, 85, 58, 384, 518, 31, 289, 194, 276, 521, 168, 99, 86, 141, 60, 576, 89, 290, 147, 196, 522, 263, 101, 280, 142, 529, 47, 90, 176, 292, 149, 321, 524, 102, 200, 267, 105, 530, 163, 92, 150, 322, 296, 55, 640, 153, 545, 106, 269, 532, 79, 165, 208, 275, 324, 113, 154, 546, 270, 59, 108, 385, 519, 304, 166, 195, 536, 114, 277, 169, 156, 328, 87, 548, 386, 61, 577, 224, 291, 278, 197, 523, 170, 116, 768, 281, 143, 62, 578, 388, 91, 177, 552, 293, 336, 198, 525, 172, 103, 282, 201, 120, 531, 178, 580, 93, 294, 392, 151, 323, 526, 297, 641, 202, 560, 284, 107, 533, 94, 180, 352, 209, 584, 325, 298, 642, 155, 204, 547, 271, 400, 109, 534, 305, 167, 210, 537, 326, 184, 115, 300, 644, 157, 329, 549, 592, 110, 387, 306, 225, 212, 538, 279, 171, 117, 158, 769, 330, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 656, 174, 203, 772, 561, 122, 285, 448, 582, 95, 181, 353, 556, 394, 340, 585, 232, 299, 643, 562, 286, 205, 124, 401, 776, 535, 182, 354, 211, 586, 672, 396, 327, 185, 301, 344, 645, 206, 564, 402, 593, 111, 240, 307, 356, 213, 539, 186, 588, 784, 302, 646, 159, 331, 417, 551, 594, 404, 649, 227, 568, 309, 214, 541, 188, 360, 119, 704, 217, 771, 418, 609, 333, 650, 596, 391, 310, 229, 555, 408, 339, 542, 800, 313, 657, 175, 218, 610, 773, 334, 420, 123, 449, 652, 583, 368, 230, 557, 600, 395, 341, 314, 233, 658, 220, 774, 563, 287, 612, 450, 125, 777, 424, 183, 355, 558, 342, 587, 673, 234, 397, 316, 660, 832, 345, 207, 565, 126, 403, 452, 778, 241, 616, 357, 674, 398, 187, 589, 236, 785, 303, 346, 647, 432, 566, 664, 595, 242, 405, 780, 569, 358, 456, 215, 590, 676, 189, 361, 786, 705, 624, 419, 348, 406, 651, 597, 244, 570, 311, 896, 409, 543, 190, 801, 362, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 661, 222, 833, 480, 614, 127, 712, 453, 779, 426, 372, 617, 675, 604, 399, 318, 237, 662, 834, 347, 433, 808, 567, 665, 454, 243, 618, 781, 428, 359, 457, 591, 376, 677, 720, 238, 787, 434, 836, 625, 349, 666, 407, 782, 245, 571, 620, 897, 458, 816, 678, 191, 363, 707, 626, 789, 350, 436, 681, 465, 668, 840, 599, 246, 898, 573, 411, 736, 460, 249, 803, 365, 790, 709, 682, 628, 423, 466, 793, 655, 440, 371, 574, 900, 603, 689, 250, 413, 805, 848, 366, 710, 223, 481, 684, 615, 468, 794, 713, 632, 427, 373, 690, 414, 605, 252, 806, 319, 904, 663, 835, 482, 809, 714, 455, 796, 374, 619, 429, 472, 606, 692, 864, 377, 721, 239, 435, 837, 484, 810, 667, 716, 783, 912, 430, 621, 459, 817, 378, 679, 722, 838, 696, 627, 351, 437, 812, 669, 841, 488, 247, 622, 899, 818, 737, 461, 380, 724, 791, 438, 683, 629, 467, 670, 842, 928, 441, 575, 738, 901, 462, 251, 820, 849, 367, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 693, 254, 865, 906, 852, 744, 485, 811, 798, 717, 636, 913, 431, 474, 694, 866, 379, 723, 908, 839, 697, 486, 813, 856, 718, 489, 914, 623, 752, 476, 819, 868, 381, 725, 698, 439, 814, 671, 843, 929, 490, 916, 739, 463, 821, 382, 726, 497, 700, 872, 631, 729, 930, 443, 845, 492, 903, 822, 741, 920, 851, 498, 825, 687, 730, 471, 846, 932, 635, 445, 961, 880, 742, 255, 907, 853, 500, 826, 745, 732, 799, 446, 962, 637, 475, 936, 695, 867, 854, 746, 909, 487, 828, 857, 719, 504, 638, 915, 964, 753, 477, 869, 910, 699, 748, 815, 858, 944, 491, 754, 917, 478, 870, 383, 968, 727, 701, 873, 931, 860, 493, 918, 756, 823, 921, 499, 702, 874, 731, 847, 933, 976, 494, 881, 743, 922, 760, 501, 827, 876, 733, 934, 447, 963, 882, 937, 924, 855, 502, 747, 829, 734, 992, 505, 639, 965, 938, 884, 911, 830, 749, 859, 945, 506, 966, 755, 479, 940, 871, 969, 888, 750, 946, 861, 508, 919, 757, 970, 703, 875, 862, 948, 977, 495, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 949, 510, 1000, 759, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q48_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 23, 264, 513, 74, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 46, 528, 75, 161, 148, 320, 53, 266, 104, 515, 162, 77, 273, 135, 54, 152, 83, 544, 268, 57, 517, 78, 164, 274, 193, 112, 139, 85, 58, 384, 518, 31, 289, 194, 276, 521, 168, 99, 86, 141, 60, 576, 89, 290, 147, 196, 522, 263, 101, 280, 142, 47, 529, 90, 176, 292, 149, 321, 524, 102, 200, 267, 105, 530, 163, 92, 150, 322, 55, 296, 640, 153, 545, 106, 269, 532, 79, 165, 208, 275, 324, 113, 154, 546, 270, 59, 108, 385, 519, 304, 166, 195, 536, 114, 277, 169, 156, 87, 328, 548, 386, 61, 577, 224, 291, 278, 197, 523, 170, 116, 768, 281, 143, 62, 578, 388, 91, 177, 552, 293, 336, 198, 525, 172, 103, 282, 201, 120, 531, 178, 580, 93, 294, 151, 392, 323, 526, 297, 641, 202, 560, 284, 107, 533, 94, 180, 352, 209, 584, 325, 298, 642, 155, 204, 547, 271, 400, 109, 534, 305, 167, 210, 537, 326, 184, 115, 300, 644, 157, 329, 549, 110, 592, 387, 306, 225, 212, 538, 279, 171, 117, 158, 769, 330, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 174, 656, 203, 772, 561, 122, 285, 448, 582, 95, 181, 353, 556, 394, 340, 585, 232, 299, 643, 562, 286, 205, 124, 401, 535, 776, 182, 354, 211, 586, 672, 396, 327, 185, 301, 344, 645, 206, 564, 402, 111, 593, 240, 307, 356, 213, 539, 186, 588, 302, 784, 646, 159, 331, 417, 551, 594, 404, 649, 227, 568, 309, 214, 541, 188, 119, 360, 704, 217, 771, 418, 609, 333, 650, 596, 391, 310, 229, 555, 408, 339, 542, 800, 313, 175, 657, 218, 610, 773, 334, 420, 123, 449, 652, 583, 368, 230, 557, 600, 395, 341, 314, 233, 658, 220, 774, 563, 287, 612, 450, 125, 777, 183, 424, 355, 558, 342, 587, 673, 234, 397, 316, 660, 832, 345, 207, 565, 126, 403, 452, 778, 241, 616, 357, 674, 398, 187, 589, 236, 303, 785, 346, 647, 432, 566, 664, 595, 242, 405, 780, 569, 358, 215, 456, 590, 676, 189, 361, 786, 705, 624, 419, 348, 406, 651, 597, 244, 570, 311, 896, 409, 543, 190, 801, 362, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 661, 222, 833, 480, 614, 127, 712, 453, 779, 426, 372, 617, 675, 604, 399, 318, 237, 662, 834, 347, 433, 567, 808, 665, 454, 243, 618, 781, 428, 359, 457, 591, 376, 677, 238, 720, 787, 434, 836, 625, 349, 666, 407, 782, 245, 571, 620, 897, 458, 816, 678, 191, 363, 707, 626, 789, 350, 436, 681, 465, 668, 599, 840, 246, 898, 573, 411, 736, 460, 249, 803, 365, 790, 709, 682, 628, 423, 466, 793, 655, 440, 371, 574, 900, 603, 689, 250, 413, 805, 366, 848, 710, 223, 481, 684, 615, 468, 794, 713, 632, 427, 373, 690, 414, 605, 252, 806, 319, 663, 904, 835, 482, 809, 714, 455, 796, 374, 619, 429, 472, 606, 692, 864, 377, 239, 721, 435, 837, 484, 810, 667, 716, 783, 430, 912, 621, 459, 817, 378, 679, 722, 838, 696, 627, 351, 437, 812, 669, 841, 247, 488, 622, 899, 818, 737, 461, 380, 724, 791, 438, 683, 629, 467, 670, 842, 928, 441, 575, 738, 901, 462, 251, 820, 367, 849, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 693, 254, 865, 906, 852, 744, 485, 811, 798, 717, 636, 431, 913, 474, 694, 866, 379, 723, 908, 839, 697, 486, 813, 856, 718, 489, 914, 623, 752, 476, 819, 868, 381, 725, 698, 439, 814, 671, 843, 929, 490, 916, 739, 463, 821, 382, 726, 497, 700, 631, 872, 729, 930, 443, 845, 492, 903, 822, 741, 920, 851, 498, 825, 687, 730, 471, 846, 932, 635, 445, 961, 880, 742, 255, 907, 853, 500, 826, 745, 732, 799, 446, 962, 637, 475, 695, 936, 867, 854, 746, 909, 487, 828, 857, 719, 504, 638, 915, 964, 753, 477, 869, 910, 699, 748, 815, 858, 944, 491, 754, 917, 478, 870, 383, 727, 968, 701, 873, 931, 860, 493, 918, 756, 823, 921, 499, 702, 874, 731, 847, 933, 494, 976, 881, 743, 922, 760, 501, 827, 876, 733, 934, 447, 963, 882, 937, 924, 855, 502, 747, 829, 734, 992, 505, 639, 965, 938, 884, 911, 830, 749, 859, 945, 506, 966, 755, 479, 940, 871, 969, 888, 750, 946, 861, 508, 919, 757, 970, 703, 875, 862, 948, 495, 977, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 949, 510, 759, 1000, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q49_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 23, 264, 74, 513, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 46, 528, 75, 161, 148, 320, 53, 266, 104, 515, 162, 77, 273, 135, 54, 152, 83, 544, 268, 57, 78, 517, 164, 274, 193, 112, 139, 85, 58, 384, 518, 31, 289, 194, 276, 521, 168, 99, 86, 141, 60, 576, 89, 290, 147, 196, 522, 263, 101, 280, 142, 47, 90, 529, 176, 292, 149, 321, 524, 102, 200, 267, 105, 530, 163, 92, 150, 322, 55, 296, 640, 153, 106, 545, 269, 532, 79, 165, 208, 275, 324, 113, 154, 546, 270, 59, 108, 385, 519, 304, 166, 195, 536, 114, 277, 169, 156, 87, 328, 548, 386, 61, 577, 224, 291, 278, 197, 523, 170, 116, 768, 281, 143, 62, 578, 388, 91, 177, 552, 293, 336, 198, 525, 172, 103, 282, 201, 120, 531, 178, 580, 93, 294, 151, 392, 323, 526, 297, 202, 641, 560, 284, 107, 94, 533, 180, 352, 209, 584, 325, 298, 642, 155, 204, 547, 271, 400, 109, 534, 305, 167, 210, 537, 326, 184, 115, 300, 644, 157, 329, 110, 549, 387, 592, 306, 225, 212, 538, 279, 171, 117, 158, 330, 769, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 174, 656, 203, 772, 122, 561, 285, 448, 582, 95, 181, 353, 556, 394, 340, 585, 232, 299, 643, 562, 286, 205, 124, 401, 535, 776, 182, 354, 211, 586, 672, 396, 327, 185, 301, 344, 206, 645, 564, 402, 111, 593, 240, 307, 356, 213, 539, 186, 588, 302, 784, 646, 159, 331, 417, 551, 594, 404, 649, 227, 568, 309, 214, 541, 188, 119, 360, 704, 217, 771, 418, 609, 333, 650, 391, 596, 310, 229, 555, 408, 339, 542, 800, 313, 175, 218, 657, 610, 334, 773, 420, 123, 449, 652, 583, 368, 230, 557, 395, 600, 341, 314, 233, 658, 220, 774, 563, 287, 612, 450, 125, 777, 183, 424, 355, 558, 342, 587, 234, 673, 397, 316, 660, 832, 345, 207, 126, 565, 403, 452, 778, 241, 616, 357, 674, 398, 187, 589, 236, 303, 346, 785, 647, 432, 566, 664, 595, 242, 405, 780, 569, 358, 215, 456, 590, 676, 189, 361, 786, 705, 419, 624, 348, 406, 651, 597, 244, 570, 311, 896, 409, 543, 190, 362, 801, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 222, 661, 833, 480, 614, 127, 712, 453, 779, 426, 372, 617, 675, 399, 604, 318, 237, 662, 834, 347, 433, 567, 808, 665, 454, 243, 618, 781, 428, 359, 457, 591, 376, 238, 677, 720, 787, 434, 836, 625, 349, 666, 407, 782, 245, 571, 620, 458, 897, 816, 678, 191, 363, 707, 626, 350, 789, 436, 681, 465, 668, 599, 840, 246, 898, 573, 411, 736, 460, 249, 803, 365, 790, 709, 682, 423, 628, 466, 793, 655, 440, 371, 574, 900, 603, 250, 689, 413, 366, 805, 848, 710, 223, 481, 684, 615, 468, 794, 713, 427, 632, 373, 690, 414, 605, 252, 806, 319, 663, 904, 835, 482, 809, 714, 455, 796, 374, 619, 429, 472, 606, 692, 864, 377, 239, 721, 435, 837, 484, 810, 667, 716, 783, 430, 912, 621, 459, 378, 817, 679, 722, 838, 696, 627, 351, 437, 812, 669, 841, 247, 488, 622, 899, 818, 737, 461, 380, 724, 791, 438, 683, 629, 467, 670, 842, 928, 441, 575, 738, 462, 901, 251, 820, 367, 849, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 254, 693, 865, 906, 852, 744, 485, 811, 798, 717, 431, 636, 474, 913, 694, 866, 379, 723, 908, 839, 697, 486, 813, 856, 718, 489, 914, 623, 752, 476, 819, 868, 381, 725, 698, 439, 814, 671, 843, 490, 929, 916, 739, 463, 382, 821, 726, 497, 700, 631, 872, 729, 930, 443, 845, 492, 903, 822, 741, 920, 851, 498, 825, 687, 730, 471, 846, 932, 635, 445, 961, 880, 742, 255, 907, 853, 500, 826, 745, 732, 799, 446, 962, 637, 475, 695, 936, 867, 854, 746, 909, 487, 828, 857, 719, 504, 638, 915, 964, 753, 477, 869, 910, 699, 748, 815, 858, 944, 491, 754, 478, 917, 870, 383, 727, 968, 701, 873, 931, 860, 493, 918, 756, 823, 921, 499, 702, 874, 731, 847, 494, 933, 976, 881, 743, 922, 760, 501, 827, 876, 733, 934, 447, 963, 882, 937, 924, 855, 502, 747, 829, 734, 992, 505, 639, 965, 938, 884, 911, 830, 749, 859, 506, 945, 966, 755, 479, 940, 871, 969, 888, 750, 946, 861, 508, 919, 757, 970, 703, 875, 862, 948, 495, 977, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 510, 949, 759, 1000, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q50_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 23, 264, 74, 513, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 46, 528, 75, 161, 148, 320, 53, 266, 104, 515, 162, 77, 273, 135, 54, 152, 83, 544, 268, 57, 78, 517, 164, 274, 193, 112, 139, 85, 58, 384, 518, 31, 289, 194, 276, 521, 168, 99, 86, 141, 60, 576, 89, 290, 147, 196, 522, 263, 101, 280, 142, 47, 90, 529, 176, 292, 149, 321, 524, 102, 200, 267, 105, 530, 163, 92, 150, 322, 55, 296, 640, 153, 106, 545, 269, 532, 79, 165, 208, 275, 324, 113, 154, 546, 270, 59, 108, 385, 519, 304, 166, 195, 536, 114, 277, 169, 156, 87, 328, 548, 386, 61, 577, 224, 291, 278, 197, 523, 170, 116, 768, 281, 143, 62, 578, 91, 388, 177, 552, 293, 336, 198, 525, 172, 103, 282, 201, 120, 531, 178, 580, 93, 294, 151, 392, 323, 526, 297, 202, 641, 560, 284, 107, 94, 533, 180, 352, 209, 584, 325, 298, 642, 155, 204, 547, 271, 400, 109, 534, 305, 167, 210, 537, 326, 184, 115, 300, 644, 157, 329, 110, 549, 387, 592, 306, 225, 212, 538, 279, 171, 117, 158, 330, 769, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 174, 656, 203, 772, 122, 561, 285, 448, 582, 95, 181, 353, 556, 394, 340, 585, 232, 299, 643, 562, 286, 205, 124, 401, 535, 182, 776, 354, 211, 586, 672, 396, 327, 185, 301, 344, 206, 645, 564, 402, 111, 593, 240, 307, 356, 213, 539, 186, 588, 302, 784, 646, 159, 331, 417, 551, 594, 404, 649, 227, 568, 309, 214, 541, 188, 119, 360, 704, 217, 771, 418, 609, 333, 650, 391, 596, 310, 229, 555, 408, 339, 542, 800, 313, 175, 218, 657, 610, 334, 773, 123, 420, 449, 652, 583, 368, 230, 557, 395, 600, 341, 314, 233, 658, 220, 774, 563, 287, 612, 450, 125, 183, 777, 424, 355, 558, 342, 587, 234, 673, 397, 316, 660, 832, 345, 207, 126, 565, 403, 452, 778, 241, 616, 357, 674, 398, 187, 589, 236, 303, 346, 785, 647, 432, 566, 664, 595, 242, 405, 780, 569, 358, 215, 456, 590, 676, 189, 361, 786, 705, 419, 624, 348, 406, 651, 597, 244, 570, 311, 896, 409, 543, 190, 362, 801, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 222, 661, 833, 480, 614, 127, 712, 453, 779, 426, 372, 617, 675, 399, 604, 318, 237, 662, 834, 347, 433, 567, 808, 665, 454, 243, 618, 781, 428, 359, 457, 591, 376, 238, 677, 720, 787, 434, 836, 625, 349, 666, 407, 782, 245, 571, 620, 458, 897, 816, 678, 191, 363, 707, 626, 350, 789, 436, 681, 465, 668, 599, 246, 840, 898, 573, 411, 736, 460, 249, 803, 365, 790, 709, 682, 423, 628, 466, 793, 655, 440, 371, 574, 603, 900, 250, 689, 413, 366, 805, 848, 710, 223, 481, 684, 615, 468, 794, 713, 427, 632, 373, 690, 414, 605, 252, 806, 319, 663, 904, 835, 482, 809, 714, 455, 796, 374, 619, 429, 472, 606, 692, 864, 377, 239, 721, 435, 837, 484, 810, 667, 716, 783, 430, 912, 621, 459, 378, 817, 679, 722, 838, 696, 627, 351, 437, 812, 669, 247, 841, 488, 622, 899, 818, 737, 461, 380, 724, 791, 438, 683, 629, 467, 670, 842, 928, 441, 575, 738, 462, 901, 251, 820, 367, 849, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 254, 693, 865, 906, 852, 744, 485, 811, 798, 717, 431, 636, 474, 913, 694, 866, 379, 723, 908, 839, 697, 486, 813, 856, 718, 489, 914, 623, 752, 476, 819, 868, 381, 725, 698, 439, 814, 671, 843, 490, 929, 916, 739, 463, 382, 821, 726, 497, 700, 631, 872, 729, 930, 443, 845, 492, 903, 822, 741, 920, 851, 498, 825, 687, 730, 471, 846, 635, 932, 445, 961, 880, 742, 255, 907, 853, 500, 826, 745, 732, 799, 446, 962, 637, 475, 695, 936, 867, 854, 746, 909, 487, 828, 857, 719, 504, 638, 915, 964, 753, 477, 869, 910, 699, 748, 815, 858, 944, 491, 754, 478, 917, 870, 383, 727, 968, 701, 873, 931, 860, 493, 918, 756, 823, 921, 499, 702, 874, 731, 847, 494, 933, 976, 881, 743, 922, 760, 501, 827, 876, 733, 934, 447, 963, 882, 937, 924, 855, 502, 747, 829, 734, 992, 505, 639, 965, 938, 884, 911, 830, 749, 859, 506, 945, 966, 755, 479, 940, 871, 969, 888, 750, 946, 861, 508, 919, 757, 970, 703, 875, 862, 948, 495, 977, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 510, 949, 759, 1000, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q51_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 23, 264, 74, 513, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 46, 528, 75, 161, 148, 320, 53, 266, 104, 515, 162, 77, 273, 135, 54, 152, 83, 544, 268, 57, 78, 517, 164, 274, 193, 112, 139, 85, 58, 384, 518, 31, 289, 194, 276, 521, 168, 99, 86, 141, 60, 576, 89, 290, 147, 196, 522, 263, 101, 280, 142, 47, 90, 529, 176, 292, 149, 321, 524, 102, 200, 267, 105, 530, 163, 92, 150, 322, 55, 296, 640, 153, 106, 545, 269, 532, 79, 165, 208, 275, 324, 113, 154, 546, 270, 59, 108, 385, 519, 304, 166, 195, 536, 114, 277, 169, 156, 87, 328, 548, 386, 61, 577, 224, 291, 278, 197, 523, 170, 116, 768, 281, 143, 62, 578, 91, 388, 177, 552, 293, 336, 198, 525, 172, 103, 282, 201, 120, 531, 178, 580, 93, 294, 151, 392, 323, 526, 297, 202, 641, 560, 284, 107, 94, 533, 180, 352, 209, 584, 325, 298, 642, 155, 204, 547, 271, 400, 109, 534, 305, 167, 210, 537, 326, 184, 115, 300, 644, 157, 329, 110, 549, 387, 592, 306, 225, 212, 538, 279, 171, 117, 158, 330, 769, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 174, 656, 203, 772, 122, 561, 285, 448, 582, 95, 181, 353, 556, 394, 340, 585, 232, 299, 643, 562, 286, 205, 124, 401, 535, 182, 776, 354, 211, 586, 672, 396, 327, 185, 301, 344, 206, 645, 564, 402, 111, 593, 240, 307, 356, 213, 539, 186, 588, 302, 784, 646, 159, 331, 417, 551, 594, 404, 649, 227, 568, 309, 214, 541, 188, 119, 360, 704, 217, 771, 418, 609, 333, 650, 391, 596, 310, 229, 555, 408, 339, 542, 800, 313, 175, 218, 657, 610, 334, 773, 123, 420, 449, 652, 583, 368, 230, 557, 395, 600, 341, 314, 233, 658, 220, 774, 563, 287, 612, 450, 125, 183, 777, 424, 355, 558, 342, 587, 234, 673, 397, 316, 660, 832, 345, 207, 126, 565, 403, 452, 241, 778, 616, 357, 674, 398, 187, 589, 236, 303, 346, 785, 647, 432, 566, 664, 595, 242, 405, 780, 569, 358, 215, 456, 590, 676, 189, 361, 786, 705, 419, 624, 348, 406, 651, 597, 244, 570, 311, 896, 409, 543, 190, 362, 801, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 222, 661, 833, 480, 614, 127, 712, 453, 779, 426, 372, 617, 675, 399, 604, 318, 237, 662, 834, 347, 433, 567, 808, 665, 454, 243, 618, 781, 428, 359, 457, 591, 376, 238, 677, 720, 787, 434, 836, 625, 349, 666, 407, 245, 782, 571, 620, 458, 897, 816, 678, 191, 363, 707, 626, 350, 789, 436, 681, 465, 668, 599, 246, 840, 898, 573, 411, 736, 460, 249, 803, 365, 790, 709, 682, 423, 628, 466, 793, 655, 440, 371, 574, 603, 900, 250, 689, 413, 366, 805, 848, 710, 223, 481, 684, 615, 468, 794, 713, 427, 632, 373, 690, 414, 605, 252, 806, 319, 663, 904, 835, 482, 809, 714, 455, 796, 374, 619, 429, 472, 606, 692, 864, 377, 239, 721, 435, 837, 484, 810, 667, 716, 783, 430, 912, 621, 459, 378, 817, 679, 722, 838, 696, 627, 351, 437, 812, 669, 247, 841, 488, 622, 899, 818, 737, 461, 380, 724, 791, 438, 683, 629, 467, 670, 842, 928, 441, 575, 738, 462, 901, 251, 820, 367, 849, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 254, 693, 865, 906, 852, 744, 485, 811, 798, 717, 431, 636, 474, 913, 694, 866, 379, 723, 908, 839, 697, 486, 813, 856, 718, 489, 914, 623, 752, 476, 819, 868, 381, 725, 698, 439, 814, 671, 843, 490, 929, 916, 739, 463, 382, 821, 726, 497, 700, 631, 872, 729, 930, 443, 845, 492, 903, 822, 741, 920, 851, 498, 825, 687, 730, 471, 846, 635, 932, 445, 961, 880, 742, 255, 907, 853, 500, 826, 745, 732, 799, 446, 962, 637, 475, 695, 936, 867, 854, 746, 909, 487, 828, 857, 719, 504, 638, 915, 964, 753, 477, 869, 910, 699, 748, 815, 858, 944, 491, 754, 478, 917, 870, 383, 727, 968, 701, 873, 931, 860, 493, 918, 756, 823, 921, 499, 702, 874, 731, 847, 494, 933, 976, 881, 743, 922, 760, 501, 827, 876, 733, 934, 447, 963, 882, 937, 924, 855, 502, 747, 829, 734, 992, 505, 639, 965, 938, 884, 911, 830, 749, 859, 506, 945, 966, 755, 479, 940, 871, 969, 888, 750, 946, 861, 508, 919, 757, 970, 703, 875, 862, 948, 495, 977, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 510, 949, 759, 1000, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q52_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 136, 67, 41, 28, 258, 96, 69, 42, 15, 144, 260, 49, 70, 44, 73, 131, 50, 23, 264, 74, 513, 160, 133, 52, 81, 514, 27, 76, 272, 134, 39, 82, 137, 56, 516, 29, 192, 259, 97, 138, 84, 43, 30, 288, 145, 520, 98, 261, 140, 71, 45, 88, 146, 262, 51, 100, 265, 46, 528, 75, 161, 148, 320, 53, 266, 104, 515, 162, 77, 273, 135, 54, 152, 83, 544, 268, 57, 78, 517, 164, 274, 193, 112, 139, 85, 58, 384, 518, 31, 289, 194, 276, 521, 168, 99, 86, 141, 60, 576, 89, 290, 147, 196, 522, 263, 101, 280, 142, 47, 90, 529, 176, 292, 149, 321, 524, 102, 200, 267, 105, 530, 163, 92, 150, 322, 55, 296, 640, 153, 106, 545, 269, 532, 79, 165, 208, 275, 324, 113, 154, 546, 270, 59, 108, 385, 519, 304, 166, 195, 536, 114, 277, 169, 156, 87, 328, 548, 61, 386, 577, 224, 291, 278, 197, 523, 170, 116, 768, 281, 143, 62, 578, 91, 388, 177, 552, 293, 336, 198, 525, 172, 103, 282, 201, 120, 531, 178, 580, 93, 294, 151, 392, 323, 526, 297, 202, 641, 560, 284, 107, 94, 533, 180, 352, 209, 584, 325, 298, 642, 155, 204, 547, 271, 400, 109, 534, 305, 167, 210, 537, 326, 184, 115, 300, 644, 157, 329, 110, 549, 387, 592, 306, 225, 212, 538, 279, 171, 117, 158, 330, 769, 416, 550, 63, 648, 579, 226, 389, 308, 553, 337, 199, 540, 118, 173, 216, 770, 283, 608, 332, 121, 390, 179, 581, 228, 554, 295, 338, 393, 527, 312, 174, 656, 203, 122, 772, 561, 285, 448, 582, 95, 181, 353, 556, 394, 340, 585, 232, 299, 643, 562, 286, 205, 124, 401, 535, 182, 776, 354, 211, 586, 672, 396, 327, 185, 301, 344, 206, 645, 564, 402, 111, 593, 240, 307, 356, 213, 539, 186, 588, 302, 784, 646, 159, 331, 417, 551, 594, 404, 649, 227, 568, 309, 214, 541, 188, 119, 360, 704, 217, 771, 418, 609, 333, 650, 391, 596, 310, 229, 555, 408, 339, 542, 800, 313, 175, 218, 657, 610, 334, 123, 773, 420, 449, 652, 583, 368, 230, 557, 395, 600, 341, 314, 233, 658, 220, 774, 563, 287, 612, 125, 450, 183, 777, 424, 355, 558, 342, 587, 234, 673, 397, 316, 660, 832, 345, 207, 126, 565, 403, 452, 241, 778, 616, 357, 674, 398, 187, 589, 236, 303, 346, 785, 647, 432, 566, 664, 595, 242, 405, 780, 569, 358, 215, 456, 590, 676, 189, 361, 786, 705, 419, 624, 348, 406, 651, 597, 244, 570, 311, 896, 409, 543, 190, 362, 801, 706, 219, 788, 680, 611, 335, 421, 464, 598, 653, 369, 231, 572, 410, 601, 248, 802, 315, 659, 364, 708, 221, 775, 422, 613, 451, 792, 654, 370, 425, 559, 602, 688, 412, 343, 235, 804, 317, 222, 661, 833, 480, 614, 127, 712, 453, 779, 426, 372, 617, 675, 399, 604, 318, 237, 662, 834, 347, 433, 567, 808, 665, 454, 243, 618, 781, 428, 359, 457, 591, 376, 238, 677, 720, 787, 434, 836, 625, 349, 666, 407, 245, 782, 571, 620, 458, 897, 816, 678, 191, 363, 707, 626, 350, 789, 436, 681, 465, 668, 599, 246, 840, 573, 898, 411, 736, 460, 249, 803, 365, 790, 709, 682, 423, 628, 466, 793, 655, 440, 371, 574, 603, 250, 900, 689, 413, 366, 805, 848, 710, 223, 481, 684, 615, 468, 794, 713, 427, 632, 373, 690, 414, 605, 252, 806, 319, 663, 904, 835, 482, 809, 714, 455, 796, 374, 619, 429, 472, 606, 692, 864, 377, 239, 721, 435, 837, 484, 810, 667, 716, 783, 430, 912, 621, 459, 378, 817, 679, 722, 838, 696, 627, 351, 437, 812, 669, 247, 841, 488, 622, 899, 818, 737, 461, 380, 724, 791, 438, 683, 629, 467, 670, 842, 928, 441, 575, 738, 462, 251, 901, 820, 367, 849, 711, 496, 630, 685, 728, 469, 795, 442, 844, 633, 902, 691, 415, 740, 253, 807, 850, 905, 483, 824, 686, 470, 715, 634, 797, 444, 375, 960, 473, 607, 254, 693, 865, 906, 852, 744, 485, 811, 798, 717, 431, 636, 474, 913, 694, 866, 379, 723, 908, 839, 697, 486, 813, 856, 718, 489, 914, 623, 752, 476, 819, 868, 381, 725, 698, 439, 814, 671, 843, 490, 929, 916, 739, 463, 382, 821, 726, 497, 700, 631, 872, 729, 930, 443, 845, 492, 903, 822, 741, 920, 851, 498, 825, 687, 730, 471, 846, 635, 932, 445, 961, 880, 742, 255, 907, 853, 500, 826, 745, 732, 799, 446, 637, 962, 475, 695, 936, 867, 854, 746, 909, 487, 828, 857, 719, 504, 638, 915, 964, 753, 477, 869, 910, 699, 748, 815, 858, 944, 491, 754, 478, 917, 870, 383, 727, 968, 701, 873, 931, 860, 493, 918, 756, 823, 921, 499, 702, 874, 731, 847, 494, 933, 976, 881, 743, 922, 760, 501, 827, 876, 733, 934, 447, 963, 882, 937, 924, 855, 502, 747, 829, 734, 992, 505, 639, 965, 938, 884, 911, 830, 749, 859, 506, 945, 966, 755, 479, 940, 871, 969, 888, 750, 946, 861, 508, 919, 757, 970, 703, 875, 862, 948, 495, 977, 758, 923, 972, 761, 877, 935, 978, 952, 883, 762, 925, 503, 878, 735, 993, 980, 939, 885, 926, 764, 831, 994, 507, 967, 886, 941, 984, 889, 751, 947, 996, 509, 942, 971, 890, 863, 510, 949, 759, 1000, 973, 892, 950, 979, 953, 974, 763, 879, 1008, 981, 954, 927, 765, 995, 982, 956, 887, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q53_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 512, 25, 132, 37, 80, 26, 257, 38, 67, 136, 41, 28, 258, 96, 69, 42, 15, 144, 260, 49, 70, 44, 73, 131, 50, 23, 264, 74, 513, 160, 133, 52, 81, 514, 27, 76, 134, 272, 39, 82, 137, 56, 516, 29, 192, 259, 97, 138, 84, 43, 30, 288, 145, 520, 98, 261, 71, 140, 45, 88, 146, 262, 51, 100, 265, 46, 528, 75, 161, 148, 320, 53, 266, 104, 515, 162, 77, 135, 273, 54, 83, 152, 268, 544, 57, 78, 517, 164, 274, 193, 112, 139, 85, 58, 384, 518, 31, 289, 194, 276, 521, 99, 168, 86, 141, 60, 576, 89, 290, 147, 196, 522, 263, 101, 142, 280, 47, 90, 529, 176, 292, 149, 321, 524, 102, 200, 267, 105, 530, 163, 92, 150, 322, 55, 296, 640, 153, 106, 269, 545, 532, 79, 165, 208, 275, 324, 113, 154, 270, 546, 59, 108, 385, 519, 166, 304, 195, 536, 114, 277, 169, 87, 156, 328, 548, 61, 386, 577, 224, 291, 278, 197, 523, 170, 116, 768, 143, 281, 62, 578, 91, 388, 177, 552, 293, 198, 336, 525, 103, 172, 282, 201, 120, 531, 178, 580, 93, 294, 151, 323, 392, 526, 297, 202, 641, 284, 560, 107, 94, 533, 180, 352, 209, 584, 325, 298, 642, 155, 204, 271, 547, 400, 109, 534, 167, 305, 210, 537, 326, 115, 184, 300, 644, 157, 329, 110, 549, 387, 592, 306, 225, 212, 538, 279, 171, 117, 158, 330, 769, 416, 550, 63, 579, 648, 226, 389, 308, 553, 199, 337, 540, 118, 173, 216, 770, 283, 332, 608, 121, 390, 179, 581, 228, 554, 295, 338, 393, 527, 174, 312, 656, 203, 122, 772, 285, 561, 448, 582, 95, 181, 353, 556, 394, 340, 585, 232, 299, 643, 286, 562, 205, 124, 401, 535, 182, 776, 354, 211, 586, 327, 396, 672, 185, 301, 206, 344, 645, 564, 402, 111, 593, 240, 307, 356, 213, 539, 186, 588, 302, 646, 784, 159, 331, 417, 551, 594, 404, 649, 227, 568, 309, 214, 541, 119, 188, 360, 704, 217, 771, 418, 333, 609, 650, 391, 596, 310, 229, 555, 339, 408, 542, 800, 175, 313, 218, 657, 334, 610, 123, 773, 420, 449, 583, 652, 230, 368, 557, 395, 600, 341, 314, 233, 658, 220, 774, 287, 563, 612, 125, 450, 183, 777, 355, 424, 558, 342, 587, 234, 397, 673, 316, 660, 832, 207, 345, 126, 565, 403, 452, 241, 778, 616, 357, 398, 674, 187, 589, 236, 303, 346, 647, 785, 432, 566, 595, 664, 242, 405, 780, 569, 358, 215, 456, 590, 676, 189, 361, 786, 705, 419, 348, 624, 406, 651, 597, 244, 570, 311, 896, 409, 543, 190, 362, 801, 706, 219, 788, 335, 611, 680, 421, 464, 598, 653, 231, 369, 572, 410, 601, 248, 802, 315, 659, 364, 708, 221, 775, 422, 613, 451, 654, 792, 370, 425, 559, 602, 343, 412, 688, 235, 804, 317, 222, 661, 833, 480, 614, 127, 712, 453, 779, 426, 372, 617, 399, 675, 604, 318, 237, 662, 834, 347, 433, 567, 808, 665, 454, 243, 618, 781, 359, 428, 457, 591, 238, 376, 677, 720, 787, 434, 836, 349, 625, 666, 407, 245, 782, 571, 620, 458, 897, 678, 816, 191, 363, 707, 350, 626, 789, 436, 681, 465, 599, 668, 246, 840, 573, 898, 411, 460, 736, 249, 803, 365, 790, 709, 682, 423, 628, 466, 655, 793, 371, 440, 574, 603, 250, 900, 413, 689, 366, 805, 710, 848, 223, 481, 615, 684, 468, 794, 713, 427, 632, 373, 414, 690, 605, 252, 806, 319, 663, 835, 904, 482, 809, 714, 455, 796, 374, 619, 429, 472, 606, 692, 864, 239, 377, 721, 435, 837, 484, 810, 667, 716, 783, 430, 912, 621, 459, 378, 679, 817, 722, 838, 351, 627, 696, 437, 812, 669, 247, 841, 488, 622, 899, 818, 461, 737, 380, 724, 791, 438, 683, 629, 467, 670, 842, 928, 441, 575, 462, 738, 251, 901, 820, 367, 711, 849, 496, 630, 685, 728, 469, 795, 442, 844, 633, 902, 415, 691, 740, 253, 807, 850, 905, 483, 686, 824, 470, 715, 634, 797, 375, 444, 960, 473, 607, 254, 693, 865, 906, 852, 744, 485, 811, 798, 717, 431, 636, 474, 913, 694, 866, 379, 723, 839, 908, 697, 486, 813, 718, 856, 489, 914, 623, 476, 752, 819, 868, 381, 725, 698, 439, 814, 671, 843, 490, 929, 916, 463, 739, 382, 821, 726, 497, 631, 700, 872, 729, 930, 443, 845, 492, 903, 822, 741, 851, 920, 498, 687, 825, 730, 471, 846, 635, 932, 445, 961, 742, 880, 255, 907, 853, 500, 826, 745, 732, 799, 446, 637, 962, 475, 695, 867, 936, 854, 746, 909, 487, 828, 719, 857, 504, 638, 915, 964, 477, 753, 869, 910, 699, 748, 815, 858, 944, 491, 478, 754, 917, 870, 383, 727, 968, 701, 873, 931, 860, 493, 918, 756, 823, 921, 499, 702, 874, 731, 847, 494, 933, 976, 743, 881, 922, 760, 501, 827, 876, 733, 934, 447, 963, 882, 937, 855, 924, 502, 747, 829, 734, 992, 505, 639, 965, 938, 884, 911, 830, 749, 859, 506, 945, 966, 479, 755, 871, 940, 969, 750, 888, 946, 861, 508, 919, 757, 970, 703, 875, 862, 948, 495, 977, 758, 923, 972, 761, 877, 935, 978, 883, 952, 762, 925, 503, 878, 735, 993, 980, 939, 885, 926, 764, 831, 994, 507, 967, 886, 941, 984, 751, 889, 947, 996, 509, 942, 971, 890, 863, 510, 949, 759, 1000, 973, 892, 950, 979, 953, 974, 763, 879, 1008, 981, 954, 927, 765, 995, 982, 887, 956, 985, 766, 997, 943, 986, 891, 998, 511, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q54_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 260, 49, 70, 44, 73, 131, 50, 23, 264, 74, 513, 160, 133, 52, 81, 27, 514, 76, 134, 272, 39, 82, 137, 56, 29, 516, 192, 259, 97, 138, 84, 43, 30, 288, 145, 520, 98, 261, 71, 140, 45, 88, 146, 262, 51, 100, 265, 46, 528, 75, 161, 148, 320, 53, 266, 104, 515, 162, 77, 135, 273, 54, 83, 152, 268, 57, 544, 78, 517, 164, 274, 193, 112, 139, 85, 58, 384, 31, 518, 289, 194, 276, 521, 99, 168, 86, 141, 60, 89, 576, 290, 147, 196, 522, 263, 101, 142, 280, 47, 90, 529, 176, 292, 149, 321, 524, 102, 200, 267, 105, 530, 163, 92, 150, 322, 55, 296, 153, 640, 106, 269, 545, 532, 79, 165, 208, 275, 324, 113, 154, 270, 59, 546, 108, 385, 519, 166, 304, 195, 536, 114, 277, 169, 87, 156, 328, 61, 548, 386, 577, 224, 291, 278, 197, 523, 170, 116, 143, 281, 768, 62, 91, 578, 388, 177, 552, 293, 198, 336, 525, 103, 172, 282, 201, 120, 531, 178, 93, 580, 294, 151, 323, 392, 526, 297, 202, 641, 284, 560, 107, 94, 533, 180, 352, 209, 584, 325, 298, 155, 642, 204, 271, 547, 400, 109, 534, 167, 305, 210, 537, 326, 115, 184, 300, 157, 644, 329, 110, 549, 387, 592, 306, 225, 212, 538, 279, 171, 117, 158, 330, 769, 416, 63, 550, 579, 648, 226, 389, 308, 553, 199, 337, 540, 118, 173, 216, 283, 770, 332, 121, 608, 390, 179, 581, 228, 554, 295, 338, 393, 527, 174, 312, 656, 203, 122, 285, 772, 561, 448, 95, 582, 181, 353, 556, 394, 340, 585, 232, 299, 643, 286, 562, 205, 124, 401, 535, 182, 776, 354, 211, 586, 327, 396, 185, 672, 301, 206, 344, 645, 564, 402, 111, 593, 240, 307, 356, 213, 539, 186, 588, 302, 159, 646, 784, 331, 417, 551, 594, 404, 649, 227, 568, 309, 214, 541, 119, 188, 360, 217, 704, 771, 418, 333, 609, 650, 391, 596, 310, 229, 555, 339, 408, 542, 175, 313, 800, 218, 657, 334, 123, 610, 773, 420, 449, 583, 652, 230, 368, 557, 395, 600, 341, 314, 233, 658, 220, 287, 774, 563, 125, 612, 450, 183, 777, 355, 424, 558, 342, 587, 234, 397, 673, 316, 660, 207, 345, 832, 126, 565, 403, 452, 241, 778, 616, 357, 398, 187, 674, 589, 236, 303, 346, 647, 785, 432, 566, 595, 664, 242, 405, 780, 569, 358, 215, 456, 590, 189, 676, 361, 786, 705, 419, 348, 624, 406, 651, 597, 244, 570, 311, 409, 896, 543, 190, 362, 801, 219, 706, 788, 335, 611, 680, 421, 464, 598, 653, 231, 369, 572, 410, 601, 248, 315, 802, 659, 364, 221, 708, 775, 422, 613, 451, 654, 792, 370, 425, 559, 602, 343, 412, 688, 235, 317, 804, 222, 661, 833, 480, 127, 614, 712, 453, 779, 426, 372, 617, 399, 675, 604, 318, 237, 662, 347, 834, 433, 567, 808, 665, 454, 243, 618, 781, 359, 428, 457, 591, 238, 376, 677, 720, 787, 434, 349, 836, 625, 666, 407, 245, 782, 571, 620, 458, 897, 191, 678, 816, 363, 707, 350, 626, 789, 436, 681, 465, 599, 668, 246, 840, 573, 411, 898, 460, 249, 736, 803, 365, 790, 709, 682, 423, 628, 466, 655, 793, 371, 440, 574, 603, 250, 413, 900, 689, 366, 805, 223, 710, 848, 481, 615, 684, 468, 794, 713, 427, 632, 373, 414, 690, 605, 252, 319, 806, 663, 835, 904, 482, 809, 714, 455, 796, 374, 619, 429, 472, 606, 692, 239, 377, 864, 721, 435, 837, 484, 810, 667, 716, 783, 430, 912, 621, 459, 378, 679, 817, 722, 351, 838, 627, 696, 437, 812, 669, 247, 841, 488, 622, 899, 818, 461, 737, 380, 724, 791, 438, 683, 629, 467, 670, 842, 441, 928, 575, 462, 251, 738, 901, 820, 367, 711, 849, 496, 630, 685, 728, 469, 795, 442, 844, 633, 415, 902, 691, 253, 740, 807, 850, 905, 483, 686, 824, 470, 715, 634, 797, 375, 444, 473, 960, 607, 254, 693, 865, 906, 852, 744, 485, 811, 798, 717, 431, 636, 474, 913, 694, 379, 866, 723, 839, 908, 697, 486, 813, 718, 856, 489, 914, 623, 476, 752, 819, 381, 868, 725, 698, 439, 814, 671, 843, 490, 929, 916, 463, 739, 382, 821, 726, 497, 631, 700, 872, 729, 443, 930, 845, 492, 903, 822, 741, 851, 920, 498, 687, 825, 730, 471, 846, 635, 445, 932, 961, 255, 742, 880, 907, 853, 500, 826, 745, 732, 799, 446, 637, 475, 962, 695, 867, 936, 854, 746, 909, 487, 828, 719, 857, 504, 638, 915, 477, 964, 753, 869, 910, 699, 748, 815, 858, 944, 491, 478, 754, 917, 383, 870, 727, 968, 701, 873, 931, 860, 493, 918, 756, 823, 921, 499, 702, 874, 731, 847, 494, 933, 976, 743, 881, 922, 760, 501, 827, 876, 733, 447, 934, 963, 882, 937, 855, 924, 502, 747, 829, 734, 505, 992, 639, 965, 938, 884, 911, 830, 749, 859, 506, 945, 479, 966, 755, 871, 940, 969, 750, 888, 946, 861, 508, 919, 757, 970, 703, 875, 862, 948, 495, 977, 758, 923, 972, 761, 877, 935, 978, 883, 952, 762, 925, 503, 878, 735, 993, 980, 939, 885, 926, 764, 831, 507, 994, 967, 886, 941, 984, 751, 889, 947, 509, 996, 942, 971, 890, 863, 510, 949, 759, 1000, 973, 892, 950, 979, 953, 974, 763, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q55_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 513, 160, 133, 52, 81, 27, 514, 76, 134, 272, 39, 82, 137, 56, 29, 516, 192, 259, 97, 138, 84, 43, 30, 288, 145, 98, 520, 261, 71, 140, 45, 88, 146, 51, 262, 100, 265, 46, 528, 75, 161, 148, 320, 53, 266, 104, 515, 162, 77, 135, 273, 54, 83, 152, 57, 268, 544, 78, 517, 164, 274, 193, 112, 139, 85, 58, 384, 31, 518, 289, 194, 276, 99, 521, 168, 86, 141, 60, 89, 576, 290, 147, 196, 522, 263, 101, 142, 280, 47, 90, 529, 176, 292, 149, 321, 102, 524, 200, 267, 105, 530, 163, 92, 150, 322, 55, 296, 153, 640, 106, 269, 545, 532, 79, 165, 208, 275, 113, 324, 154, 59, 270, 546, 108, 385, 519, 166, 304, 195, 114, 536, 277, 169, 87, 156, 328, 61, 548, 386, 577, 224, 291, 278, 197, 523, 170, 116, 143, 281, 768, 62, 91, 578, 177, 388, 552, 293, 198, 336, 103, 525, 172, 282, 201, 120, 531, 178, 93, 580, 294, 151, 323, 392, 526, 297, 202, 641, 284, 560, 107, 94, 533, 180, 352, 209, 584, 325, 298, 155, 642, 204, 271, 547, 400, 109, 534, 167, 305, 210, 115, 326, 537, 184, 300, 157, 644, 329, 110, 549, 387, 592, 306, 225, 212, 538, 279, 171, 117, 158, 330, 769, 416, 63, 550, 579, 226, 648, 389, 308, 553, 199, 337, 118, 540, 173, 216, 283, 770, 121, 332, 608, 179, 390, 581, 228, 554, 295, 338, 393, 527, 174, 312, 656, 203, 122, 285, 561, 772, 448, 95, 582, 181, 353, 556, 394, 340, 585, 232, 299, 643, 286, 205, 562, 124, 401, 535, 182, 354, 776, 211, 586, 327, 185, 396, 672, 301, 206, 344, 645, 564, 402, 111, 593, 240, 307, 356, 213, 539, 186, 588, 302, 159, 646, 784, 331, 417, 551, 594, 404, 227, 649, 568, 309, 214, 119, 541, 188, 360, 217, 704, 771, 418, 333, 609, 650, 391, 596, 310, 229, 555, 339, 408, 542, 175, 313, 800, 218, 657, 123, 334, 610, 773, 420, 449, 583, 230, 652, 368, 557, 395, 600, 341, 314, 233, 658, 220, 287, 563, 774, 125, 612, 450, 183, 355, 777, 424, 558, 342, 587, 234, 397, 673, 316, 660, 207, 345, 832, 126, 565, 403, 241, 452, 778, 616, 357, 187, 398, 674, 589, 236, 303, 346, 647, 785, 432, 566, 595, 242, 664, 405, 358, 569, 780, 215, 456, 590, 189, 676, 361, 786, 705, 419, 348, 624, 406, 651, 597, 244, 570, 311, 409, 896, 543, 190, 362, 801, 219, 706, 788, 335, 611, 680, 421, 464, 598, 231, 653, 369, 572, 410, 601, 248, 315, 802, 659, 364, 221, 708, 775, 422, 613, 451, 654, 370, 792, 425, 559, 602, 343, 412, 688, 235, 317, 804, 222, 661, 833, 480, 127, 614, 712, 453, 779, 426, 372, 617, 399, 675, 604, 318, 237, 662, 347, 834, 433, 567, 808, 243, 454, 665, 618, 359, 781, 428, 457, 591, 238, 376, 677, 720, 787, 434, 349, 625, 836, 666, 407, 245, 571, 782, 620, 458, 897, 191, 678, 816, 363, 707, 350, 626, 789, 436, 681, 465, 599, 246, 668, 840, 573, 411, 898, 249, 460, 736, 803, 365, 790, 709, 682, 423, 628, 466, 655, 371, 793, 440, 574, 603, 250, 413, 689, 900, 366, 805, 223, 710, 848, 481, 615, 684, 468, 794, 713, 427, 632, 373, 414, 690, 605, 252, 319, 806, 663, 835, 482, 904, 809, 714, 455, 374, 796, 619, 429, 472, 606, 692, 239, 377, 864, 721, 435, 837, 484, 810, 667, 716, 783, 430, 912, 621, 459, 378, 679, 817, 722, 351, 627, 838, 696, 437, 812, 247, 669, 841, 488, 622, 899, 461, 818, 737, 380, 724, 791, 438, 683, 629, 467, 670, 842, 441, 928, 575, 251, 462, 738, 901, 820, 367, 711, 849, 496, 630, 685, 728, 469, 795, 442, 633, 844, 415, 691, 902, 253, 740, 807, 850, 483, 905, 686, 824, 470, 715, 634, 375, 797, 444, 473, 960, 607, 254, 693, 865, 906, 852, 744, 485, 811, 798, 717, 431, 636, 474, 913, 694, 379, 866, 723, 839, 486, 697, 908, 813, 718, 856, 489, 914, 623, 476, 752, 819, 381, 868, 725, 698, 439, 814, 671, 843, 490, 929, 916, 463, 739, 382, 821, 726, 497, 631, 700, 872, 729, 443, 930, 845, 492, 903, 822, 741, 851, 498, 920, 687, 825, 730, 471, 635, 846, 445, 932, 961, 255, 742, 880, 907, 853, 500, 826, 745, 732, 799, 446, 637, 475, 962, 695, 867, 936, 854, 746, 487, 909, 828, 719, 857, 504, 638, 915, 477, 753, 964, 869, 699, 910, 748, 815, 858, 944, 491, 478, 754, 917, 383, 870, 727, 968, 701, 873, 931, 860, 493, 918, 756, 823, 499, 921, 702, 874, 731, 847, 494, 933, 976, 743, 881, 922, 760, 501, 827, 876, 733, 447, 934, 963, 882, 937, 855, 502, 924, 747, 829, 734, 505, 992, 639, 965, 938, 884, 911, 830, 749, 859, 506, 945, 479, 755, 966, 871, 940, 969, 750, 888, 946, 861, 508, 919, 757, 970, 703, 875, 862, 948, 495, 977, 758, 923, 761, 972, 877, 935, 978, 883, 952, 762, 503, 925, 878, 735, 993, 980, 939, 885, 926, 764, 831, 507, 994, 967, 886, 941, 984, 751, 889, 947, 509, 996, 942, 971, 890, 863, 510, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q56_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 513, 160, 133, 52, 81, 27, 514, 76, 134, 272, 39, 82, 137, 56, 29, 516, 192, 259, 97, 138, 84, 43, 30, 288, 145, 98, 520, 261, 71, 140, 45, 88, 146, 51, 262, 100, 265, 46, 528, 75, 161, 148, 320, 53, 266, 104, 515, 162, 77, 135, 273, 54, 83, 152, 57, 268, 544, 78, 517, 164, 274, 193, 112, 139, 85, 58, 384, 31, 518, 289, 194, 276, 99, 521, 168, 86, 141, 60, 89, 576, 290, 147, 196, 522, 263, 101, 142, 280, 47, 90, 529, 176, 292, 149, 321, 102, 524, 200, 267, 105, 530, 163, 92, 150, 322, 55, 296, 153, 640, 106, 269, 545, 532, 79, 165, 208, 275, 113, 324, 154, 59, 270, 546, 108, 385, 519, 166, 304, 195, 114, 536, 277, 169, 87, 156, 328, 61, 548, 386, 577, 224, 291, 278, 197, 523, 170, 116, 143, 281, 768, 62, 91, 578, 177, 388, 552, 293, 198, 336, 103, 525, 172, 282, 201, 120, 531, 178, 93, 580, 294, 151, 323, 392, 526, 297, 202, 641, 284, 560, 107, 94, 533, 180, 352, 209, 584, 325, 298, 155, 642, 204, 271, 547, 109, 400, 534, 167, 305, 210, 115, 326, 537, 184, 300, 157, 644, 329, 110, 549, 387, 592, 306, 225, 212, 538, 279, 171, 117, 158, 330, 769, 416, 63, 550, 579, 226, 648, 389, 308, 553, 199, 337, 118, 540, 173, 216, 283, 770, 121, 332, 608, 179, 390, 581, 228, 554, 295, 338, 393, 527, 174, 312, 656, 203, 122, 285, 561, 772, 448, 95, 582, 181, 353, 556, 394, 340, 585, 232, 299, 643, 286, 205, 562, 124, 401, 535, 182, 354, 776, 211, 586, 327, 185, 396, 672, 301, 206, 344, 645, 564, 111, 402, 593, 240, 307, 356, 213, 539, 186, 588, 302, 159, 646, 784, 331, 417, 551, 594, 404, 227, 649, 568, 309, 214, 119, 541, 188, 360, 217, 704, 771, 418, 333, 609, 650, 391, 596, 310, 229, 555, 339, 408, 542, 175, 313, 218, 800, 657, 123, 334, 610, 773, 420, 449, 583, 230, 652, 368, 557, 395, 600, 341, 314, 233, 658, 220, 287, 563, 774, 125, 612, 450, 183, 355, 777, 424, 558, 342, 587, 234, 397, 673, 316, 660, 207, 345, 832, 126, 565, 403, 241, 452, 778, 616, 357, 187, 398, 674, 589, 236, 303, 346, 647, 785, 432, 566, 595, 242, 664, 405, 358, 569, 780, 215, 456, 590, 189, 676, 361, 786, 705, 419, 348, 624, 406, 651, 597, 244, 570, 311, 409, 896, 543, 190, 362, 219, 801, 706, 788, 335, 611, 680, 421, 464, 598, 231, 653, 369, 572, 410, 601, 248, 315, 802, 659, 364, 221, 708, 775, 422, 613, 451, 654, 370, 792, 425, 559, 602, 343, 412, 688, 235, 317, 222, 804, 661, 833, 480, 127, 614, 712, 453, 779, 426, 372, 617, 399, 675, 604, 318, 237, 662, 347, 834, 433, 567, 808, 243, 454, 665, 618, 359, 781, 428, 457, 591, 238, 376, 677, 720, 787, 434, 349, 625, 836, 666, 407, 245, 571, 782, 620, 458, 897, 191, 678, 816, 363, 707, 350, 626, 789, 436, 681, 465, 599, 246, 668, 840, 573, 411, 898, 249, 460, 736, 803, 365, 790, 709, 682, 423, 628, 466, 655, 371, 793, 440, 574, 603, 250, 413, 689, 900, 366, 223, 805, 710, 848, 481, 615, 684, 468, 794, 713, 427, 632, 373, 414, 690, 605, 252, 319, 806, 663, 835, 482, 904, 809, 714, 455, 374, 796, 619, 429, 472, 606, 692, 239, 377, 864, 721, 435, 837, 484, 810, 667, 716, 783, 430, 621, 912, 459, 378, 679, 817, 722, 351, 627, 838, 696, 437, 812, 247, 669, 841, 488, 622, 899, 461, 818, 737, 380, 724, 791, 438, 683, 629, 467, 670, 842, 441, 928, 575, 251, 462, 738, 901, 820, 367, 711, 849, 496, 630, 685, 728, 469, 795, 442, 633, 844, 415, 691, 902, 253, 740, 807, 850, 483, 905, 686, 824, 470, 715, 634, 375, 797, 444, 473, 960, 607, 254, 693, 865, 906, 852, 744, 485, 811, 798, 717, 431, 636, 474, 913, 694, 379, 866, 723, 839, 486, 697, 908, 813, 718, 856, 489, 623, 914, 476, 752, 819, 381, 868, 725, 698, 439, 814, 671, 843, 490, 929, 916, 463, 739, 382, 821, 726, 497, 631, 700, 872, 729, 443, 930, 845, 492, 903, 822, 741, 851, 498, 920, 687, 825, 730, 471, 635, 846, 445, 932, 961, 255, 742, 880, 907, 853, 500, 826, 745, 732, 799, 446, 637, 475, 962, 695, 867, 936, 854, 746, 487, 909, 828, 719, 857, 504, 638, 915, 477, 753, 964, 869, 699, 910, 748, 815, 858, 944, 491, 478, 754, 917, 383, 870, 727, 968, 701, 873, 931, 860, 493, 918, 756, 823, 499, 921, 702, 874, 731, 847, 494, 933, 976, 743, 881, 922, 760, 501, 827, 876, 733, 447, 934, 963, 882, 937, 855, 502, 924, 747, 829, 734, 505, 992, 639, 965, 938, 884, 911, 830, 749, 859, 506, 945, 479, 755, 966, 871, 940, 969, 750, 888, 946, 861, 508, 919, 757, 970, 703, 875, 862, 948, 495, 977, 758, 923, 761, 972, 877, 935, 978, 883, 952, 762, 503, 925, 878, 735, 993, 980, 939, 885, 926, 764, 831, 507, 994, 967, 886, 941, 984, 751, 889, 947, 509, 996, 942, 971, 890, 863, 510, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q57_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 520, 261, 71, 140, 45, 88, 146, 51, 262, 100, 265, 46, 75, 528, 161, 148, 320, 53, 266, 104, 162, 515, 77, 135, 273, 54, 83, 152, 57, 268, 544, 78, 164, 517, 274, 193, 112, 139, 85, 58, 31, 384, 518, 289, 194, 276, 99, 168, 521, 86, 141, 60, 89, 576, 290, 147, 196, 522, 263, 101, 142, 280, 47, 90, 176, 529, 292, 149, 321, 102, 524, 200, 267, 105, 530, 163, 92, 150, 322, 55, 296, 153, 640, 106, 269, 545, 79, 532, 165, 208, 275, 113, 324, 154, 59, 270, 546, 108, 385, 166, 519, 304, 195, 114, 536, 277, 169, 87, 156, 328, 61, 548, 386, 224, 577, 291, 278, 197, 170, 523, 116, 143, 281, 62, 768, 91, 578, 177, 388, 552, 293, 198, 336, 103, 172, 525, 282, 201, 120, 178, 531, 93, 580, 294, 151, 323, 392, 526, 297, 202, 641, 284, 107, 560, 94, 180, 533, 352, 209, 584, 325, 298, 155, 642, 204, 271, 547, 109, 400, 534, 167, 305, 210, 115, 326, 184, 537, 300, 157, 644, 329, 110, 549, 387, 592, 306, 225, 212, 538, 279, 171, 117, 158, 330, 63, 416, 769, 550, 226, 579, 648, 389, 308, 553, 199, 337, 118, 540, 173, 216, 283, 770, 121, 332, 608, 179, 390, 228, 581, 554, 295, 338, 393, 174, 527, 312, 203, 656, 122, 285, 561, 772, 95, 448, 582, 181, 353, 556, 394, 340, 232, 585, 299, 643, 286, 205, 562, 124, 401, 182, 535, 354, 776, 211, 586, 327, 185, 396, 672, 301, 206, 344, 645, 111, 564, 402, 240, 593, 307, 356, 213, 186, 539, 588, 302, 159, 646, 331, 784, 417, 551, 594, 404, 227, 649, 568, 309, 214, 119, 188, 541, 360, 217, 704, 418, 771, 333, 609, 650, 391, 596, 310, 229, 555, 339, 408, 542, 175, 313, 218, 800, 657, 123, 334, 610, 420, 773, 449, 230, 583, 652, 368, 557, 395, 600, 341, 314, 233, 658, 220, 287, 563, 774, 125, 612, 450, 183, 355, 424, 777, 558, 342, 234, 587, 397, 673, 316, 207, 660, 345, 126, 832, 565, 403, 241, 452, 778, 616, 357, 187, 398, 674, 236, 589, 303, 346, 647, 432, 785, 566, 242, 595, 664, 405, 358, 569, 780, 215, 456, 590, 189, 676, 361, 786, 705, 419, 348, 624, 406, 651, 244, 597, 570, 311, 409, 190, 543, 896, 362, 219, 801, 706, 335, 788, 611, 680, 421, 464, 598, 231, 653, 369, 572, 410, 248, 601, 315, 802, 659, 364, 221, 708, 422, 775, 613, 451, 654, 370, 792, 425, 559, 602, 343, 412, 235, 688, 317, 222, 804, 661, 127, 480, 833, 614, 712, 453, 426, 779, 372, 617, 399, 675, 604, 318, 237, 662, 347, 834, 433, 567, 808, 243, 454, 665, 618, 359, 428, 781, 457, 238, 591, 376, 677, 720, 434, 787, 349, 625, 836, 666, 407, 245, 571, 782, 620, 458, 191, 897, 678, 363, 816, 707, 350, 626, 436, 789, 681, 465, 246, 599, 668, 840, 573, 411, 898, 249, 460, 736, 803, 365, 790, 709, 682, 423, 628, 466, 655, 371, 440, 793, 574, 250, 603, 413, 689, 900, 366, 223, 805, 710, 848, 481, 615, 684, 468, 794, 713, 427, 632, 373, 414, 690, 252, 605, 319, 806, 663, 482, 835, 904, 809, 714, 455, 374, 796, 619, 429, 472, 606, 239, 692, 377, 864, 721, 435, 484, 837, 810, 667, 716, 430, 783, 621, 459, 912, 378, 679, 817, 722, 351, 627, 838, 696, 437, 812, 247, 669, 488, 841, 622, 899, 461, 818, 737, 380, 724, 438, 791, 683, 629, 467, 670, 842, 441, 575, 928, 251, 462, 738, 901, 367, 820, 711, 496, 849, 630, 685, 728, 469, 442, 795, 633, 844, 415, 691, 902, 253, 740, 807, 850, 483, 905, 686, 824, 470, 715, 634, 375, 444, 797, 473, 254, 607, 960, 693, 865, 906, 852, 744, 485, 811, 798, 717, 431, 636, 474, 913, 694, 379, 866, 723, 486, 839, 697, 908, 813, 718, 856, 489, 623, 914, 476, 752, 819, 381, 868, 725, 698, 439, 814, 671, 490, 843, 929, 463, 916, 739, 382, 821, 726, 497, 631, 700, 872, 729, 443, 930, 492, 845, 903, 822, 741, 498, 851, 920, 687, 825, 730, 471, 635, 846, 445, 932, 255, 961, 742, 880, 907, 500, 853, 826, 745, 732, 446, 799, 637, 475, 962, 695, 867, 936, 854, 746, 487, 909, 828, 719, 504, 857, 638, 915, 477, 753, 964, 869, 699, 910, 748, 815, 858, 491, 944, 478, 754, 917, 383, 870, 727, 968, 701, 873, 931, 860, 493, 918, 756, 823, 499, 921, 702, 874, 731, 494, 847, 933, 976, 743, 881, 922, 760, 501, 827, 876, 733, 447, 934, 963, 882, 937, 502, 855, 924, 747, 829, 734, 505, 639, 992, 965, 938, 884, 911, 830, 749, 506, 859, 945, 479, 755, 966, 871, 940, 969, 750, 888, 946, 508, 861, 919, 757, 970, 703, 875, 862, 495, 948, 977, 758, 923, 761, 972, 877, 935, 978, 883, 952, 762, 503, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q58_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 320, 53, 266, 104, 162, 515, 77, 135, 273, 54, 83, 152, 57, 268, 544, 78, 164, 517, 274, 193, 112, 139, 85, 58, 31, 384, 518, 289, 194, 276, 99, 168, 521, 86, 141, 60, 89, 576, 290, 147, 196, 263, 522, 101, 142, 280, 47, 90, 176, 529, 292, 149, 321, 102, 524, 200, 267, 105, 530, 163, 92, 150, 322, 55, 296, 153, 640, 106, 269, 545, 79, 532, 165, 208, 275, 113, 324, 154, 59, 270, 546, 108, 385, 166, 519, 304, 195, 114, 277, 536, 169, 87, 156, 328, 61, 548, 386, 224, 577, 291, 278, 197, 170, 523, 116, 143, 281, 62, 768, 91, 177, 578, 388, 293, 552, 198, 336, 103, 172, 525, 282, 201, 120, 178, 531, 93, 580, 294, 151, 323, 392, 526, 297, 202, 641, 284, 107, 560, 94, 180, 533, 352, 209, 325, 584, 298, 155, 642, 204, 271, 547, 109, 400, 534, 167, 305, 210, 115, 326, 184, 537, 300, 157, 644, 329, 110, 549, 387, 592, 306, 225, 212, 279, 538, 171, 117, 158, 330, 63, 416, 769, 550, 226, 579, 389, 648, 308, 553, 199, 337, 118, 540, 173, 216, 283, 770, 121, 332, 608, 179, 390, 228, 581, 295, 554, 338, 393, 174, 527, 312, 203, 656, 122, 285, 561, 772, 95, 448, 181, 582, 353, 556, 394, 340, 232, 585, 299, 643, 286, 205, 562, 124, 401, 182, 535, 354, 211, 776, 327, 185, 586, 396, 672, 301, 206, 344, 645, 111, 564, 402, 240, 593, 307, 356, 213, 186, 539, 588, 302, 159, 646, 331, 784, 417, 551, 594, 404, 227, 649, 309, 568, 214, 119, 188, 541, 360, 217, 704, 418, 771, 333, 609, 391, 650, 596, 310, 229, 555, 339, 408, 542, 175, 313, 218, 800, 657, 123, 334, 610, 420, 773, 449, 230, 583, 652, 368, 557, 395, 341, 600, 314, 233, 658, 220, 287, 563, 774, 125, 612, 450, 183, 355, 424, 777, 558, 342, 234, 587, 397, 673, 316, 207, 660, 345, 126, 832, 565, 403, 241, 452, 778, 357, 616, 187, 398, 674, 236, 589, 303, 346, 647, 432, 785, 566, 242, 595, 405, 664, 358, 569, 215, 780, 456, 189, 590, 676, 361, 786, 705, 419, 348, 624, 406, 651, 244, 597, 311, 570, 409, 190, 543, 896, 362, 219, 801, 706, 335, 788, 611, 421, 680, 464, 598, 231, 653, 369, 572, 410, 248, 601, 315, 802, 659, 364, 221, 708, 422, 775, 613, 451, 654, 370, 792, 425, 559, 343, 602, 412, 235, 688, 317, 222, 804, 661, 127, 480, 833, 614, 453, 712, 426, 779, 372, 617, 399, 675, 604, 318, 237, 662, 347, 433, 834, 567, 243, 808, 454, 665, 359, 618, 428, 781, 457, 238, 591, 376, 677, 720, 434, 787, 349, 625, 836, 407, 666, 245, 571, 782, 620, 458, 191, 897, 678, 363, 816, 707, 350, 626, 436, 789, 681, 465, 246, 599, 668, 840, 573, 411, 898, 249, 460, 736, 803, 365, 790, 709, 423, 682, 628, 466, 655, 371, 440, 793, 574, 250, 603, 413, 689, 900, 366, 223, 805, 710, 848, 481, 615, 684, 468, 794, 713, 427, 373, 632, 414, 690, 252, 605, 319, 806, 663, 482, 835, 904, 809, 455, 714, 374, 796, 619, 429, 472, 606, 239, 692, 377, 864, 721, 435, 484, 837, 810, 667, 716, 430, 783, 621, 459, 912, 378, 679, 817, 722, 351, 627, 437, 838, 696, 247, 812, 669, 488, 841, 622, 899, 461, 818, 737, 380, 724, 438, 791, 683, 629, 467, 670, 441, 842, 575, 928, 251, 462, 738, 901, 367, 820, 711, 496, 849, 630, 685, 469, 728, 442, 795, 633, 844, 415, 691, 902, 253, 740, 807, 850, 483, 905, 686, 824, 470, 715, 375, 634, 444, 797, 473, 254, 607, 960, 693, 865, 906, 852, 485, 744, 811, 798, 717, 431, 636, 474, 913, 694, 379, 866, 723, 486, 839, 697, 908, 813, 718, 856, 489, 623, 914, 476, 752, 819, 381, 868, 725, 439, 698, 814, 671, 490, 843, 929, 463, 916, 739, 382, 821, 726, 497, 631, 700, 872, 729, 443, 930, 492, 845, 903, 822, 741, 498, 851, 920, 687, 825, 471, 730, 635, 445, 846, 932, 255, 961, 742, 880, 907, 500, 853, 826, 745, 732, 446, 799, 637, 475, 962, 695, 867, 936, 854, 487, 746, 909, 828, 719, 504, 857, 638, 915, 477, 753, 964, 869, 699, 910, 748, 815, 858, 491, 944, 478, 754, 917, 383, 870, 727, 968, 701, 873, 931, 860, 493, 918, 756, 823, 499, 921, 702, 874, 731, 494, 847, 933, 976, 743, 881, 922, 501, 760, 827, 876, 733, 447, 934, 963, 882, 937, 502, 855, 924, 747, 829, 734, 505, 639, 992, 965, 938, 884, 911, 830, 749, 506, 859, 945, 479, 755, 966, 871, 940, 969, 750, 888, 946, 508, 861, 919, 757, 970, 703, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q59_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 320, 53, 266, 104, 162, 515, 77, 135, 273, 54, 83, 152, 57, 268, 544, 78, 164, 517, 274, 193, 112, 139, 85, 58, 31, 384, 518, 289, 194, 276, 99, 168, 521, 86, 141, 60, 89, 576, 290, 147, 196, 263, 522, 101, 142, 280, 47, 90, 176, 529, 292, 149, 321, 102, 524, 200, 267, 105, 530, 92, 163, 150, 322, 55, 296, 153, 640, 106, 269, 545, 79, 532, 165, 208, 275, 113, 324, 154, 59, 270, 546, 108, 385, 166, 519, 304, 195, 114, 277, 536, 169, 87, 156, 328, 61, 548, 386, 224, 577, 291, 278, 197, 170, 523, 116, 143, 281, 62, 768, 91, 177, 578, 388, 293, 552, 198, 336, 103, 172, 525, 282, 201, 120, 178, 531, 93, 580, 294, 151, 323, 392, 526, 297, 202, 641, 284, 107, 560, 94, 180, 533, 352, 209, 325, 584, 298, 155, 642, 204, 271, 547, 109, 400, 534, 167, 305, 210, 115, 184, 326, 537, 300, 157, 644, 329, 110, 549, 387, 592, 306, 225, 212, 279, 538, 171, 117, 158, 330, 63, 416, 769, 550, 226, 579, 389, 648, 308, 553, 199, 337, 118, 540, 173, 216, 283, 770, 121, 332, 608, 179, 390, 228, 581, 295, 554, 338, 393, 174, 527, 312, 203, 656, 122, 285, 561, 772, 95, 448, 181, 582, 353, 556, 394, 340, 232, 585, 299, 643, 286, 205, 562, 124, 401, 182, 535, 354, 211, 776, 185, 327, 586, 396, 672, 301, 206, 344, 645, 111, 564, 402, 240, 593, 307, 356, 213, 186, 539, 588, 302, 159, 646, 331, 784, 417, 551, 594, 404, 227, 649, 309, 568, 214, 119, 188, 541, 360, 217, 704, 418, 771, 333, 609, 391, 650, 596, 310, 229, 555, 339, 408, 542, 175, 313, 218, 800, 657, 123, 334, 610, 420, 773, 449, 230, 583, 368, 652, 557, 395, 341, 600, 314, 233, 658, 220, 287, 563, 774, 125, 612, 450, 183, 355, 424, 777, 558, 342, 234, 587, 397, 673, 316, 207, 660, 345, 126, 832, 565, 403, 241, 452, 778, 357, 616, 187, 398, 674, 236, 589, 303, 346, 647, 432, 785, 566, 242, 595, 405, 664, 358, 569, 215, 780, 456, 189, 590, 676, 361, 786, 705, 348, 419, 624, 406, 651, 244, 597, 311, 570, 409, 190, 543, 896, 362, 219, 801, 706, 335, 788, 611, 421, 680, 464, 598, 231, 369, 653, 572, 410, 248, 601, 315, 802, 659, 364, 221, 708, 422, 775, 613, 451, 370, 654, 792, 425, 559, 343, 602, 412, 235, 688, 317, 222, 804, 661, 127, 480, 833, 614, 453, 712, 426, 779, 372, 617, 399, 604, 675, 318, 237, 662, 347, 433, 834, 567, 243, 808, 454, 665, 359, 618, 428, 781, 457, 238, 591, 376, 677, 720, 434, 787, 349, 625, 836, 407, 666, 245, 571, 782, 620, 458, 191, 897, 678, 363, 816, 707, 350, 626, 436, 789, 681, 465, 246, 599, 668, 840, 573, 411, 898, 249, 460, 736, 803, 365, 790, 709, 423, 682, 628, 466, 371, 655, 440, 793, 574, 250, 603, 413, 689, 900, 366, 223, 805, 710, 848, 481, 615, 684, 468, 794, 713, 427, 373, 632, 414, 690, 252, 605, 319, 806, 663, 482, 835, 904, 809, 455, 714, 374, 796, 619, 429, 472, 606, 239, 692, 377, 864, 721, 435, 484, 837, 810, 667, 716, 430, 783, 621, 459, 912, 378, 679, 817, 722, 351, 627, 437, 696, 838, 247, 812, 669, 488, 841, 622, 899, 461, 818, 737, 380, 724, 438, 791, 683, 629, 467, 670, 441, 842, 575, 928, 251, 462, 738, 901, 367, 820, 711, 496, 849, 630, 685, 469, 728, 442, 795, 633, 844, 415, 691, 902, 253, 740, 807, 850, 483, 905, 686, 824, 470, 715, 375, 634, 444, 797, 473, 254, 607, 960, 693, 865, 906, 852, 485, 744, 811, 798, 717, 431, 636, 474, 913, 694, 379, 866, 723, 486, 697, 839, 908, 813, 718, 856, 489, 623, 914, 476, 752, 819, 381, 868, 725, 439, 698, 814, 671, 490, 843, 929, 463, 916, 739, 382, 821, 726, 497, 631, 700, 872, 729, 443, 930, 492, 845, 903, 822, 741, 498, 851, 920, 687, 825, 471, 730, 635, 445, 846, 932, 255, 961, 742, 880, 907, 500, 853, 826, 745, 732, 446, 799, 637, 475, 962, 695, 867, 936, 854, 487, 746, 909, 828, 719, 504, 857, 638, 915, 477, 753, 964, 869, 699, 910, 748, 815, 858, 491, 944, 478, 754, 917, 383, 870, 727, 968, 701, 873, 860, 931, 493, 918, 756, 823, 499, 921, 702, 874, 731, 494, 847, 933, 976, 743, 881, 922, 501, 760, 827, 876, 733, 447, 934, 963, 882, 937, 502, 855, 924, 747, 829, 734, 505, 639, 992, 965, 938, 884, 911, 830, 749, 506, 859, 945, 479, 755, 966, 871, 940, 969, 750, 888, 946, 508, 861, 919, 757, 970, 703, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q60_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 320, 53, 266, 104, 162, 515, 77, 135, 273, 54, 83, 152, 57, 268, 544, 78, 164, 517, 274, 193, 112, 139, 85, 58, 31, 384, 518, 289, 194, 276, 99, 168, 521, 86, 141, 60, 89, 576, 290, 147, 196, 263, 522, 101, 142, 280, 47, 90, 176, 529, 292, 149, 321, 102, 524, 200, 267, 105, 530, 92, 163, 150, 322, 55, 296, 153, 640, 106, 269, 545, 79, 532, 165, 208, 275, 113, 324, 154, 59, 270, 546, 108, 385, 166, 519, 304, 195, 114, 277, 536, 169, 87, 156, 328, 61, 548, 386, 224, 577, 291, 278, 197, 170, 523, 116, 143, 281, 62, 768, 91, 177, 578, 388, 293, 552, 198, 336, 103, 172, 525, 282, 201, 120, 178, 531, 93, 580, 294, 151, 323, 392, 526, 297, 202, 641, 284, 107, 560, 94, 180, 533, 352, 209, 325, 584, 298, 155, 642, 204, 271, 547, 109, 400, 534, 167, 305, 210, 115, 184, 326, 537, 300, 157, 644, 329, 110, 549, 387, 592, 306, 225, 212, 279, 538, 171, 117, 158, 330, 63, 416, 769, 550, 226, 579, 389, 648, 308, 553, 199, 337, 118, 540, 173, 216, 283, 121, 770, 332, 608, 179, 390, 228, 581, 295, 554, 338, 393, 174, 527, 312, 203, 656, 122, 285, 561, 772, 95, 448, 181, 582, 353, 556, 394, 340, 232, 585, 299, 643, 286, 205, 562, 124, 401, 182, 535, 354, 211, 776, 185, 327, 586, 396, 672, 301, 206, 344, 645, 111, 564, 402, 240, 593, 307, 356, 213, 186, 539, 588, 302, 159, 646, 331, 784, 417, 551, 594, 404, 227, 649, 309, 568, 214, 119, 188, 541, 360, 217, 704, 418, 771, 333, 609, 391, 650, 596, 310, 229, 555, 339, 408, 542, 175, 313, 218, 800, 657, 123, 334, 610, 420, 773, 449, 230, 583, 368, 652, 557, 395, 341, 600, 314, 233, 658, 220, 287, 563, 125, 774, 612, 450, 183, 355, 424, 777, 558, 342, 234, 587, 397, 673, 316, 207, 660, 345, 126, 832, 565, 403, 241, 452, 778, 357, 616, 187, 398, 674, 236, 589, 303, 346, 647, 432, 785, 566, 242, 595, 405, 664, 358, 569, 215, 780, 456, 189, 590, 676, 361, 786, 705, 348, 419, 624, 406, 651, 244, 597, 311, 570, 409, 190, 543, 896, 362, 219, 801, 706, 335, 788, 611, 421, 680, 464, 598, 231, 369, 653, 572, 410, 248, 601, 315, 802, 659, 364, 221, 708, 422, 775, 613, 451, 370, 654, 792, 425, 559, 343, 602, 412, 235, 688, 317, 222, 804, 661, 127, 480, 833, 614, 453, 712, 426, 779, 372, 617, 399, 604, 675, 318, 237, 662, 347, 433, 834, 567, 243, 808, 454, 665, 359, 618, 428, 781, 457, 238, 591, 376, 677, 720, 434, 787, 349, 625, 836, 407, 666, 245, 571, 782, 620, 458, 191, 897, 678, 363, 816, 707, 350, 626, 436, 789, 681, 465, 246, 599, 668, 840, 573, 411, 249, 898, 460, 736, 803, 365, 790, 709, 423, 682, 628, 466, 371, 655, 440, 793, 574, 250, 603, 413, 689, 900, 366, 223, 805, 710, 848, 481, 615, 684, 468, 794, 713, 427, 373, 632, 414, 690, 252, 605, 319, 806, 663, 482, 835, 904, 809, 455, 714, 374, 796, 619, 429, 472, 606, 239, 692, 377, 864, 721, 435, 484, 837, 810, 667, 716, 430, 783, 621, 459, 912, 378, 679, 817, 722, 351, 627, 437, 696, 838, 247, 812, 669, 488, 841, 622, 899, 461, 818, 737, 380, 724, 438, 791, 683, 629, 467, 670, 441, 842, 575, 928, 251, 462, 738, 901, 367, 820, 711, 496, 849, 630, 685, 469, 728, 442, 795, 633, 844, 415, 691, 253, 902, 740, 807, 850, 483, 905, 686, 824, 470, 715, 375, 634, 444, 797, 473, 254, 607, 960, 693, 865, 906, 852, 485, 744, 811, 798, 717, 431, 636, 474, 913, 694, 379, 866, 723, 486, 697, 839, 908, 813, 718, 856, 489, 623, 914, 476, 752, 819, 381, 868, 725, 439, 698, 814, 671, 490, 843, 929, 463, 916, 739, 382, 821, 726, 497, 631, 700, 872, 729, 443, 930, 492, 845, 903, 822, 741, 498, 851, 920, 687, 825, 471, 730, 635, 445, 846, 932, 255, 961, 742, 880, 907, 500, 853, 826, 745, 732, 446, 799, 637, 475, 962, 695, 867, 936, 854, 487, 746, 909, 828, 719, 504, 857, 638, 915, 477, 753, 964, 869, 699, 910, 748, 815, 858, 491, 944, 478, 754, 917, 383, 870, 727, 968, 701, 873, 860, 931, 493, 918, 756, 823, 499, 921, 702, 874, 731, 494, 847, 933, 976, 743, 881, 922, 501, 760, 827, 876, 733, 447, 934, 963, 882, 937, 502, 855, 924, 747, 829, 734, 505, 639, 992, 965, 938, 884, 911, 830, 749, 506, 859, 945, 479, 755, 966, 871, 940, 969, 750, 888, 946, 508, 861, 919, 757, 970, 703, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q61_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 320, 53, 266, 104, 162, 515, 77, 135, 273, 54, 83, 152, 57, 268, 544, 78, 164, 517, 274, 193, 112, 139, 85, 58, 31, 384, 518, 289, 194, 276, 99, 168, 521, 86, 141, 60, 89, 576, 290, 147, 196, 263, 522, 101, 142, 280, 47, 90, 176, 529, 292, 149, 321, 102, 524, 200, 267, 105, 530, 92, 163, 150, 322, 55, 296, 153, 640, 106, 269, 545, 79, 532, 165, 208, 275, 113, 324, 154, 59, 270, 546, 108, 385, 166, 519, 304, 195, 114, 277, 536, 169, 87, 156, 328, 61, 548, 386, 224, 577, 291, 278, 197, 170, 523, 116, 143, 281, 62, 768, 91, 177, 578, 388, 293, 552, 198, 336, 103, 172, 525, 282, 201, 120, 178, 531, 93, 580, 294, 151, 323, 392, 526, 297, 202, 641, 284, 107, 560, 94, 180, 533, 352, 209, 325, 584, 298, 155, 642, 204, 271, 547, 109, 400, 534, 167, 305, 210, 115, 184, 326, 537, 300, 157, 329, 644, 110, 549, 387, 592, 306, 225, 212, 279, 538, 171, 117, 158, 330, 63, 416, 769, 550, 226, 579, 389, 648, 308, 553, 199, 337, 118, 540, 173, 216, 283, 121, 770, 332, 608, 179, 390, 228, 581, 295, 554, 338, 393, 174, 527, 312, 203, 656, 122, 285, 561, 772, 95, 448, 181, 582, 353, 556, 394, 340, 232, 585, 299, 643, 286, 205, 562, 124, 401, 182, 535, 354, 211, 776, 185, 327, 586, 396, 672, 301, 206, 344, 645, 111, 564, 402, 240, 593, 307, 356, 213, 186, 539, 588, 302, 159, 331, 646, 784, 417, 551, 594, 404, 227, 649, 309, 568, 214, 119, 188, 541, 360, 217, 704, 418, 771, 333, 609, 391, 650, 596, 310, 229, 555, 339, 408, 542, 175, 313, 218, 800, 657, 123, 334, 610, 420, 773, 449, 230, 583, 368, 652, 557, 395, 341, 600, 314, 233, 658, 220, 287, 563, 125, 774, 612, 450, 183, 355, 424, 777, 558, 342, 234, 587, 397, 673, 316, 207, 345, 660, 126, 832, 565, 403, 241, 452, 778, 357, 616, 187, 398, 674, 236, 589, 303, 346, 647, 432, 785, 566, 242, 595, 405, 664, 358, 569, 215, 780, 456, 189, 590, 361, 676, 786, 705, 348, 419, 624, 406, 651, 244, 597, 311, 570, 409, 190, 543, 896, 362, 219, 801, 706, 335, 788, 611, 421, 680, 464, 598, 231, 369, 653, 572, 410, 248, 601, 315, 802, 659, 364, 221, 708, 422, 775, 613, 451, 370, 654, 792, 425, 559, 343, 602, 412, 235, 688, 317, 222, 804, 661, 127, 480, 833, 614, 453, 712, 426, 779, 372, 617, 399, 604, 675, 318, 237, 347, 662, 433, 834, 567, 243, 808, 454, 665, 359, 618, 428, 781, 457, 238, 591, 376, 677, 720, 434, 787, 349, 625, 836, 407, 666, 245, 571, 782, 620, 458, 191, 897, 363, 678, 816, 707, 350, 626, 436, 789, 681, 465, 246, 599, 668, 840, 573, 411, 249, 898, 460, 736, 803, 365, 790, 709, 423, 682, 628, 466, 371, 655, 440, 793, 574, 250, 603, 413, 689, 900, 366, 223, 805, 710, 848, 481, 615, 684, 468, 794, 713, 427, 373, 632, 414, 690, 252, 605, 319, 806, 663, 482, 835, 904, 809, 455, 714, 374, 796, 619, 429, 472, 606, 239, 377, 692, 864, 721, 435, 484, 837, 810, 667, 716, 430, 783, 621, 459, 912, 378, 679, 817, 722, 351, 627, 437, 696, 838, 247, 812, 669, 488, 841, 622, 899, 461, 818, 737, 380, 724, 438, 791, 683, 629, 467, 670, 441, 842, 575, 928, 251, 462, 738, 901, 367, 820, 711, 496, 849, 630, 685, 469, 728, 442, 795, 633, 844, 415, 691, 253, 902, 740, 807, 850, 483, 905, 686, 824, 470, 715, 375, 634, 444, 797, 473, 254, 607, 960, 693, 865, 906, 852, 485, 744, 811, 798, 717, 431, 636, 474, 913, 379, 694, 866, 723, 486, 697, 839, 908, 813, 718, 856, 489, 623, 914, 476, 752, 819, 381, 868, 725, 439, 698, 814, 671, 490, 843, 929, 463, 916, 739, 382, 821, 726, 497, 631, 700, 872, 729, 443, 930, 492, 845, 903, 822, 741, 498, 851, 920, 687, 825, 471, 730, 635, 445, 846, 932, 255, 961, 742, 880, 907, 500, 853, 826, 745, 732, 446, 799, 637, 475, 962, 695, 867, 936, 854, 487, 746, 909, 828, 719, 504, 857, 638, 915, 477, 753, 964, 869, 699, 910, 748, 815, 858, 491, 944, 478, 754, 917, 383, 870, 727, 968, 701, 873, 860, 931, 493, 918, 756, 823, 499, 921, 702, 874, 731, 494, 847, 933, 976, 743, 881, 922, 501, 760, 827, 876, 733, 447, 934, 963, 882, 937, 502, 855, 924, 747, 829, 734, 505, 639, 992, 965, 938, 884, 911, 830, 749, 506, 859, 945, 479, 755, 966, 871, 940, 969, 750, 888, 946, 508, 861, 919, 757, 970, 703, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q62_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 53, 320, 266, 104, 162, 515, 77, 135, 273, 54, 83, 152, 57, 268, 544, 78, 164, 517, 274, 193, 112, 139, 85, 58, 31, 384, 518, 289, 194, 99, 276, 168, 521, 86, 141, 60, 89, 576, 290, 147, 196, 263, 522, 101, 142, 280, 47, 90, 176, 529, 292, 149, 321, 102, 524, 200, 267, 105, 530, 92, 163, 150, 55, 322, 296, 153, 106, 640, 269, 545, 79, 532, 165, 208, 275, 113, 324, 154, 59, 270, 546, 108, 385, 166, 519, 304, 195, 114, 277, 536, 169, 87, 156, 61, 328, 548, 386, 224, 577, 291, 278, 197, 170, 523, 116, 143, 281, 62, 768, 91, 177, 578, 388, 293, 198, 552, 336, 103, 172, 525, 282, 201, 120, 178, 531, 93, 580, 294, 151, 323, 392, 526, 297, 202, 107, 641, 284, 560, 94, 180, 533, 352, 209, 325, 584, 298, 155, 642, 204, 271, 547, 109, 400, 534, 167, 305, 210, 115, 184, 326, 537, 300, 157, 329, 110, 644, 549, 387, 592, 306, 225, 212, 279, 538, 171, 117, 158, 63, 330, 416, 769, 550, 226, 579, 389, 648, 308, 199, 553, 337, 118, 540, 173, 216, 283, 121, 770, 332, 608, 179, 390, 228, 581, 295, 554, 338, 393, 174, 527, 312, 203, 122, 656, 285, 561, 772, 95, 181, 448, 582, 353, 556, 394, 340, 232, 585, 299, 643, 286, 205, 562, 124, 401, 182, 535, 354, 211, 776, 185, 327, 586, 396, 672, 301, 206, 344, 111, 645, 564, 402, 240, 593, 307, 356, 213, 186, 539, 588, 302, 159, 331, 646, 784, 417, 551, 594, 227, 404, 649, 309, 214, 568, 119, 188, 541, 360, 217, 704, 418, 771, 333, 609, 391, 650, 596, 310, 229, 555, 339, 408, 542, 175, 313, 218, 800, 123, 657, 334, 610, 420, 773, 449, 230, 583, 368, 652, 557, 395, 341, 600, 314, 233, 658, 220, 287, 563, 125, 774, 612, 183, 450, 355, 424, 777, 558, 342, 234, 587, 397, 673, 316, 207, 345, 126, 660, 565, 832, 403, 241, 452, 778, 357, 616, 187, 398, 674, 236, 589, 303, 346, 647, 432, 785, 566, 242, 595, 405, 664, 358, 215, 569, 780, 189, 456, 590, 361, 676, 786, 705, 348, 419, 624, 406, 651, 244, 597, 311, 570, 409, 190, 543, 362, 896, 219, 801, 706, 335, 611, 788, 421, 680, 464, 598, 231, 369, 653, 572, 410, 248, 601, 315, 802, 659, 364, 221, 708, 422, 775, 613, 451, 370, 654, 792, 425, 559, 343, 602, 235, 412, 688, 317, 222, 804, 127, 661, 480, 833, 614, 453, 712, 426, 779, 372, 617, 399, 604, 675, 318, 237, 347, 662, 433, 567, 834, 243, 454, 808, 665, 359, 618, 428, 781, 457, 238, 591, 376, 677, 720, 434, 787, 349, 625, 836, 407, 666, 245, 571, 782, 620, 191, 458, 363, 897, 678, 816, 707, 350, 626, 436, 789, 681, 465, 246, 599, 668, 573, 840, 411, 249, 898, 460, 736, 803, 365, 790, 709, 423, 682, 628, 466, 371, 655, 440, 793, 574, 250, 603, 413, 689, 366, 900, 223, 805, 710, 848, 481, 615, 684, 468, 794, 713, 427, 373, 632, 414, 690, 252, 605, 319, 806, 663, 482, 835, 904, 455, 809, 714, 374, 619, 796, 429, 472, 606, 239, 377, 692, 864, 721, 435, 484, 837, 810, 667, 716, 430, 783, 621, 459, 378, 912, 679, 817, 722, 351, 627, 437, 696, 838, 247, 812, 669, 488, 841, 622, 899, 461, 818, 737, 380, 724, 438, 791, 683, 629, 467, 670, 441, 575, 842, 928, 251, 462, 738, 367, 901, 820, 711, 496, 849, 630, 685, 469, 728, 442, 795, 633, 844, 415, 691, 253, 902, 740, 807, 850, 483, 905, 686, 470, 824, 715, 375, 634, 444, 797, 473, 254, 607, 693, 960, 865, 906, 852, 485, 744, 811, 798, 717, 431, 636, 474, 379, 913, 694, 866, 723, 486, 697, 839, 908, 813, 718, 856, 489, 623, 914, 476, 752, 819, 381, 868, 725, 439, 698, 814, 671, 490, 843, 929, 463, 739, 382, 916, 821, 726, 497, 631, 700, 872, 729, 443, 930, 492, 845, 903, 822, 741, 498, 851, 920, 687, 471, 825, 730, 635, 445, 846, 932, 255, 961, 742, 880, 907, 500, 853, 826, 745, 732, 446, 799, 637, 475, 695, 962, 867, 936, 854, 487, 746, 909, 828, 719, 504, 857, 638, 915, 477, 753, 964, 869, 699, 910, 748, 815, 858, 491, 944, 478, 754, 383, 917, 870, 727, 701, 968, 873, 860, 931, 493, 918, 756, 823, 499, 921, 702, 874, 731, 494, 847, 933, 976, 743, 881, 922, 501, 760, 827, 876, 733, 447, 934, 963, 882, 937, 502, 855, 747, 924, 829, 734, 505, 639, 992, 965, 938, 884, 911, 830, 749, 506, 859, 945, 479, 755, 966, 871, 940, 969, 750, 888, 946, 508, 861, 919, 757, 703, 970, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q63_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 288, 145, 98, 261, 520, 71, 140, 45, 88, 146, 51, 262, 100, 265, 46, 75, 528, 161, 148, 53, 320, 266, 104, 162, 515, 77, 135, 273, 54, 83, 152, 57, 268, 544, 78, 164, 517, 274, 193, 112, 139, 85, 58, 31, 384, 518, 289, 194, 99, 276, 168, 521, 86, 141, 60, 89, 576, 290, 147, 196, 263, 522, 101, 142, 280, 47, 90, 176, 529, 292, 149, 321, 102, 524, 200, 267, 105, 530, 92, 163, 150, 55, 322, 296, 153, 106, 640, 269, 545, 79, 532, 165, 208, 275, 113, 324, 154, 59, 270, 546, 108, 385, 166, 519, 304, 195, 114, 277, 536, 169, 87, 156, 61, 328, 548, 386, 224, 577, 291, 278, 197, 170, 523, 116, 143, 281, 62, 91, 768, 177, 578, 388, 293, 198, 552, 336, 103, 172, 525, 282, 201, 120, 178, 531, 93, 580, 294, 151, 323, 392, 526, 297, 202, 107, 284, 641, 560, 94, 180, 533, 352, 209, 325, 584, 298, 155, 642, 204, 271, 547, 109, 400, 534, 167, 305, 210, 115, 184, 326, 537, 300, 157, 329, 110, 644, 549, 387, 592, 306, 225, 212, 279, 538, 171, 117, 158, 63, 330, 416, 769, 550, 226, 579, 389, 648, 308, 199, 553, 337, 118, 540, 173, 216, 283, 121, 770, 332, 608, 179, 390, 228, 581, 295, 554, 338, 393, 174, 527, 312, 203, 122, 656, 285, 561, 95, 772, 181, 448, 582, 353, 556, 394, 340, 232, 585, 299, 286, 643, 205, 562, 124, 401, 182, 535, 354, 211, 776, 185, 327, 586, 396, 672, 301, 206, 344, 111, 645, 564, 402, 240, 593, 307, 356, 213, 186, 539, 588, 302, 159, 331, 646, 784, 417, 551, 594, 227, 404, 649, 309, 214, 568, 119, 188, 541, 360, 217, 704, 418, 771, 333, 609, 391, 650, 596, 310, 229, 555, 339, 408, 542, 175, 313, 218, 123, 800, 657, 334, 610, 420, 773, 449, 230, 583, 368, 652, 557, 395, 341, 600, 314, 233, 658, 220, 287, 563, 125, 774, 612, 183, 450, 355, 424, 777, 558, 342, 234, 587, 397, 316, 673, 207, 345, 126, 660, 565, 832, 403, 241, 452, 778, 357, 616, 187, 398, 674, 236, 589, 303, 346, 647, 432, 785, 566, 242, 595, 405, 664, 358, 215, 569, 780, 189, 456, 590, 361, 676, 786, 348, 705, 419, 624, 406, 651, 244, 597, 311, 570, 409, 190, 543, 362, 219, 896, 801, 706, 335, 611, 788, 421, 680, 464, 598, 231, 369, 653, 572, 410, 248, 601, 315, 802, 659, 364, 221, 708, 422, 775, 613, 451, 370, 654, 792, 425, 559, 343, 602, 235, 412, 688, 317, 222, 127, 804, 661, 480, 833, 614, 453, 712, 426, 779, 372, 617, 399, 604, 318, 675, 237, 347, 662, 433, 567, 834, 243, 454, 808, 665, 359, 618, 428, 781, 457, 238, 591, 376, 677, 720, 434, 787, 349, 625, 836, 407, 666, 245, 571, 782, 620, 191, 458, 363, 897, 678, 816, 350, 707, 626, 436, 789, 681, 465, 246, 599, 668, 573, 840, 411, 249, 898, 460, 736, 803, 365, 790, 709, 423, 682, 628, 466, 371, 655, 440, 793, 574, 250, 603, 413, 689, 366, 223, 900, 805, 710, 848, 481, 615, 684, 468, 794, 713, 427, 373, 632, 414, 690, 252, 605, 319, 806, 663, 482, 835, 904, 455, 809, 714, 374, 619, 796, 429, 472, 606, 239, 377, 692, 864, 721, 435, 484, 837, 810, 667, 716, 430, 783, 621, 459, 378, 912, 679, 817, 722, 351, 627, 437, 696, 838, 247, 812, 669, 488, 841, 622, 899, 461, 818, 380, 737, 724, 438, 791, 683, 629, 467, 670, 441, 575, 842, 251, 928, 462, 738, 367, 901, 820, 711, 496, 849, 630, 685, 469, 728, 442, 795, 633, 844, 415, 691, 253, 902, 740, 807, 850, 483, 905, 686, 470, 824, 715, 375, 634, 444, 797, 473, 254, 607, 693, 960, 865, 906, 852, 485, 744, 811, 798, 717, 431, 636, 474, 379, 913, 694, 866, 723, 486, 697, 839, 908, 813, 718, 856, 489, 623, 914, 476, 752, 819, 381, 868, 725, 439, 698, 814, 671, 490, 843, 929, 463, 382, 739, 916, 821, 726, 497, 631, 700, 872, 729, 443, 930, 492, 845, 903, 822, 741, 498, 851, 920, 687, 471, 825, 730, 635, 445, 846, 255, 932, 961, 742, 880, 907, 500, 853, 826, 745, 732, 446, 799, 637, 475, 695, 962, 867, 936, 854, 487, 746, 909, 828, 719, 504, 857, 638, 915, 477, 753, 964, 869, 699, 910, 748, 815, 858, 491, 944, 478, 754, 383, 917, 870, 727, 701, 968, 873, 860, 931, 493, 918, 756, 823, 499, 921, 702, 874, 731, 494, 847, 933, 976, 743, 881, 922, 501, 760, 827, 876, 733, 447, 934, 963, 882, 937, 502, 855, 747, 924, 829, 734, 505, 639, 992, 965, 938, 884, 911, 830, 749, 506, 859, 945, 479, 755, 966, 871, 940, 969, 750, 888, 946, 508, 861, 919, 757, 703, 970, 875, 862, 495, 948, 977, 758, 923, 761, 972, 877, 935, 978, 883, 952, 503, 762, 925, 878, 735, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q64_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 257, 38, 67, 136, 41, 28, 258, 96, 69, 42, 15, 144, 49, 260, 70, 44, 73, 131, 50, 23, 264, 74, 160, 513, 133, 52, 81, 27, 514, 76, 134, 272, 39, 82, 137, 56, 29, 516, 192, 259, 97, 138, 84, 43, 30, 145, 288, 98, 261, 520, 71, 140, 45, 88, 146, 51, 262, 100, 265, 46, 75, 528, 161, 148, 53, 320, 266, 104, 162, 515, 77, 135, 273, 54, 83, 152, 57, 268, 544, 78, 164, 517, 274, 193, 112, 139, 85, 58, 31, 384, 518, 289, 194, 99, 276, 168, 521, 86, 141, 60, 89, 147, 290, 576, 196, 263, 522, 101, 142, 280, 47, 90, 176, 529, 149, 292, 321, 102, 524, 200, 267, 105, 530, 92, 163, 150, 55, 322, 153, 296, 106, 640, 269, 545, 79, 532, 165, 208, 275, 113, 324, 154, 59, 270, 546, 108, 385, 166, 519, 304, 195, 114, 277, 536, 169, 87, 156, 61, 328, 548, 386, 224, 291, 577, 278, 197, 170, 523, 116, 143, 281, 62, 91, 768, 177, 578, 388, 293, 198, 552, 336, 103, 172, 525, 282, 201, 120, 178, 531, 93, 151, 294, 580, 323, 392, 526, 297, 202, 107, 284, 641, 560, 94, 180, 533, 209, 352, 325, 155, 298, 584, 642, 204, 271, 547, 109, 400, 534, 167, 305, 210, 115, 184, 326, 537, 157, 300, 329, 110, 644, 549, 387, 306, 592, 225, 212, 279, 538, 171, 117, 158, 63, 330, 416, 769, 550, 226, 579, 389, 648, 308, 199, 553, 337, 118, 540, 173, 216, 283, 121, 770, 332, 179, 608, 390, 228, 295, 581, 554, 338, 393, 174, 527, 312, 203, 122, 656, 285, 561, 95, 772, 181, 448, 582, 353, 556, 394, 340, 232, 299, 585, 286, 643, 205, 562, 124, 401, 182, 535, 211, 354, 776, 185, 327, 586, 396, 672, 301, 206, 344, 111, 645, 564, 402, 240, 307, 593, 213, 356, 186, 539, 159, 302, 588, 331, 646, 784, 417, 551, 594, 227, 404, 649, 309, 214, 568, 119, 188, 541, 217, 360, 418, 704, 771, 333, 609, 391, 650, 310, 596, 229, 555, 339, 408, 542, 175, 313, 218, 123, 657, 800, 334, 610, 420, 773, 449, 230, 583, 368, 652, 557, 395, 341, 314, 600, 233, 658, 220, 287, 563, 125, 774, 183, 612, 450, 355, 424, 777, 558, 342, 234, 587, 397, 316, 673, 207, 345, 126, 660, 565, 403, 832, 241, 452, 778, 357, 187, 616, 398, 674, 236, 303, 589, 346, 647, 432, 785, 566, 242, 595, 405, 664, 215, 358, 569, 780, 189, 456, 590, 361, 676, 786, 348, 419, 705, 624, 406, 651, 244, 311, 597, 570, 409, 190, 543, 219, 362, 896, 801, 706, 335, 611, 788, 421, 680, 464, 598, 231, 369, 653, 572, 410, 248, 315, 601, 659, 802, 221, 364, 422, 708, 775, 613, 451, 370, 654, 792, 425, 559, 343, 602, 235, 412, 688, 317, 222, 127, 661, 804, 480, 833, 614, 453, 426, 712, 779, 372, 617, 399, 318, 604, 675, 237, 347, 662, 433, 567, 834, 243, 454, 665, 808, 359, 618, 428, 781, 457, 238, 591, 376, 677, 434, 720, 787, 349, 625, 407, 836, 666, 245, 571, 782, 191, 620, 458, 363, 897, 678, 816, 350, 707, 626, 436, 789, 681, 465, 246, 599, 668, 573, 411, 840, 249, 898, 460, 736, 803, 365, 790, 423, 709, 682, 628, 466, 371, 655, 440, 793, 574, 250, 603, 413, 689, 223, 366, 900, 805, 710, 848, 481, 615, 684, 468, 794, 427, 713, 373, 632, 414, 690, 252, 319, 605, 663, 806, 482, 835, 904, 455, 809, 714, 374, 619, 796, 429, 472, 606, 239, 377, 692, 435, 721, 864, 484, 837, 667, 810, 430, 716, 783, 621, 459, 378, 912, 679, 817, 722, 351, 627, 437, 696, 838, 247, 669, 812, 488, 841, 622, 899, 461, 818, 380, 737, 438, 724, 791, 683, 629, 467, 670, 441, 575, 842, 251, 928, 462, 738, 367, 901, 820, 711, 496, 849, 630, 685, 469, 442, 728, 795, 633, 415, 844, 691, 253, 902, 740, 807, 850, 483, 905, 686, 470, 824, 715, 375, 634, 444, 797, 473, 254, 607, 693, 960, 865, 906, 852, 485, 744, 811, 798, 431, 717, 636, 474, 379, 913, 694, 723, 866, 486, 697, 839, 908, 813, 718, 856, 489, 623, 914, 476, 752, 819, 381, 439, 725, 868, 698, 671, 814, 490, 843, 929, 463, 382, 739, 916, 821, 726, 497, 631, 700, 443, 729, 872, 930, 492, 845, 903, 822, 741, 498, 851, 920, 687, 471, 825, 730, 635, 445, 846, 255, 932, 961, 742, 880, 907, 500, 853, 826, 745, 446, 732, 799, 637, 475, 695, 962, 867, 936, 854, 487, 746, 909, 828, 719, 504, 857, 638, 915, 477, 753, 964, 869, 699, 910, 748, 815, 858, 491, 944, 478, 754, 383, 917, 727, 870, 701, 968, 873, 860, 931, 493, 918, 756, 823, 499, 921, 702, 731, 874, 494, 847, 933, 976, 743, 881, 922, 501, 760, 827, 447, 733, 876, 934, 963, 882, 937, 502, 855, 747, 924, 829, 734, 505, 639, 992, 965, 938, 884, 911, 830, 749, 506, 859, 945, 479, 755, 966, 871, 940, 969, 750, 888, 946, 508, 861, 919, 757, 703, 970, 875, 862, 495, 948, 977, 758, 923, 761, 972, 877, 935, 978, 883, 952, 503, 762, 925, 735, 878, 993, 980, 939, 885, 926, 764, 831, 507, 994, 967, 886, 941, 984, 751, 889, 947, 509, 996, 942, 971, 890, 510, 863, 949, 759, 1000, 973, 892, 950, 979, 953, 763, 974, 879, 1008, 981, 954, 927, 765, 995, 982, 887, 956, 985, 766, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q65_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 272, 39, 82, 137, 56, 29, 516, 192, 259, 97, 138, 84, 43, 30, 145, 288, 98, 261, 520, 71, 140, 45, 88, 146, 51, 262, 100, 46, 265, 75, 528, 161, 148, 53, 320, 266, 104, 162, 77, 515, 135, 54, 273, 83, 152, 57, 268, 544, 78, 164, 517, 274, 193, 112, 139, 85, 58, 31, 384, 518, 289, 194, 99, 276, 168, 521, 86, 141, 60, 89, 147, 290, 576, 196, 263, 522, 101, 142, 280, 47, 90, 176, 529, 149, 292, 102, 321, 524, 200, 267, 105, 92, 530, 163, 150, 55, 322, 153, 296, 106, 640, 269, 545, 79, 532, 165, 208, 275, 113, 324, 154, 59, 270, 108, 546, 166, 385, 519, 304, 195, 114, 277, 536, 169, 87, 156, 61, 328, 548, 386, 224, 291, 577, 278, 197, 170, 523, 116, 143, 62, 281, 91, 768, 177, 578, 388, 293, 198, 552, 336, 103, 172, 525, 282, 201, 120, 178, 93, 531, 151, 294, 580, 323, 392, 526, 297, 202, 107, 284, 641, 560, 94, 180, 533, 209, 352, 325, 155, 298, 584, 204, 642, 271, 109, 547, 400, 534, 167, 305, 210, 115, 184, 326, 537, 157, 300, 110, 329, 644, 549, 387, 306, 592, 225, 212, 279, 538, 171, 117, 158, 63, 330, 416, 550, 769, 226, 579, 389, 648, 308, 199, 553, 118, 337, 540, 173, 216, 283, 121, 332, 770, 179, 608, 390, 228, 295, 581, 554, 338, 174, 393, 527, 312, 203, 122, 656, 285, 561, 95, 772, 181, 448, 582, 353, 556, 394, 340, 232, 299, 585, 286, 205, 643, 124, 562, 182, 401, 535, 211, 354, 776, 185, 327, 586, 396, 672, 301, 206, 344, 111, 645, 564, 402, 240, 307, 593, 213, 356, 186, 539, 159, 302, 588, 331, 646, 784, 417, 551, 594, 227, 404, 649, 309, 214, 568, 119, 188, 541, 217, 360, 418, 704, 333, 771, 609, 391, 650, 310, 596, 229, 555, 339, 408, 542, 175, 313, 218, 123, 657, 800, 334, 610, 420, 773, 230, 449, 583, 368, 652, 557, 395, 341, 314, 600, 233, 220, 658, 287, 125, 563, 774, 183, 612, 450, 355, 424, 558, 777, 342, 234, 587, 397, 316, 673, 207, 126, 345, 660, 565, 403, 832, 241, 452, 778, 357, 187, 616, 398, 236, 674, 303, 589, 346, 647, 432, 566, 785, 242, 595, 405, 664, 215, 358, 569, 780, 189, 456, 590, 361, 676, 348, 786, 419, 705, 624, 406, 651, 244, 311, 597, 570, 190, 409, 543, 219, 362, 896, 801, 706, 335, 611, 788, 421, 680, 464, 598, 231, 369, 653, 572, 410, 248, 315, 601, 221, 659, 364, 802, 422, 708, 775, 613, 451, 370, 654, 792, 425, 559, 343, 602, 235, 412, 688, 317, 222, 127, 661, 804, 480, 614, 833, 453, 426, 712, 779, 372, 617, 399, 318, 604, 237, 675, 347, 662, 433, 567, 834, 243, 454, 665, 808, 359, 618, 428, 781, 238, 457, 591, 376, 677, 434, 720, 349, 787, 625, 407, 836, 666, 245, 571, 782, 191, 620, 458, 363, 678, 897, 816, 350, 707, 626, 436, 789, 681, 246, 465, 599, 668, 573, 411, 840, 249, 460, 898, 736, 365, 803, 790, 423, 709, 682, 628, 466, 371, 655, 440, 574, 793, 250, 603, 413, 689, 223, 366, 900, 805, 710, 848, 481, 615, 684, 468, 794, 427, 713, 373, 632, 414, 252, 690, 319, 605, 663, 806, 482, 835, 904, 455, 809, 714, 374, 619, 796, 429, 472, 606, 239, 377, 692, 435, 721, 864, 484, 837, 667, 810, 430, 716, 783, 621, 459, 378, 912, 679, 817, 722, 351, 627, 437, 696, 838, 247, 669, 812, 488, 622, 841, 461, 899, 380, 818, 737, 438, 724, 791, 683, 629, 467, 670, 441, 575, 842, 251, 928, 462, 738, 367, 901, 820, 711, 496, 630, 849, 685, 469, 442, 728, 795, 633, 415, 844, 253, 691, 902, 740, 807, 850, 483, 686, 905, 470, 824, 715, 375, 634, 444, 797, 254, 473, 607, 693, 960, 865, 906, 852, 485, 744, 811, 798, 431, 717, 636, 474, 379, 694, 913, 723, 866, 486, 697, 839, 908, 813, 718, 856, 489, 623, 476, 914, 752, 381, 819, 439, 725, 868, 698, 671, 814, 490, 843, 929, 463, 382, 739, 916, 821, 726, 497, 631, 700, 443, 729, 872, 492, 930, 845, 903, 822, 741, 498, 851, 920, 687, 471, 825, 730, 635, 445, 846, 255, 932, 742, 961, 880, 907, 500, 853, 826, 745, 446, 732, 799, 637, 475, 695, 962, 867, 936, 854, 487, 746, 909, 828, 719, 504, 638, 857, 477, 915, 753, 964, 869, 699, 910, 748, 815, 858, 491, 944, 478, 754, 383, 917, 727, 870, 701, 968, 873, 860, 493, 931, 918, 756, 823, 499, 702, 921, 731, 874, 494, 847, 933, 976, 743, 881, 922, 501, 760, 827, 447, 733, 876, 934, 963, 882, 937, 502, 855, 747, 924, 829, 734, 505, 639, 992, 965, 938, 884, 911, 830, 749, 506, 859, 945, 479, 755, 966, 871, 940, 750, 969, 888, 508, 946, 861, 919, 757, 703, 970, 875, 862, 495, 948, 758, 977, 923, 761, 972, 877, 935, 978, 883, 952, 503, 762, 925, 735, 878, 993, 980, 939, 885, 926, 764, 831, 507, 994, 967, 886, 941, 984, 751, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q66_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 272, 39, 82, 137, 56, 29, 516, 192, 259, 97, 138, 84, 43, 30, 145, 288, 98, 261, 520, 71, 140, 45, 88, 146, 51, 262, 100, 46, 265, 75, 161, 528, 148, 53, 320, 266, 104, 162, 77, 515, 135, 54, 273, 83, 152, 57, 268, 544, 78, 164, 517, 274, 193, 112, 139, 85, 58, 31, 384, 518, 289, 194, 99, 276, 168, 521, 86, 141, 60, 89, 147, 290, 576, 196, 263, 522, 101, 142, 280, 47, 90, 176, 529, 149, 292, 102, 321, 524, 200, 267, 105, 92, 163, 530, 150, 55, 322, 153, 296, 106, 640, 269, 545, 79, 165, 532, 208, 275, 113, 324, 154, 59, 270, 108, 546, 166, 385, 519, 304, 195, 114, 277, 169, 536, 87, 156, 61, 328, 548, 386, 224, 291, 577, 278, 197, 170, 523, 116, 143, 62, 281, 91, 768, 177, 578, 388, 293, 198, 552, 336, 103, 172, 525, 282, 201, 120, 178, 93, 531, 151, 294, 580, 323, 392, 526, 297, 202, 107, 284, 641, 560, 94, 180, 533, 209, 352, 325, 155, 298, 584, 204, 642, 271, 109, 547, 400, 167, 534, 305, 210, 115, 184, 326, 537, 157, 300, 110, 329, 644, 549, 387, 306, 225, 592, 212, 279, 171, 538, 117, 158, 63, 330, 416, 550, 769, 226, 579, 389, 648, 308, 199, 553, 118, 337, 173, 540, 216, 283, 121, 332, 770, 179, 608, 390, 228, 295, 581, 554, 338, 174, 393, 527, 312, 203, 122, 656, 285, 561, 95, 772, 181, 448, 582, 353, 556, 394, 340, 232, 299, 585, 286, 205, 643, 124, 562, 182, 401, 535, 211, 354, 776, 185, 327, 586, 396, 672, 301, 206, 344, 111, 645, 564, 402, 240, 307, 593, 213, 356, 186, 539, 159, 302, 588, 331, 646, 417, 784, 551, 227, 594, 404, 649, 309, 214, 568, 119, 188, 541, 217, 360, 418, 704, 333, 771, 609, 391, 650, 310, 229, 596, 555, 339, 408, 175, 542, 313, 218, 123, 657, 800, 334, 610, 420, 773, 230, 449, 583, 368, 652, 557, 395, 341, 314, 233, 600, 220, 658, 287, 125, 563, 774, 183, 612, 450, 355, 424, 558, 777, 342, 234, 587, 397, 316, 673, 207, 126, 345, 660, 565, 403, 832, 241, 452, 778, 357, 187, 616, 398, 236, 674, 303, 589, 346, 647, 432, 566, 785, 242, 595, 405, 664, 215, 358, 569, 780, 189, 456, 590, 361, 676, 348, 419, 786, 705, 624, 406, 651, 244, 311, 597, 570, 190, 409, 543, 219, 362, 896, 801, 706, 335, 611, 421, 788, 680, 464, 231, 598, 369, 653, 572, 410, 248, 315, 601, 221, 364, 659, 802, 422, 708, 775, 613, 451, 370, 654, 425, 792, 559, 343, 235, 602, 412, 688, 317, 222, 127, 661, 804, 480, 614, 833, 453, 426, 712, 779, 372, 617, 399, 318, 237, 604, 675, 347, 662, 433, 567, 834, 243, 454, 665, 808, 359, 618, 428, 781, 238, 457, 591, 376, 677, 434, 720, 349, 787, 625, 407, 836, 666, 245, 571, 782, 191, 620, 458, 363, 678, 897, 816, 350, 707, 626, 436, 789, 681, 246, 465, 599, 668, 573, 411, 840, 249, 460, 898, 736, 365, 803, 423, 790, 709, 682, 628, 466, 371, 655, 440, 574, 793, 250, 603, 413, 689, 223, 366, 900, 805, 710, 481, 848, 615, 684, 468, 427, 794, 713, 373, 632, 414, 252, 690, 319, 605, 663, 806, 482, 835, 904, 455, 809, 714, 374, 619, 429, 796, 472, 239, 606, 377, 692, 435, 721, 864, 484, 837, 667, 810, 430, 716, 783, 621, 459, 378, 912, 679, 817, 722, 351, 627, 437, 696, 838, 247, 669, 812, 488, 622, 841, 461, 899, 380, 818, 737, 438, 724, 791, 683, 629, 467, 670, 441, 575, 842, 251, 928, 462, 738, 367, 901, 820, 711, 496, 630, 849, 685, 469, 442, 728, 795, 633, 415, 844, 253, 691, 902, 740, 807, 483, 850, 686, 905, 470, 824, 715, 375, 634, 444, 797, 254, 473, 607, 693, 960, 865, 906, 485, 852, 744, 811, 431, 798, 717, 636, 474, 379, 694, 913, 723, 866, 486, 697, 839, 908, 813, 718, 489, 856, 623, 476, 914, 752, 381, 819, 439, 725, 868, 698, 671, 814, 490, 843, 929, 463, 382, 739, 916, 821, 726, 497, 631, 700, 443, 729, 872, 492, 930, 845, 903, 822, 741, 498, 851, 920, 687, 471, 825, 730, 635, 445, 846, 255, 932, 742, 961, 880, 907, 500, 853, 826, 745, 446, 732, 799, 637, 475, 695, 962, 867, 936, 487, 854, 746, 909, 828, 719, 504, 638, 857, 477, 915, 753, 964, 869, 699, 910, 748, 815, 491, 858, 944, 478, 754, 383, 917, 727, 870, 701, 968, 873, 493, 860, 931, 918, 756, 823, 499, 702, 921, 731, 874, 494, 847, 933, 976, 743, 881, 922, 501, 760, 827, 447, 733, 876, 934, 963, 882, 937, 502, 855, 747, 924, 829, 734, 505, 639, 992, 965, 938, 884, 911, 830, 749, 506, 859, 945, 479, 755, 966, 871, 940, 750, 969, 888, 508, 946, 861, 919, 757, 703, 970, 875, 495, 862, 948, 758, 977, 923, 761, 972, 877, 935, 978, 883, 952, 503, 762, 925, 735, 878, 993, 980, 939, 885, 926, 764, 831, 507, 994, 967, 886, 941, 984, 751, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q67_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 272, 39, 82, 137, 56, 29, 516, 192, 259, 97, 138, 84, 43, 30, 145, 288, 98, 261, 520, 71, 140, 45, 88, 146, 51, 262, 100, 46, 265, 75, 161, 528, 148, 53, 320, 266, 104, 162, 77, 515, 135, 54, 273, 83, 152, 57, 268, 544, 78, 164, 517, 274, 193, 112, 139, 85, 58, 31, 384, 518, 289, 194, 99, 276, 168, 521, 86, 141, 60, 89, 147, 290, 576, 196, 263, 522, 101, 142, 280, 47, 90, 176, 529, 149, 292, 102, 321, 524, 200, 267, 105, 92, 163, 530, 150, 55, 322, 153, 296, 106, 269, 640, 545, 79, 165, 532, 208, 275, 113, 324, 154, 59, 270, 108, 546, 166, 385, 519, 304, 195, 114, 277, 169, 536, 87, 156, 61, 328, 548, 386, 224, 291, 577, 278, 197, 170, 523, 116, 143, 62, 281, 91, 768, 177, 578, 388, 293, 198, 552, 336, 103, 172, 525, 282, 201, 120, 178, 93, 531, 151, 294, 580, 323, 392, 526, 297, 202, 107, 284, 641, 560, 94, 180, 533, 209, 352, 325, 155, 298, 584, 204, 271, 642, 109, 547, 400, 167, 534, 305, 210, 115, 184, 326, 537, 157, 300, 110, 329, 644, 549, 387, 306, 225, 592, 212, 279, 171, 538, 117, 158, 63, 330, 416, 550, 769, 226, 579, 389, 648, 308, 199, 553, 118, 337, 173, 540, 216, 283, 121, 332, 770, 179, 608, 390, 228, 295, 581, 554, 338, 174, 393, 527, 312, 203, 122, 285, 656, 561, 95, 772, 181, 448, 582, 353, 556, 394, 340, 232, 299, 585, 286, 205, 643, 124, 562, 182, 401, 535, 211, 354, 776, 185, 327, 586, 396, 301, 672, 206, 344, 111, 645, 564, 402, 240, 307, 593, 213, 356, 186, 539, 159, 302, 588, 331, 646, 417, 784, 551, 227, 594, 404, 649, 309, 214, 568, 119, 188, 541, 217, 360, 418, 333, 704, 771, 609, 391, 650, 310, 229, 596, 555, 339, 408, 175, 542, 313, 218, 123, 657, 800, 334, 610, 420, 773, 230, 449, 583, 368, 652, 557, 395, 341, 314, 233, 600, 220, 287, 658, 125, 563, 774, 183, 612, 450, 355, 424, 558, 777, 342, 234, 587, 397, 316, 673, 207, 126, 345, 660, 565, 403, 832, 241, 452, 778, 357, 187, 616, 398, 236, 303, 674, 589, 346, 647, 432, 566, 785, 242, 595, 405, 664, 215, 358, 569, 780, 189, 456, 590, 361, 676, 348, 419, 786, 705, 624, 406, 651, 244, 311, 597, 570, 190, 409, 543, 219, 362, 896, 801, 335, 706, 611, 421, 788, 680, 464, 231, 598, 369, 653, 572, 410, 248, 315, 601, 221, 364, 659, 802, 422, 708, 775, 613, 451, 370, 654, 425, 792, 559, 343, 235, 602, 412, 317, 688, 222, 127, 661, 804, 480, 614, 833, 453, 426, 712, 779, 372, 617, 399, 318, 237, 604, 675, 347, 662, 433, 567, 834, 243, 454, 665, 808, 359, 618, 428, 781, 238, 457, 591, 376, 677, 434, 349, 720, 787, 625, 407, 836, 666, 245, 571, 782, 191, 620, 458, 363, 678, 897, 816, 350, 707, 626, 436, 789, 681, 246, 465, 599, 668, 573, 411, 840, 249, 460, 898, 365, 736, 803, 423, 790, 709, 682, 628, 466, 371, 655, 440, 574, 793, 250, 603, 413, 689, 223, 366, 900, 805, 710, 481, 848, 615, 684, 468, 427, 794, 713, 373, 632, 414, 252, 319, 690, 605, 663, 806, 482, 835, 904, 455, 809, 714, 374, 619, 429, 796, 472, 239, 606, 377, 692, 435, 721, 864, 484, 837, 667, 810, 430, 716, 783, 621, 459, 378, 912, 679, 817, 351, 722, 627, 437, 696, 838, 247, 669, 812, 488, 622, 841, 461, 899, 380, 818, 737, 438, 724, 791, 683, 629, 467, 670, 441, 575, 842, 251, 928, 462, 367, 738, 901, 820, 711, 496, 630, 849, 685, 469, 442, 728, 795, 633, 415, 844, 253, 691, 902, 740, 807, 483, 850, 686, 905, 470, 824, 715, 375, 634, 444, 797, 254, 473, 607, 693, 960, 865, 906, 485, 852, 744, 811, 431, 798, 717, 636, 474, 379, 694, 913, 723, 866, 486, 697, 839, 908, 813, 718, 489, 856, 623, 476, 914, 381, 752, 819, 439, 725, 868, 698, 671, 814, 490, 843, 929, 463, 382, 739, 916, 821, 726, 497, 631, 700, 443, 729, 872, 492, 930, 845, 903, 822, 741, 498, 851, 920, 687, 471, 825, 730, 635, 445, 846, 255, 932, 742, 961, 880, 907, 500, 853, 826, 745, 446, 732, 799, 637, 475, 695, 962, 867, 936, 487, 854, 746, 909, 828, 719, 504, 638, 857, 477, 915, 753, 964, 869, 699, 910, 748, 815, 491, 858, 944, 478, 383, 754, 917, 727, 870, 701, 968, 873, 493, 860, 931, 918, 756, 823, 499, 702, 921, 731, 874, 494, 847, 933, 976, 743, 881, 922, 501, 760, 827, 447, 733, 876, 934, 963, 882, 937, 502, 855, 747, 924, 829, 734, 505, 639, 992, 965, 938, 884, 911, 830, 749, 506, 859, 945, 479, 755, 966, 871, 940, 750, 969, 888, 508, 946, 861, 919, 757, 703, 970, 875, 495, 862, 948, 758, 977, 923, 761, 972, 877, 935, 978, 883, 952, 503, 762, 925, 735, 878, 993, 980, 939, 885, 926, 764, 831, 507, 994, 967, 886, 941, 984, 751, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q68_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 192, 259, 97, 138, 84, 43, 30, 145, 288, 98, 261, 520, 71, 140, 45, 88, 146, 51, 262, 100, 46, 265, 75, 161, 528, 148, 53, 320, 266, 104, 162, 77, 515, 135, 54, 273, 83, 152, 57, 268, 78, 544, 164, 517, 274, 193, 112, 139, 85, 58, 31, 384, 518, 289, 194, 99, 276, 168, 521, 86, 141, 60, 89, 147, 290, 576, 196, 263, 522, 101, 142, 47, 280, 90, 176, 529, 149, 292, 102, 321, 524, 200, 267, 105, 92, 163, 530, 150, 55, 322, 153, 296, 106, 269, 640, 79, 545, 165, 532, 208, 275, 113, 324, 154, 59, 270, 108, 546, 166, 385, 519, 304, 195, 114, 277, 169, 536, 87, 156, 61, 328, 548, 386, 224, 291, 577, 278, 197, 170, 116, 523, 143, 62, 281, 91, 768, 177, 578, 388, 293, 198, 552, 103, 336, 172, 525, 282, 201, 120, 178, 93, 531, 151, 294, 580, 323, 392, 526, 297, 202, 107, 284, 641, 94, 560, 180, 533, 209, 352, 325, 155, 298, 584, 204, 271, 642, 109, 547, 167, 400, 534, 305, 210, 115, 184, 326, 537, 157, 300, 110, 329, 644, 549, 387, 306, 225, 592, 212, 279, 171, 538, 117, 158, 63, 330, 416, 550, 769, 226, 579, 389, 648, 308, 199, 553, 118, 337, 173, 540, 216, 283, 121, 332, 770, 179, 608, 390, 228, 295, 581, 554, 338, 174, 393, 527, 312, 203, 122, 285, 656, 95, 561, 772, 181, 448, 582, 353, 556, 394, 340, 232, 299, 585, 286, 205, 643, 124, 562, 182, 401, 535, 211, 354, 776, 185, 327, 586, 396, 301, 206, 672, 111, 344, 645, 564, 402, 240, 307, 593, 213, 356, 186, 539, 159, 302, 588, 331, 646, 417, 551, 784, 227, 594, 404, 649, 309, 214, 568, 119, 188, 541, 217, 360, 418, 333, 704, 771, 609, 391, 650, 310, 229, 596, 555, 339, 175, 408, 542, 313, 218, 123, 657, 334, 800, 610, 420, 773, 230, 449, 583, 368, 652, 557, 395, 341, 314, 233, 600, 220, 287, 658, 125, 563, 774, 183, 612, 450, 355, 424, 558, 777, 342, 234, 587, 397, 316, 207, 673, 126, 345, 660, 565, 403, 832, 241, 452, 778, 357, 187, 616, 398, 236, 303, 674, 589, 346, 647, 432, 566, 785, 242, 595, 405, 664, 215, 358, 569, 780, 189, 456, 590, 361, 676, 348, 419, 786, 705, 624, 406, 244, 651, 311, 597, 570, 190, 409, 543, 219, 362, 896, 335, 801, 706, 611, 421, 788, 680, 231, 464, 598, 369, 653, 572, 410, 248, 315, 601, 221, 364, 659, 802, 422, 708, 775, 613, 451, 370, 654, 425, 559, 792, 343, 235, 602, 412, 317, 222, 688, 127, 661, 804, 480, 614, 833, 453, 426, 712, 372, 779, 617, 399, 318, 237, 604, 675, 347, 662, 433, 567, 834, 243, 454, 665, 808, 359, 618, 428, 781, 238, 457, 591, 376, 677, 434, 349, 720, 787, 625, 407, 836, 666, 245, 571, 782, 191, 620, 458, 363, 678, 897, 350, 816, 707, 626, 436, 789, 681, 246, 465, 599, 668, 573, 411, 840, 249, 460, 898, 365, 736, 803, 423, 790, 709, 682, 628, 466, 371, 655, 440, 574, 793, 250, 603, 413, 223, 689, 366, 900, 805, 710, 481, 615, 848, 684, 468, 427, 794, 713, 373, 632, 414, 252, 319, 690, 605, 663, 806, 482, 835, 904, 455, 809, 714, 374, 619, 429, 796, 239, 472, 606, 377, 692, 435, 721, 864, 484, 837, 667, 810, 430, 716, 783, 621, 459, 378, 679, 912, 351, 817, 722, 627, 437, 696, 838, 247, 669, 812, 488, 622, 841, 461, 899, 380, 818, 737, 438, 724, 791, 683, 629, 467, 670, 441, 575, 842, 251, 462, 928, 367, 738, 901, 820, 711, 496, 630, 849, 685, 469, 442, 728, 795, 633, 415, 844, 253, 691, 902, 740, 807, 483, 850, 686, 905, 470, 824, 715, 375, 634, 444, 797, 254, 473, 607, 693, 960, 865, 906, 485, 852, 744, 811, 431, 798, 717, 636, 474, 379, 694, 913, 723, 866, 486, 697, 839, 908, 813, 718, 489, 623, 856, 476, 914, 381, 752, 819, 439, 725, 868, 698, 671, 814, 490, 843, 463, 929, 382, 739, 916, 821, 726, 497, 631, 700, 443, 729, 872, 492, 930, 845, 903, 822, 741, 498, 851, 687, 920, 471, 825, 730, 635, 445, 846, 255, 932, 742, 961, 880, 500, 907, 853, 826, 745, 446, 732, 799, 637, 475, 695, 962, 867, 936, 487, 854, 746, 909, 828, 719, 504, 638, 857, 477, 915, 753, 964, 869, 699, 910, 748, 815, 491, 858, 478, 944, 383, 754, 917, 727, 870, 701, 968, 873, 493, 860, 931, 918, 756, 823, 499, 702, 921, 731, 874, 494, 847, 933, 743, 976, 881, 922, 501, 760, 827, 447, 733, 876, 934, 963, 882, 937, 502, 855, 747, 924, 829, 734, 505, 639, 992, 965, 938, 884, 911, 830, 749, 506, 859, 479, 945, 755, 966, 871, 940, 750, 969, 888, 508, 946, 861, 919, 757, 703, 970, 875, 495, 862, 948, 758, 977, 923, 761, 972, 877, 935, 978, 883, 952, 503, 762, 925, 735, 878, 993, 980, 939, 885, 926, 764, 831, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q69_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 192, 259, 97, 138, 84, 43, 30, 145, 288, 98, 261, 520, 71, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 384, 518, 289, 194, 99, 276, 168, 521, 86, 141, 60, 89, 147, 290, 576, 196, 263, 522, 101, 142, 47, 280, 90, 176, 529, 149, 292, 102, 321, 524, 200, 267, 105, 92, 163, 530, 150, 55, 322, 153, 296, 106, 269, 640, 79, 545, 165, 532, 208, 275, 113, 154, 324, 59, 270, 108, 546, 166, 385, 519, 304, 195, 114, 277, 169, 536, 87, 156, 61, 328, 548, 386, 224, 291, 577, 278, 197, 170, 116, 523, 143, 62, 281, 91, 768, 177, 578, 388, 293, 198, 552, 103, 336, 172, 525, 282, 201, 120, 93, 178, 531, 151, 294, 580, 323, 392, 526, 297, 202, 107, 284, 641, 94, 560, 180, 533, 209, 352, 155, 325, 298, 584, 204, 271, 642, 109, 547, 167, 400, 534, 305, 210, 115, 184, 326, 537, 157, 300, 110, 329, 644, 549, 387, 306, 225, 592, 212, 279, 171, 538, 117, 158, 63, 330, 416, 550, 769, 226, 579, 389, 308, 648, 199, 553, 118, 337, 173, 540, 216, 283, 121, 332, 770, 179, 608, 390, 228, 295, 581, 554, 338, 174, 393, 527, 312, 203, 122, 285, 656, 95, 561, 772, 181, 448, 582, 353, 556, 394, 340, 232, 299, 585, 286, 205, 643, 124, 562, 182, 401, 535, 211, 354, 776, 185, 327, 586, 396, 301, 206, 672, 111, 344, 645, 564, 402, 240, 307, 593, 213, 186, 356, 539, 159, 302, 588, 331, 646, 417, 551, 784, 227, 594, 404, 309, 649, 214, 568, 119, 188, 541, 217, 360, 333, 418, 704, 771, 609, 391, 310, 650, 229, 596, 555, 339, 175, 408, 542, 313, 218, 123, 657, 334, 800, 610, 420, 773, 230, 449, 583, 368, 652, 557, 395, 341, 314, 233, 600, 220, 287, 658, 125, 563, 774, 183, 612, 450, 355, 424, 558, 777, 342, 234, 587, 397, 316, 207, 673, 126, 345, 660, 565, 403, 832, 241, 452, 778, 187, 357, 616, 398, 236, 303, 589, 674, 346, 647, 432, 566, 785, 242, 595, 405, 664, 215, 358, 569, 780, 189, 456, 590, 361, 676, 348, 419, 786, 705, 624, 406, 244, 311, 651, 597, 570, 190, 409, 543, 219, 362, 896, 335, 801, 706, 611, 421, 788, 680, 231, 464, 598, 369, 653, 572, 410, 248, 315, 601, 221, 364, 659, 802, 422, 708, 775, 613, 451, 370, 654, 425, 559, 792, 343, 235, 602, 412, 317, 222, 688, 127, 661, 804, 480, 614, 833, 453, 426, 372, 712, 779, 617, 399, 318, 237, 604, 675, 347, 662, 433, 567, 834, 243, 454, 665, 808, 359, 618, 428, 781, 238, 457, 591, 376, 677, 349, 434, 720, 787, 625, 407, 666, 836, 245, 571, 782, 191, 620, 458, 363, 678, 897, 350, 816, 707, 626, 436, 789, 681, 246, 465, 599, 668, 573, 411, 840, 249, 460, 898, 365, 736, 803, 423, 790, 709, 682, 628, 466, 371, 655, 440, 574, 793, 250, 603, 413, 223, 689, 366, 900, 805, 710, 481, 615, 848, 684, 468, 427, 794, 373, 713, 632, 414, 252, 319, 605, 690, 663, 806, 482, 835, 904, 455, 809, 374, 714, 619, 429, 796, 239, 472, 606, 377, 692, 435, 721, 864, 484, 667, 837, 810, 430, 716, 783, 621, 459, 378, 679, 912, 351, 817, 722, 627, 437, 696, 838, 247, 669, 812, 488, 622, 841, 461, 899, 380, 818, 737, 438, 724, 791, 683, 629, 467, 670, 441, 575, 842, 251, 462, 928, 367, 738, 901, 820, 711, 496, 630, 849, 685, 469, 442, 728, 795, 633, 415, 844, 253, 691, 902, 740, 807, 483, 850, 686, 905, 470, 824, 375, 715, 634, 444, 797, 254, 473, 607, 693, 960, 865, 906, 485, 852, 744, 811, 431, 798, 717, 636, 474, 379, 694, 913, 723, 866, 486, 697, 839, 908, 813, 718, 489, 623, 856, 476, 914, 381, 752, 819, 439, 725, 698, 868, 671, 814, 490, 843, 463, 929, 382, 739, 916, 821, 726, 497, 631, 700, 443, 729, 872, 492, 845, 930, 903, 822, 741, 498, 851, 687, 920, 471, 825, 730, 635, 445, 846, 255, 932, 742, 961, 880, 500, 907, 853, 826, 745, 446, 732, 799, 637, 475, 695, 962, 867, 936, 487, 854, 746, 909, 828, 719, 504, 638, 857, 477, 915, 753, 964, 699, 869, 910, 748, 815, 491, 858, 478, 944, 383, 754, 917, 727, 870, 701, 968, 873, 493, 860, 931, 918, 756, 823, 499, 702, 921, 731, 874, 494, 847, 933, 743, 976, 881, 922, 501, 760, 827, 447, 733, 876, 934, 963, 882, 937, 502, 855, 747, 924, 829, 734, 505, 639, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 952, 503, 762, 925, 735, 878, 993, 980, 939, 885, 926, 764, 831, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q7_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 192, 259, 97, 138, 84, 43, 30, 145, 288, 98, 261, 520, 71, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 384, 518, 289, 194, 99, 276, 168, 521, 86, 141, 60, 89, 147, 290, 576, 196, 263, 522, 101, 142, 47, 280, 90, 176, 529, 149, 292, 102, 321, 524, 200, 267, 105, 92, 163, 530, 150, 55, 322, 153, 296, 106, 269, 640, 79, 545, 165, 532, 208, 275, 113, 154, 324, 59, 270, 108, 546, 166, 385, 519, 304, 195, 114, 277, 169, 536, 87, 156, 61, 328, 548, 386, 224, 291, 577, 278, 197, 170, 116, 523, 143, 62, 281, 91, 177, 768, 578, 388, 293, 198, 552, 103, 336, 172, 525, 282, 201, 120, 93, 178, 531, 151, 294, 580, 323, 392, 526, 297, 202, 107, 284, 641, 94, 560, 180, 533, 209, 352, 155, 325, 298, 584, 204, 271, 642, 109, 547, 167, 400, 534, 305, 210, 115, 184, 326, 537, 157, 300, 110, 329, 644, 549, 387, 306, 225, 592, 212, 279, 171, 538, 117, 158, 63, 330, 416, 550, 769, 226, 579, 389, 308, 648, 199, 553, 118, 337, 173, 540, 216, 283, 121, 332, 179, 770, 608, 390, 228, 295, 581, 554, 338, 174, 393, 527, 312, 203, 122, 285, 656, 95, 561, 181, 772, 448, 582, 353, 556, 394, 340, 232, 299, 585, 286, 205, 643, 124, 562, 182, 401, 535, 211, 354, 185, 776, 327, 586, 396, 301, 206, 672, 111, 344, 645, 564, 402, 240, 307, 593, 213, 186, 356, 539, 159, 302, 588, 331, 646, 417, 551, 784, 227, 594, 404, 309, 649, 214, 568, 119, 188, 541, 217, 360, 333, 418, 704, 771, 609, 391, 310, 650, 229, 596, 555, 339, 175, 408, 542, 313, 218, 123, 657, 334, 800, 610, 420, 773, 230, 449, 583, 368, 652, 557, 395, 341, 314, 233, 600, 220, 287, 658, 125, 563, 183, 774, 612, 450, 355, 424, 558, 777, 342, 234, 587, 397, 316, 207, 673, 126, 345, 660, 565, 403, 241, 832, 452, 187, 778, 357, 616, 398, 236, 303, 589, 674, 346, 647, 432, 566, 785, 242, 595, 405, 664, 215, 358, 569, 189, 780, 456, 590, 361, 676, 348, 419, 786, 705, 624, 406, 244, 311, 651, 597, 570, 190, 409, 543, 219, 362, 896, 335, 801, 706, 611, 421, 788, 680, 231, 464, 598, 369, 653, 572, 410, 248, 315, 601, 221, 364, 659, 802, 422, 708, 775, 613, 451, 370, 654, 425, 559, 792, 343, 235, 602, 412, 317, 222, 688, 127, 661, 804, 480, 614, 833, 453, 426, 372, 712, 779, 617, 399, 318, 237, 604, 675, 347, 662, 433, 567, 243, 834, 454, 665, 808, 359, 618, 428, 781, 238, 457, 591, 376, 677, 349, 434, 720, 787, 625, 407, 666, 245, 836, 571, 191, 782, 620, 458, 363, 678, 897, 350, 816, 707, 626, 436, 789, 681, 246, 465, 599, 668, 573, 411, 249, 840, 460, 898, 365, 736, 803, 423, 790, 709, 682, 628, 466, 371, 655, 440, 574, 793, 250, 603, 413, 223, 689, 366, 900, 805, 710, 481, 615, 848, 684, 468, 427, 794, 373, 713, 632, 414, 252, 319, 605, 690, 663, 806, 482, 835, 904, 455, 809, 374, 714, 619, 429, 796, 239, 472, 606, 377, 692, 435, 721, 864, 484, 667, 837, 810, 430, 716, 783, 621, 459, 378, 679, 912, 351, 817, 722, 627, 437, 696, 247, 838, 669, 812, 488, 622, 841, 461, 899, 380, 818, 737, 438, 724, 791, 683, 629, 467, 670, 441, 575, 251, 842, 462, 928, 367, 738, 901, 820, 711, 496, 630, 849, 685, 469, 442, 728, 795, 633, 415, 253, 844, 691, 902, 740, 807, 483, 850, 686, 905, 470, 824, 375, 715, 634, 444, 797, 254, 473, 607, 693, 960, 865, 906, 485, 852, 744, 811, 431, 798, 717, 636, 474, 379, 694, 913, 723, 866, 486, 697, 839, 908, 813, 718, 489, 623, 856, 476, 914, 381, 752, 819, 439, 725, 698, 868, 671, 814, 490, 843, 463, 929, 382, 739, 916, 821, 726, 497, 631, 700, 443, 729, 872, 492, 845, 930, 903, 822, 741, 498, 851, 687, 920, 471, 825, 730, 635, 445, 255, 846, 932, 742, 961, 880, 500, 907, 853, 826, 745, 446, 732, 799, 637, 475, 695, 962, 867, 936, 487, 854, 746, 909, 828, 719, 504, 638, 857, 477, 915, 753, 964, 699, 869, 910, 748, 815, 491, 858, 478, 944, 383, 754, 917, 727, 870, 701, 968, 873, 493, 860, 931, 918, 756, 823, 499, 702, 921, 731, 874, 494, 847, 933, 743, 976, 881, 922, 501, 760, 827, 447, 733, 876, 934, 963, 882, 937, 502, 855, 747, 924, 829, 734, 505, 639, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 952, 503, 762, 925, 735, 878, 993, 980, 939, 885, 926, 764, 831, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q71_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 520, 71, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 640, 79, 545, 165, 532, 275, 208, 113, 154, 324, 59, 270, 108, 546, 166, 519, 385, 304, 195, 114, 277, 169, 536, 87, 156, 61, 328, 548, 386, 291, 224, 577, 278, 197, 170, 116, 523, 143, 62, 281, 91, 177, 768, 578, 388, 293, 198, 552, 103, 336, 172, 525, 282, 201, 120, 93, 178, 531, 151, 294, 580, 323, 526, 392, 297, 202, 107, 284, 641, 94, 560, 180, 533, 209, 352, 155, 325, 298, 584, 271, 204, 642, 109, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 769, 226, 579, 389, 308, 648, 199, 118, 553, 337, 173, 540, 283, 216, 121, 332, 179, 770, 608, 390, 295, 228, 581, 554, 338, 174, 527, 393, 312, 203, 122, 285, 656, 95, 561, 181, 772, 582, 448, 353, 556, 394, 340, 299, 232, 585, 286, 205, 643, 124, 562, 182, 535, 401, 211, 354, 185, 776, 327, 586, 396, 301, 206, 672, 111, 344, 645, 564, 402, 307, 240, 593, 213, 186, 356, 539, 159, 302, 588, 331, 646, 551, 417, 784, 227, 594, 404, 309, 214, 649, 568, 119, 188, 541, 217, 360, 333, 418, 771, 704, 609, 391, 310, 229, 650, 596, 555, 339, 175, 542, 408, 313, 218, 123, 334, 657, 800, 610, 420, 773, 230, 583, 449, 368, 652, 557, 395, 341, 314, 233, 600, 287, 220, 658, 125, 563, 183, 774, 612, 450, 355, 558, 424, 342, 777, 234, 587, 397, 316, 207, 673, 126, 345, 660, 565, 403, 241, 832, 452, 187, 357, 778, 616, 398, 303, 236, 589, 674, 346, 647, 566, 432, 785, 242, 595, 405, 664, 215, 358, 569, 189, 780, 590, 456, 361, 676, 348, 419, 786, 705, 624, 406, 311, 244, 651, 597, 570, 190, 543, 409, 219, 362, 896, 335, 801, 706, 611, 421, 788, 680, 231, 598, 464, 369, 653, 572, 410, 315, 248, 601, 221, 364, 659, 802, 422, 775, 708, 613, 451, 370, 654, 559, 425, 792, 343, 235, 602, 412, 317, 222, 688, 127, 661, 804, 614, 480, 833, 453, 426, 372, 779, 712, 617, 399, 318, 237, 604, 675, 347, 662, 567, 433, 243, 834, 454, 665, 808, 359, 618, 428, 781, 238, 591, 457, 376, 677, 349, 434, 787, 720, 625, 407, 245, 666, 836, 571, 191, 782, 620, 458, 363, 678, 897, 350, 816, 707, 626, 436, 789, 246, 681, 599, 465, 668, 573, 411, 249, 840, 460, 898, 365, 803, 736, 423, 790, 709, 682, 628, 466, 371, 655, 574, 440, 793, 250, 603, 413, 223, 366, 689, 900, 805, 710, 615, 481, 848, 684, 468, 427, 373, 794, 713, 632, 414, 319, 252, 605, 690, 663, 806, 482, 835, 904, 455, 374, 809, 714, 619, 429, 796, 239, 606, 472, 377, 692, 435, 721, 864, 484, 667, 837, 810, 430, 783, 716, 621, 459, 378, 679, 912, 351, 817, 722, 627, 437, 696, 247, 838, 669, 812, 622, 488, 841, 461, 899, 380, 818, 737, 438, 791, 724, 683, 629, 467, 670, 575, 441, 251, 842, 462, 928, 367, 738, 901, 820, 711, 630, 496, 849, 685, 469, 442, 795, 728, 633, 415, 253, 844, 691, 902, 807, 740, 483, 850, 686, 470, 905, 824, 375, 715, 634, 444, 797, 254, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 914, 381, 819, 752, 439, 725, 698, 868, 671, 814, 490, 843, 463, 929, 382, 739, 916, 821, 726, 631, 497, 700, 443, 729, 872, 492, 845, 930, 903, 822, 741, 498, 851, 687, 920, 471, 825, 730, 635, 445, 255, 846, 932, 742, 961, 880, 500, 907, 853, 826, 745, 446, 799, 732, 637, 475, 695, 962, 867, 936, 487, 854, 746, 909, 828, 719, 638, 504, 857, 477, 915, 753, 964, 699, 869, 910, 815, 748, 491, 858, 478, 944, 383, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 952, 503, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q72_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 520, 71, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 640, 79, 545, 165, 532, 275, 208, 113, 154, 324, 59, 270, 108, 546, 166, 519, 385, 304, 195, 114, 277, 169, 536, 87, 156, 61, 328, 548, 386, 291, 224, 577, 278, 197, 170, 116, 523, 143, 62, 281, 91, 177, 768, 578, 388, 293, 198, 552, 103, 336, 172, 525, 282, 201, 120, 93, 178, 531, 151, 294, 580, 323, 526, 392, 297, 202, 107, 284, 641, 94, 560, 180, 533, 209, 352, 155, 325, 298, 584, 271, 204, 642, 109, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 769, 226, 579, 389, 308, 648, 199, 118, 553, 337, 173, 540, 283, 216, 121, 332, 179, 770, 608, 390, 295, 228, 581, 554, 338, 174, 527, 393, 312, 203, 122, 285, 656, 95, 561, 181, 772, 582, 448, 353, 556, 394, 340, 299, 232, 585, 286, 205, 124, 643, 562, 182, 535, 401, 211, 354, 185, 776, 327, 586, 396, 301, 206, 672, 111, 344, 645, 564, 402, 307, 240, 593, 213, 186, 356, 539, 159, 302, 588, 331, 646, 551, 417, 784, 227, 594, 404, 309, 214, 649, 568, 119, 188, 541, 217, 360, 333, 418, 771, 704, 609, 391, 310, 229, 650, 596, 555, 339, 175, 542, 408, 313, 218, 123, 334, 657, 800, 610, 420, 773, 230, 583, 449, 368, 652, 557, 395, 341, 314, 233, 600, 287, 220, 658, 125, 563, 183, 774, 612, 450, 355, 558, 424, 342, 777, 234, 587, 397, 316, 207, 673, 126, 345, 660, 565, 403, 241, 832, 452, 187, 357, 778, 616, 398, 303, 236, 589, 674, 346, 647, 566, 432, 785, 242, 595, 405, 664, 215, 358, 569, 189, 780, 590, 456, 361, 676, 348, 419, 786, 705, 624, 406, 311, 244, 651, 597, 570, 190, 543, 409, 219, 362, 896, 335, 801, 706, 611, 421, 788, 680, 231, 598, 464, 369, 653, 572, 410, 315, 248, 601, 221, 364, 659, 802, 422, 775, 708, 613, 451, 370, 654, 559, 425, 792, 343, 235, 602, 412, 317, 222, 688, 127, 661, 804, 614, 480, 833, 453, 426, 372, 779, 712, 617, 399, 318, 237, 604, 675, 347, 662, 567, 433, 243, 834, 454, 665, 808, 359, 618, 428, 781, 238, 591, 457, 376, 677, 349, 434, 787, 720, 625, 407, 245, 666, 836, 571, 191, 782, 620, 458, 363, 678, 897, 350, 816, 707, 626, 436, 789, 246, 681, 599, 465, 668, 573, 411, 249, 840, 460, 898, 365, 803, 736, 423, 790, 709, 682, 628, 466, 371, 655, 574, 440, 793, 250, 603, 413, 223, 366, 689, 900, 805, 710, 615, 481, 848, 684, 468, 427, 373, 794, 713, 632, 414, 319, 252, 605, 690, 663, 806, 482, 835, 904, 455, 374, 809, 714, 619, 429, 796, 239, 606, 472, 377, 692, 435, 721, 864, 484, 667, 837, 810, 430, 783, 716, 621, 459, 378, 679, 912, 351, 817, 722, 627, 437, 696, 247, 838, 669, 812, 622, 488, 841, 461, 380, 899, 818, 737, 438, 791, 724, 683, 629, 467, 670, 575, 441, 251, 842, 462, 928, 367, 738, 901, 820, 711, 630, 496, 849, 685, 469, 442, 795, 728, 633, 415, 253, 844, 691, 902, 807, 740, 483, 850, 686, 470, 905, 824, 375, 715, 634, 444, 797, 254, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 914, 381, 819, 752, 439, 725, 698, 868, 671, 814, 490, 843, 463, 929, 382, 739, 916, 821, 726, 631, 497, 700, 443, 729, 872, 492, 845, 930, 903, 822, 741, 498, 851, 687, 920, 471, 825, 730, 635, 445, 255, 846, 932, 742, 961, 880, 500, 907, 853, 826, 745, 446, 799, 732, 637, 475, 695, 962, 867, 936, 487, 854, 746, 909, 828, 719, 638, 504, 857, 477, 915, 753, 964, 699, 869, 910, 815, 748, 491, 858, 478, 944, 383, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 952, 503, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q73_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 640, 79, 545, 165, 532, 275, 208, 113, 154, 324, 59, 270, 108, 546, 166, 519, 385, 304, 195, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 769, 226, 579, 389, 308, 199, 648, 118, 553, 337, 173, 540, 283, 216, 121, 332, 179, 770, 608, 390, 295, 228, 581, 554, 338, 174, 527, 393, 312, 203, 122, 285, 656, 95, 561, 181, 772, 582, 448, 353, 556, 394, 340, 299, 232, 585, 286, 205, 124, 643, 562, 182, 535, 401, 211, 354, 185, 327, 776, 586, 396, 301, 206, 672, 111, 344, 645, 564, 402, 307, 240, 593, 213, 186, 356, 539, 159, 302, 588, 331, 646, 551, 417, 784, 227, 594, 404, 309, 214, 649, 119, 568, 188, 541, 217, 360, 333, 418, 771, 704, 609, 391, 310, 229, 650, 596, 555, 339, 175, 542, 408, 313, 218, 123, 334, 657, 800, 610, 420, 773, 230, 583, 449, 368, 652, 557, 395, 341, 314, 233, 600, 287, 220, 125, 658, 563, 183, 774, 612, 450, 355, 558, 424, 342, 777, 234, 587, 397, 316, 207, 126, 673, 345, 660, 565, 403, 241, 832, 452, 187, 357, 778, 616, 398, 303, 236, 589, 674, 346, 647, 566, 432, 785, 242, 595, 405, 215, 664, 358, 569, 189, 780, 590, 456, 361, 676, 348, 419, 786, 705, 624, 406, 311, 244, 651, 597, 570, 190, 543, 409, 219, 362, 896, 335, 801, 706, 611, 421, 788, 231, 680, 598, 464, 369, 653, 572, 410, 315, 248, 601, 221, 364, 659, 802, 422, 775, 708, 613, 451, 370, 654, 559, 425, 343, 792, 235, 602, 412, 317, 222, 688, 127, 661, 804, 614, 480, 833, 453, 426, 372, 779, 712, 617, 399, 318, 237, 604, 675, 347, 662, 567, 433, 243, 834, 454, 665, 359, 808, 618, 428, 781, 238, 591, 457, 376, 677, 349, 434, 787, 720, 625, 407, 245, 666, 836, 571, 191, 782, 620, 458, 363, 678, 350, 897, 816, 707, 626, 436, 789, 246, 681, 599, 465, 668, 573, 411, 249, 840, 460, 365, 898, 803, 736, 423, 790, 709, 682, 628, 466, 371, 655, 574, 440, 793, 250, 603, 413, 223, 366, 689, 900, 805, 710, 615, 481, 848, 684, 468, 427, 373, 794, 713, 632, 414, 319, 252, 605, 690, 663, 806, 482, 835, 455, 904, 374, 809, 714, 619, 429, 796, 239, 606, 472, 377, 692, 435, 721, 864, 484, 667, 837, 810, 430, 783, 716, 621, 459, 378, 679, 912, 351, 817, 722, 627, 437, 247, 696, 838, 669, 812, 622, 488, 841, 461, 380, 899, 818, 737, 438, 791, 724, 683, 629, 467, 670, 575, 441, 251, 842, 462, 928, 367, 738, 901, 820, 711, 630, 496, 849, 685, 469, 442, 795, 728, 633, 415, 253, 844, 691, 902, 807, 740, 483, 850, 686, 470, 905, 375, 824, 715, 634, 444, 797, 254, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 828, 719, 638, 504, 857, 477, 915, 753, 964, 699, 869, 910, 815, 748, 491, 858, 478, 944, 383, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q74_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 324, 59, 270, 108, 546, 166, 519, 385, 304, 195, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 769, 226, 579, 389, 308, 199, 648, 118, 553, 337, 173, 540, 283, 216, 121, 332, 179, 770, 608, 390, 295, 228, 581, 554, 338, 174, 527, 393, 312, 203, 122, 285, 95, 656, 561, 181, 772, 582, 448, 353, 556, 394, 340, 299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 784, 227, 594, 404, 309, 214, 649, 119, 568, 188, 541, 217, 360, 333, 418, 771, 704, 609, 391, 310, 229, 650, 596, 555, 339, 175, 542, 408, 313, 218, 123, 334, 657, 800, 610, 420, 773, 230, 583, 449, 368, 652, 557, 395, 341, 314, 233, 600, 287, 220, 125, 658, 563, 183, 774, 612, 450, 355, 558, 424, 342, 777, 234, 587, 397, 316, 207, 126, 673, 345, 660, 565, 403, 241, 832, 452, 187, 357, 778, 616, 398, 303, 236, 589, 674, 346, 647, 566, 432, 785, 242, 595, 405, 215, 664, 358, 569, 189, 780, 590, 456, 361, 676, 348, 419, 786, 705, 624, 406, 311, 244, 651, 597, 570, 190, 543, 409, 219, 362, 335, 896, 801, 706, 611, 421, 788, 231, 680, 598, 464, 369, 653, 572, 410, 315, 248, 601, 221, 364, 659, 802, 422, 775, 708, 613, 451, 370, 654, 559, 425, 343, 792, 235, 602, 412, 317, 222, 127, 688, 661, 804, 614, 480, 833, 453, 426, 372, 779, 712, 617, 399, 318, 237, 604, 675, 347, 662, 567, 433, 243, 834, 454, 665, 359, 808, 618, 428, 781, 238, 591, 457, 376, 677, 349, 434, 787, 720, 625, 407, 245, 666, 836, 571, 191, 782, 620, 458, 363, 678, 350, 897, 816, 707, 626, 436, 789, 246, 681, 599, 465, 668, 573, 411, 249, 840, 460, 365, 898, 803, 736, 423, 790, 709, 682, 628, 466, 371, 655, 574, 440, 793, 250, 603, 413, 223, 366, 689, 900, 805, 710, 615, 481, 848, 684, 468, 427, 373, 794, 713, 632, 414, 319, 252, 605, 690, 663, 806, 482, 835, 455, 904, 374, 809, 714, 619, 429, 796, 239, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724, 683, 629, 467, 670, 575, 441, 251, 842, 462, 367, 928, 738, 901, 820, 711, 630, 496, 849, 685, 469, 442, 795, 728, 633, 415, 253, 844, 691, 902, 807, 740, 483, 850, 686, 470, 905, 375, 824, 715, 634, 444, 797, 254, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 828, 719, 638, 504, 857, 477, 915, 753, 964, 699, 869, 910, 815, 748, 491, 858, 478, 944, 383, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q75_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 324, 59, 270, 108, 546, 166, 519, 385, 304, 195, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 226, 769, 579, 389, 308, 199, 648, 118, 553, 337, 173, 540, 283, 216, 121, 332, 179, 770, 608, 390, 295, 228, 581, 554, 338, 174, 527, 393, 312, 203, 122, 285, 95, 656, 561, 181, 772, 582, 448, 353, 556, 394, 340, 299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 227, 784, 594, 404, 309, 214, 649, 119, 568, 188, 541, 217, 360, 333, 418, 771, 704, 609, 391, 310, 229, 650, 596, 555, 339, 175, 542, 408, 313, 218, 123, 334, 657, 800, 610, 420, 230, 773, 583, 449, 368, 652, 557, 395, 341, 314, 233, 600, 287, 220, 125, 658, 563, 183, 774, 612, 450, 355, 558, 424, 342, 234, 777, 587, 397, 316, 207, 126, 673, 345, 660, 565, 403, 241, 832, 452, 187, 357, 778, 616, 398, 303, 236, 589, 674, 346, 647, 566, 432, 242, 785, 595, 405, 215, 664, 358, 569, 189, 780, 590, 456, 361, 676, 348, 419, 786, 705, 624, 406, 311, 244, 651, 597, 570, 190, 543, 409, 219, 362, 335, 896, 801, 706, 611, 421, 231, 788, 680, 598, 464, 369, 653, 572, 410, 315, 248, 601, 221, 364, 659, 802, 422, 775, 708, 613, 451, 370, 654, 559, 425, 343, 235, 792, 602, 412, 317, 222, 127, 688, 661, 804, 614, 480, 833, 453, 426, 372, 779, 712, 617, 399, 318, 237, 604, 675, 347, 662, 567, 433, 243, 834, 454, 665, 359, 808, 618, 428, 238, 781, 591, 457, 376, 677, 349, 434, 787, 720, 625, 407, 245, 666, 836, 571, 191, 782, 620, 458, 363, 678, 350, 897, 816, 707, 626, 436, 246, 789, 681, 599, 465, 668, 573, 411, 249, 840, 460, 365, 898, 803, 736, 423, 790, 709, 682, 628, 466, 371, 655, 574, 440, 250, 793, 603, 413, 223, 366, 689, 900, 805, 710, 615, 481, 848, 684, 468, 427, 373, 794, 713, 632, 414, 319, 252, 605, 690, 663, 806, 482, 835, 455, 904, 374, 809, 714, 619, 429, 239, 796, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724, 683, 629, 467, 670, 575, 441, 251, 842, 462, 367, 928, 738, 901, 820, 711, 630, 496, 849, 685, 469, 442, 795, 728, 633, 415, 253, 844, 691, 902, 807, 740, 483, 850, 686, 470, 905, 375, 824, 715, 634, 444, 254, 797, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 828, 719, 638, 504, 857, 477, 915, 753, 964, 699, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q76_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 226, 769, 579, 389, 199, 308, 118, 648, 553, 337, 173, 540, 283, 216, 121, 332, 179, 770, 390, 608, 295, 228, 581, 554, 338, 174, 527, 393, 203, 312, 122, 285, 95, 656, 561, 181, 772, 582, 448, 353, 556, 394, 340, 299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 227, 784, 594, 404, 309, 214, 119, 649, 568, 188, 541, 217, 360, 333, 418, 771, 704, 391, 609, 310, 229, 650, 596, 555, 339, 175, 542, 408, 313, 218, 123, 334, 657, 800, 610, 420, 230, 773, 583, 449, 368, 652, 557, 395, 341, 314, 233, 600, 287, 220, 125, 658, 563, 183, 774, 612, 450, 355, 558, 424, 342, 234, 777, 587, 397, 207, 316, 126, 673, 345, 660, 565, 403, 241, 832, 187, 452, 357, 778, 398, 616, 303, 236, 589, 674, 346, 647, 566, 432, 242, 785, 595, 405, 215, 664, 358, 569, 189, 780, 590, 456, 361, 676, 348, 419, 786, 705, 406, 624, 311, 244, 651, 597, 570, 190, 543, 409, 219, 362, 335, 896, 801, 706, 611, 421, 231, 788, 680, 598, 464, 369, 653, 572, 410, 315, 248, 601, 221, 364, 659, 802, 422, 775, 708, 613, 451, 370, 654, 559, 425, 343, 235, 792, 602, 412, 317, 222, 127, 688, 661, 804, 614, 480, 833, 453, 426, 372, 779, 712, 399, 617, 318, 237, 604, 675, 347, 662, 567, 433, 243, 834, 454, 665, 359, 808, 618, 428, 238, 781, 591, 457, 376, 677, 349, 434, 787, 720, 407, 625, 245, 666, 571, 836, 191, 782, 620, 458, 363, 678, 350, 897, 707, 816, 626, 436, 246, 789, 681, 599, 465, 668, 573, 411, 249, 840, 460, 365, 898, 803, 736, 423, 790, 709, 682, 628, 466, 371, 655, 574, 440, 250, 793, 603, 413, 223, 366, 689, 900, 805, 710, 615, 481, 848, 684, 468, 427, 373, 794, 713, 414, 632, 319, 252, 605, 690, 663, 806, 482, 835, 455, 374, 904, 809, 714, 619, 429, 239, 796, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724, 683, 629, 467, 670, 575, 441, 251, 842, 462, 367, 928, 738, 901, 711, 820, 630, 496, 849, 685, 469, 442, 795, 728, 415, 633, 253, 844, 691, 902, 807, 740, 483, 850, 686, 470, 375, 905, 715, 824, 634, 444, 254, 797, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q77_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 226, 769, 579, 389, 199, 308, 118, 648, 553, 337, 173, 540, 283, 216, 121, 179, 332, 770, 390, 608, 295, 228, 581, 554, 338, 174, 527, 393, 203, 312, 122, 285, 95, 656, 561, 181, 772, 582, 448, 353, 556, 394, 340, 299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 227, 784, 594, 404, 309, 214, 119, 649, 568, 188, 541, 217, 360, 333, 418, 771, 704, 391, 609, 310, 229, 650, 596, 555, 339, 175, 542, 408, 313, 218, 123, 334, 657, 800, 610, 420, 230, 773, 583, 449, 368, 652, 557, 395, 341, 314, 233, 600, 287, 220, 125, 658, 563, 183, 774, 612, 450, 355, 558, 424, 342, 234, 777, 587, 397, 207, 316, 126, 673, 345, 660, 565, 403, 241, 832, 187, 452, 357, 778, 398, 616, 303, 236, 589, 674, 346, 647, 566, 432, 242, 785, 595, 405, 215, 358, 664, 569, 189, 780, 590, 456, 361, 676, 348, 419, 786, 705, 406, 624, 311, 244, 651, 597, 570, 190, 543, 409, 219, 362, 335, 896, 801, 706, 611, 421, 231, 788, 680, 598, 464, 369, 653, 572, 410, 315, 248, 601, 221, 364, 659, 802, 422, 775, 708, 613, 451, 370, 654, 559, 425, 343, 235, 792, 602, 412, 317, 222, 127, 688, 661, 804, 614, 480, 833, 453, 426, 372, 779, 712, 399, 617, 318, 237, 604, 675, 347, 662, 567, 433, 243, 834, 454, 359, 665, 808, 618, 428, 238, 781, 591, 457, 376, 677, 349, 434, 787, 720, 407, 625, 245, 666, 571, 836, 191, 782, 620, 458, 363, 678, 350, 897, 707, 816, 626, 436, 246, 789, 681, 599, 465, 668, 573, 411, 249, 840, 460, 365, 898, 803, 736, 423, 790, 709, 682, 628, 466, 371, 655, 574, 440, 250, 793, 603, 413, 223, 366, 689, 900, 805, 710, 615, 481, 848, 684, 468, 427, 373, 794, 713, 414, 632, 319, 252, 605, 690, 663, 806, 482, 835, 455, 374, 904, 809, 714, 619, 429, 239, 796, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724, 683, 629, 467, 670, 575, 441, 251, 842, 462, 367, 928, 738, 901, 711, 820, 630, 496, 849, 685, 469, 442, 795, 728, 415, 633, 253, 691, 844, 902, 807, 740, 483, 850, 686, 470, 375, 905, 715, 824, 634, 444, 254, 797, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q78_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 84, 43, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 168, 86, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 169, 87, 536, 156, 61, 328, 548, 386, 291, 224, 577, 278, 197, 170, 116, 523, 143, 62, 281, 91, 177, 768, 578, 388, 293, 198, 103, 552, 336, 172, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 226, 769, 579, 389, 199, 308, 118, 648, 553, 337, 173, 540, 283, 216, 121, 179, 332, 770, 390, 608, 295, 228, 581, 554, 338, 174, 527, 393, 203, 312, 122, 285, 95, 656, 561, 181, 772, 582, 448, 353, 556, 394, 340, 299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 227, 784, 594, 404, 309, 214, 119, 649, 568, 188, 541, 217, 360, 333, 418, 771, 704, 391, 609, 310, 229, 650, 596, 555, 339, 175, 542, 408, 313, 218, 123, 334, 657, 800, 610, 420, 230, 773, 583, 449, 368, 652, 557, 395, 341, 314, 233, 600, 287, 220, 125, 658, 563, 183, 774, 612, 450, 355, 558, 424, 342, 234, 777, 587, 397, 207, 316, 126, 673, 345, 660, 565, 403, 241, 187, 832, 452, 357, 778, 398, 616, 303, 236, 589, 674, 346, 647, 566, 432, 242, 785, 595, 405, 215, 358, 664, 569, 189, 780, 590, 456, 361, 676, 348, 419, 786, 705, 406, 624, 311, 244, 651, 597, 570, 190, 543, 409, 219, 362, 335, 896, 801, 706, 611, 421, 231, 788, 680, 598, 464, 369, 653, 572, 410, 315, 248, 601, 221, 364, 659, 802, 422, 775, 708, 613, 451, 370, 654, 559, 425, 343, 235, 792, 602, 412, 317, 222, 127, 688, 661, 804, 614, 480, 833, 453, 426, 372, 779, 712, 399, 617, 318, 237, 604, 675, 347, 662, 567, 433, 243, 834, 454, 359, 665, 808, 618, 428, 238, 781, 591, 457, 376, 677, 349, 434, 787, 720, 407, 625, 245, 666, 571, 191, 836, 782, 620, 458, 363, 678, 350, 897, 707, 816, 626, 436, 246, 789, 681, 599, 465, 668, 573, 411, 249, 840, 460, 365, 898, 803, 736, 423, 790, 709, 682, 628, 466, 371, 655, 574, 440, 250, 793, 603, 413, 223, 366, 689, 900, 805, 710, 615, 481, 848, 684, 468, 427, 373, 794, 713, 414, 632, 319, 252, 605, 690, 663, 806, 482, 835, 455, 374, 904, 809, 714, 619, 429, 239, 796, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724, 683, 629, 467, 670, 575, 441, 251, 842, 462, 367, 928, 738, 901, 711, 820, 630, 496, 849, 685, 469, 442, 795, 728, 415, 633, 253, 691, 844, 902, 807, 740, 483, 850, 686, 470, 375, 905, 715, 824, 634, 444, 254, 797, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 851, 687, 471, 920, 825, 730, 635, 445, 255, 846, 932, 742, 961, 880, 500, 907, 853, 826, 745, 446, 799, 732, 637, 475, 695, 962, 867, 487, 936, 854, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 937, 855, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q79_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 43, 84, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 86, 168, 521, 141, 60, 89, 147, 290, 576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 87, 169, 536, 156, 61, 328, 548, 386, 291, 224, 577, 278, 197, 170, 116, 523, 143, 62, 281, 91, 177, 768, 578, 388, 293, 198, 103, 552, 172, 336, 525, 282, 201, 120, 93, 178, 531, 151, 294, 580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 171, 212, 117, 538, 158, 63, 330, 550, 416, 226, 769, 579, 389, 199, 308, 118, 648, 553, 173, 337, 540, 283, 216, 121, 179, 332, 770, 390, 608, 295, 228, 581, 554, 174, 338, 527, 393, 203, 312, 122, 285, 95, 656, 561, 181, 772, 582, 448, 353, 556, 394, 299, 340, 232, 585, 286, 205, 124, 643, 562, 182, 535, 401, 211, 354, 185, 327, 776, 586, 396, 301, 206, 111, 344, 672, 645, 564, 402, 307, 240, 593, 213, 186, 356, 539, 159, 302, 588, 331, 646, 551, 417, 227, 784, 594, 404, 309, 214, 119, 649, 568, 188, 541, 217, 360, 333, 418, 771, 704, 391, 609, 310, 229, 650, 555, 596, 175, 339, 542, 408, 313, 218, 123, 334, 657, 800, 610, 420, 230, 773, 583, 449, 368, 652, 557, 395, 341, 314, 233, 600, 287, 220, 125, 658, 563, 183, 774, 612, 450, 355, 558, 342, 424, 234, 777, 587, 397, 207, 316, 126, 345, 673, 660, 565, 403, 241, 187, 832, 452, 357, 778, 398, 616, 303, 236, 589, 346, 674, 647, 566, 432, 242, 785, 595, 405, 215, 358, 664, 569, 189, 780, 590, 456, 361, 348, 676, 419, 786, 705, 406, 624, 311, 244, 651, 597, 570, 190, 543, 409, 219, 362, 335, 896, 801, 706, 611, 421, 231, 788, 598, 680, 464, 369, 653, 572, 410, 315, 248, 601, 221, 364, 659, 802, 422, 775, 708, 613, 451, 370, 654, 559, 343, 425, 235, 792, 602, 412, 317, 222, 127, 688, 661, 804, 614, 480, 833, 453, 426, 372, 779, 712, 399, 617, 318, 237, 604, 347, 675, 662, 567, 433, 243, 834, 454, 359, 665, 808, 618, 428, 238, 781, 591, 457, 376, 349, 677, 434, 787, 720, 407, 625, 245, 666, 571, 191, 836, 782, 620, 458, 363, 350, 678, 897, 707, 816, 626, 436, 246, 789, 599, 681, 465, 668, 573, 411, 249, 840, 460, 365, 898, 803, 736, 423, 790, 709, 682, 628, 466, 371, 655, 574, 440, 250, 793, 603, 413, 223, 366, 689, 900, 805, 710, 615, 481, 684, 848, 427, 468, 373, 794, 713, 414, 632, 319, 252, 605, 690, 663, 806, 482, 835, 455, 374, 904, 809, 714, 619, 429, 239, 796, 606, 472, 377, 692, 435, 721, 864, 484, 667, 837, 810, 430, 783, 716, 621, 459, 378, 351, 679, 912, 817, 722, 627, 437, 247, 696, 838, 669, 812, 622, 488, 841, 461, 380, 899, 818, 737, 438, 791, 683, 724, 629, 467, 670, 575, 441, 251, 842, 462, 367, 928, 738, 901, 711, 820, 630, 496, 685, 849, 469, 442, 795, 728, 415, 633, 253, 691, 844, 902, 807, 740, 483, 686, 850, 470, 375, 905, 715, 824, 634, 444, 254, 797, 607, 473, 693, 960, 865, 485, 906, 811, 852, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443, 729, 872, 492, 845, 930, 903, 822, 741, 498, 687, 851, 471, 920, 825, 730, 635, 445, 255, 846, 932, 742, 961, 880, 500, 907, 853, 826, 745, 446, 799, 732, 637, 475, 695, 962, 867, 487, 854, 936, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447, 733, 876, 934, 963, 882, 502, 855, 937, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 939, 980, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q80_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 43, 84, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 86, 168, 521, 141, 60, 89, 147, 290, 263, 576, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 87, 169, 536, 156, 61, 328, 548, 386, 291, 224, 577, 278, 197, 170, 116, 523, 143, 62, 281, 91, 177, 768, 578, 388, 293, 198, 103, 552, 172, 336, 525, 282, 201, 120, 93, 178, 531, 151, 294, 580, 323, 526, 392, 297, 202, 107, 284, 94, 641, 560, 180, 533, 209, 352, 155, 325, 298, 271, 584, 204, 109, 642, 547, 167, 534, 400, 305, 210, 115, 184, 326, 537, 157, 300, 110, 329, 644, 549, 387, 306, 225, 279, 592, 171, 212, 117, 538, 158, 63, 330, 550, 416, 226, 769, 579, 389, 199, 308, 118, 648, 553, 173, 337, 540, 283, 216, 121, 179, 332, 770, 390, 295, 608, 228, 581, 554, 174, 338, 527, 393, 203, 312, 122, 285, 95, 656, 561, 181, 772, 582, 448, 353, 556, 394, 299, 340, 232, 585, 286, 205, 124, 643, 562, 182, 535, 401, 211, 354, 185, 327, 776, 586, 396, 301, 206, 111, 344, 672, 645, 564, 402, 307, 240, 593, 213, 186, 356, 539, 159, 302, 588, 331, 646, 551, 417, 227, 784, 594, 404, 309, 214, 119, 649, 568, 188, 541, 217, 360, 333, 418, 771, 391, 704, 609, 310, 229, 650, 555, 596, 175, 339, 542, 408, 313, 218, 123, 334, 657, 800, 610, 420, 230, 773, 583, 449, 368, 652, 557, 395, 341, 314, 233, 287, 600, 220, 125, 658, 563, 183, 774, 612, 450, 355, 558, 342, 424, 234, 777, 587, 397, 207, 316, 126, 345, 673, 660, 565, 403, 241, 187, 832, 452, 357, 778, 398, 303, 616, 236, 589, 346, 674, 647, 566, 432, 242, 785, 595, 405, 215, 358, 664, 569, 189, 780, 590, 456, 361, 348, 676, 419, 786, 705, 406, 311, 624, 244, 651, 597, 570, 190, 543, 409, 219, 362, 335, 896, 801, 706, 611, 421, 231, 788, 598, 680, 464, 369, 653, 572, 410, 315, 248, 601, 221, 364, 659, 802, 422, 775, 708, 613, 451, 370, 654, 559, 343, 425, 235, 792, 602, 412, 317, 222, 127, 688, 661, 804, 614, 480, 833, 453, 426, 372, 779, 399, 712, 617, 318, 237, 604, 347, 675, 662, 567, 433, 243, 834, 454, 359, 665, 808, 618, 428, 238, 781, 591, 457, 376, 349, 677, 434, 787, 407, 720, 625, 245, 666, 571, 191, 836, 782, 620, 458, 363, 350, 678, 897, 707, 816, 626, 436, 246, 789, 599, 681, 465, 668, 573, 411, 249, 840, 460, 365, 898, 803, 423, 736, 790, 709, 682, 628, 466, 371, 655, 574, 440, 250, 793, 603, 413, 223, 366, 689, 900, 805, 710, 615, 481, 684, 848, 427, 468, 373, 794, 713, 414, 319, 632, 252, 605, 690, 663, 806, 482, 835, 455, 374, 904, 809, 714, 619, 429, 239, 796, 606, 472, 377, 692, 435, 721, 864, 484, 667, 837, 810, 430, 783, 716, 621, 459, 378, 351, 679, 912, 817, 722, 627, 437, 247, 696, 838, 669, 812, 622, 488, 841, 461, 380, 899, 818, 737, 438, 791, 683, 724, 629, 467, 670, 575, 441, 251, 842, 462, 367, 928, 738, 901, 711, 820, 630, 496, 685, 849, 469, 442, 795, 415, 728, 633, 253, 691, 844, 902, 807, 740, 483, 686, 850, 470, 375, 905, 715, 824, 634, 444, 254, 797, 607, 473, 693, 960, 865, 485, 906, 811, 852, 431, 744, 798, 717, 636, 474, 379, 694, 913, 723, 866, 486, 697, 839, 908, 813, 718, 623, 489, 856, 476, 381, 914, 819, 439, 752, 725, 698, 868, 671, 814, 490, 843, 463, 382, 929, 739, 916, 821, 726, 631, 497, 700, 443, 729, 872, 492, 845, 930, 903, 822, 741, 498, 687, 851, 471, 920, 825, 730, 635, 445, 255, 846, 932, 742, 961, 880, 500, 907, 853, 826, 745, 446, 799, 732, 637, 475, 695, 962, 867, 487, 854, 936, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 447, 760, 733, 876, 934, 963, 882, 502, 855, 937, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 939, 980, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q81_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 43, 84, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 86, 168, 521, 141, 60, 89, 147, 290, 263, 576, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 87, 169, 536, 156, 61, 328, 548, 386, 291, 224, 577, 278, 197, 170, 116, 523, 143, 62, 281, 91, 177, 768, 578, 388, 293, 198, 103, 552, 172, 336, 525, 282, 201, 120, 93, 178, 531, 151, 294, 580, 323, 526, 392, 297, 202, 107, 284, 94, 641, 560, 180, 533, 209, 352, 155, 325, 298, 271, 584, 204, 109, 642, 547, 167, 534, 400, 305, 210, 115, 184, 326, 537, 157, 300, 110, 329, 644, 549, 387, 306, 225, 279, 171, 592, 212, 117, 538, 158, 63, 330, 550, 416, 226, 769, 579, 389, 199, 308, 118, 648, 553, 173, 337, 540, 283, 216, 121, 179, 332, 770, 390, 295, 608, 228, 581, 554, 174, 338, 527, 393, 203, 312, 122, 285, 95, 656, 561, 181, 772, 582, 448, 353, 556, 394, 299, 340, 232, 585, 286, 205, 124, 643, 562, 182, 535, 401, 211, 354, 185, 327, 776, 586, 396, 301, 206, 111, 344, 672, 645, 564, 402, 307, 240, 593, 213, 186, 539, 356, 159, 302, 588, 331, 646, 551, 417, 227, 784, 594, 404, 309, 214, 119, 649, 568, 188, 541, 217, 360, 333, 418, 771, 391, 704, 609, 310, 229, 650, 555, 175, 596, 339, 542, 408, 313, 218, 123, 334, 657, 800, 610, 420, 230, 773, 583, 449, 368, 652, 557, 395, 341, 314, 233, 287, 600, 220, 125, 658, 563, 183, 774, 612, 450, 355, 558, 342, 424, 234, 777, 587, 397, 207, 316, 126, 345, 673, 660, 565, 403, 241, 187, 832, 452, 357, 778, 398, 303, 616, 236, 589, 346, 674, 647, 566, 432, 242, 785, 595, 405, 215, 358, 664, 569, 189, 780, 590, 456, 361, 348, 676, 419, 786, 705, 406, 311, 624, 244, 651, 597, 570, 190, 543, 409, 219, 362, 335, 896, 801, 706, 611, 421, 231, 788, 598, 680, 464, 369, 653, 572, 410, 315, 248, 601, 221, 364, 659, 802, 422, 775, 708, 613, 451, 370, 654, 559, 343, 425, 235, 792, 602, 412, 317, 222, 127, 688, 661, 804, 614, 480, 833, 453, 426, 372, 779, 399, 712, 617, 318, 237, 604, 347, 675, 662, 567, 433, 243, 834, 454, 359, 665, 808, 618, 428, 238, 781, 591, 457, 376, 349, 677, 434, 787, 407, 720, 625, 245, 666, 571, 191, 836, 782, 620, 458, 363, 350, 678, 897, 707, 816, 626, 436, 246, 789, 599, 681, 465, 668, 573, 411, 249, 840, 460, 365, 898, 803, 423, 736, 790, 709, 682, 628, 466, 371, 655, 574, 440, 250, 793, 603, 413, 223, 366, 689, 900, 805, 710, 615, 481, 684, 427, 848, 468, 373, 794, 713, 414, 319, 632, 252, 605, 690, 663, 806, 482, 835, 455, 374, 904, 809, 714, 619, 429, 239, 796, 606, 472, 377, 692, 435, 721, 864, 667, 484, 837, 810, 430, 783, 716, 621, 459, 378, 351, 679, 912, 817, 722, 627, 437, 247, 696, 838, 669, 812, 622, 488, 841, 461, 380, 899, 818, 737, 438, 791, 683, 724, 629, 467, 670, 575, 441, 251, 842, 462, 367, 928, 738, 901, 711, 820, 630, 496, 685, 849, 469, 442, 795, 415, 728, 633, 253, 691, 844, 902, 807, 740, 483, 686, 850, 470, 375, 905, 715, 824, 634, 444, 254, 797, 607, 473, 693, 960, 865, 485, 906, 811, 431, 852, 744, 798, 717, 636, 474, 379, 694, 913, 723, 866, 486, 697, 839, 908, 813, 718, 623, 489, 856, 476, 381, 914, 819, 439, 752, 725, 698, 868, 671, 814, 490, 843, 463, 382, 929, 739, 916, 821, 726, 631, 497, 700, 443, 729, 872, 492, 845, 930, 903, 822, 741, 498, 687, 851, 471, 920, 825, 730, 635, 445, 255, 846, 932, 742, 961, 880, 500, 907, 853, 826, 745, 446, 799, 732, 637, 475, 695, 962, 867, 487, 854, 936, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 447, 760, 733, 876, 934, 963, 882, 502, 855, 937, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 939, 980, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q82_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 43, 84, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 86, 168, 521, 141, 60, 89, 147, 290, 263, 576, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 87, 169, 536, 156, 61, 328, 548, 386, 291, 224, 278, 577, 197, 170, 116, 523, 143, 62, 281, 91, 177, 768, 578, 388, 293, 198, 103, 552, 172, 336, 525, 282, 201, 120, 93, 178, 531, 151, 294, 580, 323, 526, 392, 297, 202, 107, 284, 94, 641, 560, 180, 533, 209, 352, 155, 325, 298, 271, 584, 204, 109, 642, 547, 167, 534, 400, 305, 210, 115, 184, 326, 537, 157, 300, 110, 329, 644, 549, 387, 306, 225, 279, 171, 592, 212, 117, 538, 158, 63, 330, 550, 416, 226, 769, 579, 389, 199, 308, 118, 648, 553, 173, 337, 540, 283, 216, 121, 179, 332, 770, 390, 295, 608, 228, 581, 554, 174, 338, 527, 393, 203, 312, 122, 285, 95, 656, 561, 181, 772, 582, 448, 353, 556, 394, 299, 340, 232, 286, 585, 205, 124, 643, 562, 182, 535, 401, 211, 354, 185, 327, 776, 586, 396, 301, 206, 111, 344, 672, 645, 564, 402, 307, 240, 593, 213, 186, 539, 356, 159, 302, 588, 331, 646, 551, 417, 227, 784, 594, 404, 309, 214, 119, 649, 568, 188, 541, 217, 360, 333, 418, 771, 391, 704, 310, 609, 229, 650, 555, 175, 596, 339, 542, 408, 313, 218, 123, 334, 657, 800, 610, 420, 230, 773, 583, 449, 368, 652, 557, 395, 341, 314, 233, 287, 600, 220, 125, 658, 563, 183, 774, 612, 450, 355, 558, 342, 424, 234, 777, 587, 397, 207, 316, 126, 345, 673, 660, 565, 403, 241, 187, 832, 452, 357, 778, 398, 303, 616, 236, 589, 346, 674, 647, 566, 432, 242, 785, 595, 405, 215, 358, 664, 569, 189, 780, 590, 456, 361, 348, 676, 419, 786, 406, 705, 311, 624, 244, 651, 597, 570, 190, 543, 409, 219, 362, 335, 896, 801, 706, 611, 421, 231, 788, 598, 680, 464, 369, 653, 572, 410, 315, 248, 601, 221, 364, 659, 802, 422, 775, 708, 613, 451, 370, 654, 559, 343, 425, 235, 792, 602, 412, 317, 222, 127, 688, 661, 804, 614, 480, 833, 453, 426, 372, 779, 399, 712, 318, 617, 237, 604, 347, 675, 662, 567, 433, 243, 834, 454, 359, 665, 808, 618, 428, 238, 781, 591, 457, 376, 349, 677, 434, 787, 407, 720, 625, 245, 666, 571, 191, 836, 782, 620, 458, 363, 350, 678, 897, 707, 816, 626, 436, 246, 789, 599, 681, 465, 668, 573, 411, 249, 840, 460, 365, 898, 803, 423, 736, 790, 709, 682, 628, 466, 371, 655, 574, 440, 250, 793, 603, 413, 223, 366, 689, 900, 805, 710, 615, 481, 684, 427, 848, 468, 373, 794, 414, 713, 319, 632, 252, 605, 690, 663, 806, 482, 835, 455, 374, 904, 809, 714, 619, 429, 239, 796, 606, 472, 377, 692, 435, 721, 864, 667, 484, 837, 810, 430, 783, 716, 621, 459, 378, 351, 679, 912, 817, 722, 627, 437, 247, 696, 838, 669, 812, 622, 488, 841, 461, 380, 899, 818, 438, 737, 791, 683, 724, 629, 467, 670, 575, 441, 251, 842, 462, 367, 928, 738, 901, 711, 820, 630, 496, 685, 849, 469, 442, 795, 415, 728, 633, 253, 691, 844, 902, 807, 740, 483, 686, 850, 470, 375, 905, 715, 824, 634, 444, 254, 797, 607, 473, 693, 960, 865, 485, 906, 811, 431, 852, 744, 798, 717, 636, 474, 379, 694, 913, 723, 866, 486, 697, 839, 908, 813, 718, 623, 489, 856, 476, 381, 914, 819, 439, 752, 725, 698, 868, 671, 814, 490, 843, 463, 382, 929, 739, 916, 821, 726, 631, 497, 700, 443, 729, 872, 492, 845, 930, 903, 822, 741, 498, 687, 851, 471, 920, 825, 730, 635, 445, 255, 846, 932, 742, 961, 880, 500, 907, 853, 826, 446, 745, 799, 732, 637, 475, 695, 962, 867, 487, 854, 936, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 447, 760, 733, 876, 934, 963, 882, 502, 855, 937, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 939, 980, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q83_1^{1024}$=[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22, 25, 512, 132, 37, 80, 26, 38, 257, 67, 136, 41, 28, 258, 96, 69, 42, 15, 144, 49, 260, 70, 44, 73, 131, 50, 23, 264, 74, 160, 513, 133, 52, 81, 27, 76, 514, 134, 39, 272, 82, 137, 56, 29, 516, 259, 192, 97, 138, 43, 84, 30, 145, 288, 98, 261, 71, 520, 140, 45, 88, 146, 51, 262, 100, 46, 265, 75, 161, 528, 148, 53, 320, 266, 104, 77, 162, 515, 135, 54, 273, 83, 152, 57, 268, 78, 544, 164, 517, 274, 193, 112, 139, 85, 58, 31, 518, 384, 289, 194, 99, 276, 86, 168, 521, 141, 60, 89, 147, 290, 263, 576, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 59, 324, 270, 108, 546, 166, 519, 385, 195, 304, 114, 277, 87, 169, 536, 156, 61, 328, 548, 386, 291, 224, 278, 577, 197, 170, 116, 523, 143, 62, 281, 91, 177, 768, 578, 388, 293, 198, 103, 552, 172, 336, 525, 282, 201, 120, 93, 178, 531, 151, 294, 580, 323, 526, 392, 297, 202, 107, 284, 94, 641, 560, 180, 533, 209, 155, 352, 325, 298, 271, 584, 204, 109, 642, 547, 167, 534, 400, 305, 210, 115, 184, 326, 537, 157, 300, 110, 329, 644, 549, 387, 306, 225, 279, 171, 592, 212, 117, 538, 158, 63, 330, 550, 416, 226, 769, 579, 389, 199, 308, 118, 648, 553, 173, 337, 540, 283, 216, 121, 179, 332, 770, 390, 295, 608, 228, 581, 554, 174, 338, 527, 393, 203, 312, 122, 285, 95, 656, 561, 181, 772, 582, 448, 353, 556, 394, 299, 340, 232, 286, 585, 205, 124, 643, 562, 182, 535, 401, 211, 354, 185, 327, 776, 586, 396, 301, 206, 111, 344, 672, 645, 564, 402, 307, 240, 593, 213, 186, 539, 159, 356, 302, 588, 331, 646, 551, 417, 227, 784, 594, 404, 309, 214, 119, 649, 568, 188, 541, 217, 360, 333, 418, 771, 391, 310, 704, 609, 229, 650, 555, 175, 596, 339, 542, 408, 313, 218, 123, 334, 657, 800, 610, 420, 230, 773, 583, 449, 368, 652, 557, 395, 341, 314, 233, 287, 600, 220, 125, 658, 563, 183, 774, 612, 450, 355, 558, 342, 424, 234, 777, 587, 397, 207, 316, 126, 345, 673, 660, 565, 403, 241, 187, 832, 452, 357, 778, 398, 303, 616, 236, 589, 346, 674, 647, 566, 432, 242, 785, 595, 405, 215, 358, 664, 569, 189, 780, 590, 456, 361, 348, 676, 419, 786, 406, 311, 705, 624, 244, 651, 597, 570, 190, 543, 409, 219, 362, 335, 896, 801, 706, 611, 421, 231, 788, 598, 680, 464, 369, 653, 572, 410, 315, 248, 601, 221, 364, 659, 802, 422, 775, 708, 613, 451, 370, 654, 559, 343, 425, 235, 792, 602, 412, 317, 222, 127, 688, 661, 804, 614, 480, 833, 453, 426, 372, 779, 399, 318, 712, 617, 237, 604, 347, 675, 662, 567, 433, 243, 834, 454, 359, 665, 808, 618, 428, 238, 781, 591, 457, 376, 349, 677, 434, 787, 407, 720, 625, 245, 666, 571, 191, 836, 782, 620, 458, 363, 350, 678, 897, 707, 816, 626, 436, 246, 789, 599, 681, 465, 668, 573, 411, 249, 840, 460, 365, 898, 803, 423, 736, 790, 709, 682, 628, 466, 371, 655, 574, 440, 250, 793, 603, 413, 223, 366, 689, 900, 805, 710, 615, 481, 684, 427, 848, 468, 373, 794, 414, 319, 713, 632, 252, 605, 690, 663, 806, 482, 835, 455, 374, 904, 809, 714, 619, 429, 239, 796, 606, 472, 377, 692, 435, 721, 667, 864, 484, 837, 810, 430, 783, 716, 621, 459, 378, 351, 679, 912, 817, 722, 627, 437, 247, 696, 838, 669, 812, 622, 488, 841, 461, 380, 899, 818, 438, 737, 791, 683, 724, 629, 467, 670, 575, 441, 251, 842, 462, 367, 928, 738, 901, 711, 820, 630, 496, 685, 849, 469, 442, 795, 415, 728, 633, 253, 691, 844, 902, 807, 740, 483, 686, 850, 470, 375, 905, 715, 824, 634, 444, 254, 797, 607, 473, 693, 960, 865, 485, 906, 811, 431, 852, 744, 798, 717, 636, 474, 379, 694, 913, 723, 866, 486, 697, 839, 908, 813, 718, 623, 489, 856, 476, 381, 914, 819, 439, 752, 725, 698, 671, 868, 814, 490, 843, 463, 382, 929, 739, 916, 821, 726, 631, 497, 700, 443, 729, 872, 492, 845, 930, 903, 822, 741, 498, 687, 851, 471, 920, 825, 730, 635, 445, 255, 846, 932, 742, 961, 880, 500, 907, 853, 826, 446, 745, 799, 732, 637, 475, 695, 962, 867, 487, 854, 936, 746, 909, 719, 828, 638, 504, 857, 477, 915, 753, 699, 964, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 447, 760, 733, 876, 934, 963, 882, 502, 855, 937, 747, 924, 829, 734, 639, 505, 992, 965, 938, 884, 911, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 878, 993, 939, 980, 885, 926, 831, 764, 507, 994, 967, 886, 941, 751, 984, 889, 509, 947, 996, 942, 971, 890, 510, 863, 949, 759, 1000, 973, 892, 950, 979, 953, 763, 974, 879, 1008, 981, 954, 927, 765, 995, 982, 887, 956, 766, 985, 997, 943, 986, 891, 511, 998, 1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023];

$Q84_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 513, 52, 81, 27, 76, 39, 134, 514, 82, 272, 137, 56, 29, 516, 259, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 515, 54, 83, 273, 57, 152, 78, 268, 164, 544, 517, 274, 193, 112, 139, 85, 58, 31, 518, 99, 194, 289, 384, 86, 276, 168, 141, 521, 60, 89, 147, 290, 263, 101, 196, 576, 47, 142, 522, 90, 280, 176, 149, 529, 102, 292, 321, 524, 267, 105, 200, 92, 163, 55, 150, 530, 322, 153, 106, 296, 79, 269, 165, 545, 640, 532, 275, 113, 208, 59, 154, 324, 270, 108, 166, 546, 519, 195, 385, 114, 304, 87, 277, 169, 61, 156, 536, 328, 548, 291, 386, 224, 278, 197, 577, 170, 116, 143, 523, 62, 91, 281, 177, 103, 198, 293, 388, 578, 768, 172, 552, 336, 525, 282, 201, 120, 93, 178, 151, 531, 294, 580, 323, 526, 107, 202, 297, 392, 94, 284, 641, 180, 560, 533, 209, 155, 352, 325, 298, 271, 109, 204, 584, 167, 547, 642, 534, 115, 210, 305, 400, 184, 326, 157, 537, 110, 300, 329, 549, 644, 387, 306, 225, 279, 171, 117, 212, 592, 63, 158, 538, 330, 550, 226, 416, 199, 389, 579, 769, 118, 308, 173, 553, 648, 337, 540, 283, 121, 216, 179, 332, 295, 390, 770, 228, 608, 581, 174, 554, 338, 527, 203, 393, 122, 312, 95, 285, 181, 561, 656, 582, 772, 353, 448, 556, 299, 394, 340, 232, 286, 205, 585, 124, 643, 182, 562, 535, 211, 401, 354, 185, 327, 111, 206, 301, 396, 586, 776, 344, 672, 645, 564, 307, 402, 240, 213, 593, 186, 159, 539, 356, 302, 588, 331, 551, 646, 227, 417, 119, 214, 309, 404, 594, 784, 649, 188, 568, 541, 217, 360, 333, 418, 391, 771, 310, 229, 609, 704, 175, 555, 650, 596, 339, 542, 123, 218, 313, 408, 334, 657, 230, 420, 610, 800, 583, 773, 449, 368, 557, 652, 395, 341, 314, 233, 287, 125, 220, 600, 183, 563, 658, 774, 612, 355, 450, 558, 342, 234, 424, 207, 397, 587, 777, 126, 316, 345, 673, 565, 660, 403, 241, 187, 357, 452, 832, 303, 398, 778, 236, 616, 589, 346, 674, 647, 566, 242, 432, 215, 405, 595, 785, 358, 189, 569, 664, 590, 780, 361, 456, 348, 676, 419, 311, 406, 786, 705, 244, 624, 651, 597, 190, 570, 543, 219, 409, 362, 335, 231, 421, 611, 706, 801, 896, 598, 788, 680, 369, 464, 653, 572, 315, 410, 248, 221, 601, 364, 659, 422, 802, 775, 613, 708, 451, 370, 559, 654, 343, 235, 425, 127, 222, 317, 412, 602, 792, 688, 661, 614, 804, 480, 453, 833, 426, 372, 399, 779, 318, 237, 617, 712, 604, 347, 675, 567, 662, 243, 433, 359, 454, 834, 665, 238, 428, 618, 808, 591, 781, 457, 376, 349, 677, 434, 407, 787, 245, 625, 720, 191, 571, 666, 836, 782, 620, 363, 458, 350, 678, 707, 897, 246, 436, 626, 816, 599, 789, 681, 465, 573, 668, 411, 249, 365, 460, 840, 423, 803, 898, 736, 790, 709, 682, 628, 371, 466, 655, 574, 250, 440, 223, 413, 603, 793, 366, 689, 615, 710, 805, 900, 481, 684, 427, 373, 468, 848, 319, 414, 794, 713, 252, 632, 605, 690, 663, 806, 482, 455, 835, 374, 239, 429, 619, 714, 809, 904, 606, 796, 377, 472, 692, 435, 721, 667, 484, 864, 837, 430, 810, 783, 621, 716, 459, 378, 351, 679, 247, 437, 627, 722, 817, 912, 696, 838, 669, 622, 812, 488, 461, 841, 380, 899, 438, 818, 737, 791, 683, 629, 724, 467, 575, 670, 251, 441, 367, 462, 842, 738, 928, 711, 901, 630, 820, 496, 685, 469, 849, 442, 415, 795, 253, 633, 728, 691, 844, 807, 902, 740, 483, 686, 375, 470, 850, 715, 905, 254, 444, 634, 824, 607, 797, 473, 693, 485, 865, 960, 431, 811, 906, 852, 744, 798, 717, 636, 379, 474, 694, 723, 913, 486, 866, 697, 839, 623, 718, 813, 908, 489, 381, 476, 856, 439, 819, 914, 752, 725, 698, 671, 868, 814, 490, 463, 843, 382, 739, 929, 631, 726, 821, 916, 497, 700, 443, 729, 492, 872, 845, 930, 903, 822, 741, 498, 687, 471, 851, 255, 445, 635, 730, 825, 920, 846, 742, 932, 961, 500, 880, 907, 853, 446, 826, 745, 799, 637, 732, 475, 695, 487, 867, 962, 854, 746, 936, 719, 909, 638, 828, 504, 477, 857, 915, 753, 699, 869, 964, 815, 910, 748, 491, 383, 478, 858, 754, 944, 727, 917, 870, 701, 493, 873, 968, 860, 931, 823, 918, 756, 499, 702, 731, 921, 494, 874, 847, 743, 933, 501, 881, 976, 447, 827, 922, 760, 733, 876, 934, 963, 502, 882, 855, 747, 937, 639, 734, 829, 924, 505, 992, 965, 938, 884, 911, 830, 749, 506, 479, 859, 755, 945, 871, 966, 750, 940, 969, 508, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 764, 507, 994, 967, 886, 751, 941, 509, 889, 984, 947, 996, 942, 971, 510, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q85_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 513, 52, 81, 27, 76, 39, 134, 514, 82, 272, 137, 56, 29, 259, 516, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 515, 54, 83, 273, 57, 152, 78, 268, 164, 544, 517, 274, 193, 112, 139, 85, 58, 31, 518, 99, 194, 289, 384, 86, 276, 168, 141, 521, 60, 89, 147, 290, 263, 101, 196, 576, 47, 142, 522, 90, 280, 176, 149, 529, 102, 292, 321, 267, 524, 105, 200, 92, 163, 55, 150, 530, 322, 153, 106, 296, 79, 269, 165, 545, 640, 275, 532, 113, 208, 59, 154, 324, 270, 108, 166, 546, 519, 195, 385, 114, 304, 87, 277, 169, 61, 156, 536, 328, 291, 548, 386, 224, 278, 197, 577, 170, 116, 143, 523, 62, 91, 281, 177, 103, 198, 293, 388, 578, 768, 172, 552, 336, 525, 282, 201, 120, 93, 178, 151, 531, 294, 323, 580, 526, 107, 202, 297, 392, 94, 284, 641, 180, 560, 533, 209, 155, 352, 325, 298, 271, 109, 204, 584, 167, 547, 642, 534, 115, 210, 305, 400, 184, 326, 157, 537, 110, 300, 329, 549, 387, 644, 306, 225, 279, 171, 117, 212, 592, 63, 158, 538, 330, 550, 226, 416, 199, 389, 579, 769, 118, 308, 173, 553, 648, 337, 283, 540, 121, 216, 179, 332, 295, 390, 770, 228, 608, 581, 174, 554, 338, 527, 203, 393, 122, 312, 95, 285, 181, 561, 656, 582, 772, 353, 448, 299, 556, 394, 340, 232, 286, 205, 585, 124, 643, 182, 562, 535, 211, 401, 354, 185, 327, 111, 206, 301, 396, 586, 776, 344, 672, 645, 307, 564, 402, 240, 213, 593, 186, 159, 539, 356, 302, 331, 588, 551, 646, 227, 417, 119, 214, 309, 404, 594, 784, 649, 188, 568, 541, 217, 360, 333, 418, 391, 771, 310, 229, 609, 704, 175, 555, 650, 339, 596, 542, 123, 218, 313, 408, 334, 657, 230, 420, 610, 800, 583, 773, 449, 368, 557, 395, 652, 341, 314, 233, 287, 125, 220, 600, 183, 563, 658, 774, 355, 612, 450, 558, 342, 234, 424, 207, 397, 587, 777, 126, 316, 345, 673, 565, 403, 660, 241, 187, 357, 452, 832, 303, 398, 778, 236, 616, 589, 346, 674, 647, 566, 242, 432, 215, 405, 595, 785, 358, 189, 569, 664, 590, 780, 361, 456, 348, 419, 676, 311, 406, 786, 705, 244, 624, 651, 597, 190, 570, 543, 219, 409, 362, 335, 231, 421, 611, 706, 801, 896, 598, 788, 680, 369, 464, 653, 315, 572, 410, 248, 221, 601, 364, 659, 422, 802, 775, 613, 451, 708, 370, 559, 654, 343, 235, 425, 127, 222, 317, 412, 602, 792, 688, 661, 614, 804, 480, 453, 833, 426, 372, 399, 779, 318, 237, 617, 712, 347, 604, 675, 567, 662, 243, 433, 359, 454, 834, 665, 238, 428, 618, 808, 591, 781, 457, 376, 349, 677, 434, 407, 787, 245, 625, 720, 191, 571, 666, 836, 782, 363, 620, 458, 350, 678, 707, 897, 246, 436, 626, 816, 599, 789, 681, 465, 573, 411, 668, 249, 365, 460, 840, 423, 803, 898, 736, 790, 709, 682, 371, 628, 466, 655, 574, 250, 440, 223, 413, 603, 793, 366, 689, 615, 710, 805, 900, 481, 427, 684, 373, 468, 848, 319, 414, 794, 713, 252, 632, 605, 690, 663, 806, 482, 455, 835, 374, 239, 429, 619, 714, 809, 904, 606, 796, 377, 472, 435, 692, 721, 667, 484, 864, 837, 430, 810, 783, 621, 459, 716, 378, 351, 679, 247, 437, 627, 722, 817, 912, 696, 838, 669, 622, 812, 488, 461, 841, 380, 899, 438, 818, 737, 791, 683, 629, 467, 724, 575, 670, 251, 441, 367, 462, 842, 738, 928, 711, 901, 630, 820, 496, 685, 469, 849, 442, 415, 795, 253, 633, 728, 691, 844, 807, 902, 483, 740, 686, 375, 470, 850, 715, 905, 254, 444, 634, 824, 607, 797, 473, 693, 485, 865, 960, 431, 811, 906, 852, 744, 798, 717, 379, 636, 474, 694, 723, 913, 486, 866, 697, 839, 623, 718, 813, 908, 489, 381, 476, 856, 439, 819, 914, 752, 725, 698, 671, 868, 814, 490, 463, 843, 382, 739, 929, 631, 726, 821, 916, 497, 443, 700, 729, 492, 872, 845, 930, 903, 822, 741, 498, 687, 471, 851, 255, 445, 635, 730, 825, 920, 846, 742, 932, 961, 500, 880, 907, 853, 446, 826, 745, 799, 637, 475, 732, 695, 487, 867, 962, 854, 746, 936, 719, 909, 638, 828, 504, 477, 857, 915, 753, 699, 869, 964, 815, 910, 491, 748, 383, 478, 858, 754, 944, 727, 917, 870, 701, 493, 873, 968, 860, 931, 823, 918, 499, 756, 702, 731, 921, 494, 874, 847, 743, 933, 501, 881, 976, 447, 827, 922, 760, 733, 876, 934, 963, 502, 882, 855, 747, 937, 639, 734, 829, 924, 505, 992, 965, 938, 884, 911, 830, 749, 506, 479, 859, 755, 945, 871, 966, 750, 940, 969, 508, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 507, 764, 994, 967, 886, 751, 941, 509, 889, 984, 947, 996, 942, 971, 510, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q86_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 513, 52, 81, 27, 76, 39, 134, 514, 82, 272, 137, 56, 29, 259, 516, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 515, 54, 83, 273, 57, 152, 78, 268, 164, 544, 517, 274, 193, 112, 139, 85, 58, 31, 518, 99, 194, 289, 384, 86, 276, 168, 141, 521, 60, 89, 147, 290, 263, 101, 196, 576, 47, 142, 522, 90, 280, 176, 149, 529, 102, 292, 321, 267, 524, 105, 200, 92, 163, 55, 150, 530, 322, 153, 106, 296, 79, 269, 165, 545, 640, 275, 532, 113, 208, 59, 154, 324, 270, 108, 166, 546, 519, 195, 385, 114, 304, 87, 277, 169, 61, 156, 536, 328, 291, 548, 386, 224, 278, 197, 170, 577, 116, 143, 523, 62, 91, 281, 177, 103, 198, 293, 388, 578, 768, 172, 552, 336, 525, 282, 201, 120, 93, 178, 151, 531, 294, 323, 580, 526, 107, 202, 297, 392, 94, 284, 641, 180, 560, 533, 209, 155, 352, 325, 298, 271, 109, 204, 584, 167, 547, 642, 534, 115, 210, 305, 400, 184, 326, 157, 537, 110, 300, 329, 549, 387, 644, 306, 225, 279, 171, 117, 212, 592, 63, 158, 538, 330, 550, 226, 416, 199, 389, 579, 118, 769, 308, 173, 553, 648, 337, 283, 540, 121, 216, 179, 332, 295, 390, 770, 228, 608, 174, 581, 554, 338, 527, 203, 393, 122, 312, 95, 285, 181, 561, 656, 582, 772, 353, 448, 299, 556, 394, 340, 232, 286, 205, 585, 124, 643, 182, 562, 535, 211, 401, 354, 185, 327, 111, 206, 301, 396, 586, 776, 344, 672, 645, 307, 564, 402, 240, 213, 186, 593, 159, 539, 356, 302, 331, 588, 551, 646, 227, 417, 119, 214, 309, 404, 594, 784, 649, 188, 568, 541, 217, 360, 333, 418, 391, 771, 310, 229, 609, 704, 175, 555, 650, 339, 596, 542, 123, 218, 313, 408, 334, 657, 230, 420, 610, 800, 583, 773, 449, 368, 557, 395, 652, 341, 314, 233, 287, 125, 220, 600, 183, 563, 658, 774, 355, 612, 450, 558, 342, 234, 424, 207, 397, 587, 126, 777, 316, 345, 673, 565, 403, 660, 241, 187, 357, 452, 832, 303, 398, 778, 236, 616, 589, 346, 674, 647, 566, 242, 432, 215, 405, 595, 785, 358, 189, 569, 664, 590, 780, 361, 456, 348, 419, 676, 311, 406, 786, 705, 244, 624, 651, 190, 597, 570, 543, 219, 409, 362, 335, 231, 421, 611, 706, 801, 896, 598, 788, 680, 369, 464, 653, 315, 572, 410, 248, 221, 601, 364, 659, 422, 802, 775, 613, 451, 708, 370, 559, 654, 343, 235, 425, 127, 222, 317, 412, 602, 792, 688, 661, 614, 804, 480, 453, 426, 833, 372, 399, 779, 318, 237, 617, 712, 347, 604, 675, 567, 662, 243, 433, 359, 454, 834, 665, 238, 428, 618, 808, 591, 781, 457, 376, 349, 677, 434, 407, 787, 245, 625, 720, 191, 571, 666, 836, 782, 363, 620, 458, 350, 678, 707, 246, 897, 436, 626, 816, 599, 789, 681, 465, 573, 411, 668, 249, 365, 460, 840, 423, 803, 898, 736, 790, 709, 682, 371, 628, 466, 655, 574, 250, 440, 223, 413, 603, 793, 366, 689, 615, 710, 805, 900, 481, 427, 684, 373, 468, 848, 319, 414, 794, 713, 252, 632, 605, 690, 663, 806, 482, 455, 835, 374, 239, 429, 619, 714, 809, 904, 606, 796, 377, 472, 435, 692, 721, 667, 484, 864, 430, 837, 810, 783, 621, 459, 716, 378, 351, 679, 247, 437, 627, 722, 817, 912, 696, 838, 669, 622, 812, 488, 461, 841, 380, 899, 438, 818, 737, 791, 683, 629, 467, 724, 575, 670, 251, 441, 367, 462, 842, 738, 928, 711, 901, 630, 820, 496, 685, 469, 442, 849, 415, 795, 253, 633, 728, 691, 844, 807, 902, 483, 740, 686, 375, 470, 850, 715, 254, 905, 444, 634, 824, 607, 797, 473, 693, 485, 865, 960, 431, 811, 906, 852, 744, 798, 717, 379, 636, 474, 694, 723, 913, 486, 866, 697, 839, 623, 718, 813, 908, 489, 381, 476, 856, 439, 819, 914, 752, 725, 698, 671, 868, 814, 490, 463, 843, 382, 739, 929, 631, 726, 821, 916, 497, 443, 700, 729, 492, 872, 845, 930, 903, 822, 741, 498, 687, 471, 851, 255, 445, 635, 730, 825, 920, 846, 742, 932, 961, 500, 880, 907, 446, 853, 826, 745, 799, 637, 475, 732, 695, 487, 867, 962, 854, 746, 936, 719, 909, 638, 828, 504, 477, 857, 915, 753, 699, 869, 964, 815, 910, 491, 748, 383, 478, 858, 754, 944, 727, 917, 870, 701, 493, 873, 968, 860, 931, 823, 918, 499, 756, 702, 731, 921, 494, 874, 847, 743, 933, 501, 881, 976, 447, 827, 922, 760, 733, 876, 934, 963, 502, 882, 855, 747, 937, 639, 734, 829, 924, 505, 992, 965, 938, 884, 911, 830, 749, 506, 479, 859, 755, 945, 871, 966, 750, 940, 969, 508, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 507, 764, 994, 967, 886, 751, 941, 509, 889, 984, 947, 996, 942, 971, 510, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q87_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 516, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 518, 99, 194, 289, 384, 86, 276, 168, 141, 60, 521, 89, 147, 290, 263, 101, 196, 576, 47, 142, 522, 90, 280, 176, 149, 529, 102, 292, 321, 267, 524, 105, 200, 92, 163, 55, 150, 530, 322, 153, 106, 296, 79, 269, 165, 545, 640, 275, 532, 113, 208, 59, 154, 324, 270, 108, 166, 546, 519, 195, 114, 385, 304, 87, 277, 169, 61, 156, 536, 328, 291, 548, 386, 224, 278, 197, 170, 116, 577, 143, 62, 523, 91, 281, 177, 103, 198, 293, 388, 578, 768, 172, 552, 336, 525, 282, 201, 120, 93, 178, 151, 531, 294, 323, 580, 526, 107, 202, 297, 392, 94, 284, 180, 641, 560, 533, 209, 155, 352, 325, 298, 271, 109, 204, 584, 167, 547, 642, 534, 115, 210, 305, 400, 184, 326, 157, 537, 110, 300, 329, 549, 387, 644, 306, 225, 279, 171, 117, 212, 592, 63, 158, 538, 330, 550, 226, 416, 199, 118, 389, 579, 308, 769, 173, 553, 337, 648, 283, 540, 121, 216, 179, 332, 295, 390, 228, 770, 608, 174, 581, 554, 338, 527, 203, 122, 393, 312, 95, 285, 181, 561, 656, 582, 772, 353, 448, 299, 556, 394, 340, 232, 286, 205, 124, 585, 182, 643, 562, 535, 211, 401, 354, 185, 327, 111, 206, 301, 396, 586, 776, 344, 672, 645, 307, 564, 402, 240, 213, 186, 593, 159, 539, 356, 302, 331, 588, 551, 646, 227, 417, 119, 214, 309, 404, 594, 784, 188, 649, 568, 541, 217, 360, 333, 418, 391, 310, 229, 771, 609, 704, 175, 555, 339, 650, 596, 542, 123, 218, 313, 408, 334, 657, 230, 420, 610, 800, 583, 773, 449, 368, 557, 395, 341, 652, 314, 233, 287, 125, 220, 600, 183, 563, 658, 774, 355, 612, 450, 558, 342, 234, 424, 207, 126, 397, 587, 316, 777, 345, 673, 565, 403, 660, 241, 187, 357, 452, 832, 303, 398, 236, 778, 616, 589, 346, 674, 647, 566, 242, 432, 215, 405, 595, 785, 358, 189, 569, 664, 590, 780, 361, 456, 348, 419, 676, 311, 406, 244, 786, 705, 624, 190, 651, 597, 570, 543, 219, 409, 362, 335, 231, 421, 611, 706, 801, 896, 598, 788, 369, 680, 464, 653, 315, 572, 410, 248, 221, 601, 364, 659, 422, 802, 775, 613, 451, 708, 370, 559, 343, 654, 235, 425, 127, 222, 317, 412, 602, 792, 688, 661, 614, 804, 480, 453, 426, 372, 833, 399, 318, 237, 779, 617, 712, 347, 604, 675, 567, 662, 243, 433, 359, 454, 834, 665, 238, 428, 618, 808, 591, 781, 457, 376, 349, 677, 434, 407, 245, 787, 625, 720, 191, 571, 666, 836, 782, 363, 620, 458, 350, 678, 246, 707, 436, 626, 897, 816, 599, 789, 681, 465, 573, 411, 668, 249, 365, 460, 840, 423, 803, 898, 736, 790, 709, 371, 682, 628, 466, 655, 574, 250, 440, 223, 413, 603, 793, 366, 689, 615, 710, 805, 900, 481, 427, 373, 684, 468, 848, 319, 414, 252, 794, 713, 632, 605, 690, 663, 806, 482, 455, 374, 835, 239, 429, 619, 714, 809, 904, 606, 796, 377, 472, 435, 692, 721, 667, 484, 864, 430, 837, 810, 783, 621, 459, 716, 378, 351, 679, 247, 437, 627, 722, 817, 912, 696, 838, 669, 622, 812, 488, 461, 380, 841, 438, 899, 818, 737, 791, 683, 629, 467, 724, 575, 670, 251, 441, 367, 462, 842, 738, 928, 711, 630, 901, 820, 496, 685, 469, 442, 849, 415, 253, 795, 633, 728, 691, 844, 807, 902, 483, 740, 375, 686, 470, 850, 254, 715, 444, 634, 905, 824, 607, 797, 473, 693, 485, 865, 960, 431, 811, 906, 852, 744, 798, 717, 379, 636, 474, 694, 723, 913, 486, 866, 697, 839, 623, 718, 813, 908, 489, 381, 476, 856, 439, 819, 914, 752, 725, 698, 671, 868, 814, 490, 463, 382, 843, 739, 929, 631, 726, 821, 916, 497, 443, 700, 729, 492, 872, 845, 930, 903, 822, 741, 498, 687, 471, 851, 255, 445, 635, 730, 825, 920, 846, 742, 932, 500, 961, 880, 446, 907, 853, 826, 745, 799, 637, 475, 732, 695, 487, 867, 962, 854, 746, 936, 719, 638, 909, 828, 504, 477, 857, 915, 753, 699, 869, 964, 815, 910, 491, 748, 383, 478, 858, 754, 944, 727, 917, 870, 701, 493, 873, 968, 860, 931, 823, 918, 499, 756, 702, 731, 921, 494, 874, 847, 743, 933, 501, 881, 976, 447, 827, 922, 760, 733, 876, 934, 502, 963, 882, 855, 747, 937, 639, 734, 829, 924, 505, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 507, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q88_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 516, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 518, 99, 194, 289, 384, 86, 276, 168, 141, 60, 521, 89, 147, 290, 263, 101, 196, 47, 576, 142, 522, 90, 280, 176, 149, 529, 102, 292, 321, 267, 524, 105, 200, 92, 163, 55, 150, 530, 322, 153, 106, 296, 79, 269, 165, 545, 640, 275, 532, 113, 208, 59, 154, 324, 270, 108, 166, 546, 519, 195, 114, 385, 304, 87, 277, 169, 61, 156, 536, 328, 291, 548, 386, 224, 278, 197, 170, 116, 577, 143, 62, 523, 91, 281, 177, 103, 198, 293, 388, 578, 768, 172, 552, 336, 525, 282, 201, 120, 93, 178, 151, 531, 294, 323, 580, 526, 107, 202, 297, 392, 94, 284, 180, 641, 560, 533, 209, 155, 352, 325, 298, 271, 109, 204, 584, 167, 547, 642, 534, 115, 210, 305, 400, 184, 326, 157, 537, 110, 300, 329, 549, 387, 644, 306, 225, 279, 171, 117, 212, 63, 592, 158, 538, 330, 550, 226, 416, 199, 118, 389, 579, 308, 769, 173, 553, 337, 648, 283, 540, 121, 216, 179, 332, 295, 390, 228, 770, 608, 174, 581, 554, 338, 527, 203, 122, 393, 312, 95, 285, 181, 561, 656, 582, 772, 353, 448, 299, 556, 394, 340, 232, 286, 205, 124, 585, 182, 643, 562, 535, 211, 401, 354, 185, 327, 111, 206, 301, 396, 586, 776, 344, 672, 645, 307, 564, 402, 240, 213, 186, 593, 159, 539, 356, 302, 331, 588, 551, 646, 227, 417, 119, 214, 309, 404, 594, 784, 188, 649, 568, 541, 217, 360, 333, 418, 391, 310, 229, 771, 609, 175, 704, 555, 339, 650, 596, 542, 123, 218, 313, 408, 334, 657, 230, 420, 610, 800, 583, 773, 449, 368, 557, 395, 341, 652, 314, 233, 287, 125, 220, 600, 183, 563, 658, 774, 355, 612, 450, 558, 342, 234, 424, 207, 126, 397, 587, 316, 777, 345, 673, 565, 403, 660, 241, 187, 357, 452, 303, 832, 398, 236, 778, 616, 589, 346, 674, 647, 566, 242, 432, 215, 405, 595, 785, 358, 189, 569, 664, 590, 780, 361, 456, 348, 419, 676, 311, 406, 244, 786, 705, 624, 190, 651, 597, 570, 543, 219, 409, 362, 335, 231, 421, 611, 706, 801, 896, 598, 788, 369, 680, 464, 653, 315, 572, 410, 248, 221, 601, 364, 659, 422, 802, 775, 613, 451, 708, 370, 559, 343, 654, 235, 425, 127, 222, 317, 412, 602, 792, 688, 661, 614, 804, 480, 453, 426, 372, 833, 399, 318, 237, 779, 617, 712, 347, 604, 675, 567, 662, 243, 433, 359, 454, 834, 665, 238, 428, 618, 808, 591, 781, 457, 376, 349, 677, 434, 407, 245, 787, 625, 191, 720, 571, 666, 836, 782, 363, 620, 458, 350, 678, 246, 707, 436, 626, 897, 816, 599, 789, 681, 465, 573, 411, 668, 249, 365, 460, 840, 423, 803, 898, 736, 790, 709, 371, 682, 628, 466, 655, 574, 250, 440, 223, 413, 603, 793, 366, 689, 615, 710, 805, 900, 481, 427, 373, 684, 468, 319, 848, 414, 252, 794, 713, 632, 605, 690, 663, 806, 482, 455, 374, 835, 239, 429, 619, 714, 809, 904, 606, 796, 377, 472, 435, 692, 721, 667, 484, 864, 430, 837, 810, 783, 621, 459, 716, 378, 351, 679, 247, 437, 627, 722, 817, 912, 696, 838, 669, 622, 812, 488, 461, 380, 841, 438, 899, 818, 737, 791, 683, 629, 467, 724, 575, 670, 251, 441, 367, 462, 842, 738, 928, 711, 630, 901, 820, 496, 685, 469, 442, 849, 415, 253, 795, 633, 728, 691, 844, 807, 902, 483, 740, 375, 686, 470, 850, 254, 715, 444, 634, 905, 824, 607, 797, 473, 693, 485, 865, 431, 960, 811, 906, 852, 744, 798, 717, 379, 636, 474, 694, 723, 913, 486, 866, 697, 839, 623, 718, 813, 908, 489, 381, 476, 856, 439, 819, 914, 752, 725, 698, 671, 868, 814, 490, 463, 382, 843, 739, 929, 631, 726, 821, 916, 497, 443, 700, 729, 492, 872, 845, 930, 903, 822, 741, 498, 687, 471, 851, 255, 445, 635, 730, 825, 920, 846, 742, 932, 500, 961, 880, 446, 907, 853, 826, 745, 799, 637, 475, 732, 695, 487, 867, 962, 854, 746, 936, 719, 638, 909, 828, 504, 477, 857, 915, 753, 699, 869, 964, 815, 910, 491, 748, 383, 478, 858, 754, 944, 727, 917, 870, 701, 493, 873, 968, 860, 931, 823, 918, 499, 756, 702, 731, 921, 494, 874, 847, 743, 933, 501, 881, 447, 976, 827, 922, 760, 733, 876, 934, 502, 963, 882, 855, 747, 937, 639, 734, 829, 924, 505, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 507, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q89_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 516, 97, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 518, 99, 194, 289, 384, 86, 276, 168, 141, 60, 521, 89, 147, 290, 263, 101, 196, 47, 576, 142, 522, 90, 280, 176, 149, 529, 102, 292, 321, 267, 524, 105, 200, 92, 163, 55, 150, 530, 153, 322, 106, 296, 79, 269, 165, 545, 640, 275, 532, 113, 208, 59, 154, 324, 270, 108, 166, 546, 519, 195, 114, 385, 304, 87, 277, 169, 61, 156, 536, 328, 291, 548, 386, 224, 278, 197, 170, 116, 577, 143, 62, 523, 91, 281, 177, 103, 198, 293, 388, 578, 768, 172, 552, 336, 525, 282, 201, 120, 93, 178, 151, 531, 294, 323, 580, 526, 107, 202, 297, 392, 94, 284, 180, 641, 560, 533, 209, 155, 352, 325, 298, 271, 109, 204, 584, 167, 547, 642, 534, 115, 210, 305, 400, 184, 157, 326, 537, 110, 300, 329, 549, 387, 306, 644, 225, 279, 171, 117, 212, 63, 592, 158, 538, 330, 550, 226, 416, 199, 118, 389, 579, 308, 769, 173, 553, 337, 648, 283, 540, 121, 216, 179, 332, 295, 390, 228, 770, 608, 174, 581, 554, 338, 527, 203, 122, 393, 312, 95, 285, 181, 561, 656, 582, 772, 353, 448, 299, 556, 394, 340, 232, 286, 205, 124, 585, 182, 643, 562, 535, 211, 401, 185, 354, 327, 111, 206, 301, 396, 586, 776, 344, 672, 307, 645, 564, 402, 240, 213, 186, 593, 159, 539, 356, 302, 331, 588, 551, 646, 227, 417, 119, 214, 309, 404, 594, 784, 188, 649, 568, 541, 217, 360, 333, 418, 391, 310, 229, 771, 609, 175, 704, 555, 339, 650, 596, 542, 123, 218, 313, 408, 334, 657, 230, 420, 610, 800, 583, 773, 449, 368, 557, 395, 341, 314, 652, 233, 287, 125, 220, 600, 183, 563, 658, 774, 355, 612, 450, 558, 342, 234, 424, 207, 126, 397, 587, 316, 777, 345, 673, 565, 403, 660, 241, 187, 357, 452, 303, 832, 398, 236, 778, 616, 589, 346, 674, 647, 566, 242, 432, 215, 405, 595, 785, 189, 358, 569, 664, 590, 780, 361, 456, 348, 419, 676, 311, 406, 244, 786, 705, 624, 190, 651, 597, 570, 543, 219, 409, 362, 335, 231, 421, 611, 706, 801, 896, 598, 788, 369, 680, 464, 315, 653, 572, 410, 248, 221, 601, 364, 659, 422, 802, 775, 613, 451, 370, 708, 559, 343, 654, 235, 425, 127, 222, 317, 412, 602, 792, 688, 661, 614, 804, 480, 453, 426, 372, 833, 399, 318, 237, 779, 617, 712, 347, 604, 675, 567, 662, 243, 433, 359, 454, 665, 834, 238, 428, 618, 808, 591, 781, 457, 376, 349, 677, 434, 407, 245, 787, 625, 191, 720, 571, 666, 836, 782, 363, 620, 458, 350, 678, 246, 707, 436, 626, 897, 816, 599, 789, 681, 465, 573, 411, 668, 249, 365, 460, 840, 423, 803, 898, 736, 790, 371, 709, 682, 628, 466, 655, 574, 250, 440, 223, 413, 603, 793, 366, 689, 615, 710, 805, 900, 481, 427, 373, 684, 468, 319, 848, 414, 252, 794, 713, 632, 605, 690, 663, 806, 482, 455, 374, 835, 239, 429, 619, 714, 809, 904, 606, 796, 377, 472, 435, 692, 721, 667, 484, 864, 430, 837, 810, 783, 621, 459, 378, 716, 351, 679, 247, 437, 627, 722, 817, 912, 696, 669, 838, 622, 812, 488, 461, 380, 841, 438, 899, 818, 737, 791, 683, 629, 467, 724, 575, 670, 251, 441, 367, 462, 842, 738, 928, 711, 630, 901, 820, 496, 685, 469, 442, 849, 415, 253, 795, 633, 728, 691, 844, 807, 902, 483, 740, 375, 686, 470, 850, 254, 715, 444, 634, 905, 824, 607, 797, 473, 693, 485, 865, 431, 960, 811, 906, 852, 744, 798, 379, 717, 636, 474, 694, 723, 913, 486, 697, 866, 839, 623, 718, 813, 908, 489, 381, 476, 856, 439, 819, 914, 752, 725, 698, 671, 868, 814, 490, 463, 382, 843, 739, 929, 631, 726, 821, 916, 497, 443, 700, 729, 492, 872, 845, 930, 903, 822, 741, 498, 687, 471, 851, 255, 445, 635, 730, 825, 920, 846, 742, 932, 500, 961, 880, 446, 907, 853, 826, 745, 799, 637, 475, 732, 695, 487, 867, 962, 854, 746, 936, 719, 638, 909, 828, 504, 477, 857, 915, 753, 699, 869, 964, 815, 910, 491, 748, 383, 478, 858, 754, 944, 727, 917, 701, 870, 493, 873, 968, 860, 931, 823, 918, 499, 756, 702, 731, 921, 494, 874, 847, 743, 933, 501, 881, 447, 976, 827, 922, 760, 733, 876, 934, 502, 963, 882, 855, 747, 937, 639, 734, 829, 924, 505, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 926, 507, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q90_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 516, 192, 43, 138, 84, 30, 145, 98, 288, 71, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 384, 86, 276, 168, 141, 60, 521, 89, 147, 290, 263, 101, 196, 47, 576, 142, 522, 90, 280, 176, 149, 529, 102, 292, 321, 267, 105, 524, 200, 92, 163, 55, 150, 530, 153, 322, 106, 296, 79, 269, 165, 545, 640, 275, 113, 532, 208, 59, 154, 324, 270, 108, 166, 546, 519, 195, 114, 385, 304, 87, 277, 169, 61, 156, 536, 328, 291, 548, 386, 224, 278, 197, 170, 116, 577, 143, 62, 523, 91, 281, 177, 103, 198, 293, 388, 578, 768, 172, 552, 336, 525, 282, 201, 120, 93, 178, 151, 531, 294, 323, 580, 107, 526, 202, 297, 392, 94, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 644, 279, 171, 117, 212, 63, 592, 158, 538, 330, 550, 226, 416, 199, 118, 389, 579, 308, 769, 173, 553, 337, 648, 283, 121, 540, 216, 179, 332, 295, 390, 228, 770, 608, 174, 581, 554, 338, 527, 203, 122, 393, 312, 95, 285, 181, 561, 656, 582, 353, 772, 448, 299, 556, 394, 340, 232, 286, 205, 124, 585, 182, 643, 562, 535, 211, 401, 185, 354, 327, 111, 206, 301, 396, 586, 776, 344, 672, 307, 645, 564, 402, 240, 213, 186, 593, 159, 539, 356, 302, 331, 588, 551, 227, 646, 417, 119, 214, 309, 404, 594, 784, 188, 649, 568, 541, 217, 360, 333, 418, 391, 310, 229, 771, 609, 175, 704, 555, 339, 650, 596, 123, 542, 218, 313, 408, 334, 657, 230, 420, 610, 800, 583, 773, 449, 368, 557, 395, 341, 314, 233, 652, 287, 125, 220, 600, 183, 563, 658, 355, 774, 612, 450, 558, 342, 234, 424, 207, 126, 397, 587, 316, 777, 345, 673, 565, 403, 241, 660, 187, 357, 452, 303, 832, 398, 236, 778, 616, 589, 346, 674, 647, 566, 242, 432, 215, 405, 595, 785, 189, 358, 569, 664, 590, 361, 780, 456, 348, 419, 676, 311, 406, 244, 786, 705, 624, 190, 651, 597, 570, 543, 219, 409, 362, 335, 231, 421, 611, 706, 801, 896, 598, 369, 788, 680, 464, 315, 653, 572, 410, 248, 221, 601, 364, 659, 422, 802, 775, 613, 451, 370, 708, 559, 343, 235, 654, 425, 127, 222, 317, 412, 602, 792, 688, 661, 614, 804, 480, 453, 426, 372, 833, 399, 318, 237, 779, 617, 712, 347, 604, 675, 567, 243, 662, 433, 359, 454, 665, 834, 238, 428, 618, 808, 591, 781, 457, 376, 349, 677, 434, 407, 245, 787, 625, 191, 720, 571, 666, 836, 363, 782, 620, 458, 350, 678, 246, 707, 436, 626, 897, 816, 599, 789, 681, 465, 573, 411, 249, 668, 365, 460, 840, 423, 803, 898, 736, 371, 790, 709, 682, 628, 466, 655, 574, 250, 440, 223, 413, 603, 793, 366, 689, 615, 710, 805, 481, 900, 427, 373, 684, 468, 319, 848, 414, 252, 794, 713, 632, 605, 690, 663, 806, 482, 455, 374, 835, 239, 429, 619, 714, 809, 904, 606, 377, 796, 472, 435, 692, 721, 667, 484, 864, 430, 837, 810, 783, 621, 459, 378, 716, 351, 679, 247, 437, 627, 722, 817, 912, 696, 669, 838, 622, 812, 488, 461, 380, 841, 438, 899, 818, 737, 791, 683, 629, 467, 724, 575, 251, 670, 441, 367, 462, 842, 738, 928, 711, 630, 901, 820, 496, 685, 469, 442, 849, 415, 253, 795, 633, 728, 691, 844, 807, 483, 902, 740, 375, 686, 470, 850, 254, 715, 444, 634, 905, 824, 607, 797, 473, 693, 485, 865, 431, 960, 811, 906, 852, 744, 379, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 929, 631, 726, 821, 497, 916, 443, 700, 729, 492, 872, 845, 930, 903, 822, 741, 498, 687, 471, 851, 255, 445, 635, 730, 825, 920, 846, 742, 932, 500, 961, 880, 446, 907, 853, 826, 745, 799, 637, 475, 732, 695, 487, 867, 962, 854, 746, 936, 719, 638, 909, 828, 504, 477, 857, 915, 753, 699, 869, 964, 815, 491, 910, 748, 383, 478, 858, 754, 944, 727, 917, 701, 870, 493, 873, 968, 860, 931, 823, 499, 918, 756, 702, 731, 921, 494, 874, 847, 743, 933, 501, 881, 447, 976, 827, 922, 760, 733, 876, 934, 502, 963, 882, 855, 747, 937, 639, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 952, 735, 925, 878, 993, 939, 885, 980, 831, 507, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q91_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 516, 192, 43, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 384, 86, 276, 168, 141, 60, 521, 89, 147, 290, 263, 101, 196, 47, 142, 576, 522, 90, 280, 176, 149, 529, 102, 292, 321, 267, 105, 524, 200, 92, 163, 55, 150, 530, 153, 322, 106, 79, 296, 269, 165, 545, 640, 275, 113, 532, 208, 59, 154, 324, 270, 108, 166, 546, 519, 195, 114, 385, 87, 304, 277, 169, 61, 156, 536, 328, 291, 548, 386, 224, 278, 197, 170, 116, 143, 577, 62, 523, 91, 281, 177, 103, 198, 293, 388, 578, 768, 172, 552, 336, 525, 282, 201, 120, 93, 178, 151, 531, 294, 323, 580, 107, 526, 202, 297, 392, 94, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 644, 279, 171, 117, 212, 63, 158, 592, 538, 330, 550, 226, 199, 416, 118, 389, 579, 308, 769, 173, 553, 337, 648, 283, 121, 540, 216, 179, 332, 295, 390, 228, 770, 174, 608, 581, 554, 338, 527, 203, 122, 393, 95, 312, 285, 181, 561, 656, 582, 353, 772, 448, 299, 556, 394, 340, 232, 286, 205, 124, 585, 182, 643, 562, 535, 211, 401, 185, 354, 327, 111, 206, 301, 396, 586, 776, 344, 672, 307, 645, 564, 402, 240, 213, 186, 159, 593, 539, 356, 302, 331, 588, 551, 227, 646, 417, 119, 214, 309, 404, 594, 784, 188, 649, 568, 541, 217, 360, 333, 418, 391, 310, 229, 771, 175, 609, 704, 555, 339, 650, 596, 123, 542, 218, 313, 408, 334, 657, 230, 420, 610, 583, 800, 773, 449, 368, 557, 395, 341, 314, 233, 652, 287, 125, 220, 600, 183, 563, 658, 355, 774, 612, 450, 558, 342, 234, 207, 424, 126, 397, 587, 316, 777, 345, 673, 565, 403, 241, 660, 187, 357, 452, 303, 398, 832, 236, 778, 616, 589, 346, 674, 647, 566, 242, 215, 432, 405, 595, 785, 189, 358, 569, 664, 590, 361, 780, 456, 348, 419, 676, 311, 406, 244, 786, 705, 190, 624, 651, 597, 570, 543, 219, 409, 362, 335, 231, 421, 611, 706, 801, 896, 598, 369, 788, 680, 464, 315, 653, 572, 410, 248, 221, 601, 364, 659, 422, 802, 775, 613, 451, 370, 708, 559, 343, 235, 654, 425, 127, 222, 317, 412, 602, 792, 688, 661, 614, 804, 480, 453, 426, 372, 399, 833, 318, 237, 779, 617, 712, 347, 604, 675, 567, 243, 662, 433, 359, 454, 665, 834, 238, 428, 618, 591, 808, 781, 457, 376, 349, 677, 434, 407, 245, 787, 191, 625, 720, 571, 666, 836, 363, 782, 620, 458, 350, 678, 246, 707, 436, 626, 897, 599, 816, 789, 681, 465, 573, 411, 249, 668, 365, 460, 840, 423, 803, 898, 736, 371, 790, 709, 682, 628, 466, 655, 574, 250, 223, 440, 413, 603, 793, 366, 689, 615, 710, 805, 481, 900, 427, 373, 684, 468, 319, 414, 848, 252, 794, 713, 632, 605, 690, 663, 806, 482, 455, 374, 835, 239, 429, 619, 714, 809, 904, 606, 377, 796, 472, 435, 692, 721, 667, 484, 430, 864, 837, 810, 783, 621, 459, 378, 716, 351, 679, 247, 437, 627, 722, 817, 912, 696, 669, 838, 622, 812, 488, 461, 380, 841, 438, 899, 818, 737, 791, 683, 629, 467, 724, 575, 251, 670, 441, 367, 462, 842, 738, 711, 928, 630, 901, 820, 496, 685, 469, 442, 415, 849, 253, 795, 633, 728, 691, 844, 807, 483, 902, 740, 375, 686, 470, 850, 254, 715, 444, 634, 905, 607, 824, 797, 473, 693, 485, 431, 865, 960, 811, 906, 852, 744, 379, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 929, 631, 726, 821, 497, 916, 443, 700, 729, 492, 872, 845, 930, 903, 822, 741, 498, 687, 471, 851, 255, 445, 635, 730, 825, 920, 846, 742, 932, 500, 961, 446, 880, 907, 853, 826, 745, 799, 637, 475, 732, 695, 487, 867, 962, 854, 746, 719, 936, 638, 909, 828, 504, 477, 857, 915, 753, 699, 869, 964, 815, 491, 910, 748, 383, 478, 858, 754, 727, 944, 917, 701, 870, 493, 873, 968, 860, 931, 823, 499, 918, 756, 702, 731, 921, 494, 874, 847, 743, 933, 501, 447, 881, 976, 827, 922, 760, 733, 876, 934, 502, 963, 882, 855, 747, 937, 639, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 980, 831, 507, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q924_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 516, 192, 43, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 384, 86, 276, 168, 141, 60, 521, 89, 147, 290, 263, 101, 196, 47, 142, 576, 522, 90, 280, 176, 149, 529, 102, 292, 321, 267, 105, 524, 200, 92, 163, 55, 150, 530, 153, 322, 106, 79, 296, 269, 165, 545, 640, 275, 113, 532, 208, 59, 154, 324, 270, 108, 166, 546, 519, 195, 114, 385, 87, 304, 277, 169, 61, 156, 536, 328, 291, 548, 386, 224, 278, 197, 170, 116, 143, 62, 577, 523, 91, 281, 177, 103, 198, 293, 388, 578, 768, 172, 552, 336, 525, 282, 201, 120, 93, 178, 151, 531, 294, 323, 580, 107, 526, 202, 297, 392, 94, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 644, 279, 171, 117, 212, 63, 158, 592, 538, 330, 550, 226, 199, 416, 118, 389, 579, 308, 769, 173, 553, 337, 648, 283, 121, 540, 216, 179, 332, 295, 390, 228, 770, 174, 608, 581, 554, 338, 527, 203, 122, 393, 95, 312, 285, 181, 561, 656, 582, 353, 772, 448, 299, 556, 394, 340, 232, 286, 205, 124, 585, 182, 643, 562, 535, 211, 401, 185, 354, 327, 111, 206, 301, 396, 586, 776, 344, 672, 307, 645, 564, 402, 240, 213, 186, 159, 593, 539, 356, 302, 331, 588, 551, 227, 646, 417, 119, 214, 309, 404, 594, 784, 188, 649, 568, 541, 217, 360, 333, 418, 391, 310, 229, 771, 175, 609, 704, 555, 339, 650, 596, 123, 542, 218, 313, 408, 334, 657, 230, 420, 610, 583, 800, 773, 449, 368, 557, 395, 341, 314, 233, 652, 287, 125, 220, 600, 183, 563, 658, 355, 774, 612, 450, 558, 342, 234, 207, 424, 126, 397, 587, 316, 777, 345, 673, 565, 403, 241, 660, 187, 357, 452, 303, 398, 832, 236, 778, 616, 589, 346, 674, 647, 566, 242, 215, 432, 405, 595, 785, 189, 358, 569, 664, 590, 361, 780, 456, 348, 419, 676, 311, 406, 244, 786, 190, 705, 624, 651, 597, 570, 543, 219, 409, 362, 335, 231, 421, 611, 706, 801, 896, 598, 369, 788, 680, 464, 315, 653, 572, 410, 248, 221, 601, 364, 659, 422, 802, 775, 613, 451, 370, 708, 559, 343, 235, 654, 425, 127, 222, 317, 412, 602, 792, 688, 661, 614, 804, 480, 453, 426, 372, 399, 318, 833, 237, 779, 617, 712, 347, 604, 675, 567, 243, 662, 433, 359, 454, 665, 834, 238, 428, 618, 591, 808, 781, 457, 376, 349, 677, 434, 407, 245, 787, 191, 625, 720, 571, 666, 836, 363, 782, 620, 458, 350, 678, 246, 707, 436, 626, 897, 599, 816, 789, 681, 465, 573, 411, 249, 668, 365, 460, 840, 423, 803, 898, 736, 371, 790, 709, 682, 628, 466, 655, 574, 250, 223, 440, 413, 603, 793, 366, 689, 615, 710, 805, 481, 900, 427, 373, 684, 468, 319, 414, 848, 252, 794, 713, 632, 605, 690, 663, 806, 482, 455, 374, 835, 239, 429, 619, 714, 809, 904, 606, 377, 796, 472, 435, 692, 721, 667, 484, 430, 864, 837, 810, 783, 621, 459, 378, 716, 351, 679, 247, 437, 627, 722, 817, 912, 696, 669, 838, 622, 812, 488, 461, 380, 841, 438, 899, 818, 737, 791, 683, 629, 467, 724, 575, 251, 670, 441, 367, 462, 842, 738, 711, 928, 630, 901, 820, 496, 685, 469, 442, 415, 849, 253, 795, 633, 728, 691, 844, 807, 483, 902, 740, 375, 686, 470, 850, 254, 715, 444, 634, 905, 607, 824, 797, 473, 693, 485, 431, 865, 960, 811, 906, 852, 744, 379, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 929, 631, 726, 821, 497, 916, 443, 700, 729, 492, 872, 845, 930, 903, 822, 741, 498, 687, 471, 851, 255, 445, 635, 730, 825, 920, 846, 742, 932, 500, 446, 961, 880, 907, 853, 826, 745, 799, 637, 475, 732, 695, 487, 867, 962, 854, 746, 719, 936, 638, 909, 828, 504, 477, 857, 915, 753, 699, 869, 964, 815, 491, 910, 748, 383, 478, 858, 754, 727, 944, 917, 701, 870, 493, 873, 968, 860, 931, 823, 499, 918, 756, 702, 731, 921, 494, 874, 847, 743, 933, 501, 447, 881, 976, 827, 922, 760, 733, 876, 934, 502, 963, 882, 855, 747, 937, 639, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 980, 831, 507, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q93_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 516, 43, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 529, 102, 292, 321, 267, 105, 524, 200, 92, 163, 55, 150, 530, 153, 322, 106, 79, 296, 269, 165, 545, 640, 275, 113, 532, 59, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 580, 107, 526, 202, 297, 94, 392, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 644, 279, 171, 117, 63, 212, 158, 592, 538, 330, 550, 226, 199, 118, 416, 389, 579, 308, 173, 769, 553, 337, 648, 283, 121, 540, 216, 179, 332, 295, 390, 228, 174, 770, 608, 581, 554, 338, 527, 203, 122, 95, 393, 312, 285, 181, 561, 656, 582, 353, 772, 299, 448, 556, 394, 340, 232, 286, 205, 124, 585, 182, 643, 562, 535, 211, 401, 185, 354, 327, 111, 206, 301, 396, 586, 776, 344, 672, 307, 645, 564, 402, 240, 213, 186, 159, 593, 539, 356, 302, 331, 588, 551, 227, 646, 119, 417, 214, 309, 404, 594, 188, 784, 649, 568, 541, 217, 360, 333, 418, 391, 310, 229, 175, 771, 609, 555, 704, 339, 650, 596, 123, 542, 218, 313, 408, 334, 657, 230, 420, 610, 583, 800, 773, 449, 368, 557, 395, 341, 314, 233, 652, 287, 125, 220, 600, 183, 563, 658, 355, 774, 612, 450, 558, 342, 234, 207, 126, 424, 397, 587, 316, 777, 345, 673, 565, 403, 241, 660, 187, 357, 303, 452, 398, 236, 832, 778, 616, 589, 346, 674, 647, 566, 242, 215, 432, 405, 595, 189, 785, 358, 569, 664, 590, 361, 780, 456, 348, 419, 676, 311, 406, 244, 190, 786, 705, 624, 651, 597, 570, 543, 219, 409, 362, 335, 231, 421, 611, 706, 801, 598, 896, 369, 788, 680, 315, 464, 653, 572, 410, 248, 221, 601, 364, 659, 422, 802, 775, 613, 451, 370, 559, 708, 343, 235, 654, 127, 425, 222, 317, 412, 602, 792, 688, 661, 614, 804, 480, 453, 426, 372, 399, 318, 237, 833, 779, 617, 712, 347, 604, 675, 567, 243, 662, 433, 359, 454, 665, 238, 834, 428, 618, 591, 808, 781, 457, 376, 349, 677, 434, 407, 245, 191, 787, 625, 571, 720, 666, 836, 363, 782, 620, 458, 350, 678, 246, 707, 436, 626, 599, 897, 816, 789, 681, 465, 573, 411, 249, 668, 365, 460, 840, 423, 803, 898, 736, 371, 790, 709, 682, 628, 466, 655, 574, 250, 223, 440, 413, 603, 793, 366, 689, 615, 710, 805, 481, 900, 427, 373, 684, 319, 468, 414, 252, 848, 794, 713, 632, 605, 690, 663, 806, 482, 455, 374, 239, 835, 429, 619, 714, 809, 606, 904, 377, 796, 472, 435, 692, 721, 667, 484, 430, 864, 837, 810, 783, 621, 459, 378, 716, 351, 679, 247, 437, 627, 722, 817, 912, 696, 669, 838, 622, 812, 488, 461, 380, 841, 438, 899, 818, 737, 791, 683, 629, 467, 575, 724, 251, 670, 441, 367, 462, 842, 738, 711, 630, 928, 901, 820, 496, 685, 469, 442, 415, 253, 849, 795, 633, 728, 691, 844, 807, 483, 902, 740, 375, 686, 470, 254, 850, 715, 444, 634, 607, 905, 824, 797, 473, 693, 485, 431, 865, 811, 960, 906, 852, 744, 379, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 631, 929, 726, 821, 497, 916, 443, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 964, 491, 910, 748, 383, 478, 858, 754, 727, 944, 917, 701, 870, 493, 873, 968, 860, 931, 823, 499, 918, 756, 702, 731, 921, 494, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 980, 507, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q94_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 516, 43, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 529, 102, 292, 321, 267, 105, 524, 200, 92, 163, 55, 150, 530, 153, 322, 106, 79, 296, 269, 165, 545, 275, 640, 113, 532, 59, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 580, 107, 526, 202, 297, 94, 392, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 279, 644, 171, 117, 63, 212, 158, 592, 538, 330, 550, 226, 199, 118, 416, 389, 579, 308, 173, 769, 553, 337, 283, 648, 121, 540, 216, 179, 332, 295, 390, 228, 174, 770, 608, 581, 554, 338, 527, 203, 122, 95, 393, 312, 285, 181, 561, 656, 582, 353, 772, 299, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 646, 119, 417, 214, 309, 404, 594, 188, 784, 649, 568, 541, 217, 360, 333, 418, 391, 310, 229, 175, 771, 609, 555, 339, 704, 650, 596, 123, 542, 218, 313, 408, 334, 657, 230, 420, 610, 583, 800, 773, 449, 368, 557, 395, 341, 314, 233, 287, 652, 125, 220, 600, 183, 563, 658, 355, 774, 612, 450, 558, 342, 234, 207, 126, 424, 397, 587, 316, 777, 345, 673, 565, 403, 241, 660, 187, 357, 303, 452, 398, 236, 832, 778, 616, 589, 346, 674, 647, 566, 242, 215, 432, 405, 595, 189, 785, 358, 569, 664, 590, 361, 780, 456, 348, 419, 311, 676, 406, 244, 190, 786, 705, 624, 651, 597, 570, 543, 219, 409, 362, 335, 231, 421, 611, 706, 801, 598, 896, 369, 788, 315, 680, 464, 653, 572, 410, 248, 221, 601, 364, 659, 422, 802, 775, 613, 451, 370, 559, 343, 708, 235, 654, 127, 425, 222, 317, 412, 602, 792, 688, 661, 614, 804, 480, 453, 426, 372, 399, 318, 237, 833, 779, 617, 347, 712, 604, 675, 567, 243, 662, 433, 359, 454, 665, 238, 834, 428, 618, 591, 808, 781, 457, 376, 349, 677, 434, 407, 245, 191, 787, 625, 571, 720, 666, 836, 363, 782, 620, 458, 350, 678, 246, 707, 436, 626, 599, 897, 816, 789, 681, 465, 573, 411, 249, 668, 365, 460, 840, 423, 803, 898, 371, 736, 790, 709, 682, 628, 466, 655, 574, 250, 223, 440, 413, 603, 793, 366, 689, 615, 710, 805, 481, 900, 427, 373, 319, 684, 468, 414, 252, 848, 794, 713, 632, 605, 690, 663, 806, 482, 455, 374, 239, 835, 429, 619, 714, 809, 606, 904, 377, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 724, 251, 670, 441, 367, 462, 842, 738, 711, 630, 928, 901, 820, 496, 685, 469, 442, 415, 253, 849, 795, 633, 728, 691, 844, 807, 483, 902, 375, 740, 686, 470, 254, 850, 715, 444, 634, 607, 905, 824, 797, 473, 693, 485, 431, 865, 811, 960, 906, 852, 379, 744, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 631, 929, 726, 821, 497, 916, 443, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 964, 491, 910, 383, 748, 478, 858, 754, 727, 944, 917, 701, 870, 493, 873, 968, 860, 931, 823, 499, 918, 756, 702, 731, 921, 494, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 980, 507, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q95_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 43, 516, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 529, 102, 292, 321, 267, 105, 524, 200, 92, 163, 55, 150, 530, 153, 322, 106, 79, 296, 269, 165, 545, 275, 640, 113, 59, 532, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 107, 580, 526, 202, 297, 94, 392, 284, 180, 641, 560, 533, 209, 155, 352, 325, 298, 271, 109, 204, 584, 167, 547, 642, 115, 534, 210, 305, 400, 184, 157, 326, 537, 110, 300, 329, 549, 387, 306, 225, 279, 171, 644, 117, 63, 212, 158, 592, 538, 330, 550, 226, 199, 118, 416, 389, 308, 579, 173, 769, 553, 337, 283, 648, 121, 540, 216, 179, 332, 295, 390, 228, 174, 770, 608, 581, 554, 338, 527, 203, 122, 95, 393, 312, 285, 181, 561, 656, 582, 353, 299, 772, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 646, 119, 417, 214, 309, 404, 594, 188, 784, 649, 568, 541, 217, 360, 333, 418, 391, 310, 229, 175, 771, 609, 555, 339, 704, 650, 123, 596, 542, 218, 313, 408, 334, 657, 230, 420, 610, 583, 800, 773, 449, 368, 557, 395, 341, 314, 233, 287, 652, 125, 220, 600, 183, 563, 658, 355, 774, 612, 450, 558, 342, 234, 207, 126, 424, 397, 316, 587, 777, 345, 673, 565, 403, 241, 187, 660, 357, 303, 452, 398, 236, 832, 778, 616, 589, 346, 674, 647, 566, 242, 215, 432, 405, 595, 189, 785, 358, 569, 664, 590, 361, 780, 456, 348, 419, 311, 676, 406, 244, 190, 786, 705, 624, 651, 597, 570, 543, 219, 409, 362, 335, 231, 421, 611, 706, 801, 598, 896, 369, 315, 788, 680, 464, 653, 572, 410, 248, 221, 601, 364, 659, 422, 802, 775, 613, 451, 370, 559, 343, 235, 708, 654, 127, 425, 222, 317, 412, 602, 792, 688, 661, 614, 804, 480, 453, 426, 372, 399, 318, 237, 833, 779, 617, 347, 712, 604, 675, 567, 243, 662, 433, 359, 454, 665, 238, 834, 428, 618, 591, 808, 781, 457, 376, 349, 677, 434, 407, 245, 191, 787, 625, 571, 720, 666, 363, 836, 782, 620, 458, 350, 678, 246, 436, 707, 626, 599, 897, 816, 789, 681, 465, 573, 411, 249, 668, 365, 460, 840, 423, 803, 898, 371, 736, 790, 709, 682, 628, 466, 655, 574, 250, 223, 440, 413, 603, 793, 366, 689, 615, 710, 805, 481, 427, 900, 373, 319, 684, 468, 414, 252, 848, 794, 713, 632, 605, 690, 663, 806, 482, 455, 374, 239, 835, 429, 619, 714, 809, 606, 904, 377, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 251, 724, 670, 441, 367, 462, 842, 738, 711, 630, 928, 901, 820, 496, 685, 469, 442, 415, 253, 849, 795, 633, 728, 691, 844, 807, 483, 902, 375, 740, 686, 470, 254, 850, 444, 715, 634, 607, 905, 824, 797, 473, 693, 485, 431, 865, 811, 960, 906, 379, 852, 744, 798, 717, 636, 474, 694, 723, 913, 486, 697, 866, 839, 623, 718, 813, 489, 908, 381, 476, 856, 439, 819, 914, 752, 725, 698, 671, 868, 814, 490, 463, 382, 843, 739, 631, 929, 726, 821, 497, 443, 916, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 491, 964, 910, 383, 748, 478, 858, 754, 727, 944, 917, 701, 870, 493, 873, 968, 860, 931, 823, 499, 918, 756, 702, 731, 921, 494, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 507, 980, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q96_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 43, 516, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 102, 529, 292, 321, 267, 105, 524, 200, 92, 163, 55, 150, 530, 153, 322, 106, 79, 296, 269, 165, 545, 275, 113, 640, 59, 532, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 107, 580, 526, 202, 297, 94, 392, 284, 180, 641, 560, 533, 209, 155, 352, 325, 298, 271, 109, 204, 584, 167, 547, 115, 642, 534, 210, 305, 400, 184, 157, 326, 110, 537, 300, 329, 549, 387, 306, 225, 279, 171, 117, 644, 63, 212, 158, 592, 538, 330, 550, 226, 199, 118, 416, 389, 308, 579, 173, 769, 553, 337, 283, 121, 648, 540, 216, 179, 332, 295, 390, 228, 174, 770, 608, 581, 554, 338, 527, 203, 122, 95, 393, 312, 285, 181, 561, 656, 582, 353, 299, 772, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 119, 646, 417, 214, 309, 404, 594, 188, 784, 649, 568, 541, 217, 360, 333, 418, 391, 310, 229, 175, 771, 609, 555, 339, 704, 123, 650, 596, 542, 218, 313, 408, 334, 230, 657, 420, 610, 583, 800, 773, 449, 368, 557, 395, 341, 314, 233, 287, 125, 652, 220, 600, 183, 563, 658, 355, 774, 612, 450, 558, 342, 234, 207, 126, 424, 397, 316, 587, 777, 345, 673, 565, 403, 241, 187, 660, 357, 303, 452, 398, 236, 832, 778, 616, 589, 346, 674, 647, 566, 242, 215, 432, 405, 595, 189, 358, 785, 569, 664, 590, 361, 780, 456, 348, 419, 311, 676, 406, 244, 190, 786, 705, 624, 651, 597, 570, 543, 219, 409, 362, 335, 231, 421, 611, 706, 801, 598, 369, 896, 315, 788, 680, 464, 653, 572, 410, 248, 221, 601, 364, 659, 422, 802, 775, 613, 451, 370, 559, 343, 235, 708, 127, 654, 425, 222, 317, 412, 602, 792, 688, 661, 614, 804, 480, 453, 426, 372, 399, 318, 237, 833, 779, 617, 347, 712, 604, 675, 567, 243, 662, 433, 359, 454, 238, 665, 834, 428, 618, 591, 808, 781, 457, 376, 349, 677, 434, 407, 245, 191, 787, 625, 571, 720, 666, 363, 836, 782, 620, 458, 350, 678, 246, 436, 707, 626, 599, 897, 816, 789, 681, 465, 573, 411, 249, 668, 365, 460, 840, 423, 803, 371, 898, 736, 790, 709, 682, 628, 466, 655, 574, 250, 223, 440, 413, 603, 366, 793, 689, 615, 710, 805, 481, 427, 373, 900, 319, 684, 468, 414, 252, 848, 794, 713, 632, 605, 690, 663, 806, 482, 455, 374, 239, 835, 429, 619, 714, 809, 606, 377, 904, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 251, 724, 670, 441, 367, 462, 842, 738, 711, 630, 928, 901, 820, 496, 685, 469, 442, 415, 253, 849, 795, 633, 728, 691, 844, 807, 483, 375, 902, 740, 686, 470, 254, 850, 444, 715, 634, 607, 905, 824, 797, 473, 693, 485, 431, 865, 811, 960, 379, 906, 852, 744, 798, 717, 636, 474, 694, 723, 486, 913, 697, 866, 839, 623, 718, 813, 489, 381, 908, 476, 856, 439, 819, 914, 752, 725, 698, 671, 868, 814, 490, 463, 382, 843, 739, 631, 929, 726, 821, 497, 443, 916, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 491, 964, 383, 910, 748, 478, 858, 754, 727, 944, 917, 701, 870, 493, 873, 968, 860, 931, 823, 499, 918, 756, 702, 731, 494, 921, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 507, 980, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q97_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 43, 516, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 102, 529, 292, 321, 267, 105, 524, 200, 92, 163, 55, 150, 530, 153, 322, 106, 79, 296, 269, 165, 545, 275, 113, 640, 59, 532, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 107, 580, 526, 202, 297, 94, 392, 284, 180, 641, 560, 533, 209, 155, 352, 325, 298, 271, 109, 204, 167, 584, 547, 115, 642, 534, 210, 305, 400, 184, 157, 326, 110, 537, 300, 329, 549, 387, 306, 225, 279, 171, 117, 644, 63, 212, 158, 592, 538, 330, 550, 226, 199, 118, 416, 389, 308, 579, 173, 769, 553, 337, 283, 121, 648, 540, 216, 179, 332, 295, 390, 228, 174, 770, 608, 581, 554, 338, 527, 203, 122, 95, 393, 312, 285, 181, 561, 656, 582, 353, 299, 772, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 119, 646, 417, 214, 309, 404, 594, 188, 784, 649, 568, 541, 217, 360, 333, 418, 391, 310, 229, 175, 771, 609, 555, 339, 704, 123, 650, 596, 542, 218, 313, 408, 334, 230, 657, 420, 610, 583, 800, 773, 449, 368, 557, 395, 341, 314, 233, 287, 125, 652, 220, 183, 600, 563, 658, 355, 774, 612, 450, 558, 342, 234, 207, 126, 424, 397, 316, 587, 777, 345, 673, 565, 403, 241, 187, 660, 357, 303, 452, 398, 236, 832, 778, 616, 589, 346, 674, 647, 566, 242, 215, 432, 405, 595, 189, 358, 785, 569, 664, 590, 361, 780, 456, 348, 419, 311, 676, 406, 244, 190, 786, 705, 624, 651, 597, 570, 543, 219, 409, 362, 335, 231, 421, 611, 706, 801, 598, 369, 896, 315, 788, 680, 464, 653, 572, 410, 248, 221, 601, 364, 659, 422, 802, 775, 613, 451, 370, 559, 343, 235, 708, 127, 654, 425, 222, 317, 412, 602, 792, 688, 661, 614, 804, 480, 453, 426, 372, 399, 318, 237, 833, 779, 617, 347, 712, 604, 675, 567, 243, 662, 433, 359, 454, 238, 665, 834, 428, 618, 591, 808, 781, 457, 376, 349, 677, 434, 407, 245, 191, 787, 625, 571, 720, 666, 363, 836, 782, 620, 458, 350, 678, 246, 436, 707, 626, 599, 897, 816, 789, 681, 465, 573, 411, 249, 668, 365, 460, 423, 840, 803, 371, 898, 736, 790, 709, 682, 628, 466, 655, 574, 250, 223, 440, 413, 603, 366, 793, 689, 615, 710, 805, 481, 427, 373, 900, 319, 684, 468, 414, 252, 848, 794, 713, 632, 605, 690, 663, 806, 482, 455, 374, 239, 835, 429, 619, 714, 809, 606, 377, 904, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 251, 724, 670, 441, 367, 462, 842, 738, 711, 630, 928, 901, 820, 496, 685, 469, 442, 415, 253, 849, 795, 633, 728, 691, 844, 807, 483, 375, 902, 740, 686, 470, 254, 850, 444, 715, 634, 607, 905, 824, 797, 473, 693, 485, 431, 865, 811, 960, 379, 906, 852, 744, 798, 717, 636, 474, 694, 723, 486, 913, 697, 866, 839, 623, 718, 813, 489, 381, 908, 476, 439, 856, 819, 914, 752, 725, 698, 671, 868, 814, 490, 463, 382, 843, 739, 631, 929, 726, 821, 497, 443, 916, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 491, 964, 383, 910, 748, 478, 858, 754, 727, 944, 917, 701, 870, 493, 873, 968, 860, 931, 823, 499, 918, 756, 702, 731, 494, 921, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 507, 980, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q98_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 43, 516, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 289, 86, 384, 276, 168, 141, 60, 521, 89, 147, 290, 263, 101, 47, 196, 142, 576, 522, 90, 280, 176, 149, 102, 529, 292, 321, 267, 105, 524, 200, 92, 163, 55, 150, 530, 153, 322, 106, 79, 296, 269, 165, 545, 275, 113, 59, 640, 532, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 578, 172, 768, 552, 336, 525, 282, 201, 120, 93, 178, 151, 531, 294, 323, 107, 580, 526, 202, 297, 94, 392, 284, 180, 641, 560, 533, 209, 155, 352, 325, 298, 271, 109, 204, 167, 584, 547, 115, 642, 534, 210, 305, 400, 184, 157, 326, 110, 537, 300, 329, 549, 387, 306, 225, 279, 171, 117, 63, 644, 212, 158, 592, 538, 330, 550, 226, 199, 118, 416, 389, 308, 579, 173, 769, 553, 337, 283, 121, 648, 540, 216, 179, 332, 295, 390, 228, 174, 770, 608, 581, 554, 338, 527, 203, 122, 95, 393, 312, 285, 181, 561, 656, 582, 353, 299, 772, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 119, 646, 417, 214, 309, 404, 594, 188, 784, 649, 568, 541, 217, 360, 333, 418, 391, 310, 229, 175, 771, 609, 555, 339, 123, 704, 650, 596, 542, 218, 313, 408, 334, 230, 657, 420, 610, 583, 800, 773, 449, 368, 557, 395, 341, 314, 233, 287, 125, 652, 220, 183, 600, 563, 658, 355, 774, 612, 450, 558, 342, 234, 207, 126, 424, 397, 316, 587, 777, 345, 673, 565, 403, 241, 187, 660, 357, 303, 452, 398, 236, 832, 778, 616, 589, 346, 674, 647, 566, 242, 215, 432, 405, 595, 189, 358, 785, 569, 664, 590, 361, 780, 456, 348, 419, 311, 676, 406, 244, 190, 786, 705, 624, 651, 597, 570, 543, 219, 409, 362, 335, 231, 421, 611, 706, 801, 598, 369, 315, 896, 788, 680, 464, 653, 572, 410, 248, 221, 601, 364, 659, 422, 802, 775, 613, 451, 370, 559, 343, 235, 127, 708, 654, 425, 222, 317, 412, 602, 792, 688, 661, 614, 804, 480, 453, 426, 372, 399, 318, 237, 833, 779, 617, 347, 712, 604, 675, 567, 243, 662, 433, 359, 454, 238, 665, 834, 428, 618, 591, 808, 781, 457, 376, 349, 677, 434, 407, 245, 191, 787, 625, 571, 720, 666, 363, 836, 782, 620, 458, 350, 678, 246, 436, 707, 626, 599, 897, 816, 789, 681, 465, 573, 411, 249, 668, 365, 460, 423, 840, 803, 371, 898, 736, 790, 709, 682, 628, 466, 655, 574, 250, 223, 440, 413, 603, 366, 793, 689, 615, 710, 805, 481, 427, 373, 319, 900, 684, 468, 414, 252, 848, 794, 713, 632, 605, 690, 663, 806, 482, 455, 374, 239, 835, 429, 619, 714, 809, 606, 377, 904, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 251, 724, 670, 441, 367, 462, 842, 738, 711, 630, 928, 901, 820, 496, 685, 469, 442, 415, 253, 849, 795, 633, 728, 691, 844, 807, 483, 375, 902, 740, 686, 470, 254, 850, 444, 715, 634, 607, 905, 824, 797, 473, 693, 485, 431, 865, 811, 379, 960, 906, 852, 744, 798, 717, 636, 474, 694, 723, 486, 913, 697, 866, 839, 623, 718, 813, 489, 381, 908, 476, 439, 856, 819, 914, 752, 725, 698, 671, 868, 814, 490, 463, 382, 843, 739, 631, 929, 726, 821, 497, 443, 916, 700, 729, 492, 872, 845, 930, 903, 822, 741, 498, 687, 471, 255, 851, 445, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 491, 383, 964, 910, 748, 478, 858, 754, 727, 944, 917, 701, 870, 493, 873, 968, 860, 931, 823, 499, 918, 756, 702, 731, 494, 921, 874, 847, 743, 933, 501, 447, 881, 827, 976, 922, 760, 733, 876, 934, 502, 963, 882, 855, 747, 639, 937, 734, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 507, 980, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q99_1^{1024}$=[0, 1, 2, 4, 8, 16, 3, 32, 5, 6, 9, 64, 10, 17, 12, 18, 33, 128, 20, 34, 7, 24, 36, 65, 11, 66, 256, 40, 13, 19, 68, 14, 129, 48, 21, 72, 35, 130, 22, 25, 37, 132, 512, 80, 26, 38, 67, 257, 41, 136, 28, 258, 96, 69, 42, 15, 49, 144, 70, 260, 44, 73, 131, 50, 23, 74, 264, 160, 133, 52, 513, 81, 27, 76, 39, 134, 514, 82, 272, 137, 56, 29, 259, 97, 43, 516, 192, 138, 84, 30, 145, 98, 71, 288, 261, 45, 140, 520, 88, 51, 146, 262, 100, 46, 75, 265, 161, 53, 148, 528, 320, 266, 104, 77, 162, 135, 54, 515, 83, 273, 57, 152, 78, 268, 164, 544, 517, 274, 193, 112, 139, 85, 58, 31, 99, 518, 194, 86, 289, 384, 276, 168, 141, 60, 521, 89, 147, 290, 263, 101, 47, 196, 142, 576, 522, 90, 280, 176, 149, 102, 529, 292, 321, 267, 105, 524, 200, 92, 163, 55, 150, 530, 153, 322, 106, 79, 296, 269, 165, 545, 275, 113, 59, 640, 532, 208, 154, 324, 270, 108, 166, 546, 519, 195, 114, 87, 385, 304, 277, 169, 61, 156, 536, 328, 291, 548, 386, 224, 278, 197, 170, 116, 143, 62, 577, 523, 91, 281, 177, 103, 198, 293, 388, 172, 578, 768, 552, 336, 525, 282, 201, 120, 93, 178, 151, 531, 294, 323, 107, 580, 526, 202, 94, 297, 392, 284, 180, 641, 560, 533, 209, 155, 352, 325, 298, 271, 109, 204, 167, 584, 547, 115, 642, 534, 210, 305, 400, 184, 157, 326, 110, 537, 300, 329, 549, 387, 306, 225, 279, 171, 117, 63, 644, 212, 158, 592, 538, 330, 550, 226, 199, 118, 416, 389, 308, 173, 579, 769, 553, 337, 283, 121, 648, 540, 216, 179, 332, 295, 390, 228, 174, 770, 608, 581, 554, 338, 527, 203, 122, 95, 393, 312, 285, 181, 561, 656, 582, 353, 299, 772, 448, 556, 394, 340, 232, 286, 205, 124, 585, 182, 643, 562, 535, 211, 401, 185, 354, 327, 111, 206, 301, 396, 586, 776, 344, 307, 672, 645, 564, 402, 240, 213, 186, 159, 593, 539, 356, 302, 331, 588, 551, 227, 119, 646, 214, 417, 309, 404, 188, 594, 784, 649, 568, 541, 217, 360, 333, 418, 391, 310, 229, 175, 771, 609, 555, 339, 123, 704, 650, 596, 542, 218, 313, 408, 334, 230, 657, 420, 610, 583, 800, 773, 449, 368, 557, 395, 341, 314, 233, 287, 125, 652, 220, 183, 600, 563, 658, 355, 774, 612, 450, 558, 342, 234, 207, 126, 424, 397, 316, 587, 777, 345, 673, 565, 403, 241, 187, 660, 357, 303, 452, 398, 236, 832, 778, 616, 589, 346, 674, 647, 566, 242, 215, 432, 405, 189, 595, 358, 785, 569, 664, 590, 361, 780, 456, 348, 419, 311, 676, 406, 244, 190, 786, 705, 624, 651, 597, 570, 543, 219, 409, 362, 335, 231, 421, 611, 706, 598, 801, 369, 315, 896, 788, 680, 464, 653, 572, 410, 248, 221, 601, 364, 659, 422, 802, 775, 613, 451, 370, 559, 343, 235, 127, 708, 654, 222, 425, 317, 412, 602, 792, 688, 661, 614, 804, 480, 453, 426, 372, 399, 318, 237, 833, 779, 617, 347, 712, 604, 675, 567, 243, 662, 433, 359, 454, 238, 665, 428, 834, 618, 591, 808, 781, 457, 376, 349, 677, 434, 407, 245, 191, 787, 625, 571, 720, 666, 363, 836, 782, 620, 458, 350, 678, 246, 436, 707, 626, 599, 897, 816, 789, 681, 465, 573, 411, 249, 668, 365, 460, 423, 840, 803, 371, 898, 736, 790, 709, 682, 628, 466, 655, 574, 250, 223, 440, 413, 603, 366, 793, 689, 615, 710, 805, 481, 427, 373, 319, 900, 684, 468, 414, 252, 848, 794, 713, 632, 605, 690, 663, 806, 482, 455, 374, 239, 429, 835, 619, 714, 606, 809, 377, 904, 796, 472, 435, 692, 721, 667, 484, 430, 864, 837, 810, 783, 621, 459, 378, 351, 716, 679, 247, 437, 627, 722, 817, 912, 696, 669, 838, 622, 812, 488, 461, 380, 841, 438, 899, 818, 737, 791, 683, 629, 467, 575, 251, 724, 670, 441, 367, 462, 842, 738, 711, 630, 928, 901, 820, 496, 685, 469, 442, 415, 253, 849, 795, 633, 728, 691, 844, 807, 483, 375, 902, 740, 686, 470, 254, 444, 850, 715, 634, 607, 905, 824, 797, 473, 693, 485, 431, 865, 811, 379, 960, 906, 852, 744, 798, 717, 636, 474, 694, 723, 486, 913, 697, 866, 839, 623, 718, 813, 489, 381, 908, 476, 439, 856, 819, 914, 752, 725, 698, 671, 868, 814, 490, 463, 382, 843, 739, 631, 726, 929, 821, 497, 443, 916, 700, 729, 492, 872, 845, 930, 903, 822, 741, 498, 687, 471, 255, 445, 851, 635, 730, 825, 920, 846, 742, 932, 500, 446, 961, 880, 907, 853, 826, 745, 799, 637, 475, 732, 695, 487, 867, 962, 854, 746, 719, 638, 936, 909, 828, 504, 477, 857, 915, 753, 699, 869, 815, 491, 383, 964, 910, 748, 478, 858, 754, 727, 944, 917, 701, 870, 493, 873, 968, 860, 931, 823, 499, 918, 756, 702, 731, 494, 921, 874, 847, 743, 933, 501, 447, 881, 827, 976, 922, 760, 733, 876, 934, 502, 963, 882, 855, 747, 639, 734, 937, 829, 505, 924, 992, 965, 938, 884, 911, 830, 749, 506, 479, 859, 755, 945, 871, 966, 750, 940, 508, 969, 888, 861, 946, 919, 757, 703, 495, 875, 970, 862, 758, 948, 977, 923, 761, 877, 972, 935, 503, 883, 978, 762, 735, 952, 925, 878, 993, 939, 885, 831, 507, 980, 926, 764, 994, 967, 886, 751, 941, 509, 889, 984, 947, 996, 942, 510, 971, 890, 863, 759, 949, 1000, 973, 892, 950, 979, 763, 953, 879, 974, 1008, 981, 954, 927, 765, 995, 887, 982, 766, 956, 985, 997, 943, 511, 891, 986, 998, 1001, 893, 988, 951, 1002, 975, 894, 1009, 955, 1004, 1010, 983, 767, 957, 1012, 958, 987, 999, 1016, 989, 1003, 895, 990, 1005, 1011, 1006, 1013, 959, 1014, 1017, 1018, 991, 1020, 1007, 1015, 1019, 1021, 1022, 1023];

$Q100_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 514, 29, 56, 137, 272, 43, 97, 259, 30, 84, 138, 192, 516, 145, 71, 98, 45, 261, 288, 140, 88, 520, 51, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 200, 524, 55, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 580, 297, 284, 392, 180, 155, 209, 533, 560, 641, 109, 271, 298, 325, 352, 204, 167, 584, 115, 547, 210, 534, 642, 305, 157, 184, 400, 110, 326, 537, 300, 329, 63, 117, 171, 279, 225, 306, 387, 549, 158, 212, 644, 538, 592, 330, 118, 199, 226, 550, 173, 308, 389, 416, 579, 121, 283, 337, 553, 769, 216, 540, 648, 179, 332, 295, 174, 228, 390, 95, 122, 203, 527, 338, 554, 581, 608, 770, 285, 312, 393, 181, 561, 656, 582, 299, 353, 124, 205, 286, 232, 340, 394, 556, 448, 772, 585, 182, 211, 535, 562, 643, 185, 401, 111, 327, 354, 206, 301, 396, 586, 344, 776, 307, 159, 186, 213, 240, 402, 564, 645, 672, 539, 593, 302, 356, 331, 588, 119, 227, 551, 214, 646, 309, 417, 188, 404, 594, 217, 541, 568, 649, 784, 333, 360, 175, 229, 310, 391, 418, 123, 339, 555, 609, 771, 218, 542, 596, 650, 704, 313, 408, 334, 230, 657, 420, 583, 610, 125, 287, 233, 314, 341, 395, 557, 368, 449, 773, 800, 220, 652, 183, 600, 563, 658, 355, 126, 207, 234, 342, 558, 450, 612, 774, 316, 397, 424, 587, 345, 777, 187, 241, 403, 565, 673, 660, 303, 357, 236, 398, 452, 346, 589, 616, 778, 832, 215, 242, 566, 647, 674, 189, 405, 432, 595, 358, 569, 785, 664, 590, 361, 348, 456, 780, 311, 419, 190, 244, 406, 676, 219, 543, 570, 597, 651, 624, 705, 786, 409, 335, 362, 231, 421, 611, 598, 706, 315, 369, 801, 221, 248, 410, 572, 653, 464, 680, 788, 896, 601, 364, 659, 422, 127, 235, 343, 559, 370, 451, 613, 775, 802, 222, 654, 708, 317, 425, 412, 602, 792, 661, 688, 614, 237, 318, 399, 372, 426, 453, 480, 804, 347, 617, 779, 833, 604, 712, 243, 567, 675, 662, 433, 359, 238, 454, 665, 428, 591, 618, 834, 349,
376, 457, 781, 808, 191, 245, 407, 434, 677, 571, 625, 787,
666, 720, 363, 350, 458, 620, 782, 836, 246, 678, 436, 599,
626, 707, 249, 411, 573, 465, 681, 789, 816, 897, 668, 365,
460, 423, 840, 371, 803, 223, 250, 574, 655, 466, 628, 682,
709, 790, 736, 898, 413, 440, 603, 366, 793, 689, 615, 710,
319, 373, 427, 481, 805, 252, 414, 468, 684, 900, 605, 632,
713, 794, 848, 663, 690, 239, 374, 455, 482, 806, 429, 619,
835, 606, 714, 377, 809, 472, 796, 904, 435, 692, 667, 721,
430, 484, 351, 378, 459, 621, 783, 810, 837, 864, 716, 247,
679, 437, 627, 722, 817, 669, 696, 912, 622, 838, 380, 461,
488, 812, 841, 438, 251, 575, 467, 629, 683, 791, 737, 818,
899, 670, 724, 441, 367, 462, 842, 630, 711, 738, 253, 415,
442, 469, 685, 496, 820, 901, 928, 633, 795, 849, 728, 691,
844, 375, 483, 807, 254, 470, 686, 740, 902, 444, 607, 634,
715, 850, 473, 797, 824, 905, 693, 431, 485, 379, 811, 865,
474, 636, 717, 798, 744, 852, 906, 960, 694, 723, 486, 697,
913, 623, 839, 866, 718, 381, 489, 813, 476, 908, 439, 856,
819, 671, 698, 725, 752, 914, 382, 463, 490, 814, 868, 843,
631, 739, 726, 443, 497, 821, 929, 700, 916, 729, 492, 845,
872, 255, 471, 687, 498, 741, 822, 903, 930, 445, 635, 851,
730, 825, 920, 846, 742, 446, 500, 932, 475, 637, 799, 745,
826, 853, 907, 880, 961, 732, 695, 487, 867, 638, 719, 746,
854, 962, 477, 504, 828, 909, 936, 857, 699, 753, 915, 383,
491, 815, 869, 478, 748, 910, 964, 858, 727, 754, 701, 917,
944, 870, 493, 873, 860, 968, 499, 823, 931, 702, 756, 918,
731, 494, 921, 847, 874, 743, 447, 501, 933, 827, 881, 733,
760, 922, 976, 876, 502, 934, 639, 747, 855, 882, 963, 734,
505, 829, 937, 924, 479, 506, 749, 830, 911, 884, 938, 965,
992, 859, 755, 945, 871, 750, 966, 508, 940, 861, 888, 969,
703, 757, 919, 946, 495, 875, 862, 970, 758, 948, 761, 923,
977, 877, 972, 503, 935, 883, 735, 762, 978, 925, 952, 878,
507, 831, 885, 939, 993, 764, 926, 980, 751, 886, 967, 994,
509, 941, 889, 984, 947, 510, 942, 996, 863, 890, 971, 759,
949, 892, 973, 1000, 950, 763, 979, 953, 879, 974, 765, 927,
954, 981, 1008, 887, 995, 766, 982, 956, 985, 511, 943, 997,
891, 986, 998, 893, 1001, 988, 951, 894, 975, 1002, 955,
1009, 1004, 767, 983, 1010, 957, 958, 1012, 987, 999, 989,
1016, 895, 1003, 990, 1005, 1011, 1006, 959, 1013, 1014,
1017, 991, 1018, 1020, 1007, 1015, 1019, 1021, 1022,
1023];

$Q101_1^{1024}$=[0, 1, 2, 4, 8, 16, 3, 5, 32, 6, 9, 10, 64, 17, 12,
18, 33, 20, 128, 7, 34, 24, 36, 11, 65, 66, 13, 40, 256, 19, 14,
68, 21, 48, 129, 72, 35, 22, 130, 25, 37, 132, 26, 80, 512, 38,
67, 41, 257, 28, 136, 15, 42, 69, 96, 258, 49, 144, 70, 44,
260, 73, 23, 50, 131, 74, 264, 52, 133, 160, 27, 81, 513, 76,
39, 134, 82, 514, 29, 56, 137, 272, 43, 97, 259, 30, 84, 138,
192, 516, 145, 71, 98, 45, 261, 288, 140, 88, 520, 51, 146,
46, 100, 262, 75, 265, 53, 161, 148, 528, 77, 104, 266, 320,
54, 135, 162, 83, 515, 57, 273, 152, 78, 268, 164, 31, 58, 85,
139, 112, 193, 274, 517, 544, 99, 86, 194, 518, 289, 60, 141,
168, 276, 384, 89, 521, 147, 47, 101, 263, 290, 142, 196, 90,
522, 576, 280, 149, 176, 102, 529, 292, 105, 267, 321, 92,
200, 524, 55, 163, 150, 530, 153, 79, 106, 322, 269, 296,
165, 59, 113, 275, 545, 154, 208, 532, 640, 108, 270, 324,
166, 87, 114, 195, 519, 546, 61, 169, 277, 304, 385, 156,
536, 328, 291, 62, 143, 116, 170, 197, 278, 224, 386, 548,
91, 523, 577, 281, 177, 103, 198, 293, 172, 388, 578, 93,
120, 201, 282, 525, 336, 552, 768, 151, 178, 531, 294, 107,
323, 94, 202, 526, 580, 297, 284, 392, 180, 155, 209, 533,
560, 641, 109, 271, 298, 325, 352, 204, 167, 584, 115, 547,
210, 534, 642, 305, 157, 184, 400, 110, 326, 537, 300, 329,
63, 117, 171, 279, 225, 306, 387, 549, 158, 212, 644, 538,
592, 330, 118, 199, 226, 550, 173, 308, 389, 416, 579, 121,
283, 337, 553, 769, 216, 540, 648, 179, 332, 295, 174, 228,
390, 95, 122, 203, 527, 338, 554, 581, 608, 770, 285, 312,
393, 181, 561, 656, 582, 299, 353, 124, 205, 286, 232, 340,
394, 556, 448, 772, 585, 182, 211, 535, 562, 643, 185, 401,
111, 327, 354, 206, 301, 396, 586, 344, 776, 307, 159, 186,
213, 240, 402, 564, 645, 672, 539, 593, 302, 356, 331, 588,
119, 227, 551, 214, 646, 309, 417, 188, 404, 594, 217, 541,
568, 649, 784, 333, 360, 175, 229, 310, 391, 418, 123, 339,
555, 609, 771, 218, 542, 596, 650, 313, 704, 408, 334, 230,
657, 420, 583, 610, 125, 287, 233, 314, 341, 395, 557, 368,
449, 773, 800, 220, 652, 183, 600, 563, 658, 355, 126, 207,
234, 342, 558, 450, 612, 774, 316, 397, 424, 587, 345, 777,
187, 241, 403, 565, 673, 660, 303, 357, 236, 398, 452, 346,
589, 616, 778, 832, 215, 242, 566, 647, 674, 189, 405, 432,
595, 358, 569, 785, 664, 590, 361, 348, 456, 780, 311, 419,
190, 244, 406, 676, 219, 543, 570, 597, 651, 624, 705, 786,
409, 335, 362, 231, 421, 611, 598, 315, 706, 369, 801, 221,
248, 410, 572, 653, 464, 680, 788, 896, 601, 364, 659, 422,
127, 235, 343, 559, 370, 451, 613, 775, 802, 222, 654, 317,
708, 425, 412, 602, 792, 661, 688, 614, 237, 318, 399, 372,
426, 453, 480, 804, 347, 617, 779, 833, 604, 712, 243, 567,
675, 662, 433, 359, 238, 454, 665, 428, 591, 618, 834, 349,
376, 457, 781, 808, 191, 245, 407, 434, 677, 571, 625, 787,
666, 720, 363, 350, 458, 620, 782, 836, 246, 678, 436, 599,
626, 707, 249, 411, 573, 465, 681, 789, 816, 897, 668, 365,
460, 423, 840, 371, 803, 223, 250, 574, 655, 466, 628, 682,
709, 790, 736, 898, 413, 440, 603, 366, 793, 689, 615, 319,
710, 373, 427, 481, 805, 252, 414, 468, 684, 900, 605, 632,
713, 794, 848, 663, 690, 239, 374, 455, 482, 806, 429, 619,
835, 606, 714, 377, 809, 472, 796, 904, 435, 692, 667, 721,
430, 484, 351, 378, 459, 621, 783, 810, 837, 864, 716, 247,
679, 437, 627, 722, 817, 669, 696, 912, 622, 838, 380, 461,
488, 812, 841, 438, 251, 575, 467, 629, 683, 791, 737, 818,
899, 670, 724, 441, 367, 462, 842, 630, 711, 738, 253, 415,
442, 469, 685, 496, 820, 901, 928, 633, 795, 849, 728, 691,
844, 375, 483, 807, 254, 470, 686, 740, 902, 444, 607, 634,
715, 850, 473, 797, 824, 905, 693, 431, 485, 379, 811, 865,
474, 636, 717, 798, 744, 852, 906, 960, 694, 723, 486, 697,
913, 623, 839, 866, 718, 381, 489, 813, 476, 908, 439, 856,
819, 671, 698, 725, 752, 914, 382, 463, 490, 814, 868, 843,
631, 739, 726, 443, 497, 821, 929, 700, 916, 729, 492, 845,
872, 255, 471, 687, 498, 741, 822, 903, 930, 445, 635, 851,
730, 825, 920, 846, 742, 446, 500, 932, 475, 637, 799, 745,
826, 853, 907, 880, 961, 732, 695, 487, 867, 638, 719, 746,
854, 962, 477, 504, 828, 909, 936, 857, 699, 753, 915, 383,
491, 815, 869, 478, 748, 910, 964, 858, 727, 754, 701, 917,
944, 870, 493, 873, 860, 968, 499, 823, 931, 702, 756, 918,
731, 494, 921, 847, 874, 743, 447, 501, 933, 827, 881, 733,
760, 922, 976, 876, 502, 934, 639, 747, 855, 882, 963, 734,
505, 829, 937, 924, 479, 506, 749, 830, 911, 884, 938, 965,
992, 859, 755, 945, 871, 750, 966, 508, 940, 861, 888, 969,
703, 757, 919, 946, 495, 875, 862, 970, 758, 948, 761, 923,
977, 877, 972, 503, 935, 883, 735, 762, 978, 925, 952, 878,
507, 831, 885, 939, 993, 764, 926, 980, 751, 886, 967, 994,
509, 941, 889, 984, 947, 510, 942, 996, 863, 890, 971, 759,
949, 892, 973, 1000, 950, 763, 979, 953, 879, 974, 765, 927,
954, 981, 1008, 887, 995, 766, 982, 956, 985, 511, 943, 997,
891, 986, 998, 893, 1001, 988, 951, 894, 975, 1002, 955,
1009, 1004, 767, 983, 1010, 957, 958, 1012, 987, 999, 989,
1016, 895, 1003, 990, 1005, 1011, 1006, 959, 1013, 1014,
1017, 991, 1018, 1020, 1007, 1015, 1019, 1021, 1022,
1023];

$Q102_1^{1024}$=[0, 1, 2, 4, 8, 16, 3, 5, 32, 6, 9, 10, 64, 17, 12,
18, 33, 20, 128, 7, 34, 24, 36, 11, 65, 66, 13, 40, 256, 19, 14,
68, 21, 48, 129, 72, 35, 22, 130, 25, 37, 132, 26, 80, 512, 38,
67, 41, 257, 28, 136, 15, 42, 69, 96, 258, 49, 144, 70, 44,
260, 73, 23, 50, 131, 74, 264, 52, 133, 160, 27, 81, 513, 76,
39, 134, 82, 514, 29, 56, 137, 272, 43, 97, 259, 30, 84, 138,
192, 516, 145, 71, 98, 45, 261, 288, 140, 88, 520, 51, 146,
46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 200, 524, 55, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 584, 115, 547, 210, 534, 305, 642, 157, 184, 400, 110, 326, 537, 300, 329, 63, 117, 171, 279, 225, 306, 387, 549, 158, 212, 644, 538, 592, 330, 118, 199, 226, 550, 173, 308, 389, 416, 579, 121, 283, 337, 553, 769, 216, 540, 648, 179, 332, 295, 174, 228, 390, 95, 122, 203, 527, 338, 554, 581, 608, 770, 285, 312, 393, 181, 561, 656, 299, 582, 353, 124, 205, 286, 232, 340, 394, 556, 448, 772, 585, 182, 211, 535, 562, 643, 185, 401, 111, 327, 354, 206, 301, 396, 586, 344, 776, 307, 159, 186, 213, 240, 402, 564, 645, 672, 539, 593, 302, 356, 331, 588, 119, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 420, 583, 610, 125, 287, 233, 314, 341, 395, 557, 368, 449, 773, 800, 220, 652, 183, 600, 563, 658, 355, 126, 207, 234, 342, 558, 450, 612, 774, 316, 397, 424, 587, 345, 777, 187, 241, 403, 565, 673, 660, 303, 357, 236, 398, 452, 346, 589, 616, 778, 832, 215, 242, 566, 647, 674, 189, 405, 432, 595, 358, 569, 785, 664, 590, 361, 348, 456, 780, 311, 419, 190, 244, 406, 676, 219, 543, 570, 597, 651, 624, 705, 786, 409, 335, 362, 231, 421, 611, 315, 598, 369, 706, 801, 221, 248, 410, 572, 653, 464, 680, 788, 896, 601, 364, 659, 422, 127, 235, 343, 559, 370, 451, 613, 775, 802, 222, 317, 654, 425, 708, 412, 602, 792, 661, 688, 614, 237, 318, 399, 372, 426, 453, 480, 804, 347, 617, 779, 833, 604, 712, 243, 567, 675, 662, 433, 359, 238, 454, 665, 428, 591, 618, 834, 349, 376, 457, 781, 808, 191, 245, 407, 434, 677, 571, 625, 787, 666, 720, 363, 350, 458, 620, 782, 836, 246, 678, 436, 599, 626, 707, 249, 411, 573, 465, 681, 789, 816, 897, 668, 365, 460, 423, 840, 371, 803, 223, 250, 574, 655, 466, 628, 682, 709, 790, 736, 898, 413, 440, 603, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 904, 435, 692, 667, 721, 430, 484, 351, 378, 459, 621, 783, 810, 837, 864, 716, 247, 679, 437, 627, 722, 817, 669, 696, 912, 622, 838, 380, 461, 488, 812, 841, 438, 251, 575, 467, 629, 683, 791, 737, 818, 899, 670, 441, 724, 367, 462, 842, 630, 711, 738, 253, 415, 442, 469, 685, 496, 820, 901, 928, 633, 795, 849, 728, 691, 844, 375, 483, 807, 254, 470, 686, 740, 902, 444, 607, 634, 715, 850, 473, 797, 824, 905, 693, 431, 485, 379, 811, 865, 474, 636, 717, 798, 744, 852, 906, 960, 694, 723, 486, 697, 913, 623, 839, 866, 381, 718, 489, 813, 476, 908, 439, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 930, 445, 635, 851, 730, 825, 920, 846, 742, 446, 500, 932, 475, 637, 799, 745, 826, 853, 907, 880, 961, 732, 695, 487, 867, 638, 719, 746, 854, 962, 477, 504, 828, 909, 936, 857, 699, 753, 915, 383, 491, 815, 869, 478, 748, 910, 964, 858, 727, 754, 701, 917, 944, 870, 493, 873, 860, 968, 499, 823, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 972, 503, 935, 883, 735, 762, 978, 925, 952, 878, 507, 831, 885, 939, 993, 764, 926, 980, 751, 886, 967, 994, 509, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q103_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 514, 29, 56, 137, 272, 43, 97, 259, 30, 84, 138, 192, 516, 145, 71, 98, 45, 261, 288, 140, 88, 520, 51, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 200, 524, 55, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 584, 115, 547, 210, 534, 305, 642, 157, 184, 400, 110, 326, 537, 300, 329, 63, 117, 171, 279, 225, 306, 387, 549, 158, 212, 644, 538, 592, 330, 118, 199, 226, 550, 173, 308, 389, 416, 579, 121, 283, 337, 553, 769, 216, 540, 648, 179, 332, 295, 174, 228, 390, 95, 122, 203, 527, 338, 554, 581, 608, 770, 285, 312, 393, 181, 561, 656, 299, 582, 353, 124, 205, 286, 232, 340, 394, 556, 448, 772, 182, 585, 211, 535, 562, 643, 185, 401, 111, 327, 354, 206, 301, 396, 586, 344, 776, 307, 159, 186, 213, 240, 402, 564, 645, 672, 539, 593, 302, 356, 331, 588, 119, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 420, 583, 610, 125, 287, 233, 314, 341, 395, 557, 368, 449, 773, 800, 220, 652, 183, 600, 563, 658, 355, 126, 207, 234, 342, 558, 450, 612, 774, 316, 397, 424, 587, 345, 777, 187, 241, 403, 565, 673, 660, 303, 357, 236, 398, 452, 346, 589, 616, 778, 832, 215, 242, 566, 647, 674, 189, 405, 432, 595, 358, 569, 785, 664, 590, 361, 348, 456, 780, 311, 419, 190, 244, 406, 676, 219, 543, 570, 597, 651, 624, 705, 786, 409, 335, 362, 231, 421, 611, 315, 598, 369, 706, 801, 221, 248, 410, 572, 653, 464, 680, 788, 896, 601, 364, 659, 422, 127, 235, 343, 559, 370, 451, 613, 775, 802, 222, 317, 654, 425, 708, 412, 602, 792, 661, 688, 614, 237, 318, 399, 372, 426, 453, 480, 804, 347, 617, 779, 833, 604, 712, 243, 567, 675, 662, 433, 359, 238, 454, 665, 428, 591, 618, 834, 349, 376, 457, 781, 808, 191, 245, 407, 434, 677, 571, 625, 787, 666, 720, 363, 350, 458, 620, 782, 836, 246, 678, 436, 599, 626, 707, 249, 411, 573, 465, 681, 789, 816, 897, 668, 365, 460, 423, 840, 371, 803, 223, 250, 574, 655, 466, 628, 682, 709, 790, 736, 898, 413, 440, 603, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 904, 435, 692, 667, 721, 430, 484, 351, 378, 459, 621, 783, 810, 837, 864, 716, 247, 679, 437, 627, 722, 817, 669, 696, 912, 622, 838, 380, 461, 488, 812, 438, 841, 251, 575, 467, 629, 683, 791, 737, 818, 899, 670, 441, 724, 367, 462, 842, 630, 711, 738, 253, 415, 442, 469, 685, 496, 820, 901, 928, 633, 795, 849, 728, 691, 844, 375, 483, 807, 254, 470, 686, 740, 902, 444, 607, 634, 715, 850, 473, 797, 824, 905, 693, 431, 485, 379, 811, 865, 474, 636, 717, 798, 744, 852, 906, 960, 694, 723, 486, 697, 913, 623, 839, 866, 381, 718, 489, 813, 476, 908, 439, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 930, 445, 635, 851, 730, 825, 920, 846, 742, 446, 500, 932, 475, 637, 799, 745, 826, 853, 907, 880, 961, 732, 695, 487, 867, 638, 719, 746, 854, 962, 477, 504, 828, 909, 936, 857, 699, 753, 915, 383, 491, 815, 869, 478, 748, 910, 964, 858, 727, 754, 701, 917, 944, 870, 493, 873, 860, 968, 499, 823, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 972, 503, 935, 883, 735, 762, 978, 925, 952, 878, 507, 831, 885, 939, 993, 764, 926, 980, 751, 886, 967, 994, 509, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q104_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 514, 29, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 200, 55, 524, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 642, 157, 184, 400, 110, 326, 537, 300, 329, 63, 117, 171, 279, 225, 306, 387, 549, 158, 212, 644, 538, 592, 330, 118, 199, 226, 550, 173, 308, 389, 416, 579, 121, 283, 337, 553, 769, 216, 540, 179, 648, 332, 295, 174, 228, 390, 95, 122, 203, 527, 338, 554, 581, 608, 770, 285, 312, 393, 181, 561, 656, 299, 582, 353, 124, 205, 286, 232, 340, 394, 556, 448, 772, 182, 585, 211, 535, 562, 643, 185, 401, 111, 327, 354, 206, 301, 396, 586, 344, 307, 776, 159, 186, 213, 240, 402, 564, 645, 672, 539, 593, 302, 356, 331, 119, 588, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 420, 583, 610, 125, 287, 233, 314, 341, 395, 557, 368, 449, 773, 800, 220, 183, 652, 600, 563, 658, 355, 126, 207, 234, 342, 558, 450, 612, 774, 316, 397, 424, 587, 345, 777, 187, 241, 403, 565, 673, 660, 303, 357, 236, 398, 452, 346, 589, 616, 778, 832, 215, 242, 566, 647, 674, 189, 405, 432, 595, 358, 569, 785, 664, 590, 361, 348, 456, 311, 780, 419, 190, 244, 406, 676, 219, 543, 570, 597, 651, 624, 705, 786, 409, 335, 362, 231, 421, 611, 315, 598, 369, 706, 801, 221, 248, 410, 572, 653, 464, 680, 788, 896, 601, 364, 659, 422, 127, 235, 343, 559, 370, 451, 613, 775, 802, 222, 317, 654, 425, 708, 412, 602, 792, 661, 688, 614, 237, 318, 399, 372, 426, 453, 480, 804, 347, 617, 779, 833, 604, 243, 712, 567, 675, 662, 433, 359, 238, 454, 665, 428, 591, 618, 834, 349, 376, 457, 781, 808, 191, 245, 407, 434, 677, 571, 625, 787, 666, 720, 363, 350, 458, 620, 782, 836, 246, 678, 436, 599, 626, 707, 249, 411, 573, 465, 681, 789, 816, 897, 668, 365, 460, 423, 371, 840, 803, 223, 250, 574, 655, 466, 628, 682, 709, 790, 736, 898, 413, 440, 603, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 435, 904, 692, 667, 721, 430, 484, 351, 378, 459, 621, 783, 810, 837, 864, 247, 716, 679, 437, 627, 722, 817, 669, 696, 912, 622, 838, 380, 461, 488, 812, 438, 841, 251, 575, 467, 629, 683, 791, 737, 818, 899, 670, 441, 724, 367, 462, 842, 630, 711, 738, 253, 415, 442, 469, 685, 496, 820, 901, 928, 633, 795, 849, 728, 691, 375, 844, 483, 807, 254, 470, 686, 740, 902, 444, 607, 634, 715, 850, 473, 797, 824, 905, 693, 431, 485, 379, 811, 865, 474, 636, 717, 798, 744, 852, 906, 960, 694, 723, 486, 697, 913, 623, 839, 866, 381, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 930, 445, 635, 851, 730, 825, 920, 846, 742, 446, 500, 932, 475, 637, 799, 745, 826, 853, 907, 880, 961, 732, 695, 487, 867, 638, 719, 746, 854, 962, 477, 504, 828, 909, 936, 857, 699, 753, 915, 383, 491, 815, 869, 478, 748, 910, 964, 858, 727, 754, 701, 917, 944, 870, 493, 873, 860, 499, 968, 823, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 994, 509, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q105_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 514, 29, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 524, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 642, 157, 184, 110, 400, 326, 537, 300, 329, 63, 117, 171, 279, 225, 306, 387, 549, 158, 212, 644, 538, 592, 330, 118, 199, 226, 550, 173, 308, 389, 416, 579, 121, 283, 337, 553, 769, 216, 540, 179, 648, 332, 295, 174, 228, 390, 95, 122, 203, 527, 338, 554, 581, 608, 770, 285, 312, 393, 181, 561, 656, 299, 582, 353, 124, 205, 286, 232, 340, 394, 556, 448, 772, 182, 585, 211, 535, 562, 643, 185, 111, 401, 327, 354, 206, 301, 396, 586, 344, 307, 776, 159, 186, 213, 240, 402, 564, 645, 672, 539, 593, 302, 356, 331, 119, 588, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 420, 583, 610, 125, 287, 233, 314, 341, 395, 557, 368, 449, 773, 220, 800, 183, 652, 600, 563, 658, 355, 126, 207, 234, 342, 558, 450, 612, 774, 316, 397, 424, 587, 345, 777, 187, 241, 403, 565, 673, 660, 303, 357, 236, 398, 452, 346, 589, 616, 778, 832, 215, 242, 566, 647, 674, 189, 405, 432, 595, 358, 569, 785, 664, 590, 361, 348, 311, 456, 780, 419, 190, 244, 406, 676, 219, 543, 570, 597, 651, 624, 705, 786, 409, 335, 362, 231, 421, 611, 315, 598, 369, 706, 221, 801, 248, 410, 572, 653, 464, 680, 788, 896, 601, 364, 659, 422, 127, 235, 343, 559, 370, 451, 613, 775, 222, 802, 317, 654, 425, 708, 412, 602, 792, 661, 688, 614, 237, 318, 399, 372, 426, 453, 480, 804, 347, 617, 779, 833, 604, 243, 567, 712, 675, 662, 433, 359, 238, 454, 665, 428, 591, 618, 834, 349, 376, 457, 781, 808, 191, 245, 407, 434, 677, 571, 625, 787, 666, 720, 363, 350, 458, 620, 782, 836, 246, 678, 436, 599, 626, 707, 249, 411, 573, 465, 681, 789, 816, 897, 668, 365, 460, 423, 371, 840, 223, 803, 250, 574, 655, 466, 628, 682, 709, 790, 736, 898, 413, 440, 603, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 435, 904, 692, 667, 721, 430, 484, 351, 378, 459, 621, 783, 810, 837, 864, 247, 716, 679, 437, 627, 722, 817, 669, 696, 622, 912, 838, 380, 461, 488, 812, 438, 841, 251, 575, 467, 629, 683, 791, 737, 818, 899, 670, 441, 724, 367, 462, 842, 630, 711, 738, 253, 415, 442, 469, 685, 496, 820, 901, 928, 633, 795, 849, 728, 691, 375, 844, 483, 807, 254, 470, 686, 740, 902, 444, 607, 634, 715, 850, 473, 797, 824, 905, 693, 431, 485, 379, 811, 865, 474, 636, 717, 798, 744, 852, 906, 960, 694, 723, 486, 697, 623, 913, 839, 866, 381, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 930, 445, 635, 851, 730, 825, 920, 846, 742, 446, 500, 932, 475, 637, 799, 745, 826, 853, 907, 880, 961, 732, 695, 487, 867, 638, 719, 746, 854, 962, 477, 504, 828, 909, 936, 857, 699, 753, 915, 383, 491, 815, 869, 478, 748, 910, 964, 858, 727, 754, 701, 917, 944, 870, 493, 873, 860, 499, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 994, 509, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q106_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 514, 29, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 524, 163, 150, 530, 153, 79, 106, 322, 269, 296, 165, 59, 113, 275, 545, 154, 208, 532, 640, 108, 270, 324, 166, 87, 114, 195, 519, 546, 61, 169, 277, 304, 385, 156, 536, 328, 291, 62, 143, 116, 170, 197, 278, 224, 386, 548, 91, 523, 577, 281, 177, 103, 198, 293, 172, 388, 578, 93, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 642, 157, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 769, 216, 540, 179, 648, 332, 295, 174, 228, 390, 95, 122, 203, 527, 338, 554, 581, 608, 770, 285, 312, 393, 181, 561, 656, 299, 582, 353, 124, 205, 286, 232, 340, 394, 556, 448, 772, 182, 585, 211, 535, 562, 643, 185, 111, 401, 327, 354, 206, 301, 396, 586, 344, 307, 776, 159, 186, 213, 240, 402, 564, 645, 672, 539, 593, 302, 356, 331, 119, 588, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 583, 420, 610, 125, 287, 233, 314, 341, 395, 557, 368, 449, 773, 220, 800, 183, 652, 600, 563, 658, 355, 126, 207, 234, 342, 558, 450, 612, 774, 316, 397, 587, 424, 345, 777, 187, 241, 403, 565, 673, 660, 303, 357, 236, 398, 452, 346, 589, 616, 778, 832, 215, 242, 566, 647, 674, 189, 405, 595, 432, 358, 569, 785, 664, 590, 361, 348, 311, 456, 780, 419, 190, 244, 406, 676, 219, 543, 570, 597, 651, 624, 705, 786, 409, 335, 362, 231, 421, 611, 315, 598, 369, 706, 221, 801, 248, 410, 572, 653, 464, 680, 788, 896, 601, 364, 659, 422, 127, 235, 343, 559, 370, 451, 613, 775, 222, 802, 317, 654, 425, 708, 412, 602, 792, 661, 688, 614, 237, 318, 399, 372, 426, 453, 480, 804, 347, 617, 779, 833, 604, 243, 567, 712, 675, 662, 433, 359, 238, 454, 665, 591, 428, 618, 834, 349, 376, 457, 781, 808, 191, 245, 407, 434, 677, 571, 625, 787, 666, 720, 363, 350, 458, 620, 782, 836, 246, 678, 599, 436, 626, 707, 249, 411, 573, 465, 681, 789, 816, 897, 668, 365, 460, 423, 371, 840, 223, 803, 250, 574, 655, 466, 628, 682, 709, 790, 736, 898, 413, 603, 440, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 435, 904, 692, 667, 721, 430, 484, 351, 378, 459, 621, 783, 810, 837, 864, 247, 716, 679, 437, 627, 722, 817, 669, 696, 622, 912, 838, 380, 461, 488, 812, 438, 841, 251, 575, 467, 629, 683, 791, 737, 818, 899, 670, 441, 724, 367, 462, 842, 630, 711, 738, 253, 415, 442, 469, 685, 496, 820, 901, 928, 633, 795, 849, 728, 691, 375, 844, 483, 807, 254, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 866, 381, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 930, 445, 635, 851, 730, 825, 920, 846, 742, 446, 500, 932, 475, 637, 799, 745, 826, 853, 907, 880, 961, 732, 695, 487, 867, 638, 719, 746, 854, 962, 477, 504, 828, 909, 936, 857, 699, 753, 915, 383, 491, 815, 869, 478, 748, 910, 964, 858, 727, 754, 701, 917, 944, 870, 493, 873, 860, 499, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 994, 509, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q107_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 524, 163, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 386, 548, 91, 523, 577, 281, 177, 103, 198, 293, 172, 388, 93, 578, 120, 201, 282, 525, 336, 552, 768, 151, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 769, 216, 540, 179, 648, 332, 295, 174, 228, 390, 95, 122, 203, 527, 338, 554, 581, 608, 285, 770, 312, 393, 181, 561, 299, 656, 582, 353, 124, 205, 286, 232, 340, 394, 556, 448, 772, 182, 585, 211, 535, 562, 643, 185, 111, 401, 327, 354, 206, 301, 396, 586, 344, 307, 776, 159, 186, 213, 240, 402, 564, 645, 672, 539, 302, 593, 356, 331, 119, 588, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 583, 420, 125, 610, 287, 233, 314, 341, 395, 557, 368, 449, 773, 220, 800, 183, 652, 600, 563, 658, 355, 126, 207, 234, 342, 558, 450, 612, 774, 316, 397, 587, 424, 345, 777, 187, 241, 403, 565, 673, 303, 660, 357, 236, 398, 452, 346, 589, 616, 778, 832, 215, 242, 566, 647, 189, 674, 405, 595, 432, 358, 569, 785, 664, 590, 361, 348, 311, 456, 780, 419, 190, 244, 406, 676, 219, 543, 570, 597, 651, 624, 705, 786, 409, 335, 362, 231, 421, 611, 315, 598, 369, 221, 706, 801, 248, 410, 572, 653, 464, 680, 788, 896, 601, 364, 659, 422, 127, 235, 343, 559, 370, 451, 613, 775, 222, 317, 802, 654, 425, 708, 412, 602, 792, 661, 688, 614, 237, 318, 399, 372, 426, 453, 480, 804, 347, 617, 779, 833, 604, 243, 567, 712, 675, 662, 433, 359, 238, 454, 665, 591, 428, 618, 349, 834, 376, 457, 781, 808, 191, 245, 407, 434, 677, 571, 625, 787, 666, 363, 720, 350, 458, 620, 782, 836, 246, 678, 599, 436, 626, 707, 249, 411, 573, 465, 681, 789, 816, 897, 668, 365, 460, 423, 371, 840, 223, 803, 250, 574, 655, 466, 628, 682, 709, 790, 736, 413, 898, 603, 440, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 435, 904, 692, 667, 430, 721, 484, 351, 378, 459, 621, 783, 810, 837, 864, 247, 716, 679, 437, 627, 722, 817, 669, 696, 622, 912, 838, 380, 461, 488, 812, 438, 841, 251, 575, 467, 629, 683, 791, 737, 818, 899, 670, 441, 367, 724, 462, 842, 630, 711, 253, 738, 415, 442, 469, 685, 496, 820, 901, 928, 633, 795, 849, 728, 691, 375, 844, 483, 807, 254, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 872, 255, 471, 687, 498, 741, 822, 903, 445, 930, 635, 851, 730, 825, 920, 846, 742, 446, 500, 932, 475, 637, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 860, 499, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q108_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 524, 163, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 386, 548, 91, 523, 577, 281, 177, 103, 198, 293, 172, 388, 93, 578, 120, 201, 282, 525, 336, 552, 151, 768, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 769, 216, 540, 179, 648, 332, 295, 174, 228, 390, 95, 122, 203, 527, 338, 554, 581, 608, 285, 770, 312, 393, 181, 561, 299, 656, 582, 353, 124, 205, 286, 232, 340, 394, 556, 448, 772, 182, 585, 211, 535, 562, 643, 185, 111, 401, 327, 354, 206, 301, 396, 586, 344, 307, 159, 776, 186, 213, 240, 402, 564, 645, 672, 539, 302, 593, 356, 331, 119, 588, 227, 551, 214, 309, 646, 417, 188, 404, 594, 217, 541, 568, 649, 784, 333, 360, 175, 229, 310, 391, 418, 123, 339, 555, 609, 771, 218, 542, 313, 596, 650, 704, 408, 334, 230, 657, 583, 420, 125, 610, 287, 233, 314, 341, 395, 557, 368, 449, 773, 220, 183, 800, 652, 600, 563, 658, 355, 126, 207, 234, 342, 558, 450, 612, 774, 316, 397, 587, 424, 345, 777, 187, 241, 403, 565, 673, 303, 660, 357, 236, 398, 452, 346, 589, 616, 778, 215, 832, 242, 566, 647, 189, 674, 405, 595, 432, 358, 569, 785, 664, 590, 361, 348, 311, 456, 780, 419, 190, 244, 406, 676, 219, 543, 570, 597, 651, 624, 705, 786, 409, 335, 362, 231, 421, 611, 315, 598, 369, 221, 706, 801, 248, 410, 572, 653, 464, 680, 788, 896, 601, 364, 659, 422, 127, 235, 343, 559, 370, 451, 613, 775, 222, 317, 802, 654, 425, 708, 412, 602, 792, 661, 688, 614, 237, 318, 399, 372, 426, 453, 480, 804, 347, 617, 779, 833, 604, 243, 567, 712, 675, 662, 433, 359, 238, 454, 665, 591, 428, 618, 349, 834, 376, 457, 781, 191, 808, 245, 407, 434, 677, 571, 625, 787, 666, 363, 720, 350, 458, 620, 782, 836, 246, 678, 599, 436, 626, 707, 249, 411, 573, 465, 681, 789, 816, 897, 668, 365, 460, 423, 371, 223, 840, 803, 250, 574, 655, 466, 628, 682, 709, 790, 736, 413, 898, 603, 440, 366, 793, 689, 615, 319, 373, 427, 710, 481, 805, 252, 414, 468, 684, 900, 605, 632, 713, 794, 848, 663, 690, 239, 374, 455, 482, 806, 429, 619, 835, 606, 377, 714, 809, 472, 796, 435, 904, 692, 667, 430, 721, 484, 351, 378, 459, 621, 783, 810, 837, 247, 864, 716, 679, 437, 627, 722, 817, 669, 696, 622, 912, 838, 380, 461, 488, 812, 438, 841, 251, 575, 467, 629, 683, 791, 737, 818, 899, 670, 441, 367, 724, 462, 842, 630, 711, 253, 738, 415, 442, 469, 685, 496, 820, 901, 928, 633, 795, 849, 728, 691, 375, 844, 483, 807, 254, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 255, 872, 471, 687, 498, 741, 822, 903, 445, 930, 635, 851, 730, 825, 920, 846, 742, 446, 500, 932, 475, 637, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 860, 499, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q109_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 524, 163, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 386, 548, 91, 523, 577, 281, 177, 103, 198, 293, 172, 388, 93, 578, 120, 201, 282, 525, 336, 552, 151, 768, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 216, 769, 540, 179, 648, 332, 295, 174, 228, 390, 95, 122, 203, 527, 338, 554, 581, 608, 285, 770, 312, 393, 181, 561, 299, 656, 582, 353, 124, 205, 286, 232, 340, 394, 556, 448, 772, 182, 585, 211, 535, 562, 643, 185, 111, 401, 327, 354, 206, 301, 396, 586, 344, 307, 159, 776, 186, 213, 240, 402, 564, 645, 672, 539, 302, 593, 356, 331, 119, 588, 227, 551, 214, 309, 646, 417, 188, 404, 594, 217, 541, 568, 649, 784, 333, 360, 175, 229, 310, 391, 418, 123, 339, 555, 609, 218, 771, 542, 313, 596, 650, 704, 408, 334, 230, 657, 583, 420, 125, 610, 287, 233, 314, 341, 395, 557, 368, 449, 220, 773, 183, 800, 652, 600, 563, 658, 355, 126, 207, 234, 342, 558, 450, 612, 774, 316, 397, 587, 424, 345, 777, 187, 241, 403, 565, 673, 303, 660, 357, 236, 398, 452, 346, 589, 616, 778, 215, 832, 242, 566, 647, 189, 674, 405, 595, 432, 358, 569, 785, 664, 590, 361, 348, 311, 456, 780, 419, 190, 244, 406, 676, 219, 543, 570, 597, 651, 624, 705, 786, 409, 335, 362, 231, 421, 611, 315, 598, 369, 221, 706, 248, 801, 410, 572, 653, 464, 680, 788, 896, 601, 364, 659, 422, 127, 235, 343, 559, 370, 451, 613, 222, 775, 317, 802, 654, 425, 708, 412, 602, 792, 661, 688, 614, 237, 318, 399, 372, 426, 453, 480, 804, 347, 617, 779, 833, 604, 243, 567, 712, 675, 662, 433, 359, 238, 454, 665, 591, 428, 618, 349, 834, 376, 457, 781, 191, 808, 245, 407, 434, 677, 571, 625, 787, 666, 363, 720, 350, 458, 620, 782, 836, 246, 678, 599, 436, 626, 707, 249, 411, 573, 465, 681, 789, 816, 897, 668, 365, 460, 423, 371, 223, 840, 250, 803, 574, 655, 466, 628, 682, 709, 790, 736, 413, 898, 603, 440, 366, 793, 689, 615, 319, 373, 427, 710, 481, 252, 805, 414, 468, 684, 900, 605, 632, 713, 794, 848, 663, 690, 239, 374, 455, 482, 806, 429, 619, 835, 606, 377, 714, 809, 472, 796, 435, 904, 692, 667, 430, 721, 484, 351, 378, 459, 621, 783, 810, 837, 247, 864, 716, 679, 437, 627, 722, 817, 669, 696, 622, 912, 838, 380, 461, 488, 812, 438, 841, 251, 575, 467, 629, 683, 791, 737, 818, 899, 670, 441, 367, 724, 462, 842, 630, 711, 253, 738, 415, 442, 469, 685, 496, 820, 901, 928, 633, 795, 849, 728, 691, 375, 844, 483, 254, 807, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 255, 872, 471, 687, 498, 741, 822, 903, 445, 930, 635, 851, 730, 825, 920, 846, 742, 446, 500, 932, 475, 637, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 860, 499, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q110_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 163, 524, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 386, 548, 91, 523, 577, 281, 177, 103, 198, 293, 172, 388, 93, 578, 120, 201, 282, 525, 336, 552, 151, 768, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 216, 769, 179, 540, 648, 332, 295, 174, 228, 390, 95, 122, 203, 527, 338, 554, 581, 285, 608, 770, 312, 393, 181, 561, 299, 656, 582, 353, 124, 205, 286, 232, 340, 394, 556, 448, 772, 182, 585, 211, 535, 562, 643, 185, 111, 401, 327, 354, 206, 301, 396, 586, 344, 307, 159, 776, 186, 213, 240, 402, 564, 645, 672, 539, 302, 593, 356, 331, 119, 227, 588, 551, 214, 309, 646, 417, 188, 404, 594, 217, 541, 568, 649, 784, 333, 360, 175, 229, 310, 391, 418, 123, 339, 555, 609, 218, 771, 542, 313, 596, 650, 704, 408, 334, 230, 657, 583, 420, 125, 287, 610, 233, 314, 341, 395, 557, 368, 449, 220, 773, 183, 800, 652, 600, 563, 658, 355, 126, 207, 234, 342, 558, 450, 612, 774, 316, 397, 587, 424, 345, 777, 187, 241, 403, 565, 673, 303, 660, 357, 236, 398, 452, 346, 589, 616, 778, 215, 832, 242, 566, 647, 189, 674, 405, 595, 432, 358, 569, 785, 664, 590, 361, 348, 311, 456, 419, 780, 190, 244, 406, 676, 219, 543, 570, 597, 651, 624, 705, 786, 409, 335, 362, 231, 421, 611, 315, 598, 369, 221, 706, 248, 801, 410, 572, 653, 464, 680, 788, 896, 601, 364, 659, 422, 127, 235, 343, 559, 370, 451, 613, 222, 775, 317, 802, 654, 425, 708, 412, 602, 792, 661, 688, 614, 237, 318, 399, 372, 426, 453, 480, 804, 347, 617, 779, 833, 243, 604, 567, 712, 675, 662, 433, 359, 238, 454, 665, 591, 428, 618, 349, 834, 376, 457, 781, 191, 808, 245, 407, 434, 677, 571, 625, 787, 666, 363, 720, 350, 458, 620, 782, 836, 246, 678, 599, 436, 626, 707, 249, 411, 573, 465, 681, 789, 816, 897, 668, 365, 460, 423, 371, 223, 840, 250, 803, 574, 655, 466, 628, 682, 709, 790, 413, 736, 898, 603, 440, 366, 793, 689, 615, 319, 373, 427, 710, 481, 252, 805, 414, 468, 684, 900, 605, 632, 713, 794, 848, 663, 690, 239, 374, 455, 482, 806, 429, 619, 835, 606, 377, 714, 809, 472, 435, 796, 904, 692, 667, 430, 721, 484, 351, 378, 459, 621, 783, 810, 837, 247, 864, 716, 679, 437, 627, 722, 817, 669, 696, 622, 912, 838, 380, 461, 488, 812, 438, 841, 251, 575, 467, 629, 683, 791, 737, 818, 899, 670, 441, 367, 724, 462, 842, 630, 711, 253, 415, 738, 442, 469, 685, 496, 820, 901, 928, 633, 795, 849, 728, 691, 375, 483, 844, 254, 807, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 255, 872, 471, 687, 498, 741, 822, 903, 445, 930, 635, 851, 730, 825, 920, 846, 742, 446, 500, 932, 475, 637, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 499, 860, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q111_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 384, 89, 521, 147, 47, 101, 263, 290, 142, 196, 90, 522, 576, 280, 149, 176, 102, 529, 292, 105, 267, 321, 92, 55, 200, 163, 524, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 386, 91, 548, 523, 577, 281, 177, 103, 198, 293, 172, 388, 93, 578, 120, 201, 282, 525, 336, 552, 151, 768, 178, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 416, 121, 283, 337, 553, 216, 769, 179, 540, 648, 332, 295, 174, 228, 390, 95, 122, 203, 527, 338, 554, 581, 285, 608, 770, 312, 393, 181, 561, 299, 656, 582, 353, 124, 205, 286, 232, 340, 394, 556, 448, 772, 182, 585, 211, 535, 562, 643, 185, 111, 401, 327, 354, 206, 301, 396, 586, 344, 307, 159, 776, 186, 213, 240, 402, 564, 645, 672, 539, 302, 593, 356, 331, 119, 227, 588, 551, 214, 309, 646, 417, 188, 404, 594, 217, 541, 568, 649, 784, 333, 360, 175, 229, 310, 391, 418, 123, 339, 555, 609, 218, 771, 542, 313, 596, 650, 704, 408, 334, 230, 657, 583, 420, 125, 287, 610, 233, 314, 341, 395, 557, 368, 449, 220, 773, 183, 800, 652, 600, 563, 658, 355, 126, 207, 234, 342, 558, 450, 612, 774, 316, 397, 587, 424, 345, 777, 187, 241, 403, 565, 673, 303, 660, 357, 236, 398, 452, 346, 589, 616, 778, 215, 832, 242, 566, 647, 189, 674, 405, 595, 432, 358, 569, 785, 664, 590, 361, 348, 311, 456, 419, 780, 190, 244, 406, 219, 676, 543, 570, 597, 651, 624, 705, 786, 409, 335, 362, 231, 421, 611, 315, 598, 369, 221, 706, 248, 801, 410, 572, 653, 464, 680, 788, 896, 601, 364, 659, 422, 127, 235, 343, 559, 370, 451, 613, 222, 775, 317, 802, 654, 425, 708, 412, 602, 792, 661, 688, 614, 237, 318, 399, 372, 426, 453, 480, 347, 804, 617, 779, 833, 243, 604, 567, 712, 675, 662, 433, 359, 238, 454, 665, 591, 428, 618, 349, 834, 376, 457, 781, 191, 808, 245, 407, 434, 677, 571, 625, 787, 666, 363, 720, 350, 458, 620, 782, 836, 246, 678, 599, 436, 626, 707, 249, 411, 573, 465, 681, 789, 816, 897, 668, 365, 460, 423, 371, 223, 840, 250, 803, 574, 655, 466, 628, 682, 709, 790, 413, 736, 898, 603, 440, 366, 793, 689, 615, 319, 373, 427, 710, 481, 252, 805, 414, 468, 684, 900, 605, 632, 713, 794, 848, 663, 690, 239, 374, 455, 482, 806, 429, 619, 835, 606, 377, 714, 809, 472, 435, 796, 904, 692, 667, 430, 721, 484, 351, 378, 459, 621, 783, 810, 837, 247, 864, 716, 679, 437, 627, 722, 817, 669, 696, 622, 912, 838, 380, 461, 488, 812, 438, 841, 251, 575, 467, 629, 683, 791, 737, 818, 899, 670, 441, 367, 724, 462, 842, 630, 711, 253, 415, 738, 442, 469, 685, 496, 820, 901, 928, 633, 795, 849, 728, 691, 375, 483, 844, 254, 807, 470, 686, 740, 902, 607, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 845, 255, 872, 471, 687, 498, 741, 822, 903, 445, 930, 635, 851, 730, 825, 920, 846, 742, 446, 500, 475, 932, 637, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 499, 860, 823, 968, 931, 702, 756, 918, 731, 494, 921, 847, 874, 743, 447, 501, 933, 827, 881, 733, 760, 922, 976, 876, 502, 934, 639, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q112_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 89, 384, 521, 147, 47, 101, 263, 290, 142, 196, 90, 522, 576, 280, 149, 176, 102, 529, 292, 105, 267, 321, 92, 55, 200, 163, 524, 150, 530, 153, 79, 106, 322, 269, 296, 165, 59, 113, 275, 545, 154, 208, 532, 640, 108, 270, 324, 166, 87, 114, 195, 519, 61, 546, 169, 277, 304, 385, 156, 536, 328, 291, 62, 143, 116, 170, 197, 278, 224, 91, 386, 548, 523, 577, 281, 177, 103, 198, 293, 172, 93, 388, 578, 120, 201, 282, 525, 336, 552, 151, 178, 768, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 549, 158, 212, 644, 538, 592, 330, 118, 199, 226, 550, 173, 308, 389, 579, 121, 416, 283, 337, 553, 216, 179, 769, 540, 648, 332, 295, 174, 228, 95, 390, 122, 203, 527, 338, 554, 581, 285, 608, 770, 312, 393, 181, 561, 299, 656, 582, 353, 124, 205, 286, 232, 340, 394, 556, 448, 182, 772, 585, 211, 535, 562, 643, 185, 111, 401, 327, 354, 206, 301, 396, 586, 344, 307, 159, 186, 776, 213, 240, 402, 564, 645, 672, 539, 302, 593, 356, 331, 119, 227, 588, 551, 214, 309, 646, 417, 188, 404, 594, 217, 541, 568, 649, 784, 333, 360, 175, 229, 310, 391, 123, 418, 339, 555, 609, 218, 771, 542, 313, 596, 650, 704, 408, 334, 230, 657, 583, 125, 420, 287, 610, 233, 314, 341, 395, 557, 368, 449, 220, 183, 773, 800, 652, 600, 563, 658, 355, 126, 207, 234, 342, 558, 450, 612, 774, 316, 397, 587, 424, 345, 187, 777, 241, 403, 565, 673, 303, 660, 357, 236, 398, 452, 346, 589, 616, 778, 215, 242, 832, 566, 647, 189, 674, 405, 595, 432, 358, 569, 785, 664, 590, 361, 348, 311, 456, 419, 190, 780, 244, 406, 219, 676, 543, 570, 597, 651, 624, 705, 786, 409, 335, 362, 231, 421, 611, 315, 598, 369, 221, 706, 248, 801, 410, 572, 653, 464, 680, 788, 601, 896, 364, 659, 127, 422, 235, 343, 559, 370, 451, 613, 222, 775, 317, 802, 654, 425, 708, 412, 602, 792, 661, 688, 614, 237, 318, 399, 372, 426, 453, 480, 347, 804, 617, 779, 243, 833, 604, 567, 712, 675, 662, 433, 359, 238, 454, 665, 591, 428, 618, 349, 834, 376, 457, 191, 781, 808, 245, 407, 434, 677, 571, 625, 787, 666, 363, 720, 350, 458, 620, 782, 246, 836, 678, 599, 436, 626, 707, 249, 411, 573, 465, 681, 789, 816, 897, 668, 365, 460, 423, 371, 223, 250, 840, 803, 574, 655, 466, 628, 682, 709, 790, 413, 736, 603, 898, 440, 366, 793, 689, 615, 319, 373, 427, 710, 481, 252, 805, 414, 468, 684, 605, 900, 632, 713, 794, 848, 663, 690, 239, 374, 455, 482, 806, 429, 619, 835, 606, 377, 714, 809, 472, 435, 796, 904, 692, 667, 430, 721, 484, 351, 378, 459, 621, 783, 810, 247, 837, 864, 716, 679, 437, 627, 722, 817, 669, 696, 622, 912, 838, 380, 461, 488, 812, 438, 251, 841, 575, 467, 629, 683, 791, 737, 818, 899, 670, 441, 367, 724, 462, 842, 630, 711, 253, 415, 738, 442, 469, 685, 496, 820, 901, 633, 928, 795, 849, 728, 691, 375, 483, 254, 844, 807, 470, 686, 740, 607, 902, 444, 634, 715, 850, 473, 797, 824, 905, 693, 431, 485, 379, 811, 865, 474, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 255, 845, 872, 471, 687, 498, 741, 822, 903, 445, 635, 930, 851, 730, 825, 920, 846, 742, 446, 500, 475, 637, 932, 799, 745, 826, 853, 907, 880, 961, 732, 695, 487, 867, 638, 719, 746, 854, 477, 962, 504, 828, 909, 936, 857, 699, 753, 915, 383, 491, 815, 869, 478, 748, 910, 964, 858, 727, 754, 701, 917, 944, 870, 493, 873, 499, 860, 823, 968, 931, 702, 756, 918, 731, 494, 921, 847, 874, 743, 447, 501, 933, 827, 881, 733, 760, 922, 976, 876, 502, 639, 934, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q113_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 257, 28, 136, 15, 42, 69, 96, 258, 49, 144, 70, 44, 260, 73, 23, 50, 131, 74, 264, 52, 133, 160, 27, 81, 513, 76, 39, 134, 82, 29, 514, 56, 137, 272, 43, 97, 259, 30, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 515, 57, 273, 152, 78, 268, 164, 31, 58, 85, 139, 112, 193, 274, 517, 544, 99, 86, 194, 518, 289, 60, 141, 168, 276, 89, 384, 521, 147, 47, 101, 263, 290, 142, 196, 90, 522, 576, 280, 149, 176, 102, 529, 292, 105, 267, 321, 92, 55, 200, 163, 524, 150, 530, 153, 79, 106, 322, 269, 296, 165, 59, 113, 275, 154, 545, 208, 532, 640, 108, 270, 324, 166, 87, 114, 195, 519, 61, 546, 169, 277, 304, 385, 156, 536, 328, 291, 62, 143, 116, 170, 197, 278, 224, 91, 386, 548, 523, 577, 281, 177, 103, 198, 293, 172, 93, 388, 578, 120, 201, 282, 525, 336, 552, 151, 178, 768, 531, 294, 107, 323, 94, 202, 526, 297, 580, 284, 392, 180, 155, 209, 533, 560, 641, 109, 271, 298, 325, 352, 204, 167, 115, 584, 547, 210, 534, 305, 157, 642, 184, 110, 400, 326, 537, 300, 329, 63, 117, 171, 279, 225, 306, 387, 158, 549, 212, 644, 538, 592, 330, 118, 199, 226, 550, 173, 308, 389, 579, 121, 416, 283, 337, 553, 216, 179, 769, 540, 648, 332, 295, 174, 228, 95, 390, 122, 203, 527, 338, 554, 581, 285, 608, 770, 312, 393, 181, 561, 299, 656, 582, 353, 124, 205, 286, 232, 340, 394, 556, 448, 182, 772, 585, 211, 535, 562, 643, 185, 111, 401, 327, 354, 206, 301, 396, 586, 344, 307, 159, 186, 213, 776, 240, 402, 564, 645, 672, 539, 302, 593, 356, 331, 119, 227, 588, 551, 214, 309, 646, 417, 188, 404, 594, 217, 541, 568, 649, 784, 333, 360, 175, 229, 310, 391, 123, 418, 339, 555, 218, 609, 771, 542, 313, 596, 650, 704, 408, 334, 230, 657, 583, 125, 420, 287, 610, 233, 314, 341, 395, 557, 368, 449, 220, 183, 773, 800, 652, 600, 563, 658, 355, 126, 207, 234, 342, 558, 450, 612, 774, 316, 397, 587, 424, 345, 187, 777, 241, 403, 565, 673, 303, 660, 357, 236, 398, 452, 346, 589, 616, 215, 778, 242, 832, 566, 647, 189, 674, 405, 595, 432, 358, 569, 785, 664, 590, 361, 348, 311, 456, 419, 190, 780, 244, 406, 219, 676, 543, 570, 597, 651, 624, 705, 786, 409, 335, 362, 231, 421, 611, 315, 598, 369, 221, 706, 248, 410, 801, 572, 653, 464, 680, 788, 601, 896, 364, 659, 127, 422, 235, 343, 559, 370, 451, 222, 613, 775, 317, 802, 654, 425, 708, 412, 602, 792, 661, 688, 614, 237, 318, 399, 372, 426, 453, 480, 347, 804, 617, 779, 243, 833, 604, 567, 712, 675, 662, 433, 359, 238, 454, 665, 591, 428, 618, 349, 834, 376, 457, 191, 781, 245, 808, 407, 434, 677, 571, 625, 787, 666, 363, 720, 350, 458, 620, 782, 246, 836, 678, 599, 436, 626, 707, 249, 411, 573, 465, 681, 789, 816, 897, 668, 365, 460, 423, 371, 223, 250, 840, 803, 574, 655, 466, 628, 682, 709, 790, 413, 736, 603, 898, 440, 366, 793, 689, 615, 319, 373, 427, 710, 481, 252, 414, 805, 468, 684, 605, 900, 632, 713, 794, 848, 663, 690, 239, 374, 455, 482, 806, 429, 619, 835, 606, 377, 714, 809, 472, 435, 796, 904, 692, 667, 430, 721, 484, 351, 378, 459, 621, 783, 247, 810, 837, 864, 716, 679, 437, 627, 722, 817, 669, 696, 622, 912, 838, 380, 461, 488, 812, 438, 251, 841, 575, 467, 629, 683, 791, 737, 818, 899, 670, 441, 367, 724, 462, 842, 630, 711, 253, 415, 738, 442, 469, 685, 496, 820, 901, 633, 928, 795, 849, 728, 691, 375, 483, 254, 844, 807, 470, 686, 740, 607, 902, 444, 634, 715, 850, 473, 797, 824, 905, 693, 431, 485, 379, 811, 474, 865, 636, 717, 798, 744, 852, 906, 960, 694, 723, 486, 697, 623, 913, 839, 381, 866, 718, 489, 813, 476, 439, 908, 856, 819, 671, 698, 725, 752, 914, 382, 463, 490, 814, 868, 843, 631, 739, 443, 726, 497, 821, 929, 700, 916, 729, 492, 255, 845, 872, 471, 687, 498, 741, 822, 903, 445, 635, 930, 851, 730, 825, 920, 846, 742, 446, 500, 475, 637, 932, 799, 745, 826, 853, 907, 880, 961, 732, 695, 487, 867, 638, 719, 746, 854, 477, 962, 504, 828, 909, 936, 857, 699, 753, 915, 383, 491, 815, 478, 869, 748, 910, 964, 858, 727, 754, 701, 917, 944, 870, 493, 873, 499, 860, 823, 968, 931, 702, 756, 918, 731, 494, 921, 847, 874, 743, 447, 501, 933, 827, 881, 733, 760, 922, 976, 876, 502, 639, 934, 747, 855, 882, 963, 734, 505, 829, 937, 924, 479, 506, 749, 830, 911, 884, 938, 965, 992, 859, 755, 945, 871, 750, 966, 508, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 993, 764, 926, 980, 751, 886, 967, 509, 994, 941, 889, 984, 947, 510, 942, 996, 863, 890, 971, 759, 949, 892, 973, 1000, 950, 763, 979, 953, 879, 974, 765, 927, 954, 981, 1008, 887, 995, 766, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q114_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 160, 27, 81, 513, 76, 39, 134, 82, 29, 56, 514, 137, 272, 43, 97, 30, 259, 84, 138, 192, 516, 145, 71, 98, 45, 261, 288, 140, 88, 51, 520, 146, 46, 100, 262, 75, 265, 53, 161, 148, 528, 77, 104, 266, 320, 54, 135, 162, 83, 57, 515, 273, 152, 78, 268, 164, 31, 58, 85, 139, 112, 193, 274, 517, 544, 99, 86, 194, 60, 289, 518, 141, 168, 276, 89, 384, 521, 147, 47, 101, 263, 290, 142, 196, 90, 522, 576, 280, 149, 176, 102, 529, 292, 105, 267, 92, 321, 55, 200, 163, 524, 150, 530, 153, 79, 106, 322, 269, 296, 165, 59, 113, 275, 154, 545, 208, 532, 640, 108, 270, 324, 166, 87, 114, 195, 61, 519, 546, 169, 277, 304, 156, 385, 536, 328, 62, 291, 143, 116, 170, 197, 278, 224, 91, 386, 548, 523, 577, 281, 177, 103, 198, 293, 172, 93, 388, 120, 578, 201, 282, 525, 336, 552, 151, 178, 768, 531, 294, 107, 94, 323, 202, 297, 526, 580, 284, 392, 180, 155, 209, 533, 560, 641, 109, 271, 298, 325, 352, 204, 167, 115, 584, 547, 210, 305, 534, 157, 184, 642, 110, 400, 326, 537, 300, 329, 63, 117, 171, 279, 225, 306, 158, 387, 549, 212, 644, 538, 592, 330, 118, 199, 226, 550, 173, 308, 389, 121, 579, 416, 283, 337, 553, 216, 179, 540, 769, 648, 332, 295, 174, 228, 95, 390, 122, 203, 527, 338, 554, 581, 285, 608, 312, 770, 393, 181, 561, 299, 656, 124, 353, 582, 205, 286, 232, 340, 394, 556, 448, 182, 772, 585, 211, 535, 562, 185, 643, 111, 401, 327, 354, 206, 301, 396, 586, 344, 307, 159, 186, 213, 776, 240, 402, 564, 645, 672, 539, 302, 593, 356, 331, 119, 227, 588, 551, 214, 309, 188, 417, 646, 404, 594, 217, 541, 568, 649, 784, 333, 360, 175, 229, 310, 391, 123, 418, 339, 555, 218, 609, 313, 542, 771, 596, 650, 704, 408, 334, 230, 657, 125, 583, 420, 287, 610, 233, 314, 341, 395, 557, 368, 220, 449, 183, 773, 800, 652, 600, 563, 658, 126, 355, 207, 234, 342, 558, 450, 612, 316, 774, 397, 587, 424, 345, 187, 777, 241, 403, 565, 673, 303, 660, 357, 236, 398, 452, 346, 589, 616, 215, 778, 242, 832, 566, 189, 647, 674, 405, 595, 432, 358, 569, 785, 664, 361, 590, 348, 311, 456, 190, 419, 780, 244, 406, 219, 676, 543, 570, 597, 651, 624, 705, 786, 409, 335, 362, 231, 421, 611, 315, 369, 598, 221, 248, 706, 410, 572, 801, 653, 464, 680, 788, 601, 896, 364, 659, 127, 422, 235, 343, 559, 370, 222, 451, 613, 317, 775, 802, 425, 654, 708, 412, 602, 792, 661, 688, 614, 237, 318, 399, 372, 426, 453, 480, 347, 804, 617, 779, 243, 604, 833, 567, 712, 675, 433, 662, 359, 238, 454, 665, 591, 428, 618, 349, 376, 834, 457, 191, 781, 245, 808, 407, 434, 677, 571, 625, 787, 666, 363, 720, 350, 458, 620, 782, 246, 836, 678, 599, 436, 626, 249, 707, 411, 573, 465, 681, 789, 816, 668, 897, 365, 460, 423, 371, 223, 250, 840, 574, 803, 655, 466, 628, 682, 709, 790, 413, 736, 603, 440, 898, 366, 793, 689, 615, 319, 373, 427, 252, 481, 710, 414, 805, 468, 684, 605, 900, 632, 713, 794, 848, 663, 690, 239, 374, 455, 482, 806, 429, 619, 377, 606, 835, 714, 809, 472, 435, 796, 904, 692, 667, 430, 721, 484, 351, 378, 459, 621, 783, 247, 810, 837, 864, 716, 679, 437, 627, 722, 817, 669, 696, 622, 912, 380, 838, 461, 488, 812, 438, 251, 841, 575, 467, 629, 683, 791, 737, 818, 441, 670, 899, 367, 724, 462, 842, 630, 253, 711, 415, 738, 442, 469, 685, 496, 820, 901, 633, 928, 795, 849, 728, 691, 375, 254, 483, 844, 807, 470, 686, 740, 607, 444, 902, 634, 715, 850, 473, 797, 824, 905, 693, 431, 485, 379, 811, 474, 636, 865, 717, 798, 744, 852, 906, 960, 694, 723, 486, 697, 623, 913, 381, 839, 866, 489, 718, 813, 476, 439, 908, 856, 819, 671, 698, 725, 752, 914, 382, 463, 490, 814, 868, 843, 631, 739, 443, 497, 726, 821, 700, 929, 916, 729, 492, 255, 845, 872, 471, 687, 498, 741, 822, 445, 903, 635, 930, 851, 730, 825, 920, 846, 742, 446, 500, 475, 637, 932, 799, 745, 826, 853, 907, 880, 732, 961, 695, 487, 638, 867, 719, 746, 854, 477, 504, 962, 828, 909, 936, 857, 699, 753, 915, 383, 491, 815, 478, 869, 748, 910, 964, 858, 727, 754, 701, 917, 944, 870, 493, 873, 499, 860, 823, 968, 702, 931, 756, 918, 731, 494, 921, 847, 874, 743, 447, 501, 933, 827, 881, 733, 760, 922, 976, 876, 502, 639, 934, 747, 855, 882, 505, 734, 963, 829, 937, 924, 479, 506, 749, 830, 911, 884, 938, 965, 992, 859, 755, 945, 871, 750, 508, 966, 940, 861, 888, 969, 703, 757, 919, 946, 495, 875, 862, 970, 758, 948, 761, 923, 977, 877, 503, 972, 935, 883, 735, 762, 978, 925, 952, 878, 507, 831, 885, 939, 764, 993, 926, 980, 751, 886, 509, 967, 994, 941, 889, 984, 947, 510, 942, 996, 863, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q115_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 27, 160, 81, 513, 76, 39, 134, 82, 29, 56, 514, 137, 272, 43, 97, 30, 259, 84, 138, 192, 516, 145, 71, 98, 45, 261, 288, 140, 88, 51, 520, 146, 46, 100, 262, 75, 265, 53, 161, 148, 528, 77, 104, 266, 54, 320, 135, 162, 83, 57, 515, 273, 152, 78, 268, 31, 164, 58, 85, 139, 112, 193, 274, 517, 544, 99, 86, 194, 60, 289, 518, 141, 168, 276, 89, 384, 521, 147, 47, 101, 263, 290, 142, 196, 90, 522, 576, 280, 149, 176, 102, 529, 292, 105, 267, 92, 55, 321, 200, 163, 524, 150, 530, 153, 79, 106, 322, 269, 296, 165, 59, 113, 275, 154, 545, 208, 532, 108, 640, 270, 324, 166, 87, 114, 195, 61, 519, 546, 169, 277, 304, 156, 385, 536, 62, 328, 291, 143, 116, 170, 197, 278, 91, 224, 386, 548, 523, 577, 281, 177, 103, 198, 293, 172, 93, 388, 120, 578, 201, 282, 525, 336, 552, 151, 178, 768, 531, 294, 107, 94, 323, 202, 297, 526, 580, 284, 392, 180, 155, 209, 533, 560, 109, 641, 271, 298, 325, 352, 204, 167, 115, 584, 547, 210, 305, 534, 157, 184, 110, 642, 400, 326, 537, 300, 63, 329, 117, 171, 279, 225, 306, 158, 387, 549, 212, 644, 538, 592, 330, 118, 199, 226, 550, 173, 308, 389, 121, 579, 283, 416, 337, 553, 216, 179, 540, 769, 648, 332, 295, 174, 95, 228, 390, 122, 203, 527, 338, 554, 581, 285, 608, 312, 770, 393, 181, 561, 299, 124, 656, 353, 582, 205, 286, 232, 340, 394, 556, 182, 448, 772, 585, 211, 535, 562, 185, 111, 643, 401, 327, 354, 206, 301, 396, 586, 344, 307, 159, 186, 213, 776, 240, 402, 564, 645, 539, 672, 302, 593, 356, 331, 119, 227, 588, 551, 214, 309, 188, 417, 646, 404, 594, 217, 541, 568, 649, 784, 333, 360, 175, 229, 310, 391, 123, 418, 339, 555, 218, 609, 313, 542, 771, 596, 650, 704, 408, 334, 230, 125, 657, 583, 287, 420, 610, 233, 314, 341, 395, 557, 368, 220, 183, 449, 773, 800, 652, 600, 563, 126, 658, 355, 207, 234, 342, 558, 450, 612, 316, 774, 397, 587, 424, 345, 187, 777, 241, 403, 565, 673, 303, 660, 357, 236, 398, 452, 346, 589, 616, 215, 778, 242, 566, 832, 189, 647, 674, 405, 595, 432, 358, 569, 785, 664, 361, 590, 348, 311, 190, 456, 419, 780, 244, 406, 219, 543, 676, 570, 597, 651, 624, 705, 786, 409, 335, 362, 231, 421, 611, 315, 369, 598, 221, 248, 706, 410, 572, 801, 653, 464, 680, 788, 601, 364, 896, 127, 659, 422, 235, 343, 559, 370, 222, 451, 613, 317, 775, 802, 425, 654, 708, 412, 602, 792, 661, 688, 614, 237, 318, 399, 372, 426, 453, 347, 480, 804, 617, 779, 243, 604, 567, 833, 712, 675, 433, 662, 359, 238, 454, 665, 591, 428, 618, 349, 376, 834, 191, 457, 781, 245, 808, 407, 434, 677, 571, 625, 787, 666, 363, 720, 350, 458, 620, 782, 246, 836, 678, 599, 436, 626, 249, 707, 411, 573, 465, 681, 789, 816, 668, 365, 897, 460, 423, 371, 223, 250, 574, 840, 803, 655, 466, 628, 682, 709, 790, 413, 603, 736, 440, 366, 898, 793, 689, 615, 319, 373, 427, 252, 481, 710, 414, 805, 468, 684, 605, 900, 632, 713, 794, 848, 663, 690, 239, 374, 455, 482, 806, 429, 619, 377, 606, 835, 714, 809, 472, 435, 796, 904, 692, 667, 430, 721, 351, 484, 378, 459, 621, 783, 247, 810, 837, 864, 716, 679, 437, 627, 722, 817, 669, 696, 622, 380, 912, 838, 461, 488, 812, 438, 251, 575, 841, 467, 629, 683, 791, 737, 818, 441, 670, 367, 899, 724, 462, 842, 630, 253, 711, 415, 738, 442, 469, 685, 496, 820, 901, 633, 795, 928, 849, 728, 691, 375, 254, 483, 844, 807, 470, 686, 607, 740, 444, 902, 634, 715, 850, 473, 797, 824, 905, 693, 431, 485, 379, 811, 474, 636, 865, 717, 798, 744, 852, 906, 694, 960, 723, 486, 697, 623, 381, 913, 839, 866, 489, 718, 813, 476, 439, 908, 856, 819, 671, 698, 725, 752, 382, 914, 463, 490, 814, 868, 843, 631, 739, 443, 497, 726, 821, 700, 929, 916, 729, 492, 255, 845, 872, 471, 687, 498, 741, 822, 445, 903, 635, 930, 851, 730, 825, 920, 846, 742, 446, 500, 475, 637, 799, 932, 745, 826, 853, 907, 880, 732, 695, 961, 487, 638, 867, 719, 746, 854, 477, 504, 962, 828, 909, 936, 857, 699, 753, 383, 915, 491, 815, 478, 869, 748, 910, 964, 858, 727, 754, 701, 917, 944, 870, 493, 873, 499, 860, 823, 702, 968, 931, 756, 918, 731, 494, 921, 847, 874, 743, 447, 501, 933, 827, 881, 733, 760, 922, 976, 876, 502, 639, 934, 747, 855, 882, 505, 734, 963, 829, 937, 924, 479, 506, 749, 830, 911, 884, 938, 965, 859, 992, 755, 945, 871, 750, 508, 966, 940, 861, 888, 703, 969, 757, 919, 946, 495, 875, 862, 970, 758, 948, 761, 923, 977, 877, 503, 972, 935, 883, 735, 762, 978, 925, 952, 878, 507, 831, 885, 939, 764, 993, 926, 980, 751, 886, 509, 967, 994, 941, 889, 984, 947, 510, 942, 863, 996, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q116_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 27, 160, 81, 513, 76, 39, 134, 82, 29, 56, 514, 137, 272, 43, 97, 30, 259, 84, 138, 192, 516, 145, 71, 98, 45, 261, 288, 140, 88, 51, 520, 146, 46, 100, 262, 75, 265, 53, 161, 148, 528, 77, 104, 266, 54, 320, 135, 162, 83, 57, 515, 273, 152, 78, 268, 31, 164, 58, 85, 139, 112, 193, 274, 517, 544, 99, 86, 194, 60, 289, 518, 141, 168, 276, 89, 384, 521, 147, 47, 101, 263, 290, 142, 196, 90, 522, 576, 280, 149, 176, 102, 529, 292, 105, 267, 92, 55, 321, 200, 163, 524, 150, 530, 153, 79, 106, 322, 269, 296, 165, 59, 113, 275, 154, 545, 208, 532, 108, 640, 270, 324, 166, 87, 114, 195, 61, 519, 546, 169, 277, 304, 156, 385, 536, 62, 328, 291, 143, 116, 170, 197, 278, 91, 224, 386, 548, 523, 577, 281, 177, 103, 198, 293, 172, 93, 388, 120, 578, 201, 282, 525, 336, 151, 552, 178, 768, 531, 294, 107, 94, 323, 202, 297, 526, 580, 284, 392, 180, 155, 209, 533, 560, 109, 641, 271, 298, 325, 352, 204, 167, 115, 584, 547, 210, 305, 534, 157, 184, 110, 642, 400, 326, 537, 300, 63, 329, 117, 171, 279, 225, 306, 158, 387, 549, 212, 644, 538, 592, 330, 118, 199, 226, 550, 173, 308, 389, 121, 579, 283, 416, 337, 553, 216, 179, 540, 769, 648, 332, 295, 174, 95, 228, 390, 122, 203, 527, 338, 554, 581, 285, 608, 312, 770, 393, 181, 561, 299, 124, 656, 353, 582, 205, 286, 232, 340, 394, 556, 182, 448, 772, 585, 211, 535, 562, 185, 111, 643, 401, 327, 354, 206, 301, 396, 586, 344, 307, 159, 186, 213, 776, 240, 402, 564, 645, 539, 672, 302, 593, 356, 331, 119, 227, 588, 551, 214, 309, 188, 417, 646, 404, 594, 217, 541, 568, 649, 784, 333, 360, 175, 229, 310, 391, 123, 418, 339, 555, 218, 609, 313, 542, 771, 596, 650, 704, 408, 334, 230, 125, 657, 583, 287, 420, 610, 233, 314, 341, 395, 557, 368, 220, 183, 449, 773, 800, 652, 600, 563, 126, 658, 355, 207, 234, 342, 558, 450, 612, 316, 774, 397, 587, 424, 345, 187, 777, 241, 403, 565, 673, 303, 660, 357, 236, 398, 452, 346, 589, 215, 616, 778, 242, 566, 832, 189, 647, 674, 405, 595, 432, 358, 569, 785, 664, 361, 590, 348, 311, 190, 456, 419, 780, 244, 406, 219, 543, 676, 570, 597, 651, 624, 705, 786, 409, 335, 362, 231, 421, 611, 315, 369, 598, 221, 248, 706, 410, 572, 801, 653, 464, 680, 788, 601, 364, 896, 127, 659, 422, 235, 343, 559, 370, 222, 451, 613, 317, 775, 802, 425, 654, 708, 412, 602, 792, 661, 688, 614, 237, 318, 399, 372, 426, 453, 347, 480, 804, 617, 779, 243, 604, 567, 833, 712, 675, 433, 662, 359, 238, 454, 665, 591, 428, 618, 349, 376, 834, 191, 457, 781, 245, 407, 808, 434, 677, 571, 625, 787, 666, 363, 720, 350, 458, 620, 782, 246, 836, 678, 599, 436, 626, 249, 707, 411, 573, 465, 681, 789, 816, 668, 365, 897, 460, 423, 371, 223, 250, 574, 840, 803, 655, 466, 628, 682, 709, 790, 413, 603, 736, 440, 366, 898, 793, 689, 615, 319, 373, 427, 252, 481, 710, 414, 805, 468, 684, 605, 900, 632, 713, 794, 848, 663, 690, 239, 374, 455, 482, 806, 429, 619, 377, 606, 835, 714, 809, 472, 435, 796, 904, 692, 667, 430, 721, 351, 484, 378, 459, 621, 783, 247, 810, 837, 864, 716, 679, 437, 627, 722, 817, 669, 696, 622, 380, 912, 838, 461, 488, 812, 438, 251, 575, 841, 467, 629, 683, 791, 737, 818, 441, 670, 367, 899, 724, 462, 842, 630, 253, 711, 415, 738, 442, 469, 685, 496, 820, 901, 633, 795, 928, 849, 728, 691, 375, 254, 483, 844, 807, 470, 686, 607, 740, 444, 902, 634, 715, 850, 473, 797, 824, 905, 693, 431, 485, 379, 811, 474, 636, 865, 717, 798, 744, 852, 906, 694, 960, 723, 486, 697, 623, 381, 913, 839, 866, 489, 718, 813, 476, 439, 908, 856, 819, 671, 698, 725, 752, 382, 914, 463, 490, 814, 868, 843, 631, 739, 443, 497, 726, 821, 700, 929, 916, 729, 492, 255, 845, 471, 872, 687, 498, 741, 822, 445, 903, 635, 930, 851, 730, 825, 920, 846, 742, 446, 500, 475, 637, 799, 932, 745, 826, 853, 907, 880, 732, 695, 961, 487, 638, 867, 719, 746, 854, 477, 504, 962, 828, 909, 936, 857, 699, 753, 383, 915, 491, 815, 478, 869, 748, 910, 964, 858, 727, 754, 701, 917, 944, 870, 493, 873, 499, 860, 823, 702, 968, 931, 756, 918, 731, 494, 921, 847, 874, 743, 447, 501, 933, 827, 881, 733, 760, 922, 976, 876, 502, 639, 934, 747, 855, 882, 505, 734, 963, 829, 937, 924, 479, 506, 749, 830, 911, 884, 938, 965, 859, 992, 755, 945, 871, 750, 508, 966, 940, 861, 888, 703, 969, 757, 919, 946, 495, 875, 862, 970, 758, 948, 761, 923, 977, 877, 503, 972, 935, 883, 735, 762, 978, 925, 952, 878, 507, 831, 885, 939, 764, 993, 926, 980, 751, 886, 509, 967, 994, 941, 889, 984, 947, 510, 942, 863, 996, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q117_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 27, 160, 81, 513, 76, 39, 134, 82, 29, 56, 514, 137, 272, 43, 97, 30, 259, 84, 138, 192, 516, 145, 71, 98, 45, 261, 288, 140, 88, 51, 520, 146, 46, 100, 262, 75, 265, 53, 161, 148, 528, 77, 104, 266, 54, 320, 135, 162, 83, 57, 515, 273, 152, 78, 268, 31, 164, 58, 85, 139, 112, 193, 274, 517, 544, 99, 86, 194, 60, 289, 518, 141, 168, 276, 89, 384, 521, 147, 47, 101, 263, 290, 142, 196, 90, 522, 576, 280, 149, 176, 102, 529, 292, 105, 267, 92, 55, 321, 200, 163, 524, 150, 530, 153, 79, 106, 322, 269, 296, 165, 59, 113, 275, 154, 545, 208, 532, 108, 640, 270, 324, 166, 87, 114, 195, 61, 519, 546, 169, 277, 304, 156, 385, 536, 62, 328, 291, 143, 116, 170, 197, 278, 91, 224, 386, 548, 523, 577, 281, 177, 103, 198, 293, 172, 93, 388, 120, 578, 201, 282, 525, 336, 151, 552, 178, 768, 531, 294, 107, 94, 323, 202, 297, 526, 580, 284, 392, 180, 155, 209, 533, 560, 109, 641, 271, 298, 325, 352, 204, 167, 115, 584, 547, 210, 305, 534, 157, 184, 110, 642, 400, 326, 537, 300, 63, 329, 117, 171, 279, 225, 306, 158, 387, 549, 212, 644, 538, 592, 330, 118, 199, 226, 550, 173, 308, 389, 121, 579, 283, 416, 337, 553, 216, 179, 540, 769, 648, 332, 295, 174, 95, 228, 390, 122, 203, 527, 338, 554, 581, 285, 608, 312, 770, 393, 181, 561, 299, 124, 656, 353, 582, 205, 286, 232, 340, 394, 556, 182, 448, 772, 585, 211, 535, 562, 185, 111, 643, 401, 327, 354, 206, 301, 396, 586, 344, 307, 159, 186, 213, 776, 240, 402, 564, 645, 539, 672, 302, 593, 356, 331, 119, 227, 588, 551, 214, 309, 188, 417, 646, 404, 594, 217, 541, 568, 649, 784, 333, 360, 175, 229, 310, 391, 123, 418, 339, 555, 218, 609, 313, 542, 771, 596, 650, 704, 408, 334, 230, 125, 657, 583, 287, 420, 610, 233, 314, 341, 395, 557, 368, 220, 183, 449, 773, 800, 652, 600, 563, 126, 658, 355, 207, 234, 342, 558, 450, 612, 316, 774, 397, 587, 424, 345, 187, 777, 241, 403, 565, 673, 303, 660, 357, 236, 398, 452, 346, 589, 215, 616, 778, 242, 566, 189, 832, 647, 674, 405, 595, 432, 358, 569, 785, 664, 361, 590, 348, 311, 190, 456, 419, 780, 244, 406, 219, 543, 676, 570, 597, 651, 624, 705, 786, 409, 335, 362, 231, 421, 611, 315, 369, 598, 221, 248, 706, 410, 572, 801, 653, 464, 680, 788, 601, 364, 896, 127, 659, 422, 235, 343, 559, 370, 222, 451, 613, 317, 775, 802, 425, 654, 708, 412, 602, 792, 661, 688, 614, 237, 318, 399, 372, 426, 453, 347, 480, 804, 617, 779, 243, 604, 567, 833, 712, 675, 433, 662, 359, 238, 454, 665, 591, 428, 618, 349, 376, 191, 834, 457, 781, 245, 407, 808, 434, 677, 571, 625, 787, 666, 363, 720, 350, 458, 620, 782, 246, 836, 678, 599, 436, 626, 249, 707, 411, 573, 465, 681, 789, 816, 668, 365, 897, 460, 423, 371, 223, 250, 574, 840, 803, 655, 466, 628, 682, 709, 790, 413, 603, 736, 440, 366, 898, 793, 689, 615, 319, 373, 427, 252, 481, 710, 414, 805, 468, 684, 605, 900, 632, 713, 794, 848, 663, 690, 239, 374, 455, 482, 806, 429, 619, 377, 606, 835, 714, 809, 472, 435, 796, 904, 692, 667, 430, 721, 351, 484, 378, 459, 621, 783, 247, 810, 837, 864, 716, 679, 437, 627, 722, 817, 669, 696, 622, 380, 912, 838, 461, 488, 812, 438, 251, 575, 841, 467, 629, 683, 791, 737, 818, 441, 670, 367, 899, 724, 462, 842, 630, 253, 711, 415, 738, 442, 469, 685, 496, 820, 901, 633, 795, 928, 849, 728, 691, 375, 254, 483, 844, 807, 470, 686, 607, 740, 444, 902, 634, 715, 850, 473, 797, 824, 905, 693, 431, 485, 379, 811, 474, 636, 865, 717, 798, 744, 852, 906, 694, 960, 723, 486, 697, 623, 381, 913, 839, 866, 489, 718, 813, 476, 439, 908, 856, 819, 671, 698, 725, 752, 382, 914, 463, 490, 814, 868, 843, 631, 739, 443, 497, 726, 821, 700, 929, 916, 729, 492, 255, 845, 471, 872, 687, 498, 741, 822, 445, 903, 635, 930, 851, 730, 825, 920, 846, 742, 446, 500, 475, 637, 799, 932, 745, 826, 853, 907, 880, 732, 695, 961, 487, 638, 867, 719, 746, 854, 477, 504, 962, 828, 909, 936, 857, 699, 753, 383, 915, 491, 815, 478, 869, 748, 910, 964, 858, 727, 754, 701, 917, 944, 870, 493, 873, 499, 860, 823, 702, 968, 931, 756, 918, 731, 494, 921, 847, 874, 743, 447, 501, 933, 827, 881, 733, 760, 922, 976, 876, 502, 639, 934, 747, 855, 882, 505, 734, 963, 829, 937, 924, 479, 506, 749, 830, 911, 884, 938, 965, 859, 992, 755, 945, 871, 750, 508, 966, 940, 861, 888, 703, 969, 757, 919, 946, 495, 875, 862, 970, 758, 948, 761, 923, 977, 877, 503, 972, 935, 883, 735, 762, 978, 925, 952, 878, 507, 831, 885, 939, 764, 993, 926, 980, 751, 886, 509, 967, 994, 941, 889, 984, 947, 510, 942, 863, 996, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q118_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 27, 160, 81, 513, 76, 39, 134, 82, 29, 56, 137, 514, 272, 43, 97, 30, 259, 84, 138, 192, 516, 145, 71, 98, 45, 261, 288, 140, 88, 51, 520, 146, 46, 100, 262, 75, 265, 53, 161, 148, 528, 77, 104, 266, 54, 320, 135, 162, 83, 57, 515, 273, 152, 78, 268, 31, 164, 58, 85, 139, 112, 193, 274, 517, 544, 99, 86, 194, 60, 289, 141, 518, 168, 276, 89, 384, 521, 147, 47, 101, 263, 290, 142, 196, 90, 522, 576, 280, 149, 176, 102, 529, 292, 105, 267, 92, 55, 321, 200, 163, 524, 150, 153, 530, 79, 106, 322, 269, 296, 165, 59, 113, 275, 154, 545, 208, 532, 108, 640, 270, 324, 166, 87, 114, 195, 61, 519, 169, 546, 277, 304, 156, 385, 536, 62, 328, 291, 143, 116, 170, 197, 278, 91, 224, 386, 548, 523, 577, 281, 177, 103, 198, 293, 172, 93, 388, 120, 201, 578, 282, 525, 336, 151, 552, 178, 768, 531, 294, 107, 94, 323, 202, 297, 526, 580, 284, 392, 180, 155, 209, 533, 560, 109, 641, 271, 298, 325, 352, 204, 167, 115, 584, 547, 210, 305, 157, 534, 184, 110, 642, 400, 326, 537, 300, 63, 329, 117, 171, 279, 225, 306, 158, 387, 549, 212, 644, 538, 592, 330, 118, 199, 226, 173, 550, 308, 389, 121, 579, 283, 416, 337, 553, 216, 179, 540, 769, 648, 332, 295, 174, 95, 228, 390, 122, 203, 527, 338, 554, 581, 285, 608, 312, 393, 770, 181, 561, 299, 124, 353, 656, 205, 582, 286, 232, 340, 394, 556, 182, 448, 772, 585, 211, 535, 185, 562, 111, 643, 401, 327, 354, 206, 301, 396, 586, 344, 307, 159, 186, 213, 776, 240, 402, 564, 645, 539, 672, 302, 593, 356, 331, 119, 227, 588, 551, 214, 309, 188, 417, 646, 404, 217, 594, 541, 568, 649, 784, 333, 360, 175, 229, 310, 391, 123, 418, 339, 555, 218, 609, 313, 542, 771, 596, 650, 704, 408, 334, 230, 125, 657, 583, 287, 420, 233, 610, 314, 341, 395, 557, 368, 220, 183, 449, 773, 800, 652, 600, 563, 126, 355, 658, 207, 234, 342, 558, 450, 612, 316, 397, 774, 587, 424, 345, 187, 777, 241, 403, 565, 673, 303, 357, 660, 236, 398, 452, 346, 589, 215, 616, 778, 242, 189, 566, 832, 647, 674, 405, 595, 432, 358, 569, 785, 361, 664, 590, 348, 311, 190, 456, 419, 780, 244, 406, 219, 543, 676, 570, 597, 651, 624, 705, 409, 786, 335, 362, 231, 421, 611, 315, 369, 221, 598, 248, 706, 410, 572, 801, 653, 464, 680, 788, 601, 364, 896, 127, 659, 422, 235, 343, 559, 370, 222, 451, 613, 317, 775, 425, 802, 654, 708, 412, 602, 792, 661, 688, 237, 614, 318, 399, 372, 426, 453, 347, 480, 804, 617, 779, 243, 604, 567, 833, 712, 675, 433, 359, 662, 238, 454, 665, 591, 428, 618, 349, 376, 191, 457, 834, 781, 245, 407, 808, 434, 677, 571, 625, 787, 363, 666, 720, 350, 458, 620, 782, 246, 836, 678, 599, 436, 249, 626, 707, 411, 573, 465, 681, 789, 816, 365, 668, 897, 460, 423, 371, 223, 250, 574, 840, 803, 655, 466, 628, 682, 709, 413, 790, 603, 736, 440, 366, 898, 793, 689, 615, 319, 373, 427, 252, 481, 710, 414, 805, 468, 684, 605, 900, 632, 713, 794, 848, 663, 690, 239, 374, 455, 482, 429, 806, 619, 377, 606, 835, 714, 809, 472, 435, 796, 904, 692, 667, 430, 721, 351, 484, 378, 459, 621, 783, 247, 810, 837, 864, 716, 679, 437, 627, 722, 817, 669, 696, 622, 380, 912, 461, 838, 488, 812, 438, 251, 575, 841, 467, 629, 683, 791, 737, 441, 818, 367, 670, 899, 724, 462, 842, 253, 630, 711, 415, 738, 442, 469, 685, 496, 820, 901, 633, 795, 928, 849, 728, 691, 375, 254, 483, 844, 807, 470, 686, 607, 740, 444, 902, 634, 715, 473, 850, 797, 824, 905, 693, 431, 485, 379, 811, 474, 636, 865, 717, 798, 744, 852, 906, 694, 960, 723, 486, 697, 623, 381, 913, 839, 489, 866, 718, 813, 476, 439, 908, 856, 819, 671, 698, 725, 752, 382, 914, 463, 490, 814, 868, 843, 631, 739, 443, 497, 726, 821, 700, 929, 916, 729, 492, 255, 845, 471, 872, 687, 498, 741, 445, 822, 903, 635, 930, 851, 730, 825, 920, 846, 742, 446, 500, 475, 637, 799, 932, 745, 826, 853, 907, 880, 732, 695, 961, 487, 638, 867, 719, 746, 477, 854, 504, 962, 828, 909, 936, 857, 699, 753, 383, 915, 491, 815, 478, 869, 748, 910, 964, 858, 727, 754, 701, 917, 944, 493, 870, 873, 499, 860, 823, 702, 968, 931, 756, 918, 731, 494, 921, 847, 874, 743, 447, 501, 933, 827, 881, 733, 760, 922, 976, 876, 502, 639, 934, 747, 855, 505, 882, 734, 963, 829, 937, 924, 479, 506, 749, 830, 911, 884, 938, 965, 859, 992, 755, 945, 871, 750, 508, 966, 940, 861, 888, 703, 969, 757, 919, 946, 495, 875, 862, 970, 758, 948, 761, 923, 977, 877, 503, 972, 935, 883, 735, 762, 978, 925, 952, 878, 507, 831, 885, 939, 764, 993, 926, 980, 751, 509, 886, 967, 994, 941, 889, 984, 947, 510, 942, 863, 996, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q119_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 72, 35, 22, 130, 25, 37, 132, 26, 80, 512, 38, 67, 41, 28, 257, 136, 15, 42, 69, 96, 258, 49, 144, 70, 44, 260, 73, 23, 50, 131, 74, 264, 52, 133, 27, 160, 81, 513, 76, 39, 134, 82, 29, 56, 137, 514, 272, 43, 97, 30, 259, 84, 138, 192, 516, 145, 71, 98, 45, 261, 288, 140, 88, 51, 520, 146, 46, 100, 262, 75, 265, 53, 161, 148, 77, 528, 104, 266, 54, 320, 135, 162, 83, 57, 515, 273, 152, 78, 268, 31, 164, 58, 85, 139, 112, 193, 274, 517, 544, 99, 86, 194, 60, 289, 141, 518, 168, 276, 89, 384, 521, 147, 47, 101, 263, 290, 142, 196, 90, 522, 576, 280, 149, 176, 102, 529, 292, 105, 267, 92, 55, 321, 200, 163, 524, 150, 153, 79, 530, 106, 322, 269, 296, 165, 59, 113, 275, 154, 545, 208, 532, 108, 640, 270, 324, 166, 87, 114, 195, 61, 519, 169, 546, 277, 304, 156, 385, 536, 62, 328, 291, 143, 116, 170, 197, 278, 91, 224, 386, 548, 523, 577, 281, 177, 103, 198, 293, 172, 93, 388, 120, 201, 578, 282, 525, 336, 151, 552, 178, 768, 531, 294, 107, 94, 323, 202, 297, 526, 580, 284, 392, 180, 155, 209, 533, 109, 560, 641, 271, 298, 325, 352, 204, 167, 115, 584, 547, 210, 305, 157, 534, 184, 110, 642, 400, 326, 537, 300, 63, 329, 117, 171, 279, 225, 306, 158, 387, 549, 212, 644, 538, 592, 330, 118, 199, 226, 173, 550, 308, 389, 121, 579, 283, 416, 337, 553, 216, 179, 540, 769, 648, 332, 295, 174, 95, 228, 390, 122, 203, 527, 338, 554, 581, 285, 608, 312, 393, 770, 181, 561, 299, 124, 353, 205, 656, 582, 286, 232, 340, 394, 556, 182, 448, 772, 585, 211, 535, 185, 111, 562, 643, 401, 327, 354, 206, 301, 396, 586, 344, 307, 159, 186, 213, 776, 240, 402, 564, 645, 539, 672, 302, 593, 356, 331, 119, 227, 588, 551, 214, 309, 188, 417, 646, 404, 217, 594, 541, 568, 649, 333, 784, 360, 175, 229, 310, 391, 123, 418, 339, 555, 218, 609, 313, 542, 771, 596, 650, 704, 408, 334, 230, 125, 657, 583, 287, 420, 233, 610, 314, 341, 395, 557, 368, 220, 183, 449, 773, 800, 652, 600, 563, 126, 355, 207, 658, 234, 342, 558, 450, 612, 316, 397, 774, 587, 424, 345, 187, 777, 241, 403, 565, 673, 303, 357, 660, 236, 398, 452, 346, 589, 215, 616, 778, 242, 189, 566, 832, 647, 674, 405, 595, 432, 358, 569, 785, 361, 664, 590, 348, 311, 190, 456, 419, 780, 244, 406, 219, 543, 676, 570, 597, 651, 624, 705, 409, 335, 786, 362, 231, 421, 611, 315, 369, 221, 598, 248, 706, 410, 572, 801, 653, 464, 680, 788, 601, 364, 896, 127, 659, 422, 235, 343, 559, 370, 222, 451, 613, 317, 775, 425, 802, 654, 708, 412, 602, 792, 661, 237, 688, 614, 318, 399, 372, 426, 453, 347, 480, 804, 617, 779, 243, 604, 567, 833, 712, 675, 433, 359, 662, 238, 454, 665, 591, 428, 618, 349, 376, 191, 457, 834, 781, 245, 407, 808, 434, 677, 571, 625, 787, 363, 666, 720, 350, 458, 620, 782, 246, 836, 678, 599, 436, 249, 626, 707, 411, 573, 465, 681, 789, 365, 816, 668, 897, 460, 423, 371, 223, 250, 574, 840, 803, 655, 466, 628, 682, 709, 413, 790, 603, 736, 440, 366, 898, 793, 689, 615, 319, 373, 427, 252, 481, 710, 414, 805, 468, 684, 605, 900, 632, 713, 794, 848, 663, 239, 690, 374, 455, 482, 429, 806, 619, 377, 606, 835, 714, 809, 472, 435, 796, 904, 692, 667, 430, 721, 351, 484, 378, 459, 621, 783, 247, 810, 837, 864, 716, 679, 437, 627, 722, 817, 669, 696, 622, 380, 461, 912, 838, 488, 812, 438, 251, 575, 841, 467, 629, 683, 791, 737, 441, 367, 818, 670, 899, 724, 462, 842, 253, 630, 711, 415, 738, 442, 469, 685, 496, 820, 901, 633, 795, 928, 849, 728, 691, 375, 254, 483, 844, 807, 470, 686, 607, 740, 444, 902, 634, 715, 473, 850, 797, 824, 905, 693, 431, 485, 379, 811, 474, 636, 865, 717, 798, 744, 852, 906, 694, 960, 723, 486, 697, 623, 381, 913, 839, 489, 866, 718, 813, 476, 439, 908, 856, 819, 671, 698, 725, 752, 382, 463, 914, 490, 814, 868, 843, 631, 739, 443, 497, 726, 821, 700, 929, 916, 729, 492, 255, 845, 471, 872, 687, 498, 741, 445, 822, 903, 635, 930, 851, 730, 825, 920, 846, 742, 446, 500, 475, 637, 799, 932, 745, 826, 853, 907, 880, 732, 695, 961, 487, 638, 867, 719, 746, 477, 854, 504, 962, 828, 909, 936, 857, 699, 753, 383, 915, 491, 815, 478, 869, 748, 910, 964, 858, 727, 754, 701, 917, 493, 944, 870, 873, 499, 860, 823, 702, 968, 931, 756, 918, 731, 494, 921, 847, 874, 743, 447, 501, 933, 827, 881, 733, 760, 922, 976, 876, 502, 639, 934, 747, 855, 505, 882, 734, 963, 829, 937, 924, 479, 506, 749, 830, 911, 884, 938, 965, 859, 992, 755, 945, 871, 750, 508, 966, 940, 861, 888, 703, 969, 757, 919, 495, 946, 875, 862, 970, 758, 948, 761, 923, 977, 877, 503, 972, 935, 883, 735, 762, 978, 925, 952, 878, 507, 831, 885, 939, 764, 993, 926, 980, 751, 509, 886, 967, 994, 941, 889, 984, 947, 510, 942, 863, 996, 890, 971, 759, 949, 892, 973, 1000, 950, 763, 979, 953, 879, 974, 765, 927, 954, 981, 1008, 887, 766, 995, 982, 956, 985, 511, 943, 997, 891, 986, 998, 893, 1001, 988, 951, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q120_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 97, 30, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 194, 60, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 195, 61, 519, 169, 546, 277, 156, 304, 385, 536, 62, 143, 291, 328, 116, 170, 197, 278, 91, 224, 386, 548, 523, 281, 577, 103, 177, 198, 293, 172, 93, 388, 120, 201, 282, 578, 525, 151, 336, 552, 178, 768, 531, 294, 107, 94, 323, 202, 297, 526, 284, 580, 392, 180, 155, 209, 533, 109, 560, 271, 641, 298, 325, 167, 204, 352, 115, 547, 584, 210, 157, 305, 534, 110, 184, 642, 326, 400, 537, 300, 63, 329, 117, 171, 279, 225, 158, 306, 387, 549, 212, 644, 538, 592, 330, 118, 199, 226, 173, 550, 308, 389, 121, 283, 579, 416, 337, 553, 179, 216, 540, 769, 648, 295, 332, 174, 95, 228, 390, 122, 203, 527, 338, 554, 285, 581, 312, 608, 393, 770, 181, 561, 299, 124, 205, 353, 286, 582, 656, 232, 340, 394, 556, 182, 448, 772, 585, 211, 535, 111, 185, 562, 643, 327, 401, 206, 354, 301, 396, 586, 159, 307, 344, 186, 213, 776, 240, 402, 564, 645, 539, 302, 672, 593, 356, 331, 119, 227, 551, 588, 214, 309, 188, 417, 646, 404, 217, 594, 541, 568, 649, 333, 784, 175, 360, 229, 310, 391, 123, 418, 339, 555, 218, 313, 609, 542, 771, 596, 650, 334, 408, 704, 230, 125, 287, 583, 657, 420, 233, 314, 610, 341, 395, 557, 183, 220, 368, 449, 773, 652, 800, 563, 600, 126, 207, 355, 658, 234, 342, 558, 450, 316, 612, 397, 774, 587, 424, 345, 187, 777, 241, 403, 565, 303, 673, 357, 660, 236, 398, 452, 346, 589, 215, 616, 778, 242, 189, 566, 647, 832, 674, 405, 595, 358, 432, 569, 785, 361, 590, 664, 311, 348, 190, 419, 456, 780, 244, 406, 219, 543, 676, 570, 597, 651, 624, 335, 409, 705, 786, 362, 231, 421, 315, 611, 221, 369, 598, 248, 410, 706, 572, 653, 801, 464, 680, 788, 601, 364, 896, 127, 659, 422, 235, 343, 559, 222, 370, 451, 317, 613, 775, 425, 654, 802, 412, 708, 602, 792, 661, 237, 318, 614, 688, 399, 372, 426, 453, 347, 480, 804, 617, 779, 243, 567, 604, 833, 675, 712, 359, 433, 662, 238, 454, 591, 665, 428, 618, 349, 191, 376, 457, 834, 781, 245, 407, 808, 434, 677, 571, 625, 787, 363, 666, 350, 720, 458, 620, 782, 246, 836, 678, 599, 436, 249, 626, 411, 707, 573, 465, 681, 789, 365, 668, 816, 897, 423, 460, 223, 371, 250, 574, 655, 803, 840, 466, 628, 682, 413, 709, 790, 603, 366, 440, 736, 898, 793, 319, 615, 689, 373, 427, 252, 481, 414, 710, 805, 468, 684, 605, 900, 632, 713, 794, 663, 848, 239, 690, 374, 455, 482, 429, 806, 619, 377, 606, 835, 714, 809, 435, 472, 796, 904, 692, 667, 430, 351, 721, 484, 378, 459, 621, 783, 247, 810, 837, 679, 716, 864, 437, 627, 722, 669, 817, 622, 696, 380, 461, 838, 912, 488, 812, 438, 251, 575, 841, 467, 629, 683, 791, 367, 441, 737, 670, 818, 899, 724, 462, 842, 253, 630, 415, 711, 442, 738, 469, 685, 496, 820, 901, 633, 795, 928, 849, 691, 728, 375, 254, 483, 807, 844, 470, 686, 607, 444, 740, 902, 634, 715, 473, 850, 797, 824, 905, 693, 431, 485, 379, 811, 474, 636, 717, 865, 798, 744, 852, 906, 694, 960, 723, 486, 623, 697, 381, 839, 913, 489, 718, 866, 813, 439, 476, 908, 671, 819, 856, 698, 725, 382, 752, 463, 914, 490, 814, 868, 843, 631, 443, 739, 497, 726, 821, 700, 929, 916, 729, 492, 255, 845, 471, 687, 872, 498, 445, 741, 822, 903, 635, 930, 851, 730, 825, 846, 920, 446, 742, 500, 475, 637, 799, 932, 745, 826, 853, 907, 695, 732, 880, 961, 487, 638, 719, 867, 746, 477, 854, 504, 962, 828, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 963, 829, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 993, 926, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q121_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 61, 195, 519, 169, 546, 277, 156, 304, 385, 536, 62, 143, 291, 328, 116, 170, 197, 278, 91, 224, 386, 548, 523, 281, 577, 103, 177, 198, 293, 172, 93, 120, 388, 201, 282, 578, 525, 151, 336, 552, 178, 768, 531, 294, 107, 94, 323, 202, 297, 526, 284, 580, 392, 180, 155, 209, 533, 109, 560, 271, 641, 298, 325, 167, 204, 352, 115, 547, 584, 210, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 308, 121, 389, 283, 579, 416, 337, 553, 179, 216, 540, 769, 648, 295, 332, 174, 95, 228, 122, 390, 203, 527, 338, 554, 285, 581, 312, 608, 393, 770, 181, 561, 299, 124, 205, 286, 353, 582, 656, 232, 340, 394, 556, 182, 448, 772, 585, 211, 535, 111, 185, 562, 643, 327, 401, 206, 354, 301, 396, 586, 159, 307, 344, 186, 213, 240, 776, 402, 564, 645, 539, 302, 672, 593, 356, 331, 119, 227, 551, 588, 214, 309, 188, 417, 646, 404, 217, 594, 541, 568, 649, 333, 784, 175, 360, 229, 310, 123, 391, 418, 339, 555, 218, 313, 542, 609, 771, 596, 650, 334, 408, 704, 230, 125, 287, 583, 657, 420, 233, 314, 610, 341, 395, 557, 183, 220, 368, 449, 773, 652, 800, 563, 600, 126, 207, 355, 658, 234, 342, 558, 316, 450, 612, 397, 774, 587, 424, 345, 187, 241, 777, 403, 565, 303, 673, 357, 660, 236, 398, 452, 346, 589, 215, 616, 242, 778, 189, 566, 647, 832, 674, 405, 595, 358, 432, 569, 785, 361, 590, 664, 311, 348, 190, 419, 456, 244, 780, 406, 219, 543, 676, 570, 597, 651, 624, 335, 409, 705, 786, 362, 231, 421, 315, 611, 221, 369, 598, 248, 410, 572, 706, 653, 801, 464, 680, 788, 601, 364, 896, 127, 659, 422, 235, 343, 559, 222, 370, 317, 451, 613, 775, 425, 654, 802, 412, 708, 602, 792, 661, 237, 318, 614, 688, 399, 372, 426, 453, 347, 480, 804, 617, 243, 779, 567, 604, 833, 675, 712, 359, 433, 662, 238, 454, 591, 665, 428, 618, 349, 191, 376, 457, 834, 245, 781, 407, 808, 434, 677, 571, 625, 787, 363, 666, 350, 720, 458, 620, 246, 782, 836, 678, 599, 436, 249, 626, 411, 573, 707, 465, 681, 789, 365, 668, 816, 897, 423, 460, 223, 371, 250, 574, 655, 803, 840, 466, 628, 682, 413, 709, 790, 603, 366, 440, 736, 898, 793, 319, 615, 689, 373, 427, 252, 414, 481, 710, 805, 468, 684, 605, 632, 900, 713, 794, 663, 848, 239, 690, 374, 455, 482, 429, 806, 619, 377, 606, 835, 714, 809, 435, 472, 796, 904, 692, 667, 430, 351, 721, 484, 378, 459, 621, 247, 783, 810, 837, 679, 716, 864, 437, 627, 722, 669, 817, 622, 696, 380, 461, 838, 912, 488, 812, 438, 251, 575, 841, 467, 629, 683, 791, 367, 441, 670, 737, 818, 899, 724, 462, 842, 253, 630, 415, 711, 442, 738, 469, 685, 496, 820, 633, 901, 795, 928, 849, 691, 728, 375, 254, 483, 807, 844, 470, 686, 607, 444, 740, 634, 902, 715, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 813, 439, 476, 908, 671, 819, 856, 698, 725, 382, 752, 463, 914, 490, 814, 868, 843, 631, 443, 739, 497, 726, 821, 700, 929, 916, 729, 492, 255, 845, 471, 687, 872, 498, 445, 741, 822, 635, 903, 930, 851, 730, 825, 846, 920, 446, 742, 500, 475, 637, 799, 932, 745, 826, 853, 907, 695, 732, 880, 961, 487, 638, 719, 867, 746, 477, 854, 504, 828, 962, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q122_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 278, 91, 224, 386, 548, 523, 281, 577, 103, 177, 198, 293, 172, 93, 120, 388, 201, 282, 578, 525, 151, 336, 552, 178, 768, 531, 294, 107, 94, 323, 202, 297, 526, 284, 580, 392, 180, 155, 209, 533, 109, 560, 271, 641, 298, 325, 167, 204, 352, 115, 547, 584, 210, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 308, 121, 389, 283, 579, 416, 337, 553, 179, 216, 540, 769, 648, 295, 332, 174, 95, 228, 122, 390, 203, 527, 338, 285, 554, 581, 312, 608, 393, 770, 181, 561, 299, 124, 205, 286, 353, 582, 656, 232, 340, 394, 556, 182, 448, 772, 585, 211, 535, 111, 185, 562, 643, 327, 401, 206, 354, 301, 396, 586, 159, 307, 344, 186, 213, 240, 776, 402, 564, 645, 539, 302, 672, 593, 356, 331, 119, 227, 551, 588, 214, 309, 188, 417, 646, 404, 217, 594, 541, 568, 649, 333, 784, 175, 360, 229, 310, 123, 391, 418, 339, 555, 218, 313, 542, 609, 771, 596, 650, 334, 408, 704, 230, 125, 287, 583, 657, 420, 233, 314, 341, 610, 395, 557, 183, 220, 368, 449, 773, 652, 800, 563, 600, 126, 207, 355, 658, 234, 342, 558, 316, 450, 612, 397, 774, 587, 424, 345, 187, 241, 777, 403, 565, 303, 673, 357, 660, 236, 398, 452, 346, 589, 215, 616, 242, 778, 189, 566, 647, 832, 405, 674, 595, 358, 432, 569, 785, 361, 590, 664, 311, 348, 190, 419, 456, 244, 780, 406, 219, 543, 676, 570, 597, 651, 624, 335, 409, 705, 786, 362, 231, 421, 315, 611, 221, 369, 598, 248, 410, 572, 706, 653, 801, 464, 680, 788, 601, 364, 896, 127, 659, 422, 235, 343, 559, 222, 370, 317, 451, 613, 775, 425, 654, 802, 412, 708, 602, 792, 661, 237, 318, 614, 688, 399, 372, 426, 453, 347, 480, 804, 617, 243, 779, 567, 604, 833, 675, 712, 359, 433, 662, 238, 454, 591, 665, 428, 349, 618, 191, 376, 457, 834, 245, 781, 407, 808, 434, 677, 571, 625, 787, 363, 666, 350, 720, 458, 620, 246, 782, 836, 678, 599, 436, 249, 626, 411, 573, 707, 465, 681, 789, 365, 668, 816, 897, 423, 460, 223, 371, 250, 574, 655, 803, 840, 466, 628, 413, 682, 709, 790, 603, 366, 440, 736, 898, 793, 319, 615, 689, 373, 427, 252, 414, 481, 710, 805, 468, 684, 605, 632, 900, 713, 794, 663, 848, 239, 690, 374, 455, 482, 429, 806, 619, 377, 606, 835, 714, 809, 435, 472, 796, 904, 692, 667, 430, 351, 721, 484, 378, 459, 621, 247, 783, 810, 837, 679, 716, 864, 437, 627, 722, 669, 817, 622, 696, 380, 461, 838, 912, 488, 812, 438, 251, 575, 841, 467, 629, 683, 791, 367, 441, 670, 737, 818, 899, 724, 462, 842, 253, 630, 415, 711, 442, 469, 738, 685, 496, 820, 633, 901, 795, 928, 849, 691, 728, 375, 254, 483, 807, 844, 470, 686, 607, 444, 740, 634, 902, 715, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 813, 439, 476, 908, 671, 819, 856, 698, 725, 382, 752, 463, 914, 490, 814, 868, 843, 631, 443, 739, 497, 726, 821, 700, 929, 916, 729, 492, 255, 845, 471, 687, 872, 498, 445, 741, 822, 635, 903, 930, 851, 730, 825, 846, 920, 446, 742, 500, 475, 637, 799, 932, 745, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q123_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 278, 91, 224, 386, 548, 523, 281, 577, 103, 177, 198, 293, 172, 93, 120, 388, 201, 282, 578, 525, 151, 336, 552, 178, 768, 531, 294, 107, 94, 323, 202, 297, 526, 284, 580, 392, 180, 155, 209, 533, 109, 271, 560, 641, 298, 325, 167, 204, 352, 115, 547, 584, 210, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 308, 121, 389, 283, 579, 416, 337, 553, 179, 216, 540, 769, 648, 295, 332, 174, 95, 228, 122, 390, 203, 527, 338, 285, 554, 581, 312, 608, 393, 181, 770, 561, 299, 124, 205, 286, 353, 582, 656, 232, 340, 394, 556, 182, 448, 772, 585, 211, 535, 111, 185, 562, 643, 327, 401, 206, 354, 301, 396, 586, 159, 307, 344, 186, 213, 240, 776, 402, 564, 645, 539, 302, 672, 593, 356, 331, 119, 227, 551, 588, 214, 309, 188, 417, 646, 404, 217, 594, 541, 568, 649, 333, 784, 175, 360, 229, 310, 123, 391, 418, 339, 555, 218, 313, 542, 609, 771, 596, 650, 334, 408, 704, 230, 125, 287, 583, 657, 420, 233, 314, 341, 610, 395, 557, 183, 220, 368, 449, 773, 652, 800, 563, 600, 126, 207, 355, 658, 234, 342, 558, 316, 450, 612, 397, 774, 587, 424, 345, 187, 241, 777, 403, 565, 303, 673, 357, 660, 236, 398, 452, 346, 589, 215, 616, 242, 189, 778, 566, 647, 832, 405, 674, 595, 358, 432, 569, 785, 361, 590, 664, 311, 348, 190, 419, 456, 244, 780, 406, 219, 543, 676, 570, 597, 651, 335, 624, 409, 705, 786, 362, 231, 421, 315, 611, 221, 369, 598, 248, 410, 572, 706, 653, 801, 464, 680, 788, 601, 364, 896, 127, 659, 422, 235, 343, 559, 222, 370, 317, 451, 613, 775, 425, 654, 802, 412, 708, 602, 792, 661, 237, 318, 614, 399, 688, 372, 426, 453, 347, 480, 804, 617, 243, 779, 567, 604, 833, 675, 712, 359, 433, 662, 238, 454, 591, 665, 428, 349, 618, 191, 376, 457, 245, 834, 781, 407, 808, 434, 677, 571, 625, 787, 363, 666, 350, 720, 458, 620, 246, 782, 836, 678, 599, 436, 249, 626, 411, 573, 707, 465, 681, 789, 365, 668, 816, 897, 423, 460, 223, 371, 250, 574, 655, 803, 840, 466, 628, 413, 682, 709, 790, 603, 366, 440, 736, 898, 793, 319, 615, 689, 373, 427, 252, 414, 481, 710, 805, 468, 684, 605, 632, 900, 713, 794, 663, 848, 239, 690, 374, 455, 482, 429, 806, 619, 377, 606, 835, 714, 809, 435, 472, 796, 904, 692, 667, 430, 351, 721, 484, 378, 459, 621, 247, 783, 810, 837, 679, 716, 864, 437, 627, 722, 669, 817, 622, 696, 380, 461, 838, 912, 488, 812, 438, 251, 575, 841, 467, 629, 683, 791, 367, 441, 670, 737, 818, 899, 724, 462, 253, 842, 630, 415, 711, 442, 469, 738, 685, 496, 820, 633, 901, 795, 928, 849, 691, 728, 375, 254, 483, 807, 844, 470, 686, 607, 444, 740, 634, 902, 715, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 813, 439, 476, 908, 671, 819, 856, 698, 725, 382, 463, 752, 914, 490, 814, 868, 843, 631, 443, 739, 497, 726, 821, 700, 929, 916, 729, 492, 255, 845, 471, 687, 872, 498, 445, 741, 822, 635, 903, 930, 851, 730, 825, 846, 920, 446, 742, 500, 475, 637, 799, 932, 745, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q124_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 278, 91, 224, 386, 548, 523, 281, 577, 103, 177, 198, 293, 172, 93, 120, 388, 201, 282, 578, 525, 151, 336, 552, 178, 768, 531, 294, 107, 94, 323, 202, 297, 526, 284, 580, 392, 180, 155, 209, 533, 109, 271, 560, 641, 298, 325, 167, 204, 352, 115, 547, 584, 210, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 308, 121, 389, 283, 579, 416, 337, 553, 179, 216, 540, 769, 648, 295, 332, 174, 95, 228, 122, 390, 203, 527, 338, 285, 554, 581, 312, 608, 393, 181, 770, 561, 299, 124, 205, 286, 353, 582, 656, 232, 340, 394, 556, 182, 448, 772, 585, 211, 535, 111, 185, 562, 643, 327, 401, 206, 354, 301, 396, 586, 159, 307, 344, 186, 213, 240, 776, 402, 564, 645, 539, 302, 672, 593, 356, 331, 119, 227, 551, 588, 214, 309, 188, 417, 646, 404, 217, 594, 541, 568, 649, 333, 175, 784, 360, 229, 310, 123, 391, 418, 339, 555, 218, 313, 542, 609, 771, 596, 650, 334, 408, 704, 230, 125, 287, 583, 657, 420, 233, 314, 341, 610, 395, 557, 183, 220, 368, 449, 773, 652, 800, 563, 600, 126, 207, 355, 658, 234, 342, 558, 316, 450, 612, 397, 774, 587, 424, 345, 187, 241, 777, 403, 565, 303, 673, 357, 660, 236, 398, 452, 346, 589, 215, 616, 242, 189, 778, 566, 647, 832, 405, 674, 595, 358, 432, 569, 785, 361, 590, 664, 311, 348, 190, 419, 456, 244, 780, 406, 219, 543, 676, 570, 597, 651, 335, 624, 409, 705, 786, 362, 231, 421, 315, 611, 221, 369, 598, 248, 410, 572, 706, 653, 801, 464, 680, 788, 601, 364, 127, 896, 659, 422, 235, 343, 559, 222, 370, 317, 451, 613, 775, 425, 654, 802, 412, 708, 602, 792, 661, 237, 318, 614, 399, 688, 372, 426, 453, 347, 480, 804, 617, 243, 779, 567, 604, 833, 675, 712, 359, 433, 662, 238, 454, 591, 665, 428, 349, 618, 191, 376, 457, 245, 834, 781, 407, 808, 434, 677, 571, 625, 787, 363, 666, 350, 720, 458, 620, 246, 782, 836, 678, 599, 436, 249, 626, 411, 573, 707, 465, 681, 789, 365, 668, 816, 897, 423, 460, 223, 371, 250, 574, 655, 803, 840, 466, 628, 413, 682, 709, 790, 603, 366, 440, 736, 898, 793, 319, 615, 689, 373, 427, 252, 414, 481, 710, 805, 468, 684, 605, 632, 900, 713, 794, 663, 239, 848, 690, 374, 455, 482, 429, 806, 619, 377, 606, 835, 714, 809, 435, 472, 796, 904, 692, 667, 430, 351, 721, 484, 378, 459, 621, 247, 783, 810, 837, 679, 716, 864, 437, 627, 722, 669, 817, 622, 696, 380, 461, 838, 912, 488, 812, 438, 251, 575, 841, 467, 629, 683, 791, 367, 441, 670, 737, 818, 899, 724, 462, 253, 842, 630, 415, 711, 442, 469, 738, 685, 496, 820, 633, 901, 795, 928, 849, 691, 728, 375, 254, 483, 807, 844, 470, 686, 607, 444, 740, 634, 902, 715, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 813, 439, 476, 908, 671, 819, 856, 698, 725, 382, 463, 752, 914, 490, 814, 868, 843, 631, 443, 739, 497, 726, 821, 700, 929, 916, 729, 492, 255, 845, 471, 687, 872, 498, 445, 741, 822, 635, 903, 930, 851, 730, 825, 846, 920, 446, 742, 500, 475, 637, 799, 932, 745, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q125_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 260, 73, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 520, 146, 46, 100, 262, 75, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 276, 89, 384, 521, 147, 47, 101, 263, 142, 290, 196, 90, 522, 280, 576, 149, 102, 176, 529, 292, 105, 267, 55, 92, 321, 163, 200, 524, 150, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 278, 91, 224, 386, 548, 523, 281, 577, 103, 177, 198, 293, 172, 93, 120, 388, 201, 282, 578, 525, 151, 336, 552, 178, 768, 531, 294, 107, 94, 323, 202, 297, 526, 284, 580, 392, 180, 155, 209, 533, 109, 271, 560, 641, 298, 325, 167, 204, 352, 115, 547, 584, 210, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 308, 121, 389, 283, 579, 416, 337, 553, 179, 216, 540, 769, 648, 295, 332, 174, 95, 228, 122, 390, 203, 527, 338, 285, 554, 581, 312, 393, 608, 181, 770, 561, 299, 124, 205, 286, 353, 582, 656, 232, 340, 394, 556, 182, 448, 772, 585, 211, 535, 111, 185, 562, 643, 327, 401, 206, 354, 301, 396, 586, 159, 307, 344, 186, 213, 240, 776, 402, 564, 645, 539, 302, 672, 593, 356, 331, 119, 227, 551, 588, 214, 309, 188, 417, 646, 404, 217, 594, 541, 568, 649, 333, 175, 784, 360, 229, 310, 123, 391, 418, 339, 555, 218, 313, 542, 609, 771, 596, 650, 334, 408, 704, 230, 125, 287, 583, 657, 420, 233, 314, 341, 395, 610, 557, 183, 220, 368, 449, 773, 652, 800, 563, 600, 126, 207, 355, 658, 234, 342, 558, 316, 450, 397, 612, 774, 587, 424, 345, 187, 241, 777, 403, 565, 303, 673, 357, 660, 236, 398, 452, 346, 589, 215, 616, 242, 189, 778, 566, 647, 832, 405, 674, 595, 358, 432, 569, 785, 361, 590, 664, 311, 348, 190, 419, 456, 244, 780, 406, 219, 543, 676, 570, 597, 651, 335, 409, 624, 705, 786, 362, 231, 421, 315, 611, 221, 369, 598, 248, 410, 572, 706, 653, 801, 464, 680, 788, 601, 364, 127, 896, 659, 422, 235, 343, 559, 222, 370, 317, 451, 613, 775, 425, 654, 802, 412, 708, 602, 792, 661, 237, 318, 399, 614, 688, 372, 426, 453, 347, 480, 804, 617, 243, 779, 567, 604, 833, 675, 712, 359, 433, 662, 238, 454, 591, 665, 428, 349, 618, 191, 376, 457, 245, 834, 781, 407, 808, 434, 677, 571, 625, 787, 363, 666, 350, 720, 458, 620, 246, 782, 836, 678, 599, 436, 249, 411, 626, 573, 707, 465, 681, 789, 365, 668, 816, 897, 423, 460, 223, 371, 250, 574, 655, 803, 840, 466, 413, 628, 682, 709, 790, 603, 366, 440, 736, 898, 793, 319, 615, 689, 373, 427, 252, 414, 481, 710, 805, 468, 684, 605, 632, 900, 713, 794, 663, 239, 848, 690, 374, 455, 482, 429, 806, 619, 377, 606, 835, 714, 809, 435, 472, 796, 904, 692, 667, 430, 351, 721, 484, 378, 459, 621, 247, 783, 810, 837, 679, 716, 864, 437, 627, 722, 669, 817, 622, 696, 380, 461, 838, 912, 488, 812, 438, 251, 575, 841, 467, 629, 683, 791, 367, 441, 670, 737, 818, 899, 724, 462, 253, 842, 415, 630, 711, 442, 469, 738, 685, 496, 820, 633, 901, 795, 928, 849, 691, 728, 375, 254, 483, 807, 844, 470, 686, 607, 444, 740, 634, 902, 715, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 813, 439, 476, 908, 671, 819, 856, 698, 725, 382, 463, 752, 914, 490, 814, 868, 843, 631, 443, 739, 497, 726, 821, 700, 929, 916, 729, 492, 255, 845, 471, 687, 872, 498, 445, 741, 822, 635, 903, 930, 851, 730, 825, 846, 920, 446, 742, 500, 475, 637, 799, 932, 745, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 873, 499, 823, 860, 702, 931, 968, 756, 918, 731, 494, 847, 921, 874, 447, 743, 501, 933, 827, 733, 881, 760, 922, 976, 876, 502, 639, 934, 747, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 948, 761, 923, 977, 877, 503, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 950, 763, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

Q126$_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 73, 260, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 146, 520, 46, 100, 75, 262, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 89, 276, 384, 147, 521, 47, 101, 263, 142, 290, 196, 90, 522, 280, 576, 149, 102, 176, 529, 105, 292, 267, 55, 92, 321, 163, 200, 150, 524, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 91, 278, 224, 386, 548, 523, 281, 577, 103, 177, 198, 293, 172, 93, 120, 201, 388, 282, 578, 151, 525, 336, 178, 552, 768, 531, 107, 294, 94, 323, 202, 297, 526, 284, 580, 392, 180, 155, 209, 533, 109, 271, 560, 641, 298, 325, 167, 204, 352, 115, 547, 210, 584, 157, 305, 534, 110, 184, 642, 326, 400, 537, 300, 63, 329, 117, 171, 279, 158, 225, 306, 387, 549, 212, 644, 538, 592, 330, 118, 199, 226, 173, 550, 121, 308, 389, 283, 579, 416, 337, 179, 553, 216, 540, 769, 648, 295, 332, 174, 95, 228, 122, 203, 390, 527, 338, 285, 554, 581, 312, 393, 608, 181, 770, 561, 299, 124, 205, 286, 353, 582, 656, 232, 340, 394, 182, 556, 448, 211, 585, 772, 535, 111, 185, 562, 643, 327, 401, 206, 354, 301, 396, 586, 159, 307, 344, 186, 213, 240, 402, 776, 564, 645, 539, 302, 672, 593, 356, 331, 119, 227, 551, 214, 588, 309, 188, 417, 646, 217, 404, 594, 541, 568, 649, 333, 175, 784, 360, 229, 123, 310, 391, 418, 339, 555, 218, 313, 542, 609, 771, 596, 650, 334, 408, 704, 230, 125, 287, 583, 657, 233, 420, 314, 341, 395, 610, 183, 557, 220, 368, 449, 773, 652, 800, 563, 600, 126, 207, 355, 658, 234, 342, 558, 316, 450, 397, 612, 587, 774, 424, 345, 187, 241, 403, 777, 565, 303, 673, 357, 660, 236, 398, 452, 346, 215, 589, 242, 616, 189, 778, 566, 647, 832, 405, 674, 595, 358, 432, 569, 785, 361, 590, 664, 311, 348, 190, 419, 456, 244, 219, 406, 780, 543, 676, 570, 597, 651, 335, 409, 624, 705, 786, 362, 231, 421, 315, 611, 221, 369, 598, 248, 410, 572, 706, 653, 801, 464, 680, 601, 788, 364, 127, 896, 659, 235, 422, 343, 559, 222, 370, 317, 451, 613, 775, 425, 654, 802, 412, 708, 602, 792, 661, 237, 318, 399, 614, 688, 372, 426, 453, 347, 480, 243, 617, 804, 779, 567, 604, 833, 675, 712, 359, 433, 662, 238, 454, 591, 665, 428, 349, 618, 191, 376, 457, 245, 834, 407, 781, 434, 808, 677, 571, 625, 787, 363, 666, 350, 720, 458, 246, 620, 782, 836, 678, 599, 249, 436, 411, 626, 573, 707, 465, 681, 789, 365, 668, 816, 897, 423, 460, 223, 371, 250, 574, 655, 803, 466, 840, 413, 628, 682, 709, 603, 790, 366, 440, 736, 898, 793, 319, 615, 689, 373, 427, 252, 414, 481, 710, 805, 468, 684, 605, 632, 713, 900, 794, 663, 239, 848, 690, 374, 455, 482, 429, 619, 806, 377, 606, 835, 714, 435, 809, 472, 796, 904, 692, 667, 430, 351, 721, 484, 378, 459, 247, 621, 783, 810, 837, 679, 716, 864, 437, 627, 722, 669, 817, 622, 696, 380, 461, 838, 912, 488, 251, 438, 812, 575, 467, 841, 629, 683, 791, 367, 441, 670, 737, 818, 899, 724, 462, 253, 842, 415, 630, 711, 442, 469, 738, 685, 496, 633, 820, 901, 795, 928, 849, 691, 728, 375, 254, 483, 807, 470, 844, 686, 607, 444, 740, 634, 715, 902, 473, 850, 797, 824, 905, 693, 431, 485, 379, 811, 474, 636, 717, 798, 865, 744, 852, 906, 694, 960, 723, 486, 623, 697, 381, 839, 913, 489, 718, 866, 439, 813, 476, 908, 671, 819, 856, 698, 725, 382, 463, 752, 914, 490, 814, 868, 843, 631, 443, 739, 497, 726, 821, 700, 929, 729, 916, 492, 255, 471, 845, 687, 498, 872, 445, 741, 635, 822, 903, 930, 851, 730, 825, 846, 920, 446, 742, 500, 475, 637, 799, 745, 932, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 499, 873, 823, 860, 702, 931, 968, 756, 731, 918, 494, 847, 921, 874, 447, 743, 501, 933, 827, 733, 881, 760, 922, 976, 502, 876, 639, 747, 934, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 761, 948, 923, 977, 503, 877, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 763, 950, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

Q127$_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 73, 260, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 146, 520, 46, 100, 75, 262, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 89, 276, 384, 147, 521, 47, 101, 263, 142, 290, 196, 90, 522, 280, 149, 576, 102, 176, 529, 105, 292, 267, 55, 92, 321, 163, 200, 150, 524, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 91, 278, 224, 386, 548, 523, 281, 577, 103, 177, 198, 293, 172, 93, 120, 201, 388, 282, 151, 578, 525, 336, 178, 552, 768, 531, 107, 294, 94, 323, 202, 297, 526, 284, 580, 392, 180, 155, 209, 533, 109, 271, 560, 641, 298, 325, 167, 204, 352, 115, 547, 210, 157, 584, 305, 534, 110, 184, 642, 326, 400, 537, 300, 63, 329, 117, 171, 279, 158, 225, 306, 387, 549, 212, 644, 538, 592, 330, 118, 199, 226, 173, 550, 121, 308, 389, 283, 579, 416, 337, 179, 553, 216, 540, 769, 648, 295, 332, 174, 95, 228, 122, 203, 390, 527, 338, 285, 554, 581, 312, 393, 181, 608, 770, 561, 299, 124, 205, 286, 353, 582, 656, 232, 340, 394, 182, 556, 448, 211, 585, 772, 535, 111, 185, 562, 643, 327, 401, 206, 354, 301, 396, 159, 586, 307, 344, 186, 213, 240, 402, 776, 564, 645, 539, 302, 672, 593, 356, 331, 119, 227, 551, 214, 588, 309, 188, 417, 646, 217, 404, 594, 541, 568, 649, 333, 175, 784, 360, 229, 123, 310, 391, 418, 339, 555, 218, 313, 542, 609, 771, 596, 650, 334, 408, 704, 230, 125, 287, 583, 657, 233, 420, 314, 341, 395, 183, 610, 557, 220, 368, 449, 773, 652, 800, 563, 600, 126, 207, 355, 658, 234, 342, 558, 316, 450, 397, 612, 587, 774, 424, 345, 187, 241, 403, 777, 565, 303, 673, 357, 660, 236, 398, 452, 346, 215, 589, 242, 189, 616, 778, 566, 647, 405, 832, 674, 595, 358, 432, 569, 785, 361, 590, 664, 311, 348, 190, 419, 456, 244, 219, 406, 780, 543, 676, 570, 597, 651, 335, 409, 624, 705, 786, 362, 231, 421, 315, 611, 221, 369, 598, 248, 410, 572, 706, 653, 801, 464, 680, 601, 788, 364, 127, 896, 659, 235, 422, 343, 559, 222, 370, 317, 451, 613, 775, 425, 654, 802, 412, 708, 602, 792, 661, 237, 318, 399, 614, 688, 372, 426, 453, 347, 480, 243, 617, 804, 779, 567, 604, 833, 675, 712, 359, 433, 662, 238, 454, 591, 665, 428, 349, 191, 618, 376, 457, 245, 407, 834, 781, 434, 808, 677, 571, 625, 787, 363, 666, 350, 720, 458, 246, 620, 782, 836, 678, 599, 249, 436, 411, 626, 573, 707, 465, 681, 789, 365, 668, 816, 897, 423, 460, 223, 371, 250, 574, 655, 803, 466, 413, 840, 628, 682, 709, 603, 790, 366, 440, 736, 898, 793, 319, 615, 689, 373, 427, 252, 414, 481, 710, 805, 468, 684, 605, 632, 713, 900, 794, 663, 239, 848, 690, 374, 455, 482, 429, 619, 806, 377, 606, 835, 714, 435, 809, 472, 796, 904, 692, 667, 430, 351, 721, 484, 378, 459, 247, 621, 783, 810, 837, 679, 716, 437, 864, 627, 722, 669, 817, 622, 696, 380, 461, 838, 912, 488, 251, 438, 812, 575, 467, 841, 629, 683, 791, 367, 441, 670, 737, 818, 899, 724, 462, 253, 415, 842, 630, 711, 442, 469, 738, 685, 496, 633, 820, 901, 795, 928, 849, 691, 728, 375, 254, 483, 807, 470, 844, 686, 607, 444, 740, 634, 715, 902, 473, 850, 797, 824, 905, 693, 431, 485, 379, 811, 474, 636, 717, 798, 865, 744, 852, 906, 694, 960, 723, 486, 623, 697, 381, 839, 913, 489, 718, 439, 866, 813, 476, 908, 671, 819, 856, 698, 725, 382, 463, 752, 914, 490, 814, 868, 843, 631, 443, 739, 497, 726, 821, 700, 929, 729, 916, 492, 255, 471, 845, 687, 498, 445, 872, 741, 635, 822, 903, 930, 851, 730, 825, 846, 920, 446, 742, 500, 475, 637, 799, 745, 932, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 499, 873, 823, 860, 702, 931, 968, 756, 731, 918, 494, 847, 921, 447, 874, 743, 501, 933, 827, 733, 881, 760, 922, 976, 502, 876, 639, 747, 934, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 761, 948, 923, 977, 503, 877, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 763, 950, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q128_1^{1024}$=[0, 1, 2, 4, 8, 16, 3, 5, 32, 6, 9, 10, 64, 17, 12, 18, 33, 20, 128, 7, 34, 24, 36, 11, 65, 66, 13, 40, 256, 19, 14, 68, 21, 48, 129, 35, 72, 22, 130, 25, 37, 132, 26, 80, 512, 38, 67, 41, 28, 257, 136, 15, 42, 69, 96, 258, 49, 70, 144, 44, 73, 260, 23, 50, 131, 74, 264, 52, 133, 27, 160, 81, 513, 39, 76, 134, 82, 29, 56, 137, 514, 272, 43, 30, 97, 259, 84, 138, 192, 516, 71, 145, 98, 45, 261, 140, 288, 51, 88, 146, 520, 46, 100, 75, 262, 265, 53, 161, 148, 77, 528, 104, 266, 54, 135, 320, 162, 83, 57, 515, 273, 78, 152, 268, 31, 164, 58, 85, 139, 112, 193, 274, 517, 544, 99, 86, 60, 194, 141, 289, 518, 168, 89, 276, 384, 147, 521, 47, 101, 263, 142, 290, 196, 90, 522, 280, 149, 576, 102, 176, 529, 105, 292, 267, 55, 92, 321, 163, 200, 150, 524, 79, 153, 530, 106, 322, 269, 296, 165, 59, 113, 275, 154, 545, 208, 532, 108, 270, 640, 324, 166, 87, 114, 61, 195, 519, 169, 277, 546, 156, 304, 385, 536, 62, 143, 291, 328, 116, 170, 197, 91, 278, 224, 386, 548, 523, 281, 577, 103, 177, 198, 293, 172, 93, 120, 201, 388, 282, 151, 578, 525, 336, 178, 552, 768, 531, 107, 294, 94, 323, 202, 297, 526, 284, 580, 392, 180, 155, 209, 533, 109, 271, 560, 641, 298, 325, 167, 204, 352, 115, 547, 210, 157, 584, 305, 534, 110, 184, 642, 326, 400, 537, 300, 63, 329, 117, 171, 279, 158, 225, 306, 387, 549, 212, 644, 538, 592, 330, 118, 199, 226, 173, 550, 121, 308, 389, 283, 579, 416, 337, 179, 553, 216, 540, 769, 295, 648, 332, 174, 95, 228, 122, 203, 390, 527, 338, 285, 554, 581, 312, 393, 181, 608, 770, 561, 299, 124, 205, 286, 353, 582, 656, 232, 340, 394, 182, 556, 448, 211, 585, 772, 535, 111, 185, 562, 643, 327, 401, 206, 354, 301, 396, 159, 586, 307, 344, 186, 213, 240, 402, 776, 564, 645, 539, 302, 672, 593, 356, 331, 119, 227, 551, 214, 588, 309, 188, 417, 646, 217, 404, 594, 541, 568, 649, 333, 175, 784, 360, 229, 123, 310, 391, 418, 339, 555, 218, 313, 542, 609, 771, 596, 650, 334, 408, 704, 230, 125, 287, 583, 657, 233, 420, 314, 341, 395, 183, 610, 557, 220, 368, 449, 773, 652, 800, 563, 600, 126, 207, 355, 658, 234, 342, 558, 316, 450, 397, 612, 587, 774, 424, 345, 187, 241, 403, 777, 565, 303, 673, 357, 660, 236, 398, 452, 346, 215, 589, 242, 189, 616, 778, 566, 647, 405, 832, 674, 595, 358, 432, 569, 785, 361, 590, 311, 664, 348, 190, 419, 456, 244, 219, 406, 780, 543, 676, 570, 597, 651, 335, 409, 624, 705, 786, 362, 231, 421, 315, 611, 221, 369, 598, 248, 410, 572, 706, 653, 801, 464, 680, 601, 788, 364, 127, 896, 659, 235, 422, 343, 559, 222, 370, 317, 451, 613, 775, 425, 654, 802, 412, 708, 602, 792, 661, 237, 318, 399, 614, 688, 372, 426, 453, 347, 480, 243, 617, 804, 779, 567, 604, 833, 675, 359, 712, 433, 662, 238, 454, 591, 665, 428, 349, 191, 618, 376, 457, 245, 407, 834, 781, 434, 808, 677, 571, 625, 787, 363, 666, 350, 720, 458, 246, 620, 782, 836, 678, 599, 249, 436, 411, 626, 573, 707, 465, 681, 789, 365, 668, 816, 897, 423, 460, 223, 371, 250, 574, 655, 803, 466, 413, 840, 628, 682, 709, 603, 790, 366, 440, 736, 898, 793, 319, 615, 689, 373, 427, 252, 414, 481, 710, 805, 468, 684, 605, 632, 713, 900, 794, 663, 239, 848, 690, 374, 455, 482, 429, 619, 806, 377, 606, 835, 714, 435, 809, 472, 796, 904, 692, 667, 430, 351, 721, 484, 378, 459, 247, 621, 783, 810, 837, 679, 716, 437, 864, 627, 722, 669, 817, 622, 696, 380, 461, 838, 912, 488, 251, 438, 812, 575, 467, 841, 629, 683, 791, 367, 441, 670, 737, 818, 899, 724, 462, 253, 415, 842, 630, 711, 442, 469, 738, 685, 496, 633, 820, 901, 795, 928, 849, 691, 375, 728, 254, 483, 807, 470, 844, 686, 607, 444, 740, 634, 715, 902, 473, 850, 797, 824, 905, 693, 431, 485, 379, 811, 474, 636, 717, 798, 865, 744, 852, 906, 694, 960, 723, 486, 623, 697, 381, 839, 913, 489, 718, 439, 866, 813, 476, 908, 671, 819, 856, 698, 725, 382, 463, 752, 914, 490, 814, 868, 843, 631, 443, 739, 497, 726, 821, 700, 929, 729, 916, 492, 255, 471, 845, 687, 498, 445, 872, 741, 635, 822, 903, 930, 851, 730, 825, 846, 920, 446, 742, 500, 475, 637, 799, 745, 932, 826, 853, 907, 695, 732, 880, 961, 487, 638, 719, 867, 477, 746, 854, 504, 828, 962, 909, 936, 857, 699, 383, 753, 915, 491, 815, 478, 869, 748, 910, 964, 858, 727, 754, 701, 917, 493, 870, 944, 499, 873, 823, 860, 702, 931, 968, 756, 731, 918, 494, 847, 921, 447, 874, 743, 501, 933, 827, 733, 881, 760, 922, 976, 502, 876, 639, 747, 934, 855, 505, 734, 882, 829, 963, 937, 924, 479, 506, 749, 830, 911, 884, 938, 965, 859, 992, 755, 871, 945, 750, 508, 966, 940, 861, 703, 888, 969, 757, 919, 495, 946, 875, 862, 970, 758, 761, 948, 923, 977, 503, 877, 935, 972, 735, 883, 762, 978, 925, 878, 952, 507, 831, 885, 939, 764, 926, 993, 980, 751, 509, 886, 967, 994, 941, 889, 947, 984, 510, 942, 863, 996, 890, 971, 759, 949, 892, 973, 1000, 763, 950, 979, 879, 953, 974, 765, 927, 954, 981, 1008, 887, 766, 995, 982, 956, 985, 511, 943, 997, 891, 986, 998, 893, 1001, 951, 988, 894, 975, 1002, 955, 1009, 1004, 767, 983, 1010, 957, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q129_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 256, 19, 14, 68, 21, 48, 129, 35, 72, 22, 130, 25, 37, 26, 132, 80, 512, 38, 67, 41, 28, 257, 136, 15, 42, 69, 96, 258, 49, 70, 144, 44, 73, 260, 23, 50, 131, 74, 52, 264, 27, 133, 160, 81, 513, 39, 76, 134, 29, 82, 56, 137, 514, 272, 43, 30, 97, 259, 84, 138, 192, 516, 71, 145, 45, 98, 261, 140, 288, 51, 88, 146, 520, 46, 100, 75, 262, 53, 265, 161, 148, 77, 104, 528, 54, 266, 135, 320, 162, 83, 57, 515, 273, 78, 152, 268, 31, 58, 164, 85, 139, 112, 193, 274, 517, 544, 99, 86, 60, 141, 194, 289, 518, 168, 89, 276, 384, 147, 521, 47, 101, 263, 142, 290, 90, 196, 522, 280, 149, 576, 102, 176, 105, 529, 292, 55, 267, 92, 321, 163, 200, 150, 524, 79, 153, 106, 530, 269, 322, 296, 59, 165, 113, 275, 154, 545, 208, 108, 532, 270, 640, 324, 166, 87, 61, 114, 195, 519, 169, 277, 546, 156, 304, 385, 536, 62, 143, 291, 116, 328, 170, 91, 197, 278, 224, 386, 548, 523, 281, 577, 103, 177, 198, 293, 172, 93, 120, 201, 282, 388, 151, 525, 578, 336, 178, 552, 768, 107, 531, 294, 94, 323, 202, 297, 526, 284, 580, 180, 392, 155, 209, 109, 533, 271, 560, 641, 298, 325, 167, 204, 352, 115, 547, 157, 210, 584, 305, 110, 534, 184, 642, 326, 400, 537, 300, 63, 117, 329, 171, 279, 158, 225, 306, 387, 549, 212, 538, 644, 592, 118, 330, 199, 173, 226, 550, 121, 308, 283, 389, 579, 416, 337, 179, 553, 216, 540, 769, 295, 648, 332, 174, 95, 122, 228, 203, 390, 527, 285, 338, 554, 581, 312, 181, 393, 608, 770, 561, 299, 124, 205, 286, 353, 582, 232, 656, 340, 182, 394, 556, 448, 211, 585, 772, 111, 535, 185, 562, 643, 327, 401, 206, 301, 354, 396, 159, 586, 307, 344, 186, 213, 240, 402, 564, 776, 539, 645, 302, 672, 593, 356, 119, 331, 227, 551, 214, 588, 309, 188, 417, 646, 217, 404, 541, 594, 568, 649, 333, 175, 360, 784, 123, 229, 310, 391, 418, 339, 555, 218, 313, 542, 609, 771, 596, 650, 334, 408, 704, 230, 125, 287, 583, 233, 657, 314, 420, 341, 183, 395, 557, 610, 220, 368, 449, 773, 652, 800, 563, 600, 126, 207, 355, 234, 658, 342, 558, 316, 397, 450, 612, 587, 774, 424, 345, 187, 241, 403, 565, 777, 303, 673, 357, 236, 660, 398, 346, 452, 215, 589, 189, 242, 616, 566, 778, 647, 405, 832, 674, 595, 358, 432, 569, 361, 785, 590, 311, 664, 348, 190, 419, 244, 456, 219, 406, 780, 543, 570, 676, 597, 651, 335, 409, 624, 705, 362, 786, 231, 315, 421, 611, 221, 369, 598, 248, 410, 572, 653, 706, 801, 464, 680, 601, 364, 788, 127, 896, 235, 659, 422, 343, 559, 222, 317, 370, 451, 613, 775, 425, 654, 802, 412, 602, 708, 792, 237, 661, 318, 399, 614, 688, 372, 426, 347, 453, 480, 243, 617, 804, 567, 779, 604, 833, 675, 359, 712, 433, 238, 662, 454, 591, 665, 428, 349, 191, 618, 376, 245, 457, 407, 781, 834, 434, 808, 571, 677, 625, 363, 787, 666, 350, 720, 246, 458, 620, 782, 836, 678, 599, 249, 436, 411, 573, 626, 707, 465, 681, 365, 789, 668, 816, 897, 423, 460, 223, 371, 250, 574, 655, 803, 413, 466, 628, 840, 682, 603, 709, 366, 790, 440, 736, 898, 793, 319, 615, 689, 373, 427, 252, 414, 481, 710, 805, 468, 684, 605, 632, 713, 794, 900, 239, 663, 848, 690, 374, 455, 429, 482, 619, 806, 377, 606, 835, 714, 435, 809, 472, 796, 692, 904, 667, 430, 351, 721, 378, 484, 247, 459, 621, 783, 810, 837, 679, 716, 437, 864, 627, 669, 722, 817, 622, 696, 380, 461, 838, 488, 912, 251, 438, 812, 575, 467, 629, 841, 683, 367, 791, 441, 670, 737, 818, 899, 724, 462, 253, 415, 630, 842, 711, 442, 469, 685, 738, 496, 633, 820, 795, 901, 928, 849, 691, 375, 728, 254, 483, 807, 470, 844, 686, 607, 444, 634, 740, 715, 902, 473, 797, 850, 824, 693, 905, 431, 379, 485, 811, 474, 636, 717, 798, 865, 744, 852, 694, 906, 960, 723, 486, 623, 697, 381, 839, 489, 913, 718, 439, 813, 866, 476, 908, 671, 819, 856, 698, 725, 382, 463, 752, 490, 914, 814, 868, 631, 843, 443, 739, 497, 726, 821, 700, 929, 729, 492, 916, 255, 471, 845, 687, 445, 498, 872, 635, 741, 822, 903, 930, 851, 730, 825, 846, 920, 446, 742, 500, 475, 637, 799, 745, 826, 932, 853, 695, 907, 732, 880, 961, 487, 638, 719, 867, 477, 746, 854, 504, 828, 909, 962, 936, 857, 699, 383, 753, 491, 915, 815, 478, 869, 748, 910, 858, 964, 727, 701, 754, 493, 917, 870, 944, 499, 873, 823, 860, 702, 931, 756, 968, 731, 494, 918, 847, 921, 447, 874, 743, 501, 827, 933, 733, 881, 760, 922, 976, 502, 876, 639, 747, 934, 855, 505, 734, 829, 882, 963, 937, 924, 479, 506, 749, 830, 911, 884, 938, 859, 965, 992, 755, 871, 945, 750, 508, 966, 940, 861, 703, 888, 757, 969, 495, 919, 946, 875, 862, 758, 970, 761, 948, 923, 977, 503, 877, 935, 972, 735, 883, 762, 925, 978, 878, 952, 507, 831, 885, 939, 764, 926, 993, 980, 751, 509, 886, 967, 941, 994, 889, 947, 984, 510, 942, 863, 890, 996, 759, 971, 949, 892, 973, 1000, 763, 950, 979, 879, 953, 974, 765, 927, 954, 981, 1008, 887, 766, 995, 982, 956, 985, 511, 943, 891, 997, 986, 998, 893, 1001, 951, 988, 894, 975, 1002, 955, 1009, 1004, 767, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q130_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 256, 19, 14, 68, 21, 48, 129, 35, 72, 22, 130, 25, 37, 26, 132, 80, 512, 38, 67, 41, 28, 257, 136, 15, 42, 69, 96, 258, 49, 70, 144, 44, 73, 260, 23, 50, 131, 74, 52, 264, 27, 133, 160, 81, 513, 39, 76, 134, 29, 82, 56, 137, 514, 272, 43, 30, 97, 259, 84, 138, 192, 516, 71, 145, 45, 98, 261, 140, 288, 51, 88, 146, 520, 46, 100, 75, 262, 53, 265, 161, 148, 77, 104, 528, 54, 266, 135, 320, 162, 83, 57, 515, 273, 78, 152, 268, 31, 58, 164, 85, 139, 112, 193, 274, 517, 544, 99, 86, 60, 141, 194, 289, 518, 168, 89, 276, 384, 147, 521, 47, 101, 263, 142, 290, 90, 196, 522, 280, 149, 576, 102, 176, 105, 529, 292, 55, 267, 92, 321, 163, 200, 150, 524, 79, 153, 106, 530, 269, 322, 296, 59, 165, 113, 275, 154, 545, 208, 108, 532, 270, 640, 324, 166, 87, 61, 114, 195, 519, 169, 277, 546, 156, 304, 385, 536, 62, 143, 291, 116, 328, 170, 91, 197, 278, 224, 386, 548, 523, 281, 577, 103, 177, 198, 293, 172, 93, 120, 201, 282, 388, 151, 525, 578, 336, 178, 552, 768, 107, 531, 294, 94, 323, 202, 297, 526, 284, 580, 180, 392, 155, 209, 109, 533, 271, 560, 298, 641, 325, 167, 204, 352, 115, 547, 157, 210, 584, 305, 110, 534, 184, 642, 326, 400, 537, 300, 63, 117, 329, 171, 279, 158, 225, 306, 387, 549, 212, 538, 644, 592, 118, 330, 199, 173, 226, 550, 121, 308, 283, 389, 579, 416, 337, 179, 553, 216, 540, 769, 295, 648, 332, 174, 95, 122, 228, 203, 390, 527, 285, 338, 554, 581, 312, 181, 393, 608, 770, 561, 299, 124, 205, 286, 353, 582, 232, 656, 340, 182, 394, 556, 448, 211, 585, 772, 111, 535, 185, 562, 643, 327, 401, 206, 301, 354, 396, 159, 586, 307, 344, 186, 213, 240, 402, 564, 776, 539, 302, 645, 672, 593, 356, 119, 331, 227, 551, 214, 588, 309, 188, 417, 646, 217, 404, 541, 594, 568, 649, 333, 175, 360, 784, 123, 229, 310, 391, 418, 339, 555, 218, 313, 542, 609, 771, 596, 650, 334, 408, 704, 230, 125, 287, 583, 233, 314, 657, 420, 341, 183, 395, 557, 610, 220, 368, 449, 773, 652, 800, 563, 600, 126, 207, 355, 234, 658, 342, 558, 316, 397, 450, 612, 587, 774, 424, 345, 187, 241, 403, 565, 777, 303, 673, 357, 236, 660, 398, 346, 452, 215, 589, 189, 242, 616, 566, 778, 647, 405, 832, 674, 595, 358, 432, 569, 361, 785, 590, 311, 664, 348, 190, 419, 244, 456, 219, 406, 780, 543, 570, 676, 597, 651, 335, 409, 624, 362, 705, 786, 231, 315, 421, 611, 221, 369, 598, 248, 410, 572, 653, 706, 801, 464, 680, 601, 364, 788, 127, 896, 235, 659, 422, 343, 559, 222, 317, 370, 451, 613, 775, 425, 654, 802, 412, 602, 708, 792, 237, 318, 661, 399, 614, 688, 372, 426, 347, 453, 480, 243, 617, 804, 567, 779, 604, 833, 675, 359, 712, 433, 238, 662, 454, 591, 665, 428, 349, 191, 618, 376, 245, 457, 407, 781, 834, 434, 808, 571, 677, 625, 363, 787, 666, 350, 720, 246, 458, 620, 782, 836, 678, 599, 249, 436, 411, 573, 626, 707, 465, 681, 365, 789, 668, 816, 897, 423, 460, 223, 371, 250, 574, 655, 803, 413, 466, 628, 840, 682, 603, 366, 709, 790, 440, 736, 898, 793, 319, 615, 689, 373, 427, 252, 414, 481, 710, 805, 468, 684, 605, 632, 713, 794, 900, 239, 663, 848, 690, 374, 455, 429, 482, 619, 806, 377, 606, 835, 714, 435, 809, 472, 796, 692, 904, 667, 430, 351, 378, 721, 484, 247, 459, 621, 783, 810, 837, 679, 716, 437, 864, 627, 669, 722, 817, 622, 696, 380, 461, 838, 488, 912, 251, 438, 812, 575, 467, 629, 841, 683, 367, 791, 441, 670, 737, 818, 899, 724, 462, 253, 415, 630, 842, 711, 442, 469, 685, 738, 496, 633, 820, 795, 901, 928, 849, 691, 375, 728, 254, 483, 807, 470, 844, 686, 607, 444, 634, 740, 715, 902, 473, 797, 850, 824, 693, 905, 431, 379, 485, 811, 474, 636, 717, 798, 865, 744, 852, 694, 906, 960, 723, 486, 623, 697, 381, 839, 489, 913, 718, 439, 813, 866, 476, 908, 671, 819, 856, 698, 382, 725, 463, 752, 490, 914, 814, 868, 631, 843, 443, 739, 497, 726, 821, 700, 929, 729, 492, 916, 255, 471, 845, 687, 445, 498, 872, 635, 741, 822, 903, 930, 851, 730, 825, 846, 920, 446, 742, 500, 475, 637, 799, 745, 826, 932, 853, 695, 907, 732, 880, 961, 487, 638, 719, 867, 477, 746, 854, 504, 828, 909, 962, 936, 857, 699, 383, 753, 491, 915, 815, 478, 869, 748, 910, 858, 964, 727, 701, 754, 493, 917, 870, 944, 499, 873, 823, 860, 702, 931, 756, 968, 731, 494, 918, 847, 921, 447, 874, 743, 501, 827, 933, 733, 881, 760, 922, 976, 502, 876, 639, 747, 934, 855, 505, 734, 829, 882, 963, 937, 924, 479, 506, 749, 830, 911, 884, 938, 859, 965, 992, 755, 871, 945, 750, 508, 966, 940, 861, 703, 888, 757, 969, 495, 919, 946, 875, 862, 758, 970, 761, 948, 923, 977, 503, 877, 935, 972, 735, 883, 762, 925, 978, 878, 952, 507, 831, 885, 939, 764, 926, 993, 980, 751, 509, 886, 967, 941, 994, 889, 947, 984, 510, 942, 863, 890, 996, 759, 971, 949, 892, 973, 1000, 763, 950, 979, 879, 953, 974, 765, 927, 954, 981, 1008, 887, 766, 995, 982, 956, 985, 511, 943, 891, 997, 986, 998, 893, 1001, 951, 988, 894, 975, 1002, 955, 1009, 1004, 767, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q131_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 256, 19, 14, 68, 21, 48, 129, 35, 72, 22, 130, 25, 37, 26, 132, 80, 512, 38, 67, 41, 28, 257, 136, 15, 42, 69, 96, 258, 49, 70, 144, 44, 73, 260, 23, 50, 131, 74, 52, 264, 27, 133, 160, 81, 513, 39, 76, 134, 29, 82, 56, 137, 514, 272, 43, 30, 97, 259, 84, 138, 192, 516, 71, 145, 45, 98, 261, 140, 288, 51, 88, 146, 520, 46, 100, 75, 262, 53, 265, 161, 148, 77, 104, 528, 54, 266, 135, 320, 162, 83, 57, 515, 78, 273, 152, 268, 31, 58, 164, 85, 139, 112, 193, 274, 517, 544, 99, 86, 60, 141, 194, 289, 518, 168, 89, 276, 384, 147, 521, 47, 101, 263, 142, 290, 90, 196, 522, 280, 149, 576, 102, 176, 105, 529, 292, 55, 267, 92, 321, 163, 200, 150, 524, 79, 153, 106, 530, 269, 322, 296, 59, 165, 113, 275, 154, 545, 208, 108, 532, 270, 640, 324, 166, 87, 61, 114, 195, 519, 169, 277, 156, 546, 304, 385, 536, 62, 143, 291, 116, 328, 170, 91, 197, 278, 224, 386, 548, 523, 281, 577, 103, 177, 198, 293, 172, 93, 120, 201, 282, 388, 151, 525, 578, 336, 178, 552, 107, 768, 531, 294, 94, 323, 202, 297, 526, 284, 580, 180, 392, 155, 209, 109, 533, 271, 560, 298, 641, 325, 167, 204, 352, 115, 157, 547, 210, 584, 110, 305, 534, 184, 642, 326, 400, 537, 300, 63, 117, 329, 171, 279, 158, 225, 306, 387, 549, 212, 538, 644, 592, 118, 330, 199, 173, 226, 550, 121, 308, 283, 389, 579, 416, 337, 179, 553, 216, 540, 769, 295, 648, 332, 174, 95, 122, 228, 203, 390, 527, 285, 338, 554, 581, 312, 181, 393, 608, 770, 561, 299, 124, 205, 286, 353, 582, 232, 656, 340, 182, 394, 556, 448, 211, 585, 111, 772, 535, 185, 562, 643, 327, 206, 401, 301, 354, 396, 159, 586, 307, 344, 186, 213, 240, 402, 564, 776, 539, 302, 645, 672, 593, 356, 119, 331, 227, 551, 214, 588, 309, 188, 417, 646, 217, 404, 541, 594, 568, 649, 333, 175, 360, 123, 784, 229, 310, 391, 418, 339, 555, 218, 313, 542, 609, 771, 596, 650, 334, 408, 704, 230, 125, 287, 583, 233, 314, 657, 420, 341, 183, 395, 557, 220, 610, 368, 449, 773, 652, 800, 563, 600, 126, 207, 355, 234, 658, 342, 558, 316, 397, 450, 612, 587, 774, 424, 345, 187, 241, 403, 565, 777, 303, 673, 357, 236, 660, 398, 346, 452, 215, 589, 189, 242, 616, 566, 778, 647, 405, 832, 674, 595, 358, 432, 569, 361, 590, 785, 311, 664, 348, 190, 419, 244, 456, 219, 406, 780, 543, 570, 676, 597, 651, 335, 409, 624, 362, 705, 786, 231, 315, 421, 221, 611, 369, 598, 248, 410, 572, 653, 706, 801, 464, 680, 601, 364, 127, 788, 235, 896, 659, 422, 343, 559, 222, 317, 370, 451, 613, 775, 425, 654, 412, 802, 602, 708, 792, 237, 318, 661, 399, 614, 688, 372, 426, 347, 453, 480, 243, 617, 804, 567, 779, 604, 833, 675, 359, 712, 238, 433, 662, 454, 591, 665, 428, 349, 191, 618, 376, 245, 457, 407, 781, 834, 434, 808, 571, 677, 625, 363, 787, 666, 350, 720, 246, 458, 620, 782, 836, 678, 599, 249, 436, 411, 573, 626, 707, 465, 681, 365, 789, 668, 816, 897, 423, 460, 223, 371, 250, 574, 655, 413, 803, 466, 628, 840, 682, 603, 366, 709, 790, 440, 736, 898, 793, 319, 615, 689, 373, 427, 252, 414, 481, 710, 805, 468, 684, 605, 632, 713, 794, 239, 900, 663, 848, 690, 374, 455, 429, 482, 619, 806, 377, 606, 835, 714, 435, 809, 472, 796, 692, 904, 667, 430, 351, 378, 721, 484, 247, 459, 621, 783, 810, 837, 679, 716, 437, 864, 627, 669, 722, 622, 817, 696, 380, 461, 838, 488, 251, 912, 438, 812, 575, 467, 629, 841, 683, 367, 791, 441, 670, 737, 818, 899, 724, 462, 253, 415, 630, 842, 711, 442, 469, 685, 738, 496, 633, 820, 795, 901, 928, 849, 691, 375, 728, 254, 483, 807, 470, 844, 686, 607, 444, 634, 740, 715, 902, 473, 797, 850, 824, 693, 905, 431, 379, 485, 811, 474, 636, 717, 798, 865, 744, 852, 694, 906, 960, 723, 486, 623, 697, 381, 839, 489, 718, 913, 439, 813, 476, 866, 908, 671, 819, 856, 698, 382, 725, 463, 752, 490, 914, 814, 868, 631, 843, 443, 739, 497, 726, 821, 700, 929, 729, 492, 255, 916, 471, 845, 687, 445, 498, 872, 635, 741, 822, 903, 930, 851, 730, 825, 846, 920, 446, 742, 500, 475, 637, 799, 745, 826, 932, 853, 695, 907, 732, 880, 961, 487, 638, 719, 477, 867, 746, 854, 504, 828, 909, 962, 936, 857, 699, 383, 753, 491, 915, 815, 478, 869, 748, 910, 858, 964, 727, 701, 754, 493, 917, 870, 944, 499, 873, 823, 860, 702, 931, 756, 968, 731, 494, 918, 847, 921, 447, 874, 743, 501, 827, 933, 733, 881, 760, 922, 976, 502, 876, 639, 747, 934, 855, 505, 734, 829, 882, 963, 937, 924, 479, 506, 749, 830, 911, 884, 938, 859, 965, 992, 755, 871, 750, 945, 508, 966, 940, 861, 703, 888, 757, 969, 495, 919, 946, 875, 862, 758, 970, 761, 948, 923, 977, 503, 877, 935, 972, 735, 883, 762, 925, 978, 878, 952, 507, 831, 885, 939, 764, 926, 993, 980, 751, 509, 886, 967, 941, 994, 889, 947, 984, 510, 942, 863, 890, 996, 759, 971, 949, 892, 973, 1000, 763, 950, 979, 879, 953, 974, 765, 927, 954, 981, 1008, 887, 766, 995, 982, 956, 985, 511, 943, 891, 997, 986, 998, 893, 1001, 951, 988, 894, 975, 1002, 955, 1009, 1004, 767, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q132_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 256, 19, 14, 68, 21, 48, 129, 35, 72, 22, 130, 25, 37, 26, 132, 80, 512, 38, 67, 41, 28, 257, 136, 15, 42, 69, 96, 258, 49, 70, 144, 44, 73, 260, 23, 50, 131, 74, 52, 264, 27, 133, 160, 81, 513, 39, 76, 134, 29, 82, 56, 137, 514, 272, 43, 30, 97, 259, 84, 138, 192, 516, 71, 145, 45, 98, 261, 140, 288, 51, 88, 146, 520, 46, 100, 75, 262, 53, 265, 161, 148, 77, 104, 528, 54, 266, 135, 320, 162, 83, 57, 515, 78, 273, 152, 268, 31, 58, 164, 85, 139, 112, 193, 274, 517, 544, 99, 86, 60, 141, 194, 289, 518, 168, 89, 276, 384, 147, 521, 47, 101, 263, 142, 290, 90, 196, 522, 280, 149, 576, 102, 176, 105, 529, 292, 55, 267, 92, 321, 163, 200, 150, 524, 79, 153, 106, 530, 269, 322, 296, 59, 165, 113, 275, 154, 545, 208, 108, 532, 270, 640, 324, 166, 87, 61, 114, 195, 519, 169, 277, 156, 546, 304, 385, 536, 62, 143, 291, 116, 328, 170, 91, 197, 278, 224, 386, 548, 523, 281, 577, 103, 177, 198, 293, 172, 93, 120, 201, 282, 388, 151, 525, 578, 336, 178, 552, 107, 768, 531, 294, 94, 323, 202, 297, 526, 284, 580, 180, 392, 155, 209, 109, 533, 271, 560, 298, 641, 325, 167, 204, 352, 115, 157, 547, 210, 584, 110, 305, 534, 184, 642, 326, 400, 537, 300, 63, 117, 329, 171, 279, 158, 225, 306, 387, 549, 212, 538, 644, 592, 118, 330, 199, 173, 226, 550, 121, 308, 283, 389, 579, 416, 337, 179, 553, 216, 540, 769, 295, 648, 332, 174, 95, 122, 228, 203, 390, 527, 285, 338, 554, 581, 312, 181, 393, 608, 770, 561, 299, 124, 205, 286, 353, 582, 232, 656, 340, 182, 394, 556, 448, 211, 585, 111, 772, 535, 185, 562, 643, 327, 206, 401, 301, 354, 396, 159, 586, 307, 344, 186, 213, 240, 402, 564, 776, 539, 302, 645, 672, 593, 356, 119, 331, 227, 551, 214, 588, 309, 188, 417, 646, 217, 404, 541, 594, 568, 649, 333, 175, 360, 123, 229, 784, 310, 391, 418, 339, 555, 218, 313, 542, 609, 771, 596, 650, 334, 408, 704, 230, 125, 287, 583, 233, 314, 657, 420, 341, 183, 395, 557, 220, 610, 368, 449, 773, 652, 800, 563, 600, 126, 207, 355, 234, 658, 342, 558, 316, 397, 450, 612, 587, 774, 424, 345, 187, 241, 403, 565, 777, 303, 673, 357, 236, 660, 398, 346, 452, 215, 589, 189, 242, 616, 566, 778, 647, 405, 832, 674, 595, 358, 432, 569, 361, 590, 785, 311, 664, 348, 190, 419, 244, 456, 219, 406, 780, 543, 570, 676, 597, 651, 335, 409, 624, 362, 705, 231, 786, 315, 421, 221, 611, 369, 598, 248, 410, 572, 653, 706, 801, 464, 680, 601, 364, 127, 788, 235, 896, 659, 422, 343, 559, 222, 317, 370, 451, 613, 775, 425, 654, 412, 802, 602, 708, 237, 792, 318, 661, 399, 614, 688, 372, 426, 347, 453, 480, 243, 617, 804, 567, 779, 604, 833, 675, 359, 712, 238, 433, 662, 454, 591, 665, 428, 349, 191, 618, 376, 245, 457, 407, 781, 834, 434, 808, 571, 677, 625, 363, 787, 666, 350, 720, 246, 458, 620, 782, 836, 678, 599, 249, 436, 411, 573, 626, 707, 465, 681, 365, 789, 668, 816, 897, 423, 460, 223, 371, 250, 574, 655, 413, 803, 466, 628, 840, 682, 603, 366, 709, 790, 440, 736, 898, 793, 319, 615, 689, 373, 427, 252, 414, 481, 710, 805, 468, 684, 605, 632, 713, 239, 794, 900, 663, 848, 690, 374, 455, 429, 482, 619, 806, 377, 606, 835, 714, 435, 809, 472, 796, 692, 904, 667, 430, 351, 378, 721, 484, 247, 459, 621, 783, 810, 837, 679, 716, 437, 864, 627, 669, 722, 622, 817, 696, 380, 461, 838, 488, 251, 912, 438, 812, 575, 467, 629, 841, 683, 367, 791, 441, 670, 737, 818, 899, 724, 462, 253, 415, 630, 842, 711, 442, 469, 685, 738, 496, 633, 820, 795, 901, 928, 849, 691, 375, 728, 254, 483, 807, 470, 844, 686, 607, 444, 634, 740, 715, 902, 473, 797, 850, 824, 693, 905, 431, 379, 485, 811, 474, 636, 717, 798, 865, 744, 852, 694, 906, 960, 723, 486, 623, 697, 381, 839, 489, 718, 913, 439, 813, 476, 866, 908, 671, 819, 856, 698, 382, 725, 463, 752, 490, 914, 814, 868, 631, 843, 443, 739, 497, 726, 821, 700, 929, 729, 492, 255, 916, 471, 845, 687, 445, 498, 872, 635, 741, 822, 903, 930, 851, 730, 825, 846, 920, 446, 742, 500, 475, 637, 799, 745, 826, 932, 853, 695, 907, 732, 880, 961, 487, 638, 719, 477, 867, 746, 854, 504, 828, 909, 962, 936, 857, 699, 383, 753, 491, 915, 815, 478, 869, 748, 910, 858, 964, 727, 701, 754, 493, 917, 870, 944, 499, 873, 823, 860, 702, 931, 756, 968, 731, 494, 918, 847, 921, 447, 874, 743, 501, 827, 933, 733, 881, 760, 922, 976, 502, 876, 639, 747, 934, 855, 505, 734, 829, 882, 963, 937, 924, 479, 506, 749, 830, 911, 884, 938, 859, 965, 992, 755, 871, 750, 945, 508, 966, 940, 861, 703, 888, 757, 969, 495, 919, 946, 875, 862, 758, 970, 761, 948, 923, 977, 503, 877, 935, 972, 735, 883, 762, 925, 978, 878, 952, 507, 831, 885, 939, 764, 926, 993, 980, 751, 509, 886, 967, 941, 994, 889, 947, 984, 510, 942, 863, 890, 996, 759, 971, 949, 892, 973, 1000, 763, 950, 979, 879, 953, 974, 765, 927, 954, 981, 1008, 887, 766, 995, 982, 956, 985, 511, 943, 891, 997, 986, 998, 893, 1001, 951, 988, 894, 975, 1002, 955, 1009, 1004, 767, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q133_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 264, 133, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 528, 266, 135, 83, 162, 320, 57, 515, 78, 273, 152, 31, 268, 58, 85, 164, 139, 112, 193, 274, 517, 544, 99, 86, 60, 141, 194, 289, 518, 89, 168, 276, 147, 384, 47, 521, 101, 263, 142, 290, 90, 196, 522, 280, 149, 102, 576, 176, 105, 55, 292, 529, 267, 92, 163, 321, 200, 150, 524, 79, 153, 106, 530, 269, 322, 59, 296, 165, 113, 275, 154, 545, 208, 108, 532, 270, 87, 166, 324, 640, 61, 114, 195, 519, 169, 277, 156, 546, 304, 385, 62, 536, 143, 291, 116, 91, 170, 328, 197, 278, 224, 386, 548, 523, 281, 103, 577, 177, 198, 293, 93, 172, 120, 201, 282, 151, 388, 525, 578, 178, 336, 552, 107, 294, 531, 768, 94, 323, 202, 297, 526, 284, 580, 180, 155, 392, 209, 109, 533, 271, 560, 298, 167, 325, 641, 204, 115, 352, 157, 547, 210, 110, 584, 305, 534, 184, 326, 642, 400, 63, 300, 537, 117, 171, 329, 279, 158, 225, 306, 387, 549, 212, 538, 644, 118, 592, 330, 199, 173, 226, 550, 121, 308, 283, 389, 579, 179, 337, 416, 553, 216, 540, 295, 769, 95, 174, 332, 648, 122, 228, 203, 390, 527, 285, 338, 554, 581, 312, 181, 393, 608, 770, 561, 299, 124, 205, 286, 353, 582, 232, 182, 340, 656, 394, 556, 211, 448, 111, 585, 535, 772, 185, 562, 327, 643, 206, 401, 301, 354, 159, 396, 586, 307, 186, 344, 213, 240, 402, 564, 302, 539, 776, 645, 119, 356, 593, 672, 331, 227, 551, 214, 588, 309, 188, 417, 646, 217, 404, 541, 594, 568, 175, 333, 649, 123, 360, 229, 310, 784, 391, 339, 418, 555, 218, 313, 542, 609, 771, 596, 334, 650, 408, 230, 704, 125, 287, 583, 233, 314, 183, 341, 420, 657, 395, 557, 220, 610, 368, 449, 773, 652, 563, 800, 126, 600, 207, 355, 234, 342, 658, 558, 316, 397, 450, 612, 587, 774, 187, 345, 424, 241, 403, 565, 303, 777, 357, 673, 236, 660, 398, 346, 215, 452, 589, 189, 242, 616, 566, 778, 647, 405, 358, 595, 674, 832, 432, 569, 361, 590, 311, 785, 190, 348, 664, 419, 244, 219, 456, 406, 543, 780, 570, 597, 676, 335, 651, 409, 624, 362, 231, 705, 786, 315, 421, 221, 611, 369, 598, 248, 410, 572, 653, 706, 801, 464, 127, 364, 601, 680, 788, 235, 343, 422, 659, 896, 559, 222, 317, 370, 451, 613, 775, 425, 654, 412, 802, 602, 708, 237, 318, 792, 661, 399, 614, 372, 688, 347, 426, 453, 243, 480, 617, 567, 804, 779, 604, 359, 675, 833, 238, 712, 433, 662, 454, 591, 191, 349, 428, 665, 618, 376, 245, 457, 407, 781, 834, 434, 571, 808, 677, 625, 363, 787, 350, 666, 246, 720, 458, 620, 782, 599, 678, 836, 249, 436, 411, 573, 626, 707, 465, 365, 681, 789, 668, 816, 423, 897, 223, 460, 371, 250, 574, 655, 413, 803, 466, 628, 366, 603, 682, 840, 709, 790, 440, 736, 898, 319, 793, 615, 373, 689, 427, 252, 414, 481, 710, 805, 468, 605, 684, 632, 239, 713, 794, 663, 900, 374, 690, 848, 455, 429, 482, 619, 806, 377, 606, 835, 714, 435, 809, 472, 796, 692, 351, 430, 667, 904, 378, 247, 484, 721, 459, 621, 783, 810, 679, 837, 716, 437, 627, 864, 669, 722, 622, 817, 380, 696, 461, 838, 251, 488, 438, 912, 575, 812, 467, 629, 367, 683, 841, 791, 441, 670, 737, 818, 899, 724, 462, 253, 415, 630, 842, 711, 442, 469, 685, 738, 496, 633, 820, 795, 901, 375, 691, 849, 928, 254, 728, 483, 807, 470, 607, 686, 844, 444, 634, 740, 715, 902, 473, 797, 850, 824, 693, 431, 905, 379, 485, 811, 474, 636, 717, 798, 865, 744, 694, 852, 906, 486, 723, 960, 623, 381, 697, 839, 489, 718, 439, 913, 813, 476, 866, 671, 908, 819, 382, 698, 856, 725, 463, 752, 490, 914, 814, 631, 868, 843, 443, 739, 497, 726, 821, 700, 929, 255, 492, 729, 916, 471, 687, 845, 445, 498, 635, 872, 741, 822, 903, 851, 930, 730, 825, 846, 446, 920, 742, 500, 475, 637, 799, 745, 826, 695, 853, 932, 907, 732, 880, 487, 961, 638, 719, 477, 867, 746, 854, 504, 828, 909, 962, 383, 699, 857, 936, 753, 491, 915, 815, 478, 869, 748, 910, 858, 727, 964, 701, 754, 493, 917, 870, 944, 499, 873, 823, 702, 860, 931, 756, 494, 731, 968, 918, 847, 447, 921, 874, 743, 501, 827, 933, 733, 881, 760, 922, 502, 976, 639, 876, 747, 855, 934, 505, 734, 829, 882, 963, 937, 924, 479, 506, 749, 830, 911, 884, 859, 938, 965, 755, 992, 871, 750, 945, 508, 966, 703, 861, 940, 888, 757, 495, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 890, 759, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q134_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 264, 133, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 528, 266, 135, 83, 162, 320, 57, 515, 78, 273, 152, 31, 268, 58, 85, 164, 139, 112, 193, 274, 517, 544, 99, 86, 60, 141, 194, 289, 518, 89, 168, 276, 147, 384, 47, 521, 101, 263, 142, 290, 90, 196, 522, 280, 149, 102, 576, 176, 105, 55, 292, 529, 267, 92, 163, 321, 200, 150, 524, 79, 153, 106, 530, 269, 322, 59, 296, 165, 113, 275, 154, 545, 208, 108, 532, 270, 87, 166, 324, 640, 61, 114, 195, 519, 169, 277, 156, 546, 304, 385, 62, 536, 143, 291, 116, 91, 170, 328, 197, 278, 224, 386, 548, 523, 281, 103, 577, 177, 198, 293, 93, 172, 120, 201, 282, 151, 388, 525, 578, 178, 336, 552, 107, 294, 531, 768, 94, 323, 202, 297, 526, 284, 580, 180, 155, 392, 209, 109, 533, 271, 560, 298, 167, 325, 641, 204, 115, 352, 157, 547, 210, 110, 305, 584, 534, 184, 326, 642, 400, 63, 300, 537, 117, 171, 329, 279, 158, 225, 306, 387, 549, 212, 538, 644, 118, 592, 330, 199, 173, 226, 550, 121, 308, 283, 389, 579, 179, 337, 416, 553, 216, 540, 295, 769, 95, 174, 332, 648, 122, 228, 203, 390, 527, 285, 338, 554, 581, 312, 181, 393, 608, 770, 561, 299, 124, 205, 286, 353, 582, 232, 182, 340, 656, 394, 556, 211, 448, 111, 585, 535, 772, 185, 562, 327, 643, 206, 401, 301, 354, 159, 396, 307, 586, 186, 344, 213, 240, 402, 564, 302, 539, 776, 645, 119, 356, 593, 672, 331, 227, 551, 214, 309, 588, 188, 417, 646, 217, 404, 541, 594, 568, 175, 333, 649, 123, 360, 229, 310, 784, 391, 339, 418, 555, 218, 313, 542, 609, 771, 596, 334, 650, 408, 230, 704, 125, 287, 583, 233, 314, 183, 341, 420, 657, 395, 557, 220, 610, 368, 449, 773, 652, 563, 800, 126, 600, 207, 355, 234, 342, 658, 558, 316, 397, 450, 612, 587, 774, 187, 345, 424, 241, 403, 565, 303, 777, 357, 673, 236, 660, 398, 346, 215, 452, 589, 189, 242, 616, 566, 778, 647, 405, 358, 595, 674, 832, 432, 569, 361, 311, 590, 785, 190, 348, 664, 419, 244, 219, 456, 406, 543, 780, 570, 597, 676, 335, 651, 409, 624, 362, 231, 705, 786, 315, 421, 221, 611, 369, 598, 248, 410, 572, 653, 706, 801, 464, 127, 364, 601, 680, 788, 235, 343, 422, 659, 896, 559, 222, 317, 370, 451, 613, 775, 425, 654, 412, 802, 602, 708, 237, 318, 792, 661, 399, 614, 372, 688, 347, 426, 453, 243, 480, 617, 567, 804, 779, 604, 359, 675, 833, 238, 433, 712, 662, 454, 591, 191, 349, 428, 665, 618, 376, 245, 457, 407, 781, 834, 434, 571, 808, 677, 625, 363, 787, 350, 666, 246, 720, 458, 620, 782, 599, 678, 836, 249, 436, 411, 573, 626, 707, 465, 365, 681, 789, 668, 816, 423, 897, 223, 460, 371, 250, 574, 655, 413, 803, 466, 628, 366, 603, 682, 840, 709, 790, 440, 736, 898, 319, 793, 615, 373, 689, 427, 252, 414, 481, 710, 805, 468, 605, 684, 632, 239, 713, 794, 663, 900, 374, 690, 848, 455, 429, 482, 619, 806, 377, 606, 835, 435, 714, 809, 472, 796, 692, 351, 430, 667, 904, 378, 247, 484, 721, 459, 621, 783, 810, 679, 837, 437, 716, 627, 864, 669, 722, 622, 817, 380, 696, 461, 838, 251, 488, 438, 912, 575, 812, 467, 629, 367, 683, 841, 791, 441, 670, 737, 818, 899, 724, 462, 253, 415, 630, 842, 711, 442, 469, 685, 738, 496, 633, 820, 795, 901, 375, 691, 849, 928, 254, 728, 483, 807, 470, 607, 686, 844, 444, 634, 740, 715, 902, 473, 797, 850, 824, 693, 431, 905, 379, 485, 811, 474, 636, 717, 798, 865, 744, 694, 852, 906, 486, 723, 960, 623, 381, 697, 839, 489, 439, 718, 913, 813, 476, 866, 671, 908, 819, 382, 698, 856, 725, 463, 752, 490, 914, 814, 631, 868, 843, 443, 739, 497, 726, 821, 700, 929, 255, 492, 729, 916, 471, 687, 845, 445, 498, 635, 872, 741, 822, 903, 851, 930, 730, 825, 846, 446, 920, 742, 500, 475, 637, 799, 745, 826, 695, 853, 932, 907, 732, 880, 487, 961, 638, 719, 477, 867, 746, 854, 504, 828, 909, 962, 383, 699, 857, 936, 753, 491, 915, 815, 478, 869, 748, 910, 858, 727, 964, 701, 754, 493, 917, 870, 944, 499, 873, 823, 702, 860, 931, 756, 494, 731, 968, 918, 847, 447, 921, 874, 743, 501, 827, 933, 733, 881, 760, 922, 502, 976, 639, 876, 747, 855, 934, 505, 734, 829, 882, 963, 937, 924, 479, 506, 749, 830, 911, 884, 859, 938, 965, 755, 992, 871, 750, 945, 508, 966, 703, 861, 940, 888, 757, 495, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 890, 759, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q135_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 264, 133, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 528, 266, 135, 83, 162, 320, 57, 515, 78, 273, 152, 31, 268, 58, 85, 164, 139, 112, 193, 274, 517, 544, 99, 86, 60, 141, 194, 289, 518, 89, 168, 276, 147, 384, 47, 521, 101, 263, 142, 290, 90, 196, 522, 280, 149, 102, 576, 176, 105, 55, 292, 529, 267, 92, 163, 321, 200, 150, 524, 79, 153, 106, 530, 269, 322, 59, 296, 165, 113, 275, 154, 545, 208, 108, 532, 270, 87, 166, 324, 640, 61, 114, 195, 519, 169, 277, 156, 546, 304, 385, 62, 536, 143, 291, 116, 91, 170, 328, 197, 278, 224, 386, 548, 523, 281, 103, 577, 177, 198, 293, 93, 172, 120, 201, 282, 151, 388, 525, 578, 178, 336, 552, 107, 294, 531, 768, 94, 323, 202, 297, 526, 284, 580, 180, 155, 392, 209, 109, 533, 271, 560, 298, 167, 325, 641, 204, 115, 352, 157, 547, 210, 110, 305, 584, 534, 184, 326, 642, 400, 63, 300, 537, 117, 171, 329, 279, 158, 225, 306, 387, 549, 212, 538, 644, 118, 592, 330, 199, 173, 226, 550, 121, 308, 283, 389, 579, 179, 337, 416, 553, 216, 540, 295, 769, 95, 174, 332, 648, 122, 228, 203, 390, 527, 285, 338, 554, 581, 312, 181, 393, 608, 770, 561, 299, 124, 205, 286, 353, 582, 232, 182, 340, 656, 394, 556, 211, 448, 111, 585, 535, 185, 772, 562, 327, 643, 206, 401, 301, 354, 159, 396, 307, 586, 186, 344, 213, 240, 402, 564, 302, 539, 776, 645, 119, 356, 593, 672, 331, 227, 551, 214, 309, 588, 188, 417, 646, 217, 404, 541, 594, 568, 175, 333, 649, 123, 360, 229, 310, 784, 391, 339, 418, 555, 218, 313, 542, 609, 771, 596, 334, 650, 408, 230, 704, 125, 287, 583, 233, 314, 183, 341, 420, 657, 395, 557, 220, 610, 368, 449, 773, 652, 563, 800, 126, 600, 207, 355, 234, 342, 658, 558, 316, 397, 450, 612, 587, 187, 774, 345, 424, 241, 403, 565, 303, 777, 357, 673, 236, 660, 398, 346, 215, 452, 589, 189, 242, 616, 566, 778, 647, 405, 358, 595, 674, 832, 432, 569, 361, 311, 590, 785, 190, 348, 664, 419, 244, 219, 456, 406, 543, 780, 570, 597, 676, 335, 651, 409, 624, 362, 231, 705, 786, 315, 421, 221, 611, 369, 598, 248, 410, 572, 653, 706, 801, 464, 127, 364, 601, 680, 788, 235, 343, 422, 659, 896, 559, 222, 317, 370, 451, 613, 775, 425, 654, 412, 802, 602, 708, 237, 318, 792, 661, 399, 614, 372, 688, 347, 426, 453, 243, 480, 617, 567, 804, 779, 604, 359, 675, 833, 238, 433, 712, 662, 454, 591, 191, 349, 428, 665, 618, 376, 245, 457, 407, 781, 834, 434, 571, 808, 677, 625, 363, 787, 350, 666, 246, 720, 458, 620, 782, 599, 678, 249, 836, 436, 411, 573, 626, 707, 465, 365, 681, 789, 668, 816, 423, 897, 223, 460, 371, 250, 574, 655, 413, 803, 466, 628, 366, 603, 682, 840, 709, 790, 440, 736, 898, 319, 793, 615, 373, 689, 427, 252, 414, 481, 710, 805, 468, 605, 684, 632, 239, 713, 794, 663, 900, 374, 690, 848, 455, 429, 482, 619, 806, 377, 606, 835, 435, 714, 809, 472, 796, 692, 351, 430, 667, 904, 378, 247, 484, 721, 459, 621, 783, 810, 679, 837, 437, 716, 627, 864, 669, 722, 622, 817, 380, 696, 461, 251, 838, 488, 438, 912, 575, 812, 467, 629, 367, 683, 841, 791, 441, 670, 737, 818, 899, 724, 462, 253, 415, 630, 842, 711, 442, 469, 685, 738, 496, 633, 820, 795, 901, 375, 691, 849, 928, 254, 728, 483, 807, 470, 607, 686, 844, 444, 634, 740, 715, 902, 473, 797, 850, 824, 693, 431, 905, 379, 485, 811, 474, 636, 717, 798, 865, 744, 694, 852, 906, 486, 723, 960, 623, 381, 697, 839, 489, 439, 718, 913, 813, 476, 866, 671, 908, 819, 382, 698, 856, 725, 463, 752, 490, 914, 814, 631, 868, 843, 443, 739, 497, 726, 821, 700, 929, 255, 492, 729, 916, 471, 687, 845, 445, 498, 635, 872, 741, 822, 903, 851, 930, 730, 825, 846, 446, 920, 742, 500, 475, 637, 799, 745, 826, 695, 853, 932, 907, 732, 880, 487, 961, 638, 719, 477, 867, 746, 854, 504, 828, 909, 962, 383, 699, 857, 936, 753, 491, 915, 815, 478, 869, 748, 910, 858, 727, 964, 701, 754, 493, 917, 870, 944, 499, 873, 823, 702, 860, 931, 756, 494, 731, 968, 918, 847, 447, 921, 874, 743, 501, 827, 933, 733, 881, 760, 922, 502, 976, 639, 876, 747, 855, 934, 505, 734, 829, 882, 963, 937, 924, 479, 506, 749, 830, 911, 884, 859, 938, 965, 755, 992, 871, 750, 945, 508, 966, 703, 861, 940, 888, 757, 495, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 890, 759, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q136_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 264, 133, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 528, 266, 135, 83, 162, 320, 57, 515, 78, 273, 152, 31, 268, 58, 85, 164, 139, 112, 193, 274, 517, 544, 99, 86, 60, 141, 194, 289, 518, 89, 168, 276, 147, 47, 384, 521, 101, 263, 142, 290, 90, 196, 522, 280, 149, 102, 576, 176, 105, 55, 292, 529, 267, 92, 163, 321, 200, 150, 524, 79, 153, 106, 530, 269, 322, 59, 296, 165, 113, 275, 154, 208, 545, 108, 532, 270, 87, 166, 324, 640, 61, 114, 195, 519, 169, 277, 156, 546, 304, 385, 62, 536, 143, 291, 116, 91, 170, 328, 197, 278, 224, 386, 548, 523, 281, 103, 577, 177, 198, 293, 93, 172, 120, 201, 282, 151, 388, 525, 578, 178, 336, 552, 107, 294, 531, 94, 768, 323, 202, 297, 526, 284, 580, 180, 155, 392, 209, 109, 533, 271, 560, 298, 167, 325, 641, 204, 115, 352, 157, 210, 547, 110, 305, 584, 534, 184, 326, 642, 63, 400, 300, 537, 117, 171, 329, 279, 158, 225, 306, 387, 212, 549, 538, 644, 118, 592, 330, 199, 173, 226, 550, 121, 308, 283, 389, 579, 179, 337, 416, 216, 553, 540, 295, 95, 769, 174, 332, 648, 122, 228, 203, 390, 527, 285, 338, 554, 581, 312, 181, 393, 608, 770, 561, 299, 124, 205, 286, 353, 582, 232, 182, 340, 656, 394, 556, 211, 111, 448, 585, 535, 185, 772, 562, 327, 643, 206, 401, 301, 354, 159, 396, 307, 586, 186, 344, 213, 240, 402, 564, 302, 539, 776, 645, 119, 356, 593, 331, 672, 227, 214, 551, 309, 588, 188, 417, 646, 217, 404, 541, 594, 568, 175, 333, 649, 123, 360, 229, 310, 784, 391, 339, 418, 218, 555, 313, 542, 609, 771, 596, 334, 650, 408, 230, 704, 125, 287, 583, 233, 314, 183, 341, 420, 657, 395, 220, 557, 610, 368, 449, 773, 652, 563, 126, 800, 600, 207, 355, 234, 342, 658, 558, 316, 397, 450, 612, 587, 187, 774, 345, 424, 241, 403, 565, 303, 777, 357, 673, 236, 660, 398, 346, 215, 452, 589, 189, 242, 616, 566, 778, 647, 405, 358, 595, 674, 832, 432, 569, 361, 311, 590, 785, 190, 348, 664, 419, 244, 219, 456, 406, 543, 780, 570, 597, 335, 676, 651, 409, 624, 362, 231, 705, 786, 315, 421, 221, 611, 369, 598, 248, 410, 572, 653, 706, 127, 464, 801, 364, 601, 680, 788, 235, 343, 422, 659, 222, 559, 896, 317, 370, 451, 613, 775, 425, 654, 412, 802, 602, 708, 237, 318, 792, 661, 399, 614, 372, 347, 688, 426, 453, 243, 480, 617, 567, 804, 779, 604, 359, 675, 833, 238, 433, 712, 662, 454, 591, 191, 349, 428, 665, 618, 376, 245, 457, 407, 781, 834, 434, 571, 808, 677, 625, 363, 787, 350, 666, 246, 720, 458, 620, 782, 599, 678, 249, 836, 436, 411, 573, 626, 707, 465, 365, 681, 789, 668, 816, 423, 223, 897, 460, 371, 250, 574, 655, 413, 466, 803, 628, 366, 603, 682, 840, 709, 790, 440, 736, 898, 319, 793, 615, 373, 689, 427, 252, 414, 481, 710, 468, 805, 605, 684, 632, 239, 713, 794, 663, 900, 374, 690, 848, 455, 429, 482, 619, 806, 377, 606, 835, 435, 714, 472, 809, 796, 351, 692, 430, 667, 904, 378, 247, 484, 721, 459, 621, 783, 810, 679, 837, 437, 716, 627, 864, 669, 722, 622, 817, 380, 696, 461, 251, 838, 488, 438, 575, 912, 812, 467, 629, 367, 683, 841, 791, 441, 670, 737, 818, 899, 724, 462, 253, 415, 630, 842, 711, 442, 469, 685, 738, 496, 633, 820, 795, 901, 375, 691, 849, 254, 928, 728, 483, 470, 807, 607, 686, 844, 444, 634, 740, 715, 902, 473, 797, 850, 824, 693, 431, 905, 379, 485, 474, 811, 636, 717, 798, 865, 744, 694, 852, 906, 486, 723, 623, 960, 381, 697, 839, 489, 439, 718, 913, 476, 813, 866, 671, 908, 819, 382, 698, 856, 725, 463, 752, 490, 914, 814, 631, 868, 843, 443, 739, 497, 726, 821, 700, 255, 929, 492, 729, 916, 471, 687, 845, 445, 498, 635, 872, 741, 822, 903, 851, 930, 730, 825, 846, 446, 920, 742, 500, 475, 637, 799, 745, 826, 695, 853, 932, 907, 732, 880, 487, 961, 638, 719, 477, 867, 746, 854, 504, 828, 909, 962, 383, 699, 857, 936, 753, 491, 915, 478, 815, 869, 748, 910, 858, 727, 964, 701, 754, 493, 917, 870, 944, 499, 873, 823, 702, 860, 931, 756, 494, 731, 968, 918, 847, 447, 921, 874, 743, 501, 827, 933, 733, 881, 760, 922, 502, 639, 976, 876, 747, 855, 934, 505, 734, 829, 882, 963, 937, 924, 479, 506, 749, 830, 911, 884, 859, 938, 965, 755, 992, 871, 750, 945, 508, 966, 703, 861, 940, 888, 757, 495, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 890, 759, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q137_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 264, 133, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 528, 266, 135, 83, 162, 320, 57, 515, 78, 273, 152, 31, 268, 58, 85, 164, 139, 112, 193, 274, 517, 544, 99, 86, 60, 141, 194, 289, 89, 518, 168, 276, 147, 47, 384, 521, 101, 263, 142, 290, 90, 196, 522, 280, 149, 102, 576, 176, 105, 55, 292, 529, 267, 92, 163, 321, 200, 150, 524, 79, 153, 106, 530, 269, 322, 59, 296, 165, 113, 275, 154, 208, 545, 108, 532, 270, 87, 166, 324, 640, 61, 114, 195, 519, 169, 277, 156, 546, 304, 385, 62, 536, 143, 291, 116, 91, 170, 328, 197, 278, 224, 386, 548, 523, 281, 103, 577, 177, 198, 293, 93, 172, 120, 201, 282, 151, 388, 525, 578, 178, 336, 552, 107, 294, 531, 94, 768, 323, 202, 297, 526, 284, 580, 180, 155, 392, 209, 109, 533, 271, 560, 298, 167, 325, 641, 204, 115, 352, 157, 210, 547, 110, 305, 584, 534, 184, 326, 642, 63, 400, 300, 537, 117, 171, 329, 279, 158, 225, 306, 387, 212, 549, 538, 644, 118, 592, 330, 199, 173, 226, 121, 550, 308, 283, 389, 579, 179, 337, 416, 216, 553, 540, 295, 95, 174, 769, 332, 648, 122, 228, 203, 390, 527, 285, 338, 554, 581, 312, 181, 393, 608, 770, 561, 299, 124, 205, 286, 353, 582, 232, 182, 340, 656, 394, 556, 211, 111, 448, 585, 535, 185, 772, 562, 327, 643, 206, 401, 301, 354, 159, 396, 307, 586, 186, 344, 213, 240, 402, 564, 302, 539, 776, 645, 119, 356, 593, 331, 672, 227, 214, 551, 309, 588, 188, 417, 217, 646, 404, 541, 594, 568, 175, 333, 649, 123, 360, 229, 310, 784, 391, 339, 418, 218, 555, 313, 542, 609, 771, 596, 334, 650, 408, 230, 704, 125, 287, 583, 233, 314, 183, 341, 420, 657, 395, 220, 557, 610, 368, 449, 773, 652, 563, 126, 800, 600, 207, 355, 234, 342, 658, 558, 316, 397, 450, 612, 587, 187, 345, 774, 424, 241, 403, 565, 303, 777, 357, 673, 236, 660, 398, 346, 215, 452, 589, 189, 242, 616, 566, 778, 647, 405, 358, 595, 674, 832, 432, 569, 361, 311, 590, 190, 785, 348, 664, 419, 244, 219, 456, 406, 543, 780, 570, 597, 335, 676, 651, 409, 624, 362, 231, 705, 786, 315, 421, 221, 611, 369, 598, 248, 410, 572, 653, 706, 127, 464, 801, 364, 601, 680, 788, 235, 343, 422, 659, 222, 559, 896, 317, 370, 451, 613, 775, 425, 654, 412, 802, 602, 708, 237, 318, 792, 661, 399, 614, 372, 347, 688, 426, 453, 243, 480, 617, 567, 804, 779, 604, 359, 675, 238, 833, 433, 712, 662, 454, 591, 191, 349, 428, 665, 618, 376, 245, 457, 407, 781, 834, 434, 571, 808, 677, 625, 363, 787, 350, 666, 246, 720, 458, 620, 782, 599, 249, 678, 836, 436, 411, 573, 626, 707, 465, 365, 681, 789, 668, 816, 423, 223, 897, 460, 371, 250, 574, 655, 413, 466, 803, 628, 366, 603, 682, 840, 709, 790, 440, 736, 898, 319, 793, 615, 373, 689, 427, 252, 414, 481, 710, 468, 805, 605, 684, 632, 239, 713, 794, 663, 900, 374, 690, 848, 455, 429, 482, 619, 377, 806, 606, 835, 435, 714, 472, 809, 796, 351, 692, 430, 667, 904, 378, 247, 484, 721, 459, 621, 783, 810, 679, 837, 437, 716, 627, 864, 669, 722, 622, 817, 380, 696, 461, 251, 838, 488, 438, 575, 912, 812, 467, 629, 367, 683, 841, 791, 441, 670, 737, 818, 899, 724, 462, 253, 415, 630, 842, 711, 442, 469, 685, 738, 496, 633, 820, 795, 901, 375, 691, 254, 849, 928, 728, 483, 470, 807, 607, 686, 844, 444, 634, 740, 715, 473, 902, 797, 850, 824, 693, 431, 905, 379, 485, 474, 811, 636, 717, 798, 865, 744, 694, 852, 906, 486, 723, 623, 960, 381, 697, 839, 489, 439, 718, 913, 476, 813, 866, 671, 908, 819, 382, 698, 856, 725, 463, 752, 490, 914, 814, 631, 868, 843, 443, 739, 497, 726, 821, 700, 255, 929, 492, 729, 916, 471, 687, 845, 445, 498, 635, 872, 741, 822, 903, 851, 930, 730, 825, 846, 446, 920, 742, 500, 475, 637, 799, 745, 826, 695, 853, 932, 907, 732, 880, 487, 961, 638, 719, 477, 867, 746, 854, 504, 828, 909, 962, 383, 699, 857, 936, 753, 491, 915, 478, 815, 869, 748, 910, 858, 727, 964, 701, 754, 493, 917, 870, 944, 499, 873, 823, 702, 860, 931, 756, 494, 731, 968, 918, 847, 447, 921, 874, 743, 501, 827, 933, 733, 881, 760, 922, 502, 639, 976, 876, 747, 855, 505, 934, 734, 829, 882, 963, 937, 924, 479, 506, 749, 830, 911, 884, 859, 938, 965, 755, 992, 871, 750, 945, 508, 966, 703, 861, 940, 888, 757, 495, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 890, 759, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q138_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 133, 264, 81, 160, 39, 513, 76, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 135, 266, 528, 83, 162, 320, 57, 515, 78, 273, 152, 31, 268, 58, 85, 164, 139, 112, 193, 274, 517, 544, 99, 86, 60, 141, 194, 289, 89, 518, 168, 276, 147, 47, 384, 521, 101, 263, 142, 290, 90, 196, 522, 149, 280, 102, 576, 176, 105, 55, 292, 267, 529, 92, 163, 321, 200, 150, 524, 79, 153, 106, 530, 269, 322, 59, 165, 296, 113, 275, 154, 208, 545, 108, 270, 532, 87, 166, 324, 640, 61, 114, 195, 519, 169, 277, 156, 546, 304, 385, 62, 143, 536, 291, 116, 91, 170, 197, 328, 278, 224, 386, 548, 523, 281, 103, 577, 177, 198, 293, 93, 172, 120, 201, 151, 282, 388, 525, 578, 178, 336, 552, 107, 294, 531, 94, 768, 323, 202, 297, 526, 284, 580, 180, 155, 392, 209, 109, 271, 533, 167, 298, 560, 325, 641, 204, 115, 352, 157, 210, 547, 110, 305, 584, 534, 184, 326, 642, 63, 400, 300, 537, 117, 171, 329, 279, 158, 225, 306, 387, 212, 549, 538, 644, 118, 199, 330, 592, 173, 226, 121, 550, 308, 283, 389, 579, 179, 337, 416, 216, 553, 540, 295, 95, 174, 769, 332, 648, 122, 228, 203, 390, 527, 285, 338, 554, 581, 181, 312, 393, 608, 770, 299, 561, 124, 205, 286, 353, 582, 232, 182, 340, 394, 656, 556, 211, 111, 448, 585, 535, 185, 772, 562, 327, 643, 206, 401, 301, 354, 159, 396, 307, 586, 186, 213, 344, 240, 402, 302, 564, 539, 645, 776, 119, 356, 331, 593, 672, 227, 214, 551, 309, 588, 188, 417, 217, 646, 404, 541, 594, 175, 568, 333, 649, 123, 229, 360, 310, 391, 784, 339, 418, 218, 555, 313, 542, 609, 771, 334, 596, 650, 408, 230, 704, 125, 287, 583, 233, 183, 314, 341, 420, 395, 657, 220, 557, 610, 368, 449, 773, 652, 563, 126, 800, 207, 600, 355, 234, 342, 658, 558, 316, 397, 450, 612, 587, 187, 345, 774, 424, 241, 403, 303, 565, 777, 357, 673, 236, 398, 660, 215, 346, 452, 589, 189, 242, 616, 566, 647, 778, 405, 358, 595, 674, 832, 432, 569, 361, 311, 590, 190, 785, 348, 664, 419, 244, 219, 456, 406, 543, 780, 570, 335, 597, 676, 651, 409, 231, 362, 624, 705, 786, 315, 421, 221, 611, 369, 598, 248, 410, 572, 653, 706, 127, 464, 801, 364, 601, 680, 788, 235, 343, 422, 659, 222, 559, 896, 317, 370, 451, 613, 775, 425, 654, 412, 802, 602, 708, 237, 318, 399, 661, 792, 614, 372, 347, 426, 688, 453, 243, 480, 617, 567, 804, 779, 604, 359, 675, 238, 833, 433, 712, 662, 454, 591, 191, 349, 428, 665, 618, 245, 376, 457, 407, 781, 834, 434, 571, 677, 808, 363, 625, 787, 350, 666, 246, 458, 720, 620, 782, 599, 249, 678, 836, 436, 411, 573, 626, 707, 465, 365, 681, 789, 668, 423, 816, 223, 897, 460, 371, 250, 574, 655, 413, 466, 803, 366, 628, 603, 682, 709, 840, 790, 440, 736, 898, 319, 793, 615, 373, 427, 689, 252, 414, 481, 710, 468, 805, 605, 684, 239, 632, 713, 663, 794, 900, 374, 690, 455, 848, 429, 482, 619, 377, 806, 606, 835, 435, 714, 472, 809, 796, 351, 430, 692, 667, 904, 247, 378, 484, 459, 721, 621, 783, 679, 810, 837, 437, 716, 627, 864, 669, 722, 622, 817, 380, 696, 461, 251, 838, 488, 438, 575, 912, 812, 467, 367, 629, 683, 841, 791, 441, 670, 737, 818, 899, 462, 724, 253, 415, 630, 711, 842, 442, 469, 685, 738, 496, 633, 820, 795, 901, 375, 691, 254, 849, 928, 728, 483, 470, 807, 607, 686, 844, 444, 634, 740, 715, 473, 902, 797, 850, 431, 693, 824, 905, 379, 485, 474, 811, 636, 717, 798, 865, 744, 694, 852, 906, 486, 723, 623, 960, 381, 697, 839, 489, 439, 718, 913, 476, 813, 866, 671, 908, 819, 382, 698, 463, 725, 856, 490, 752, 914, 814, 631, 868, 843, 443, 739, 497, 726, 821, 700, 255, 929, 492, 729, 916, 471, 687, 845, 445, 498, 635, 741, 872, 822, 903, 851, 930, 730, 825, 846, 446, 920, 742, 500, 475, 637, 799, 745, 695, 826, 853, 932, 907, 732, 487, 880, 961, 638, 719, 477, 867, 746, 854, 504, 828, 909, 962, 383, 699, 857, 936, 491, 753, 915, 478, 815, 869, 748, 910, 727, 858, 964, 701, 754, 493, 917, 870, 944, 499, 873, 823, 702, 860, 931, 494, 756, 731, 968, 918, 847, 447, 921, 743, 874, 501, 827, 933, 733, 881, 760, 922, 502, 639, 976, 876, 747, 855, 505, 934, 734, 829, 882, 963, 937, 924, 479, 506, 749, 830, 911, 884, 859, 938, 965, 755, 992, 871, 750, 945, 508, 966, 703, 861, 940, 495, 757, 888, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 947, 510, 984, 863, 942, 759, 890, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q139_1^{1024}$=[0, 1, 2, 4, 8, 16, 3, 5, 32, 6, 9, 10, 64, 17, 12, 18, 33, 20, 128, 7, 34, 24, 36, 11, 65, 13, 66, 40, 19, 256, 14, 68, 21, 48, 129, 35, 72, 22, 130, 25, 37, 26, 132, 80, 38, 512, 67, 41, 28, 257, 136, 15, 42, 69, 96, 258, 49, 70, 144, 44, 73, 23, 260, 50, 131, 74, 52, 27, 133, 264, 81, 160, 39, 76, 513, 134, 29, 82, 56, 137, 514, 272, 43, 30, 97, 259, 84, 138, 192, 516, 71, 145, 45, 98, 261, 140, 51, 288, 88, 146, 46, 520, 100, 75, 262, 53, 265, 161, 148, 77, 104, 54, 135, 266, 528, 83, 162, 320, 57, 78, 515, 273, 152, 31, 268, 58, 85, 164, 139, 112, 193, 274, 517, 544, 99, 86, 60, 141, 194, 289, 89, 518, 168, 276, 147, 47, 384, 521, 101, 263, 142, 290, 90, 196, 522, 149, 280, 102, 576, 176, 105, 55, 292, 267, 92, 529, 163, 321, 200, 150, 524, 79, 153, 106, 530, 269, 322, 59, 165, 296, 113, 275, 154, 208, 108, 545, 270, 532, 87, 166, 324, 61, 640, 114, 195, 519, 169, 277, 156, 546, 304, 385, 62, 143, 536, 291, 116, 91, 170, 197, 328, 278, 224, 386, 548, 523, 281, 103, 577, 177, 198, 293, 93, 172, 120, 201, 151, 282, 388, 525, 578, 178, 336, 552, 107, 294, 94, 531, 768, 323, 202, 297, 526, 284, 580, 180, 155, 392, 209, 109, 271, 533, 167, 298, 560, 325, 204, 641, 115, 352, 157, 210, 110, 547, 305, 584, 534, 184, 326, 63, 642, 400, 300, 537, 117, 171, 329, 279, 158, 225, 306, 387, 212, 549, 538, 644, 118, 199, 330, 592, 173, 226, 121, 550, 308, 283, 389, 579, 179, 337, 416, 216, 553, 540, 295, 95, 174, 332, 769, 648, 122, 228, 203, 390, 527, 285, 338, 554, 581, 181, 312, 393, 608, 770, 299, 124, 561, 205, 286, 353, 582, 232, 182, 340, 394, 656, 556, 211, 111, 448, 585, 535, 185, 772, 562, 327, 206, 643, 401, 301, 354, 159, 396, 307, 586, 186, 213, 344, 240, 402, 302, 564, 539, 645, 776, 119, 356, 331, 593, 672, 227, 214, 551, 309, 588, 188, 417, 217, 646, 404, 541, 594, 175, 568, 333, 649, 123, 229, 360, 310, 391, 784, 339, 418, 218, 555, 313, 542, 609, 334, 771, 596, 650, 408, 230, 125, 704, 287, 583, 233, 183, 314, 341, 420, 395, 220, 657, 557, 610, 368, 449, 773, 652, 126, 563, 207, 800, 600, 355, 234, 342, 658, 558, 316, 397, 450, 612, 587, 187, 345, 774, 424, 241, 403, 303, 565, 777, 357, 236, 673, 398, 660, 215, 346, 452, 589, 189, 242, 616, 566, 647, 778, 405, 358, 595, 674, 832, 432, 569, 361, 311, 590, 190, 348, 785, 664, 419, 244, 219, 456, 406, 543, 780, 570, 335, 597, 676, 651, 409, 231, 362, 624, 705, 786, 315, 421, 221, 611, 369, 598, 248, 410, 572, 653, 127, 706, 464, 364, 801, 601, 680, 788, 235, 343, 422, 222, 659, 559, 317, 896, 370, 451, 613, 775, 425, 654, 412, 802, 602, 708, 237, 318, 399, 661, 792, 614, 372, 347, 426, 688, 453, 243, 480, 617, 567, 804, 779, 604, 359, 238, 675, 833, 433, 712, 662, 454, 591, 191, 349, 428, 665, 618, 245, 376, 457, 407, 781, 834, 434, 571, 677, 808, 363, 625, 350, 787, 666, 246, 458, 720, 620, 782, 599, 249, 678, 836, 436, 411, 573, 626, 707, 465, 365, 681, 789, 668, 423, 223, 816, 460, 897, 371, 250, 574, 655, 413, 466, 366, 803, 628, 603, 682, 709, 840, 790, 440, 736, 319, 898, 793, 615, 373, 427, 252, 689, 414, 481, 710, 468, 805, 605, 684, 239, 632, 713, 663, 794, 900, 374, 690, 455, 848, 429, 482, 619, 377, 806, 606, 835, 435, 714, 472, 809, 796, 351, 430, 692, 667, 904, 247, 378, 484, 459, 721, 621, 783, 679, 810, 837, 437, 716, 627, 864, 669, 722, 622, 380, 817, 696, 461, 251, 838, 488, 438, 575, 912, 812, 467, 367, 629, 683, 841, 791, 441, 670, 737, 818, 462, 899, 724, 253, 415, 630, 711, 842, 442, 469, 685, 738, 496, 633, 820, 795, 901, 375, 254, 691, 849, 928, 728, 483, 470, 807, 607, 686, 844, 444, 634, 740, 715, 473, 902, 797, 850, 431, 693, 824, 905, 379, 485, 474, 811, 636, 717, 798, 865, 744, 694, 852, 906, 486, 723, 623, 381, 960, 697, 839, 489, 439, 718, 476, 913, 813, 866, 671, 908, 382, 819, 698, 463, 725, 856, 490, 752, 914, 814, 631, 868, 843, 443, 739, 497, 726, 821, 700, 255, 492, 929, 729, 916, 471, 687, 845, 445, 498, 635, 741, 872, 822, 903, 851, 930, 730, 825, 846, 446, 920, 742, 500, 475, 637, 799, 745, 695, 826, 853, 932, 907, 732, 487, 880, 961, 638, 719, 477, 867, 746, 854, 504, 828, 909, 383, 962, 699, 857, 936, 491, 753, 478, 915, 815, 869, 748, 910, 727, 858, 964, 701, 754, 493, 917, 870, 944, 499, 873, 823, 702, 860, 494, 931, 756, 731, 968, 918, 847, 447, 921, 743, 874, 501, 827, 933, 733, 881, 760, 922, 502, 639, 976, 876, 747, 855, 505, 934, 734, 829, 882, 963, 937, 924, 479, 506, 749, 830, 911, 884, 859, 938, 965, 755, 992, 871, 750, 508, 945, 966, 703, 861, 940, 495, 757, 888, 969, 919, 946, 875, 862, 758, 970, 761, 948, 923, 503, 977, 877, 935, 735, 972, 883, 762, 925, 978, 878, 952, 507, 831, 885, 939, 764, 926, 993, 980, 751, 509, 886, 967, 941, 994, 889, 510, 947, 984, 863, 942, 759, 890, 996, 971, 949, 892, 973, 763, 1000, 950, 979, 879, 953, 974, 765, 927, 954, 981, 1008, 887, 766, 995, 982, 956, 511, 985, 943, 891, 997, 986, 998, 893, 1001, 951, 988, 894, 975, 1002, 955, 1009, 767, 1004, 983, 957, 1010, 958, 1012, 987, 999, 989, 1016, 895, 1003, 990, 1005, 1011, 1006, 959, 1013, 1014, 1017, 991, 1018, 1020, 1007, 1015, 1019, 1021, 1022, 1023];

$Q140_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 320, 57, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 322, 59, 165, 296, 113, 275, 154, 108, 208, 545, 270, 532, 87, 166, 324, 61, 640, 114, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 560, 325, 204, 641, 115, 352, 157, 110, 210, 547, 305, 184, 534, 584, 326, 63, 642, 300, 400, 537, 117, 171, 279, 329, 158, 225, 306, 212, 387, 549, 538, 644, 118, 199, 330, 592, 173, 226, 121, 550, 283, 308, 389, 179, 579, 337, 216, 416, 553, 540, 95, 295, 174, 332, 769, 648, 122, 203, 228, 390, 527, 285, 338, 554, 181, 581, 312, 393, 608, 770, 124, 299, 561, 205, 286, 353, 182, 232, 582, 340, 394, 556, 656, 111, 211, 448, 185, 535, 585, 772, 562, 327, 206, 643, 301, 401, 354, 159, 396, 307, 186, 586, 213, 344, 240, 302, 402, 539, 564, 645, 776, 119, 331, 356, 593, 672, 227, 214, 551, 309, 188, 588, 217, 417, 646, 404, 541, 594, 175, 568, 333, 649, 123, 229, 310, 360, 391, 784, 339, 218, 418, 555, 313, 542, 609, 334, 596, 771, 650, 408, 230, 125, 704, 287, 183, 233, 583, 314, 341, 220, 395, 420, 557, 657, 610, 368, 449, 773, 652, 126, 563, 207, 600, 800, 355, 234, 342, 558, 658, 316, 397, 450, 187, 587, 612, 345, 424, 774, 241, 303, 403, 565, 777, 357, 236, 673, 398, 660, 215, 346, 452, 189, 589, 242, 566, 616, 647, 778, 405, 358, 595, 674, 432, 832, 569, 311, 361, 190, 590, 348, 785, 664, 219, 244, 419, 406, 456, 543, 780, 570, 335, 597, 651, 676, 409, 231, 362, 624, 705, 786, 315, 221, 421, 611, 369, 248, 598, 410, 572, 653, 127, 706, 364, 464, 601, 801, 680, 788, 235, 343, 222, 422, 559, 659, 317, 896, 370, 451, 613, 425, 775, 654, 412, 602, 802, 708, 237, 318, 399, 661, 792, 614, 347, 372, 426, 688, 453, 243, 480, 567, 617, 604, 779, 804, 359, 238, 675, 433, 833, 662, 712, 454, 191, 591, 349, 428, 665, 618, 245, 376, 407, 457, 781, 434, 834, 571, 677, 808, 363, 625, 350, 787, 666, 246, 458, 620, 720, 782, 249, 599, 678, 411, 436, 836, 573, 626, 707, 365, 465, 681, 789, 668, 223, 423, 816, 460, 897, 371, 250, 574, 655, 413, 366, 466, 603, 628, 803, 682, 709, 440, 790, 840, 736, 319, 898, 793, 615, 373, 252, 427, 689, 414, 481, 710, 468, 605, 805, 684, 239, 632, 663, 713, 794, 900, 374, 690, 455, 848, 429, 482, 619, 377, 606, 806, 435, 835, 714, 472, 809, 796, 351, 430, 667, 692, 904, 247, 378, 459, 484, 621, 721, 783, 679, 810, 437, 837, 716, 627, 864, 669, 622, 722, 380, 817, 696, 461, 251, 438, 488, 838, 575, 812, 912, 367, 467, 629, 683, 441, 791, 841, 670, 737, 818, 462, 724, 899, 253, 415, 630, 711, 442, 842, 469, 685, 738, 496, 633, 795, 820, 901, 375, 254, 691, 849, 728, 928, 483, 470, 607, 807, 686, 444, 844, 634, 715, 740, 473, 902, 797, 850, 431, 693, 824, 905, 379, 485, 474, 636, 811, 717, 798, 865, 694, 744, 852, 906, 486, 623, 723, 381, 960, 697, 439, 489, 839, 718, 476, 813, 913, 866, 671, 908, 382, 819, 698, 463, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 909, 383, 962, 699, 857, 936, 491, 753, 478, 815, 915, 869, 748, 910, 727, 858, 964, 701, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 966, 703, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q141_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 320, 57, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 322, 59, 165, 296, 113, 275, 154, 108, 208, 545, 270, 532, 87, 166, 324, 61, 640, 114, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 560, 325, 204, 641, 115, 352, 157, 110, 210, 547, 305, 184, 534, 584, 326, 63, 642, 300, 400, 537, 117, 171, 279, 329, 158, 225, 306, 212, 387, 549, 538, 644, 118, 199, 330, 592, 173, 226, 121, 550, 283, 308, 389, 179, 579, 337, 216, 416, 553, 540, 95, 295, 174, 332, 769, 648, 122, 203, 228, 390, 527, 285, 338, 554, 181, 581, 312, 393, 608, 770, 124, 299, 561, 205, 286, 353, 182, 232, 582, 340, 394, 556, 656, 111, 211, 448, 185, 535, 585, 772, 562, 327, 206, 643, 301, 401, 354, 159, 396, 307, 186, 586, 213, 344, 240, 302, 402, 539, 564, 645, 119, 776, 331, 356, 593, 672, 227, 214, 551, 309, 188, 588, 217, 417, 646, 404, 541, 594, 175, 568, 333, 649, 123, 229, 310, 360, 391, 784, 339, 218, 418, 555, 313, 542, 609, 334, 596, 771, 650, 408, 230, 125, 704, 287, 183, 233, 583, 314, 341, 220, 395, 420, 557, 657, 610, 368, 449, 773, 652, 126, 563, 207, 600, 800, 355, 234, 342, 558, 658, 316, 397, 450, 187, 587, 612, 345, 424, 774, 241, 303, 403, 565, 777, 357, 236, 673, 398, 660, 215, 346, 452, 189, 589, 242, 566, 616, 647, 778, 405, 358, 595, 674, 432, 832, 569, 311, 361, 190, 590, 348, 785, 664, 219, 244, 419, 406, 456, 543, 780, 570, 335, 597, 651, 676, 409, 231, 362, 624, 705, 786, 315, 221, 421, 611, 369, 248, 598, 410, 572, 653, 127, 706, 364, 464, 601, 801, 680, 788, 235, 343, 222, 422, 559, 659, 317, 896, 370, 451, 613, 425, 775, 654, 412, 602, 802, 708, 237, 318, 399, 661, 792, 614, 347, 372, 426, 688, 453, 243, 480, 567, 617, 604, 779, 804, 359, 238, 675, 433, 833, 662, 712, 454, 191, 591, 349, 428, 665, 618, 245, 376, 407, 457, 781, 434, 834, 571, 677, 808, 363, 625, 350, 787, 666, 246, 458, 620, 720, 782, 249, 599, 678, 411, 436, 836, 573, 626, 707, 365, 465, 681, 789, 668, 223, 423, 816, 460, 897, 371, 250, 574, 655, 413, 366, 466, 603, 628, 803, 682, 709, 440, 790, 840, 736, 319, 898, 793, 615, 373, 252, 427, 689, 414, 481, 710, 468, 605, 805, 684, 239, 632, 663, 713, 794, 900, 374, 690, 455, 848, 429, 482, 619, 377, 606, 806, 435, 835, 714, 472, 809, 796, 351, 430, 667, 692, 247, 904, 378, 459, 484, 621, 721, 783, 679, 810, 437, 837, 716, 627, 864, 669, 622, 722, 380, 817, 696, 461, 251, 438, 488, 838, 575, 812, 912, 367, 467, 629, 683, 441, 791, 841, 670, 737, 818, 462, 724, 899, 253, 415, 630, 711, 442, 842, 469, 685, 738, 496, 633, 795, 820, 901, 375, 254, 691, 849, 728, 928, 483, 470, 607, 807, 686, 444, 844, 634, 715, 740, 473, 902, 797, 850, 431, 693, 824, 905, 379, 485, 474, 636, 811, 717, 798, 865, 694, 744, 852, 906, 486, 623, 723, 381, 960, 697, 439, 489, 839, 718, 476, 813, 913, 866, 671, 908, 382, 819, 698, 463, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 909, 383, 962, 699, 857, 936, 491, 753, 478, 815, 915, 869, 748, 910, 727, 858, 964, 701, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 966, 703, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q142_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 560, 325, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 769, 122, 648, 203, 228, 390, 527, 285, 338, 554, 181, 581, 312, 393, 608, 770, 124, 299, 561, 205, 286, 353, 182, 232, 582, 340, 394, 556, 656, 111, 211, 185, 448, 535, 585, 772, 562, 327, 206, 643, 301, 401, 354, 159, 396, 307, 186, 586, 213, 344, 240, 302, 402, 539, 564, 119, 645, 776, 331, 356, 593, 672, 227, 214, 551, 309, 188, 588, 217, 417, 646, 404, 541, 594, 175, 568, 333, 123, 649, 229, 310, 360, 391, 784, 339, 218, 418, 555, 313, 542, 609, 334, 596, 771, 650, 408, 230, 125, 704, 287, 183, 233, 583, 314, 341, 220, 395, 420, 557, 657, 610, 368, 449, 773, 126, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 778, 405, 358, 595, 674, 432, 569, 832, 311, 361, 190, 590, 348, 785, 664, 219, 244, 419, 406, 456, 543, 780, 570, 335, 597, 651, 676, 409, 231, 362, 624, 705, 786, 315, 221, 421, 611, 369, 248, 598, 410, 572, 127, 653, 706, 364, 464, 601, 801, 680, 788, 235, 343, 222, 422, 559, 659, 317, 370, 896, 451, 613, 425, 775, 654, 412, 602, 802, 708, 237, 318, 399, 661, 792, 614, 347, 372, 426, 688, 453, 243, 480, 567, 617, 604, 779, 804, 359, 238, 675, 433, 833, 662, 712, 191, 454, 591, 349, 428, 665, 618, 245, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 897, 250, 574, 655, 413, 366, 466, 603, 628, 803, 682, 709, 440, 790, 840, 736, 319, 898, 793, 615, 373, 252, 427, 689, 414, 481, 710, 468, 605, 805, 684, 239, 632, 663, 713, 794, 374, 900, 690, 455, 848, 429, 482, 619, 377, 606, 806, 435, 835, 714, 472, 809, 796, 351, 430, 667, 692, 247, 378, 904, 459, 484, 621, 721, 783, 679, 810, 437, 837, 716, 627, 864, 669, 622, 722, 380, 817, 696, 461, 251, 438, 488, 575, 838, 812, 912, 367, 467, 629, 683, 441, 791, 841, 670, 737, 818, 462, 724, 899, 253, 415, 630, 711, 442, 842, 469, 685, 738, 496, 633, 795, 820, 375, 901, 254, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 698, 463, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q143_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 560, 325, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 769, 122, 648, 203, 228, 390, 527, 285, 338, 554, 181, 581, 312, 393, 608, 770, 124, 299, 561, 205, 286, 353, 182, 232, 582, 340, 394, 556, 656, 111, 211, 185, 535, 448, 585, 772, 562, 327, 206, 643, 301, 401, 354, 159, 396, 307, 186, 586, 213, 344, 240, 302, 402, 539, 564, 119, 645, 776, 331, 356, 593, 672, 227, 214, 551, 309, 188, 588, 217, 417, 646, 404, 541, 594, 175, 568, 333, 123, 649, 229, 310, 360, 391, 784, 339, 218, 418, 555, 313, 542, 609, 334, 596, 771, 650, 408, 230, 125, 704, 287, 183, 233, 583, 314, 341, 220, 395, 420, 557, 657, 610, 368, 449, 773, 126, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 778, 405, 358, 595, 674, 432, 569, 832, 311, 361, 190, 590, 348, 785, 664, 219, 244, 419, 406, 543, 456, 780, 570, 335, 597, 651, 676, 409, 231, 362, 624, 705, 786, 315, 221, 421, 611, 369, 248, 598, 410, 572, 127, 653, 706, 364, 464, 601, 801, 680, 788, 235, 343, 222, 422, 559, 659, 317, 370, 896, 451, 613, 425, 775, 654, 412, 602, 802, 708, 237, 318, 399, 661, 792, 614, 347, 372, 426, 688, 453, 243, 567, 480, 617, 604, 779, 804, 359, 238, 675, 433, 833, 662, 712, 191, 454, 591, 349, 428, 665, 618, 245, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 897, 250, 574, 655, 413, 366, 466, 603, 628, 803, 682, 709, 440, 790, 840, 736, 319, 898, 793, 615, 373, 252, 427, 689, 414, 481, 710, 468, 605, 805, 684, 239, 632, 663, 713, 794, 374, 900, 690, 455, 848, 429, 482, 619, 377, 606, 806, 435, 835, 714, 472, 809, 796, 351, 430, 667, 692, 247, 378, 904, 459, 484, 621, 721, 783, 679, 810, 437, 837, 716, 627, 864, 669, 622, 722, 380, 817, 696, 461, 251, 438, 575, 488, 838, 812, 912, 367, 467, 629, 683, 441, 791, 841, 670, 737, 818, 462, 724, 899, 253, 415, 630, 711, 442, 842, 469, 685, 738, 496, 633, 795, 820, 375, 901, 254, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 698, 463, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q144_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 560, 325, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 769, 122, 648, 203, 228, 390, 527, 285, 338, 554, 181, 581, 312, 393, 608, 770, 124, 299, 561, 205, 286, 353, 182, 232, 582, 340, 394, 556, 656, 111, 211, 185, 535, 448, 585, 772, 562, 327, 206, 643, 301, 401, 354, 159, 396, 307, 186, 586, 213, 344, 240, 302, 402, 539, 564, 119, 645, 776, 331, 356, 593, 672, 227, 214, 551, 309, 188, 588, 217, 417, 646, 404, 541, 594, 175, 568, 333, 123, 649, 229, 310, 360, 391, 784, 339, 218, 418, 555, 313, 542, 609, 334, 596, 771, 650, 408, 230, 125, 287, 704, 183, 233, 583, 314, 341, 220, 395, 420, 557, 657, 610, 368, 449, 773, 126, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 778, 405, 358, 595, 674, 432, 569, 832, 311, 361, 190, 590, 348, 785, 664, 219, 244, 419, 406, 543, 456, 780, 570, 335, 597, 651, 676, 409, 231, 362, 624, 705, 786, 315, 221, 421, 611, 369, 248, 598, 410, 572, 127, 653, 706, 364, 464, 601, 801, 680, 788, 235, 343, 222, 422, 559, 659, 317, 370, 896, 451, 613, 425, 775, 654, 412, 602, 802, 708, 237, 318, 399, 661, 792, 614, 347, 372, 426, 688, 453, 243, 567, 480, 617, 604, 779, 804, 359, 238, 675, 433, 833, 662, 712, 191, 454, 591, 349, 428, 665, 618, 245, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 897, 250, 574, 655, 413, 366, 466, 603, 628, 803, 682, 709, 440, 790, 840, 319, 736, 898, 793, 615, 373, 252, 427, 689, 414, 481, 710, 468, 605, 805, 684, 239, 632, 663, 713, 794, 374, 900, 690, 455, 848, 429, 482, 619, 377, 606, 806, 435, 835, 714, 472, 809, 796, 351, 430, 667, 692, 247, 378, 904, 459, 484, 621, 721, 783, 679, 810, 437, 837, 716, 627, 864, 669, 622, 722, 380, 817, 696, 461, 251, 438, 575, 488, 838, 812, 912, 367, 467, 629, 683, 441, 791, 841, 670, 737, 818, 462, 724, 899, 253, 415, 630, 711, 442, 842, 469, 685, 738, 496, 633, 795, 820, 375, 901, 254, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 698, 463, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q145_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 325, 560, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 769, 122, 648, 203, 228, 390, 527, 285, 338, 554, 181, 581, 312, 393, 608, 770, 124, 299, 561, 205, 286, 353, 182, 232, 582, 340, 394, 556, 656, 111, 211, 185, 535, 448, 585, 772, 327, 562, 206, 643, 301, 401, 354, 159, 396, 307, 186, 586, 213, 344, 240, 302, 402, 539, 564, 119, 645, 776, 331, 356, 593, 672, 227, 214, 551, 309, 188, 588, 217, 417, 646, 404, 541, 594, 175, 333, 568, 123, 649, 229, 310, 360, 391, 784, 339, 218, 418, 555, 313, 542, 609, 334, 596, 771, 650, 408, 230, 125, 287, 704, 183, 233, 583, 314, 341, 220, 395, 420, 557, 657, 610, 368, 449, 773, 126, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 778, 405, 358, 595, 674, 432, 569, 832, 311, 361, 190, 590, 348, 785, 664, 219, 244, 419, 406, 543, 456, 780, 335, 570, 597, 651, 676, 409, 231, 362, 624, 705, 786, 315, 221, 421, 611, 369, 248, 598, 410, 572, 127, 653, 706, 364, 464, 601, 801, 680, 235, 788, 343, 222, 422, 559, 659, 317, 370, 896, 451, 613, 425, 775, 654, 412, 602, 802, 708, 237, 318, 399, 661, 792, 614, 347, 372, 426, 453, 688, 243, 567, 480, 617, 604, 779, 804, 359, 238, 675, 433, 833, 662, 712, 191, 454, 591, 349, 428, 665, 618, 245, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 897, 250, 574, 655, 413, 366, 466, 603, 628, 803, 682, 709, 440, 790, 840, 319, 736, 898, 793, 615, 373, 252, 427, 689, 414, 481, 710, 468, 605, 805, 684, 239, 632, 663, 713, 794, 374, 900, 455, 690, 848, 429, 482, 619, 377, 606, 806, 435, 835, 714, 472, 809, 796, 351, 430, 667, 692, 247, 378, 904, 459, 484, 621, 721, 783, 679, 810, 437, 837, 716, 627, 864, 669, 622, 722, 380, 817, 461, 696, 251, 438, 575, 488, 838, 812, 912, 367, 467, 629, 683, 441, 791, 841, 670, 737, 818, 462, 724, 899, 253, 415, 630, 711, 442, 842, 469, 685, 738, 496, 633, 795, 820, 375, 901, 254, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 463, 698, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q146_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 522, 149, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 325, 560, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 122, 769, 648, 203, 228, 390, 527, 285, 338, 554, 181, 581, 312, 393, 608, 770, 124, 299, 561, 205, 286, 353, 182, 232, 582, 340, 394, 556, 656, 111, 211, 185, 535, 448, 585, 772, 327, 562, 206, 643, 301, 401, 354, 159, 396, 307, 186, 586, 213, 344, 240, 302, 402, 539, 564, 119, 645, 776, 331, 356, 593, 672, 227, 214, 551, 309, 188, 588, 217, 417, 646, 404, 541, 594, 175, 333, 568, 123, 649, 229, 310, 360, 391, 784, 339, 218, 418, 555, 313, 542, 609, 334, 596, 771, 650, 408, 230, 125, 287, 704, 183, 233, 583, 314, 341, 220, 395, 420, 557, 657, 610, 368, 449, 126, 773, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 778, 405, 358, 595, 674, 432, 569, 832, 311, 361, 190, 590, 348, 785, 664, 219, 244, 419, 406, 543, 456, 780, 335, 570, 597, 651, 676, 409, 231, 362, 624, 705, 786, 315, 221, 421, 611, 369, 248, 598, 410, 572, 127, 653, 706, 364, 464, 601, 801, 680, 235, 788, 343, 222, 422, 559, 659, 317, 370, 896, 451, 613, 425, 775, 654, 412, 602, 802, 708, 237, 318, 399, 661, 792, 614, 347, 372, 426, 453, 688, 243, 567, 480, 617, 604, 779, 804, 359, 238, 675, 433, 833, 662, 712, 191, 454, 591, 349, 428, 665, 618, 245, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 250, 897, 574, 655, 413, 366, 466, 603, 628, 803, 682, 709, 440, 790, 840, 319, 736, 898, 793, 615, 373, 252, 427, 689, 414, 481, 710, 468, 605, 805, 684, 239, 632, 663, 713, 794, 374, 900, 455, 690, 848, 429, 482, 619, 377, 606, 806, 435, 835, 714, 472, 809, 796, 351, 430, 667, 692, 247, 378, 904, 459, 484, 621, 721, 783, 679, 810, 437, 837, 716, 627, 864, 669, 622, 722, 380, 817, 461, 696, 251, 438, 575, 488, 838, 812, 912, 367, 467, 629, 683, 441, 791, 841, 670, 737, 818, 462, 724, 899, 253, 415, 630, 711, 442, 842, 469, 685, 738, 496, 633, 795, 820, 375, 254, 901, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 463, 698, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 874, 501, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q147_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 384, 521, 101, 263, 142, 90, 290, 196, 149, 522, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 386, 523, 548, 281, 103, 177, 577, 198, 93, 293, 172, 120, 151, 201, 282, 388, 525, 178, 578, 336, 552, 107, 94, 294, 531, 768, 323, 202, 297, 526, 284, 155, 180, 580, 392, 109, 209, 271, 533, 167, 298, 325, 560, 204, 115, 641, 352, 157, 110, 210, 547, 305, 184, 534, 584, 63, 326, 642, 300, 400, 537, 117, 171, 279, 329, 158, 225, 306, 212, 387, 549, 538, 118, 644, 199, 330, 592, 173, 226, 121, 550, 283, 308, 389, 179, 579, 337, 216, 416, 553, 540, 95, 295, 174, 332, 122, 769, 648, 203, 228, 390, 527, 285, 338, 181, 554, 312, 581, 393, 608, 770, 124, 299, 561, 205, 286, 353, 182, 232, 582, 340, 394, 556, 656, 111, 211, 185, 535, 448, 585, 772, 327, 562, 206, 643, 301, 401, 354, 159, 396, 307, 186, 213, 586, 344, 240, 302, 402, 539, 564, 119, 645, 776, 331, 356, 593, 672, 227, 214, 551, 309, 188, 588, 217, 417, 646, 404, 541, 594, 175, 333, 568, 123, 649, 229, 310, 360, 391, 784, 339, 218, 418, 555, 313, 542, 609, 334, 596, 771, 650, 408, 230, 125, 287, 704, 183, 233, 314, 583, 341, 220, 395, 420, 557, 657, 610, 368, 449, 126, 773, 652, 563, 207, 600, 800, 355, 234, 342, 558, 658, 316, 397, 187, 450, 587, 612, 345, 424, 774, 241, 303, 403, 565, 777, 357, 236, 673, 398, 660, 215, 346, 189, 452, 589, 242, 566, 616, 647, 405, 778, 358, 595, 674, 432, 569, 832, 311, 361, 190, 590, 348, 785, 664, 219, 244, 419, 406, 543, 456, 780, 335, 570, 597, 651, 676, 409, 231, 362, 624, 705, 786, 315, 221, 421, 611, 369, 248, 598, 410, 572, 127, 653, 706, 364, 464, 601, 801, 680, 235, 788, 343, 222, 422, 559, 659, 317, 370, 896, 451, 613, 425, 775, 654, 412, 602, 802, 708, 237, 318, 399, 661, 792, 614, 347, 372, 426, 453, 688, 243, 567, 480, 617, 604, 779, 804, 359, 238, 675, 433, 833, 662, 712, 191, 454, 591, 349, 428, 665, 245, 618, 376, 407, 457, 781, 434, 571, 834, 677, 808, 363, 625, 350, 787, 666, 246, 458, 620, 720, 782, 249, 599, 678, 411, 436, 573, 836, 626, 707, 365, 465, 681, 789, 668, 223, 423, 816, 460, 371, 250, 897, 574, 655, 413, 366, 466, 603, 628, 803, 682, 440, 709, 790, 840, 319, 736, 898, 793, 615, 373, 252, 427, 689, 414, 481, 710, 468, 605, 805, 684, 239, 632, 663, 713, 794, 374, 900, 455, 690, 848, 429, 482, 619, 377, 606, 806, 435, 835, 714, 472, 809, 796, 351, 430, 667, 692, 247, 378, 904, 459, 484, 621, 721, 783, 679, 437, 810, 837, 716, 627, 864, 669, 622, 722, 380, 817, 461, 696, 251, 438, 575, 488, 838, 812, 912, 367, 467, 629, 683, 441, 791, 841, 670, 737, 818, 462, 724, 899, 253, 415, 630, 442, 711, 469, 842, 685, 738, 496, 633, 795, 820, 375, 254, 901, 691, 849, 728, 928, 483, 470, 607, 807, 686, 444, 844, 634, 715, 740, 473, 902, 797, 850, 431, 693, 824, 379, 905, 485, 474, 636, 811, 717, 798, 865, 694, 744, 852, 906, 486, 623, 723, 381, 697, 960, 439, 489, 839, 718, 476, 813, 913, 866, 671, 382, 908, 819, 463, 698, 725, 856, 490, 752, 814, 914, 631, 443, 843, 868, 739, 497, 726, 821, 700, 255, 492, 729, 929, 916, 471, 687, 445, 845, 498, 635, 741, 822, 872, 903, 851, 730, 930, 825, 446, 846, 920, 742, 475, 500, 637, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 501, 874, 827, 733, 933, 881, 760, 922, 502, 639, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q148_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 521, 384, 101, 263, 142, 90, 290, 196, 149, 522, 280, 102, 176, 576, 55, 105, 92, 267, 292, 529, 163, 321, 150, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 523, 386, 548, 281, 103, 177, 577, 198, 93, 293, 172, 120, 151, 201, 282, 525, 388, 178, 578, 336, 552, 107, 94, 294, 531, 768, 323, 202, 297, 526, 284, 155, 180, 580, 392, 109, 209, 271, 533, 167, 298, 325, 560, 204, 115, 641, 352, 157, 110, 210, 547, 305, 184, 534, 584, 63, 326, 642, 300, 537, 400, 117, 171, 279, 329, 158, 225, 306, 212, 387, 549, 538, 118, 644, 199, 330, 592, 173, 226, 121, 550, 283, 308, 389, 179, 579, 337, 216, 553, 416, 540, 95, 295, 174, 332, 122, 769, 648, 203, 228, 527, 390, 285, 338, 181, 554, 312, 581, 393, 608, 770, 124, 299, 561, 205, 286, 353, 182, 232, 582, 340, 394, 556, 111, 656, 211, 185, 535, 585, 448, 772, 327, 562, 206, 643, 301, 401, 354, 159, 396, 307, 186, 213, 586, 344, 240, 302, 539, 402, 564, 119, 645, 776, 331, 356, 593, 672, 227, 214, 551, 309, 188, 588, 217, 417, 646, 541, 404, 594, 175, 333, 568, 123, 649, 229, 310, 360, 391, 784, 339, 218, 555, 418, 313, 542, 609, 334, 596, 771, 650, 408, 230, 125, 287, 704, 183, 233, 314, 583, 341, 220, 395, 557, 420, 657, 610, 368, 449, 126, 773, 652, 563, 207, 600, 800, 355, 234, 342, 558, 658, 316, 397, 187, 587, 450, 612, 345, 424, 774, 241, 303, 403, 565, 777, 357, 236, 673, 398, 660, 215, 346, 189, 589, 452, 242, 566, 616, 647, 405, 778, 358, 595, 674, 569, 432, 832, 311, 361, 190, 590, 348, 785, 664, 219, 244, 419, 543, 406, 456, 780, 335, 570, 597, 651, 676, 409, 231, 362, 624, 705, 786, 315, 221, 421, 611, 369, 248, 598, 410, 572, 127, 653, 706, 364, 601, 464, 801, 680, 235, 788, 343, 222, 559, 422, 659, 317, 370, 896, 451, 613, 425, 775, 654, 412, 602, 802, 708, 237, 318, 399, 661, 792, 614, 347, 372, 426, 453, 688, 243, 567, 617, 480, 604, 779, 804, 359, 238, 675, 433, 833, 662, 712, 191, 591, 454, 349, 428, 665, 245, 618, 376, 407, 457, 781, 571, 434, 834, 677, 808, 363, 625, 350, 787, 666, 246, 458, 620, 720, 782, 249, 599, 678, 411, 573, 436, 836, 626, 707, 365, 465, 681, 789, 668, 223, 423, 816, 460, 371, 250, 897, 574, 655, 413, 366, 603, 466, 628, 803, 682, 440, 709, 790, 840, 319, 736, 898, 793, 615, 373, 252, 427, 689, 414, 481, 710, 605, 468, 805, 684, 239, 632, 663, 713, 794, 374, 900, 455, 690, 848, 429, 619, 482, 377, 606, 806, 435, 835, 714, 472, 809, 796, 351, 430, 667, 692, 247, 378, 904, 459, 621, 484, 721, 783, 679, 437, 810, 837, 716, 627, 864, 669, 622, 722, 380, 817, 461, 696, 251, 575, 438, 488, 838, 812, 367, 912, 467, 629, 683, 441, 791, 841, 670, 737, 818, 462, 724, 899, 253, 415, 630, 442, 711, 469, 842, 685, 738, 633, 496, 795, 820, 375, 254, 901, 691, 849, 728, 928, 483, 607, 470, 807, 686, 444, 844, 634, 715, 740, 473, 902, 797, 850, 431, 693, 824, 379, 905, 485, 474, 636, 811, 717, 798, 865, 694, 744, 852, 906, 623, 486, 723, 381, 697, 960, 439, 489, 839, 718, 476, 813, 913, 866, 671, 382, 908, 819, 463, 698, 725, 856, 490, 752, 814, 914, 631, 443, 843, 868, 739, 497, 726, 821, 700, 255, 492, 729, 929, 916, 471, 687, 445, 845, 635, 498, 741, 822, 872, 903, 851, 730, 930, 825, 446, 846, 920, 742, 475, 637, 500, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 873, 702, 860, 494, 731, 756, 931, 918, 968, 447, 847, 921, 743, 501, 874, 827, 733, 933, 881, 760, 922, 639, 502, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q149_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 512, 67, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 516, 71, 45, 145, 98, 261, 140, 51, 88, 288, 46, 146, 520, 75, 100, 262, 53, 265, 161, 148, 77, 54, 104, 135, 266, 528, 83, 162, 57, 320, 78, 515, 273, 152, 31, 268, 58, 85, 139, 164, 112, 193, 274, 517, 544, 99, 86, 60, 141, 194, 89, 289, 168, 518, 276, 47, 147, 521, 384, 101, 263, 142, 90, 290, 196, 149, 522, 280, 102, 176, 576, 55, 105, 92, 267, 292, 529, 163, 150, 321, 200, 524, 79, 153, 106, 530, 269, 59, 322, 165, 296, 113, 275, 154, 108, 208, 545, 270, 532, 87, 166, 61, 324, 114, 640, 195, 169, 519, 277, 156, 546, 304, 385, 62, 143, 536, 91, 116, 291, 170, 197, 278, 328, 224, 523, 386, 548, 281, 103, 177, 577, 198, 93, 293, 172, 120, 151, 201, 282, 525, 388, 178, 578, 336, 552, 107, 94, 294, 531, 768, 323, 202, 297, 526, 284, 155, 180, 580, 392, 109, 209, 271, 533, 167, 298, 325, 560, 204, 115, 641, 352, 157, 110, 210, 547, 305, 184, 534, 584, 63, 326, 300, 642, 537, 400, 117, 171, 279, 158, 329, 225, 306, 212, 387, 549, 538, 118, 644, 199, 330, 173, 592, 226, 121, 550, 283, 308, 389, 179, 579, 337, 216, 553, 416, 540, 95, 295, 174, 332, 122, 769, 648, 203, 228, 527, 390, 285, 338, 181, 554, 312, 581, 393, 608, 770, 124, 299, 561, 205, 286, 182, 353, 232, 582, 340, 394, 556, 111, 656, 211, 185, 535, 585, 448, 772, 327, 562, 206, 301, 643, 401, 354, 159, 396, 307, 186, 213, 586, 344, 240, 302, 539, 402, 564, 119, 645, 776, 331, 356, 593, 672, 227, 214, 551, 309, 188, 588, 217, 417, 646, 541, 404, 175, 594, 333, 568, 123, 649, 229, 310, 360, 391, 784, 339, 218, 555, 418, 313, 542, 609, 334, 596, 771, 650, 408, 230, 125, 287, 704, 183, 233, 314, 583, 341, 220, 395, 557, 420, 657, 610, 368, 449, 126, 773, 652, 563, 207, 600, 800, 355, 234, 342, 558, 316, 658, 397, 187, 587, 450, 612, 345, 424, 774, 241, 303, 403, 565, 777, 357, 236, 673, 398, 660, 215, 346, 189, 589, 452, 242, 566, 616, 647, 405, 778, 358, 595, 674, 569, 432, 832, 311, 190, 361, 590, 348, 785, 664, 219, 244, 419, 543, 406, 456, 780, 335, 570, 597, 651, 676, 409, 231, 362, 624, 705, 786, 315, 221, 421, 611, 369, 248, 598, 410, 572, 127, 653, 364, 706, 601, 464, 801, 680, 235, 788, 343, 222, 559, 422, 317, 659, 370, 896, 451, 613, 425, 775, 654, 412, 602, 802, 708, 237, 318, 399, 661, 792, 614, 347, 372, 426, 453, 688, 243, 567, 617, 480, 604, 779, 804, 359, 238, 675, 433, 662, 833, 712, 191, 591, 454, 349, 428, 665, 245, 618, 376, 407, 457, 781, 571, 434, 834, 677, 808, 363, 625, 350, 787, 666, 246, 458, 620, 720, 782, 249, 599, 678, 411, 573, 436, 836, 626, 365, 707, 465, 681, 789, 668, 223, 423, 816, 460, 371, 250, 897, 574, 655, 413, 366, 603, 466, 628, 803, 682, 440, 709, 790, 840, 319, 736, 898, 793, 615, 373, 252, 427, 689, 414, 481, 710, 605, 468, 805, 684, 239, 632, 663, 713, 794, 374, 900, 455, 690, 429, 848, 619, 482, 377, 606, 806, 435, 835, 714, 472, 809, 796, 351, 430, 667, 692, 247, 378, 904, 459, 621, 484, 721, 783, 679, 437, 810, 837, 716, 627, 864, 669, 622, 380, 722, 817, 461, 696, 251, 575, 438, 488, 838, 812, 367, 912, 467, 629, 683, 441, 791, 670, 841, 737, 818, 462, 724, 899, 253, 415, 630, 442, 711, 469, 842, 685, 738, 633, 496, 795, 820, 375, 254, 901, 691, 849, 728, 928, 483, 607, 470, 807, 686, 444, 844, 634, 715, 740, 473, 902, 797, 431, 850, 693, 824, 379, 905, 485, 474, 636, 811, 717, 798, 694, 865, 744, 852, 906, 623, 486, 381, 723, 697, 960, 439, 489, 839, 718, 476, 813, 913, 866, 671, 382, 908, 819, 463, 698, 725, 856, 490, 752, 814, 914, 631, 443, 843, 868, 739, 497, 726, 821, 700, 255, 492, 729, 929, 916, 471, 687, 445, 845, 635, 498, 741, 822, 872, 903, 851, 730, 930, 825, 446, 846, 920, 742, 475, 637, 500, 799, 695, 745, 826, 853, 732, 907, 932, 487, 880, 961, 638, 719, 477, 867, 746, 504, 854, 828, 383, 909, 699, 962, 857, 936, 491, 753, 478, 815, 915, 869, 748, 910, 727, 858, 701, 964, 754, 493, 917, 870, 944, 499, 823, 702, 873, 860, 494, 731, 756, 931, 918, 968, 447, 847, 921, 743, 501, 874, 827, 733, 933, 881, 760, 922, 639, 502, 876, 976, 747, 505, 855, 734, 934, 829, 882, 963, 937, 924, 479, 506, 749, 830, 911, 859, 884, 938, 965, 755, 992, 871, 750, 508, 945, 703, 966, 861, 940, 495, 757, 888, 919, 969, 946, 875, 862, 758, 970, 761, 923, 948, 503, 877, 977, 735, 935, 972, 883, 762, 925, 878, 978, 952, 507, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 956, 511, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q150_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 67, 512, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 71, 516, 45, 145, 98, 261, 51, 140, 88, 288, 46, 146, 75, 520, 100, 262, 53, 265, 161, 148, 77, 54, 104, 135, 266, 83, 528, 162, 57, 320, 78, 515, 273, 152, 31, 268, 58, 85, 139, 164, 112, 193, 274, 517, 99, 544, 86, 60, 141, 194, 89, 289, 168, 518, 276, 47, 147, 521, 384, 101, 263, 142, 90, 290, 196, 149, 522, 102, 280, 176, 576, 55, 105, 92, 267, 292, 529, 163, 150, 321, 200, 79, 524, 153, 106, 530, 269, 59, 322, 165, 296, 113, 275, 154, 108, 208, 545, 270, 87, 532, 166, 61, 324, 114, 195, 640, 169, 519, 277, 156, 546, 304, 385, 62, 143, 91, 536, 116, 291, 170, 197, 278, 328, 224, 523, 386, 103, 281, 548, 177, 577, 198, 93, 293, 172, 120, 151, 201, 282, 525, 388, 178, 578, 336, 107, 552, 94, 294, 531, 323, 768, 202, 297, 526, 284, 155, 180, 580, 392, 109, 209, 271, 533, 167, 298, 325, 115, 204, 560, 641, 352, 157, 110, 210, 547, 305, 184, 534, 584, 63, 326, 300, 642, 537, 400, 117, 171, 279, 158, 329, 225, 306, 212, 387, 549, 538, 118, 199, 644, 330, 173, 592, 226, 121, 283, 550, 308, 389, 179, 579, 337, 216, 553, 416, 95, 540, 295, 174, 332, 122, 769, 203, 648, 228, 527, 390, 285, 338, 181, 554, 312, 581, 393, 608, 770, 124, 299, 205, 561, 286, 182, 353, 232, 582, 340, 394, 111, 556, 211, 656, 185, 535, 585, 448, 327, 772, 206, 562, 301, 643, 401, 354, 159, 307, 396, 186, 213, 586, 344, 240, 302, 539, 402, 119, 564, 645, 331, 776, 356, 593, 227, 672, 214, 551, 309, 188, 588, 217, 417, 646, 541, 404, 175, 594, 333, 123, 568, 649, 229, 310, 360, 391, 339, 784, 218, 555, 418, 313, 542, 609, 334, 596, 771, 650, 230, 408, 125, 287, 704, 183, 233, 314, 583, 341, 220, 395, 557, 420, 657, 610, 368, 449, 126, 773, 207, 563, 652, 600, 355, 800, 234, 342, 558, 316, 658, 397, 187, 587, 450, 345, 612, 424, 774, 241, 303, 403, 565, 777, 357, 236, 673, 398, 215, 660, 346, 189, 589, 452, 242, 566, 616, 647, 405, 778, 358, 595, 674, 569, 432, 832, 311, 190, 361, 590, 348, 785, 219, 664, 244, 419, 543, 406, 456, 335, 780, 570, 597, 651, 231, 409, 676, 362, 624, 705, 786, 315, 221, 421, 611, 369, 248, 598, 410, 127, 572, 653, 364, 706, 601, 464, 801, 235, 680, 343, 788, 222, 559, 422, 317, 659, 370, 451, 896, 613, 425, 775, 654, 412, 602, 802, 708, 237, 318, 399, 661, 347, 614, 792, 372, 426, 453, 243, 688, 567, 617, 480, 604, 779, 359, 804, 238, 675, 433, 662, 833, 712, 191, 591, 454, 349, 428, 665, 245, 618, 376, 407, 457, 781, 571, 434, 834, 677, 363, 808, 625, 350, 787, 666, 246, 458, 620, 720, 782, 249, 599, 411, 678, 573, 436, 836, 626, 365, 707, 465, 681, 789, 223, 668, 423, 371, 460, 816, 250, 897, 574, 655, 413, 366, 603, 466, 628, 803, 682, 440, 709, 790, 840, 319, 736, 898, 615, 793, 373, 252, 427, 689, 414, 481, 710, 605, 468, 805, 239, 684, 632, 663, 713, 794, 374, 455, 900, 690, 429, 848, 619, 482, 377, 606, 806, 435, 835, 714, 472, 809, 351, 796, 430, 667, 247, 692, 378, 459, 904, 621, 484, 721, 783, 679, 437, 810, 837, 627, 716, 864, 669, 622, 380, 722, 461, 817, 251, 696, 575, 438, 488, 838, 367, 812, 467, 912, 629, 683, 441, 791, 670, 841, 737, 462, 818, 724, 899, 253, 415, 630, 442, 711, 469, 842, 685, 738, 633, 496, 795, 375, 820, 254, 901, 691, 849, 728, 483, 928, 607, 470, 807, 686, 444, 844, 634, 715, 473, 740, 902, 797, 431, 850, 693, 379, 824, 905, 485, 474, 636, 811, 717, 798, 694, 865, 744, 852, 906, 623, 486, 381, 723, 697, 960, 439, 489, 839, 718, 476, 813, 913, 866, 671, 382, 463, 819, 908, 698, 725, 856, 490, 752, 814, 914, 631, 443, 843, 868, 739, 497, 726, 821, 255, 700, 492, 729, 929, 471, 916, 687, 445, 845, 635, 498, 741, 822, 872, 903, 851, 730, 930, 825, 446, 846, 475, 742, 920, 637, 500, 799, 695, 745, 826, 853, 732, 907, 487, 932, 880, 961, 638, 719, 477, 867, 746, 504, 854, 383, 828, 909, 699, 962, 857, 491, 936, 753, 478, 815, 915, 869, 748, 910, 727, 858, 701, 964, 754, 493, 917, 870, 499, 944, 823, 702, 873, 860, 494, 731, 756, 931, 918, 968, 447, 847, 743, 921, 501, 874, 827, 733, 933, 881, 760, 922, 639, 502, 876, 976, 747, 505, 855, 734, 934, 829, 882, 963, 937, 479, 924, 506, 749, 830, 911, 859, 884, 938, 965, 755, 992, 871, 750, 508, 945, 703, 966, 861, 495, 940, 757, 888, 919, 969, 946, 875, 862, 758, 970, 761, 923, 503, 948, 877, 977, 735, 935, 883, 972, 762, 925, 878, 978, 507, 952, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 511, 956, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q151_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 67, 512, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 71, 516, 45, 145, 98, 261, 51, 140, 88, 288, 46, 146, 75, 520, 100, 262, 53, 265, 161, 148, 77, 54, 104, 135, 266, 83, 528, 162, 57, 320, 78, 515, 273, 152, 31, 268, 58, 85, 139, 164, 112, 193, 274, 517, 99, 544, 86, 60, 141, 194, 89, 289, 168, 518, 276, 47, 147, 521, 101, 384, 263, 142, 90, 290, 196, 149, 522, 102, 280, 176, 576, 55, 105, 92, 267, 292, 529, 163, 150, 321, 200, 79, 524, 153, 106, 530, 269, 59, 322, 165, 296, 113, 275, 154, 108, 208, 545, 270, 87, 532, 166, 61, 324, 114, 195, 640, 169, 519, 277, 156, 546, 304, 385, 62, 143, 91, 536, 116, 291, 170, 197, 278, 328, 224, 523, 103, 386, 281, 548, 177, 577, 198, 93, 293, 172, 120, 151, 201, 282, 525, 388, 178, 578, 336, 107, 552, 94, 294, 531, 323, 202, 768, 297, 526, 284, 155, 180, 580, 109, 392, 209, 271, 533, 167, 298, 325, 115, 204, 560, 641, 352, 157, 110, 210, 547, 305, 184, 534, 584, 63, 326, 300, 642, 537, 117, 400, 171, 279, 158, 329, 225, 306, 212, 387, 549, 538, 118, 199, 644, 330, 173, 592, 226, 121, 283, 550, 308, 389, 179, 579, 337, 216, 553, 416, 95, 540, 295, 174, 332, 122, 203, 769, 648, 228, 527, 390, 285, 338, 181, 554, 312, 581, 393, 608, 770, 124, 299, 205, 561, 286, 182, 353, 232, 582, 340, 111, 394, 556, 211, 656, 185, 535, 585, 448, 327, 206, 772, 562, 301, 643, 401, 354, 159, 307, 396, 186, 213, 586, 344, 240, 302, 539, 119, 402, 564, 645, 331, 776, 356, 593, 227, 672, 214, 551, 309, 188, 588, 217, 417, 646, 541, 404, 175, 594, 333, 123, 568, 649, 229, 310, 360, 391, 339, 218, 784, 555, 418, 313, 542, 609, 334, 596, 771, 650, 230, 125, 408, 287, 704, 183, 233, 314, 583, 341, 220, 395, 557, 420, 657, 610, 368, 449, 126, 207, 773, 563, 652, 600, 355, 234, 800, 342, 558, 316, 658, 397, 187, 587, 450, 345, 612, 424, 774, 241, 303, 403, 565, 777, 357, 236, 673, 398, 215, 660, 346, 189, 589, 452, 242, 566, 616, 647, 405, 778, 358, 595, 674, 569, 432, 832, 311, 190, 361, 590, 348, 219, 785, 664, 244, 419, 543, 406, 456, 335, 780, 570, 597, 651, 231, 409, 676, 362, 624, 705, 786, 315, 221, 421, 611, 369, 248, 598, 127, 410, 572, 653, 364, 706, 601, 464, 235, 801, 680, 343, 222, 788, 559, 422, 317, 659, 370, 451, 613, 896, 425, 775, 654, 412, 602, 802, 708, 237, 318, 399, 661, 347, 614, 792, 372, 426, 453, 243, 688, 567, 617, 480, 604, 779, 359, 238, 804, 675, 433, 662, 833, 712, 191, 591, 454, 349, 428, 665, 245, 618, 376, 407, 457, 781, 571, 434, 834, 677, 363, 808, 625, 350, 787, 666, 246, 458, 620, 720, 782, 249, 599, 411, 678, 573, 436, 836, 626, 365, 707, 465, 681, 223, 789, 668, 423, 371, 460, 250, 816, 897, 574, 655, 413, 366, 603, 466, 628, 803, 682, 440, 709, 790, 840, 319, 736, 615, 898, 793, 373, 252, 427, 689, 414, 481, 710, 605, 468, 239, 805, 684, 632, 663, 713, 794, 374, 455, 900, 690, 429, 848, 619, 482, 377, 606, 806, 435, 835, 714, 472, 809, 351, 796, 430, 667, 247, 692, 378, 459, 621, 904, 484, 721, 783, 679, 437, 810, 837, 627, 716, 864, 669, 622, 380, 722, 461, 251, 817, 696, 575, 438, 488, 838, 367, 812, 467, 629, 912, 683, 441, 791, 670, 841, 737, 462, 818, 724, 899, 253, 415, 630, 442, 711, 469, 842, 685, 738, 633, 496, 795, 375, 254, 820, 901, 691, 849, 728, 483, 928, 607, 470, 807, 686, 444, 844, 634, 715, 473, 740, 902, 797, 431, 850, 693, 379, 824, 905, 485, 474, 636, 811, 717, 798, 694, 865, 744, 852, 623, 906, 486, 381, 723, 697, 960, 439, 489, 839, 718, 476, 813, 913, 866, 671, 382, 463, 819, 908, 698, 725, 856, 490, 752, 814, 631, 914, 443, 843, 868, 739, 497, 726, 255, 821, 700, 492, 729, 929, 471, 916, 687, 445, 845, 635, 498, 741, 822, 872, 903, 851, 730, 930, 825, 446, 846, 475, 742, 637, 920, 500, 799, 695, 745, 826, 853, 732, 907, 487, 932, 880, 961, 638, 719, 477, 867, 746, 504, 854, 383, 828, 909, 699, 962, 857, 491, 936, 753, 478, 815, 915, 869, 748, 910, 727, 858, 701, 964, 754, 493, 917, 870, 499, 944, 823, 702, 873, 860, 494, 731, 756, 931, 918, 968, 447, 847, 743, 921, 501, 874, 827, 733, 933, 881, 760, 639, 922, 502, 876, 976, 747, 505, 855, 734, 934, 829, 882, 963, 937, 479, 924, 506, 749, 830, 911, 859, 884, 938, 965, 755, 992, 871, 750, 508, 945, 703, 966, 861, 495, 940, 757, 888, 919, 969, 946, 875, 862, 758, 970, 761, 923, 503, 948, 877, 977, 735, 935, 883, 972, 762, 925, 878, 978, 507, 952, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 511, 956, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q152_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 67, 512, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 71, 516, 45, 145, 98, 261, 51, 140, 88, 288, 46, 146, 75, 520, 100, 262, 53, 265, 161, 148, 77, 54, 104, 135, 266, 83, 528, 162, 57, 320, 78, 515, 273, 152, 31, 268, 58, 85, 139, 164, 112, 193, 274, 517, 99, 544, 86, 60, 141, 194, 89, 289, 168, 518, 276, 47, 147, 521, 101, 384, 263, 142, 90, 290, 196, 149, 522, 102, 280, 176, 576, 55, 105, 92, 267, 292, 529, 163, 150, 321, 200, 79, 524, 153, 106, 530, 269, 59, 322, 165, 296, 113, 275, 154, 108, 208, 270, 545, 87, 532, 166, 61, 324, 114, 195, 640, 169, 519, 277, 156, 546, 304, 385, 62, 143, 91, 536, 116, 291, 170, 197, 278, 328, 224, 523, 103, 386, 281, 548, 177, 577, 198, 93, 293, 172, 120, 151, 201, 282, 525, 388, 178, 578, 336, 107, 552, 94, 294, 531, 323, 202, 768, 297, 526, 284, 155, 180, 580, 109, 392, 209, 271, 533, 167, 298, 325, 115, 204, 560, 641, 352, 157, 110, 210, 547, 305, 184, 534, 584, 63, 326, 300, 642, 537, 117, 400, 171, 279, 158, 329, 225, 306, 212, 387, 549, 538, 118, 199, 644, 330, 173, 592, 226, 121, 283, 550, 308, 389, 179, 579, 337, 216, 553, 416, 95, 540, 295, 174, 332, 122, 203, 769, 648, 228, 527, 390, 285, 338, 181, 554, 312, 581, 393, 608, 770, 124, 299, 205, 286, 561, 182, 353, 232, 582, 340, 111, 394, 556, 211, 656, 185, 535, 585, 448, 327, 206, 772, 562, 301, 643, 401, 354, 159, 307, 396, 186, 213, 586, 344, 240, 302, 539, 119, 402, 564, 645, 331, 776, 356, 593, 227, 672, 214, 551, 309, 188, 588, 217, 417, 646, 541, 404, 175, 594, 333, 123, 568, 649, 229, 310, 360, 391, 339, 218, 784, 555, 418, 313, 542, 334, 609, 596, 771, 650, 230, 125, 408, 287, 704, 183, 233, 314, 583, 341, 220, 395, 557, 420, 657, 610, 368, 449, 126, 207, 773, 563, 652, 600, 355, 234, 800, 342, 558, 316, 658, 397, 187, 587, 450, 345, 612, 424, 774, 241, 303, 403, 565, 777, 357, 236, 398, 673, 215, 660, 346, 189, 589, 452, 242, 566, 616, 647, 405, 778, 358, 595, 674, 569, 432, 832, 311, 190, 361, 590, 348, 219, 785, 664, 244, 419, 543, 406, 456, 335, 780, 570, 597, 651, 231, 409, 676, 362, 624, 705, 786, 315, 221, 421, 611, 369, 248, 598, 127, 410, 572, 653, 364, 706, 601, 464, 235, 801, 680, 343, 222, 788, 559, 422, 317, 659, 370, 451, 613, 896, 425, 775, 654, 412, 602, 802, 708, 237, 318, 399, 661, 347, 614, 792, 372, 426, 453, 243, 688, 567, 617, 480, 604, 779, 359, 238, 804, 675, 433, 662, 833, 712, 191, 591, 454, 349, 428, 665, 245, 618, 376, 407, 457, 781, 571, 434, 834, 677, 363, 808, 350, 625, 787, 666, 246, 458, 620, 720, 782, 249, 599, 411, 678, 573, 436, 836, 626, 365, 707, 465, 681, 223, 789, 668, 423, 371, 460, 250, 816, 897, 574, 655, 413, 366, 603, 466, 628, 803, 682, 440, 709, 790, 840, 319, 736, 615, 898, 793, 373, 252, 427, 414, 689, 481, 710, 605, 468, 239, 805, 684, 632, 663, 713, 794, 374, 455, 900, 690, 429, 848, 619, 482, 377, 606, 806, 435, 835, 714, 472, 809, 351, 796, 430, 667, 247, 692, 378, 459, 621, 904, 484, 721, 783, 679, 437, 810, 837, 627, 716, 864, 669, 622, 380, 722, 461, 251, 817, 696, 575, 438, 488, 838, 367, 812, 467, 629, 912, 683, 441, 791, 670, 841, 462, 737, 818, 724, 899, 253, 415, 630, 442, 711, 469, 842, 685, 738, 633, 496, 795, 375, 254, 820, 901, 691, 849, 728, 483, 928, 607, 470, 807, 686, 444, 844, 634, 715, 473, 740, 902, 797, 431, 850, 693, 379, 824, 905, 485, 474, 636, 811, 717, 798, 694, 865, 744, 852, 623, 906, 486, 381, 723, 697, 960, 439, 489, 839, 718, 476, 813, 913, 866, 671, 382, 463, 819, 908, 698, 725, 856, 490, 752, 814, 631, 914, 443, 843, 868, 739, 497, 726, 255, 821, 700, 492, 729, 929, 471, 916, 687, 445, 845, 635, 498, 741, 822, 872, 903, 851, 730, 930, 825, 446, 846, 475, 742, 637, 920, 500, 799, 695, 745, 826, 853, 732, 907, 487, 932, 880, 961, 638, 719, 477, 867, 746, 504, 854, 383, 828, 909, 699, 962, 857, 491, 936, 478, 753, 815, 915, 869, 748, 910, 727, 858, 701, 964, 754, 493, 917, 870, 499, 944, 823, 702, 873, 860, 494, 731, 756, 931, 918, 968, 447, 847, 743, 921, 501, 874, 827, 733, 933, 881, 760, 639, 922, 502, 876, 976, 747, 505, 855, 734, 934, 829, 882, 963, 937, 479, 924, 506, 749, 830, 911, 859, 884, 938, 965, 755, 992, 871, 750, 508, 945, 703, 966, 861, 495, 940, 757, 888, 919, 969, 946, 875, 862, 758, 970, 761, 923, 503, 948, 877, 977, 735, 935, 883, 972, 762, 925, 878, 978, 507, 952, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 511, 956, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q153_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 130, 25, 37, 26, 132, 80, 38, 67, 512, 41, 28, 257, 136, 15, 42, 69, 96, 258, 49, 70, 44, 144, 23, 73, 260, 50, 131, 74, 27, 52, 133, 264, 81, 160, 39, 76, 513, 134, 29, 82, 56, 137, 514, 272, 43, 30, 97, 84, 259, 138, 192, 71, 516, 45, 145, 98, 261, 51, 140, 88, 288, 46, 146, 75, 520, 100, 262, 53, 265, 161, 148, 77, 54, 104, 135, 266, 83, 528, 162, 57, 320, 78, 515, 273, 152, 31, 268, 58, 85, 139, 164, 112, 193, 274, 517, 99, 544, 86, 60, 141, 194, 89, 289, 168, 518, 276, 47, 147, 521, 101, 384, 263, 142, 90, 290, 196, 149, 522, 102, 280, 176, 55, 576, 105, 92, 267, 292, 529, 163, 150, 321, 200, 79, 524, 153, 106, 530, 269, 59, 322, 165, 296, 113, 275, 154, 108, 208, 270, 545, 87, 532, 166, 61, 324, 114, 195, 640, 169, 519, 277, 156, 546, 304, 385, 62, 143, 91, 536, 116, 291, 170, 197, 278, 328, 224, 523, 103, 386, 281, 548, 177, 577, 198, 93, 293, 172, 120, 151, 201, 282, 525, 388, 178, 578, 336, 107, 552, 94, 294, 531, 323, 202, 768, 297, 526, 284, 155, 180, 580, 109, 392, 209, 271, 533, 167, 298, 325, 115, 204, 560, 641, 352, 157, 110, 210, 547, 305, 184, 534, 63, 584, 326, 300, 642, 537, 117, 400, 171, 279, 158, 329, 225, 306, 212, 387, 549, 538, 118, 199, 644, 330, 173, 592, 226, 121, 283, 550, 308, 389, 179, 579, 337, 216, 553, 416, 95, 540, 295, 174, 332, 122, 203, 769, 648, 228, 527, 390, 285, 338, 181, 554, 312, 581, 393, 608, 770, 124, 299, 205, 286, 561, 182, 353, 232, 582, 340, 111, 394, 556, 211, 656, 185, 535, 585, 448, 327, 206, 772, 562, 301, 643, 401, 354, 159, 307, 396, 186, 213, 586, 344, 240, 302, 539, 119, 402, 564, 645, 331, 776, 356, 593, 227, 672, 214, 551, 309, 188, 588, 217, 417, 646, 541, 404, 175, 594, 333, 123, 568, 649, 229, 310, 360, 391, 339, 218, 784, 555, 418, 313, 542, 334, 609, 596, 771, 650, 230, 125, 408, 287, 183, 704, 233, 314, 583, 341, 220, 395, 557, 420, 657, 610, 368, 449, 126, 207, 773, 563, 652, 600, 355, 234, 800, 342, 558, 316, 658, 397, 187, 587, 450, 345, 612, 424, 774, 241, 303, 403, 565, 777, 357, 236, 398, 673, 215, 660, 346, 189, 589, 452, 242, 566, 616, 647, 405, 778, 358, 595, 674, 569, 432, 311, 832, 190, 361, 590, 348, 219, 785, 664, 244, 419, 543, 406, 456, 335, 780, 570, 597, 651, 231, 409, 676, 362, 624, 705, 786, 315, 221, 421, 611, 369, 248, 598, 127, 410, 572, 653, 364, 706, 601, 464, 235, 801, 680, 343, 222, 788, 559, 422, 317, 659, 370, 451, 613, 896, 425, 775, 654, 412, 602, 802, 708, 237, 318, 399, 661, 347, 614, 792, 372, 426, 453, 243, 688, 567, 617, 480, 604, 779, 359, 238, 804, 675, 433, 662, 833, 191, 712, 591, 454, 349, 428, 665, 245, 618, 376, 407, 457, 781, 571, 434, 834, 677, 363, 808, 350, 625, 787, 666, 246, 458, 620, 720, 782, 249, 599, 411, 678, 573, 436, 836, 626, 365, 707, 465, 681, 223, 789, 668, 423, 371, 460, 250, 816, 897, 574, 655, 413, 366, 603, 466, 628, 803, 682, 440, 709, 790, 319, 840, 736, 615, 898, 793, 373, 252, 427, 414, 689, 481, 710, 605, 468, 239, 805, 684, 632, 663, 713, 794, 374, 455, 900, 690, 429, 848, 619, 482, 377, 606, 806, 435, 835, 714, 472, 809, 351, 796, 430, 667, 247, 692, 378, 459, 621, 904, 484, 721, 783, 679, 437, 810, 837, 627, 716, 864, 669, 622, 380, 722, 461, 251, 817, 696, 575, 438, 488, 838, 367, 812, 467, 629, 912, 683, 441, 791, 670, 841, 462, 737, 818, 724, 899, 253, 415, 630, 442, 711, 469, 842, 685, 738, 633, 496, 795, 375, 254, 820, 901, 691, 849, 728, 483, 928, 607, 470, 807, 686, 444, 844, 634, 715, 473, 740, 902, 797, 431, 850, 693, 379, 824, 905, 485, 474, 636, 811, 717, 798, 694, 865, 744, 852, 623, 906, 486, 381, 723, 697, 439, 960, 489, 839, 718, 476, 813, 913, 866, 671, 382, 463, 819, 908, 698, 725, 856, 490, 752, 814, 631, 914, 443, 843, 868, 739, 497, 726, 255, 821, 700, 492, 729, 929, 471, 916, 687, 445, 845, 635, 498, 741, 822, 872, 903, 851, 730, 930, 825, 446, 846, 475, 742, 637, 920, 500, 799, 695, 745, 826, 853, 732, 907, 487, 932, 880, 961, 638, 719, 477, 867, 746, 504, 854, 383, 828, 909, 699, 962, 857, 491, 936, 478, 753, 815, 915, 869, 748, 910, 727, 858, 701, 964, 754, 493, 917, 870, 499, 944, 823, 702, 873, 860, 494, 731, 756, 931, 918, 447, 968, 847, 743, 921, 501, 874, 827, 733, 933, 881, 760, 639, 922, 502, 876, 976, 747, 505, 855, 734, 934, 829, 882, 963, 937, 479, 924, 506, 749, 830, 911, 859, 884, 938, 965, 755, 992, 871, 750, 508, 945, 703, 966, 861, 495, 940, 757, 888, 919, 969, 946, 875, 862, 758, 970, 761, 923, 503, 948, 877, 977, 735, 935, 883, 972, 762, 925, 878, 978, 507, 952, 831, 885, 764, 939, 926, 993, 980, 751, 509, 886, 967, 941, 994, 889, 510, 947, 984, 863, 942, 759, 890, 971, 996, 949, 892, 973, 763, 950, 1000, 879, 979, 953, 974, 765, 927, 954, 981, 1008, 887, 766, 995, 982, 511, 956, 985, 943, 891, 997, 986, 998, 893, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q154_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 272, 43, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 544, 86, 60, 141, 89, 194, 289, 168, 518, 276, 47, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 545, 87, 532, 61, 166, 114, 324, 195, 640, 169, 519, 277, 156, 546, 304, 385, 62, 143, 91, 116, 536, 291, 170, 197, 278, 328, 224, 103, 523, 281, 386, 548, 177, 577, 93, 198, 293, 172, 120, 151, 201, 282, 525, 178, 388, 578, 336, 107, 552, 94, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 400, 171, 279, 158, 329, 225, 306, 212, 387, 549, 118, 538, 199, 644, 330, 173, 592, 121, 226, 283, 550, 308, 179, 389, 579, 337, 216, 553, 416, 95, 540, 295, 174, 122, 332, 203, 769, 228, 648, 527, 285, 390, 338, 181, 554, 312, 581, 393, 608, 770, 124, 299, 205, 286, 561, 182, 353, 232, 582, 340, 111, 394, 556, 211, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 672, 214, 551, 309, 188, 588, 217, 417, 541, 646, 404, 175, 594, 123, 333, 568, 229, 649, 310, 360, 391, 339, 218, 784, 555, 313, 418, 542, 334, 609, 596, 771, 125, 230, 650, 408, 287, 183, 704, 233, 314, 583, 341, 220, 395, 557, 420, 657, 610, 368, 449, 126, 207, 563, 773, 652, 600, 355, 234, 800, 342, 558, 316, 658, 187, 397, 587, 345, 450, 612, 424, 241, 774, 303, 403, 565, 357, 777, 236, 398, 673, 215, 660, 346, 189, 589, 242, 452, 566, 616, 647, 405, 358, 778, 595, 569, 674, 432, 311, 832, 190, 361, 590, 348, 219, 785, 244, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 464, 235, 801, 680, 343, 222, 788, 559, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 779, 238, 804, 675, 433, 662, 833, 191, 712, 591, 349, 454, 428, 245, 665, 618, 376, 407, 457, 571, 781, 434, 834, 677, 363, 808, 350, 625, 787, 246, 666, 458, 620, 720, 249, 782, 599, 411, 573, 678, 436, 626, 836, 365, 707, 465, 681, 223, 789, 668, 423, 371, 250, 460, 816, 897, 574, 655, 413, 366, 603, 466, 628, 803, 682, 440, 709, 790, 319, 840, 736, 615, 373, 793, 898, 252, 427, 414, 689, 481, 605, 710, 468, 239, 805, 684, 632, 663, 713, 374, 794, 455, 690, 900, 429, 848, 619, 377, 482, 606, 806, 435, 835, 714, 472, 809, 351, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 812, 467, 629, 912, 683, 441, 791, 670, 841, 462, 737, 818, 724, 899, 253, 415, 630, 442, 711, 469, 842, 685, 633, 738, 496, 375, 795, 254, 820, 691, 901, 849, 728, 483, 928, 607, 470, 807, 686, 444, 634, 844, 715, 473, 740, 797, 902, 431, 850, 693, 379, 824, 485, 905, 474, 636, 811, 717, 798, 694, 865, 744, 852, 623, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 929, 471, 916, 687, 445, 635, 845, 498, 741, 822, 872, 903, 851, 730, 825, 930, 446, 846, 475, 637, 742, 500, 920, 799, 695, 745, 826, 853, 732, 487, 907, 932, 880, 961, 638, 719, 477, 867, 746, 504, 854, 383, 828, 699, 909, 857, 962, 491, 936, 478, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 976, 747, 505, 855, 734, 829, 934, 882, 963, 937, 479, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 980, 751, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q155_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 272, 43, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 544, 86, 60, 141, 89, 194, 289, 168, 518, 276, 47, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 545, 87, 532, 61, 166, 114, 324, 195, 640, 169, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 578, 336, 107, 552, 94, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 400, 171, 279, 158, 329, 225, 306, 212, 387, 549, 118, 538, 199, 644, 330, 173, 592, 121, 226, 283, 550, 308, 179, 389, 579, 337, 216, 553, 95, 416, 540, 295, 174, 122, 332, 203, 769, 228, 648, 527, 285, 390, 338, 181, 554, 312, 581, 393, 608, 124, 770, 299, 205, 286, 561, 182, 353, 232, 582, 340, 111, 394, 556, 211, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 672, 214, 551, 309, 188, 588, 217, 417, 541, 646, 404, 175, 594, 123, 333, 568, 229, 649, 310, 360, 391, 339, 218, 784, 555, 313, 418, 542, 334, 609, 596, 125, 771, 230, 650, 408, 287, 183, 704, 233, 314, 583, 341, 220, 395, 557, 420, 657, 610, 368, 126, 449, 207, 563, 773, 652, 600, 355, 234, 800, 342, 558, 316, 658, 187, 397, 587, 345, 450, 612, 424, 241, 774, 303, 403, 565, 357, 777, 236, 398, 673, 215, 660, 346, 189, 589, 242, 452, 566, 616, 647, 405, 358, 778, 595, 569, 674, 432, 311, 190, 832, 361, 590, 348, 219, 785, 244, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 464, 235, 801, 680, 343, 222, 788, 559, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 779, 238, 804, 675, 433, 662, 191, 833, 712, 591, 349, 454, 428, 245, 665, 618, 376, 407, 457, 571, 781, 434, 834, 677, 363, 808, 350, 625, 787, 246, 666, 458, 620, 720, 249, 782, 599, 411, 573, 678, 436, 626, 836, 365, 707, 465, 681, 223, 789, 668, 423, 371, 250, 460, 816, 574, 897, 655, 413, 366, 603, 466, 628, 803, 682, 440, 709, 790, 319, 840, 736, 615, 373, 793, 252, 898, 427, 414, 689, 481, 605, 710, 468, 239, 805, 684, 632, 663, 713, 374, 794, 455, 690, 900, 429, 848, 619, 377, 482, 606, 806, 435, 835, 714, 472, 809, 351, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 812, 467, 629, 912, 683, 441, 791, 670, 841, 462, 737, 818, 724, 253, 899, 415, 630, 442, 711, 469, 842, 685, 633, 738, 496, 375, 795, 254, 820, 691, 901, 849, 728, 483, 607, 928, 470, 807, 686, 444, 634, 844, 715, 473, 740, 797, 902, 431, 850, 693, 379, 824, 485, 905, 474, 636, 811, 717, 798, 694, 865, 744, 852, 623, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 929, 471, 916, 687, 445, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 854, 383, 828, 699, 909, 857, 962, 491, 936, 478, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 976, 747, 505, 855, 734, 829, 934, 882, 963, 937, 479, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 980, 751, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q156_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 272, 43, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 544, 86, 60, 141, 89, 194, 289, 168, 518, 276, 47, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 545, 87, 532, 61, 166, 114, 324, 195, 640, 169, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 578, 336, 107, 552, 94, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 400, 171, 279, 158, 329, 225, 306, 212, 387, 549, 118, 538, 199, 644, 330, 173, 592, 121, 226, 283, 550, 308, 179, 389, 579, 337, 216, 553, 95, 416, 540, 295, 174, 122, 332, 203, 228, 769, 648, 527, 285, 390, 338, 181, 554, 312, 581, 393, 608, 124, 770, 299, 205, 286, 561, 182, 353, 232, 582, 340, 111, 394, 556, 211, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 672, 214, 551, 309, 188, 588, 217, 417, 541, 646, 404, 175, 594, 123, 333, 568, 229, 649, 310, 360, 391, 339, 218, 784, 555, 313, 418, 542, 334, 609, 596, 125, 230, 771, 650, 408, 287, 183, 704, 233, 314, 583, 341, 220, 395, 557, 420, 657, 610, 368, 126, 449, 207, 563, 773, 652, 600, 355, 234, 800, 342, 558, 316, 658, 187, 397, 587, 345, 450, 612, 424, 241, 774, 303, 403, 565, 357, 236, 777, 398, 673, 215, 660, 346, 189, 589, 242, 452, 566, 616, 647, 405, 358, 778, 595, 569, 674, 432, 311, 190, 832, 361, 590, 348, 219, 244, 785, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 464, 235, 801, 343, 680, 222, 788, 559, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 238, 779, 804, 675, 433, 662, 191, 833, 712, 591, 349, 454, 428, 245, 665, 618, 376, 407, 457, 571, 781, 434, 834, 677, 363, 808, 350, 625, 246, 787, 666, 458, 620, 720, 249, 782, 599, 411, 573, 678, 436, 626, 836, 365, 707, 465, 681, 223, 789, 668, 423, 371, 250, 460, 816, 574, 897, 655, 413, 366, 603, 466, 628, 803, 682, 440, 709, 790, 319, 840, 736, 615, 373, 252, 793, 898, 427, 414, 689, 481, 605, 710, 468, 239, 805, 684, 632, 663, 713, 374, 794, 455, 690, 900, 429, 848, 619, 377, 482, 606, 806, 435, 835, 714, 472, 809, 351, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 812, 467, 629, 912, 683, 441, 791, 670, 841, 462, 737, 818, 724, 253, 899, 415, 630, 442, 711, 469, 842, 685, 633, 738, 496, 375, 254, 795, 820, 691, 901, 849, 728, 483, 607, 928, 470, 807, 686, 444, 634, 844, 715, 473, 740, 797, 902, 431, 850, 693, 379, 824, 485, 905, 474, 636, 811, 717, 798, 694, 865, 744, 852, 623, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 929, 471, 916, 687, 445, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 854, 383, 828, 699, 909, 857, 962, 491, 936, 478, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 976, 747, 505, 855, 734, 829, 934, 882, 963, 937, 479, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 980, 751, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q157_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 272, 43, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 544, 86, 60, 141, 89, 194, 289, 168, 518, 276, 47, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 545, 87, 532, 61, 166, 114, 324, 195, 640, 169, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 578, 336, 107, 552, 94, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 400, 171, 279, 158, 329, 225, 306, 212, 387, 549, 118, 538, 199, 644, 330, 173, 592, 121, 226, 283, 550, 308, 179, 389, 579, 337, 216, 553, 95, 416, 540, 295, 174, 122, 332, 203, 228, 769, 648, 527, 285, 390, 338, 181, 554, 312, 581, 393, 608, 124, 770, 299, 205, 286, 561, 182, 353, 232, 582, 340, 111, 394, 556, 211, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 672, 214, 551, 309, 188, 588, 217, 417, 541, 646, 404, 175, 594, 123, 333, 568, 229, 310, 649, 360, 391, 339, 218, 784, 555, 313, 418, 542, 334, 609, 596, 125, 230, 771, 650, 408, 287, 183, 704, 233, 314, 583, 341, 220, 395, 557, 420, 657, 610, 368, 126, 449, 207, 563, 773, 652, 600, 355, 234, 800, 342, 558, 316, 658, 187, 397, 587, 345, 450, 612, 424, 241, 774, 303, 403, 565, 357, 236, 777, 398, 673, 215, 660, 346, 189, 589, 242, 452, 566, 616, 647, 405, 358, 778, 595, 569, 674, 432, 311, 190, 832, 361, 590, 348, 219, 244, 785, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 464, 235, 801, 343, 680, 222, 788, 559, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 238, 779, 804, 675, 433, 662, 191, 833, 712, 591, 349, 454, 428, 245, 665, 618, 376, 407, 457, 571, 781, 434, 834, 677, 363, 808, 350, 625, 246, 787, 666, 458, 620, 720, 249, 782, 599, 411, 573, 678, 436, 626, 836, 365, 707, 465, 681, 223, 789, 668, 423, 371, 250, 460, 816, 574, 897, 655, 413, 366, 603, 466, 628, 803, 682, 440, 709, 790, 319, 840, 736, 615, 373, 252, 793, 898, 427, 414, 689, 481, 605, 710, 468, 239, 805, 684, 632, 663, 374, 713, 794, 455, 690, 900, 429, 848, 619, 377, 482, 606, 806, 435, 835, 714, 472, 809, 351, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 812, 467, 629, 912, 683, 441, 791, 670, 841, 462, 737, 818, 724, 253, 899, 415, 630, 442, 711, 469, 842, 685, 633, 738, 496, 375, 254, 795, 820, 691, 901, 849, 728, 483, 607, 928, 470, 807, 686, 444, 634, 844, 715, 473, 740, 797, 902, 431, 850, 693, 379, 824, 485, 905, 474, 636, 811, 717, 798, 694, 865, 744, 852, 623, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 929, 471, 916, 687, 445, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 854, 383, 828, 699, 909, 857, 962, 491, 936, 478, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 976, 747, 505, 855, 734, 829, 934, 882, 963, 937, 479, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 980, 751, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q158_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 43, 272, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 86, 544, 60, 141, 89, 194, 289, 168, 518, 47, 276, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 87, 545, 532, 61, 166, 114, 324, 195, 640, 169, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 578, 107, 336, 94, 552, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 171, 400, 279, 158, 329, 225, 306, 212, 387, 549, 118, 538, 199, 644, 330, 173, 592, 121, 226, 283, 550, 308, 179, 389, 579, 337, 216, 95, 553, 416, 540, 295, 174, 122, 332, 203, 228, 769, 648, 527, 285, 390, 338, 181, 554, 312, 581, 393, 608, 124, 770, 299, 205, 286, 561, 182, 353, 232, 582, 111, 340, 394, 211, 556, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 214, 672, 551, 309, 188, 588, 217, 417, 541, 646, 175, 404, 594, 123, 333, 568, 229, 310, 649, 360, 391, 339, 218, 555, 784, 313, 418, 542, 334, 609, 596, 125, 230, 771, 650, 408, 287, 183, 704, 233, 314, 583, 341, 220, 395, 557, 420, 657, 610, 368, 126, 449, 207, 563, 773, 652, 600, 355, 234, 342, 800, 558, 316, 658, 187, 397, 587, 345, 450, 612, 424, 241, 774, 303, 403, 565, 357, 236, 777, 398, 215, 673, 660, 346, 189, 589, 242, 452, 566, 616, 647, 405, 358, 778, 595, 569, 674, 432, 311, 190, 832, 361, 590, 348, 219, 244, 785, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 235, 464, 343, 801, 222, 680, 559, 788, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 238, 779, 804, 675, 433, 662, 191, 833, 712, 591, 349, 454, 428, 245, 665, 618, 376, 407, 457, 571, 781, 434, 834, 677, 363, 350, 808, 625, 246, 787, 666, 458, 620, 720, 249, 782, 599, 411, 573, 678, 436, 626, 836, 365, 707, 465, 223, 681, 789, 668, 423, 371, 250, 460, 816, 574, 897, 655, 413, 366, 603, 466, 628, 803, 682, 440, 709, 790, 319, 840, 736, 615, 373, 252, 793, 898, 427, 414, 689, 481, 605, 710, 239, 468, 805, 684, 632, 663, 374, 713, 794, 455, 690, 900, 429, 619, 848, 377, 482, 606, 806, 435, 835, 714, 472, 351, 809, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 467, 812, 629, 683, 912, 441, 791, 670, 841, 462, 737, 818, 724, 253, 899, 415, 630, 442, 711, 469, 842, 685, 633, 738, 496, 375, 254, 795, 820, 691, 901, 849, 728, 483, 607, 470, 928, 807, 686, 444, 634, 844, 715, 473, 740, 797, 902, 431, 850, 693, 379, 824, 485, 905, 474, 636, 811, 717, 798, 694, 865, 744, 623, 852, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 471, 929, 687, 916, 445, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 854, 383, 828, 699, 909, 857, 962, 491, 478, 936, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 747, 976, 505, 855, 734, 829, 934, 882, 963, 479, 937, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 751, 980, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q159_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 512, 41, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 514, 43, 272, 30, 97, 84, 259, 138, 192, 71, 516, 45, 145, 98, 51, 261, 140, 88, 288, 46, 146, 75, 100, 520, 262, 53, 265, 161, 148, 77, 54, 104, 135, 266, 83, 528, 57, 162, 320, 78, 515, 273, 152, 31, 58, 268, 85, 139, 164, 112, 193, 274, 517, 99, 86, 544, 60, 141, 89, 194, 289, 168, 518, 47, 276, 147, 101, 521, 384, 263, 142, 90, 290, 196, 149, 102, 522, 280, 176, 55, 576, 105, 92, 267, 292, 529, 163, 150, 321, 200, 79, 524, 153, 106, 530, 59, 269, 322, 165, 296, 113, 275, 154, 108, 208, 270, 87, 545, 532, 61, 166, 114, 324, 195, 640, 169, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 578, 107, 336, 94, 552, 294, 531, 323, 202, 768, 297, 526, 284, 155, 180, 580, 109, 392, 209, 271, 533, 167, 298, 115, 325, 204, 560, 641, 352, 157, 110, 210, 547, 305, 184, 534, 63, 584, 326, 300, 117, 537, 642, 171, 400, 279, 158, 329, 225, 306, 212, 387, 549, 118, 538, 199, 644, 330, 173, 592, 121, 226, 283, 550, 308, 179, 389, 579, 337, 216, 95, 553, 416, 540, 295, 174, 122, 332, 203, 228, 769, 648, 527, 285, 390, 338, 181, 554, 312, 581, 393, 608, 124, 770, 299, 205, 286, 561, 182, 353, 232, 582, 111, 340, 394, 211, 556, 656, 185, 535, 585, 448, 327, 206, 562, 772, 301, 643, 401, 354, 159, 307, 186, 396, 213, 586, 344, 240, 302, 119, 539, 402, 564, 645, 331, 356, 776, 593, 227, 214, 672, 551, 309, 188, 588, 217, 417, 541, 646, 175, 404, 594, 123, 333, 568, 229, 310, 649, 360, 391, 339, 218, 555, 784, 313, 418, 542, 334, 609, 596, 125, 230, 771, 650, 408, 287, 183, 704, 233, 314, 583, 341, 220, 395, 557, 420, 657, 610, 368, 126, 449, 207, 563, 773, 652, 600, 355, 234, 342, 800, 558, 316, 658, 187, 397, 587, 345, 450, 612, 424, 241, 774, 303, 403, 565, 357, 236, 777, 398, 215, 673, 660, 346, 189, 589, 242, 452, 566, 616, 647, 405, 358, 778, 595, 569, 674, 432, 311, 190, 832, 361, 590, 348, 219, 244, 785, 664, 419, 543, 406, 456, 335, 570, 780, 597, 231, 651, 409, 676, 362, 624, 705, 786, 315, 221, 421, 611, 369, 248, 598, 127, 410, 572, 653, 364, 601, 706, 235, 464, 343, 222, 801, 680, 559, 788, 317, 422, 659, 370, 451, 613, 896, 425, 775, 654, 412, 602, 802, 708, 237, 318, 399, 661, 347, 614, 372, 792, 426, 243, 453, 688, 567, 617, 480, 604, 359, 238, 779, 804, 675, 433, 662, 191, 833, 712, 591, 349, 454, 428, 245, 665, 618, 376, 407, 457, 571, 781, 434, 834, 677, 363, 350, 808, 625, 246, 787, 666, 458, 620, 720, 249, 782, 599, 411, 573, 678, 436, 626, 836, 365, 707, 465, 223, 681, 789, 668, 423, 371, 250, 460, 816, 574, 897, 655, 413, 366, 603, 466, 628, 803, 682, 440, 709, 790, 319, 840, 736, 615, 373, 252, 793, 898, 427, 414, 689, 481, 605, 710, 239, 468, 805, 684, 632, 663, 374, 713, 794, 455, 690, 900, 429, 619, 848, 377, 482, 606, 806, 435, 835, 714, 472, 351, 809, 796, 430, 247, 667, 692, 378, 459, 621, 484, 904, 721, 783, 679, 437, 810, 627, 837, 716, 864, 669, 622, 380, 722, 251, 461, 817, 696, 575, 438, 488, 838, 367, 467, 812, 629, 683, 912, 441, 791, 670, 841, 462, 737, 818, 724, 253, 899, 415, 630, 442, 711, 469, 842, 685, 633, 738, 496, 375, 254, 795, 820, 691, 901, 849, 728, 483, 607, 470, 928, 807, 686, 444, 634, 844, 715, 473, 740, 797, 902, 431, 850, 693, 379, 824, 485, 905, 474, 636, 811, 717, 798, 694, 865, 744, 623, 852, 381, 486, 906, 723, 697, 439, 960, 489, 839, 718, 476, 813, 913, 866, 671, 382, 463, 819, 698, 908, 725, 856, 490, 752, 814, 631, 914, 443, 843, 868, 739, 497, 726, 255, 821, 700, 492, 729, 471, 929, 687, 916, 445, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 854, 383, 828, 699, 909, 857, 962, 491, 478, 936, 753, 815, 915, 869, 748, 910, 727, 858, 701, 754, 964, 493, 917, 870, 499, 944, 823, 702, 873, 860, 494, 731, 756, 931, 918, 447, 968, 847, 743, 501, 921, 874, 827, 733, 933, 881, 760, 639, 502, 922, 876, 747, 976, 505, 855, 734, 829, 934, 882, 963, 479, 937, 924, 506, 749, 830, 911, 859, 884, 938, 755, 965, 992, 871, 750, 508, 945, 703, 861, 966, 495, 940, 757, 888, 919, 969, 946, 875, 862, 758, 970, 761, 503, 923, 948, 877, 977, 735, 935, 883, 762, 972, 925, 878, 978, 507, 952, 831, 885, 764, 939, 926, 993, 751, 980, 509, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 982, 511, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q160_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 266, 83, 57, 528, 162, 320, 78, 515, 273, 152, 31, 58, 268, 85, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 529, 163, 150, 321, 200, 79, 524, 153, 106, 59, 530, 269, 165, 322, 296, 113, 275, 154, 108, 208, 270, 87, 545, 61, 532, 166, 114, 324, 195, 169, 640, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 107, 578, 336, 94, 552, 294, 531, 323, 202, 297, 768, 526, 284, 155, 180, 109, 580, 392, 209, 271, 533, 167, 298, 115, 325, 204, 560, 641, 352, 157, 110, 210, 547, 305, 184, 63, 534, 584, 326, 300, 117, 537, 171, 642, 400, 279, 158, 329, 225, 306, 212, 387, 549, 118, 538, 199, 173, 330, 644, 121, 592, 226, 283, 550, 308, 179, 389, 579, 337, 216, 95, 553, 416, 540, 295, 174, 122, 332, 203, 228, 769, 648, 527, 285, 390, 181, 338, 554, 312, 581, 393, 608, 124, 299, 770, 205, 286, 561, 182, 353, 232, 111, 582, 340, 394, 211, 556, 185, 656, 535, 585, 448, 327, 206, 562, 301, 772, 643, 401, 354, 159, 307, 186, 396, 213, 586, 344, 240, 302, 119, 539, 402, 564, 331, 645, 356, 776, 593, 227, 214, 672, 551, 309, 188, 588, 217, 417, 541, 175, 646, 404, 123, 594, 333, 568, 229, 310, 649, 360, 391, 339, 218, 555, 313, 784, 418, 542, 334, 609, 125, 596, 230, 771, 650, 408, 287, 183, 233, 704, 314, 583, 341, 220, 395, 557, 420, 657, 610, 368, 126, 449, 207, 563, 773, 652, 600, 355, 234, 342, 800, 558, 316, 187, 658, 397, 587, 345, 450, 612, 424, 241, 303, 774, 403, 565, 357, 236, 777, 398, 215, 673, 189, 346, 660, 589, 242, 452, 566, 616, 647, 405, 358, 778, 595, 569, 674, 432, 311, 190, 361, 832, 590, 348, 219, 244, 785, 664, 419, 543, 406, 456, 335, 570, 780, 597, 231, 651, 409, 362, 676, 624, 705, 315, 786, 221, 421, 611, 369, 248, 127, 598, 410, 572, 653, 364, 601, 235, 706, 464, 343, 222, 801, 680, 559, 317, 788, 422, 659, 370, 451, 613, 425, 896, 775, 654, 412, 602, 802, 237, 708, 318, 399, 347, 661, 614, 372, 792, 426, 243, 453, 688, 567, 617, 480, 604, 359, 238, 779, 804, 675, 433, 191, 662, 833, 712, 591, 349, 454, 428, 245, 665, 618, 376, 407, 457, 571, 781, 434, 363, 677, 834, 350, 808, 625, 246, 787, 666, 458, 620, 249, 720, 782, 599, 411, 573, 678, 436, 626, 365, 836, 707, 465, 223, 681, 789, 668, 423, 371, 250, 460, 816, 574, 897, 655, 413, 366, 603, 466, 628, 803, 682, 440, 709, 319, 790, 840, 736, 615, 373, 252, 793, 427, 898, 414, 689, 481, 605, 239, 710, 468, 805, 684, 632, 663, 374, 713, 794, 455, 690, 429, 900, 619, 377, 848, 482, 606, 806, 435, 835, 714, 472, 351, 809, 796, 430, 247, 667, 378, 692, 459, 621, 484, 904, 721, 783, 679, 437, 810, 627, 837, 716, 864, 669, 622, 380, 251, 722, 461, 817, 696, 575, 438, 488, 367, 838, 467, 812, 629, 683, 441, 912, 791, 670, 841, 462, 737, 818, 253, 724, 899, 415, 630, 442, 711, 469, 685, 842, 633, 738, 496, 375, 254, 795, 820, 691, 901, 849, 728, 483, 607, 470, 928, 807, 686, 444, 634, 844, 715, 473, 740, 797, 431, 902, 379, 693, 850, 824, 485, 905, 474, 636, 811, 717, 798, 694, 865, 744, 623, 381, 852, 486, 906, 723, 697, 439, 489, 960, 839, 718, 476, 813, 913, 866, 671, 382, 463, 819, 698, 908, 725, 856, 490, 752, 814, 631, 443, 914, 843, 868, 739, 497, 255, 726, 821, 700, 492, 729, 471, 929, 687, 445, 916, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 383, 854, 828, 699, 909, 857, 491, 962, 478, 936, 753, 815, 915, 869, 748, 910, 727, 701, 858, 754, 493, 964, 917, 870, 499, 944, 823, 702, 873, 860, 494, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 938, 755, 965, 992, 871, 750, 508, 945, 703, 861, 495, 966, 940, 757, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q161_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 266, 83, 57, 528, 162, 320, 78, 515, 273, 152, 31, 58, 268, 85, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 529, 163, 150, 321, 200, 79, 524, 153, 106, 59, 530, 269, 165, 322, 296, 113, 275, 154, 108, 208, 270, 87, 545, 61, 532, 166, 114, 324, 195, 169, 640, 519, 277, 156, 546, 304, 62, 385, 143, 91, 116, 536, 291, 170, 197, 278, 328, 224, 103, 523, 281, 386, 548, 177, 577, 93, 198, 293, 172, 120, 151, 201, 282, 525, 178, 388, 107, 578, 336, 94, 552, 294, 531, 323, 202, 297, 768, 526, 284, 155, 180, 109, 580, 392, 209, 271, 533, 167, 298, 115, 325, 204, 560, 641, 157, 352, 110, 210, 547, 305, 184, 63, 534, 584, 326, 300, 117, 537, 171, 642, 400, 279, 158, 329, 225, 306, 212, 387, 549, 118, 538, 199, 173, 330, 644, 121, 592, 226, 283, 550, 308, 179, 389, 579, 337, 216, 95, 553, 416, 540, 295, 174, 122, 332, 203, 228, 769, 648, 527, 285, 390, 181, 338, 554, 312, 581, 393, 608, 124, 299, 770, 205, 286, 561, 182, 353, 232, 111, 582, 340, 394, 211, 556, 185, 656, 535, 585, 448, 327, 206, 562, 301, 772, 643, 401, 159, 354, 307, 186, 396, 213, 586, 344, 240, 302, 119, 539, 402, 564, 331, 645, 356, 776, 593, 227, 214, 672, 551, 309, 188, 588, 217, 417, 541, 175, 646, 404, 123, 594, 333, 568, 229, 310, 649, 360, 391, 339, 218, 555, 313, 784, 418, 542, 334, 609, 125, 596, 230, 771, 650, 408, 287, 183, 233, 314, 704, 583, 341, 220, 395, 557, 420, 657, 610, 368, 126, 449, 207, 563, 773, 652, 600, 355, 234, 342, 800, 558, 316, 187, 658, 397, 587, 345, 450, 612, 424, 241, 303, 774, 403, 565, 357, 236, 777, 398, 215, 673, 189, 346, 660, 589, 242, 452, 566, 616, 647, 405, 358, 778, 595, 569, 674, 432, 311, 190, 361, 832, 590, 348, 219, 244, 785, 664, 419, 543, 406, 456, 335, 570, 780, 597, 231, 651, 409, 362, 676, 624, 315, 705, 786, 221, 421, 611, 369, 248, 127, 598, 410, 572, 653, 364, 601, 235, 706, 464, 343, 222, 801, 680, 559, 317, 788, 422, 659, 370, 451, 613, 425, 896, 775, 654, 412, 602, 802, 237, 318, 708, 399, 347, 661, 614, 372, 792, 426, 243, 453, 688, 567, 617, 480, 604, 359, 238, 779, 804, 675, 433, 191, 662, 833, 712, 591, 349, 454, 428, 245, 665, 618, 376, 407, 457, 571, 781, 434, 363, 677, 834, 350, 808, 625, 246, 787, 666, 458, 620, 249, 720, 782, 599, 411, 573, 678, 436, 626, 365, 836, 707, 465, 223, 681, 789, 668, 423, 371, 250, 460, 816, 574, 897, 655, 413, 366, 603, 466, 628, 803, 682, 440, 319, 709, 790, 840, 736, 615, 373, 252, 793, 427, 898, 414, 689, 481, 605, 239, 710, 468, 805, 684, 632, 663, 374, 713, 794, 455, 690, 429, 900, 619, 377, 848, 482, 606, 806, 435, 835, 714, 472, 351, 809, 796, 430, 247, 667, 378, 692, 459, 621, 484, 904, 721, 783, 679, 437, 810, 627, 837, 716, 669, 864, 622, 380, 251, 722, 461, 817, 696, 575, 438, 488, 367, 838, 467, 812, 629, 683, 441, 912, 791, 670, 841, 462, 737, 818, 253, 724, 899, 415, 630, 442, 711, 469, 685, 842, 633, 738, 496, 375, 254, 795, 820, 691, 901, 849, 728, 483, 607, 470, 928, 807, 686, 444, 634, 844, 715, 473, 740, 797, 431, 902, 379, 693, 850, 824, 485, 905, 474, 636, 811, 717, 798, 694, 865, 744, 623, 381, 852, 486, 906, 723, 697, 439, 489, 960, 839, 718, 476, 813, 913, 671, 866, 382, 463, 819, 698, 908, 725, 856, 490, 752, 814, 631, 443, 914, 843, 868, 739, 497, 255, 726, 821, 700, 492, 729, 471, 929, 687, 445, 916, 635, 845, 498, 741, 822, 872, 903, 851, 730, 825, 930, 446, 846, 475, 637, 742, 500, 920, 799, 695, 745, 826, 853, 732, 487, 907, 932, 880, 638, 961, 719, 477, 867, 746, 504, 383, 854, 828, 699, 909, 857, 491, 962, 478, 936, 753, 815, 915, 869, 748, 910, 727, 701, 858, 754, 493, 964, 917, 870, 499, 944, 823, 702, 873, 860, 494, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 938, 755, 965, 992, 871, 750, 508, 945, 703, 861, 495, 966, 940, 757, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q162_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 266, 83, 57, 528, 162, 320, 78, 515, 273, 152, 31, 58, 268, 85, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 529, 163, 150, 321, 200, 79, 524, 153, 106, 59, 530, 269, 165, 322, 296, 113, 275, 154, 108, 208, 270, 87, 545, 61, 532, 166, 114, 324, 195, 169, 640, 519, 277, 156, 546, 304, 62, 385, 143, 91, 116, 291, 536, 170, 197, 278, 328, 224, 103, 523, 281, 386, 548, 177, 577, 93, 198, 293, 172, 120, 151, 201, 282, 525, 178, 388, 107, 578, 336, 94, 552, 294, 531, 323, 202, 297, 768, 526, 284, 155, 180, 109, 580, 392, 209, 271, 533, 167, 298, 115, 325, 204, 560, 641, 157, 352, 110, 210, 547, 305, 184, 63, 534, 584, 326, 300, 117, 537, 171, 642, 400, 279, 158, 329, 225, 306, 212, 387, 549, 118, 538, 199, 173, 330, 644, 121, 592, 226, 283, 550, 308, 179, 389, 579, 337, 216, 95, 553, 416, 295, 540, 174, 122, 332, 203, 228, 769, 648, 527, 285, 390, 181, 338, 554, 312, 581, 393, 608, 124, 299, 770, 205, 286, 561, 182, 353, 232, 111, 582, 340, 394, 211, 556, 185, 656, 535, 585, 448, 327, 206, 562, 301, 772, 643, 401, 159, 354, 307, 186, 396, 213, 586, 344, 240, 302, 119, 539, 402, 564, 331, 645, 356, 776, 593, 227, 214, 672, 551, 309, 188, 588, 217, 417, 541, 175, 646, 404, 123, 594, 333, 568, 229, 310, 649, 360, 391, 339, 218, 555, 313, 784, 418, 542, 334, 609, 125, 596, 230, 771, 650, 408, 287, 183, 233, 314, 704, 583, 341, 220, 395, 557, 420, 657, 610, 368, 126, 449, 207, 563, 773, 652, 355, 600, 234, 342, 800, 558, 316, 187, 658, 397, 587, 345, 450, 612, 424, 241, 303, 774, 403, 565, 357, 236, 777, 398, 215, 673, 189, 346, 660, 589, 242, 452, 566, 616, 647, 405, 358, 778, 595, 569, 674, 432, 311, 190, 361, 832, 590, 348, 219, 244, 785, 419, 664, 543, 406, 456, 335, 570, 780, 597, 231, 651, 409, 362, 676, 624, 315, 705, 786, 221, 421, 611, 369, 248, 127, 598, 410, 572, 653, 364, 601, 235, 706, 464, 343, 222, 801, 680, 559, 317, 788, 422, 659, 370, 451, 613, 425, 896, 775, 654, 412, 602, 802, 237, 318, 708, 399, 347, 661, 614, 372, 792, 426, 243, 453, 688, 567, 617, 480, 359, 604, 238, 779, 804, 675, 433, 191, 662, 833, 712, 591, 349, 454, 428, 245, 665, 618, 376, 407, 457, 571, 781, 434, 363, 677, 834, 350, 808, 625, 246, 787, 666, 458, 620, 249, 720, 782, 599, 411, 573, 678, 436, 626, 365, 836, 707, 465, 223, 681, 789, 423, 668, 371, 250, 460, 816, 574, 897, 655, 413, 366, 603, 466, 628, 803, 682, 440, 319, 709, 790, 840, 736, 615, 373, 252, 793, 427, 898, 414, 689, 481, 605, 239, 710, 468, 805, 684, 632, 663, 374, 713, 794, 455, 690, 429, 900, 619, 377, 848, 482, 606, 806, 435, 835, 714, 472, 351, 809, 796, 430, 247, 667, 378, 692, 459, 621, 484, 904, 721, 783, 679, 437, 810, 627, 837, 716, 669, 864, 622, 380, 251, 722, 461, 817, 696, 575, 438, 488, 367, 838, 467, 812, 629, 683, 441, 912, 791, 670, 841, 462, 737, 818, 253, 724, 899, 415, 630, 442, 711, 469, 685, 842, 633, 738, 496, 375, 254, 795, 820, 691, 901, 849, 483, 728, 607, 470, 928, 807, 686, 444, 634, 844, 715, 473, 740, 797, 431, 902, 379, 693, 850, 824, 485, 905, 474, 636, 811, 717, 798, 694, 865, 744, 623, 381, 852, 486, 906, 723, 697, 439, 489, 960, 839, 718, 476, 813, 913, 671, 866, 382, 463, 819, 698, 908, 725, 856, 490, 752, 814, 631, 443, 914, 843, 868, 739, 497, 255, 726, 821, 700, 492, 729, 471, 929, 687, 445, 916, 635, 845, 498, 741, 822, 872, 903, 851, 730, 825, 930, 446, 846, 475, 637, 742, 500, 920, 799, 695, 745, 826, 853, 487, 732, 907, 932, 880, 638, 961, 719, 477, 867, 746, 504, 383, 854, 828, 699, 909, 857, 491, 962, 478, 936, 753, 815, 915, 869, 748, 910, 727, 701, 858, 754, 493, 964, 917, 870, 499, 944, 823, 702, 873, 860, 494, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 938, 755, 965, 992, 871, 750, 508, 945, 703, 861, 495, 966, 940, 757, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q163_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 264, 81, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 266, 83, 57, 528, 162, 320, 78, 515, 273, 152, 31, 58, 268, 85, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 529, 163, 150, 321, 200, 79, 524, 153, 106, 59, 530, 269, 165, 322, 296, 113, 275, 154, 108, 208, 270, 87, 545, 61, 532, 166, 114, 324, 195, 169, 640, 519, 277, 156, 546, 304, 62, 385, 143, 91, 116, 291, 536, 170, 197, 278, 328, 224, 103, 523, 281, 386, 548, 177, 577, 93, 198, 293, 172, 120, 151, 201, 282, 178, 525, 388, 107, 578, 336, 94, 552, 294, 531, 323, 202, 297, 768, 526, 284, 155, 180, 109, 580, 392, 209, 271, 533, 167, 298, 115, 325, 204, 560, 641, 157, 352, 110, 210, 547, 305, 184, 63, 534, 584, 326, 300, 117, 537, 171, 642, 400, 279, 158, 329, 225, 306, 212, 387, 549, 118, 538, 199, 173, 330, 644, 121, 592, 226, 283, 550, 308, 179, 389, 579, 337, 216, 95, 553, 416, 295, 540, 174, 122, 332, 203, 228, 769, 648, 527, 285, 390, 181, 338, 554, 312, 581, 393, 608, 124, 299, 770, 205, 286, 561, 182, 353, 232, 111, 582, 340, 394, 211, 556, 185, 656, 535, 585, 448, 327, 206, 562, 301, 772, 643, 401, 159, 354, 307, 186, 396, 213, 586, 344, 240, 302, 119, 539, 402, 564, 331, 645, 356, 776, 593, 227, 214, 672, 551, 309, 188, 588, 217, 417, 541, 175, 646, 404, 123, 594, 333, 568, 229, 310, 649, 360, 391, 339, 218, 555, 313, 784, 418, 542, 334, 609, 125, 596, 230, 771, 650, 408, 287, 183, 233, 314, 704, 583, 341, 220, 395, 557, 420, 657, 610, 368, 126, 449, 207, 563, 773, 652, 355, 600, 234, 342, 800, 558, 316, 187, 658, 397, 587, 345, 450, 612, 424, 241, 303, 774, 403, 565, 357, 236, 777, 398, 215, 673, 189, 346, 660, 242, 589, 452, 566, 616, 647, 405, 358, 778, 595, 569, 674, 432, 311, 190, 361, 832, 590, 348, 219, 244, 785, 419, 664, 543, 406, 456, 335, 570, 780, 597, 231, 651, 409, 362, 676, 624, 315, 705, 786, 221, 421, 611, 369, 248, 127, 598, 410, 572, 653, 364, 601, 235, 706, 464, 343, 222, 801, 680, 559, 317, 788, 422, 659, 370, 451, 613, 425, 896, 775, 654, 412, 602, 802, 237, 318, 708, 399, 347, 661, 614, 372, 792, 426, 243, 453, 688, 567, 617, 480, 359, 604, 238, 779, 804, 675, 433, 191, 662, 833, 712, 591, 349, 454, 428, 245, 665, 618, 376, 407, 457, 571, 434, 781, 363, 677, 834, 350, 808, 625, 246, 787, 666, 458, 620, 249, 720, 782, 599, 411, 573, 678, 436, 626, 365, 836, 707, 465, 223, 681, 789, 423, 668, 371, 250, 460, 816, 574, 897, 655, 413, 366, 603, 466, 628, 803, 682, 440, 319, 709, 790, 840, 736, 615, 373, 252, 793, 427, 898, 414, 689, 481, 605, 239, 710, 468, 805, 684, 632, 663, 374, 713, 794, 455, 690, 429, 900, 619, 377, 848, 482, 606, 806, 435, 835, 714, 472, 351, 809, 796, 430, 247, 667, 378, 692, 459, 621, 484, 904, 721, 783, 679, 437, 810, 627, 837, 716, 669, 864, 622, 380, 251, 722, 461, 817, 696, 575, 438, 488, 367, 838, 467, 812, 629, 683, 441, 912, 791, 670, 841, 462, 737, 818, 253, 724, 899, 415, 630, 442, 711, 469, 685, 842, 633, 738, 496, 375, 254, 795, 820, 691, 901, 849, 483, 728, 607, 470, 928, 807, 686, 444, 634, 844, 715, 473, 740, 797, 431, 902, 379, 693, 850, 824, 485, 905, 474, 636, 811, 717, 798, 694, 865, 744, 623, 381, 852, 486, 906, 723, 697, 439, 489, 960, 839, 718, 476, 813, 913, 671, 866, 382, 463, 819, 698, 908, 725, 856, 490, 752, 814, 631, 443, 914, 843, 868, 739, 497, 255, 726, 821, 700, 492, 729, 471, 929, 687, 445, 916, 635, 498, 845, 741, 822, 872, 903, 851, 730, 825, 930, 446, 846, 475, 637, 742, 500, 920, 799, 695, 745, 826, 853, 487, 732, 907, 932, 880, 638, 961, 719, 477, 867, 746, 504, 383, 854, 828, 699, 909, 857, 491, 962, 478, 936, 753, 815, 915, 869, 748, 910, 727, 701, 858, 754, 493, 964, 917, 870, 499, 944, 823, 702, 873, 860, 494, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 938, 755, 965, 992, 871, 750, 508, 945, 703, 861, 495, 966, 940, 757, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 942, 759, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q164_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 81, 264, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 83, 266, 57, 162, 528, 320, 78, 515, 273, 152, 31, 58, 85, 268, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 163, 529, 150, 321, 200, 79, 524, 153, 106, 59, 530, 269, 165, 322, 113, 296, 275, 154, 108, 208, 87, 270, 545, 61, 166, 532, 114, 324, 195, 169, 640, 519, 277, 156, 546, 304, 62, 385, 143, 91, 116, 291, 170, 536, 197, 278, 328, 224, 103, 523, 281, 386, 548, 177, 577, 93, 198, 293, 172, 120, 151, 201, 282, 178, 525, 388, 107, 578, 336, 94, 552, 294, 531, 323, 202, 297, 768, 526, 284, 155, 180, 109, 580, 209, 392, 271, 167, 533, 115, 298, 325, 204, 560, 641, 157, 352, 110, 210, 547, 305, 184, 63, 534, 584, 326, 117, 300, 171, 537, 642, 400, 279, 158, 329, 225, 306, 212, 387, 549, 118, 538, 199, 173, 330, 644, 121, 226, 592, 283, 550, 308, 179, 389, 579, 337, 216, 95, 553, 416, 295, 174, 540, 122, 332, 203, 228, 769, 648, 527, 285, 390, 181, 338, 554, 312, 581, 393, 608, 124, 299, 770, 205, 286, 561, 182, 353, 232, 111, 582, 340, 211, 394, 556, 185, 656, 535, 585, 448, 327, 206, 562, 301, 772, 643, 401, 159, 354, 307, 186, 213, 396, 586, 344, 240, 119, 302, 539, 402, 564, 331, 645, 356, 227, 593, 776, 214, 672, 551, 309, 188, 588, 217, 417, 175, 541, 646, 404, 123, 594, 333, 568, 229, 310, 649, 360, 391, 339, 218, 555, 313, 418, 784, 542, 334, 609, 125, 230, 596, 771, 650, 408, 287, 183, 233, 314, 704, 583, 341, 220, 395, 557, 420, 657, 610, 368, 126, 449, 207, 563, 773, 652, 355, 234, 600, 342, 800, 558, 316, 187, 658, 397, 587, 345, 450, 612, 241, 424, 303, 774, 403, 565, 357, 236, 777, 215, 398, 673, 189, 346, 660, 242, 589, 452, 566, 616, 647, 405, 358, 595, 778, 569, 674, 432, 311, 190, 361, 832, 590, 348, 219, 244, 419, 785, 664, 543, 406, 456, 335, 570, 231, 597, 780, 651, 409, 362, 676, 624, 315, 705, 786, 221, 421, 611, 369, 248, 127, 598, 410, 572, 653, 364, 235, 601, 706, 464, 343, 222, 801, 680, 559, 317, 422, 788, 659, 370, 451, 613, 425, 896, 775, 654, 412, 602, 802, 237, 318, 708, 399, 347, 661, 614, 372, 243, 426, 792, 453, 688, 567, 617, 480, 359, 238, 604, 779, 804, 675, 433, 191, 662, 833, 712, 591, 349, 454, 245, 428, 665, 618, 376, 407, 457, 571, 434, 781, 363, 677, 834, 350, 625, 808, 246, 787, 666, 458, 620, 249, 720, 599, 782, 411, 573, 678, 436, 626, 365, 836, 707, 465, 223, 681, 423, 789, 668, 371, 250, 460, 816, 574, 897, 655, 413, 366, 603, 466, 628, 803, 682, 440, 319, 709, 790, 840, 736, 615, 373, 252, 427, 793, 898, 414, 689, 481, 239, 605, 710, 468, 805, 684, 632, 663, 374, 713, 794, 455, 690, 429, 900, 619, 377, 482, 848, 606, 806, 435, 835, 714, 472, 351, 809, 247, 430, 796, 667, 378, 692, 459, 621, 484, 721, 904, 783, 679, 437, 627, 810, 837, 716, 669, 864, 622, 380, 251, 722, 461, 817, 696, 575, 438, 488, 367, 838, 467, 629, 812, 683, 441, 912, 791, 670, 841, 462, 737, 818, 253, 724, 899, 415, 630, 442, 711, 469, 685, 842, 633, 738, 496, 375, 254, 795, 820, 691, 901, 483, 849, 728, 607, 470, 928, 807, 686, 444, 634, 844, 715, 473, 740, 431, 797, 902, 379, 693, 850, 824, 485, 905, 474, 636, 811, 717, 798, 694, 865, 744, 623, 381, 486, 852, 723, 906, 697, 439, 489, 960, 839, 718, 476, 813, 913, 671, 866, 382, 463, 819, 698, 725, 908, 490, 856, 752, 631, 814, 443, 914, 843, 868, 739, 497, 255, 726, 821, 700, 492, 729, 471, 929, 687, 445, 916, 635, 498, 845, 741, 822, 872, 903, 851, 730, 825, 930, 446, 846, 475, 637, 742, 500, 920, 799, 695, 745, 826, 487, 853, 732, 907, 932, 880, 638, 961, 719, 477, 867, 746, 504, 383, 854, 828, 699, 909, 491, 857, 962, 478, 753, 936, 815, 915, 869, 748, 727, 910, 701, 858, 754, 493, 964, 917, 870, 499, 944, 823, 702, 873, 494, 860, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 755, 938, 965, 992, 871, 750, 508, 945, 703, 495, 861, 966, 757, 940, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 759, 942, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q165_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 81, 264, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 83, 266, 57, 162, 528, 320, 78, 515, 273, 152, 31, 58, 85, 268, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 163, 529, 150, 321, 200, 79, 524, 153, 106, 59, 530, 269, 165, 322, 113, 296, 275, 154, 108, 208, 87, 270, 545, 61, 166, 532, 114, 324, 195, 169, 640, 519, 277, 156, 546, 304, 62, 385, 143, 91, 116, 291, 170, 536, 197, 278, 328, 224, 103, 523, 281, 386, 548, 177, 577, 93, 198, 293, 172, 120, 151, 201, 282, 178, 525, 388, 107, 578, 336, 94, 552, 294, 531, 323, 202, 297, 768, 526, 284, 155, 180, 109, 580, 209, 392, 271, 167, 533, 115, 298, 325, 204, 560, 641, 157, 352, 110, 210, 547, 305, 184, 63, 534, 584, 326, 117, 300, 171, 537, 642, 400, 279, 158, 329, 225, 306, 212, 387, 549, 118, 538, 199, 173, 330, 644, 121, 226, 592, 283, 550, 308, 179, 389, 579, 337, 216, 95, 553, 416, 295, 174, 540, 122, 332, 203, 228, 769, 648, 527, 285, 390, 181, 338, 554, 312, 581, 393, 608, 124, 299, 205, 770, 286, 561, 182, 353, 232, 111, 582, 340, 211, 394, 556, 185, 656, 535, 585, 448, 327, 206, 562, 301, 772, 643, 401, 159, 354, 307, 186, 213, 396, 586, 344, 240, 119, 302, 539, 402, 564, 331, 645, 356, 227, 593, 776, 214, 672, 551, 309, 188, 588, 217, 417, 175, 541, 646, 404, 123, 594, 333, 568, 229, 310, 649, 360, 391, 339, 218, 555, 313, 418, 784, 542, 334, 609, 125, 230, 596, 771, 650, 408, 287, 183, 233, 314, 704, 583, 341, 220, 395, 557, 420, 657, 610, 368, 126, 449, 207, 563, 773, 652, 355, 234, 600, 342, 800, 558, 316, 187, 658, 397, 587, 345, 450, 612, 241, 424, 303, 774, 403, 565, 357, 236, 777, 215, 398, 673, 189, 346, 660, 242, 589, 452, 566, 616, 647, 405, 358, 595, 778, 569, 674, 432, 311, 190, 361, 832, 590, 348, 219, 244, 419, 785, 664, 543, 406, 456, 335, 570, 231, 597, 780, 651, 409, 362, 676, 624, 315, 705, 221, 786, 421, 611, 369, 248, 127, 598, 410, 572, 653, 364, 235, 601, 706, 464, 343, 222, 801, 680, 559, 317, 422, 788, 659, 370, 451, 613, 425, 896, 775, 654, 412, 602, 237, 802, 318, 708, 399, 347, 661, 614, 372, 243, 426, 792, 453, 688, 567, 617, 480, 359, 238, 604, 779, 804, 675, 433, 191, 662, 833, 712, 591, 349, 454, 245, 428, 665, 618, 376, 407, 457, 571, 434, 781, 363, 677, 834, 350, 625, 808, 246, 787, 666, 458, 620, 249, 720, 599, 782, 411, 573, 678, 436, 626, 365, 836, 707, 465, 223, 681, 423, 789, 668, 371, 250, 460, 816, 574, 897, 655, 413, 366, 603, 466, 628, 803, 682, 440, 319, 709, 790, 840, 736, 615, 373, 252, 427, 793, 898, 414, 689, 481, 239, 605, 710, 468, 805, 684, 632, 663, 374, 713, 794, 455, 690, 429, 900, 619, 377, 482, 848, 606, 806, 435, 835, 714, 472, 351, 809, 247, 430, 796, 667, 378, 692, 459, 621, 484, 721, 904, 783, 679, 437, 627, 810, 837, 716, 669, 864, 622, 380, 251, 722, 461, 817, 696, 575, 438, 488, 367, 838, 467, 629, 812, 683, 441, 912, 791, 670, 841, 462, 737, 253, 818, 724, 899, 415, 630, 442, 711, 469, 685, 842, 633, 738, 496, 375, 254, 795, 820, 691, 901, 483, 849, 728, 607, 470, 928, 807, 686, 444, 634, 844, 715, 473, 740, 431, 797, 902, 379, 693, 850, 824, 485, 905, 474, 636, 811, 717, 798, 694, 865, 744, 623, 381, 486, 852, 723, 906, 697, 439, 489, 960, 839, 718, 476, 813, 913, 671, 866, 382, 463, 819, 698, 725, 908, 490, 856, 752, 631, 814, 443, 914, 843, 868, 739, 497, 255, 726, 821, 700, 492, 729, 471, 929, 687, 445, 916, 635, 498, 845, 741, 822, 872, 903, 851, 730, 825, 930, 446, 846, 475, 637, 742, 500, 920, 799, 695, 745, 826, 487, 853, 732, 907, 932, 880, 638, 961, 719, 477, 867, 746, 504, 383, 854, 828, 699, 909, 491, 857, 962, 478, 753, 936, 815, 915, 869, 748, 727, 910, 701, 858, 754, 493, 964, 917, 870, 499, 944, 823, 702, 873, 494, 860, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 755, 938, 965, 992, 871, 750, 508, 945, 703, 495, 861, 966, 757, 940, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 759, 942, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q166_1^{1024}$=[0, 1, 2, 4, 8, 16, 3, 5, 32, 6, 9, 10, 64, 17, 12, 18, 33, 20, 128, 7, 34, 24, 11, 36, 65, 13, 66, 40, 19, 256, 14, 68, 21, 48, 129, 35, 22, 72, 25, 130, 37, 26, 132, 80, 38, 67, 41, 512, 28, 257, 136, 15, 42, 69, 96, 258, 49, 70, 44, 144, 23, 73, 50, 260, 131, 74, 27, 52, 133, 81, 264, 160, 39, 76, 513, 29, 134, 82, 56, 137, 43, 514, 272, 30, 97, 84, 259, 138, 192, 71, 45, 516, 145, 98, 51, 261, 140, 88, 288, 46, 146, 75, 100, 520, 262, 53, 265, 161, 148, 77, 54, 104, 135, 83, 266, 57, 162, 528, 320, 78, 515, 273, 152, 31, 58, 85, 268, 139, 164, 112, 193, 274, 517, 99, 86, 544, 60, 141, 89, 194, 289, 168, 47, 518, 276, 147, 101, 521, 384, 263, 142, 90, 290, 196, 149, 102, 522, 280, 176, 55, 105, 576, 92, 267, 292, 163, 529, 150, 321, 200, 79, 524, 153, 106, 59, 269, 530, 165, 322, 113, 296, 275, 154, 108, 208, 87, 270, 545, 61, 166, 532, 114, 324, 195, 169, 640, 519, 277, 156, 546, 304, 62, 385, 143, 91, 116, 291, 170, 536, 197, 278, 328, 224, 103, 523, 281, 386, 548, 177, 577, 93, 198, 293, 172, 120, 151, 201, 282, 178, 525, 388, 107, 578, 336, 94, 552, 294, 531, 323, 202, 297, 768, 526, 284, 155, 180, 109, 580, 209, 392, 271, 167, 533, 115, 298, 325, 204, 560, 641, 157, 352, 110, 210, 547, 305, 184, 63, 534, 584, 326, 117, 300, 171, 537, 642, 400, 279, 158, 329, 225, 306, 212, 387, 549, 118, 538, 199, 173, 330, 644, 121, 226, 592, 283, 550, 308, 179, 389, 579, 337, 216, 95, 553, 416, 295, 174, 540, 122, 332, 203, 228, 769, 648, 527, 285, 390, 181, 338, 554, 312, 581, 393, 608, 124, 299, 205, 770, 286, 561, 182, 353, 232, 111, 582, 340, 211, 394, 556, 185, 656, 535, 585, 448, 327, 206, 301, 562, 772, 643, 401, 159, 354, 307, 186, 213, 396, 586, 344, 240, 119, 302, 539, 402, 564, 331, 645, 356, 227, 593, 776, 214, 672, 551, 309, 188, 588, 217, 417, 175, 541, 646, 404, 123, 333, 594, 568, 229, 310, 649, 360, 391, 339, 218, 555, 313, 418, 784, 542, 334, 609, 125, 230, 596, 771, 650, 408, 287, 183, 233, 314, 704, 583, 341, 220, 395, 557, 420, 657, 610, 368, 126, 449, 207, 563, 773, 652, 355, 234, 600, 342, 800, 558, 316, 187, 397, 658, 587, 345, 450, 612, 241, 424, 303, 774, 403, 565, 357, 236, 777, 215, 398, 673, 189, 346, 660, 242, 589, 452, 566, 616, 647, 405, 358, 595, 778, 569, 674, 432, 311, 190, 361, 832, 590, 348, 219, 244, 419, 785, 664, 543, 406, 456, 335, 570, 231, 597, 780, 651, 409, 362, 676, 624, 315, 705, 221, 786, 421, 611, 369, 248, 127, 598, 410, 572, 653, 364, 235, 601, 706, 464, 343, 222, 801, 680, 559, 317, 422, 788, 659, 370, 451, 613, 425, 896, 775, 654, 412, 602, 237, 802, 318, 708, 399, 347, 661, 614, 372, 243, 426, 792, 453, 688, 567, 617, 480, 359, 238, 604, 779, 804, 675, 433, 191, 662, 833, 712, 591, 349, 454, 245, 428, 665, 618, 376, 407, 457, 571, 434, 781, 363, 677, 834, 350, 625, 808, 246, 787, 666, 458, 620, 249, 720, 599, 782, 411, 573, 678, 436, 365, 626, 836, 707, 465, 223, 681, 423, 789, 668, 371, 250, 460, 816, 574, 897, 655, 413, 366, 603, 466, 628, 803, 682, 440, 319, 709, 790, 840, 736, 615, 373, 252, 427, 793, 898, 414, 689, 481, 239, 605, 710, 468, 805, 684, 632, 663, 374, 713, 794, 455, 429, 690, 900, 619, 377, 482, 848, 606, 806, 435, 835, 714, 472, 351, 809, 247, 430, 796, 667, 378, 692, 459, 621, 484, 721, 904, 783, 679, 437, 627, 810, 837, 716, 669, 864, 622, 380, 251, 461, 722, 817, 696, 575, 438, 488, 367, 838, 467, 629, 812, 683, 441, 912, 791, 670, 841, 462, 737, 253, 818, 724, 899, 415, 630, 442, 711, 469, 685, 842, 633, 738, 496, 375, 254, 795, 820, 691, 901, 483, 849, 728, 607, 470, 928, 807, 686, 444, 634, 844, 715, 473, 740, 431, 797, 902, 379, 693, 850, 824, 485, 905, 474, 636, 811, 717, 798, 694, 865, 744, 623, 381, 486, 852, 723, 906, 697, 439, 489, 960, 839, 718, 476, 813, 913, 671, 866, 382, 463, 819, 698, 725, 908, 490, 856, 752, 631, 814, 443, 914, 843, 868, 739, 497, 255, 726, 821, 700, 492, 729, 471, 929, 687, 445, 916, 635, 498, 845, 741, 822, 872, 903, 851, 730, 825, 930, 446, 846, 475, 637, 742, 500, 920, 799, 695, 745, 826, 487, 853, 732, 907, 932, 880, 638, 961, 719, 477, 867, 746, 504, 383, 854, 828, 699, 909, 491, 857, 962, 478, 753, 936, 815, 915, 869, 748, 727, 910, 701, 858, 493, 754, 964, 917, 870, 499, 944, 823, 702, 873, 494, 860, 731, 756, 931, 447, 918, 968, 847, 743, 501, 921, 874, 827, 733, 933, 881, 760, 639, 502, 922, 876, 747, 505, 976, 855, 734, 829, 934, 882, 963, 479, 937, 924, 506, 749, 830, 911, 859, 884, 755, 938, 965, 992, 871, 750, 508, 945, 703, 495, 861, 966, 757, 940, 888, 919, 969, 946, 875, 862, 758, 970, 761, 503, 923, 948, 877, 977, 735, 935, 883, 762, 972, 925, 878, 507, 978, 952, 831, 885, 764, 939, 926, 993, 751, 509, 980, 886, 967, 941, 889, 994, 510, 947, 984, 863, 759, 942, 890, 971, 996, 949, 892, 763, 973, 950, 1000, 879, 979, 953, 974, 765, 927, 954, 981, 1008, 887, 766, 995, 511, 982, 956, 985, 943, 891, 997, 986, 893, 998, 951, 1001, 988, 894, 975, 1002, 955, 1009, 767, 1004, 983, 957, 1010, 958, 987, 1012, 999, 989, 1016, 895, 1003, 990, 1005, 1011, 1006, 959, 1013, 1014, 1017, 991, 1018, 1020, 1007, 1015, 1019, 1021, 1022, 1023];

$Q167_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 104, 135, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 208, 270, 61, 545, 166, 532, 114, 324, 195, 169, 156, 277, 519, 640, 62, 304, 546, 143, 385, 91, 116, 170, 291, 536, 197, 278, 328, 103, 224, 281, 523, 386, 548, 177, 93, 577, 198, 172, 293, 120, 151, 201, 282, 178, 525, 388, 107, 94, 336, 578, 552, 294, 531, 202, 323, 297, 284, 526, 768, 155, 180, 109, 580, 209, 271, 392, 167, 533, 115, 298, 204, 325, 560, 157, 641, 110, 352, 210, 63, 184, 305, 547, 534, 584, 326, 117, 300, 171, 537, 158, 279, 400, 642, 329, 225, 306, 212, 387, 549, 118, 538, 199, 173, 330, 644, 121, 226, 592, 283, 308, 550, 179, 389, 95, 216, 337, 579, 553, 174, 295, 416, 540, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 772, 159, 401, 643, 354, 186, 307, 213, 396, 344, 586, 119, 240, 302, 539, 402, 564, 331, 645, 356, 227, 593, 776, 214, 188, 309, 551, 672, 588, 217, 175, 417, 541, 404, 646, 123, 333, 594, 568, 229, 310, 649, 360, 391, 218, 339, 313, 555, 418, 542, 784, 334, 125, 609, 230, 596, 287, 408, 650, 771, 183, 233, 314, 220, 341, 583, 704, 395, 557, 420, 657, 126, 368, 610, 207, 449, 563, 652, 773, 234, 355, 600, 342, 316, 558, 800, 187, 397, 658, 345, 587, 450, 612, 241, 303, 424, 774, 403, 565, 236, 357, 777, 215, 398, 189, 673, 346, 660, 242, 589, 452, 566, 616, 405, 647, 358, 595, 778, 569, 190, 311, 432, 674, 361, 348, 590, 832, 219, 244, 419, 543, 664, 785, 406, 335, 456, 570, 231, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 792, 453, 567, 688, 617, 238, 359, 480, 604, 779, 804, 191, 433, 675, 662, 349, 591, 712, 833, 454, 245, 428, 665, 376, 618, 407, 457, 571, 434, 781, 363, 677, 350, 834, 625, 808, 246, 666, 787, 458, 620, 249, 599, 720, 782, 411, 573, 436, 678, 365, 626, 836, 223, 465, 707, 681, 423, 668, 789, 250, 371, 460, 574, 816, 413, 655, 897, 366, 603, 466, 628, 319, 440, 682, 803, 709, 790, 840, 252, 373, 615, 736, 427, 793, 414, 898, 689, 239, 481, 605, 468, 710, 684, 805, 632, 663, 374, 713, 794, 455, 429, 690, 900, 377, 619, 482, 606, 848, 806, 435, 351, 472, 714, 835, 809, 247, 430, 796, 667, 378, 692, 459, 621, 484, 721, 783, 904, 437, 679, 627, 810, 716, 837, 669, 380, 622, 864, 251, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 483, 607, 728, 849, 470, 444, 686, 807, 928, 634, 844, 473, 715, 740, 431, 797, 902, 379, 693, 850, 824, 485, 905, 474, 636, 811, 717, 798, 694, 381, 623, 744, 865, 486, 852, 723, 906, 697, 439, 489, 476, 718, 839, 960, 813, 671, 913, 382, 866, 463, 698, 819, 725, 908, 490, 856, 631, 752, 814, 443, 914, 843, 868, 255, 497, 739, 726, 700, 821, 492, 729, 471, 445, 687, 929, 916, 635, 498, 845, 741, 822, 872, 903, 730, 851, 825, 446, 930, 846, 475, 637, 500, 742, 799, 920, 695, 745, 826, 487, 732, 853, 907, 932, 638, 880, 477, 719, 961, 383, 504, 746, 867, 854, 828, 699, 909, 491, 857, 478, 962, 753, 815, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 888, 919, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q168_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 104, 135, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 208, 270, 61, 545, 166, 532, 114, 324, 195, 169, 156, 277, 519, 640, 62, 304, 546, 143, 385, 91, 116, 170, 291, 536, 197, 278, 328, 103, 224, 281, 523, 386, 548, 177, 93, 577, 198, 172, 293, 120, 151, 201, 282, 178, 525, 388, 107, 94, 336, 578, 552, 294, 531, 202, 323, 297, 284, 526, 768, 155, 180, 109, 580, 209, 271, 392, 167, 533, 115, 298, 204, 325, 560, 157, 641, 110, 352, 210, 63, 184, 305, 547, 534, 584, 326, 117, 300, 171, 537, 158, 279, 400, 642, 329, 225, 306, 212, 387, 549, 118, 538, 199, 173, 330, 121, 644, 226, 592, 283, 308, 550, 179, 389, 95, 216, 337, 579, 553, 174, 295, 416, 540, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 772, 159, 401, 643, 354, 186, 307, 213, 396, 344, 586, 119, 240, 302, 539, 402, 564, 331, 645, 356, 227, 593, 776, 214, 188, 309, 551, 672, 588, 217, 175, 417, 541, 404, 123, 646, 333, 594, 568, 229, 310, 649, 360, 391, 218, 339, 313, 555, 418, 542, 784, 334, 125, 609, 230, 596, 287, 408, 650, 771, 183, 233, 314, 220, 341, 583, 704, 395, 557, 420, 657, 126, 368, 610, 207, 449, 563, 652, 773, 234, 355, 600, 342, 316, 558, 800, 187, 397, 658, 345, 587, 450, 612, 241, 303, 424, 774, 403, 565, 236, 357, 777, 215, 398, 189, 673, 346, 660, 242, 589, 452, 566, 616, 405, 647, 358, 595, 778, 569, 190, 311, 432, 674, 361, 348, 590, 832, 219, 244, 419, 543, 664, 785, 406, 335, 456, 570, 231, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 792, 453, 567, 688, 617, 238, 359, 480, 604, 779, 804, 191, 433, 675, 662, 349, 591, 712, 833, 454, 245, 428, 665, 376, 618, 407, 457, 571, 434, 781, 363, 677, 350, 834, 625, 808, 246, 666, 787, 458, 620, 249, 599, 720, 782, 411, 573, 436, 678, 365, 626, 836, 223, 465, 707, 681, 423, 668, 789, 250, 371, 460, 574, 816, 413, 655, 897, 366, 603, 466, 628, 319, 440, 682, 803, 709, 790, 840, 252, 373, 615, 736, 427, 793, 414, 898, 689, 239, 481, 605, 468, 710, 684, 805, 632, 663, 374, 713, 794, 455, 429, 690, 377, 900, 619, 482, 606, 848, 806, 435, 351, 472, 714, 835, 809, 247, 430, 796, 667, 378, 692, 459, 621, 484, 721, 783, 904, 437, 679, 627, 810, 716, 837, 669, 380, 622, 864, 251, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 483, 607, 728, 849, 470, 444, 686, 807, 928, 634, 844, 473, 715, 740, 431, 797, 379, 902, 693, 850, 824, 485, 905, 474, 636, 811, 717, 798, 694, 381, 623, 744, 865, 486, 852, 723, 906, 697, 439, 489, 476, 718, 839, 960, 813, 671, 913, 382, 866, 463, 698, 819, 725, 908, 490, 856, 631, 752, 814, 443, 914, 843, 868, 255, 497, 739, 726, 700, 821, 492, 729, 471, 445, 687, 929, 916, 635, 498, 845, 741, 822, 872, 903, 730, 851, 825, 446, 930, 846, 475, 637, 500, 742, 799, 920, 695, 745, 826, 487, 732, 853, 907, 932, 638, 880, 477, 719, 961, 383, 504, 746, 867, 854, 828, 699, 909, 491, 857, 478, 962, 753, 815, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 888, 919, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q169_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 104, 135, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 208, 270, 61, 545, 166, 532, 114, 324, 195, 169, 156, 277, 519, 640, 62, 304, 546, 143, 385, 91, 116, 170, 291, 536, 197, 278, 328, 103, 224, 281, 523, 386, 548, 177, 93, 577, 198, 172, 293, 120, 151, 201, 282, 178, 525, 107, 388, 94, 336, 578, 552, 294, 531, 202, 323, 297, 284, 526, 155, 768, 180, 109, 580, 209, 271, 392, 167, 533, 115, 298, 204, 325, 560, 157, 110, 641, 352, 210, 63, 184, 305, 547, 534, 584, 326, 117, 300, 171, 537, 158, 279, 400, 642, 329, 225, 306, 212, 387, 549, 118, 538, 199, 173, 330, 121, 644, 226, 592, 283, 308, 550, 179, 389, 95, 216, 337, 579, 553, 174, 295, 416, 540, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 159, 772, 401, 643, 354, 186, 307, 213, 396, 344, 586, 119, 240, 302, 539, 402, 564, 331, 645, 356, 227, 593, 214, 776, 188, 309, 551, 672, 588, 217, 175, 417, 541, 123, 404, 646, 333, 594, 568, 229, 310, 649, 360, 391, 218, 339, 313, 555, 418, 542, 784, 334, 125, 609, 230, 596, 287, 408, 650, 771, 183, 233, 314, 220, 341, 583, 704, 395, 557, 420, 126, 657, 368, 610, 207, 449, 563, 652, 773, 234, 355, 600, 342, 316, 558, 187, 800, 397, 658, 345, 587, 450, 612, 241, 303, 424, 774, 403, 565, 236, 357, 215, 777, 398, 189, 673, 346, 660, 242, 589, 452, 566, 405, 616, 647, 358, 595, 778, 569, 190, 311, 432, 674, 361, 348, 590, 219, 832, 244, 419, 543, 664, 785, 406, 335, 456, 570, 231, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 792, 453, 567, 688, 617, 238, 359, 480, 604, 779, 191, 804, 433, 675, 662, 349, 591, 712, 833, 454, 245, 428, 665, 376, 407, 618, 457, 571, 434, 781, 363, 677, 350, 834, 625, 246, 808, 666, 787, 458, 620, 249, 599, 720, 782, 411, 573, 436, 678, 365, 626, 223, 836, 465, 707, 681, 423, 668, 789, 250, 371, 460, 574, 816, 413, 655, 366, 897, 603, 466, 628, 319, 440, 682, 803, 709, 790, 840, 252, 373, 615, 736, 427, 793, 414, 898, 689, 239, 481, 605, 468, 710, 684, 805, 632, 663, 374, 713, 794, 455, 429, 690, 377, 619, 900, 482, 606, 848, 806, 435, 351, 472, 714, 835, 247, 809, 430, 796, 667, 378, 692, 459, 621, 484, 721, 783, 904, 437, 679, 627, 810, 716, 837, 669, 380, 622, 251, 864, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 483, 607, 728, 849, 470, 444, 686, 807, 928, 634, 844, 473, 715, 740, 431, 797, 379, 902, 693, 850, 824, 485, 905, 474, 636, 811, 717, 798, 694, 381, 623, 744, 865, 486, 852, 723, 906, 697, 439, 489, 476, 718, 839, 960, 813, 671, 382, 913, 866, 463, 698, 819, 725, 908, 490, 856, 631, 752, 814, 443, 914, 843, 255, 868, 497, 739, 726, 700, 821, 492, 729, 471, 445, 687, 929, 635, 916, 498, 845, 741, 822, 872, 903, 730, 851, 825, 446, 930, 846, 475, 637, 500, 742, 799, 920, 695, 745, 826, 487, 732, 853, 907, 932, 638, 880, 477, 719, 961, 383, 504, 746, 867, 854, 828, 699, 909, 491, 857, 478, 962, 753, 815, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 888, 919, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q170_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 104, 135, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 208, 270, 61, 545, 166, 532, 114, 324, 195, 169, 156, 277, 519, 640, 62, 304, 546, 143, 385, 91, 116, 170, 291, 536, 197, 278, 328, 103, 224, 281, 523, 386, 548, 177, 93, 577, 198, 172, 293, 120, 151, 201, 282, 178, 525, 107, 388, 94, 336, 578, 552, 294, 531, 202, 323, 297, 284, 526, 155, 768, 180, 109, 580, 209, 271, 392, 167, 533, 115, 298, 204, 325, 560, 157, 110, 641, 352, 210, 63, 184, 305, 547, 534, 584, 326, 117, 300, 171, 537, 158, 279, 400, 642, 329, 225, 306, 212, 387, 549, 118, 538, 199, 173, 330, 121, 644, 226, 592, 283, 308, 550, 179, 389, 95, 216, 337, 579, 553, 174, 295, 416, 540, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 159, 772, 401, 643, 354, 186, 307, 213, 396, 344, 586, 119, 240, 302, 539, 402, 564, 331, 645, 356, 227, 593, 214, 776, 188, 309, 551, 672, 588, 217, 175, 417, 541, 123, 404, 646, 333, 594, 568, 229, 310, 649, 360, 391, 218, 339, 313, 555, 418, 542, 784, 334, 125, 609, 230, 596, 287, 408, 650, 771, 183, 233, 314, 220, 341, 583, 704, 395, 557, 420, 126, 657, 368, 610, 207, 449, 563, 652, 773, 234, 355, 600, 342, 316, 558, 187, 800, 397, 658, 345, 587, 450, 612, 241, 303, 424, 774, 403, 565, 236, 357, 215, 777, 398, 189, 346, 673, 660, 242, 589, 452, 566, 405, 616, 647, 358, 595, 778, 569, 190, 311, 432, 674, 361, 348, 590, 219, 832, 244, 419, 543, 664, 785, 406, 335, 456, 570, 231, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 792, 453, 567, 688, 617, 238, 359, 480, 604, 779, 191, 804, 433, 675, 662, 349, 591, 712, 833, 454, 245, 428, 665, 376, 407, 618, 457, 571, 434, 781, 363, 350, 677, 834, 625, 246, 808, 666, 787, 458, 620, 249, 599, 720, 782, 411, 573, 436, 678, 365, 626, 223, 836, 465, 707, 681, 423, 668, 789, 250, 371, 460, 574, 816, 413, 655, 366, 897, 603, 466, 628, 319, 440, 682, 803, 709, 790, 840, 252, 373, 615, 736, 427, 793, 414, 898, 689, 239, 481, 605, 468, 710, 684, 805, 632, 663, 374, 713, 794, 455, 429, 690, 377, 619, 900, 482, 606, 848, 806, 435, 351, 472, 714, 835, 247, 809, 430, 796, 667, 378, 692, 459, 621, 484, 721, 783, 904, 437, 679, 627, 810, 716, 837, 669, 380, 622, 251, 864, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 483, 607, 728, 849, 470, 444, 686, 807, 928, 634, 844, 473, 715, 740, 431, 797, 379, 902, 693, 850, 824, 485, 905, 474, 636, 811, 717, 798, 694, 381, 623, 744, 865, 486, 852, 723, 906, 697, 439, 489, 476, 718, 839, 960, 813, 671, 382, 913, 866, 463, 698, 819, 725, 908, 490, 856, 631, 752, 814, 443, 914, 843, 255, 868, 497, 739, 726, 700, 821, 492, 729, 471, 445, 687, 929, 635, 916, 498, 845, 741, 822, 872, 903, 730, 851, 825, 446, 930, 846, 475, 637, 500, 742, 799, 920, 695, 745, 826, 487, 732, 853, 907, 932, 638, 880, 477, 719, 961, 383, 504, 746, 867, 854, 828, 699, 909, 491, 857, 478, 962, 753, 815, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 888, 919, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q171_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 135, 104, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 270, 208, 61, 545, 166, 532, 114, 324, 195, 169, 156, 277, 519, 640, 62, 304, 546, 143, 385, 91, 116, 170, 291, 536, 197, 278, 328, 103, 224, 281, 523, 386, 548, 177, 93, 577, 198, 172, 293, 151, 120, 201, 282, 178, 525, 107, 388, 94, 336, 578, 552, 294, 531, 202, 323, 297, 284, 526, 155, 768, 180, 109, 580, 271, 209, 392, 167, 533, 115, 298, 204, 325, 560, 157, 110, 641, 352, 210, 63, 184, 305, 547, 534, 584, 326, 117, 300, 171, 537, 158, 279, 400, 642, 329, 225, 306, 212, 387, 549, 118, 538, 199, 173, 330, 121, 644, 226, 592, 283, 308, 550, 179, 389, 95, 216, 337, 579, 553, 174, 295, 540, 416, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 159, 772, 401, 643, 354, 186, 307, 213, 396, 344, 586, 119, 302, 240, 539, 402, 564, 331, 645, 356, 227, 593, 214, 776, 188, 309, 551, 672, 588, 217, 175, 541, 417, 123, 404, 646, 333, 594, 568, 229, 310, 649, 391, 360, 218, 339, 313, 555, 542, 418, 784, 334, 125, 609, 230, 596, 287, 408, 650, 771, 183, 233, 314, 220, 341, 583, 704, 395, 557, 420, 126, 657, 368, 610, 207, 449, 563, 652, 773, 234, 355, 600, 342, 316, 558, 187, 800, 397, 658, 345, 587, 450, 612, 303, 241, 424, 774, 403, 565, 236, 357, 215, 777, 398, 189, 346, 673, 660, 242, 589, 452, 566, 405, 647, 616, 358, 595, 778, 569, 190, 311, 432, 674, 361, 348, 590, 219, 832, 244, 543, 419, 664, 785, 406, 335, 456, 570, 231, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 792, 453, 567, 688, 617, 238, 359, 604, 480, 779, 191, 804, 433, 675, 662, 349, 591, 712, 833, 454, 245, 428, 665, 407, 376, 618, 457, 571, 434, 781, 363, 350, 677, 834, 625, 246, 808, 666, 787, 458, 620, 249, 599, 782, 720, 411, 573, 436, 678, 365, 626, 223, 836, 465, 707, 681, 423, 668, 789, 250, 371, 460, 574, 816, 413, 655, 366, 897, 603, 466, 628, 319, 440, 682, 803, 709, 790, 840, 252, 373, 615, 736, 427, 793, 414, 898, 689, 239, 605, 481, 468, 710, 684, 805, 663, 632, 374, 713, 794, 455, 429, 690, 377, 619, 900, 606, 482, 848, 806, 435, 351, 472, 714, 835, 247, 809, 430, 796, 667, 378, 692, 459, 621, 484, 783, 721, 904, 437, 679, 627, 810, 716, 837, 669, 380, 622, 251, 864, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 607, 483, 728, 849, 470, 444, 686, 807, 928, 634, 844, 473, 715, 740, 431, 797, 379, 902, 693, 850, 824, 485, 905, 474, 636, 811, 717, 798, 694, 381, 623, 744, 865, 486, 852, 723, 906, 697, 439, 489, 476, 718, 839, 960, 813, 671, 382, 913, 866, 463, 698, 819, 725, 908, 490, 856, 631, 814, 752, 443, 914, 843, 255, 868, 497, 739, 726, 700, 821, 492, 729, 471, 445, 687, 929, 635, 916, 498, 845, 741, 822, 903, 872, 730, 851, 825, 446, 930, 846, 475, 637, 500, 742, 799, 920, 695, 745, 826, 487, 732, 853, 907, 932, 638, 880, 477, 719, 961, 383, 504, 746, 867, 854, 828, 699, 909, 491, 857, 478, 962, 815, 753, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 919, 888, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q172_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 516, 145, 98, 51, 140, 261, 88, 46, 288, 146, 75, 100, 520, 262, 53, 265, 161, 148, 77, 54, 135, 104, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 518, 147, 101, 521, 142, 263, 384, 90, 290, 196, 149, 102, 280, 522, 55, 176, 105, 92, 576, 267, 292, 163, 529, 150, 79, 200, 321, 524, 153, 106, 59, 269, 530, 165, 322, 113, 296, 154, 275, 108, 87, 270, 208, 61, 545, 166, 532, 114, 324, 195, 169, 156, 277, 519, 640, 62, 304, 546, 143, 385, 91, 116, 170, 291, 197, 536, 278, 328, 103, 224, 281, 523, 386, 548, 177, 93, 577, 198, 172, 293, 151, 120, 201, 282, 178, 525, 107, 388, 94, 336, 578, 552, 294, 531, 202, 323, 297, 284, 526, 155, 768, 180, 109, 580, 271, 209, 392, 167, 533, 115, 298, 204, 325, 560, 157, 110, 641, 352, 210, 63, 184, 305, 547, 534, 584, 326, 117, 300, 171, 537, 158, 279, 400, 642, 329, 225, 306, 212, 387, 549, 118, 199, 538, 173, 330, 121, 644, 226, 592, 283, 308, 550, 179, 389, 95, 216, 337, 579, 553, 174, 295, 540, 416, 122, 332, 203, 228, 285, 527, 648, 769, 390, 181, 338, 312, 554, 581, 393, 124, 608, 299, 205, 286, 770, 561, 182, 111, 232, 353, 340, 582, 211, 394, 556, 185, 535, 656, 585, 206, 327, 448, 301, 562, 159, 772, 401, 643, 354, 186, 307, 213, 396, 344, 586, 119, 302, 240, 539, 402, 564, 331, 645, 356, 227, 593, 214, 776, 188, 309, 551, 672, 588, 217, 175, 541, 417, 123, 404, 646, 333, 594, 229, 568, 310, 649, 391, 360, 218, 339, 313, 555, 542, 418, 784, 334, 125, 609, 230, 596, 287, 408, 650, 771, 183, 233, 314, 220, 341, 583, 704, 395, 557, 420, 126, 657, 368, 610, 207, 449, 563, 652, 773, 234, 355, 600, 342, 316, 558, 187, 800, 397, 658, 345, 587, 450, 612, 303, 241, 424, 774, 403, 565, 236, 357, 215, 777, 398, 189, 346, 673, 660, 242, 589, 452, 566, 405, 647, 616, 358, 595, 778, 569, 190, 311, 432, 674, 361, 348, 590, 219, 832, 244, 543, 419, 664, 785, 406, 335, 456, 231, 570, 597, 780, 409, 651, 362, 676, 624, 315, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 708, 399, 347, 661, 372, 614, 243, 426, 453, 792, 567, 688, 617, 238, 359, 604, 480, 779, 191, 804, 433, 675, 662, 349, 591, 712, 833, 454, 245, 428, 665, 407, 376, 618, 457, 571, 434, 781, 363, 350, 677, 834, 625, 246, 808, 666, 787, 458, 620, 249, 599, 782, 720, 411, 573, 436, 678, 365, 626, 223, 836, 465, 707, 681, 423, 668, 789, 250, 371, 460, 574, 816, 413, 655, 366, 897, 603, 466, 628, 319, 440, 682, 803, 709, 790, 840, 252, 373, 615, 736, 427, 793, 414, 898, 689, 239, 605, 481, 468, 710, 684, 805, 663, 632, 374, 713, 455, 794, 429, 690, 377, 619, 900, 606, 482, 848, 806, 435, 351, 472, 714, 835, 247, 809, 430, 796, 667, 378, 692, 459, 621, 484, 783, 721, 904, 437, 679, 627, 810, 716, 837, 669, 380, 622, 251, 864, 461, 722, 575, 696, 817, 438, 367, 488, 838, 467, 629, 812, 441, 683, 670, 791, 912, 841, 462, 253, 737, 818, 724, 415, 899, 630, 442, 469, 711, 685, 842, 633, 254, 375, 496, 738, 795, 820, 691, 901, 607, 483, 728, 849, 470, 444, 686, 807, 928, 634, 844, 473, 715, 740, 431, 797, 379, 902, 693, 850, 485, 824, 905, 474, 636, 811, 717, 798, 694, 381, 623, 744, 865, 486, 852, 723, 906, 697, 439, 489, 476, 718, 839, 960, 813, 671, 382, 913, 866, 463, 698, 819, 725, 908, 490, 856, 631, 814, 752, 443, 914, 843, 255, 868, 497, 739, 726, 700, 821, 492, 729, 471, 445, 687, 929, 635, 916, 498, 845, 741, 822, 903, 872, 730, 851, 825, 446, 930, 846, 475, 637, 500, 742, 799, 920, 695, 745, 487, 826, 732, 853, 907, 932, 638, 880, 477, 719, 961, 383, 504, 746, 867, 854, 828, 699, 909, 491, 857, 478, 962, 815, 753, 936, 915, 748, 869, 727, 910, 701, 858, 493, 754, 964, 917, 870, 499, 702, 823, 944, 873, 494, 860, 731, 756, 447, 931, 918, 847, 968, 501, 743, 921, 874, 827, 733, 933, 639, 760, 881, 502, 922, 876, 505, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 919, 888, 969, 946, 875, 862, 758, 970, 761, 503, 923, 948, 877, 735, 977, 935, 762, 883, 972, 925, 878, 507, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q173_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 513, 134, 82, 56, 137, 43, 30, 272, 514, 97, 84, 138, 259, 71, 192, 45, 145, 516, 98, 51, 140, 261, 88, 46, 288, 146, 75, 100, 520, 262, 53, 265, 161, 148, 77, 54, 135, 104, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 147, 518, 101, 521, 142, 263, 384, 90, 290, 196, 149, 102, 280, 522, 55, 176, 105, 92, 267, 576, 292, 163, 529, 150, 79, 200, 321, 153, 524, 106, 59, 269, 530, 165, 322, 113, 296, 154, 275, 108, 87, 270, 208, 61, 545, 166, 532, 114, 324, 195, 169, 156, 277, 519, 640, 62, 304, 546, 143, 385, 91, 116, 170, 291, 197, 536, 278, 328, 103, 224, 281, 523, 386, 177, 548, 93, 577, 198, 172, 293, 151, 120, 201, 282, 178, 525, 107, 388, 94, 336, 578, 552, 294, 531, 202, 323, 297, 284, 155, 526, 768, 180, 109, 271, 209, 580, 392, 167, 533, 115, 298, 204, 325, 560, 157, 110, 641, 352, 210, 63, 184, 305, 547, 534, 584, 326, 117, 300, 171, 537, 158, 279, 400, 642, 329, 225, 306, 212, 387, 549, 118, 199, 538, 173, 330, 121, 644, 226, 283, 592, 308, 179, 550, 389, 95, 216, 337, 579, 553, 174, 295, 540, 416, 122, 332, 203, 228, 285, 527, 648, 769, 390, 181, 338, 312, 554, 581, 393, 124, 299, 608, 205, 286, 770, 561, 182, 111, 232, 353, 340, 211, 582, 394, 185, 556, 535, 656, 585, 206, 327, 448, 301, 562, 159, 401, 772, 643, 354, 186, 307, 213, 396, 344, 586, 119, 302, 240, 539, 402, 564, 331, 645, 356, 227, 593, 214, 776, 188, 309, 551, 672, 217, 588, 175, 541, 417, 123, 404, 646, 333, 594, 229, 568, 310, 649, 391, 360, 218, 339, 313, 555, 542, 418, 784, 334, 125, 609, 230, 287, 596, 408, 650, 771, 183, 233, 314, 220, 341, 583, 395, 704, 557, 420, 126, 657, 368, 610, 207, 449, 563, 652, 773, 234, 355, 600, 342, 316, 187, 558, 800, 397, 658, 345, 587, 450, 303, 241, 612, 424, 403, 774, 565, 236, 357, 215, 777, 398, 189, 346, 673, 660, 242, 589, 452, 566, 405, 647, 616, 358, 595, 778, 569, 190, 311, 432, 674, 361, 348, 219, 590, 832, 244, 543, 419, 664, 785, 406, 335, 456, 231, 570, 597, 409, 780, 651, 362, 676, 315, 624, 221, 705, 786, 421, 127, 248, 369, 611, 598, 410, 572, 653, 364, 235, 601, 222, 343, 464, 706, 317, 559, 680, 801, 422, 788, 659, 370, 451, 613, 425, 412, 654, 775, 896, 602, 237, 318, 802, 399, 708, 347, 661, 372, 243, 614, 426, 453, 792, 567, 688, 617, 238, 359, 604, 480, 779, 191, 433, 804, 675, 662, 349, 591, 712, 833, 454, 245, 428, 665, 407, 376, 618, 457, 571, 434, 781, 363, 350, 677, 834, 625, 246, 808, 666, 787, 458, 249, 620, 599, 411, 782, 720, 573, 436, 678, 365, 626, 223, 465, 836, 707, 681, 423, 668, 789, 250, 371, 460, 574, 816, 413, 655, 366, 897, 603, 466, 319, 628, 440, 682, 803, 709, 790, 840, 252, 373, 615, 427, 736, 793, 414, 898, 689, 239, 605, 481, 468, 710, 684, 805, 663, 632, 374, 713, 455, 794, 429, 690, 377, 619, 900, 606, 482, 848, 435, 806, 351, 472, 714, 835, 247, 809, 430, 796, 667, 378, 692, 459, 621, 484, 783, 721, 904, 437, 679, 627, 810, 716, 837, 669, 380, 251, 622, 864, 461, 722, 575, 696, 817, 438, 367, 488, 467, 838, 629, 441, 812, 683, 670, 791, 912, 841, 462, 253, 737, 818, 415, 724, 899, 630, 442, 469, 711, 685, 842, 633, 254, 375, 496, 738, 795, 820, 691, 901, 607, 483, 728, 849, 470, 444, 686, 807, 928, 634, 473, 844, 715, 431, 740, 797, 379, 902, 693, 850, 485, 824, 905, 474, 636, 811, 717, 798, 694, 381, 623, 744, 865, 486, 852, 723, 906, 697, 439, 489, 476, 718, 839, 960, 813, 671, 382, 913, 866, 463, 698, 819, 725, 908, 490, 856, 631, 443, 814, 752, 914, 843, 255, 497, 868, 739, 726, 700, 821, 492, 729, 471, 445, 687, 929, 635, 916, 498, 845, 741, 822, 903, 872, 730, 851, 825, 446, 930, 475, 846, 637, 500, 742, 799, 920, 695, 745, 487, 826, 732, 853, 907, 932, 638, 880, 477, 719, 961, 383, 504, 746, 867, 854, 828, 699, 909, 491, 857, 478, 962, 815, 753, 936, 915, 748, 869, 727, 910, 701, 858, 493, 754, 964, 917, 499, 870, 702, 823, 944, 873, 494, 860, 731, 447, 756, 931, 918, 847, 968, 501, 743, 921, 874, 827, 733, 933, 639, 760, 881, 502, 922, 505, 876, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 919, 888, 969, 946, 875, 862, 758, 970, 761, 503, 923, 948, 877, 735, 977, 935, 762, 883, 972, 925, 507, 878, 978, 831, 952, 764, 885, 939, 926, 509, 751, 993, 980, 886, 967, 941, 889, 510, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q174_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 134, 513, 82, 56, 137, 43, 30, 272, 514, 97, 84, 138, 259, 71, 192, 45, 145, 516, 98, 51, 140, 261, 88, 46, 288, 146, 75, 100, 520, 262, 53, 265, 161, 148, 77, 54, 135, 104, 83, 266, 57, 162, 528, 78, 320, 31, 152, 273, 515, 58, 85, 268, 139, 164, 112, 193, 274, 517, 99, 86, 60, 544, 141, 89, 194, 47, 168, 289, 276, 147, 518, 101, 142, 521, 263, 384, 90, 290, 196, 149, 102, 280, 522, 55, 176, 105, 92, 267, 576, 292, 163, 150, 529, 79, 200, 321, 153, 524, 106, 59, 269, 530, 165, 322, 113, 296, 154, 275, 108, 87, 270, 208, 61, 166, 545, 532, 114, 324, 195, 169, 156, 277, 519, 640, 62, 304, 546, 143, 385, 91, 116, 170, 291, 197, 536, 278, 328, 103, 224, 281, 523, 386, 177, 548, 93, 198, 577, 172, 293, 151, 120, 201, 282, 178, 525, 107, 388, 94, 336, 578, 552, 294, 531, 202, 323, 297, 284, 155, 526, 768, 180, 109, 271, 209, 580, 392, 167, 533, 115, 298, 204, 325, 560, 157, 110, 641, 352, 210, 63, 184, 305, 547, 534, 584, 326, 117, 300, 171, 158, 537, 279, 400, 642, 329, 225, 306, 212, 387, 549, 118, 199, 538, 173, 330, 121, 644, 226, 283, 592, 308, 179, 550, 389, 95, 216, 337, 579, 174, 553, 295, 540, 416, 122, 332, 203, 228, 285, 527, 648, 390, 769, 181, 338, 312, 554, 581, 393, 124, 299, 608, 205, 286, 770, 182, 561, 111, 232, 353, 340, 211, 582, 394, 185, 556, 535, 656, 206, 585, 327, 448, 301, 562, 159, 401, 772, 643, 354, 186, 307, 213, 396, 344, 586, 119, 302, 240, 539, 402, 564, 331, 645, 356, 227, 214, 593, 776, 188, 309, 551, 672, 217, 588, 175, 541, 417, 123, 404, 646, 333, 594, 229, 568, 310, 649, 391, 360, 218, 339, 313, 555, 542, 418, 784, 334, 125, 230, 609, 287, 596, 408, 650, 771, 183, 233, 314, 220, 341, 583, 395, 704, 557, 420, 126, 657, 368, 610, 207, 449, 563, 652, 773, 234, 355, 600, 342, 316, 187, 558, 800, 397, 658, 345, 587, 450, 303, 241, 612, 424, 403, 774, 565, 236, 357, 215, 398, 777, 189, 346, 673, 660, 242, 589, 452, 566, 405, 647, 616, 358, 595, 778, 190, 569, 311, 432, 674, 361, 348, 219, 590, 832, 244, 543, 419, 664, 406, 785, 335, 456, 231, 570, 597, 409, 780, 651, 362, 676, 315, 624, 221, 705, 786, 421, 127, 248, 369, 611, 598, 410, 572, 653, 364, 235, 222, 601, 343, 464, 317, 706, 559, 680, 422, 801, 788, 659, 370, 451, 613, 425, 412, 654, 775, 896, 602, 237, 318, 802, 399, 708, 347, 661, 372, 243, 614, 426, 453, 792, 567, 688, 238, 617, 359, 604, 480, 779, 191, 433, 804, 675, 662, 349, 591, 712, 454, 833, 245, 428, 665, 407, 376, 618, 457, 571, 434, 781, 363, 350, 677, 834, 246, 625, 808, 666, 787, 458, 249, 620, 599, 411, 782, 720, 573, 436, 678, 365, 626, 223, 465, 836, 707, 681, 423, 668, 789, 250, 371, 460, 574, 816, 413, 655, 366, 897, 603, 466, 319, 628, 440, 682, 803, 709, 790, 840, 252, 373, 615, 427, 736, 414, 793, 898, 689, 239, 605, 481, 468, 710, 684, 805, 663, 632, 374, 713, 455, 794, 429, 690, 377, 619, 900, 606, 482, 848, 435, 806, 351, 472, 714, 835, 247, 430, 809, 796, 667, 378, 692, 459, 621, 484, 783, 721, 904, 437, 679, 627, 810, 716, 837, 669, 380, 251, 622, 864, 461, 722, 575, 696, 438, 817, 367, 488, 467, 838, 629, 441, 812, 683, 670, 791, 912, 462, 841, 253, 737, 818, 415, 724, 899, 630, 442, 469, 711, 685, 842, 254, 633, 375, 496, 738, 795, 820, 691, 901, 607, 483, 728, 470, 849, 444, 686, 807, 928, 634, 473, 844, 715, 431, 740, 797, 379, 902, 693, 850, 485, 824, 905, 474, 636, 811, 717, 798, 694, 381, 623, 744, 486, 865, 852, 723, 906, 697, 439, 489, 476, 718, 839, 960, 813, 671, 382, 913, 866, 463, 698, 819, 725, 908, 490, 856, 631, 443, 814, 752, 914, 843, 255, 497, 868, 739, 726, 700, 821, 492, 729, 471, 445, 687, 929, 635, 916, 498, 845, 741, 822, 903, 872, 730, 851, 446, 825, 930, 475, 846, 637, 500, 742, 799, 920, 695, 745, 487, 826, 732, 853, 907, 932, 638, 880, 477, 719, 961, 383, 504, 746, 867, 854, 828, 699, 909, 491, 478, 857, 962, 815, 753, 936, 915, 748, 869, 727, 910, 701, 858, 493, 754, 964, 917, 499, 870, 702, 823, 944, 494, 873, 860, 731, 447, 756, 931, 918, 847, 968, 501, 743, 921, 874, 827, 733, 933, 639, 760, 502, 881, 922, 505, 876, 747, 734, 855, 976, 829, 934, 882, 479, 963, 937, 924, 506, 749, 830, 911, 859, 884, 755, 938, 965, 508, 750, 871, 992, 703, 945, 495, 861, 966, 757, 940, 919, 888, 969, 946, 875, 862, 758, 970, 761, 503, 923, 948, 877, 735, 977, 935, 762, 883, 972, 925, 507, 878, 978, 831, 952, 764, 885, 939, 926, 509, 751, 993, 980, 886, 967, 941, 510, 889, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q175_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 260, 131, 74, 27, 52, 133, 81, 264, 39, 160, 76, 29, 134, 513, 82, 56, 137, 43, 30, 272, 514, 97, 84, 138, 259, 71, 45, 192, 145, 516, 98, 51, 140, 261, 88, 46, 288, 146, 75, 100, 520, 262, 53, 265, 161, 148, 77, 54, 135, 104, 83, 266, 57, 162, 528, 78, 320, 31, 152, 273, 515, 58, 85, 268, 139, 164, 112, 193, 274, 517, 99, 86, 60, 544, 141, 89, 47, 194, 168, 289, 276, 147, 518, 101, 142, 521, 263, 90, 384, 290, 196, 149, 102, 280, 522, 55, 176, 105, 92, 267, 576, 292, 163, 150, 529, 79, 200, 321, 153, 524, 106, 59, 269, 530, 165, 322, 113, 296, 154, 275, 108, 87, 270, 61, 208, 166, 545, 532, 114, 324, 195, 169, 156, 277, 519, 640, 62, 304, 546, 143, 91, 385, 116, 170, 291, 197, 536, 278, 328, 103, 224, 281, 523, 386, 177, 548, 93, 198, 577, 172, 293, 151, 120, 201, 282, 178, 525, 107, 94, 388, 336, 578, 552, 294, 531, 202, 323, 297, 284, 155, 526, 180, 768, 109, 271, 209, 580, 392, 167, 533, 115, 298, 204, 325, 560, 157, 110, 641, 352, 63, 210, 184, 305, 547, 534, 584, 326, 117, 300, 171, 158, 537, 279, 400, 642, 329, 225, 306, 212, 387, 549, 118, 199, 538, 173, 330, 121, 644, 226, 283, 592, 308, 179, 550, 95, 389, 216, 337, 579, 174, 553, 295, 540, 122, 416, 332, 203, 228, 285, 527, 648, 390, 181, 769, 338, 312, 554, 581, 393, 124, 299, 608, 205, 286, 182, 770, 561, 111, 232, 353, 340, 211, 582, 394, 185, 556, 535, 656, 206, 585, 327, 301, 448, 562, 159, 401, 772, 643, 354, 186, 307, 213, 396, 344, 586, 119, 302, 240, 539, 402, 564, 331, 645, 356, 227, 214, 593, 188, 776, 309, 551, 672, 217, 588, 175, 541, 123, 417, 404, 646, 333, 594, 229, 568, 310, 649, 391, 360, 218, 339, 313, 555, 542, 418, 784, 334, 125, 230, 609, 287, 596, 408, 650, 183, 771, 233, 314, 220, 341, 583, 395, 557, 704, 126, 420, 657, 368, 610, 207, 449, 563, 652, 234, 773, 355, 600, 342, 316, 187, 558, 800, 397, 658, 345, 587, 303, 450, 241, 612, 424, 403, 774, 565, 236, 357, 215, 398, 189, 777, 346, 673, 660, 242, 589, 452, 566, 405, 647, 616, 358, 595, 190, 778, 569, 311, 432, 674, 361, 348, 219, 590, 244, 832, 543, 419, 664, 406, 785, 335, 456, 231, 570, 597, 409, 780, 651, 362, 676, 315, 624, 221, 705, 786, 127, 421, 248, 369, 611, 598, 410, 572, 653, 364, 235, 222, 601, 343, 317, 464, 559, 706, 680, 422, 801, 788, 659, 370, 451, 613, 425, 412, 654, 775, 602, 896, 237, 318, 802, 399, 708, 347, 661, 372, 243, 614, 426, 453, 792, 567, 688, 238, 617, 359, 604, 480, 191, 779, 433, 804, 675, 662, 349, 591, 712, 454, 245, 833, 428, 665, 407, 376, 618, 457, 571, 434, 781, 363, 350, 677, 246, 834, 625, 808, 666, 787, 458, 249, 620, 599, 411, 782, 573, 720, 436, 678, 365, 626, 223, 465, 836, 707, 681, 423, 668, 250, 789, 371, 460, 574, 816, 413, 655, 366, 603, 897, 319, 466, 628, 440, 682, 803, 709, 790, 252, 840, 373, 615, 427, 736, 414, 793, 898, 689, 239, 605, 481, 468, 710, 684, 805, 663, 632, 374, 713, 455, 794, 429, 690, 377, 619, 606, 900, 482, 848, 435, 806, 351, 472, 714, 247, 835, 430, 809, 796, 667, 378, 692, 459, 621, 484, 783, 721, 904, 437, 679, 627, 810, 716, 837, 669, 380, 251, 622, 864, 461, 575, 722, 696, 438, 817, 367, 488, 467, 838, 629, 441, 812, 683, 670, 791, 912, 462, 253, 841, 737, 818, 415, 724, 899, 630, 442, 469, 711, 685, 254, 842, 633, 375, 496, 738, 795, 820, 691, 607, 901, 483, 728, 470, 849, 444, 686, 807, 634, 928, 473, 844, 715, 431, 740, 797, 379, 902, 693, 850, 485, 824, 905, 474, 636, 811, 717, 798, 694, 381, 623, 744, 486, 865, 852, 723, 906, 697, 439, 489, 476, 718, 839, 813, 960, 671, 382, 913, 866, 463, 698, 819, 725, 908, 490, 856, 631, 443, 814, 752, 914, 255, 843, 497, 868, 739, 726, 700, 821, 492, 729, 471, 445, 687, 635, 929, 916, 498, 845, 741, 822, 903, 872, 730, 851, 446, 825, 930, 475, 846, 637, 500, 742, 799, 920, 695, 745, 487, 826, 732, 853, 907, 638, 932, 880, 477, 719, 961, 383, 504, 746, 867, 854, 828, 699, 909, 491, 478, 857, 815, 962, 753, 936, 915, 748, 869, 727, 910, 701, 858, 493, 754, 964, 917, 499, 870, 702, 823, 944, 494, 873, 860, 731, 447, 756, 931, 918, 847, 968, 501, 743, 921, 874, 827, 733, 639, 933, 760, 502, 881, 922, 505, 876, 747, 734, 855, 829, 976, 934, 882, 479, 963, 937, 924, 506, 749, 830, 911, 859, 884, 755, 938, 965, 508, 750, 871, 992, 703, 945, 495, 861, 966, 757, 940, 919, 888, 969, 946, 875, 862, 758, 970, 761, 503, 923, 948, 877, 735, 977, 935, 762, 883, 972, 925, 507, 878, 831, 978, 952, 764, 885, 939, 926, 509, 751, 993, 980, 886, 967, 941, 510, 889, 994, 947, 863, 984, 759, 942, 890, 971, 996, 949, 892, 763, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q176_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 131, 260, 74, 27, 52, 133, 81, 264, 39, 160, 76, 29, 134, 513, 82, 56, 137, 43, 30, 272, 514, 97, 84, 138, 259, 71, 45, 192, 145, 516, 98, 51, 140, 261, 88, 46, 288, 146, 75, 100, 262, 520, 53, 265, 161, 148, 77, 54, 135, 104, 83, 266, 57, 162, 528, 78, 320, 31, 152, 273, 515, 58, 85, 139, 268, 164, 112, 193, 274, 517, 99, 86, 60, 544, 141, 89, 47, 194, 168, 289, 147, 276, 518, 101, 142, 263, 521, 90, 384, 290, 196, 149, 102, 280, 522, 55, 176, 105, 92, 267, 576, 163, 292, 150, 529, 79, 200, 321, 153, 524, 106, 59, 269, 530, 165, 322, 113, 296, 154, 275, 108, 87, 270, 61, 208, 166, 545, 532, 114, 195, 324, 169, 156, 277, 519, 640, 62, 304, 546, 143, 91, 385, 116, 170, 291, 197, 278, 536, 328, 103, 224, 281, 523, 386, 177, 548, 93, 198, 577, 172, 293, 151, 120, 201, 282, 178, 525, 107, 94, 388, 336, 578, 294, 552, 531, 202, 323, 297, 155, 284, 526, 180, 768, 109, 271, 209, 580, 392, 167, 533, 115, 298, 204, 325, 560, 157, 110, 641, 352, 63, 210, 184, 305, 547, 534, 326, 584, 117, 171, 300, 158, 279, 537, 400, 642, 329, 225, 306, 212, 387, 549, 118, 199, 538, 173, 330, 121, 644, 226, 283, 592, 179, 308, 550, 95, 389, 216, 337, 579, 174, 295, 553, 540, 122, 416, 203, 332, 228, 285, 527, 390, 648, 181, 769, 338, 312, 554, 581, 393, 124, 299, 608, 205, 286, 182, 770, 561, 111, 232, 353, 211, 340, 582, 394, 185, 556, 535, 656, 206, 327, 585, 301, 448, 562, 159, 401, 643, 772, 354, 186, 307, 213, 396, 344, 586, 119, 302, 240, 539, 402, 564, 331, 645, 227, 356, 214, 593, 188, 776, 309, 551, 672, 217, 588, 175, 541, 123, 417, 404, 646, 333, 594, 229, 310, 568, 391, 649, 360, 218, 339, 313, 555, 542, 418, 784, 334, 125, 230, 609, 287, 596, 408, 650, 183, 771, 233, 314, 220, 341, 583, 395, 557, 704, 126, 420, 657, 368, 610, 207, 449, 563, 652, 234, 773, 355, 342, 600, 187, 316, 558, 800, 397, 658, 345, 587, 303, 450, 241, 612, 424, 403, 774, 565, 236, 357, 215, 398, 189, 777, 346, 673, 660, 242, 589, 452, 566, 405, 647, 358, 616, 595, 190, 778, 311, 569, 432, 674, 361, 219, 348, 590, 244, 832, 543, 419, 406, 664, 785, 335, 456, 231, 570, 597, 409, 651, 780, 362, 676, 315, 624, 221, 705, 786, 127, 421, 248, 369, 611, 598, 410, 572, 653, 235, 364, 222, 343, 601, 317, 464, 559, 706, 422, 680, 801, 659, 788, 370, 451, 613, 425, 412, 654, 775, 602, 896, 237, 318, 802, 399, 708, 347, 661, 243, 372, 614, 426, 453, 792, 567, 688, 238, 359, 617, 604, 480, 191, 779, 433, 675, 804, 662, 349, 591, 454, 712, 245, 833, 428, 407, 665, 376, 618, 457, 571, 434, 781, 363, 350, 677, 246, 834, 625, 808, 666, 787, 458, 249, 620, 599, 411, 782, 573, 720, 436, 678, 365, 626, 223, 465, 707, 836, 423, 681, 668, 250, 789, 371, 460, 574, 816, 413, 655, 366, 603, 897, 319, 466, 628, 440, 682, 803, 709, 790, 252, 840, 373, 615, 427, 736, 414, 793, 898, 689, 239, 605, 481, 468, 710, 684, 805, 663, 374, 632, 455, 713, 794, 429, 690, 377, 619, 606, 900, 482, 848, 435, 806, 351, 472, 714, 247, 835, 430, 809, 667, 796, 378, 692, 459, 621, 484, 783, 721, 904, 437, 679, 627, 810, 716, 837, 669, 251, 380, 622, 864, 461, 575, 722, 438, 696, 817, 367, 488, 467, 838, 629, 441, 683, 812, 670, 791, 912, 462, 253, 841, 737, 818, 415, 724, 899, 630, 442, 469, 711, 685, 254, 842, 375, 633, 496, 738, 795, 691, 820, 607, 901, 483, 470, 728, 849, 444, 686, 807, 634, 928, 473, 715, 844, 431, 740, 797, 379, 902, 693, 850, 485, 824, 905, 474, 636, 811, 717, 798, 694, 381, 623, 486, 744, 865, 723, 852, 906, 439, 697, 489, 476, 718, 839, 813, 960, 671, 382, 913, 866, 463, 698, 819, 725, 908, 490, 856, 631, 443, 814, 752, 914, 255, 843, 497, 739, 868, 726, 700, 821, 492, 471, 729, 445, 687, 635, 929, 916, 498, 845, 741, 822, 903, 872, 730, 851, 446, 825, 930, 475, 846, 637, 500, 742, 799, 920, 695, 487, 745, 826, 732, 853, 907, 638, 932, 880, 477, 719, 961, 383, 504, 746, 867, 854, 699, 828, 909, 491, 478, 857, 815, 962, 753, 936, 915, 748, 869, 727, 910, 701, 858, 493, 754, 964, 917, 499, 870, 702, 823, 944, 494, 873, 731, 860, 447, 756, 931, 918, 847, 968, 501, 743, 921, 874, 827, 733, 639, 933, 502, 760, 881, 922, 505, 747, 876, 734, 855, 829, 976, 934, 882, 479, 963, 937, 924, 506, 749, 830, 911, 859, 755, 884, 938, 965, 508, 750, 871, 992, 703, 945, 495, 861, 966, 757, 940, 919, 888, 969, 946, 875, 862, 758, 970, 503, 761, 923, 948, 877, 735, 977, 935, 762, 883, 972, 925, 507, 878, 831, 978, 952, 764, 885, 939, 926, 509, 751, 993, 980, 886, 967, 941, 510, 889, 994, 947, 863, 984, 759, 942, 890, 971, 996, 949, 763, 892, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q177_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 258, 49, 70, 44, 23, 144, 73, 50, 131, 260, 74, 27, 52, 133, 81, 264, 39, 160, 76, 29, 134, 513, 82, 56, 137, 43, 30, 272, 514, 97, 84, 138, 259, 71, 45, 192, 145, 516, 98, 51, 140, 261, 88, 46, 288, 146, 75, 100, 262, 53, 520, 265, 161, 148, 77, 54, 135, 104, 83, 266, 57, 162, 528, 78, 320, 31, 152, 273, 515, 58, 85, 139, 268, 164, 112, 193, 274, 517, 99, 86, 60, 141, 544, 89, 47, 194, 168, 289, 147, 276, 518, 101, 142, 263, 521, 90, 384, 290, 196, 149, 102, 280, 55, 522, 176, 105, 92, 267, 576, 163, 292, 150, 529, 79, 200, 321, 153, 524, 106, 59, 269, 530, 165, 322, 113, 296, 154, 275, 108, 87, 270, 61, 208, 166, 545, 532, 114, 195, 324, 169, 156, 277, 519, 640, 62, 304, 143, 546, 91, 385, 116, 170, 291, 197, 278, 536, 328, 103, 224, 281, 523, 386, 177, 548, 93, 198, 577, 172, 293, 151, 120, 201, 282, 178, 525, 107, 94, 388, 336, 578, 294, 552, 531, 202, 323, 297, 155, 284, 526, 180, 768, 109, 271, 209, 580, 392, 167, 533, 115, 298, 204, 325, 157, 560, 110, 641, 352, 63, 210, 184, 305, 547, 534, 326, 117, 584, 171, 300, 158, 279, 537, 400, 642, 329, 225, 306, 212, 387, 549, 118, 199, 538, 173, 330, 121, 644, 226, 283, 592, 179, 308, 550, 95, 389, 216, 337, 579, 174, 295, 553, 540, 122, 416, 203, 332, 228, 285, 527, 390, 181, 648, 769, 338, 312, 554, 581, 393, 124, 299, 205, 608, 286, 182, 770, 561, 111, 232, 353, 211, 340, 582, 394, 185, 556, 535, 656, 206, 327, 585, 301, 448, 159, 562, 401, 643, 772, 354, 186, 307, 213, 396, 344, 119, 586, 302, 240, 539, 402, 564, 331, 645, 227, 356, 214, 593, 188, 309, 776, 551, 672, 217, 588, 175, 541, 123, 417, 404, 646, 333, 594, 229, 310, 568, 391, 649, 360, 218, 339, 313, 555, 542, 418, 784, 334, 125, 230, 609, 287, 596, 408, 183, 650, 771, 233, 314, 220, 341, 583, 395, 557, 704, 126, 420, 657, 368, 207, 610, 449, 563, 652, 234, 773, 355, 342, 600, 187, 316, 558, 397, 800, 658, 345, 587, 303, 450, 241, 612, 424, 403, 774, 565, 236, 357, 215, 398, 189, 777, 346, 673, 660, 242, 589, 452, 566, 405, 647, 358, 616, 595, 190, 311, 778, 569, 432, 674, 361, 219, 348, 590, 244, 832, 543, 419, 406, 664, 785, 335, 456, 231, 570, 597, 409, 651, 780, 362, 676, 315, 221, 624, 705, 786, 127, 421, 248, 369, 611, 598, 410, 572, 653, 235, 364, 222, 343, 601, 317, 464, 559, 706, 422, 680, 801, 659, 788, 370, 451, 613, 425, 412, 654, 775, 602, 896, 237, 318, 399, 802, 708, 347, 661, 243, 372, 614, 426, 453, 792, 567, 688, 238, 359, 617, 604, 480, 191, 779, 433, 675, 804, 662, 349, 591, 454, 245, 712, 833, 428, 407, 665, 376, 618, 457, 571, 434, 781, 363, 350, 677, 246, 834, 625, 808, 666, 787, 458, 249, 620, 599, 411, 782, 573, 720, 436, 678, 365, 223, 626, 465, 707, 836, 423, 681, 668, 250, 789, 371, 460, 574, 413, 816, 655, 366, 603, 897, 319, 466, 628, 440, 682, 803, 709, 790, 252, 373, 840, 615, 427, 736, 414, 793, 898, 689, 239, 605, 481, 468, 710, 684, 805, 663, 374, 632, 455, 713, 794, 429, 690, 377, 619, 606, 900, 482, 848, 435, 806, 351, 472, 247, 714, 835, 430, 809, 667, 796, 378, 692, 459, 621, 484, 783, 721, 437, 904, 679, 627, 810, 716, 837, 669, 251, 380, 622, 461, 864, 575, 722, 438, 696, 817, 367, 488, 467, 838, 629, 441, 683, 812, 670, 791, 912, 462, 253, 841, 737, 415, 818, 724, 899, 630, 442, 469, 711, 685, 254, 375, 842, 633, 496, 738, 795, 691, 820, 607, 901, 483, 470, 728, 849, 444, 686, 807, 634, 928, 473, 715, 844, 431, 740, 797, 379, 902, 693, 850, 485, 824, 905, 474, 636, 811, 717, 798, 694, 381, 623, 486, 744, 865, 723, 852, 439, 906, 697, 489, 476, 718, 839, 813, 960, 671, 382, 913, 463, 866, 698, 819, 725, 908, 490, 856, 631, 443, 814, 752, 914, 255, 843, 497, 739, 868, 726, 700, 821, 492, 471, 729, 445, 687, 635, 929, 916, 498, 845, 741, 822, 903, 872, 730, 851, 446, 825, 930, 475, 846, 637, 500, 742, 799, 920, 695, 487, 745, 826, 732, 853, 907, 638, 932, 477, 880, 719, 961, 383, 504, 746, 867, 854, 699, 828, 909, 491, 478, 857, 815, 962, 753, 936, 915, 748, 869, 727, 910, 701, 858, 493, 754, 964, 917, 499, 870, 702, 823, 944, 494, 873, 731, 860, 447, 756, 931, 918, 847, 501, 968, 743, 921, 874, 827, 733, 639, 933, 502, 760, 881, 922, 505, 747, 876, 734, 855, 829, 976, 934, 479, 882, 963, 937, 924, 506, 749, 830, 911, 859, 755, 884, 938, 965, 508, 750, 871, 992, 703, 945, 495, 861, 966, 757, 940, 919, 888, 969, 946, 875, 862, 758, 503, 970, 761, 923, 948, 877, 735, 977, 935, 762, 883, 972, 925, 507, 878, 831, 978, 952, 764, 885, 939, 926, 509, 751, 993, 980, 886, 967, 941, 510, 889, 994, 947, 863, 984, 759, 942, 890, 971, 996, 949, 763, 892, 973, 950, 879, 1000, 979, 953, 974, 765, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q178_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 264, 39, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 528, 78, 320, 31, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 280, 55, 522, 176, 105, 92, 267, 576, 163, 292, 150, 529, 79, 200, 321, 153, 106, 524, 59, 269, 530, 165, 113, 322, 296, 154, 275, 108, 87, 61, 270, 208, 166, 545, 114, 532, 195, 324, 169, 156, 277, 519, 640, 62, 304, 143, 546, 91, 385, 116, 170, 291, 197, 278, 536, 328, 103, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 768, 109, 271, 209, 580, 392, 167, 115, 533, 298, 204, 325, 157, 560, 110, 641, 352, 63, 210, 184, 305, 547, 534, 117, 326, 584, 171, 300, 158, 279, 537, 400, 642, 329, 225, 306, 212, 387, 549, 118, 199, 538, 173, 121, 330, 226, 644, 283, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 608, 286, 182, 561, 770, 111, 232, 353, 211, 340, 582, 185, 394, 556, 535, 656, 206, 327, 585, 301, 448, 159, 562, 401, 643, 354, 772, 186, 307, 213, 396, 344, 119, 586, 302, 240, 539, 402, 564, 331, 227, 645, 356, 214, 593, 188, 309, 776, 551, 672, 217, 588, 175, 123, 541, 417, 404, 646, 333, 594, 229, 310, 568, 391, 649, 360, 218, 339, 313, 555, 542, 418, 784, 125, 334, 230, 609, 287, 596, 408, 183, 650, 771, 233, 314, 220, 341, 583, 395, 557, 704, 126, 420, 657, 368, 207, 610, 449, 563, 234, 652, 355, 773, 342, 600, 187, 316, 558, 397, 800, 658, 345, 587, 303, 241, 450, 612, 424, 403, 565, 774, 236, 357, 215, 189, 398, 777, 346, 673, 242, 660, 589, 452, 566, 405, 647, 358, 616, 595, 190, 311, 569, 778, 432, 674, 361, 219, 348, 590, 244, 832, 543, 419, 406, 664, 785, 335, 456, 231, 570, 597, 409, 651, 362, 780, 676, 315, 221, 624, 705, 786, 127, 421, 248, 369, 611, 598, 410, 572, 235, 653, 364, 222, 343, 601, 317, 559, 464, 706, 422, 680, 801, 659, 370, 788, 451, 613, 425, 412, 654, 775, 602, 896, 237, 318, 399, 802, 708, 347, 243, 661, 372, 614, 426, 453, 792, 567, 688, 238, 359, 617, 604, 480, 191, 779, 433, 675, 804, 662, 349, 591, 245, 454, 712, 833, 428, 407, 665, 376, 618, 457, 571, 434, 363, 781, 350, 677, 246, 625, 834, 808, 666, 787, 249, 458, 620, 599, 411, 573, 782, 720, 436, 678, 365, 223, 626, 465, 707, 836, 423, 681, 250, 668, 371, 789, 460, 574, 413, 816, 655, 366, 603, 897, 319, 466, 628, 440, 682, 803, 709, 790, 252, 373, 840, 615, 427, 736, 414, 793, 689, 898, 239, 605, 481, 468, 710, 684, 805, 663, 374, 632, 455, 713, 794, 429, 690, 377, 619, 606, 482, 900, 848, 435, 806, 351, 472, 247, 714, 835, 430, 809, 667, 378, 796, 692, 459, 621, 484, 783, 721, 437, 904, 679, 627, 810, 716, 837, 251, 669, 380, 622, 461, 864, 575, 722, 438, 696, 817, 367, 488, 467, 629, 838, 441, 683, 812, 670, 791, 912, 253, 462, 841, 737, 415, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 740, 379, 797, 693, 902, 850, 485, 824, 905, 474, 636, 811, 717, 798, 694, 381, 623, 486, 744, 865, 723, 852, 439, 697, 906, 489, 476, 718, 839, 813, 960, 671, 382, 913, 463, 866, 698, 819, 725, 490, 908, 856, 631, 443, 814, 752, 914, 255, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 920, 695, 487, 745, 826, 732, 853, 907, 638, 932, 477, 880, 719, 961, 383, 504, 746, 867, 854, 699, 828, 491, 909, 478, 857, 815, 753, 962, 936, 915, 748, 869, 727, 701, 910, 858, 493, 754, 964, 499, 917, 870, 702, 823, 944, 494, 873, 731, 860, 447, 756, 931, 918, 847, 501, 968, 743, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 992, 703, 945, 495, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 984, 759, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q179_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 264, 39, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 528, 78, 320, 31, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 280, 55, 522, 176, 105, 92, 267, 576, 163, 292, 150, 529, 79, 200, 321, 153, 106, 524, 59, 269, 530, 165, 113, 322, 296, 154, 275, 108, 87, 61, 270, 208, 166, 545, 114, 532, 195, 324, 169, 156, 277, 519, 640, 62, 143, 304, 546, 91, 385, 116, 170, 291, 197, 278, 536, 328, 103, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 580, 392, 167, 115, 533, 298, 204, 325, 157, 560, 110, 641, 352, 63, 210, 184, 305, 547, 534, 117, 326, 584, 171, 300, 158, 279, 537, 400, 642, 329, 225, 306, 212, 387, 549, 118, 199, 538, 173, 121, 330, 226, 644, 283, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 561, 111, 770, 232, 353, 211, 340, 582, 185, 394, 556, 535, 656, 206, 327, 585, 301, 448, 159, 562, 401, 643, 354, 772, 186, 307, 213, 396, 344, 119, 586, 302, 240, 539, 402, 564, 331, 227, 645, 356, 214, 593, 188, 309, 776, 551, 672, 217, 588, 175, 123, 541, 417, 404, 646, 333, 594, 229, 310, 568, 391, 649, 360, 218, 339, 313, 555, 542, 418, 125, 784, 334, 230, 287, 609, 596, 408, 183, 650, 771, 233, 314, 220, 341, 583, 395, 557, 704, 126, 420, 657, 207, 368, 610, 449, 563, 234, 652, 355, 773, 342, 600, 187, 316, 558, 397, 800, 658, 345, 587, 303, 241, 450, 612, 424, 403, 565, 774, 236, 357, 215, 189, 398, 777, 346, 673, 242, 660, 589, 452, 566, 405, 647, 358, 616, 595, 190, 311, 569, 778, 432, 674, 361, 219, 348, 590, 244, 832, 543, 419, 406, 664, 785, 335, 456, 231, 570, 597, 409, 651, 362, 780, 676, 315, 221, 624, 705, 127, 786, 421, 248, 369, 611, 598, 410, 572, 235, 653, 364, 222, 343, 601, 317, 559, 464, 706, 422, 680, 801, 659, 370, 788, 451, 613, 425, 412, 654, 775, 602, 237, 896, 318, 399, 802, 708, 347, 243, 661, 372, 614, 426, 453, 792, 567, 688, 238, 359, 617, 604, 480, 191, 779, 433, 675, 804, 662, 349, 591, 245, 454, 712, 833, 428, 407, 665, 376, 618, 457, 571, 434, 363, 781, 350, 677, 246, 625, 834, 808, 666, 787, 249, 458, 620, 599, 411, 573, 782, 720, 436, 678, 365, 223, 626, 465, 707, 836, 423, 681, 250, 668, 371, 789, 460, 574, 413, 655, 816, 366, 603, 897, 319, 466, 628, 440, 682, 803, 709, 790, 252, 373, 840, 615, 427, 414, 736, 793, 689, 239, 898, 605, 481, 468, 710, 684, 805, 663, 374, 632, 455, 713, 794, 429, 690, 377, 619, 606, 482, 900, 848, 435, 806, 351, 472, 247, 714, 835, 430, 809, 667, 378, 796, 692, 459, 621, 484, 783, 721, 437, 904, 679, 627, 810, 716, 837, 251, 669, 380, 622, 461, 864, 575, 722, 438, 696, 817, 367, 488, 467, 629, 838, 441, 683, 812, 670, 791, 253, 912, 462, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 740, 379, 797, 693, 902, 850, 485, 824, 905, 474, 636, 811, 717, 798, 694, 381, 623, 486, 744, 865, 723, 852, 439, 697, 906, 489, 476, 718, 839, 813, 960, 671, 382, 913, 463, 866, 698, 819, 725, 490, 908, 856, 631, 443, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 920, 695, 487, 745, 826, 732, 853, 907, 638, 932, 477, 719, 880, 961, 383, 504, 746, 867, 854, 699, 828, 491, 909, 478, 857, 815, 753, 962, 936, 915, 748, 869, 727, 701, 910, 858, 493, 754, 964, 499, 917, 870, 702, 823, 944, 494, 873, 731, 860, 447, 756, 931, 918, 847, 501, 968, 743, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 992, 703, 945, 495, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 984, 759, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q180_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 320, 31, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 576, 163, 292, 150, 79, 529, 200, 321, 153, 106, 524, 59, 269, 530, 165, 113, 322, 296, 154, 275, 108, 87, 61, 270, 208, 166, 545, 114, 532, 195, 324, 169, 156, 277, 519, 640, 62, 143, 304, 546, 91, 385, 116, 170, 291, 197, 278, 536, 103, 328, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 580, 167, 392, 115, 533, 298, 204, 325, 157, 110, 560, 641, 352, 63, 210, 184, 305, 547, 534, 117, 326, 584, 171, 300, 158, 279, 537, 400, 642, 329, 225, 306, 212, 387, 549, 118, 199, 538, 173, 121, 330, 226, 644, 283, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 582, 185, 394, 556, 535, 206, 656, 327, 585, 301, 448, 159, 562, 401, 643, 354, 772, 186, 307, 213, 396, 119, 344, 586, 302, 240, 539, 402, 564, 331, 227, 645, 356, 214, 593, 188, 309, 551, 776, 672, 217, 588, 175, 123, 541, 417, 404, 646, 333, 594, 229, 310, 568, 391, 649, 360, 218, 339, 313, 555, 542, 418, 125, 334, 784, 230, 287, 609, 596, 183, 408, 650, 771, 233, 314, 220, 341, 583, 395, 557, 704, 126, 420, 207, 657, 368, 610, 449, 563, 234, 652, 355, 773, 342, 600, 187, 316, 558, 397, 800, 658, 345, 587, 303, 241, 450, 612, 424, 403, 565, 774, 236, 357, 215, 189, 398, 777, 346, 673, 242, 660, 589, 452, 566, 405, 647, 358, 616, 595, 190, 311, 569, 778, 432, 674, 361, 219, 348, 590, 244, 832, 543, 419, 406, 664, 335, 785, 231, 456, 570, 597, 409, 651, 362, 780, 676, 315, 221, 624, 705, 127, 786, 421, 248, 369, 611, 598, 410, 572, 235, 653, 364, 222, 343, 601, 317, 559, 464, 706, 422, 680, 801, 659, 370, 788, 451, 613, 425, 412, 654, 775, 602, 237, 896, 318, 399, 802, 708, 347, 243, 661, 372, 614, 426, 453, 567, 792, 238, 688, 359, 617, 604, 480, 191, 779, 433, 675, 804, 662, 349, 591, 245, 454, 712, 833, 428, 407, 665, 376, 618, 457, 571, 434, 363, 781, 350, 677, 246, 625, 834, 808, 666, 787, 249, 458, 620, 599, 411, 573, 782, 720, 436, 678, 365, 223, 626, 465, 707, 836, 423, 681, 250, 668, 371, 789, 460, 574, 413, 655, 366, 816, 603, 897, 319, 466, 628, 440, 682, 803, 709, 790, 252, 373, 615, 840, 427, 414, 736, 793, 239, 689, 898, 605, 481, 468, 710, 684, 805, 663, 374, 632, 455, 713, 794, 429, 690, 377, 619, 606, 482, 900, 848, 435, 806, 351, 247, 472, 714, 835, 430, 809, 667, 378, 796, 692, 459, 621, 484, 783, 721, 437, 679, 904, 627, 810, 716, 837, 251, 669, 380, 622, 461, 864, 575, 722, 438, 696, 367, 817, 488, 467, 629, 838, 441, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 740, 379, 797, 693, 902, 850, 485, 824, 905, 474, 636, 811, 717, 798, 694, 381, 623, 486, 744, 865, 723, 852, 439, 697, 906, 489, 476, 718, 839, 813, 960, 671, 382, 463, 913, 866, 698, 819, 725, 490, 908, 631, 856, 443, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 695, 920, 487, 745, 826, 732, 853, 907, 638, 932, 477, 719, 880, 961, 383, 504, 746, 867, 854, 699, 828, 491, 909, 478, 857, 815, 753, 962, 936, 915, 748, 869, 727, 701, 910, 858, 493, 754, 964, 499, 917, 870, 702, 823, 494, 944, 873, 731, 860, 447, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 992, 703, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q181_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 576, 163, 292, 150, 79, 529, 200, 321, 153, 106, 524, 59, 269, 530, 165, 113, 322, 296, 154, 275, 108, 87, 61, 270, 208, 166, 545, 114, 532, 195, 324, 169, 156, 277, 519, 62, 640, 143, 304, 546, 91, 385, 116, 170, 291, 197, 278, 536, 103, 328, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 580, 167, 392, 115, 533, 298, 204, 325, 157, 110, 560, 63, 352, 641, 210, 184, 305, 547, 534, 117, 326, 584, 171, 300, 158, 279, 537, 400, 642, 329, 225, 306, 212, 387, 549, 118, 199, 538, 173, 121, 330, 226, 644, 283, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 582, 185, 394, 556, 535, 206, 656, 327, 585, 301, 159, 448, 562, 401, 354, 643, 772, 186, 307, 213, 396, 119, 344, 586, 302, 240, 539, 402, 564, 331, 227, 356, 645, 214, 593, 188, 309, 551, 776, 672, 217, 588, 175, 123, 541, 417, 404, 646, 333, 594, 229, 310, 568, 391, 360, 649, 218, 339, 313, 555, 542, 418, 125, 334, 784, 230, 287, 609, 596, 183, 408, 650, 771, 233, 314, 220, 341, 583, 395, 557, 126, 704, 420, 207, 368, 657, 610, 449, 563, 234, 652, 355, 773, 342, 600, 187, 316, 558, 397, 800, 658, 345, 587, 303, 241, 450, 612, 424, 403, 565, 774, 236, 357, 215, 189, 398, 777, 346, 673, 242, 660, 589, 452, 566, 405, 358, 647, 616, 595, 190, 311, 569, 778, 432, 674, 361, 219, 348, 590, 244, 543, 832, 419, 406, 664, 335, 785, 231, 456, 570, 597, 409, 362, 651, 780, 676, 315, 221, 624, 127, 705, 786, 421, 248, 369, 611, 598, 410, 572, 235, 364, 653, 222, 343, 601, 317, 559, 464, 706, 422, 680, 801, 370, 659, 788, 451, 613, 425, 412, 654, 775, 602, 237, 318, 896, 399, 802, 708, 347, 243, 372, 661, 614, 426, 453, 567, 792, 238, 688, 359, 617, 604, 191, 480, 779, 433, 675, 804, 662, 349, 591, 245, 454, 712, 833, 428, 407, 376, 665, 618, 457, 571, 434, 363, 781, 350, 677, 246, 625, 834, 808, 666, 787, 249, 458, 620, 599, 411, 573, 782, 720, 436, 678, 365, 223, 626, 465, 707, 836, 423, 681, 250, 668, 371, 789, 460, 574, 413, 366, 655, 816, 603, 319, 897, 466, 628, 440, 682, 803, 709, 790, 252, 373, 615, 840, 427, 414, 736, 793, 239, 689, 898, 605, 481, 468, 710, 684, 805, 374, 663, 632, 455, 713, 794, 429, 690, 377, 619, 606, 482, 900, 848, 435, 806, 351, 247, 472, 714, 835, 430, 809, 378, 667, 796, 692, 459, 621, 484, 783, 721, 437, 679, 904, 627, 810, 716, 837, 251, 380, 669, 622, 461, 575, 864, 722, 438, 696, 367, 817, 488, 467, 629, 838, 441, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 740, 379, 797, 693, 902, 850, 485, 824, 905, 474, 636, 811, 717, 798, 694, 381, 623, 486, 744, 865, 723, 852, 439, 697, 906, 489, 476, 718, 839, 813, 382, 671, 960, 463, 913, 866, 698, 819, 725, 490, 908, 631, 856, 443, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 695, 920, 487, 745, 826, 732, 853, 907, 638, 932, 477, 719, 880, 383, 961, 504, 746, 867, 854, 699, 828, 491, 909, 478, 857, 815, 753, 962, 936, 915, 748, 869, 727, 701, 910, 858, 493, 754, 964, 499, 917, 870, 702, 823, 494, 944, 873, 731, 860, 447, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q182_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 576, 163, 292, 150, 79, 529, 200, 321, 153, 106, 524, 59, 269, 530, 165, 113, 322, 296, 154, 275, 108, 87, 61, 270, 208, 166, 545, 114, 532, 195, 324, 169, 156, 277, 519, 62, 640, 143, 304, 546, 91, 385, 116, 170, 291, 197, 278, 536, 103, 328, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 580, 167, 392, 115, 533, 298, 204, 325, 157, 110, 560, 63, 352, 641, 210, 184, 305, 547, 534, 117, 326, 584, 171, 300, 158, 279, 537, 400, 642, 329, 225, 306, 212, 387, 549, 118, 199, 538, 173, 121, 330, 226, 644, 283, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 582, 185, 394, 556, 535, 206, 656, 327, 585, 301, 159, 448, 562, 401, 354, 643, 772, 186, 307, 213, 396, 119, 344, 586, 302, 240, 539, 402, 331, 564, 227, 356, 645, 214, 593, 188, 309, 551, 776, 672, 217, 588, 175, 123, 541, 417, 404, 646, 333, 594, 229, 310, 568, 391, 360, 649, 218, 339, 313, 555, 542, 418, 125, 334, 784, 230, 287, 609, 596, 183, 408, 650, 771, 233, 314, 220, 341, 583, 395, 557, 126, 704, 420, 207, 368, 657, 610, 449, 563, 234, 652, 355, 773, 342, 600, 187, 316, 558, 397, 800, 658, 345, 587, 303, 241, 450, 612, 424, 403, 565, 774, 236, 357, 215, 189, 398, 777, 346, 673, 242, 660, 589, 452, 566, 405, 358, 647, 616, 595, 190, 311, 569, 778, 432, 674, 361, 219, 348, 590, 244, 543, 832, 419, 406, 664, 335, 785, 231, 456, 570, 597, 409, 362, 651, 780, 676, 315, 221, 624, 127, 705, 786, 421, 248, 369, 611, 598, 410, 572, 235, 364, 653, 222, 343, 601, 317, 559, 464, 706, 422, 680, 801, 370, 659, 788, 451, 613, 425, 412, 654, 775, 602, 237, 318, 896, 399, 802, 708, 347, 243, 372, 661, 614, 426, 453, 567, 792, 238, 688, 359, 617, 604, 191, 480, 779, 433, 675, 804, 662, 349, 591, 245, 454, 712, 833, 428, 407, 376, 665, 618, 457, 571, 434, 363, 781, 350, 677, 246, 625, 834, 808, 666, 787, 249, 458, 620, 599, 411, 573, 782, 720, 436, 678, 365, 223, 626, 465, 707, 836, 423, 681, 250, 668, 371, 789, 460, 574, 413, 366, 655, 816, 603, 319, 897, 466, 628, 440, 682, 803, 709, 790, 252, 373, 615, 840, 427, 414, 736, 793, 239, 689, 898, 605, 481, 468, 710, 684, 805, 374, 663, 632, 455, 713, 794, 429, 690, 377, 619, 606, 482, 900, 848, 435, 806, 351, 247, 472, 714, 835, 430, 809, 378, 667, 796, 459, 692, 621, 484, 783, 721, 437, 679, 904, 627, 810, 716, 837, 251, 380, 669, 622, 461, 575, 864, 722, 438, 696, 367, 817, 488, 467, 629, 838, 441, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 740, 379, 797, 693, 902, 850, 485, 824, 905, 474, 636, 811, 717, 798, 694, 381, 623, 486, 744, 865, 723, 852, 439, 697, 906, 489, 476, 718, 839, 813, 382, 671, 960, 463, 913, 866, 698, 819, 725, 490, 908, 631, 856, 443, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 695, 920, 487, 745, 826, 732, 853, 907, 638, 932, 477, 719, 880, 383, 961, 504, 746, 867, 854, 699, 828, 491, 909, 478, 857, 815, 753, 962, 936, 915, 748, 869, 727, 701, 910, 858, 493, 754, 964, 499, 917, 870, 702, 823, 494, 944, 873, 731, 860, 447, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q183_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 576, 163, 292, 150, 79, 529, 200, 321, 153, 106, 524, 59, 269, 530, 165, 113, 322, 296, 154, 275, 108, 87, 61, 270, 208, 166, 545, 114, 532, 195, 324, 169, 156, 277, 519, 62, 640, 143, 304, 546, 91, 385, 116, 170, 291, 197, 278, 536, 103, 328, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 580, 167, 392, 115, 533, 298, 204, 325, 157, 110, 560, 63, 352, 641, 210, 184, 305, 547, 534, 117, 326, 584, 171, 300, 158, 279, 537, 400, 329, 642, 225, 306, 212, 387, 549, 118, 199, 538, 173, 121, 330, 226, 283, 644, 592, 179, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 582, 185, 394, 556, 535, 206, 327, 656, 585, 301, 159, 448, 562, 401, 354, 643, 772, 186, 307, 213, 396, 119, 344, 586, 302, 240, 539, 402, 331, 564, 227, 356, 645, 214, 593, 188, 309, 551, 776, 672, 217, 588, 175, 123, 541, 417, 404, 333, 646, 594, 229, 310, 568, 391, 360, 649, 218, 339, 313, 555, 542, 418, 125, 334, 784, 230, 287, 609, 596, 183, 408, 650, 771, 233, 314, 220, 341, 583, 395, 557, 126, 704, 420, 207, 368, 657, 610, 449, 563, 234, 355, 652, 773, 342, 600, 187, 316, 558, 397, 800, 345, 658, 587, 303, 241, 450, 612, 424, 403, 565, 774, 236, 357, 215, 189, 398, 777, 346, 673, 242, 660, 589, 452, 566, 405, 358, 647, 616, 595, 190, 311, 569, 778, 432, 361, 674, 219, 348, 590, 244, 543, 832, 419, 406, 335, 664, 785, 231, 456, 570, 597, 409, 362, 651, 780, 315, 676, 221, 624, 127, 705, 786, 421, 248, 369, 611, 598, 410, 572, 235, 364, 653, 222, 343, 601, 317, 559, 464, 706, 422, 680, 801, 370, 659, 788, 451, 613, 425, 412, 654, 775, 602, 237, 318, 896, 399, 802, 347, 708, 243, 372, 661, 614, 426, 453, 567, 792, 238, 359, 688, 617, 604, 191, 480, 779, 433, 675, 804, 349, 662, 591, 245, 454, 712, 833, 428, 407, 376, 665, 618, 457, 571, 434, 363, 781, 350, 677, 246, 625, 834, 808, 666, 787, 249, 458, 620, 599, 411, 573, 782, 720, 436, 365, 678, 223, 626, 465, 707, 836, 423, 681, 250, 371, 668, 789, 460, 574, 413, 366, 655, 816, 603, 319, 897, 466, 628, 440, 682, 803, 709, 790, 252, 373, 615, 840, 427, 414, 736, 793, 239, 689, 898, 605, 481, 468, 710, 684, 805, 374, 663, 632, 455, 713, 794, 429, 377, 690, 619, 606, 482, 900, 848, 435, 806, 351, 247, 472, 714, 835, 430, 809, 378, 667, 796, 459, 692, 621, 484, 783, 721, 437, 679, 904, 627, 810, 716, 837, 251, 380, 669, 622, 461, 575, 864, 722, 438, 367, 696, 817, 488, 467, 629, 838, 441, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 844, 431, 379, 740, 797, 693, 902, 850, 485, 824, 905, 474, 636, 811, 717, 798, 381, 694, 623, 486, 744, 865, 723, 852, 439, 697, 906, 489, 476, 718, 839, 813, 382, 671, 960, 463, 913, 866, 698, 819, 725, 490, 908, 631, 856, 443, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 695, 920, 487, 745, 826, 732, 853, 907, 638, 932, 477, 719, 880, 383, 961, 504, 746, 867, 854, 699, 828, 491, 909, 478, 857, 815, 753, 962, 936, 915, 748, 869, 727, 701, 910, 858, 493, 754, 964, 499, 917, 870, 702, 823, 494, 944, 873, 731, 860, 447, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q184_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 163, 576, 292, 150, 79, 529, 200, 321, 153, 106, 524, 59, 269, 530, 165, 113, 322, 296, 154, 275, 108, 87, 61, 270, 208, 166, 545, 114, 532, 195, 324, 169, 156, 277, 519, 62, 640, 143, 304, 546, 91, 385, 116, 170, 291, 197, 278, 536, 103, 328, 224, 281, 523, 177, 386, 548, 93, 198, 577, 172, 293, 151, 120, 201, 282, 178, 107, 525, 94, 388, 336, 578, 294, 552, 531, 202, 323, 297, 155, 284, 526, 180, 109, 768, 271, 209, 167, 580, 392, 115, 533, 298, 204, 325, 157, 110, 560, 63, 352, 641, 210, 184, 305, 547, 534, 117, 326, 171, 584, 300, 158, 279, 537, 400, 329, 642, 225, 306, 212, 387, 549, 118, 199, 538, 173, 121, 330, 226, 283, 644, 179, 592, 308, 550, 95, 389, 216, 337, 579, 174, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 582, 185, 394, 556, 535, 206, 327, 656, 585, 301, 159, 448, 562, 401, 354, 643, 772, 186, 307, 213, 396, 119, 344, 586, 302, 240, 539, 402, 331, 564, 227, 356, 645, 214, 593, 188, 309, 551, 776, 672, 217, 175, 588, 123, 541, 417, 404, 333, 646, 594, 229, 310, 568, 391, 360, 649, 218, 339, 313, 555, 542, 418, 125, 334, 784, 230, 287, 609, 183, 596, 408, 650, 771, 233, 314, 220, 341, 583, 395, 557, 126, 704, 420, 207, 368, 657, 610, 449, 563, 234, 355, 652, 773, 342, 187, 600, 316, 558, 397, 800, 345, 658, 587, 303, 241, 450, 612, 424, 403, 565, 774, 236, 357, 215, 189, 398, 777, 346, 673, 242, 660, 589, 452, 566, 405, 358, 647, 616, 595, 190, 311, 569, 778, 432, 361, 674, 219, 348, 590, 244, 543, 419, 832, 406, 335, 664, 785, 231, 456, 570, 597, 409, 362, 651, 780, 315, 676, 221, 624, 127, 705, 786, 421, 248, 369, 611, 598, 410, 572, 235, 364, 653, 222, 343, 601, 317, 559, 464, 706, 422, 680, 801, 370, 659, 788, 451, 613, 425, 412, 654, 775, 602, 237, 318, 896, 399, 802, 347, 708, 243, 372, 661, 614, 426, 453, 567, 792, 238, 359, 688, 617, 191, 604, 480, 779, 433, 675, 804, 349, 662, 591, 245, 454, 712, 833, 428, 407, 376, 665, 618, 457, 571, 434, 363, 781, 350, 677, 246, 625, 834, 808, 666, 787, 249, 458, 620, 599, 411, 573, 782, 720, 436, 365, 678, 223, 626, 465, 707, 423, 836, 681, 250, 371, 668, 789, 460, 574, 413, 366, 655, 816, 603, 319, 897, 466, 628, 440, 682, 803, 709, 790, 252, 373, 615, 427, 840, 414, 736, 793, 239, 689, 898, 605, 481, 468, 710, 684, 805, 374, 663, 632, 455, 713, 794, 429, 377, 690, 619, 606, 482, 900, 435, 848, 806, 351, 247, 472, 714, 835, 430, 809, 378, 667, 796, 459, 692, 621, 484, 783, 721, 437, 679, 904, 627, 810, 716, 837, 251, 380, 669, 622, 461, 575, 864, 722, 438, 367, 696, 817, 488, 467, 629, 838, 441, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 849, 444, 686, 807, 634, 928, 473, 715, 431, 844, 379, 740, 797, 693, 902, 850, 485, 824, 905, 474, 636, 811, 717, 798, 381, 694, 623, 486, 744, 865, 723, 439, 852, 697, 906, 489, 476, 718, 839, 813, 382, 671, 960, 463, 913, 866, 698, 819, 725, 490, 908, 631, 443, 856, 814, 752, 255, 914, 843, 497, 739, 868, 726, 700, 821, 492, 471, 729, 445, 687, 635, 929, 498, 916, 845, 741, 822, 903, 872, 730, 851, 446, 825, 930, 475, 637, 846, 500, 742, 799, 695, 920, 487, 745, 826, 732, 853, 907, 638, 932, 477, 719, 880, 383, 961, 504, 746, 867, 854, 699, 828, 491, 909, 478, 857, 815, 753, 962, 936, 915, 748, 869, 727, 701, 910, 858, 493, 754, 964, 499, 917, 870, 702, 823, 494, 944, 873, 731, 447, 860, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q185_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 544, 89, 47, 194, 168, 289, 147, 276, 518, 101, 142, 263, 521, 90, 384, 290, 196, 149, 102, 55, 280, 522, 176, 105, 92, 267, 163, 576, 292, 150, 79, 529, 200, 321, 153, 106, 524, 59, 269, 165, 530, 113, 322, 296, 154, 275, 108, 87, 61, 270, 208, 166, 545, 114, 532, 195, 324, 169, 156, 277, 519, 62, 640, 143, 304, 546, 91, 385, 116, 170, 291, 197, 278, 536, 103, 328, 224, 281, 523, 177, 386, 548, 93, 198, 172, 577, 293, 151, 120, 201, 282, 178, 107, 525, 94, 388, 336, 578, 294, 552, 531, 202, 323, 297, 155, 284, 526, 180, 109, 768, 271, 209, 167, 580, 392, 115, 533, 298, 204, 325, 157, 110, 560, 63, 352, 641, 210, 184, 305, 547, 534, 117, 326, 171, 584, 300, 158, 279, 537, 400, 329, 642, 225, 306, 212, 387, 549, 118, 199, 173, 538, 121, 330, 226, 283, 644, 179, 592, 308, 550, 95, 389, 216, 337, 174, 579, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 185, 582, 394, 556, 535, 206, 327, 656, 585, 301, 159, 448, 562, 401, 354, 643, 772, 186, 307, 213, 396, 119, 344, 586, 302, 240, 539, 402, 331, 564, 227, 356, 645, 214, 188, 593, 309, 551, 776, 672, 217, 175, 588, 123, 541, 417, 404, 333, 646, 229, 594, 310, 568, 391, 360, 649, 218, 339, 313, 555, 542, 418, 125, 334, 784, 230, 287, 609, 183, 596, 408, 650, 771, 233, 314, 220, 341, 583, 395, 557, 126, 704, 420, 207, 368, 657, 610, 449, 563, 234, 355, 652, 773, 342, 187, 600, 316, 558, 397, 800, 345, 658, 587, 303, 241, 450, 612, 424, 403, 565, 774, 236, 357, 215, 189, 398, 777, 346, 673, 242, 660, 589, 452, 566, 405, 358, 647, 616, 190, 595, 311, 569, 778, 432, 361, 674, 219, 348, 590, 244, 543, 419, 832, 406, 335, 664, 785, 231, 456, 570, 597, 409, 362, 651, 780, 315, 676, 221, 624, 127, 705, 421, 786, 248, 369, 611, 598, 410, 572, 235, 364, 653, 222, 343, 601, 317, 559, 464, 706, 422, 680, 801, 370, 659, 788, 451, 613, 425, 412, 654, 775, 237, 602, 318, 896, 399, 802, 347, 708, 243, 372, 661, 614, 426, 453, 567, 792, 238, 359, 688, 617, 191, 604, 480, 779, 433, 675, 804, 349, 662, 591, 245, 454, 712, 428, 833, 407, 376, 665, 618, 457, 571, 434, 363, 781, 350, 677, 246, 625, 834, 808, 666, 787, 249, 458, 620, 599, 411, 573, 782, 720, 436, 365, 678, 223, 626, 465, 707, 423, 836, 681, 250, 371, 668, 789, 460, 574, 413, 366, 655, 816, 603, 319, 897, 466, 628, 440, 682, 803, 709, 790, 252, 373, 615, 427, 840, 414, 736, 793, 239, 689, 898, 605, 481, 468, 710, 684, 805, 374, 663, 632, 455, 713, 429, 794, 377, 690, 619, 606, 482, 900, 435, 848, 806, 351, 247, 472, 714, 430, 835, 809, 378, 667, 796, 459, 692, 621, 484, 783, 721, 437, 679, 904, 627, 810, 716, 837, 251, 380, 669, 622, 461, 575, 864, 722, 438, 367, 696, 817, 488, 467, 629, 441, 838, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 444, 849, 686, 807, 634, 928, 473, 715, 431, 844, 379, 740, 797, 693, 902, 485, 850, 824, 905, 474, 636, 811, 717, 798, 381, 694, 623, 486, 744, 865, 723, 439, 852, 697, 906, 489, 476, 718, 839, 813, 382, 671, 960, 463, 913, 866, 698, 819, 725, 490, 908, 631, 443, 856, 814, 752, 255, 914, 843, 497, 739, 868, 726, 700, 821, 492, 471, 729, 445, 687, 635, 929, 498, 916, 845, 741, 822, 903, 872, 730, 446, 851, 825, 930, 475, 637, 846, 500, 742, 799, 695, 920, 487, 745, 826, 732, 853, 907, 638, 932, 477, 719, 880, 383, 961, 504, 746, 867, 854, 699, 828, 491, 909, 478, 857, 815, 753, 962, 936, 915, 748, 869, 727, 701, 910, 493, 858, 754, 964, 499, 917, 870, 702, 823, 494, 944, 873, 731, 447, 860, 756, 931, 918, 847, 501, 743, 968, 921, 874, 827, 733, 639, 933, 502, 760, 881, 922, 505, 747, 876, 734, 855, 829, 976, 934, 479, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q186_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 513, 82, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 517, 86, 60, 141, 89, 544, 47, 194, 168, 289, 147, 276, 518, 101, 142, 263, 521, 90, 384, 290, 196, 149, 102, 55, 280, 522, 176, 105, 92, 267, 163, 576, 292, 150, 79, 529, 200, 321, 153, 106, 524, 59, 269, 165, 530, 113, 322, 296, 154, 275, 108, 87, 61, 270, 208, 166, 545, 114, 532, 195, 324, 169, 156, 277, 519, 62, 640, 143, 304, 91, 546, 385, 116, 170, 291, 197, 278, 536, 103, 328, 224, 281, 523, 177, 386, 93, 548, 198, 172, 577, 293, 151, 120, 201, 282, 178, 107, 525, 94, 388, 336, 578, 294, 552, 531, 202, 323, 297, 155, 284, 526, 180, 109, 768, 271, 209, 167, 580, 392, 115, 533, 298, 204, 325, 157, 110, 560, 63, 352, 641, 210, 184, 305, 547, 534, 117, 326, 171, 584, 300, 158, 279, 537, 400, 329, 642, 225, 306, 212, 387, 549, 118, 199, 173, 538, 121, 330, 226, 283, 644, 179, 592, 308, 95, 550, 389, 216, 337, 174, 579, 295, 553, 122, 540, 416, 203, 332, 228, 285, 527, 181, 390, 648, 769, 338, 312, 554, 581, 393, 124, 299, 205, 286, 608, 182, 111, 561, 770, 232, 353, 211, 340, 185, 582, 394, 556, 535, 206, 327, 656, 585, 301, 159, 448, 562, 401, 354, 643, 772, 186, 307, 213, 396, 119, 344, 586, 302, 240, 539, 402, 331, 564, 227, 356, 645, 214, 188, 593, 309, 551, 776, 217, 672, 175, 588, 123, 541, 417, 404, 333, 646, 229, 594, 310, 568, 391, 360, 649, 218, 339, 313, 555, 542, 418, 125, 334, 784, 230, 287, 609, 183, 596, 408, 650, 771, 233, 314, 220, 341, 583, 395, 557, 126, 704, 420, 207, 368, 657, 610, 449, 563, 234, 355, 652, 773, 342, 187, 600, 316, 558, 397, 345, 800, 658, 587, 303, 241, 450, 612, 424, 403, 565, 774, 236, 357, 215, 189, 398, 777, 346, 673, 242, 660, 589, 452, 566, 405, 358, 647, 616, 190, 595, 311, 569, 778, 432, 361, 219, 674, 348, 590, 244, 543, 419, 832, 406, 335, 664, 785, 231, 456, 570, 597, 409, 362, 651, 780, 315, 221, 676, 624, 127, 705, 421, 786, 248, 369, 611, 598, 410, 572, 235, 364, 653, 222, 343, 601, 317, 559, 464, 706, 422, 680, 801, 370, 659, 788, 451, 613, 425, 412, 654, 775, 237, 602, 318, 896, 399, 347, 802, 708, 243, 372, 661, 614, 426, 453, 567, 792, 238, 359, 688, 617, 191, 604, 480, 779, 433, 675, 349, 804, 662, 591, 245, 454, 712, 428, 833, 407, 376, 665, 618, 457, 571, 434, 363, 781, 350, 677, 246, 625, 834, 808, 666, 787, 249, 458, 620, 599, 411, 573, 782, 720, 436, 365, 223, 678, 626, 465, 707, 423, 836, 681, 250, 371, 668, 789, 460, 574, 413, 366, 655, 816, 603, 319, 897, 466, 628, 440, 682, 803, 709, 790, 252, 373, 615, 427, 840, 414, 736, 793, 239, 689, 898, 605, 481, 468, 710, 684, 805, 374, 663, 632, 455, 713, 429, 794, 377, 690, 619, 606, 482, 900, 435, 848, 351, 806, 247, 472, 714, 430, 835, 809, 378, 667, 796, 459, 692, 621, 484, 783, 721, 437, 679, 904, 627, 810, 716, 837, 251, 380, 669, 622, 461, 575, 864, 722, 438, 367, 696, 817, 488, 467, 629, 441, 838, 683, 812, 670, 791, 253, 462, 912, 841, 415, 737, 818, 724, 899, 630, 442, 469, 711, 685, 254, 375, 633, 842, 496, 738, 795, 691, 820, 607, 483, 901, 470, 728, 444, 849, 686, 807, 634, 473, 928, 715, 431, 844, 379, 740, 797, 693, 902, 485, 850, 824, 905, 474, 636, 811, 717, 798, 381, 694, 623, 486, 744, 865, 723, 439, 852, 697, 906, 489, 476, 718, 839, 813, 382, 671, 960, 463, 913, 866, 698, 819, 725, 490, 908, 631, 443, 856, 814, 752, 255, 914, 843, 497, 739, 868, 726, 700, 821, 492, 471, 729, 445, 687, 635, 929, 498, 916, 845, 741, 822, 903, 872, 730, 446, 851, 825, 475, 930, 637, 846, 500, 742, 799, 695, 920, 487, 745, 826, 732, 853, 907, 638, 477, 932, 719, 880, 383, 961, 504, 746, 867, 854, 699, 828, 491, 909, 478, 857, 815, 753, 962, 936, 915, 748, 869, 727, 701, 910, 493, 858, 754, 964, 499, 917, 870, 702, 823, 494, 944, 873, 731, 447, 860, 756, 931, 918, 847, 501, 743, 968, 921, 874, 827, 733, 639, 933, 502, 760, 881, 922, 505, 747, 876, 734, 855, 829, 976, 479, 934, 882, 963, 937, 506, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 941, 510, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q187_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 86, 517, 60, 141, 89, 544, 47, 194, 168, 289, 147, 276, 518, 101, 142, 263, 90, 521, 384, 290, 196, 149, 102, 55, 280, 522, 176, 105, 92, 267, 163, 576, 292, 150, 79, 529, 200, 321, 153, 106, 524, 59, 269, 165, 530, 113, 322, 296, 154, 275, 108, 87, 61, 270, 208, 166, 114, 545, 532, 195, 324, 169, 156, 277, 519, 62, 640, 143, 304, 91, 546, 385, 116, 170, 291, 197, 278, 536, 103, 328, 224, 281, 523, 177, 386, 93, 548, 198, 172, 577, 293, 151, 120, 201, 282, 178, 107, 94, 525, 388, 336, 578, 294, 552, 531, 202, 323, 297, 155, 284, 526, 180, 109, 768, 271, 209, 167, 580, 392, 115, 533, 298, 204, 325, 157, 110, 560, 63, 352, 210, 641, 184, 305, 547, 534, 117, 326, 171, 584, 300, 158, 279, 537, 400, 329, 642, 225, 306, 212, 387, 118, 549, 199, 173, 538, 121, 330, 226, 283, 644, 179, 592, 308, 95, 550, 389, 216, 337, 174, 579, 295, 122, 553, 540, 416, 203, 332, 228, 285, 527, 181, 390, 648, 338, 769, 312, 554, 581, 393, 124, 299, 205, 286, 608, 182, 111, 561, 770, 232, 353, 211, 340, 185, 582, 394, 556, 535, 206, 327, 656, 585, 301, 159, 448, 562, 401, 354, 643, 772, 186, 307, 213, 396, 119, 344, 586, 302, 240, 539, 402, 331, 564, 227, 356, 214, 645, 188, 593, 309, 551, 776, 217, 672, 175, 588, 123, 541, 417, 404, 333, 646, 229, 594, 310, 568, 391, 360, 218, 649, 339, 313, 555, 542, 418, 125, 334, 784, 230, 287, 609, 183, 596, 408, 650, 771, 233, 314, 220, 341, 583, 395, 126, 557, 704, 420, 207, 368, 657, 610, 449, 563, 234, 355, 652, 342, 773, 187, 600, 316, 558, 397, 345, 800, 658, 587, 303, 241, 450, 612, 424, 403, 565, 774, 236, 357, 215, 189, 398, 346, 777, 242, 673, 660, 589, 452, 566, 405, 358, 647, 616, 190, 595, 311, 569, 778, 432, 361, 219, 674, 348, 590, 244, 543, 419, 832, 406, 335, 664, 785, 231, 456, 570, 597, 409, 362, 651, 780, 315, 221, 676, 624, 127, 705, 421, 786, 248, 369, 611, 598, 410, 572, 235, 364, 222, 653, 343, 601, 317, 559, 464, 706, 422, 680, 370, 801, 659, 788, 451, 613, 425, 412, 654, 775, 237, 602, 318, 896, 399, 347, 802, 708, 243, 372, 661, 614, 426, 453, 567, 792, 238, 359, 688, 617, 191, 604, 480, 779, 433, 675, 349, 804, 662, 591, 245, 454, 712, 428, 833, 407, 376, 665, 618, 457, 571, 434, 363, 350, 781, 246, 677, 625, 834, 808, 666, 787, 249, 458, 620, 599, 411, 573, 782, 720, 436, 365, 223, 678, 626, 465, 707, 423, 836, 250, 681, 371, 668, 789, 460, 574, 413, 366, 655, 816, 603, 319, 466, 897, 628, 440, 682, 803, 709, 790, 252, 373, 615, 427, 840, 414, 736, 793, 239, 689, 898, 605, 481, 468, 710, 684, 374, 805, 663, 632, 455, 713, 429, 794, 377, 690, 619, 606, 482, 900, 435, 848, 351, 806, 247, 472, 714, 430, 835, 378, 809, 667, 796, 459, 692, 621, 484, 783, 721, 437, 679, 904, 627, 810, 716, 837, 251, 380, 669, 622, 461, 575, 864, 722, 438, 367, 696, 817, 488, 467, 629, 441, 838, 683, 812, 670, 791, 253, 462, 912, 841, 415, 737, 818, 724, 899, 630, 442, 469, 711, 254, 685, 375, 633, 842, 496, 738, 795, 691, 820, 607, 483, 470, 901, 728, 444, 849, 686, 807, 634, 473, 928, 715, 431, 844, 379, 740, 797, 693, 902, 485, 850, 824, 474, 905, 636, 811, 717, 798, 381, 694, 623, 486, 744, 865, 723, 439, 852, 697, 906, 489, 476, 718, 839, 382, 813, 671, 960, 463, 913, 866, 698, 819, 725, 490, 908, 631, 443, 856, 814, 752, 255, 914, 843, 497, 739, 868, 726, 700, 821, 492, 471, 729, 445, 687, 635, 498, 929, 916, 845, 741, 822, 903, 872, 730, 446, 851, 825, 475, 930, 637, 846, 500, 742, 799, 695, 920, 487, 745, 826, 732, 853, 907, 638, 477, 932, 719, 880, 383, 961, 504, 746, 867, 854, 699, 828, 491, 478, 909, 857, 815, 753, 962, 936, 915, 748, 869, 727, 701, 910, 493, 858, 754, 964, 499, 917, 870, 702, 823, 494, 944, 873, 731, 447, 860, 756, 931, 918, 847, 501, 743, 968, 921, 874, 827, 733, 639, 502, 933, 760, 881, 922, 505, 747, 876, 734, 855, 829, 976, 479, 934, 882, 963, 506, 937, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q188_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 86, 517, 60, 141, 89, 544, 47, 194, 168, 289, 147, 276, 518, 101, 142, 263, 90, 521, 384, 290, 196, 149, 102, 55, 280, 522, 176, 105, 92, 267, 163, 576, 292, 150, 79, 529, 200, 321, 153, 106, 524, 59, 269, 165, 530, 113, 322, 296, 154, 275, 108, 87, 61, 270, 208, 166, 114, 545, 532, 195, 324, 169, 156, 277, 519, 62, 640, 143, 304, 91, 546, 385, 116, 170, 291, 197, 278, 536, 103, 328, 224, 281, 523, 177, 93, 386, 548, 198, 172, 577, 293, 151, 120, 201, 282, 178, 107, 94, 525, 388, 336, 578, 294, 552, 531, 202, 323, 297, 155, 284, 526, 180, 109, 768, 271, 209, 167, 580, 392, 115, 533, 298, 204, 325, 157, 110, 560, 63, 352, 210, 641, 184, 305, 547, 534, 117, 326, 171, 584, 300, 158, 279, 537, 400, 329, 642, 225, 306, 212, 387, 118, 549, 199, 173, 538, 121, 330, 226, 283, 644, 179, 592, 308, 95, 550, 389, 216, 337, 174, 579, 295, 122, 553, 540, 416, 203, 332, 228, 285, 527, 181, 390, 648, 338, 769, 312, 554, 581, 393, 124, 299, 205, 286, 608, 182, 111, 561, 770, 232, 353, 211, 340, 185, 582, 394, 556, 535, 206, 327, 656, 585, 301, 159, 448, 562, 401, 354, 643, 186, 772, 307, 213, 396, 119, 344, 586, 302, 240, 539, 402, 331, 564, 227, 356, 214, 645, 188, 593, 309, 551, 776, 217, 672, 175, 588, 123, 541, 417, 404, 333, 646, 229, 594, 310, 568, 391, 360, 218, 649, 339, 313, 555, 542, 125, 418, 334, 784, 230, 287, 609, 183, 596, 408, 650, 771, 233, 314, 220, 341, 583, 395, 126, 557, 704, 420, 207, 368, 657, 610, 449, 563, 234, 355, 652, 342, 187, 773, 600, 316, 558, 397, 345, 800, 658, 587, 303, 241, 450, 612, 424, 403, 565, 774, 236, 357, 215, 189, 398, 346, 777, 242, 673, 660, 589, 452, 566, 405, 358, 647, 616, 190, 595, 311, 569, 778, 432, 361, 219, 674, 348, 590, 244, 543, 419, 832, 406, 335, 664, 785, 231, 456, 570, 597, 409, 362, 651, 780, 315, 221, 676, 624, 127, 705, 421, 786, 248, 369, 611, 598, 410, 572, 235, 364, 222, 653, 343, 601, 317, 559, 464, 706, 422, 680, 370, 801, 659, 788, 451, 613, 425, 412, 654, 775, 237, 602, 318, 896, 399, 347, 802, 708, 243, 372, 661, 614, 426, 453, 567, 792, 238, 359, 688, 617, 191, 604, 480, 779, 433, 675, 349, 804, 662, 591, 245, 454, 712, 428, 833, 407, 376, 665, 618, 457, 571, 434, 363, 350, 781, 246, 677, 625, 834, 808, 666, 787, 249, 458, 620, 599, 411, 573, 782, 720, 436, 365, 223, 678, 626, 465, 707, 423, 250, 836, 681, 371, 668, 789, 460, 574, 413, 366, 655, 816, 603, 319, 466, 897, 628, 440, 682, 803, 709, 790, 252, 373, 615, 427, 840, 414, 736, 793, 239, 689, 605, 898, 481, 468, 710, 684, 374, 805, 663, 632, 455, 713, 429, 794, 377, 690, 619, 606, 482, 900, 435, 848, 351, 806, 247, 472, 714, 430, 835, 378, 809, 667, 796, 459, 692, 621, 484, 783, 721, 437, 679, 904, 627, 810, 716, 251, 837, 380, 669, 622, 461, 575, 864, 722, 438, 367, 696, 817, 488, 467, 629, 441, 838, 683, 812, 670, 791, 253, 462, 912, 841, 415, 737, 818, 724, 899, 630, 442, 469, 711, 254, 685, 375, 633, 842, 496, 738, 795, 691, 820, 607, 483, 470, 901, 728, 444, 849, 686, 807, 634, 473, 928, 715, 431, 844, 379, 740, 797, 693, 902, 485, 850, 824, 474, 905, 636, 811, 717, 798, 381, 694, 623, 486, 744, 865, 723, 439, 852, 697, 906, 489, 476, 718, 839, 382, 813, 671, 960, 463, 913, 866, 698, 819, 725, 490, 908, 631, 443, 856, 814, 752, 255, 914, 843, 497, 739, 868, 726, 700, 821, 492, 471, 729, 445, 687, 635, 498, 929, 916, 845, 741, 822, 903, 872, 730, 446, 851, 825, 475, 637, 930, 846, 500, 742, 799, 695, 920, 487, 745, 826, 732, 853, 907, 638, 477, 932, 719, 880, 383, 961, 504, 746, 867, 854, 699, 828, 491, 478, 909, 857, 815, 753, 962, 936, 915, 748, 869, 727, 701, 910, 493, 858, 754, 964, 499, 917, 870, 702, 823, 494, 944, 873, 731, 447, 860, 756, 931, 918, 847, 501, 743, 968, 921, 874, 827, 733, 639, 502, 933, 760, 881, 922, 505, 747, 876, 734, 855, 829, 976, 479, 934, 882, 963, 506, 937, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q189_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 512, 15, 136, 257, 42, 69, 96, 49, 258, 70, 44, 23, 144, 73, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 516, 51, 140, 261, 88, 46, 288, 146, 75, 100, 53, 262, 520, 265, 161, 148, 77, 54, 135, 104, 83, 57, 266, 162, 78, 528, 31, 320, 152, 273, 515, 58, 85, 139, 268, 164, 112, 193, 274, 99, 86, 517, 60, 141, 89, 544, 47, 194, 168, 289, 147, 276, 518, 101, 142, 263, 90, 521, 384, 290, 196, 149, 102, 55, 280, 522, 176, 105, 92, 267, 163, 576, 292, 150, 79, 529, 200, 321, 153, 106, 524, 59, 269, 165, 530, 113, 322, 296, 154, 275, 108, 87, 61, 270, 208, 166, 114, 545, 532, 195, 324, 169, 156, 277, 519, 62, 640, 143, 304, 91, 546, 385, 116, 170, 291, 197, 278, 536, 103, 328, 224, 281, 523, 177, 93, 386, 548, 198, 172, 577, 293, 151, 120, 201, 282, 178, 107, 94, 525, 388, 336, 578, 294, 552, 531, 202, 323, 297, 155, 284, 526, 180, 109, 768, 271, 209, 167, 580, 115, 392, 533, 298, 204, 325, 157, 110, 560, 63, 352, 210, 641, 184, 305, 547, 534, 117, 326, 171, 584, 300, 158, 279, 537, 400, 329, 642, 225, 306, 212, 387, 118, 549, 199, 173, 538, 121, 330, 226, 283, 644, 179, 592, 308, 95, 550, 389, 216, 337, 174, 579, 295, 122, 553, 540, 416, 203, 332, 228, 285, 527, 181, 390, 648, 338, 769, 312, 554, 581, 393, 124, 299, 205, 286, 608, 182, 111, 561, 770, 232, 353, 211, 340, 185, 582, 394, 556, 535, 206, 327, 656, 585, 301, 159, 448, 562, 401, 354, 643, 186, 772, 307, 213, 119, 396, 344, 586, 302, 240, 539, 402, 331, 564, 227, 356, 214, 645, 188, 593, 309, 551, 776, 217, 672, 175, 588, 123, 541, 417, 404, 333, 646, 229, 594, 310, 568, 391, 360, 218, 649, 339, 313, 555, 542, 125, 418, 334, 230, 784, 287, 609, 183, 596, 408, 650, 771, 233, 314, 220, 341, 583, 395, 126, 557, 704, 420, 207, 368, 657, 610, 449, 563, 234, 355, 652, 342, 187, 773, 600, 316, 558, 397, 345, 800, 658, 587, 303, 241, 450, 612, 424, 403, 565, 774, 236, 357, 215, 189, 398, 346, 777, 242, 673, 660, 589, 452, 566, 405, 358, 647, 616, 190, 595, 311, 569, 778, 432, 361, 219, 674, 348, 590, 244, 543, 419, 832, 406, 335, 664, 231, 785, 456, 570, 597, 409, 362, 651, 780, 315, 221, 676, 624, 127, 705, 421, 786, 248, 369, 611, 598, 410, 572, 235, 364, 222, 653, 343, 601, 317, 559, 464, 706, 422, 680, 370, 801, 659, 788, 451, 613, 425, 412, 654, 775, 237, 602, 318, 896, 399, 347, 802, 708, 243, 372, 661, 614, 426, 453, 567, 238, 792, 359, 688, 617, 191, 604, 480, 779, 433, 675, 349, 804, 662, 591, 245, 454, 712, 428, 833, 407, 376, 665, 618, 457, 571, 434, 363, 350, 781, 246, 677, 625, 834, 808, 666, 787, 249, 458, 620, 599, 411, 573, 782, 720, 436, 365, 223, 678, 626, 465, 707, 423, 250, 836, 681, 371, 668, 789, 460, 574, 413, 366, 655, 816, 603, 319, 466, 897, 628, 440, 682, 803, 709, 790, 252, 373, 615, 427, 840, 414, 736, 239, 793, 689, 605, 898, 481, 468, 710, 684, 374, 805, 663, 632, 455, 713, 429, 794, 377, 690, 619, 606, 482, 900, 435, 848, 351, 806, 247, 472, 714, 430, 835, 378, 809, 667, 796, 459, 692, 621, 484, 783, 721, 437, 679, 627, 904, 810, 716, 251, 837, 380, 669, 622, 461, 575, 864, 722, 438, 367, 696, 817, 488, 467, 629, 441, 838, 683, 812, 670, 791, 253, 462, 912, 841, 415, 737, 818, 724, 899, 630, 442, 469, 711, 254, 685, 375, 633, 842, 496, 738, 795, 691, 820, 607, 483, 470, 901, 728, 444, 849, 686, 807, 634, 473, 928, 715, 431, 844, 379, 740, 797, 693, 902, 485, 850, 824, 474, 905, 636, 811, 717, 798, 381, 694, 623, 486, 744, 865, 723, 439, 852, 697, 906, 489, 476, 718, 839, 382, 813, 671, 960, 463, 913, 866, 698, 819, 725, 490, 631, 908, 443, 856, 814, 752, 255, 914, 843, 497, 739, 868, 726, 700, 821, 492, 471, 729, 445, 687, 635, 498, 929, 916, 845, 741, 822, 903, 872, 730, 446, 851, 825, 475, 637, 930, 846, 500, 742, 799, 695, 920, 487, 745, 826, 732, 853, 907, 638, 477, 932, 719, 880, 383, 961, 504, 746, 867, 854, 699, 828, 491, 478, 909, 857, 815, 753, 962, 936, 915, 748, 869, 727, 701, 910, 493, 858, 754, 964, 499, 917, 870, 702, 823, 494, 944, 873, 731, 447, 860, 756, 931, 918, 847, 501, 743, 968, 921, 874, 827, 733, 639, 502, 933, 760, 881, 922, 505, 747, 876, 734, 855, 829, 976, 479, 934, 882, 963, 506, 937, 924, 749, 830, 911, 859, 755, 884, 938, 965, 508, 750, 871, 703, 992, 495, 945, 861, 757, 966, 940, 919, 888, 969, 946, 875, 862, 758, 503, 761, 970, 923, 948, 877, 735, 977, 935, 762, 883, 972, 507, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 950, 879, 1000, 979, 953, 765, 974, 927, 954, 981, 766, 887, 1008, 511, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q190_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 516, 51, 140, 261, 88, 46, 75, 146, 288, 100, 53, 262, 520, 265, 161, 77, 148, 54, 135, 104, 83, 57, 266, 162, 78, 31, 528, 320, 152, 273, 515, 58, 85, 139, 268, 164, 112, 193, 274, 99, 86, 517, 60, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 524, 59, 269, 165, 530, 113, 322, 154, 296, 275, 108, 87, 61, 270, 208, 166, 114, 545, 532, 195, 324, 169, 156, 277, 519, 62, 143, 640, 91, 304, 546, 385, 116, 170, 291, 197, 278, 536, 103, 328, 224, 281, 523, 177, 93, 386, 548, 198, 172, 151, 293, 577, 120, 201, 282, 107, 178, 94, 525, 388, 336, 294, 578, 552, 531, 202, 323, 155, 297, 284, 526, 109, 180, 271, 768, 209, 167, 580, 115, 392, 533, 298, 204, 325, 157, 110, 63, 560, 210, 352, 641, 184, 305, 547, 534, 117, 326, 171, 158, 300, 584, 279, 537, 329, 400, 642, 225, 306, 212, 387, 118, 549, 199, 173, 538, 121, 330, 226, 283, 644, 179, 95, 308, 592, 550, 389, 216, 337, 174, 295, 579, 122, 553, 540, 203, 416, 332, 228, 285, 527, 181, 390, 648, 338, 769, 312, 554, 581, 393, 124, 299, 205, 286, 111, 182, 608, 561, 770, 232, 211, 353, 340, 185, 582, 394, 556, 535, 206, 327, 159, 301, 585, 656, 448, 562, 401, 354, 643, 186, 772, 307, 213, 119, 396, 344, 302, 586, 240, 539, 331, 402, 564, 227, 214, 356, 645, 188, 309, 593, 551, 776, 217, 175, 672, 588, 123, 541, 417, 333, 404, 646, 229, 310, 594, 568, 391, 218, 360, 649, 339, 313, 555, 542, 125, 418, 334, 230, 287, 784, 183, 609, 596, 408, 650, 771, 233, 314, 220, 341, 583, 395, 126, 557, 207, 420, 704, 368, 657, 610, 449, 563, 234, 355, 652, 342, 187, 773, 316, 600, 558, 397, 345, 303, 587, 658, 800, 241, 450, 612, 424, 403, 565, 774, 236, 215, 357, 189, 398, 346, 777, 242, 673, 589, 660, 452, 566, 405, 358, 647, 190, 616, 311, 595, 569, 778, 219, 361, 432, 674, 348, 590, 244, 543, 419, 335, 406, 832, 664, 231, 785, 456, 570, 597, 409, 362, 651, 780, 315, 221, 676, 127, 624, 421, 705, 786, 248, 369, 611, 598, 410, 572, 235, 222, 364, 653, 343, 317, 601, 559, 464, 422, 706, 680, 370, 659, 801, 788, 451, 613, 425, 412, 654, 775, 237, 318, 602, 399, 896, 347, 802, 708, 243, 372, 661, 614, 426, 453, 567, 238, 792, 359, 191, 617, 688, 604, 480, 779, 433, 675, 349, 591, 662, 804, 245, 454, 428, 712, 407, 833, 376, 665, 618, 457, 571, 363, 434, 350, 781, 246, 677, 625, 834, 666, 808, 787, 249, 458, 620, 599, 411, 573, 782, 223, 365, 436, 720, 678, 626, 465, 423, 707, 250, 836, 681, 371, 668, 789, 460, 574, 413, 366, 655, 319, 603, 816, 466, 897, 628, 440, 682, 803, 709, 790, 252, 373, 615, 427, 414, 840, 239, 736, 793, 689, 605, 898, 481, 468, 710, 684, 374, 663, 805, 632, 455, 429, 713, 794, 377, 619, 690, 606, 482, 900, 435, 351, 848, 806, 247, 472, 430, 714, 835, 378, 667, 809, 796, 459, 621, 692, 484, 783, 437, 721, 679, 627, 904, 810, 716, 251, 837, 380, 669, 622, 461, 575, 367, 438, 722, 864, 696, 817, 488, 467, 629, 441, 838, 683, 670, 812, 791, 253, 462, 415, 841, 912, 737, 818, 724, 899, 630, 442, 469, 711, 254, 685, 375, 633, 842, 496, 738, 795, 691, 607, 820, 483, 470, 901, 444, 728, 849, 686, 807, 634, 473, 431, 715, 928, 844, 379, 740, 797, 693, 902, 485, 850, 824, 474, 905, 636, 811, 717, 798, 381, 623, 694, 486, 744, 439, 723, 865, 852, 697, 906, 489, 476, 718, 839, 382, 671, 813, 463, 960, 913, 866, 698, 819, 725, 490, 631, 908, 443, 856, 814, 255, 752, 843, 914, 497, 739, 726, 868, 700, 821, 492, 471, 445, 729, 687, 635, 498, 929, 845, 916, 741, 822, 903, 446, 730, 872, 851, 825, 475, 637, 930, 846, 500, 742, 799, 695, 920, 487, 745, 826, 732, 853, 907, 638, 477, 719, 932, 383, 880, 961, 504, 746, 867, 854, 699, 828, 491, 478, 909, 857, 815, 753, 962, 936, 915, 748, 727, 869, 701, 910, 493, 858, 754, 964, 499, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 963, 506, 937, 924, 749, 830, 911, 859, 755, 884, 938, 965, 508, 750, 871, 703, 495, 992, 945, 861, 757, 966, 940, 919, 888, 969, 875, 946, 862, 758, 503, 761, 970, 923, 735, 877, 948, 977, 935, 762, 883, 972, 507, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q191_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 516, 51, 140, 261, 88, 46, 75, 146, 288, 100, 53, 262, 520, 265, 161, 77, 148, 54, 135, 104, 83, 57, 266, 162, 78, 31, 528, 320, 152, 273, 515, 58, 85, 139, 268, 164, 112, 193, 274, 99, 86, 517, 60, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 524, 59, 269, 165, 530, 113, 322, 154, 296, 275, 108, 87, 61, 270, 208, 166, 114, 545, 532, 195, 324, 169, 156, 277, 519, 62, 143, 640, 91, 304, 546, 116, 385, 170, 291, 197, 278, 536, 103, 328, 224, 281, 523, 177, 93, 386, 548, 198, 172, 151, 293, 577, 120, 201, 282, 107, 178, 94, 525, 388, 336, 294, 578, 552, 531, 202, 323, 155, 297, 284, 526, 109, 180, 271, 768, 209, 167, 580, 115, 392, 533, 298, 204, 325, 157, 110, 63, 560, 210, 352, 641, 184, 305, 547, 534, 117, 326, 171, 158, 300, 584, 279, 537, 329, 400, 642, 225, 306, 212, 118, 387, 549, 199, 173, 538, 121, 330, 226, 283, 644, 179, 95, 308, 592, 550, 389, 216, 174, 337, 295, 579, 122, 553, 540, 203, 416, 332, 228, 285, 527, 181, 390, 648, 338, 769, 312, 554, 581, 124, 393, 299, 205, 286, 111, 182, 608, 561, 232, 770, 211, 353, 340, 185, 582, 394, 556, 535, 206, 327, 159, 301, 585, 656, 448, 562, 401, 354, 643, 186, 772, 307, 213, 119, 396, 344, 302, 586, 240, 539, 331, 402, 564, 227, 214, 356, 645, 188, 309, 593, 551, 776, 217, 175, 672, 588, 123, 541, 417, 333, 404, 646, 229, 310, 594, 568, 391, 218, 360, 649, 339, 313, 555, 542, 125, 418, 334, 230, 287, 784, 183, 609, 596, 408, 650, 233, 771, 314, 220, 341, 583, 126, 395, 557, 207, 420, 704, 368, 657, 610, 449, 563, 234, 355, 652, 342, 187, 773, 316, 600, 558, 397, 345, 303, 587, 658, 800, 241, 450, 612, 424, 403, 565, 236, 774, 215, 357, 189, 398, 346, 777, 242, 673, 589, 660, 452, 566, 405, 358, 647, 190, 616, 311, 595, 569, 778, 219, 361, 432, 348, 674, 590, 244, 543, 419, 335, 406, 832, 664, 231, 785, 456, 570, 597, 409, 362, 651, 780, 315, 221, 676, 127, 624, 421, 705, 248, 786, 369, 611, 598, 410, 572, 235, 222, 364, 653, 343, 317, 601, 559, 464, 422, 706, 680, 370, 659, 801, 788, 451, 613, 425, 412, 654, 237, 775, 318, 602, 399, 896, 347, 802, 708, 243, 372, 661, 614, 426, 453, 567, 238, 792, 359, 191, 617, 688, 604, 480, 779, 433, 349, 675, 591, 662, 804, 245, 454, 428, 712, 407, 833, 376, 665, 618, 457, 571, 363, 434, 350, 781, 246, 677, 625, 834, 666, 808, 249, 787, 458, 620, 599, 411, 573, 782, 223, 365, 436, 720, 678, 626, 465, 423, 707, 250, 836, 681, 371, 668, 789, 460, 574, 413, 366, 655, 319, 603, 816, 466, 628, 897, 440, 682, 803, 709, 252, 790, 373, 615, 427, 414, 840, 239, 736, 793, 689, 605, 898, 481, 468, 710, 684, 374, 663, 805, 632, 455, 429, 713, 794, 377, 619, 690, 606, 482, 900, 435, 351, 848, 806, 247, 472, 430, 714, 835, 378, 667, 809, 796, 459, 621, 692, 484, 783, 437, 721, 679, 627, 904, 810, 716, 251, 837, 380, 669, 622, 461, 575, 367, 438, 722, 864, 696, 817, 488, 467, 629, 441, 838, 683, 670, 812, 253, 791, 462, 415, 841, 912, 737, 818, 724, 630, 899, 442, 469, 711, 254, 685, 375, 633, 842, 496, 738, 795, 691, 607, 820, 483, 470, 901, 444, 728, 686, 849, 807, 634, 473, 431, 715, 928, 844, 379, 740, 797, 693, 902, 485, 850, 824, 474, 636, 905, 811, 717, 798, 381, 623, 694, 486, 744, 439, 723, 865, 852, 697, 906, 489, 476, 718, 839, 382, 671, 813, 463, 960, 913, 866, 698, 819, 725, 490, 631, 908, 443, 856, 814, 255, 752, 843, 914, 497, 739, 726, 868, 700, 821, 492, 471, 445, 729, 687, 635, 498, 929, 845, 916, 741, 822, 903, 446, 730, 872, 851, 825, 475, 637, 930, 846, 500, 742, 799, 695, 920, 487, 745, 826, 732, 853, 638, 907, 477, 719, 932, 383, 880, 961, 504, 746, 867, 854, 699, 828, 491, 478, 909, 857, 815, 753, 962, 936, 915, 748, 727, 869, 701, 910, 493, 858, 754, 964, 499, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 963, 506, 937, 924, 749, 830, 911, 859, 755, 884, 938, 965, 508, 750, 871, 703, 495, 992, 945, 861, 757, 966, 940, 919, 888, 969, 875, 946, 862, 758, 503, 761, 970, 923, 735, 877, 948, 977, 935, 762, 883, 972, 507, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q192_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 515, 58, 85, 139, 268, 164, 112, 193, 274, 99, 86, 517, 60, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 519, 62, 143, 640, 91, 304, 546, 116, 385, 170, 291, 197, 278, 536, 103, 328, 224, 281, 523, 177, 93, 386, 548, 198, 172, 151, 293, 577, 120, 201, 282, 107, 178, 94, 525, 388, 336, 294, 578, 552, 531, 202, 323, 155, 297, 284, 526, 109, 180, 271, 768, 209, 167, 115, 580, 392, 533, 298, 204, 325, 157, 110, 63, 560, 210, 352, 641, 184, 305, 547, 534, 117, 171, 326, 158, 300, 584, 279, 537, 329, 400, 642, 225, 306, 212, 118, 387, 549, 199, 173, 538, 121, 330, 226, 283, 179, 644, 95, 308, 592, 550, 389, 216, 174, 337, 295, 579, 122, 553, 540, 203, 416, 332, 228, 285, 527, 181, 390, 338, 648, 769, 312, 554, 581, 124, 393, 299, 205, 286, 111, 182, 608, 561, 232, 770, 211, 353, 185, 340, 582, 394, 556, 535, 206, 327, 159, 301, 585, 656, 448, 562, 401, 354, 643, 186, 307, 772, 213, 119, 396, 344, 302, 586, 240, 539, 331, 402, 564, 227, 214, 356, 645, 188, 309, 593, 551, 776, 217, 175, 672, 123, 588, 541, 417, 333, 404, 646, 229, 310, 594, 568, 391, 218, 360, 339, 649, 313, 555, 542, 125, 418, 334, 230, 287, 784, 183, 609, 596, 408, 650, 233, 771, 314, 220, 341, 583, 126, 395, 557, 207, 420, 704, 368, 657, 610, 449, 563, 234, 355, 187, 342, 652, 773, 316, 600, 558, 397, 345, 303, 587, 658, 800, 241, 450, 612, 424, 403, 565, 236, 774, 215, 357, 189, 398, 346, 777, 242, 673, 589, 660, 452, 566, 405, 358, 647, 190, 616, 311, 595, 569, 778, 219, 361, 432, 348, 674, 590, 244, 543, 419, 335, 406, 832, 664, 231, 785, 456, 570, 597, 409, 362, 651, 315, 780, 221, 676, 127, 624, 421, 705, 248, 786, 369, 611, 598, 410, 572, 235, 222, 364, 343, 653, 317, 601, 559, 464, 422, 706, 370, 680, 659, 801, 788, 451, 613, 425, 412, 654, 237, 775, 318, 602, 399, 896, 347, 802, 243, 708, 372, 661, 614, 426, 453, 567, 238, 792, 359, 191, 617, 688, 604, 480, 779, 433, 349, 675, 591, 662, 804, 245, 454, 428, 712, 407, 833, 376, 665, 618, 457, 571, 363, 434, 350, 781, 246, 677, 625, 834, 666, 808, 249, 787, 458, 620, 599, 411, 573, 782, 223, 365, 436, 720, 678, 626, 465, 423, 707, 250, 371, 681, 836, 668, 789, 460, 574, 413, 366, 655, 319, 603, 816, 466, 628, 897, 440, 682, 803, 709, 252, 790, 373, 615, 427, 414, 840, 239, 736, 793, 689, 605, 898, 481, 468, 710, 374, 684, 663, 805, 632, 455, 429, 713, 794, 377, 619, 690, 606, 482, 435, 900, 351, 848, 806, 247, 472, 430, 714, 835, 378, 667, 809, 796, 459, 621, 692, 484, 783, 437, 721, 679, 627, 904, 810, 251, 716, 837, 380, 669, 622, 461, 575, 367, 438, 722, 864, 696, 817, 488, 467, 629, 441, 683, 838, 670, 812, 253, 791, 462, 415, 841, 912, 737, 818, 724, 630, 899, 442, 469, 711, 254, 375, 685, 633, 842, 496, 738, 795, 691, 607, 820, 483, 470, 901, 444, 728, 686, 849, 807, 634, 473, 431, 715, 928, 379, 844, 740, 797, 693, 902, 485, 850, 824, 474, 636, 905, 811, 717, 798, 381, 623, 694, 486, 744, 439, 723, 865, 697, 852, 906, 489, 476, 718, 839, 382, 671, 813, 463, 960, 913, 866, 698, 819, 725, 490, 631, 443, 908, 856, 814, 255, 752, 843, 914, 497, 739, 726, 868, 700, 821, 492, 471, 445, 729, 687, 635, 498, 929, 845, 916, 741, 822, 903, 446, 730, 872, 851, 825, 475, 637, 930, 846, 500, 742, 799, 695, 920, 487, 745, 826, 732, 853, 638, 907, 477, 719, 932, 383, 880, 961, 504, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 963, 506, 937, 924, 749, 830, 911, 859, 755, 884, 938, 965, 508, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q193_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 515, 58, 85, 139, 268, 164, 112, 193, 274, 99, 86, 517, 60, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 519, 62, 143, 640, 91, 304, 546, 116, 385, 170, 291, 197, 278, 103, 536, 328, 281, 224, 523, 177, 93, 386, 548, 198, 172, 151, 293, 577, 120, 201, 282, 107, 178, 94, 525, 388, 336, 294, 578, 552, 531, 202, 323, 155, 297, 284, 526, 109, 180, 271, 768, 209, 167, 115, 580, 392, 533, 298, 204, 325, 157, 110, 63, 560, 210, 352, 641, 184, 305, 547, 534, 117, 171, 326, 158, 300, 584, 279, 537, 329, 400, 642, 225, 306, 212, 118, 387, 549, 199, 173, 538, 121, 330, 283, 226, 179, 644, 95, 308, 592, 550, 389, 216, 174, 337, 295, 579, 122, 553, 540, 203, 416, 332, 285, 228, 527, 181, 390, 338, 648, 769, 312, 554, 581, 124, 393, 299, 205, 286, 111, 182, 608, 561, 232, 770, 211, 353, 185, 340, 582, 394, 556, 535, 206, 327, 159, 301, 585, 656, 562, 448, 401, 354, 643, 186, 307, 772, 213, 119, 396, 344, 302, 586, 240, 539, 331, 402, 564, 227, 214, 356, 645, 188, 309, 593, 551, 776, 217, 175, 672, 123, 588, 541, 417, 333, 404, 646, 229, 310, 594, 568, 391, 218, 360, 339, 649, 313, 555, 542, 125, 418, 334, 287, 230, 784, 183, 609, 596, 408, 650, 233, 771, 314, 220, 341, 583, 126, 395, 557, 207, 420, 704, 368, 657, 610, 563, 449, 234, 355, 187, 342, 652, 773, 316, 600, 558, 397, 345, 303, 587, 658, 800, 241, 450, 612, 424, 403, 565, 236, 774, 215, 357, 189, 398, 346, 777, 242, 673, 589, 660, 566, 452, 405, 358, 647, 190, 616, 311, 595, 569, 778, 219, 361, 432, 348, 674, 590, 244, 543, 419, 335, 406, 832, 231, 664, 785, 570, 456, 597, 409, 362, 651, 315, 780, 221, 676, 127, 624, 421, 705, 248, 786, 369, 611, 598, 410, 572, 235, 222, 364, 343, 653, 317, 601, 559, 464, 422, 706, 370, 680, 659, 801, 788, 451, 613, 425, 412, 654, 237, 775, 318, 602, 399, 896, 347, 802, 243, 708, 372, 661, 614, 426, 567, 453, 238, 359, 792, 191, 617, 688, 604, 480, 779, 433, 349, 675, 591, 662, 804, 245, 454, 428, 712, 407, 833, 376, 665, 618, 571, 457, 363, 434, 350, 781, 246, 677, 625, 834, 666, 808, 249, 787, 458, 620, 599, 411, 573, 782, 223, 365, 436, 720, 678, 626, 465, 423, 707, 250, 371, 681, 836, 668, 789, 574, 460, 413, 366, 655, 319, 603, 816, 466, 628, 897, 440, 682, 803, 709, 252, 790, 373, 615, 427, 414, 840, 239, 793, 736, 689, 605, 898, 481, 468, 710, 374, 684, 663, 805, 632, 455, 429, 713, 794, 377, 619, 690, 606, 482, 435, 900, 351, 848, 806, 247, 472, 430, 714, 835, 378, 667, 809, 796, 459, 621, 692, 484, 783, 437, 721, 679, 627, 904, 810, 251, 716, 837, 380, 669, 622, 575, 461, 367, 438, 722, 864, 696, 817, 488, 467, 629, 441, 683, 838, 670, 812, 253, 791, 462, 415, 841, 912, 737, 818, 724, 630, 899, 442, 469, 711, 254, 375, 685, 633, 842, 496, 795, 738, 691, 607, 820, 483, 470, 901, 444, 728, 686, 849, 807, 634, 473, 431, 715, 928, 379, 844, 797, 740, 693, 902, 485, 850, 824, 474, 636, 905, 811, 717, 798, 381, 623, 694, 486, 744, 439, 723, 865, 697, 852, 906, 489, 476, 718, 839, 382, 671, 813, 463, 960, 913, 866, 698, 819, 725, 490, 631, 443, 908, 856, 814, 255, 752, 843, 914, 497, 739, 726, 868, 700, 821, 492, 471, 445, 729, 687, 635, 498, 929, 845, 916, 741, 822, 903, 446, 730, 872, 851, 825, 475, 637, 930, 846, 500, 799, 742, 695, 487, 920, 745, 826, 732, 853, 638, 907, 477, 719, 932, 383, 880, 961, 504, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 963, 506, 937, 924, 749, 830, 911, 859, 755, 884, 938, 965, 508, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q194_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 513, 56, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 515, 58, 85, 139, 268, 164, 112, 193, 274, 99, 86, 517, 60, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 519, 62, 143, 640, 91, 304, 546, 116, 385, 170, 291, 197, 278, 103, 536, 328, 281, 224, 523, 177, 93, 386, 548, 198, 172, 151, 293, 577, 120, 201, 282, 107, 178, 94, 525, 388, 336, 294, 578, 552, 531, 202, 323, 155, 297, 284, 526, 109, 180, 271, 209, 768, 167, 115, 580, 392, 533, 298, 204, 325, 157, 110, 63, 560, 210, 352, 641, 184, 305, 547, 534, 117, 171, 326, 158, 300, 279, 584, 537, 329, 400, 642, 225, 306, 212, 118, 387, 549, 199, 173, 538, 121, 330, 283, 226, 179, 644, 95, 308, 592, 550, 389, 216, 174, 337, 295, 579, 122, 553, 540, 203, 416, 332, 285, 228, 527, 181, 390, 338, 648, 769, 312, 554, 581, 124, 393, 299, 205, 286, 111, 182, 608, 561, 232, 211, 770, 353, 185, 340, 582, 394, 556, 535, 206, 327, 159, 301, 585, 656, 562, 448, 401, 354, 643, 186, 307, 213, 772, 119, 396, 344, 302, 586, 240, 539, 331, 402, 564, 227, 214, 356, 645, 188, 309, 593, 551, 217, 776, 175, 672, 123, 588, 541, 417, 333, 404, 646, 229, 310, 594, 568, 391, 218, 360, 339, 649, 313, 555, 542, 125, 418, 334, 287, 230, 784, 183, 609, 596, 408, 650, 233, 771, 314, 220, 341, 583, 126, 395, 557, 207, 420, 704, 368, 657, 610, 563, 449, 234, 355, 187, 342, 652, 773, 316, 600, 558, 397, 345, 303, 587, 658, 241, 800, 450, 612, 424, 403, 565, 236, 215, 774, 357, 189, 398, 346, 777, 242, 673, 589, 660, 566, 452, 405, 358, 647, 190, 311, 616, 595, 569, 219, 778, 361, 432, 348, 674, 590, 244, 543, 419, 335, 406, 832, 231, 664, 785, 570, 456, 597, 409, 362, 651, 315, 221, 780, 676, 127, 624, 421, 705, 248, 786, 369, 611, 598, 410, 572, 235, 222, 364, 343, 653, 317, 601, 559, 464, 422, 706, 370, 680, 659, 801, 788, 451, 613, 425, 412, 654, 237, 775, 318, 602, 399, 896, 347, 243, 802, 708, 372, 661, 614, 426, 567, 453, 238, 359, 792, 191, 617, 688, 604, 480, 779, 433, 349, 675, 591, 662, 245, 804, 454, 428, 407, 712, 833, 376, 665, 618, 571, 457, 363, 434, 350, 781, 246, 677, 625, 834, 666, 249, 808, 787, 458, 620, 599, 411, 573, 223, 782, 365, 436, 720, 678, 626, 465, 423, 707, 250, 371, 681, 836, 668, 789, 574, 460, 413, 366, 655, 319, 603, 816, 466, 628, 897, 440, 682, 803, 709, 252, 790, 373, 615, 427, 414, 840, 239, 793, 736, 689, 605, 898, 481, 468, 710, 374, 684, 663, 805, 632, 455, 429, 713, 794, 377, 619, 690, 606, 482, 435, 900, 351, 848, 247, 806, 472, 430, 714, 835, 378, 667, 809, 796, 459, 621, 692, 484, 783, 437, 721, 679, 627, 904, 251, 810, 716, 837, 380, 669, 622, 575, 461, 367, 438, 722, 864, 696, 817, 488, 467, 629, 441, 683, 838, 670, 253, 812, 791, 462, 415, 841, 912, 737, 818, 724, 630, 899, 442, 469, 711, 254, 375, 685, 633, 842, 496, 795, 738, 691, 607, 820, 483, 470, 901, 444, 728, 686, 849, 807, 634, 473, 431, 715, 928, 379, 844, 797, 740, 693, 902, 485, 850, 824, 474, 636, 905, 811, 717, 798, 381, 623, 694, 486, 439, 744, 723, 865, 697, 852, 906, 489, 476, 718, 839, 382, 671, 813, 463, 960, 913, 866, 698, 819, 725, 490, 631, 443, 908, 856, 255, 814, 752, 843, 914, 497, 739, 726, 868, 700, 821, 492, 471, 445, 729, 687, 635, 498, 929, 845, 916, 741, 822, 903, 446, 730, 872, 851, 825, 475, 637, 930, 846, 500, 799, 742, 695, 487, 920, 745, 826, 732, 853, 638, 907, 477, 719, 932, 383, 880, 961, 504, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 963, 506, 937, 924, 749, 830, 911, 859, 755, 884, 938, 965, 508, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 967, 510, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q195_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 62, 519, 143, 640, 91, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 526, 109, 180, 271, 209, 768, 167, 115, 580, 392, 533, 298, 204, 325, 157, 110, 63, 560, 210, 352, 184, 641, 305, 547, 534, 117, 171, 326, 158, 300, 279, 584, 537, 329, 400, 642, 225, 306, 212, 118, 387, 549, 199, 173, 538, 121, 330, 283, 226, 179, 644, 95, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 770, 353, 185, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 776, 175, 672, 123, 588, 541, 417, 333, 404, 646, 229, 310, 594, 568, 391, 218, 360, 339, 649, 313, 555, 542, 125, 418, 334, 287, 230, 784, 183, 609, 596, 408, 650, 233, 314, 771, 220, 341, 126, 583, 395, 557, 207, 420, 704, 368, 657, 610, 563, 449, 234, 355, 187, 342, 652, 316, 773, 600, 558, 397, 345, 303, 587, 658, 241, 800, 450, 612, 424, 403, 565, 236, 215, 774, 357, 189, 398, 346, 777, 242, 673, 589, 660, 566, 452, 405, 358, 190, 647, 311, 616, 595, 569, 219, 778, 361, 432, 348, 674, 590, 244, 543, 419, 335, 406, 832, 231, 664, 785, 570, 456, 597, 409, 362, 651, 315, 221, 780, 676, 127, 624, 421, 248, 705, 786, 369, 611, 598, 410, 572, 235, 222, 364, 343, 653, 317, 601, 559, 464, 422, 706, 370, 680, 659, 801, 788, 451, 613, 425, 412, 654, 237, 318, 775, 602, 399, 896, 347, 243, 802, 708, 372, 661, 614, 426, 567, 453, 238, 359, 792, 191, 617, 688, 604, 480, 779, 433, 349, 675, 591, 662, 245, 804, 454, 428, 407, 712, 376, 833, 665, 618, 571, 457, 363, 434, 350, 781, 246, 677, 625, 834, 666, 249, 808, 787, 458, 620, 599, 411, 573, 223, 782, 365, 436, 720, 678, 626, 465, 423, 250, 707, 371, 681, 836, 668, 789, 574, 460, 413, 366, 655, 319, 603, 816, 466, 628, 440, 897, 682, 803, 252, 709, 790, 373, 615, 427, 414, 840, 239, 793, 736, 689, 605, 898, 481, 468, 710, 374, 684, 663, 805, 632, 455, 429, 713, 794, 377, 619, 690, 606, 482, 435, 900, 351, 848, 247, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 838, 670, 253, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 928, 379, 844, 797, 740, 693, 902, 485, 850, 824, 474, 636, 905, 811, 717, 798, 381, 623, 694, 486, 439, 744, 723, 865, 697, 852, 906, 489, 476, 718, 382, 839, 671, 813, 463, 960, 913, 866, 698, 819, 725, 490, 631, 443, 908, 856, 255, 814, 752, 843, 914, 497, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 932, 383, 880, 504, 961, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q196_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 526, 109, 180, 271, 209, 768, 167, 115, 580, 392, 533, 298, 204, 325, 157, 110, 63, 560, 210, 352, 184, 641, 305, 547, 534, 117, 171, 326, 158, 300, 279, 584, 537, 329, 400, 642, 225, 306, 212, 118, 387, 549, 199, 173, 538, 121, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 770, 353, 185, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 776, 175, 123, 672, 588, 541, 417, 333, 404, 646, 229, 310, 594, 568, 391, 218, 360, 339, 649, 313, 555, 542, 125, 418, 334, 287, 230, 784, 183, 609, 596, 408, 650, 233, 314, 771, 220, 341, 126, 583, 395, 557, 207, 420, 704, 368, 657, 610, 563, 449, 234, 355, 187, 342, 652, 316, 773, 600, 558, 397, 345, 303, 587, 658, 241, 800, 450, 612, 424, 403, 565, 236, 215, 774, 357, 189, 398, 346, 777, 242, 673, 589, 660, 566, 452, 405, 358, 190, 647, 311, 616, 595, 569, 219, 778, 361, 432, 348, 674, 590, 244, 543, 419, 335, 406, 832, 231, 664, 785, 570, 456, 597, 409, 362, 651, 315, 221, 780, 127, 676, 624, 421, 248, 705, 786, 369, 611, 598, 410, 572, 235, 222, 364, 343, 653, 317, 601, 559, 464, 422, 706, 370, 680, 659, 801, 788, 451, 613, 425, 412, 654, 237, 318, 775, 602, 399, 347, 896, 243, 802, 708, 372, 661, 614, 426, 567, 453, 238, 359, 792, 191, 617, 688, 604, 480, 779, 433, 349, 675, 591, 662, 245, 804, 454, 428, 407, 712, 376, 833, 665, 618, 571, 457, 363, 434, 350, 781, 246, 677, 625, 834, 666, 249, 808, 787, 458, 620, 599, 411, 573, 223, 782, 365, 436, 720, 678, 626, 465, 423, 250, 707, 371, 681, 836, 668, 789, 574, 460, 413, 366, 655, 319, 603, 816, 466, 628, 440, 897, 682, 803, 252, 709, 790, 373, 615, 427, 414, 840, 239, 793, 736, 689, 605, 898, 481, 468, 710, 374, 684, 663, 805, 632, 455, 429, 713, 794, 377, 619, 690, 606, 482, 435, 351, 900, 848, 247, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 838, 670, 253, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 902, 485, 850, 824, 474, 636, 905, 811, 717, 798, 381, 623, 694, 486, 439, 744, 723, 865, 697, 852, 906, 489, 476, 718, 382, 839, 671, 813, 463, 960, 913, 866, 698, 819, 725, 490, 631, 443, 908, 856, 255, 814, 752, 843, 914, 497, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q197_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 514, 97, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 518, 101, 142, 263, 90, 521, 384, 290, 196, 149, 102, 55, 280, 522, 105, 176, 92, 267, 163, 79, 150, 292, 576, 529, 200, 321, 153, 106, 59, 524, 269, 165, 530, 113, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 526, 109, 180, 271, 209, 167, 768, 115, 580, 392, 533, 298, 204, 325, 157, 110, 63, 560, 210, 352, 184, 641, 305, 547, 534, 117, 171, 326, 158, 300, 279, 584, 537, 329, 400, 642, 225, 306, 212, 118, 387, 549, 199, 173, 538, 121, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 770, 353, 185, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 175, 776, 123, 672, 588, 541, 417, 333, 404, 646, 229, 310, 594, 568, 391, 218, 360, 339, 649, 313, 555, 542, 125, 418, 334, 287, 230, 183, 784, 609, 596, 408, 650, 233, 314, 771, 220, 341, 126, 583, 395, 557, 207, 420, 704, 368, 657, 610, 563, 449, 234, 355, 187, 342, 652, 316, 773, 600, 558, 397, 345, 303, 587, 658, 241, 800, 450, 612, 424, 403, 565, 236, 215, 774, 357, 189, 398, 346, 777, 242, 673, 589, 660, 566, 452, 405, 358, 190, 647, 311, 616, 595, 569, 219, 778, 361, 432, 348, 674, 590, 244, 543, 419, 335, 406, 231, 832, 664, 785, 570, 456, 597, 409, 362, 651, 315, 221, 780, 127, 676, 624, 421, 248, 705, 786, 369, 611, 598, 410, 572, 235, 222, 364, 343, 653, 317, 601, 559, 464, 422, 706, 370, 680, 659, 801, 788, 451, 613, 425, 412, 654, 237, 318, 775, 602, 399, 347, 896, 243, 802, 708, 372, 661, 614, 426, 567, 453, 238, 359, 191, 792, 617, 688, 604, 480, 779, 433, 349, 675, 591, 662, 245, 804, 454, 428, 407, 712, 376, 833, 665, 618, 571, 457, 363, 434, 350, 781, 246, 677, 625, 834, 666, 249, 808, 787, 458, 620, 599, 411, 573, 223, 782, 365, 436, 720, 678, 626, 465, 423, 250, 707, 371, 681, 836, 668, 789, 574, 460, 413, 366, 655, 319, 603, 816, 466, 628, 440, 897, 682, 803, 252, 709, 790, 373, 615, 427, 414, 239, 840, 793, 736, 689, 605, 898, 481, 468, 710, 374, 684, 663, 805, 632, 455, 429, 713, 794, 377, 619, 690, 606, 482, 435, 351, 900, 247, 848, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 838, 670, 253, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 902, 485, 850, 824, 474, 636, 905, 811, 717, 798, 381, 623, 694, 486, 439, 744, 723, 865, 697, 852, 906, 489, 476, 718, 382, 839, 671, 813, 463, 960, 913, 866, 698, 819, 725, 490, 631, 443, 908, 255, 856, 814, 752, 843, 914, 497, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 910, 493, 858, 754, 499, 964, 917, 870, 702, 823, 494, 447, 731, 873, 944, 860, 756, 931, 847, 918, 501, 743, 968, 921, 874, 827, 733, 639, 502, 933, 760, 881, 922, 505, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 926, 509, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q198_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 97, 514, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 101, 518, 142, 263, 90, 521, 384, 290, 196, 149, 102, 55, 280, 105, 522, 176, 92, 267, 163, 79, 150, 292, 576, 529, 200, 321, 153, 106, 59, 524, 269, 165, 113, 530, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 109, 526, 180, 271, 209, 167, 768, 115, 580, 392, 533, 298, 204, 325, 157, 110, 63, 560, 210, 352, 184, 641, 305, 547, 117, 534, 171, 326, 158, 300, 279, 584, 537, 329, 400, 225, 642, 306, 212, 118, 387, 549, 199, 173, 121, 538, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 353, 770, 185, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 175, 776, 123, 672, 588, 541, 417, 333, 404, 229, 646, 310, 594, 568, 391, 218, 360, 339, 649, 313, 555, 125, 542, 418, 334, 287, 230, 183, 784, 609, 596, 408, 233, 650, 314, 220, 771, 341, 126, 583, 395, 557, 207, 420, 704, 368, 657, 610, 563, 449, 234, 355, 187, 342, 652, 316, 773, 600, 558, 397, 345, 303, 587, 241, 658, 800, 450, 612, 424, 403, 565, 236, 215, 357, 774, 189, 398, 346, 777, 242, 673, 589, 660, 566, 452, 405, 358, 190, 647, 311, 616, 595, 569, 219, 361, 778, 432, 348, 674, 590, 244, 543, 419, 335, 406, 231, 832, 664, 785, 570, 456, 597, 409, 362, 651, 315, 221, 780, 127, 676, 624, 421, 248, 705, 369, 786, 611, 598, 410, 572, 235, 222, 364, 343, 653, 317, 601, 559, 464, 422, 706, 370, 680, 659, 801, 788, 451, 613, 425, 412, 237, 654, 318, 775, 602, 399, 347, 896, 243, 802, 708, 372, 661, 614, 426, 567, 453, 238, 359, 191, 792, 617, 688, 604, 480, 779, 433, 349, 675, 591, 245, 662, 804, 454, 428, 407, 712, 376, 833, 665, 618, 571, 457, 363, 434, 350, 781, 246, 677, 625, 834, 249, 666, 808, 787, 458, 620, 599, 411, 573, 223, 365, 782, 436, 720, 678, 626, 465, 423, 250, 707, 371, 681, 836, 668, 789, 574, 460, 413, 366, 655, 319, 603, 816, 466, 628, 440, 897, 682, 252, 803, 709, 373, 790, 615, 427, 414, 239, 840, 793, 736, 689, 605, 481, 898, 468, 710, 374, 684, 663, 805, 632, 455, 429, 713, 377, 794, 619, 690, 606, 482, 435, 351, 900, 247, 848, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 838, 253, 670, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 485, 902, 850, 824, 474, 636, 905, 811, 717, 381, 798, 623, 694, 486, 439, 744, 723, 865, 697, 852, 489, 906, 476, 718, 382, 839, 671, 813, 463, 960, 913, 866, 698, 819, 725, 490, 631, 443, 908, 255, 856, 814, 752, 843, 497, 914, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 493, 910, 858, 754, 499, 964, 917, 870, 702, 823, 494, 447, 731, 873, 944, 860, 756, 931, 847, 501, 918, 743, 968, 921, 874, 827, 733, 639, 502, 933, 760, 881, 505, 922, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 509, 926, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q199_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 97, 514, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 101, 518, 142, 263, 90, 521, 384, 290, 196, 149, 102, 55, 280, 105, 522, 176, 92, 267, 163, 79, 150, 292, 576, 529, 200, 321, 153, 106, 59, 524, 269, 165, 113, 530, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 109, 526, 180, 271, 209, 167, 768, 115, 580, 392, 533, 298, 204, 325, 157, 110, 63, 560, 210, 352, 184, 641, 305, 547, 117, 534, 171, 326, 158, 300, 279, 584, 537, 329, 400, 225, 642, 306, 212, 118, 387, 549, 199, 173, 121, 538, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 353, 770, 185, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 175, 776, 123, 672, 588, 541, 417, 333, 404, 229, 646, 310, 594, 568, 391, 218, 360, 339, 649, 313, 555, 125, 542, 418, 334, 287, 230, 183, 784, 609, 596, 408, 233, 650, 314, 220, 771, 341, 126, 583, 395, 557, 207, 420, 704, 368, 657, 610, 563, 449, 234, 355, 187, 342, 652, 316, 773, 600, 558, 397, 345, 303, 587, 241, 658, 800, 450, 612, 424, 403, 565, 236, 215, 357, 774, 189, 398, 346, 242, 777, 673, 589, 660, 566, 452, 405, 358, 190, 647, 311, 616, 595, 569, 219, 361, 778, 432, 348, 674, 590, 244, 543, 419, 335, 406, 231, 832, 664, 785, 570, 456, 597, 409, 362, 651, 315, 221, 780, 127, 676, 624, 421, 248, 705, 369, 786, 611, 598, 410, 572, 235, 222, 364, 343, 653, 317, 601, 559, 464, 422, 706, 370, 680, 659, 801, 788, 451, 613, 425, 412, 237, 654, 318, 775, 602, 399, 347, 896, 243, 802, 708, 372, 661, 614, 426, 567, 453, 238, 359, 191, 792, 617, 688, 604, 480, 779, 433, 349, 675, 591, 245, 662, 804, 454, 428, 407, 712, 376, 833, 665, 618, 571, 457, 363, 434, 350, 246, 781, 677, 625, 834, 249, 666, 808, 787, 458, 620, 599, 411, 573, 223, 365, 782, 436, 720, 678, 626, 465, 423, 250, 707, 371, 681, 836, 668, 789, 574, 460, 413, 366, 655, 319, 603, 816, 466, 628, 440, 897, 682, 252, 803, 709, 373, 790, 615, 427, 414, 239, 840, 793, 736, 689, 605, 481, 898, 468, 710, 374, 684, 663, 805, 632, 455, 429, 713, 377, 794, 619, 690, 606, 482, 435, 351, 900, 247, 848, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 838, 253, 670, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 485, 902, 850, 824, 474, 636, 905, 811, 717, 381, 798, 623, 694, 486, 439, 744, 723, 865, 697, 852, 489, 906, 476, 718, 382, 839, 671, 813, 463, 960, 913, 866, 698, 819, 725, 490, 631, 443, 908, 255, 856, 814, 752, 843, 497, 914, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 493, 910, 858, 754, 499, 964, 917, 870, 702, 823, 494, 447, 731, 873, 944, 860, 756, 931, 847, 501, 918, 743, 968, 921, 874, 827, 733, 639, 502, 933, 760, 881, 505, 922, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 509, 926, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q200_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 97, 514, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 101, 518, 142, 263, 90, 521, 384, 290, 196, 149, 102, 55, 280, 105, 522, 176, 92, 267, 163, 79, 150, 292, 576, 529, 200, 321, 153, 106, 59, 524, 269, 165, 113, 530, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 109, 526, 180, 271, 209, 167, 768, 115, 580, 392, 533, 298, 204, 325, 157, 110, 63, 560, 210, 352, 184, 641, 305, 547, 117, 534, 171, 326, 158, 300, 279, 584, 537, 329, 400, 225, 642, 306, 212, 118, 387, 549, 199, 173, 121, 538, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 353, 185, 770, 340, 582, 394, 556, 535, 206, 327, 159, 301, 585, 656, 562, 448, 401, 354, 186, 643, 307, 213, 772, 119, 396, 344, 302, 586, 240, 539, 331, 402, 564, 227, 214, 356, 188, 645, 309, 593, 551, 217, 175, 776, 123, 672, 588, 541, 417, 333, 404, 229, 646, 310, 594, 568, 391, 218, 360, 339, 649, 313, 555, 125, 542, 418, 334, 287, 230, 183, 784, 609, 596, 408, 233, 650, 314, 220, 771, 341, 126, 583, 395, 557, 207, 420, 704, 368, 657, 610, 563, 449, 234, 355, 187, 342, 652, 316, 773, 600, 558, 397, 345, 303, 587, 241, 658, 800, 450, 612, 424, 403, 565, 236, 215, 357, 189, 774, 398, 346, 242, 777, 673, 589, 660, 566, 452, 405, 358, 190, 647, 311, 616, 595, 569, 219, 361, 778, 432, 348, 674, 590, 244, 543, 419, 335, 406, 231, 832, 664, 785, 570, 456, 597, 409, 362, 651, 315, 221, 780, 127, 676, 624, 421, 248, 705, 369, 786, 611, 598, 410, 572, 235, 222, 364, 343, 653, 317, 601, 559, 464, 422, 706, 370, 680, 659, 801, 788, 451, 613, 425, 412, 237, 654, 318, 775, 602, 399, 347, 896, 243, 802, 708, 372, 661, 614, 426, 567, 453, 238, 359, 191, 792, 617, 688, 604, 480, 779, 433, 349, 675, 591, 245, 662, 804, 454, 428, 407, 712, 376, 833, 665, 618, 571, 457, 363, 434, 350, 246, 781, 677, 625, 249, 834, 666, 808, 787, 458, 620, 599, 411, 573, 223, 365, 782, 436, 720, 678, 626, 465, 423, 250, 707, 371, 681, 836, 668, 789, 574, 460, 413, 366, 655, 319, 603, 816, 466, 628, 440, 897, 682, 252, 803, 709, 373, 790, 615, 427, 414, 239, 840, 793, 736, 689, 605, 481, 898, 468, 710, 374, 684, 663, 805, 632, 455, 429, 713, 377, 794, 619, 690, 606, 482, 435, 351, 900, 247, 848, 806, 472, 430, 714, 378, 835, 667, 809, 796, 459, 621, 692, 484, 783, 437, 721, 679, 627, 904, 251, 810, 716, 380, 837, 669, 622, 575, 461, 367, 438, 722, 864, 696, 817, 488, 467, 629, 441, 683, 253, 838, 670, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 485, 902, 850, 824, 474, 636, 905, 811, 717, 381, 798, 623, 694, 486, 439, 744, 723, 865, 697, 852, 489, 906, 476, 718, 382, 839, 671, 813, 463, 960, 913, 866, 698, 819, 725, 490, 631, 443, 908, 255, 856, 814, 752, 843, 497, 914, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 493, 910, 858, 754, 499, 964, 917, 870, 702, 823, 494, 447, 731, 873, 944, 860, 756, 931, 847, 501, 918, 743, 968, 921, 874, 827, 733, 639, 502, 933, 760, 881, 505, 922, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 509, 926, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q201_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 97, 514, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 101, 518, 142, 263, 90, 521, 384, 290, 196, 149, 102, 55, 280, 105, 522, 176, 92, 267, 163, 79, 150, 292, 576, 529, 200, 321, 153, 106, 59, 524, 269, 165, 113, 530, 322, 154, 296, 275, 108, 87, 61, 270, 208, 166, 114, 545, 532, 195, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 109, 526, 180, 271, 209, 167, 115, 768, 580, 392, 533, 298, 204, 325, 157, 110, 63, 560, 210, 352, 184, 641, 305, 547, 117, 534, 171, 326, 158, 300, 279, 584, 537, 329, 400, 225, 642, 306, 212, 118, 387, 549, 199, 173, 121, 538, 330, 283, 226, 179, 95, 644, 308, 592, 550, 389, 216, 174, 337, 295, 122, 579, 553, 540, 203, 416, 332, 285, 228, 527, 181, 390, 338, 648, 312, 769, 554, 124, 581, 393, 299, 205, 286, 111, 182, 608, 561, 232, 211, 353, 185, 770, 340, 582, 394, 556, 535, 206, 327, 159, 301, 585, 656, 562, 448, 401, 354, 186, 643, 307, 213, 119, 772, 396, 344, 302, 586, 240, 539, 331, 402, 564, 227, 214, 356, 188, 645, 309, 593, 551, 217, 175, 123, 776, 672, 588, 541, 417, 333, 404, 229, 646, 310, 594, 568, 391, 218, 360, 339, 649, 313, 555, 125, 542, 418, 334, 287, 230, 183, 784, 609, 596, 408, 233, 650, 314, 220, 771, 341, 126, 583, 395, 557, 207, 420, 704, 368, 657, 610, 563, 449, 234, 355, 187, 342, 652, 316, 773, 600, 558, 397, 345, 303, 587, 241, 658, 800, 450, 612, 424, 403, 565, 236, 215, 357, 189, 774, 398, 346, 242, 777, 673, 589, 660, 566, 452, 405, 358, 190, 647, 311, 616, 595, 569, 219, 361, 778, 432, 348, 674, 590, 244, 543, 419, 335, 406, 231, 832, 664, 785, 570, 456, 597, 409, 362, 651, 315, 221, 127, 780, 676, 624, 421, 248, 705, 369, 786, 611, 598, 410, 572, 235, 222, 364, 343, 653, 317, 601, 559, 464, 422, 706, 370, 680, 659, 801, 788, 451, 613, 425, 412, 237, 654, 318, 775, 602, 399, 347, 243, 896, 802, 708, 372, 661, 614, 426, 567, 453, 238, 359, 191, 792, 617, 688, 604, 480, 779, 433, 349, 675, 591, 245, 662, 804, 454, 428, 407, 712, 376, 833, 665, 618, 571, 457, 363, 434, 350, 246, 781, 677, 625, 249, 834, 666, 808, 787, 458, 620, 599, 411, 573, 223, 365, 782, 436, 720, 678, 626, 465, 423, 250, 707, 371, 681, 836, 668, 789, 574, 460, 413, 366, 655, 319, 603, 816, 466, 628, 440, 897, 682, 252, 803, 709, 373, 790, 615, 427, 414, 239, 840, 793, 736, 689, 605, 481, 898, 468, 710, 374, 684, 663, 805, 632, 455, 429, 713, 377, 794, 619, 690, 606, 482, 435, 351, 247, 900, 848, 806, 472, 430, 714, 378, 835, 667, 809, 796, 459, 621, 692, 484, 783, 437, 721, 679, 627, 251, 904, 810, 716, 380, 837, 669, 622, 575, 461, 367, 438, 722, 864, 696, 817, 488, 467, 629, 441, 683, 253, 838, 670, 812, 791, 462, 415, 841, 912, 737, 818, 724, 630, 442, 899, 469, 254, 711, 375, 685, 633, 842, 496, 795, 738, 691, 607, 820, 483, 470, 444, 901, 728, 686, 849, 807, 634, 473, 431, 715, 379, 928, 844, 797, 740, 693, 485, 902, 850, 824, 474, 636, 905, 811, 717, 381, 798, 623, 694, 486, 439, 744, 723, 865, 697, 852, 489, 906, 476, 718, 382, 839, 671, 813, 463, 960, 913, 866, 698, 819, 725, 490, 631, 443, 255, 908, 856, 814, 752, 843, 497, 914, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 828, 491, 478, 909, 857, 815, 753, 962, 936, 915, 748, 727, 869, 701, 493, 910, 858, 754, 499, 964, 917, 870, 702, 823, 494, 447, 731, 873, 944, 860, 756, 931, 847, 501, 918, 743, 968, 921, 874, 827, 733, 639, 502, 933, 760, 881, 505, 922, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 509, 926, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q202_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 40, 19, 14, 256, 68, 21, 48, 129, 35, 22, 72, 25, 130, 37, 26, 132, 80, 38, 67, 41, 28, 15, 512, 136, 257, 42, 69, 96, 49, 258, 70, 44, 23, 73, 144, 50, 131, 260, 74, 27, 52, 133, 81, 39, 264, 160, 76, 29, 134, 82, 56, 513, 137, 43, 30, 272, 97, 514, 84, 138, 259, 71, 45, 192, 145, 98, 51, 516, 140, 261, 88, 46, 75, 146, 288, 100, 53, 262, 520, 265, 161, 77, 148, 54, 135, 104, 83, 57, 266, 162, 78, 31, 528, 320, 152, 273, 58, 515, 85, 139, 268, 164, 112, 193, 274, 99, 86, 60, 517, 141, 89, 47, 544, 194, 168, 147, 289, 276, 101, 518, 142, 263, 90, 521, 384, 290, 196, 149, 102, 55, 280, 105, 522, 176, 92, 267, 163, 79, 150, 292, 576, 529, 200, 321, 153, 106, 59, 524, 269, 165, 113, 530, 322, 154, 296, 275, 108, 87, 61, 270, 208, 166, 114, 545, 195, 532, 169, 324, 156, 277, 62, 519, 143, 91, 640, 304, 546, 116, 385, 170, 291, 197, 278, 103, 536, 328, 281, 224, 523, 177, 93, 386, 548, 198, 172, 151, 293, 120, 577, 201, 282, 107, 178, 94, 525, 388, 336, 294, 578, 552, 531, 202, 323, 155, 297, 284, 109, 526, 180, 271, 209, 167, 115, 768, 580, 392, 533, 298, 204, 325, 157, 110, 63, 560, 210, 352, 184, 641, 305, 547, 117, 534, 171, 326, 158, 300, 279, 584, 537, 329, 400, 225, 642, 306, 212, 118, 387, 549, 199, 173, 121, 538, 330, 283, 226, 179, 95, 644, 308, 592, 550, 389, 216, 174, 337, 295, 122, 579, 553, 203, 540, 416, 332, 285, 228, 527, 181, 390, 338, 648, 312, 769, 554, 124, 581, 393, 299, 205, 286, 111, 182, 608, 561, 232, 211, 353, 185, 770, 340, 582, 394, 556, 535, 206, 327, 159, 301, 585, 656, 562, 448, 401, 354, 186, 643, 307, 213, 119, 772, 396, 344, 302, 586, 240, 539, 331, 402, 227, 564, 214, 356, 188, 645, 309, 593, 551, 217, 175, 123, 776, 672, 588, 541, 417, 333, 404, 229, 646, 310, 594, 568, 391, 218, 360, 339, 649, 313, 555, 125, 542, 418, 334, 287, 230, 183, 784, 609, 596, 408, 233, 650, 314, 220, 771, 341, 126, 583, 395, 557, 207, 420, 704, 368, 657, 610, 563, 449, 234, 355, 187, 342, 652, 316, 773, 600, 558, 397, 345, 303, 587, 241, 658, 800, 450, 612, 424, 403, 565, 236, 215, 357, 189, 774, 398, 346, 242, 777, 673, 589, 660, 566, 452, 405, 358, 190, 647, 311, 616, 595, 569, 219, 361, 778, 432, 348, 674, 590, 244, 543, 419, 335, 406, 231, 832, 664, 785, 570, 456, 597, 409, 362, 651, 315, 221, 127, 780, 676, 624, 421, 248, 705, 369, 786, 611, 598, 410, 235, 572, 222, 364, 343, 653, 317, 601, 559, 464, 422, 706, 370, 680, 659, 801, 451, 788, 613, 425, 412, 237, 654, 318, 775, 602, 399, 347, 243, 896, 802, 708, 372, 661, 614, 426, 567, 453, 238, 359, 191, 792, 617, 688, 604, 480, 779, 433, 349, 675, 591, 245, 662, 804, 454, 428, 407, 712, 376, 833, 665, 618, 571, 457, 363, 434, 350, 246, 781, 677, 625, 249, 834, 666, 808, 787, 458, 620, 599, 411, 573, 223, 365, 782, 436, 720, 678, 626, 465, 423, 250, 707, 371, 681, 836, 668, 789, 574, 460, 413, 366, 655, 319, 603, 816, 466, 628, 440, 897, 682, 252, 803, 709, 373, 790, 615, 427, 414, 239, 840, 793, 736, 689, 605, 481, 898, 468, 710, 374, 684, 663, 805, 632, 455, 429, 713, 377, 794, 619, 690, 606, 482, 435, 351, 247, 900, 848, 806, 472, 430, 714, 378, 835, 667, 809, 459, 796, 621, 692, 484, 783, 437, 721, 679, 627, 251, 904, 810, 716, 380, 837, 669, 622, 575, 461, 367, 438, 722, 864, 696, 817, 488, 467, 629, 441, 683, 253, 838, 670, 812, 791, 462, 415, 841, 912, 737, 818, 724, 630, 442, 899, 469, 254, 711, 375, 685, 633, 842, 496, 795, 738, 691, 607, 483, 820, 470, 444, 901, 728, 686, 849, 807, 634, 473, 431, 715, 379, 928, 844, 797, 740, 693, 485, 902, 850, 824, 474, 636, 905, 811, 717, 381, 798, 623, 694, 486, 439, 744, 723, 865, 697, 852, 489, 906, 476, 718, 382, 839, 671, 813, 463, 960, 913, 866, 698, 819, 725, 490, 631, 443, 255, 908, 856, 814, 752, 843, 497, 914, 739, 726, 868, 700, 821, 492, 471, 445, 729, 687, 635, 498, 929, 845, 916, 741, 822, 446, 903, 730, 872, 851, 825, 475, 637, 930, 846, 500, 799, 742, 695, 487, 920, 745, 826, 732, 853, 638, 907, 477, 719, 383, 932, 880, 504, 961, 746, 867, 699, 854, 491, 828, 478, 909, 857, 815, 753, 962, 936, 915, 748, 727, 869, 701, 493, 910, 858, 754, 499, 964, 917, 870, 702, 823, 494, 447, 731, 873, 944, 860, 756, 931, 847, 501, 918, 743, 968, 921, 874, 827, 733, 639, 502, 933, 760, 881, 505, 922, 747, 734, 876, 855, 829, 479, 976, 934, 882, 506, 963, 937, 924, 749, 830, 911, 859, 755, 884, 938, 508, 965, 750, 871, 703, 495, 992, 945, 861, 757, 966, 940, 919, 888, 969, 875, 946, 862, 758, 503, 761, 970, 923, 735, 877, 948, 977, 935, 762, 883, 507, 972, 925, 878, 831, 978, 952, 764, 885, 939, 509, 926, 751, 993, 980, 886, 510, 967, 941, 889, 994, 947, 863, 759, 984, 942, 890, 971, 996, 949, 763, 892, 973, 879, 950, 1000, 979, 953, 765, 974, 927, 954, 981, 766, 887, 511, 1008, 995, 982, 956, 985, 943, 891, 997, 986, 893, 998, 951, 1001, 988, 894, 975, 1002, 955, 767, 1009, 1004, 983, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q203_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 257, 42, 69, 96, 49, 258, 70, 23, 44, 73, 144, 50, 131, 260, 74, 27, 52, 133, 39, 81, 264, 76, 160, 29, 134, 82, 56, 513, 137, 43, 30, 272, 97, 514, 84, 138, 259, 71, 45, 192, 145, 98, 51, 516, 140, 261, 46, 88, 75, 146, 288, 100, 53, 262, 520, 265, 77, 161, 148, 54, 135, 83, 104, 57, 266, 78, 162, 31, 528, 152, 320, 273, 58, 515, 85, 139, 268, 164, 112, 193, 274, 99, 86, 60, 517, 141, 47, 89, 544, 194, 147, 168, 289, 276, 101, 518, 142, 263, 90, 521, 384, 290, 196, 149, 102, 55, 280, 105, 522, 92, 176, 267, 79, 163, 150, 292, 576, 529, 200, 153, 321, 106, 59, 524, 269, 165, 113, 530, 154, 322, 275, 296, 87, 108, 61, 270, 166, 208, 114, 545, 195, 532, 169, 156, 324, 277, 62, 519, 143, 91, 304, 640, 546, 116, 385, 170, 291, 197, 278, 103, 536, 328, 281, 224, 523, 93, 177, 386, 548, 198, 151, 172, 293, 120, 577, 201, 282, 107, 94, 178, 525, 388, 294, 336, 578, 531, 552, 202, 155, 323, 297, 284, 109, 526, 180, 271, 167, 209, 115, 768, 580, 392, 533, 298, 204, 157, 325, 110, 63, 560, 210, 184, 352, 305, 641, 547, 117, 534, 171, 158, 326, 279, 300, 584, 537, 329, 400, 225, 306, 642, 212, 118, 387, 549, 199, 173, 121, 538, 330, 283, 226, 95, 179, 308, 644, 550, 592, 389, 174, 216, 295, 337, 122, 579, 553, 203, 540, 332, 416, 285, 228, 527, 181, 390, 338, 312, 648, 769, 554, 124, 581, 393, 299, 205, 286, 111, 182, 608, 561, 211, 232, 185, 353, 770, 340, 582, 394, 535, 556, 206, 159, 327, 301, 585, 656, 562, 448, 401, 186, 354, 307, 643, 213, 119, 772, 396, 302, 344, 586, 240, 539, 331, 402, 227, 564, 214, 188, 356, 309, 645, 551, 593, 175, 217, 123, 776, 588, 672, 541, 333, 417, 404, 229, 310, 646, 594, 568, 391, 218, 339, 360, 313, 649, 555, 125, 542, 334, 418, 287, 230, 183, 784, 609, 596, 408, 233, 314, 650, 220, 771, 341, 126, 583, 395, 557, 207, 420, 368, 704, 657, 610, 563, 449, 234, 187, 355, 342, 316, 652, 773, 558, 600, 397, 303, 345, 587, 241, 658, 800, 450, 612, 403, 424, 565, 215, 236, 189, 357, 774, 398, 346, 242, 777, 589, 673, 660, 566, 452, 405, 190, 358, 311, 647, 595, 616, 569, 219, 361, 778, 348, 432, 590, 674, 244, 543, 335, 419, 406, 231, 664, 832, 785, 570, 456, 597, 409, 362, 315, 651, 221, 127, 780, 676, 624, 421, 248, 369, 705, 786, 611, 598, 410, 235, 572, 222, 343, 364, 317, 653, 559, 601, 422, 464, 370, 706, 659, 680, 801, 451, 788, 613, 425, 412, 237, 318, 654, 775, 602, 399, 347, 243, 896, 802, 372, 708, 661, 614, 426, 567, 453, 238, 191, 359, 792, 617, 604, 688, 480, 779, 349, 433, 591, 675, 245, 662, 804, 454, 407, 428, 376, 712, 665, 833, 618, 571, 457, 363, 350, 434, 246, 781, 677, 625, 249, 666, 834, 787, 808, 458, 599, 620, 411, 573, 223, 365, 782, 436, 678, 720, 626, 423, 465, 250, 371, 707, 681, 668, 836, 789, 574, 460, 413, 366, 319, 655, 603, 816, 466, 628, 440, 897, 682, 252, 803, 373, 709, 790, 615, 427, 414, 239, 840, 793, 736, 605, 689, 481, 898, 468, 374, 710, 663, 684, 805, 632, 455, 429, 377, 713, 794, 619, 606, 690, 482, 351, 435, 247, 900, 806, 848, 430, 472, 378, 714, 667, 835, 809, 459, 796, 621, 692, 484, 783, 437, 679, 721, 627, 251, 904, 810, 380, 716, 669, 837, 622, 575, 461, 367, 438, 722, 696, 864, 817, 467, 488, 629, 441, 683, 253, 670, 838, 791, 812, 462, 415, 841, 912, 737, 818, 724, 630, 442, 899, 469, 254, 375, 711, 685, 633, 842, 496, 795, 738, 607, 691, 483, 820, 470, 444, 901, 686, 728, 807, 849, 634, 431, 473, 379, 715, 844, 928, 797, 740, 693, 485, 902, 850, 824, 474, 636, 905, 811, 381, 717, 798, 623, 694, 486, 439, 723, 744, 697, 865, 852, 489, 906, 476, 382, 718, 671, 839, 813, 463, 960, 913, 698, 866, 819, 725, 490, 631, 443, 255, 908, 814, 856, 752, 843, 497, 914, 739, 726, 700, 868, 821, 471, 492, 445, 687, 729, 635, 498, 845, 929, 916, 741, 822, 446, 903, 730, 851, 872, 825, 475, 637, 846, 930, 500, 799, 742, 695, 487, 920, 745, 826, 732, 853, 638, 907, 477, 383, 719, 932, 880, 504, 961, 746, 699, 867, 854, 491, 828, 478, 909, 815, 857, 753, 962, 915, 936, 727, 748, 701, 869, 493, 910, 858, 754, 499, 964, 917, 702, 870, 823, 494, 447, 731, 873, 860, 944, 756, 847, 931, 501, 918, 743, 968, 921, 874, 827, 733, 639, 502, 933, 760, 881, 505, 922, 747, 734, 855, 876, 829, 479, 934, 976, 882, 506, 963, 937, 924, 749, 830, 911, 859, 755, 884, 938, 508, 965, 750, 703, 871, 495, 992, 861, 945, 757, 966, 919, 940, 888, 969, 875, 862, 946, 758, 503, 761, 970, 923, 735, 877, 948, 935, 977, 762, 883, 507, 972, 925, 878, 831, 978, 952, 764, 885, 939, 509, 926, 751, 993, 980, 886, 510, 967, 941, 889, 994, 863, 947, 759, 942, 984, 890, 971, 996, 949, 763, 892, 973, 879, 950, 979, 1000, 953, 765, 974, 927, 954, 981, 766, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q204_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 160, 29, 134, 82, 56, 513, 137, 43, 30, 272, 97, 84, 514, 138, 259, 71, 45, 192, 145, 98, 51, 516, 140, 46, 261, 88, 75, 146, 288, 100, 53, 262, 520, 265, 77, 161, 148, 54, 135, 83, 104, 57, 266, 78, 162, 31, 528, 152, 320, 58, 273, 85, 515, 139, 268, 164, 112, 193, 274, 99, 86, 60, 517, 141, 47, 89, 544, 194, 147, 168, 289, 276, 101, 518, 142, 263, 90, 521, 384, 290, 196, 149, 102, 55, 280, 105, 92, 522, 176, 267, 79, 163, 150, 292, 576, 529, 200, 153, 106, 321, 59, 524, 269, 165, 113, 530, 154, 322, 275, 296, 87, 108, 61, 270, 166, 208, 114, 545, 195, 532, 169, 156, 324, 62, 277, 519, 143, 91, 304, 640, 116, 546, 170, 385, 291, 197, 278, 103, 536, 328, 281, 224, 93, 523, 177, 386, 548, 198, 151, 172, 293, 120, 577, 201, 282, 107, 94, 178, 525, 388, 294, 336, 578, 531, 552, 202, 155, 323, 297, 284, 109, 526, 180, 271, 167, 209, 115, 768, 580, 392, 533, 298, 204, 157, 110, 325, 63, 560, 210, 184, 352, 305, 641, 117, 547, 534, 171, 158, 326, 279, 300, 584, 537, 329, 400, 225, 306, 212, 642, 118, 387, 549, 199, 173, 121, 538, 330, 283, 226, 95, 179, 308, 644, 550, 592, 174, 389, 216, 295, 122, 337, 579, 553, 203, 540, 332, 416, 285, 228, 527, 181, 390, 338, 312, 648, 124, 554, 769, 581, 393, 299, 205, 286, 111, 182, 608, 561, 211, 232, 185, 353, 340, 770, 582, 394, 535, 556, 206, 159, 327, 301, 585, 656, 562, 448, 186, 401, 354, 307, 213, 643, 119, 772, 396, 302, 344, 586, 240, 539, 331, 402, 227, 564, 214, 188, 356, 309, 645, 551, 593, 175, 217, 123, 776, 588, 672, 541, 333, 417, 404, 229, 310, 646, 594, 568, 391, 218, 339, 360, 313, 649, 125, 555, 542, 334, 418, 287, 230, 183, 784, 609, 596, 408, 233, 314, 220, 650, 126, 341, 771, 583, 395, 557, 207, 420, 368, 704, 657, 610, 563, 234, 449, 187, 355, 342, 316, 652, 558, 773, 600, 397, 303, 345, 587, 241, 658, 800, 450, 612, 403, 424, 565, 215, 236, 189, 357, 774, 398, 346, 242, 777, 589, 673, 660, 566, 452, 190, 405, 358, 311, 647, 595, 616, 569, 219, 361, 348, 778, 432, 590, 244, 674, 543, 335, 419, 406, 231, 664, 832, 570, 785, 456, 597, 409, 362, 315, 221, 651, 127, 780, 676, 624, 421, 248, 369, 705, 786, 611, 598, 410, 235, 572, 222, 343, 364, 317, 653, 559, 601, 422, 464, 370, 706, 659, 680, 801, 451, 788, 613, 425, 412, 237, 318, 654, 775, 602, 399, 347, 243, 896, 372, 802, 708, 661, 614, 426, 567, 238, 453, 191, 359, 792, 617, 604, 688, 480, 349, 779, 433, 591, 245, 675, 662, 804, 454, 407, 428, 376, 712, 665, 618, 833, 571, 457, 363, 350, 434, 246, 781, 677, 625, 249, 666, 834, 787, 808, 458, 599, 620, 411, 573, 223, 365, 782, 436, 678, 720, 626, 423, 250, 465, 371, 707, 681, 668, 836, 574, 789, 460, 413, 366, 319, 655, 603, 816, 466, 628, 440, 252, 682, 897, 373, 803, 709, 790, 615, 427, 414, 239, 840, 793, 736, 605, 689, 481, 468, 898, 374, 710, 663, 684, 805, 632, 455, 429, 377, 713, 794, 619, 606, 690, 482, 351, 435, 247, 900, 806, 848, 430, 472, 378, 714, 667, 835, 809, 459, 796, 621, 692, 484, 783, 437, 679, 721, 627, 251, 904, 380, 810, 716, 669, 622, 837, 575, 461, 367, 438, 722, 696, 864, 817, 467, 488, 629, 441, 253, 683, 670, 838, 791, 812, 462, 415, 841, 912, 737, 818, 724, 630, 442, 254, 469, 899, 375, 711, 685, 633, 842, 496, 795, 738, 607, 691, 483, 820, 470, 444, 686, 901, 728, 807, 634, 849, 431, 473, 379, 715, 844, 928, 797, 740, 693, 485, 902, 850, 824, 474, 636, 905, 381, 811, 717, 798, 623, 694, 486, 439, 723, 744, 697, 865, 852, 489, 476, 906, 382, 718, 671, 839, 813, 463, 960, 698, 913, 866, 819, 725, 490, 631, 443, 255, 908, 814, 856, 752, 843, 497, 914, 739, 726, 700, 868, 821, 471, 492, 445, 687, 729, 635, 498, 845, 929, 916, 741, 822, 446, 903, 730, 851, 872, 825, 475, 637, 846, 500, 930, 799, 742, 695, 487, 920, 745, 826, 732, 638, 853, 477, 907, 383, 719, 932, 880, 504, 746, 961, 699, 867, 854, 491, 828, 478, 909, 815, 857, 753, 962, 915, 936, 727, 748, 701, 869, 493, 910, 858, 754, 499, 964, 702, 917, 870, 823, 494, 447, 731, 873, 860, 944, 756, 847, 501, 931, 918, 743, 968, 921, 874, 827, 733, 639, 502, 933, 760, 881, 505, 922, 747, 734, 855, 876, 829, 479, 934, 976, 882, 506, 963, 937, 924, 749, 830, 911, 859, 755, 884, 508, 938, 750, 965, 703, 871, 495, 992, 861, 945, 757, 966, 919, 940, 888, 969, 875, 862, 946, 758, 503, 761, 970, 923, 735, 877, 948, 935, 762, 977, 883, 507, 972, 925, 878, 831, 978, 952, 764, 885, 509, 939, 926, 751, 993, 980, 886, 510, 967, 941, 889, 994, 863, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q205_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 160, 29, 134, 82, 56, 513, 137, 43, 30, 272, 97, 84, 514, 138, 259, 71, 45, 192, 145, 98, 51, 516, 140, 46, 261, 88, 75, 146, 288, 100, 53, 262, 520, 265, 77, 161, 148, 54, 135, 83, 104, 57, 266, 78, 162, 31, 528, 152, 320, 58, 273, 85, 515, 139, 268, 164, 112, 193, 274, 99, 86, 60, 517, 141, 47, 89, 544, 194, 147, 168, 289, 276, 101, 518, 142, 263, 90, 521, 384, 290, 196, 149, 102, 55, 280, 105, 92, 522, 176, 267, 79, 163, 150, 292, 576, 529, 200, 153, 106, 321, 59, 524, 269, 165, 113, 530, 154, 322, 275, 296, 87, 108, 61, 270, 166, 208, 114, 545, 195, 532, 169, 156, 324, 62, 277, 519, 143, 91, 304, 640, 116, 546, 170, 385, 291, 197, 278, 103, 536, 328, 281, 224, 93, 523, 177, 386, 548, 198, 151, 172, 293, 120, 577, 201, 282, 107, 94, 178, 525, 388, 294, 336, 578, 531, 552, 202, 155, 323, 297, 284, 109, 526, 180, 271, 167, 209, 115, 768, 580, 392, 533, 298, 204, 157, 110, 325, 63, 560, 210, 184, 352, 305, 641, 117, 547, 534, 171, 158, 326, 279, 300, 584, 537, 329, 400, 225, 306, 212, 642, 118, 387, 549, 199, 173, 121, 538, 330, 283, 226, 95, 179, 308, 644, 550, 592, 174, 389, 216, 295, 122, 337, 579, 553, 203, 540, 332, 416, 285, 228, 527, 181, 390, 338, 312, 648, 124, 554, 769, 581, 393, 299, 205, 286, 111, 182, 608, 561, 211, 232, 185, 353, 340, 770, 582, 394, 535, 556, 206, 159, 327, 301, 585, 656, 562, 448, 186, 401, 354, 307, 213, 643, 119, 772, 396, 302, 344, 586, 240, 539, 331, 402, 227, 564, 214, 188, 356, 309, 645, 551, 593, 175, 217, 123, 776, 588, 672, 541, 333, 417, 404, 229, 310, 646, 594, 568, 391, 218, 339, 360, 313, 649, 125, 555, 542, 334, 418, 287, 230, 183, 784, 609, 596, 408, 233, 314, 220, 650, 126, 341, 771, 583, 395, 557, 207, 420, 368, 704, 657, 610, 563, 234, 449, 187, 355, 342, 316, 652, 558, 773, 600, 397, 303, 345, 587, 241, 658, 800, 450, 403, 612, 424, 565, 215, 236, 189, 357, 774, 398, 346, 242, 777, 589, 673, 660, 566, 452, 190, 405, 358, 311, 647, 595, 616, 569, 219, 361, 348, 778, 432, 590, 244, 674, 543, 335, 419, 406, 231, 664, 832, 570, 785, 456, 597, 409, 362, 315, 221, 651, 127, 780, 676, 624, 421, 248, 369, 705, 786, 611, 598, 410, 235, 572, 222, 343, 364, 317, 653, 559, 601, 422, 464, 370, 706, 659, 680, 801, 451, 788, 613, 425, 412, 237, 318, 654, 775, 602, 399, 347, 243, 896, 372, 802, 708, 661, 614, 426, 567, 238, 453, 191, 359, 792, 617, 604, 688, 480, 349, 779, 433, 591, 245, 675, 662, 804, 454, 407, 428, 376, 712, 665, 618, 833, 571, 457, 363, 350, 434, 246, 781, 677, 625, 249, 666, 834, 787, 808, 458, 599, 411, 620, 573, 223, 365, 782, 436, 678, 720, 626, 423, 250, 465, 371, 707, 681, 668, 836, 574, 789, 460, 413, 366, 319, 655, 603, 816, 466, 628, 440, 252, 682, 897, 373, 803, 709, 790, 615, 427, 414, 239, 840, 793, 736, 605, 689, 481, 468, 898, 374, 710, 663, 684, 805, 632, 455, 429, 377, 713, 794, 619, 606, 690, 482, 351, 435, 247, 900, 806, 848, 430, 472, 378, 714, 667, 835, 809, 459, 796, 621, 692, 484, 783, 437, 679, 721, 627, 251, 904, 380, 810, 716, 669, 622, 837, 575, 461, 367, 438, 722, 696, 864, 817, 467, 488, 629, 441, 253, 683, 670, 838, 791, 812, 462, 415, 841, 912, 737, 818, 724, 630, 442, 254, 469, 899, 375, 711, 685, 633, 842, 496, 795, 738, 607, 691, 483, 820, 470, 444, 686, 901, 728, 807, 634, 849, 431, 473, 379, 715, 844, 928, 797, 740, 693, 485, 902, 850, 824, 474, 636, 905, 381, 811, 717, 798, 623, 694, 486, 439, 723, 744, 697, 865, 852, 489, 476, 906, 382, 718, 671, 839, 813, 463, 960, 698, 913, 866, 819, 725, 490, 631, 443, 255, 908, 814, 856, 752, 843, 497, 914, 739, 726, 700, 868, 821, 471, 492, 445, 687, 729, 635, 498, 845, 929, 916, 741, 822, 446, 903, 730, 851, 872, 825, 475, 637, 846, 500, 930, 799, 742, 695, 487, 920, 745, 826, 732, 638, 853, 477, 907, 383, 719, 932, 880, 504, 746, 961, 699, 867, 854, 491, 828, 478, 909, 815, 857, 753, 962, 915, 936, 727, 748, 701, 869, 493, 910, 858, 754, 499, 964, 702, 917, 870, 823, 494, 447, 731, 873, 860, 944, 756, 847, 501, 931, 918, 743, 968, 921, 874, 827, 733, 639, 502, 933, 760, 881, 505, 922, 747, 734, 855, 876, 829, 479, 934, 976, 882, 506, 963, 937, 924, 749, 830, 911, 859, 755, 884, 508, 938, 750, 965, 703, 871, 495, 992, 861, 945, 757, 966, 919, 940, 888, 969, 875, 862, 946, 758, 503, 761, 970, 923, 735, 877, 948, 935, 762, 977, 883, 507, 972, 925, 878, 831, 978, 952, 764, 885, 509, 939, 926, 751, 993, 980, 886, 510, 967, 941, 889, 994, 863, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q206_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 160, 29, 134, 82, 56, 513, 137, 43, 30, 272, 97, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 162, 31, 528, 152, 320, 58, 273, 85, 515, 139, 268, 164, 112, 193, 274, 99, 86, 60, 517, 141, 47, 89, 544, 194, 147, 168, 289, 276, 101, 518, 142, 90, 263, 521, 384, 290, 196, 149, 102, 55, 280, 105, 92, 176, 522, 267, 79, 163, 150, 292, 576, 529, 200, 153, 106, 321, 59, 524, 269, 165, 113, 530, 154, 322, 275, 296, 87, 108, 61, 270, 166, 208, 114, 545, 195, 532, 169, 156, 324, 62, 277, 519, 143, 91, 304, 640, 116, 546, 170, 385, 291, 197, 278, 103, 536, 328, 281, 224, 93, 177, 523, 386, 548, 198, 151, 172, 120, 293, 577, 201, 282, 107, 94, 178, 525, 388, 294, 336, 578, 531, 552, 202, 155, 323, 297, 284, 109, 180, 526, 271, 167, 209, 115, 768, 580, 392, 533, 298, 204, 157, 110, 325, 63, 560, 210, 184, 352, 305, 641, 117, 547, 534, 171, 158, 326, 279, 300, 584, 537, 329, 400, 225, 306, 212, 642, 118, 387, 549, 199, 173, 121, 538, 330, 283, 226, 95, 179, 308, 644, 550, 592, 174, 216, 389, 122, 295, 337, 579, 553, 203, 540, 332, 416, 285, 228, 181, 527, 390, 338, 312, 648, 124, 554, 769, 581, 393, 299, 205, 286, 111, 182, 608, 561, 211, 232, 185, 353, 340, 770, 582, 394, 535, 556, 206, 159, 327, 301, 585, 656, 562, 448, 186, 401, 354, 307, 213, 643, 119, 772, 396, 302, 344, 240, 586, 539, 331, 402, 227, 564, 214, 188, 356, 309, 645, 551, 593, 175, 217, 123, 776, 588, 672, 541, 333, 417, 404, 229, 310, 646, 594, 568, 218, 391, 339, 360, 313, 649, 125, 555, 542, 334, 418, 287, 230, 183, 784, 609, 596, 408, 233, 314, 220, 650, 126, 341, 771, 583, 395, 557, 207, 420, 368, 704, 657, 610, 563, 234, 449, 187, 355, 342, 316, 652, 558, 600, 773, 397, 303, 345, 241, 587, 658, 800, 450, 403, 612, 424, 565, 215, 236, 189, 357, 774, 398, 346, 242, 777, 589, 673, 660, 566, 452, 190, 405, 358, 311, 647, 595, 616, 569, 219, 361, 348, 432, 778, 244, 590, 674, 543, 335, 419, 406, 231, 664, 832, 570, 785, 456, 597, 409, 362, 315, 221, 651, 127, 780, 676, 624, 248, 421, 369, 705, 786, 611, 598, 410, 235, 572, 222, 343, 364, 317, 653, 559, 601, 422, 464, 370, 706, 659, 680, 801, 451, 788, 613, 425, 412, 237, 318, 654, 602, 775, 399, 347, 243, 896, 372, 802, 708, 661, 614, 426, 567, 238, 453, 191, 359, 792, 617, 604, 688, 480, 349, 433, 779, 245, 591, 675, 662, 804, 454, 407, 428, 376, 712, 665, 618, 833, 571, 457, 363, 350, 434, 246, 781, 677, 625, 249, 666, 834, 787, 808, 458, 599, 411, 620, 573, 223, 365, 436, 782, 678, 720, 626, 250, 423, 465, 371, 707, 681, 668, 836, 574, 789, 460, 413, 366, 319, 655, 603, 816, 466, 628, 440, 252, 682, 897, 373, 803, 709, 790, 615, 427, 414, 239, 840, 793, 736, 605, 689, 481, 468, 898, 374, 710, 663, 684, 632, 805, 455, 429, 377, 713, 794, 619, 606, 690, 482, 351, 435, 247, 900, 806, 848, 430, 472, 378, 714, 667, 835, 809, 459, 796, 621, 692, 484, 437, 783, 679, 721, 627, 251, 904, 380, 810, 716, 669, 622, 837, 575, 461, 367, 438, 722, 696, 864, 817, 467, 488, 629, 441, 253, 683, 670, 838, 791, 812, 462, 415, 841, 912, 737, 818, 724, 630, 442, 254, 469, 899, 375, 711, 685, 633, 496, 842, 795, 738, 607, 691, 483, 820, 470, 444, 686, 728, 901, 634, 807, 849, 431, 473, 379, 715, 844, 928, 797, 740, 693, 485, 902, 850, 824, 474, 636, 905, 381, 811, 717, 798, 623, 694, 486, 439, 723, 744, 697, 865, 852, 489, 476, 906, 382, 718, 671, 839, 813, 463, 960, 698, 913, 866, 819, 725, 490, 631, 443, 255, 908, 814, 856, 752, 497, 843, 914, 739, 726, 700, 868, 821, 471, 492, 445, 687, 729, 635, 498, 845, 929, 916, 741, 822, 446, 730, 903, 851, 872, 825, 475, 637, 500, 846, 930, 799, 742, 695, 487, 920, 745, 826, 732, 638, 853, 477, 907, 383, 719, 932, 880, 504, 746, 961, 699, 867, 854, 491, 828, 478, 909, 815, 857, 753, 962, 915, 936, 727, 748, 701, 869, 493, 910, 858, 754, 499, 964, 702, 917, 870, 823, 494, 447, 731, 873, 860, 944, 756, 501, 847, 931, 918, 743, 968, 921, 874, 827, 733, 639, 502, 760, 933, 881, 505, 922, 747, 734, 855, 876, 829, 479, 934, 976, 882, 506, 963, 937, 924, 749, 830, 911, 859, 755, 884, 508, 938, 750, 965, 703, 871, 495, 992, 861, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 926, 751, 993, 980, 886, 510, 967, 941, 889, 994, 863, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q207_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 272, 97, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 274, 99, 86, 60, 517, 141, 47, 89, 544, 194, 147, 168, 289, 276, 101, 518, 142, 90, 263, 521, 384, 290, 196, 149, 102, 55, 280, 105, 92, 176, 522, 267, 79, 163, 150, 292, 576, 529, 200, 153, 106, 59, 321, 524, 269, 165, 113, 530, 154, 322, 275, 296, 87, 108, 61, 270, 166, 208, 114, 545, 195, 532, 169, 156, 62, 324, 277, 519, 143, 91, 304, 116, 640, 546, 170, 385, 291, 197, 278, 103, 536, 328, 281, 93, 224, 177, 523, 386, 548, 198, 151, 172, 120, 293, 577, 201, 282, 107, 94, 178, 525, 388, 294, 336, 578, 531, 552, 202, 155, 323, 297, 284, 109, 180, 526, 271, 167, 209, 115, 768, 580, 392, 533, 298, 204, 157, 110, 63, 325, 560, 210, 184, 352, 305, 117, 641, 547, 534, 171, 158, 326, 279, 300, 584, 537, 329, 400, 225, 306, 212, 118, 642, 387, 549, 199, 173, 121, 538, 330, 283, 95, 226, 179, 308, 644, 550, 592, 174, 216, 389, 122, 295, 337, 579, 553, 203, 540, 332, 285, 416, 228, 181, 527, 390, 338, 312, 124, 648, 554, 769, 581, 393, 299, 205, 286, 111, 182, 608, 561, 211, 232, 185, 353, 340, 770, 582, 394, 535, 556, 206, 159, 327, 301, 585, 656, 562, 186, 448, 401, 354, 307, 213, 119, 643, 772, 396, 302, 344, 240, 586, 539, 331, 402, 227, 564, 214, 188, 356, 309, 645, 551, 593, 175, 217, 123, 776, 588, 541, 672, 333, 417, 404, 229, 310, 646, 594, 568, 218, 391, 339, 360, 313, 125, 649, 555, 542, 334, 287, 418, 230, 183, 784, 609, 596, 408, 233, 314, 220, 126, 650, 341, 771, 583, 395, 557, 207, 420, 368, 704, 657, 610, 563, 234, 187, 449, 355, 342, 316, 652, 558, 600, 773, 397, 303, 345, 241, 587, 658, 800, 450, 403, 612, 424, 565, 215, 236, 189, 357, 774, 398, 346, 242, 777, 589, 673, 660, 566, 190, 452, 405, 358, 311, 647, 595, 616, 569, 219, 361, 348, 432, 778, 244, 590, 543, 674, 335, 419, 406, 231, 664, 570, 832, 785, 456, 597, 409, 362, 315, 221, 127, 651, 780, 676, 624, 248, 421, 369, 705, 786, 611, 598, 410, 235, 572, 222, 343, 364, 317, 653, 559, 601, 422, 464, 370, 706, 659, 680, 801, 451, 788, 613, 425, 412, 237, 318, 654, 602, 775, 399, 347, 243, 372, 896, 802, 708, 661, 614, 426, 567, 238, 191, 453, 359, 792, 617, 604, 688, 349, 480, 433, 779, 245, 591, 675, 662, 804, 454, 407, 428, 376, 712, 665, 618, 571, 833, 457, 363, 350, 434, 246, 781, 677, 625, 249, 666, 834, 787, 808, 458, 599, 411, 620, 573, 223, 365, 436, 782, 678, 720, 626, 250, 423, 465, 371, 707, 681, 668, 574, 836, 789, 460, 413, 366, 319, 655, 603, 816, 466, 628, 440, 252, 682, 373, 897, 803, 709, 790, 615, 427, 414, 239, 840, 793, 605, 736, 689, 481, 468, 374, 898, 710, 663, 684, 632, 805, 455, 429, 377, 713, 794, 619, 606, 690, 351, 482, 435, 247, 900, 806, 848, 430, 472, 378, 714, 667, 835, 809, 459, 796, 621, 692, 484, 437, 783, 679, 721, 627, 251, 380, 904, 810, 716, 669, 622, 575, 837, 461, 367, 438, 722, 696, 864, 817, 467, 488, 629, 441, 253, 683, 670, 838, 791, 812, 462, 415, 841, 912, 737, 818, 724, 630, 442, 254, 469, 375, 899, 711, 685, 633, 496, 842, 795, 607, 738, 691, 483, 820, 470, 444, 686, 728, 901, 634, 807, 849, 431, 473, 379, 715, 844, 797, 928, 740, 693, 485, 902, 850, 824, 474, 636, 381, 905, 811, 717, 798, 623, 694, 486, 439, 723, 744, 697, 865, 852, 489, 476, 382, 906, 718, 671, 839, 813, 463, 698, 960, 913, 866, 819, 725, 490, 631, 443, 255, 908, 814, 856, 752, 497, 843, 914, 739, 726, 700, 868, 821, 471, 492, 445, 687, 729, 635, 498, 845, 929, 916, 741, 822, 446, 730, 903, 851, 872, 825, 475, 637, 500, 846, 799, 930, 742, 695, 487, 920, 745, 826, 732, 638, 853, 477, 383, 907, 719, 932, 880, 504, 746, 699, 961, 867, 854, 491, 828, 478, 909, 815, 857, 753, 962, 915, 936, 727, 748, 701, 869, 493, 910, 858, 754, 499, 702, 964, 917, 870, 823, 494, 447, 731, 873, 860, 944, 756, 501, 847, 931, 918, 743, 968, 921, 874, 827, 733, 639, 502, 760, 933, 881, 505, 922, 747, 734, 855, 876, 829, 479, 934, 976, 882, 506, 963, 937, 924, 749, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 926, 751, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q208_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 544, 147, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 296, 87, 108, 61, 270, 166, 208, 114, 195, 545, 532, 169, 156, 62, 324, 277, 519, 143, 91, 304, 116, 640, 546, 170, 385, 291, 197, 103, 278, 536, 328, 281, 93, 224, 177, 523, 386, 198, 548, 151, 172, 120, 293, 577, 201, 107, 282, 94, 178, 525, 388, 294, 336, 578, 531, 202, 552, 155, 323, 297, 109, 284, 180, 526, 271, 167, 209, 115, 768, 580, 392, 533, 298, 204, 157, 110, 63, 325, 210, 560, 184, 352, 305, 117, 641, 547, 534, 171, 158, 326, 279, 300, 584, 537, 329, 225, 400, 306, 212, 118, 642, 387, 199, 549, 173, 121, 538, 330, 283, 95, 226, 179, 308, 644, 550, 592, 174, 216, 389, 122, 295, 337, 579, 203, 553, 540, 332, 285, 416, 228, 181, 527, 390, 338, 312, 124, 648, 554, 769, 581, 393, 299, 205, 111, 286, 182, 608, 211, 561, 232, 185, 353, 340, 770, 582, 394, 535, 206, 556, 159, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 593, 175, 217, 123, 776, 588, 541, 672, 333, 417, 229, 404, 310, 646, 594, 218, 568, 391, 339, 360, 313, 125, 649, 555, 542, 334, 287, 418, 230, 183, 609, 784, 596, 233, 408, 314, 220, 126, 650, 341, 771, 583, 395, 207, 557, 420, 368, 704, 657, 610, 563, 234, 187, 449, 355, 342, 316, 652, 558, 600, 773, 397, 303, 345, 241, 587, 658, 450, 800, 403, 612, 424, 215, 565, 236, 189, 357, 774, 398, 346, 242, 777, 589, 673, 660, 566, 190, 452, 405, 358, 311, 647, 595, 616, 219, 569, 361, 348, 432, 778, 244, 590, 543, 674, 335, 419, 231, 406, 664, 570, 832, 785, 456, 597, 409, 362, 315, 221, 127, 651, 780, 676, 624, 248, 421, 369, 705, 611, 786, 598, 235, 410, 222, 572, 343, 364, 317, 653, 559, 601, 422, 464, 370, 706, 659, 680, 451, 801, 613, 788, 425, 237, 412, 318, 654, 602, 775, 399, 347, 243, 372, 896, 802, 708, 661, 614, 426, 567, 238, 191, 453, 359, 617, 792, 604, 688, 349, 480, 433, 779, 245, 591, 675, 662, 454, 804, 407, 428, 376, 712, 665, 618, 571, 833, 457, 363, 350, 434, 246, 781, 677, 625, 249, 666, 834, 787, 458, 808, 599, 411, 620, 223, 573, 365, 436, 782, 678, 720, 626, 250, 423, 465, 371, 707, 681, 668, 574, 836, 789, 460, 413, 366, 319, 655, 603, 466, 816, 628, 440, 252, 682, 373, 897, 803, 709, 615, 790, 427, 239, 414, 840, 793, 605, 736, 689, 481, 468, 374, 898, 710, 663, 684, 632, 455, 805, 429, 377, 713, 619, 794, 606, 690, 351, 482, 435, 247, 900, 806, 848, 430, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 864, 467, 817, 488, 629, 441, 253, 683, 670, 838, 791, 462, 812, 415, 841, 737, 912, 818, 724, 630, 442, 254, 469, 375, 899, 711, 685, 633, 496, 842, 795, 607, 738, 691, 483, 470, 820, 444, 686, 728, 901, 634, 807, 849, 431, 473, 379, 715, 844, 797, 928, 740, 693, 485, 902, 850, 474, 824, 636, 381, 905, 811, 717, 623, 798, 694, 486, 439, 723, 744, 697, 865, 852, 489, 476, 382, 906, 718, 671, 839, 463, 813, 698, 960, 913, 866, 819, 725, 490, 631, 443, 255, 908, 814, 856, 752, 497, 843, 739, 914, 726, 700, 868, 471, 821, 492, 445, 687, 729, 635, 498, 845, 929, 741, 916, 822, 446, 730, 903, 851, 872, 475, 825, 637, 500, 846, 799, 930, 742, 695, 487, 745, 920, 826, 732, 638, 853, 477, 383, 907, 719, 932, 880, 504, 746, 699, 961, 867, 854, 491, 478, 828, 909, 815, 857, 753, 962, 915, 936, 727, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 876, 479, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q209_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 544, 147, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 296, 87, 108, 61, 270, 166, 208, 114, 195, 545, 169, 532, 156, 62, 324, 277, 519, 143, 91, 304, 116, 640, 546, 170, 385, 291, 197, 103, 278, 536, 328, 281, 93, 224, 177, 523, 386, 198, 548, 151, 172, 120, 293, 577, 201, 107, 282, 94, 178, 525, 388, 294, 336, 578, 531, 202, 552, 155, 323, 297, 109, 284, 180, 526, 271, 167, 209, 115, 768, 580, 392, 533, 298, 204, 157, 110, 63, 325, 210, 560, 184, 352, 305, 117, 641, 547, 171, 534, 158, 326, 279, 300, 584, 537, 329, 225, 400, 306, 212, 118, 642, 387, 199, 549, 173, 121, 538, 330, 283, 95, 226, 179, 308, 644, 550, 592, 174, 216, 389, 122, 295, 337, 579, 203, 553, 540, 332, 285, 416, 228, 181, 527, 390, 338, 312, 124, 648, 554, 769, 581, 393, 299, 205, 111, 286, 182, 608, 211, 561, 232, 185, 353, 340, 770, 582, 394, 535, 206, 556, 159, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 593, 175, 217, 123, 776, 588, 541, 672, 333, 417, 229, 404, 310, 646, 594, 218, 568, 391, 339, 360, 313, 125, 649, 555, 542, 334, 287, 418, 230, 183, 609, 784, 233, 596, 408, 314, 220, 126, 650, 341, 771, 583, 395, 207, 557, 420, 368, 704, 657, 610, 563, 234, 187, 449, 355, 342, 316, 652, 558, 600, 773, 397, 303, 345, 241, 587, 658, 450, 800, 403, 612, 424, 215, 565, 236, 189, 357, 774, 398, 346, 242, 777, 589, 673, 660, 566, 190, 452, 405, 358, 311, 647, 595, 616, 219, 569, 361, 348, 432, 778, 244, 590, 543, 674, 335, 419, 231, 406, 664, 570, 832, 785, 456, 597, 409, 362, 315, 221, 127, 651, 780, 676, 624, 248, 421, 369, 705, 611, 786, 235, 598, 410, 222, 572, 343, 364, 317, 653, 559, 601, 422, 464, 370, 706, 659, 680, 451, 801, 613, 425, 788, 237, 412, 318, 654, 602, 775, 399, 347, 243, 372, 896, 802, 708, 661, 614, 426, 567, 238, 191, 453, 359, 617, 792, 604, 688, 349, 480, 433, 779, 245, 591, 675, 662, 454, 804, 407, 428, 376, 712, 665, 618, 571, 833, 457, 363, 350, 434, 246, 781, 677, 625, 249, 666, 834, 787, 458, 808, 599, 411, 620, 223, 573, 365, 436, 782, 678, 720, 626, 250, 423, 465, 371, 707, 681, 668, 574, 836, 789, 460, 413, 366, 319, 655, 603, 466, 816, 628, 440, 252, 682, 373, 897, 803, 709, 615, 427, 790, 239, 414, 840, 793, 605, 736, 689, 481, 468, 374, 898, 710, 663, 684, 632, 455, 805, 429, 377, 713, 619, 794, 606, 690, 351, 482, 435, 247, 900, 806, 848, 430, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 864, 467, 817, 488, 629, 441, 253, 683, 670, 838, 791, 462, 812, 415, 841, 737, 912, 818, 724, 630, 442, 254, 469, 375, 899, 711, 685, 633, 496, 842, 795, 607, 738, 691, 483, 470, 820, 444, 686, 728, 901, 634, 807, 849, 431, 473, 379, 715, 844, 797, 928, 740, 693, 485, 902, 850, 474, 824, 636, 381, 905, 811, 717, 623, 798, 694, 486, 439, 723, 744, 697, 865, 489, 852, 476, 382, 906, 718, 671, 839, 463, 813, 698, 960, 913, 866, 819, 725, 490, 631, 443, 255, 908, 814, 856, 752, 497, 843, 739, 914, 726, 700, 868, 471, 821, 492, 445, 687, 729, 635, 498, 845, 929, 741, 916, 822, 446, 730, 903, 851, 872, 475, 825, 637, 500, 846, 799, 930, 742, 695, 487, 745, 920, 826, 732, 638, 853, 477, 383, 907, 719, 932, 880, 504, 746, 699, 961, 867, 491, 854, 478, 828, 909, 815, 857, 753, 962, 915, 936, 727, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 876, 479, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q210_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 544, 147, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 87, 296, 108, 61, 270, 166, 208, 114, 195, 545, 169, 532, 156, 62, 324, 277, 519, 143, 91, 304, 116, 640, 546, 170, 385, 291, 197, 103, 278, 536, 328, 281, 93, 224, 177, 523, 386, 198, 548, 151, 172, 120, 293, 577, 201, 107, 282, 94, 178, 525, 388, 294, 336, 578, 531, 202, 552, 155, 323, 297, 109, 284, 180, 526, 271, 167, 209, 115, 768, 580, 392, 533, 298, 204, 157, 110, 63, 325, 210, 560, 184, 352, 305, 117, 641, 547, 171, 534, 158, 326, 279, 300, 584, 537, 329, 225, 400, 306, 212, 118, 642, 387, 199, 549, 173, 121, 538, 330, 283, 95, 226, 179, 308, 644, 550, 174, 592, 216, 389, 122, 295, 337, 579, 203, 553, 540, 332, 285, 416, 228, 181, 527, 390, 338, 312, 124, 648, 554, 769, 581, 393, 299, 205, 111, 286, 182, 608, 211, 561, 232, 185, 353, 340, 770, 582, 394, 535, 206, 556, 159, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 175, 593, 217, 123, 776, 588, 541, 672, 333, 417, 229, 404, 310, 646, 594, 218, 391, 568, 339, 360, 313, 125, 649, 555, 542, 334, 287, 418, 230, 183, 609, 784, 233, 596, 408, 314, 220, 126, 650, 341, 771, 583, 395, 207, 557, 420, 368, 704, 657, 610, 563, 234, 187, 449, 355, 342, 316, 652, 558, 600, 773, 397, 303, 345, 241, 587, 658, 450, 800, 403, 612, 215, 424, 565, 236, 189, 357, 774, 398, 346, 242, 777, 589, 673, 660, 566, 190, 452, 405, 358, 311, 647, 595, 616, 219, 569, 361, 348, 432, 778, 244, 590, 543, 674, 335, 419, 231, 406, 664, 570, 832, 785, 456, 597, 409, 362, 315, 221, 127, 651, 780, 676, 624, 248, 421, 369, 705, 611, 786, 235, 598, 410, 222, 572, 343, 364, 317, 653, 559, 601, 422, 464, 370, 706, 659, 680, 451, 801, 613, 425, 788, 237, 412, 318, 654, 602, 775, 399, 347, 243, 372, 896, 802, 708, 661, 614, 426, 567, 238, 191, 453, 359, 617, 792, 604, 688, 349, 480, 433, 779, 245, 591, 675, 662, 454, 804, 407, 428, 376, 712, 665, 618, 571, 833, 457, 363, 350, 434, 246, 781, 677, 625, 249, 666, 834, 787, 458, 599, 808, 411, 620, 223, 573, 365, 436, 782, 678, 720, 626, 250, 423, 465, 371, 707, 681, 668, 574, 836, 789, 460, 413, 366, 319, 655, 603, 466, 816, 628, 440, 252, 682, 373, 897, 803, 709, 615, 427, 790, 239, 414, 840, 793, 605, 736, 689, 481, 468, 374, 898, 710, 663, 684, 455, 632, 805, 429, 377, 713, 619, 794, 606, 690, 351, 482, 435, 247, 900, 806, 430, 848, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 864, 467, 817, 488, 629, 441, 253, 683, 670, 838, 791, 462, 812, 415, 841, 737, 912, 818, 724, 630, 442, 254, 469, 375, 899, 711, 685, 633, 496, 842, 795, 607, 738, 691, 483, 470, 820, 444, 686, 728, 901, 634, 807, 431, 849, 473, 379, 715, 844, 797, 928, 740, 693, 485, 902, 850, 474, 824, 636, 381, 905, 811, 717, 623, 798, 694, 486, 439, 723, 744, 697, 865, 489, 852, 476, 382, 906, 718, 671, 839, 463, 813, 698, 960, 913, 866, 819, 725, 490, 631, 443, 255, 908, 814, 856, 752, 497, 843, 739, 914, 726, 700, 868, 471, 821, 492, 445, 687, 729, 635, 498, 845, 929, 741, 916, 822, 446, 730, 903, 851, 872, 475, 825, 637, 500, 846, 799, 930, 742, 695, 487, 745, 920, 826, 732, 638, 853, 477, 383, 907, 719, 932, 880, 504, 746, 699, 961, 867, 491, 854, 478, 828, 909, 815, 857, 753, 962, 915, 727, 936, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 876, 479, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q211_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 147, 544, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 87, 296, 108, 61, 270, 166, 208, 114, 195, 545, 169, 532, 156, 62, 324, 277, 519, 143, 91, 304, 116, 640, 546, 170, 385, 291, 197, 103, 278, 536, 328, 281, 93, 224, 177, 523, 386, 198, 151, 548, 172, 120, 293, 577, 201, 107, 282, 94, 178, 525, 388, 294, 336, 578, 531, 202, 155, 552, 323, 297, 109, 284, 180, 526, 271, 167, 209, 115, 768, 580, 392, 533, 298, 204, 157, 110, 63, 325, 210, 560, 184, 352, 305, 117, 641, 547, 171, 534, 158, 326, 279, 300, 584, 537, 329, 225, 400, 306, 212, 118, 642, 387, 199, 549, 173, 121, 538, 330, 283, 95, 226, 179, 308, 644, 550, 174, 592, 216, 389, 122, 295, 337, 579, 203, 553, 540, 332, 285, 416, 228, 181, 527, 390, 338, 312, 124, 648, 554, 769, 581, 393, 299, 205, 111, 286, 182, 211, 608, 561, 232, 185, 353, 340, 770, 582, 394, 535, 206, 159, 556, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 175, 593, 217, 123, 776, 588, 541, 672, 333, 417, 229, 404, 310, 646, 594, 218, 391, 568, 339, 360, 313, 125, 649, 555, 542, 334, 287, 418, 230, 183, 609, 784, 233, 596, 408, 314, 220, 126, 650, 341, 771, 583, 395, 207, 557, 420, 368, 704, 657, 610, 563, 234, 187, 449, 355, 342, 316, 652, 558, 600, 773, 397, 303, 345, 241, 587, 658, 450, 403, 800, 215, 612, 424, 565, 236, 189, 357, 774, 398, 346, 242, 777, 589, 673, 660, 566, 190, 452, 405, 358, 311, 647, 595, 219, 616, 569, 361, 348, 432, 778, 244, 590, 543, 674, 335, 419, 231, 406, 664, 570, 832, 785, 456, 597, 409, 362, 315, 221, 127, 651, 780, 676, 624, 248, 421, 369, 705, 611, 786, 235, 598, 410, 222, 572, 343, 364, 317, 653, 559, 601, 422, 464, 370, 706, 659, 680, 451, 801, 613, 425, 788, 237, 412, 318, 654, 602, 775, 399, 347, 243, 372, 896, 802, 708, 661, 614, 426, 567, 238, 191, 453, 359, 617, 792, 604, 688, 349, 480, 433, 779, 245, 591, 675, 662, 454, 407, 804, 428, 376, 712, 665, 618, 571, 833, 457, 363, 350, 434, 246, 781, 677, 625, 249, 666, 834, 787, 458, 599, 411, 808, 223, 620, 573, 365, 436, 782, 678, 720, 626, 250, 423, 465, 371, 707, 681, 668, 574, 836, 789, 460, 413, 366, 319, 655, 603, 466, 816, 628, 440, 252, 682, 373, 897, 803, 709, 615, 427, 790, 239, 414, 840, 793, 605, 736, 689, 481, 468, 374, 898, 710, 663, 684, 455, 632, 805, 429, 377, 713, 619, 794, 606, 690, 351, 482, 435, 247, 900, 806, 430, 848, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 467, 864, 817, 488, 629, 441, 253, 683, 670, 838, 791, 462, 415, 812, 841, 737, 912, 818, 724, 630, 442, 254, 469, 375, 899, 711, 685, 633, 496, 842, 795, 607, 738, 691, 483, 470, 820, 444, 686, 728, 901, 634, 807, 431, 849, 473, 379, 715, 844, 797, 928, 740, 693, 485, 902, 850, 474, 824, 636, 381, 905, 811, 717, 623, 798, 694, 486, 439, 723, 744, 697, 865, 489, 852, 476, 382, 906, 718, 671, 839, 463, 813, 698, 960, 913, 866, 819, 725, 490, 631, 443, 255, 908, 814, 856, 752, 497, 843, 739, 914, 726, 700, 471, 868, 821, 492, 445, 687, 729, 635, 498, 845, 929, 741, 916, 822, 446, 730, 903, 851, 475, 872, 825, 637, 500, 846, 799, 930, 742, 695, 487, 745, 920, 826, 732, 638, 853, 477, 383, 907, 719, 932, 880, 504, 746, 699, 961, 867, 491, 854, 478, 828, 909, 815, 857, 753, 962, 915, 727, 936, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 479, 876, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q212_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 147, 544, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 87, 296, 108, 61, 270, 166, 208, 114, 195, 545, 169, 532, 156, 62, 324, 277, 519, 143, 91, 304, 116, 640, 546, 170, 385, 291, 197, 103, 278, 536, 328, 281, 93, 224, 177, 523, 386, 198, 151, 548, 172, 120, 293, 577, 201, 107, 282, 94, 178, 525, 388, 294, 336, 578, 531, 202, 155, 552, 323, 297, 109, 284, 180, 526, 271, 167, 209, 115, 768, 580, 392, 533, 298, 204, 157, 110, 63, 325, 210, 560, 184, 352, 305, 117, 641, 547, 171, 534, 158, 326, 279, 300, 584, 537, 329, 225, 400, 306, 212, 118, 642, 387, 199, 549, 173, 121, 538, 330, 283, 95, 226, 179, 308, 644, 550, 174, 592, 216, 122, 389, 295, 337, 579, 203, 553, 540, 332, 285, 416, 228, 181, 527, 390, 338, 312, 124, 648, 554, 769, 581, 393, 299, 205, 111, 286, 182, 211, 608, 561, 232, 185, 353, 340, 770, 582, 394, 535, 206, 159, 556, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 175, 593, 217, 123, 776, 588, 541, 672, 333, 417, 229, 404, 310, 646, 594, 218, 391, 568, 339, 360, 313, 125, 649, 555, 542, 334, 287, 418, 230, 183, 609, 784, 233, 596, 408, 314, 220, 126, 650, 341, 771, 583, 395, 207, 557, 420, 368, 704, 657, 610, 563, 234, 187, 449, 355, 342, 316, 652, 558, 600, 773, 397, 303, 345, 241, 587, 658, 450, 403, 800, 215, 612, 424, 565, 236, 189, 357, 774, 398, 346, 242, 777, 589, 673, 660, 566, 190, 452, 405, 358, 311, 647, 595, 219, 616, 569, 361, 348, 432, 244, 778, 590, 543, 674, 335, 419, 231, 406, 664, 570, 832, 785, 456, 597, 409, 362, 315, 221, 127, 651, 780, 676, 624, 248, 421, 369, 705, 611, 786, 235, 598, 410, 222, 572, 343, 364, 317, 653, 559, 601, 422, 464, 370, 706, 659, 680, 451, 801, 613, 425, 788, 237, 412, 318, 654, 602, 775, 399, 347, 243, 372, 896, 802, 708, 661, 614, 426, 567, 238, 191, 453, 359, 617, 792, 604, 688, 349, 480, 433, 245, 779, 591, 675, 662, 454, 407, 804, 428, 376, 712, 665, 618, 571, 833, 457, 363, 350, 434, 246, 781, 677, 625, 249, 666, 834, 787, 458, 599, 411, 808, 223, 620, 573, 365, 436, 782, 678, 720, 626, 250, 423, 465, 371, 707, 681, 668, 574, 836, 789, 460, 413, 366, 319, 655, 603, 466, 816, 628, 440, 252, 682, 373, 897, 803, 709, 615, 427, 790, 239, 414, 840, 793, 605, 736, 689, 481, 468, 374, 898, 710, 663, 684, 455, 632, 805, 429, 377, 713, 619, 794, 606, 690, 351, 482, 435, 247, 900, 806, 430, 848, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 467, 864, 817, 488, 629, 441, 253, 683, 670, 838, 791, 462, 415, 812, 841, 737, 912, 818, 724, 630, 442, 254, 469, 375, 899, 711, 685, 633, 496, 842, 795, 607, 738, 691, 483, 470, 820, 444, 686, 728, 634, 901, 807, 431, 849, 473, 379, 715, 844, 797, 928, 740, 693, 485, 902, 850, 474, 824, 636, 381, 905, 811, 717, 623, 798, 694, 486, 439, 723, 744, 697, 865, 489, 852, 476, 382, 906, 718, 671, 839, 463, 813, 698, 960, 913, 866, 819, 725, 490, 631, 443, 255, 908, 814, 856, 752, 497, 843, 739, 914, 726, 700, 471, 868, 821, 492, 445, 687, 729, 635, 498, 845, 929, 741, 916, 822, 446, 730, 903, 851, 475, 872, 825, 637, 500, 846, 799, 930, 742, 695, 487, 745, 920, 826, 732, 638, 853, 477, 383, 907, 719, 932, 880, 504, 746, 699, 961, 867, 491, 854, 478, 828, 909, 815, 857, 753, 962, 915, 727, 936, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 479, 876, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q213_1^{1024}$=[0, 1, 2, 4, 8, 16, 3, 5, 32, 6, 9, 10, 64, 17, 12, 18, 33, 20, 7, 128, 34, 24, 11, 36, 65, 13, 66, 19, 40, 14, 256, 68, 21, 48, 129, 35, 22, 72, 25, 130, 37, 26, 132, 38, 80, 67, 41, 28, 15, 512, 136, 42, 257, 69, 96, 49, 258, 70, 23, 44, 73, 144, 50, 131, 260, 74, 27, 52, 133, 39, 81, 264, 76, 29, 160, 134, 82, 56, 513, 137, 43, 30, 97, 272, 84, 514, 138, 259, 71, 45, 192, 145, 98, 51, 516, 140, 46, 88, 261, 75, 146, 288, 100, 53, 262, 520, 265, 77, 161, 148, 54, 135, 83, 104, 57, 266, 78, 31, 162, 528, 152, 58, 320, 273, 85, 515, 139, 268, 164, 112, 193, 99, 274, 86, 60, 517, 141, 47, 89, 194, 147, 544, 168, 289, 101, 276, 518, 142, 90, 263, 521, 384, 290, 196, 149, 102, 55, 105, 280, 92, 176, 522, 267, 79, 163, 150, 292, 576, 529, 200, 153, 106, 59, 321, 524, 269, 165, 113, 530, 154, 322, 275, 87, 296, 108, 61, 270, 166, 208, 114, 195, 545, 169, 532, 156, 62, 324, 277, 519, 143, 91, 304, 116, 640, 546, 170, 385, 291, 197, 103, 278, 536, 328, 281, 93, 224, 177, 523, 386, 198, 151, 548, 172, 120, 293, 577, 201, 107, 282, 94, 178, 525, 388, 294, 336, 578, 531, 202, 155, 552, 323, 297, 109, 284, 180, 526, 271, 167, 209, 115, 768, 580, 392, 533, 298, 204, 157, 110, 63, 325, 210, 560, 184, 352, 305, 117, 641, 547, 171, 534, 158, 326, 279, 300, 584, 537, 329, 225, 400, 306, 212, 118, 642, 387, 199, 549, 173, 121, 538, 330, 283, 95, 226, 179, 308, 644, 550, 174, 592, 216, 122, 389, 295, 337, 579, 203, 553, 540, 332, 285, 416, 228, 181, 527, 390, 338, 312, 124, 648, 554, 769, 581, 393, 299, 205, 111, 286, 182, 211, 608, 561, 232, 185, 353, 340, 770, 582, 394, 535, 206, 159, 556, 327, 301, 585, 656, 562, 186, 448, 401, 354, 307, 213, 119, 643, 772, 396, 302, 344, 240, 586, 539, 331, 227, 402, 214, 564, 188, 356, 309, 645, 551, 175, 593, 217, 123, 776, 588, 541, 672, 333, 417, 229, 404, 310, 646, 594, 218, 391, 568, 339, 360, 313, 125, 649, 555, 542, 334, 287, 418, 230, 183, 609, 233, 784, 596, 408, 314, 220, 126, 341, 650, 771, 583, 395, 207, 557, 420, 368, 704, 657, 610, 563, 234, 187, 449, 355, 342, 316, 652, 558, 600, 773, 397, 303, 345, 241, 587, 658, 450, 403, 215, 800, 612, 424, 565, 236, 189, 357, 774, 398, 346, 242, 777, 589, 673, 660, 566, 190, 452, 405, 358, 311, 647, 595, 219, 616, 569, 361, 348, 432, 244, 778, 590, 543, 674, 335, 419, 231, 406, 664, 570, 832, 785, 456, 597, 409, 362, 315, 221, 127, 651, 780, 676, 624, 248, 421, 369, 705, 611, 235, 786, 598, 410, 222, 572, 343, 364, 317, 653, 559, 601, 422, 464, 370, 706, 659, 680, 451, 801, 613, 425, 237, 788, 412, 318, 654, 602, 775, 399, 347, 243, 372, 896, 802, 708, 661, 614, 426, 567, 238, 191, 453, 359, 617, 792, 604, 688, 349, 480, 433, 245, 779, 591, 675, 662, 454, 407, 804, 428, 376, 712, 665, 618, 571, 833, 457, 363, 350, 434, 246, 781, 677, 625, 249, 666, 834, 787, 458, 599, 411, 223, 808, 620, 573, 365, 436, 782, 678, 720, 626, 250, 423, 465, 371, 707, 681, 668, 574, 836, 789, 460, 413, 366, 319, 655, 603, 466, 816, 628, 440, 252, 373, 682, 897, 803, 709, 615, 427, 239, 790, 414, 840, 793, 605, 736, 689, 481, 468, 374, 898, 710, 663, 684, 455, 632, 805, 429, 377, 713, 619, 794, 606, 690, 351, 482, 435, 247, 900, 806, 430, 848, 472, 378, 714, 667, 835, 459, 809, 621, 796, 692, 484, 437, 783, 679, 721, 627, 251, 380, 904, 810, 716, 669, 622, 575, 837, 461, 367, 438, 722, 696, 467, 864, 817, 488, 629, 441, 253, 683, 670, 838, 791, 462, 415, 812, 841, 737, 912, 818, 724, 630, 442, 254, 469, 375, 899, 711, 685, 633, 496, 842, 795, 607, 738, 691, 483, 470, 820, 444, 686, 728, 634, 901, 807, 431, 849, 473, 379, 715, 844, 797, 928, 740, 693, 485, 902, 850, 474, 824, 636, 381, 905, 811, 717, 623, 798, 694, 486, 439, 723, 744, 697, 865, 489, 852, 476, 382, 906, 718, 671, 839, 463, 813, 698, 960, 913, 866, 819, 725, 490, 631, 443, 255, 908, 814, 856, 752, 497, 843, 739, 914, 726, 700, 471, 868, 821, 492, 445, 687, 729, 635, 498, 845, 929, 741, 916, 822, 446, 730, 903, 851, 475, 872, 825, 637, 500, 846, 799, 930, 742, 695, 487, 745, 920, 826, 732, 638, 853, 477, 383, 907, 719, 932, 880, 504, 746, 699, 961, 867, 491, 854, 478, 828, 909, 815, 857, 753, 962, 915, 727, 936, 748, 701, 869, 493, 910, 858, 754, 499, 702, 964, 917, 870, 823, 494, 447, 731, 873, 860, 944, 756, 501, 847, 931, 743, 918, 968, 921, 874, 827, 733, 639, 502, 760, 933, 881, 505, 747, 922, 734, 855, 479, 876, 829, 934, 976, 882, 506, 963, 937, 749, 924, 830, 911, 859, 755, 884, 508, 938, 750, 703, 965, 871, 495, 861, 992, 945, 757, 966, 919, 940, 888, 969, 875, 862, 946, 758, 503, 761, 970, 923, 735, 877, 948, 762, 935, 977, 883, 507, 972, 925, 878, 831, 978, 952, 764, 885, 509, 939, 751, 926, 993, 980, 886, 510, 967, 941, 889, 863, 994, 947, 759, 942, 984, 890, 971, 996, 949, 763, 892, 973, 879, 950, 979, 1000, 953, 765, 974, 927, 954, 766, 981, 887, 511, 1008, 995, 982, 956, 943, 985, 891, 997, 986, 893, 998, 951, 1001, 988, 894, 975, 1002, 955, 767, 1009, 983, 1004, 957, 1010, 958, 987, 1012, 999, 989, 895, 1016, 1003, 990, 1005, 1011, 1006, 959, 1013, 1014, 1017, 991, 1018, 1020, 1007, 1015, 1019, 1021, 1022, 1023];

$Q214_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 513, 30, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 322, 61, 108, 296, 270, 166, 114, 208, 195, 169, 545, 62, 156, 532, 277, 324, 143, 519, 91, 116, 304, 170, 546, 640, 103, 197, 291, 385, 278, 536, 93, 281, 328, 177, 224, 523, 151, 198, 386, 172, 548, 120, 293, 107, 201, 577, 94, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 547, 641, 158, 534, 279, 326, 300, 537, 584, 329, 225, 118, 212, 306, 400, 642, 199, 387, 173, 549, 121, 538, 95, 283, 330, 179, 226, 308, 174, 550, 644, 122, 216, 592, 295, 389, 337, 203, 579, 553, 540, 285, 332, 181, 228, 416, 527, 390, 338, 124, 312, 554, 648, 111, 205, 299, 393, 581, 769, 286, 182, 211, 185, 232, 561, 608, 353, 340, 159, 206, 535, 394, 582, 770, 556, 327, 301, 585, 186, 562, 656, 119, 213, 307, 354, 401, 448, 643, 302, 396, 772, 344, 240, 539, 586, 331, 227, 214, 402, 188, 564, 309, 356, 175, 551, 645, 123, 217, 593, 541, 588, 776, 672, 333, 229, 417, 310, 404, 646, 218, 594, 391, 568, 339, 125, 313, 360, 555, 649, 542, 287, 334, 183, 230, 418, 233, 609, 126, 220, 314, 408, 596, 784, 341, 650, 207, 395, 583, 771, 557, 420, 368, 187, 234, 563, 610, 657, 704, 355, 449, 342, 316, 558, 652, 600, 303, 397, 773, 345, 241, 587, 658, 215, 403, 450, 189, 236, 565, 424, 612, 800, 357, 398, 774, 346, 242, 589, 777, 673, 190, 566, 660, 311, 358, 405, 452, 647, 219, 595, 569, 616, 361, 348, 244, 432, 543, 590, 778, 674, 335, 231, 419, 406, 570, 664, 127, 221, 315, 362, 409, 597, 456, 785, 832, 651, 780, 676, 248, 624, 421, 369, 235, 611, 705, 222, 410, 598, 786, 572, 343, 317, 364, 559, 653, 601, 422, 370, 464, 659, 706, 680, 451, 237, 425, 613, 801, 318, 412, 788, 654, 602, 399, 775, 347, 243, 372, 191, 238, 567, 426, 614, 661, 708, 802, 896, 359, 453, 617, 604, 792, 688, 349, 245, 433, 480, 591, 779, 675, 662, 407, 454, 428, 804, 376, 571, 618, 665, 712, 363, 457, 833, 350, 246, 434, 781, 677, 249, 625, 666, 223, 411, 599, 458, 787, 834, 573, 620, 808, 365, 436, 782, 678, 250, 626, 720, 423, 371, 465, 707, 681, 574, 668, 319, 366, 413, 460, 789, 836, 655, 603, 466, 252, 440, 628, 816, 373, 682, 239, 427, 615, 709, 803, 897, 414, 790, 605, 793, 840, 689, 736, 481, 374, 468, 663, 710, 898, 684, 455, 632, 429, 805, 377, 619, 713, 606, 794, 690, 351, 247, 435, 482, 430, 806, 900, 378, 472, 848, 667, 714, 459, 835, 621, 809, 796, 692, 437, 484, 783, 679, 251, 627, 721, 380, 575, 622, 669, 716, 810, 904, 367, 461, 837, 438, 722, 696, 467, 253, 441, 629, 488, 817, 864, 683, 670, 415, 462, 791, 838, 812, 841, 737, 254, 442, 630, 724, 818, 912, 375, 469, 711, 899, 685, 633, 496, 607, 795, 842, 691, 738, 483, 470, 444, 820, 686, 634, 728, 431, 807, 901, 379, 473, 849, 715, 797, 844, 693, 740, 928, 485, 902, 474, 850, 636, 824, 381, 623, 717, 811, 905, 798, 694, 439, 486, 723, 697, 744, 489, 865, 382, 476, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 929, 446, 822, 916, 730, 903, 475, 851, 637, 825, 872, 500, 799, 846, 695, 742, 930, 487, 745, 638, 732, 826, 920, 383, 477, 853, 719, 907, 932, 504, 880, 699, 746, 491, 867, 961, 478, 854, 828, 815, 909, 857, 753, 727, 915, 962, 701, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 993, 510, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q215_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 513, 30, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 322, 61, 108, 296, 270, 166, 114, 208, 195, 169, 545, 62, 156, 532, 277, 324, 143, 519, 91, 116, 304, 170, 546, 640, 103, 197, 291, 385, 278, 536, 93, 281, 328, 177, 224, 523, 151, 198, 386, 172, 548, 120, 293, 107, 201, 577, 94, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 547, 641, 158, 534, 279, 326, 300, 537, 584, 329, 225, 118, 212, 306, 400, 642, 199, 387, 173, 549, 121, 538, 95, 283, 330, 179, 226, 308, 174, 550, 644, 122, 216, 592, 295, 389, 337, 203, 579, 553, 540, 285, 332, 181, 228, 416, 527, 390, 338, 124, 312, 554, 648, 111, 205, 299, 393, 581, 769, 286, 182, 211, 185, 232, 561, 608, 353, 340, 159, 206, 535, 394, 582, 770, 556, 327, 301, 585, 186, 562, 656, 119, 213, 307, 354, 401, 448, 643, 302, 396, 772, 344, 240, 539, 586, 331, 227, 214, 402, 188, 564, 309, 356, 175, 551, 645, 123, 217, 593, 541, 588, 776, 333, 672, 229, 417, 310, 404, 646, 218, 594, 391, 568, 339, 125, 313, 360, 555, 649, 542, 287, 334, 183, 230, 418, 233, 609, 126, 220, 314, 408, 596, 784, 341, 650, 207, 395, 583, 771, 557, 420, 368, 187, 234, 563, 610, 657, 704, 355, 449, 342, 316, 558, 652, 600, 303, 397, 773, 345, 241, 587, 658, 215, 403, 450, 189, 236, 565, 424, 612, 800, 357, 398, 774, 346, 242, 589, 777, 673, 190, 566, 660, 311, 358, 405, 452, 647, 219, 595, 569, 616, 361, 348, 244, 432, 543, 590, 778, 335, 674, 231, 419, 406, 570, 664, 127, 221, 315, 362, 409, 597, 456, 785, 832, 651, 780, 676, 248, 624, 421, 369, 235, 611, 705, 222, 410, 598, 786, 572, 343, 317, 364, 559, 653, 601, 422, 370, 464, 659, 706, 680, 451, 237, 425, 613, 801, 318, 412, 788, 654, 602, 399, 775, 347, 243, 372, 191, 238, 567, 426, 614, 661, 708, 802, 896, 359, 453, 617, 604, 792, 349, 688, 245, 433, 480, 591, 779, 675, 662, 407, 454, 428, 804, 376, 571, 618, 665, 712, 363, 457, 833, 350, 246, 434, 781, 677, 249, 625, 666, 223, 411, 599, 458, 787, 834, 573, 620, 808, 365, 436, 782, 678, 250, 626, 720, 423, 371, 465, 707, 681, 574, 668, 319, 366, 413, 460, 789, 836, 655, 603, 466, 252, 440, 628, 816, 373, 682, 239, 427, 615, 709, 803, 897, 414, 790, 605, 793, 840, 689, 736, 481, 374, 468, 663, 710, 898, 684, 455, 632, 429, 805, 377, 619, 713, 606, 794, 351, 690, 247, 435, 482, 430, 806, 900, 378, 472, 848, 667, 714, 459, 835, 621, 809, 796, 692, 437, 484, 783, 679, 251, 627, 721, 380, 575, 622, 669, 716, 810, 904, 367, 461, 837, 438, 722, 696, 467, 253, 441, 629, 488, 817, 864, 683, 670, 415, 462, 791, 838, 812, 841, 737, 254, 442, 630, 724, 818, 912, 375, 469, 711, 899, 685, 633, 496, 607, 795, 842, 691, 738, 483, 470, 444, 820, 686, 634, 728, 431, 807, 901, 379, 473, 849, 715, 797, 844, 693, 740, 928, 485, 902, 474, 850, 636, 824, 381, 623, 717, 811, 905, 798, 694, 439, 486, 723, 697, 744, 489, 865, 382, 476, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 929, 446, 822, 916, 730, 903, 475, 851, 637, 825, 872, 500, 799, 846, 695, 742, 930, 487, 745, 638, 732, 826, 920, 383, 477, 853, 719, 907, 932, 504, 880, 699, 746, 491, 867, 961, 478, 854, 828, 815, 909, 857, 753, 727, 915, 962, 701, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 993, 510, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q216_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 513, 30, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 322, 61, 108, 296, 270, 166, 114, 208, 195, 169, 545, 62, 156, 532, 277, 324, 143, 519, 91, 116, 304, 170, 546, 640, 103, 197, 291, 385, 278, 536, 93, 281, 328, 177, 224, 523, 151, 198, 386, 172, 548, 120, 293, 107, 201, 577, 94, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 547, 641, 158, 534, 279, 326, 300, 537, 584, 329, 225, 118, 212, 306, 400, 642, 199, 387, 173, 549, 121, 538, 95, 283, 330, 179, 226, 308, 174, 550, 644, 122, 216, 295, 592, 389, 337, 203, 579, 553, 540, 285, 332, 181, 228, 416, 527, 390, 338, 124, 312, 554, 648, 111, 205, 299, 393, 581, 769, 286, 182, 211, 185, 232, 561, 608, 353, 340, 159, 206, 535, 394, 582, 770, 556, 327, 301, 585, 186, 562, 656, 119, 213, 307, 354, 401, 448, 643, 302, 396, 772, 344, 240, 539, 586, 331, 227, 214, 402, 188, 564, 309, 356, 175, 551, 645, 123, 217, 593, 541, 588, 776, 333, 672, 229, 417, 310, 404, 646, 218, 594, 391, 568, 339, 125, 313, 360, 555, 649, 542, 287, 334, 183, 230, 418, 233, 609, 126, 220, 314, 408, 596, 784, 341, 650, 207, 395, 583, 771, 557, 420, 368, 187, 234, 563, 610, 657, 704, 355, 449, 342, 316, 558, 652, 303, 600, 397, 773, 345, 241, 587, 658, 215, 403, 450, 189, 236, 565, 424, 612, 800, 357, 398, 774, 346, 242, 589, 777, 673, 190, 566, 660, 311, 358, 405, 452, 647, 219, 595, 569, 616, 361, 348, 244, 432, 543, 590, 778, 335, 674, 231, 419, 406, 570, 664, 127, 221, 315, 362, 409, 597, 456, 785, 832, 651, 780, 676, 248, 624, 421, 369, 235, 611, 705, 222, 410, 598, 786, 572, 343, 317, 364, 559, 653, 601, 422, 370, 464, 659, 706, 680, 451, 237, 425, 613, 801, 318, 412, 788, 654, 602, 399, 775, 347, 243, 372, 191, 238, 567, 426, 614, 661, 708, 802, 896, 359, 453, 617, 604, 792, 349, 688, 245, 433, 480, 591, 779, 675, 662, 407, 454, 428, 804, 376, 571, 618, 665, 712, 363, 457, 833, 350, 246, 434, 781, 677, 249, 625, 666, 223, 411, 599, 458, 787, 834, 573, 620, 808, 365, 436, 782, 678, 250, 626, 423, 720, 371, 465, 707, 681, 574, 668, 319, 366, 413, 460, 789, 836, 655, 603, 466, 252, 440, 628, 816, 373, 682, 239, 427, 615, 709, 803, 897, 414, 790, 605, 793, 840, 689, 736, 481, 374, 468, 663, 710, 898, 684, 455, 632, 429, 805, 377, 619, 713, 606, 794, 351, 690, 247, 435, 482, 430, 806, 900, 378, 472, 848, 667, 714, 459, 835, 621, 809, 796, 692, 437, 484, 783, 679, 251, 627, 721, 380, 575, 622, 669, 716, 810, 904, 367, 461, 837, 438, 722, 696, 467, 253, 441, 629, 488, 817, 864, 683, 670, 415, 462, 791, 838, 812, 841, 737, 254, 442, 630, 724, 818, 912, 375, 469, 711, 899, 685, 633, 496, 607, 795, 842, 691, 738, 483, 470, 444, 820, 686, 634, 431, 728, 807, 901, 379, 473, 849, 715, 797, 844, 693, 740, 928, 485, 902, 474, 850, 636, 824, 381, 623, 717, 811, 905, 798, 694, 439, 486, 723, 697, 744, 489, 865, 382, 476, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 929, 446, 822, 916, 730, 903, 475, 851, 637, 825, 872, 500, 799, 846, 695, 742, 930, 487, 745, 638, 732, 826, 920, 383, 477, 853, 719, 907, 932, 504, 880, 699, 746, 491, 867, 961, 478, 854, 828, 815, 909, 857, 753, 727, 915, 962, 701, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 993, 510, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q217_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 30, 513, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 322, 61, 108, 296, 270, 166, 114, 208, 195, 169, 62, 545, 156, 532, 277, 324, 143, 519, 91, 116, 304, 170, 546, 640, 103, 197, 291, 385, 278, 536, 93, 281, 328, 177, 224, 523, 151, 198, 386, 172, 548, 120, 293, 107, 201, 94, 577, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 547, 158, 641, 534, 279, 326, 300, 537, 584, 329, 225, 118, 212, 306, 400, 642, 199, 387, 173, 549, 121, 538, 95, 283, 330, 179, 226, 308, 174, 550, 644, 122, 216, 295, 592, 389, 337, 203, 579, 553, 540, 285, 332, 181, 228, 416, 527, 390, 338, 124, 312, 554, 648, 111, 205, 299, 393, 581, 286, 769, 182, 211, 185, 232, 561, 608, 353, 340, 159, 206, 535, 394, 582, 770, 556, 327, 301, 585, 186, 562, 656, 119, 213, 307, 354, 401, 448, 643, 302, 396, 772, 344, 240, 539, 586, 331, 227, 214, 402, 188, 564, 309, 356, 175, 551, 645, 123, 217, 593, 541, 588, 776, 333, 672, 229, 417, 310, 404, 646, 218, 594, 391, 568, 339, 125, 313, 360, 555, 649, 542, 287, 334, 183, 230, 418, 233, 126, 609, 220, 314, 408, 596, 784, 341, 650, 207, 395, 583, 771, 557, 420, 368, 187, 234, 563, 610, 657, 704, 355, 449, 342, 316, 558, 652, 303, 600, 397, 773, 345, 241, 587, 658, 215, 403, 450, 189, 236, 565, 424, 612, 800, 357, 398, 774, 346, 242, 589, 777, 190, 673, 566, 660, 311, 358, 405, 452, 647, 219, 595, 569, 616, 361, 348, 244, 432, 543, 590, 778, 335, 674, 231, 419, 406, 570, 664, 127, 221, 315, 362, 409, 597, 456, 785, 832, 651, 780, 676, 248, 624, 421, 369, 235, 611, 222, 705, 410, 598, 786, 572, 343, 317, 364, 559, 653, 601, 422, 370, 464, 659, 706, 680, 451, 237, 425, 613, 318, 801, 412, 788, 654, 602, 399, 775, 347, 243, 372, 191, 238, 567, 426, 614, 661, 708, 802, 896, 359, 453, 617, 604, 792, 349, 688, 245, 433, 480, 591, 779, 675, 662, 407, 454, 428, 804, 376, 571, 618, 665, 712, 363, 457, 350, 833, 246, 434, 781, 677, 249, 625, 666, 223, 411, 599, 458, 787, 834, 573, 620, 808, 365, 436, 782, 678, 250, 626, 423, 720, 371, 465, 707, 681, 574, 668, 319, 366, 413, 460, 789, 836, 655, 603, 466, 252, 440, 628, 816, 373, 682, 239, 427, 615, 709, 803, 414, 897, 790, 605, 793, 840, 689, 736, 481, 374, 468, 663, 710, 898, 684, 455, 632, 429, 805, 377, 619, 713, 606, 794, 351, 690, 247, 435, 482, 430, 806, 900, 378, 472, 848, 667, 714, 459, 835, 621, 809, 796, 692, 437, 484, 783, 679, 251, 627, 721, 380, 575, 622, 669, 716, 810, 904, 367, 461, 837, 438, 722, 696, 467, 253, 441, 629, 488, 817, 864, 683, 670, 415, 462, 791, 838, 812, 841, 254, 737, 442, 630, 724, 818, 912, 375, 469, 711, 899, 685, 633, 496, 607, 795, 842, 691, 738, 483, 470, 444, 820, 686, 634, 431, 728, 807, 901, 379, 473, 849, 715, 797, 844, 693, 740, 928, 485, 902, 474, 850, 636, 824, 381, 623, 717, 811, 905, 798, 694, 439, 486, 723, 697, 744, 489, 382, 865, 476, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 446, 929, 822, 916, 730, 903, 475, 851, 637, 825, 872, 500, 799, 846, 695, 742, 930, 487, 745, 638, 732, 826, 920, 383, 477, 853, 719, 907, 932, 504, 880, 699, 746, 491, 867, 478, 961, 854, 828, 815, 909, 857, 753, 727, 915, 962, 701, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 510, 993, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q218_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 30, 513, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 61, 322, 108, 296, 270, 166, 114, 208, 195, 169, 62, 545, 156, 532, 277, 324, 143, 519, 91, 116, 304, 170, 546, 640, 103, 197, 291, 385, 278, 536, 93, 281, 328, 177, 224, 523, 151, 198, 386, 172, 548, 120, 293, 107, 201, 94, 577, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 547, 158, 641, 534, 279, 326, 300, 537, 584, 329, 225, 118, 212, 306, 400, 642, 199, 387, 173, 549, 121, 538, 95, 283, 330, 179, 226, 308, 174, 550, 122, 644, 216, 295, 592, 389, 337, 203, 579, 553, 540, 285, 332, 181, 228, 527, 416, 390, 338, 124, 312, 554, 648, 111, 205, 299, 393, 581, 286, 769, 182, 211, 185, 232, 561, 608, 353, 340, 159, 206, 535, 394, 582, 770, 556, 327, 301, 585, 186, 562, 656, 119, 213, 307, 354, 401, 448, 643, 302, 396, 772, 344, 240, 539, 586, 331, 227, 214, 402, 188, 564, 309, 356, 175, 551, 123, 645, 217, 593, 541, 588, 776, 333, 672, 229, 417, 310, 404, 646, 218, 594, 391, 568, 339, 125, 313, 360, 555, 649, 542, 287, 334, 183, 230, 418, 233, 126, 609, 220, 314, 408, 596, 784, 341, 650, 207, 395, 583, 771, 557, 420, 368, 187, 234, 563, 610, 657, 704, 355, 449, 342, 316, 558, 652, 303, 600, 397, 773, 345, 241, 587, 658, 215, 403, 189, 450, 236, 565, 424, 612, 800, 357, 398, 774, 346, 242, 589, 777, 190, 673, 566, 660, 311, 358, 405, 452, 647, 219, 595, 569, 616, 361, 348, 244, 543, 432, 590, 778, 335, 674, 231, 419, 406, 570, 664, 127, 221, 315, 362, 409, 597, 456, 785, 832, 651, 780, 676, 248, 624, 421, 369, 235, 611, 222, 705, 410, 598, 786, 572, 343, 317, 364, 559, 653, 601, 422, 370, 464, 659, 706, 680, 451, 237, 425, 613, 318, 801, 412, 788, 654, 602, 399, 775, 347, 243, 372, 191, 238, 567, 426, 614, 661, 708, 802, 896, 359, 453, 617, 604, 792, 349, 688, 245, 433, 591, 480, 779, 675, 662, 407, 454, 428, 804, 376, 571, 618, 665, 712, 363, 457, 350, 833, 246, 434, 781, 677, 249, 625, 666, 223, 411, 599, 458, 787, 573, 834, 620, 808, 365, 436, 782, 678, 250, 626, 423, 720, 371, 465, 707, 681, 574, 668, 319, 366, 413, 460, 789, 836, 655, 603, 466, 252, 440, 628, 816, 373, 682, 239, 427, 615, 709, 803, 414, 897, 790, 605, 793, 840, 689, 736, 481, 374, 468, 663, 710, 898, 684, 455, 632, 429, 805, 377, 619, 713, 606, 794, 351, 690, 247, 435, 482, 430, 806, 378, 900, 472, 848, 667, 714, 459, 835, 621, 809, 796, 692, 437, 484, 783, 679, 251, 627, 721, 380, 575, 622, 669, 716, 810, 904, 367, 461, 837, 438, 722, 696, 467, 253, 441, 629, 488, 817, 864, 683, 670, 415, 462, 791, 838, 812, 841, 254, 737, 442, 630, 724, 818, 912, 375, 469, 711, 899, 685, 633, 607, 496, 795, 842, 691, 738, 483, 470, 444, 820, 686, 634, 431, 728, 807, 379, 901, 473, 849, 715, 797, 844, 693, 740, 928, 485, 902, 474, 850, 636, 824, 381, 623, 717, 811, 905, 798, 694, 439, 486, 723, 697, 744, 489, 382, 865, 476, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 446, 929, 822, 916, 730, 903, 475, 851, 637, 825, 872, 500, 799, 846, 695, 742, 930, 487, 745, 638, 732, 826, 920, 383, 477, 853, 719, 907, 932, 504, 880, 699, 746, 491, 867, 478, 961, 854, 828, 815, 909, 857, 753, 727, 915, 701, 962, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 510, 993, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q219_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 30, 513, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 61, 322, 108, 296, 270, 166, 114, 208, 195, 169, 62, 156, 545, 532, 277, 324, 143, 519, 91, 116, 304, 170, 546, 103, 640, 197, 291, 385, 278, 536, 93, 281, 328, 177, 224, 523, 151, 198, 386, 172, 548, 120, 293, 107, 201, 94, 577, 282, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 158, 547, 641, 534, 279, 326, 300, 537, 584, 329, 225, 118, 212, 306, 400, 642, 199, 387, 173, 549, 121, 538, 95, 283, 330, 179, 226, 308, 174, 550, 122, 644, 216, 295, 592, 389, 337, 203, 579, 553, 540, 285, 332, 181, 228, 527, 416, 390, 338, 124, 312, 554, 111, 648, 205, 299, 393, 581, 286, 769, 182, 211, 185, 232, 561, 608, 353, 340, 159, 206, 535, 394, 582, 770, 556, 327, 301, 585, 186, 562, 119, 656, 213, 307, 354, 401, 448, 643, 302, 396, 772, 344, 240, 539, 586, 331, 227, 214, 402, 188, 564, 309, 356, 175, 551, 123, 645, 217, 593, 541, 588, 776, 333, 672, 229, 417, 310, 404, 646, 218, 594, 391, 568, 339, 125, 313, 360, 555, 649, 542, 287, 334, 183, 230, 418, 233, 126, 220, 609, 314, 408, 596, 784, 341, 650, 207, 395, 583, 771, 557, 420, 368, 187, 234, 563, 610, 657, 704, 355, 449, 342, 316, 558, 652, 303, 600, 397, 773, 345, 241, 587, 658, 215, 403, 189, 450, 236, 565, 424, 612, 800, 357, 398, 774, 346, 242, 589, 777, 190, 673, 566, 660, 311, 358, 405, 452, 647, 219, 595, 569, 616, 361, 348, 244, 543, 432, 590, 778, 335, 674, 231, 419, 406, 570, 127, 664, 221, 315, 362, 409, 597, 456, 785, 832, 651, 780, 676, 248, 624, 421, 369, 235, 222, 611, 705, 410, 598, 786, 572, 343, 317, 364, 559, 653, 601, 422, 370, 464, 659, 706, 680, 451, 237, 425, 613, 318, 412, 801, 788, 654, 602, 399, 775, 347, 243, 372, 191, 238, 567, 426, 614, 661, 708, 802, 359, 896, 453, 617, 604, 792, 349, 688, 245, 433, 591, 480, 779, 675, 662, 407, 454, 428, 804, 376, 571, 618, 665, 712, 363, 457, 350, 833, 246, 434, 781, 677, 249, 625, 666, 223, 411, 599, 458, 787, 573, 834, 620, 808, 365, 436, 782, 678, 250, 626, 423, 720, 371, 465, 707, 681, 574, 668, 319, 366, 413, 460, 789, 836, 655, 603, 466, 252, 440, 628, 816, 373, 682, 239, 427, 615, 709, 414, 803, 897, 790, 605, 793, 840, 689, 736, 481, 374, 468, 663, 710, 898, 684, 455, 632, 429, 805, 377, 619, 713, 606, 794, 351, 690, 247, 435, 482, 430, 806, 378, 900, 472, 848, 667, 714, 459, 835, 621, 809, 796, 692, 437, 484, 783, 679, 251, 627, 721, 380, 575, 622, 669, 716, 810, 367, 904, 461, 837, 438, 722, 696, 467, 253, 441, 629, 488, 817, 864, 683, 670, 415, 462, 791, 838, 812, 841, 254, 737, 442, 630, 724, 818, 375, 912, 469, 711, 899, 685, 633, 607, 496, 795, 842, 691, 738, 483, 470, 444, 820, 686, 634, 431, 728, 807, 379, 901, 473, 849, 715, 797, 844, 693, 740, 928, 485, 902, 474, 850, 636, 824, 381, 623, 717, 811, 905, 798, 694, 439, 486, 723, 697, 744, 489, 382, 476, 865, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 741, 446, 929, 822, 916, 730, 903, 475, 851, 637, 825, 872, 500, 799, 846, 695, 742, 930, 487, 745, 638, 732, 826, 383, 920, 477, 853, 719, 907, 932, 504, 880, 699, 746, 491, 478, 867, 961, 854, 828, 815, 909, 857, 753, 727, 915, 701, 962, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 510, 993, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q220_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 129, 22, 25, 72, 130, 37, 26, 38, 132, 80, 67, 41, 28, 15, 42, 136, 512, 69, 257, 49, 96, 23, 70, 258, 44, 73, 50, 144, 131, 260, 27, 74, 52, 39, 133, 81, 29, 76, 264, 160, 134, 82, 56, 43, 137, 30, 513, 97, 84, 272, 138, 514, 71, 259, 45, 51, 98, 145, 192, 46, 140, 516, 88, 261, 75, 146, 53, 100, 288, 262, 520, 77, 265, 161, 54, 148, 135, 83, 57, 104, 31, 78, 266, 162, 58, 152, 528, 85, 273, 320, 139, 515, 268, 164, 112, 99, 193, 86, 274, 60, 47, 141, 517, 89, 147, 194, 168, 544, 101, 289, 276, 142, 518, 90, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 275, 61, 322, 108, 296, 270, 166, 114, 208, 195, 169, 62, 156, 545, 532, 277, 324, 143, 519, 91, 116, 304, 170, 546, 103, 640, 197, 291, 385, 278, 536, 93, 281, 328, 177, 224, 523, 151, 198, 386, 172, 548, 120, 293, 107, 201, 94, 282, 577, 178, 525, 294, 388, 336, 155, 202, 531, 578, 552, 323, 109, 297, 284, 180, 526, 271, 167, 115, 209, 63, 110, 157, 204, 298, 533, 392, 580, 768, 325, 210, 184, 560, 117, 305, 352, 171, 158, 547, 641, 534, 279, 326, 300, 537, 584, 329, 225, 118, 212, 306, 400, 642, 199, 387, 173, 549, 121, 538, 95, 283, 330, 179, 226, 308, 174, 550, 122, 644, 216, 295, 389, 592, 337, 203, 579, 553, 540, 285, 332, 181, 228, 527, 416, 390, 338, 124, 312, 554, 111, 648, 205, 299, 393, 286, 581, 769, 182, 211, 185, 232, 561, 608, 353, 340, 159, 206, 535, 394, 582, 770, 556, 327, 301, 585, 186, 562, 119, 656, 213, 307, 354, 401, 448, 643, 302, 396, 772, 344, 240, 539, 586, 331, 227, 214, 402, 188, 564, 309, 356, 175, 551, 123, 645, 217, 593, 541, 588, 776, 333, 672, 229, 417, 310, 404, 646, 218, 391, 594, 568, 339, 125, 313, 360, 555, 649, 542, 287, 334, 183, 230, 418, 233, 126, 220, 314, 609, 408, 596, 784, 341, 650, 207, 395, 583, 771, 557, 420, 368, 187, 234, 563, 610, 657, 704, 355, 449, 342, 316, 558, 652, 303, 397, 600, 773, 345, 241, 587, 658, 215, 403, 189, 450, 236, 565, 424, 612, 800, 357, 398, 774, 346, 242, 589, 777, 190, 673, 566, 660, 311, 358, 405, 452, 647, 219, 595, 569, 616, 361, 348, 244, 543, 432, 590, 778, 335, 674, 231, 419, 406, 570, 127, 664, 221, 315, 362, 409, 597, 456, 785, 832, 651, 780, 676, 248, 421, 624, 369, 235, 222, 611, 410, 705, 598, 786, 572, 343, 317, 364, 559, 653, 601, 422, 370, 464, 659, 706, 680, 451, 237, 425, 318, 613, 412, 801, 788, 654, 399, 602, 775, 347, 243, 372, 191, 238, 567, 426, 614, 661, 708, 802, 359, 896, 453, 617, 604, 792, 349, 688, 245, 433, 591, 480, 779, 675, 662, 407, 454, 428, 804, 376, 571, 618, 665, 712, 363, 457, 350, 833, 246, 434, 781, 677, 249, 625, 666, 223, 411, 599, 458, 787, 573, 834, 620, 808, 365, 436, 782, 678, 250, 423, 626, 720, 371, 465, 707, 681, 574, 668, 319, 366, 413, 460, 789, 836, 655, 603, 466, 252, 440, 628, 816, 373, 682, 239, 427, 615, 414, 709, 803, 897, 790, 605, 793, 840, 689, 736, 481, 374, 468, 663, 710, 898, 684, 455, 429, 632, 805, 377, 619, 713, 606, 794, 351, 690, 247, 435, 482, 430, 806, 378, 900, 472, 848, 667, 714, 459, 835, 621, 809, 796, 692, 437, 484, 783, 679, 251, 627, 721, 380, 575, 622, 669, 716, 810, 367, 904, 461, 837, 438, 722, 696, 467, 253, 441, 629, 488, 817, 864, 683, 670, 415, 462, 791, 838, 812, 841, 254, 442, 737, 630, 724, 818, 375, 912, 469, 711, 899, 685, 633, 607, 496, 795, 842, 691, 738, 483, 470, 444, 820, 686, 431, 634, 728, 807, 379, 901, 473, 849, 715, 797, 844, 693, 740, 928, 485, 902, 474, 850, 636, 824, 381, 623, 717, 811, 905, 798, 694, 439, 486, 723, 697, 744, 489, 382, 476, 865, 852, 671, 718, 906, 463, 839, 813, 698, 255, 443, 631, 490, 725, 819, 866, 913, 960, 814, 908, 856, 752, 497, 843, 739, 726, 914, 700, 471, 445, 492, 821, 868, 687, 635, 729, 498, 845, 446, 741, 929, 822, 916, 730, 903, 475, 851, 637, 825, 872, 500, 799, 846, 695, 742, 930, 487, 745, 638, 732, 826, 383, 920, 477, 853, 719, 907, 932, 504, 880, 699, 746, 491, 478, 867, 961, 854, 828, 815, 909, 857, 753, 727, 915, 701, 962, 748, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 933, 505, 881, 747, 734, 922, 479, 855, 829, 876, 934, 506, 882, 976, 963, 749, 937, 830, 924, 911, 859, 755, 508, 884, 703, 750, 938, 495, 871, 965, 861, 757, 945, 992, 919, 966, 940, 888, 875, 969, 862, 758, 946, 503, 761, 735, 923, 970, 877, 948, 762, 935, 507, 883, 977, 831, 878, 925, 972, 978, 764, 952, 509, 885, 751, 939, 926, 510, 993, 886, 980, 967, 941, 889, 863, 759, 947, 994, 942, 890, 984, 971, 949, 996, 763, 892, 879, 973, 950, 979, 765, 953, 1000, 927, 974, 766, 954, 511, 887, 981, 1008, 995, 982, 956, 943, 891, 985, 997, 986, 893, 951, 998, 1001, 894, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q221_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 512, 69, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 514, 71, 45, 259, 51, 98, 145, 192, 46, 140, 88, 516, 261, 75, 146, 53, 100, 288, 262, 520, 77, 265, 54, 161, 148, 135, 83, 57, 104, 31, 78, 266, 162, 58, 152, 528, 85, 273, 320, 139, 515, 268, 164, 112, 99, 86, 193, 60, 274, 47, 141, 89, 517, 147, 194, 168, 544, 101, 289, 276, 142, 90, 518, 263, 521, 55, 102, 149, 196, 290, 384, 105, 92, 280, 176, 522, 79, 267, 163, 150, 292, 59, 106, 153, 200, 529, 576, 321, 524, 269, 165, 113, 154, 530, 87, 61, 275, 108, 322, 296, 270, 166, 114, 208, 195, 62, 169, 156, 545, 532, 277, 324, 143, 91, 519, 116, 304, 170, 546, 103, 640, 197, 291, 278, 385, 536, 93, 281, 328, 177, 224, 523, 151, 198, 172, 386, 120, 548, 293, 107, 94, 201, 282, 577, 178, 525, 294, 388, 336, 155, 202, 531, 578, 552, 109, 323, 297, 284, 180, 526, 271, 167, 115, 209, 63, 110, 157, 204, 298, 533, 392, 580, 768, 325, 210, 184, 560, 117, 305, 352, 171, 158, 547, 534, 641, 279, 326, 300, 537, 584, 329, 118, 225, 212, 306, 400, 642, 199, 173, 387, 121, 549, 538, 95, 283, 330, 179, 226, 308, 174, 122, 550, 216, 644, 295, 389, 592, 337, 203, 579, 553, 540, 285, 332, 181, 228, 527, 416, 390, 124, 338, 312, 554, 111, 648, 205, 299, 286, 393, 581, 769, 182, 211, 185, 232, 561, 608, 353, 340, 159, 206, 535, 394, 582, 556, 770, 327, 301, 585, 186, 562, 119, 656, 213, 307, 354, 401, 448, 643, 302, 396, 344, 772, 240, 539, 586, 331, 227, 214, 188, 402, 564, 309, 356, 175, 123, 551, 217, 645, 593, 541, 588, 776, 333, 672, 229, 310, 417, 404, 218, 646, 391, 594, 568, 125, 339, 313, 360, 555, 542, 649, 287, 334, 183, 230, 418, 126, 233, 220, 314, 609, 408, 596, 784, 341, 650, 207, 395, 583, 557, 771, 420, 368, 187, 234, 563, 610, 657, 704, 355, 342, 449, 316, 558, 652, 303, 397, 600, 345, 773, 241, 587, 658, 215, 189, 403, 236, 450, 565, 424, 612, 800, 357, 398, 346, 774, 242, 589, 777, 190, 566, 673, 660, 311, 358, 405, 452, 219, 647, 595, 569, 616, 361, 348, 244, 543, 432, 590, 778, 335, 674, 231, 419, 406, 570, 127, 664, 221, 315, 362, 409, 597, 456, 785, 832, 651, 780, 248, 676, 421, 624, 369, 235, 222, 611, 410, 598, 705, 572, 786, 343, 317, 364, 559, 653, 601, 422, 370, 464, 659, 706, 680, 237, 451, 318, 425, 613, 412, 801, 788, 654, 399, 602, 347, 775, 243, 372, 191, 238, 567, 426, 614, 661, 708, 802, 359, 896, 453, 617, 604, 792, 349, 688, 245, 433, 591, 480, 779, 675, 662, 407, 454, 428, 376, 804, 571, 618, 665, 712, 363, 350, 457, 833, 246, 434, 781, 249, 677, 625, 666, 223, 411, 599, 458, 573, 787, 620, 834, 808, 365, 436, 782, 250, 678, 423, 626, 720, 371, 465, 707, 574, 681, 668, 319, 366, 413, 460, 789, 836, 655, 603, 252, 466, 440, 628, 816, 373, 682, 239, 427, 615, 414, 709, 803, 790, 897, 605, 793, 840, 689, 736, 374, 481, 468, 663, 710, 684, 898, 455, 429, 632, 377, 805, 619, 606, 713, 794, 351, 690, 247, 435, 482, 430, 378, 806, 472, 900, 848, 667, 714, 459, 621, 835, 809, 796, 692, 437, 484, 783, 251, 679, 627, 721, 380, 575, 622, 669, 716, 810, 367, 904, 461, 837, 438, 722, 696, 253, 467, 441, 629, 488, 817, 864, 683, 670, 415, 462, 791, 838, 812, 841, 254, 442, 630, 737, 724, 818, 375, 912, 469, 711, 685, 899, 633, 607, 496, 795, 842, 691, 738, 483, 470, 444, 820, 686, 431, 634, 728, 379, 807, 473, 901, 849, 715, 797, 844, 693, 740, 928, 485, 474, 902, 636, 850, 824, 381, 623, 717, 811, 798, 905, 694, 439, 486, 723, 697, 744, 382, 489, 476, 865, 852, 671, 718, 906, 463, 839, 813, 698, 255, 443, 631, 490, 725, 819, 866, 913, 960, 814, 908, 856, 752, 497, 843, 739, 726, 700, 914, 471, 445, 492, 821, 868, 687, 635, 729, 498, 845, 446, 741, 822, 929, 916, 730, 475, 903, 637, 851, 825, 872, 500, 799, 846, 695, 742, 930, 487, 638, 745, 732, 826, 383, 920, 477, 853, 719, 907, 504, 932, 880, 699, 746, 491, 478, 867, 854, 961, 828, 815, 909, 857, 753, 727, 701, 915, 748, 962, 936, 493, 869, 910, 858, 754, 499, 702, 447, 494, 823, 870, 917, 964, 731, 873, 860, 756, 944, 501, 847, 743, 931, 918, 639, 733, 827, 874, 921, 968, 502, 760, 505, 933, 881, 747, 734, 922, 479, 855, 829, 876, 506, 934, 882, 976, 749, 963, 830, 937, 924, 911, 859, 755, 508, 884, 703, 750, 938, 495, 871, 965, 861, 757, 945, 992, 919, 966, 940, 888, 875, 862, 969, 758, 946, 503, 761, 735, 923, 970, 877, 948, 762, 507, 935, 883, 977, 831, 878, 925, 972, 764, 978, 952, 509, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 954, 511, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q222_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 514, 45, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 320, 139, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 530, 61, 275, 108, 322, 296, 270, 166, 114, 208, 195, 62, 169, 156, 545, 532, 277, 324, 143, 91, 519, 116, 304, 170, 103, 546, 197, 640, 291, 278, 385, 93, 536, 281, 328, 177, 224, 523, 151, 198, 172, 386, 120, 548, 293, 107, 94, 201, 282, 577, 178, 525, 294, 388, 336, 155, 202, 531, 578, 109, 323, 552, 297, 284, 180, 526, 271, 167, 115, 209, 63, 110, 157, 204, 298, 533, 392, 580, 325, 768, 210, 184, 117, 560, 305, 352, 171, 158, 547, 534, 641, 279, 326, 300, 537, 584, 329, 118, 225, 212, 306, 400, 199, 642, 173, 387, 121, 549, 95, 538, 283, 330, 179, 226, 308, 174, 122, 550, 216, 644, 295, 389, 592, 337, 203, 579, 553, 540, 285, 332, 181, 228, 527, 416, 390, 124, 338, 312, 111, 554, 205, 648, 299, 286, 393, 581, 182, 769, 211, 185, 232, 561, 608, 353, 340, 159, 206, 535, 394, 582, 327, 556, 770, 301, 585, 186, 119, 562, 213, 656, 307, 354, 401, 448, 643, 302, 396, 344, 772, 240, 539, 586, 331, 227, 214, 188, 402, 564, 309, 356, 175, 123, 551, 217, 645, 593, 541, 588, 333, 776, 229, 672, 310, 417, 404, 218, 646, 391, 594, 125, 339, 568, 313, 360, 555, 542, 649, 287, 334, 183, 230, 418, 126, 233, 220, 314, 609, 408, 596, 341, 784, 207, 650, 395, 583, 557, 771, 420, 368, 187, 234, 563, 610, 657, 704, 355, 342, 449, 316, 558, 652, 303, 397, 600, 345, 773, 241, 587, 215, 658, 189, 403, 236, 450, 565, 424, 612, 357, 800, 398, 346, 774, 242, 589, 190, 777, 566, 673, 660, 311, 358, 405, 452, 219, 647, 595, 569, 616, 361, 348, 244, 543, 432, 590, 335, 778, 231, 674, 419, 406, 127, 570, 221, 664, 315, 362, 409, 597, 456, 785, 832, 651, 780, 248, 676, 421, 624, 369, 235, 222, 611, 410, 598, 705, 343, 572, 786, 317, 364, 559, 653, 601, 422, 370, 464, 659, 706, 237, 451, 680, 318, 425, 613, 412, 801, 788, 654, 399, 602, 347, 775, 243, 372, 191, 238, 567, 426, 614, 661, 708, 359, 802, 453, 896, 617, 604, 349, 792, 245, 688, 433, 591, 480, 779, 675, 662, 407, 454, 428, 376, 804, 571, 618, 665, 712, 363, 350, 457, 246, 833, 434, 781, 249, 677, 625, 223, 666, 411, 599, 458, 573, 787, 620, 834, 365, 808, 436, 782, 250, 678, 423, 626, 720, 371, 465, 707, 574, 681, 668, 319, 366, 413, 460, 789, 836, 655, 603, 252, 466, 440, 628, 373, 816, 239, 682, 427, 615, 414, 709, 803, 790, 897, 605, 793, 840, 689, 736, 374, 481, 468, 663, 710, 455, 684, 898, 429, 632, 377, 805, 619, 606, 713, 351, 794, 247, 690, 435, 482, 430, 378, 806, 472, 900, 848, 667, 714, 459, 621, 835, 809, 796, 692, 437, 484, 783, 251, 679, 627, 721, 380, 575, 622, 669, 716, 367, 810, 461, 904, 837, 438, 722, 253, 467, 696, 441, 629, 488, 817, 864, 683, 670, 415, 462, 791, 838, 812, 254, 841, 442, 630, 737, 724, 375, 818, 469, 912, 711, 685, 899, 633, 607, 496, 795, 842, 691, 738, 483, 470, 444, 820, 686, 431, 634, 728, 379, 807, 473, 901, 849, 715, 797, 844, 693, 740, 485, 928, 474, 902, 636, 850, 381, 824, 623, 717, 811, 798, 905, 694, 439, 486, 723, 697, 744, 382, 489, 476, 865, 852, 671, 718, 463, 906, 839, 813, 255, 698, 443, 631, 490, 725, 819, 866, 913, 960, 814, 908, 856, 752, 497, 843, 739, 726, 471, 700, 914, 445, 492, 821, 868, 687, 635, 729, 498, 845, 446, 741, 822, 929, 916, 730, 475, 903, 637, 851, 825, 872, 500, 799, 846, 695, 742, 487, 930, 638, 745, 732, 383, 826, 477, 920, 853, 719, 907, 504, 932, 880, 699, 746, 491, 478, 867, 854, 961, 828, 815, 909, 857, 753, 727, 701, 915, 748, 962, 493, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 884, 703, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 978, 509, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q223_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 514, 45, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 320, 139, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 530, 61, 275, 108, 322, 296, 270, 166, 114, 208, 195, 62, 169, 156, 545, 532, 277, 324, 143, 91, 519, 116, 304, 170, 103, 546, 197, 291, 640, 278, 385, 93, 536, 281, 328, 177, 224, 523, 151, 198, 172, 386, 120, 548, 293, 107, 94, 201, 282, 577, 178, 525, 294, 388, 336, 155, 202, 531, 578, 109, 323, 552, 297, 284, 180, 526, 271, 167, 115, 209, 63, 110, 157, 204, 298, 533, 392, 580, 325, 768, 210, 184, 117, 560, 305, 352, 171, 158, 547, 534, 641, 279, 326, 300, 537, 584, 329, 118, 225, 212, 306, 400, 199, 642, 173, 387, 121, 549, 95, 538, 283, 330, 179, 226, 308, 174, 122, 550, 216, 295, 644, 389, 592, 337, 203, 579, 553, 540, 285, 332, 181, 228, 527, 416, 390, 124, 338, 312, 111, 554, 205, 299, 648, 286, 393, 581, 182, 769, 211, 185, 232, 561, 608, 353, 340, 159, 206, 535, 394, 582, 327, 556, 770, 301, 585, 186, 119, 562, 213, 307, 656, 354, 401, 448, 643, 302, 396, 344, 772, 240, 539, 586, 331, 227, 214, 188, 402, 564, 309, 356, 175, 123, 551, 217, 645, 593, 541, 588, 333, 776, 229, 672, 310, 417, 404, 218, 646, 391, 594, 125, 339, 568, 313, 360, 555, 542, 649, 287, 334, 183, 230, 418, 126, 233, 220, 314, 609, 408, 596, 341, 784, 207, 650, 395, 583, 557, 771, 420, 368, 187, 234, 563, 610, 657, 355, 704, 342, 449, 316, 558, 303, 652, 397, 600, 345, 773, 241, 587, 215, 658, 189, 403, 236, 450, 565, 424, 612, 357, 800, 398, 346, 774, 242, 589, 190, 777, 566, 673, 311, 660, 358, 405, 452, 219, 647, 595, 569, 616, 361, 348, 244, 543, 432, 590, 335, 778, 231, 674, 419, 406, 127, 570, 221, 315, 664, 362, 409, 597, 456, 785, 832, 651, 780, 248, 676, 421, 624, 369, 235, 222, 611, 410, 598, 705, 343, 572, 786, 317, 364, 559, 653, 601, 422, 370, 464, 659, 706, 237, 451, 680, 318, 425, 613, 412, 801, 788, 654, 399, 602, 347, 775, 243, 372, 191, 238, 567, 426, 614, 661, 359, 708, 802, 453, 896, 617, 604, 349, 792, 245, 688, 433, 591, 480, 779, 675, 662, 407, 454, 428, 376, 804, 571, 618, 665, 363, 712, 350, 457, 246, 833, 434, 781, 249, 677, 625, 223, 666, 411, 599, 458, 573, 787, 620, 834, 365, 808, 436, 782, 250, 678, 423, 626, 371, 720, 465, 707, 574, 681, 319, 668, 366, 413, 460, 789, 836, 655, 603, 252, 466, 440, 628, 373, 816, 239, 682, 427, 615, 414, 709, 803, 790, 897, 605, 793, 840, 689, 736, 374, 481, 468, 663, 710, 455, 684, 898, 429, 632, 377, 805, 619, 606, 713, 351, 794, 247, 690, 435, 482, 430, 378, 806, 472, 900, 848, 667, 714, 459, 621, 835, 809, 796, 692, 437, 484, 783, 251, 679, 627, 721, 380, 575, 622, 669, 367, 716, 810, 461, 904, 837, 438, 722, 253, 467, 696, 441, 629, 488, 817, 864, 683, 670, 415, 462, 791, 838, 812, 254, 841, 442, 630, 737, 375, 724, 818, 469, 912, 711, 685, 899, 633, 607, 496, 795, 842, 691, 738, 483, 470, 444, 820, 686, 431, 634, 379, 728, 807, 473, 901, 849, 715, 797, 844, 693, 740, 485, 928, 474, 902, 636, 850, 381, 824, 623, 717, 811, 798, 905, 694, 439, 486, 723, 697, 744, 382, 489, 476, 865, 852, 671, 718, 463, 906, 839, 813, 255, 698, 443, 631, 490, 725, 819, 866, 913, 960, 814, 908, 856, 752, 497, 843, 739, 726, 471, 700, 914, 445, 492, 821, 868, 687, 635, 729, 498, 845, 446, 741, 822, 929, 916, 730, 475, 903, 637, 851, 825, 872, 500, 799, 846, 695, 742, 487, 930, 638, 745, 383, 732, 826, 477, 920, 853, 719, 907, 504, 932, 880, 699, 746, 491, 478, 867, 854, 961, 828, 815, 909, 857, 753, 727, 701, 915, 748, 962, 493, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 884, 703, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 978, 509, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q224_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 320, 139, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 61, 530, 275, 108, 322, 296, 270, 166, 114, 208, 195, 62, 169, 156, 545, 532, 277, 324, 143, 91, 519, 116, 304, 170, 103, 546, 197, 291, 640, 278, 385, 93, 536, 281, 328, 177, 224, 523, 151, 198, 172, 386, 120, 548, 293, 107, 94, 201, 282, 577, 178, 525, 294, 388, 336, 155, 202, 531, 109, 578, 323, 552, 297, 284, 180, 526, 271, 167, 115, 209, 63, 110, 157, 204, 298, 533, 392, 580, 325, 768, 210, 184, 117, 560, 305, 352, 171, 158, 547, 534, 641, 279, 326, 300, 537, 584, 329, 118, 225, 212, 306, 400, 199, 173, 642, 387, 121, 549, 95, 538, 283, 330, 179, 226, 308, 174, 122, 550, 216, 295, 644, 389, 592, 337, 203, 579, 553, 540, 285, 332, 181, 228, 527, 416, 390, 124, 338, 312, 111, 554, 205, 299, 648, 286, 393, 581, 182, 769, 211, 185, 232, 561, 608, 353, 340, 159, 206, 535, 394, 582, 327, 556, 301, 770, 585, 186, 119, 562, 213, 307, 656, 354, 401, 448, 643, 302, 396, 344, 772, 240, 539, 586, 331, 227, 214, 188, 402, 564, 309, 356, 175, 123, 551, 217, 645, 593, 541, 588, 333, 776, 229, 672, 310, 417, 404, 218, 646, 391, 125, 594, 339, 568, 313, 360, 555, 542, 649, 287, 334, 183, 230, 418, 126, 233, 220, 314, 609, 408, 596, 341, 784, 207, 650, 395, 583, 557, 771, 420, 368, 187, 234, 563, 610, 657, 355, 704, 342, 449, 316, 558, 303, 652, 397, 600, 345, 773, 241, 587, 215, 189, 658, 403, 236, 450, 565, 424, 612, 357, 800, 398, 346, 774, 242, 589, 190, 777, 566, 673, 311, 660, 358, 405, 452, 219, 647, 595, 569, 616, 361, 348, 244, 543, 432, 590, 335, 778, 231, 674, 419, 406, 127, 570, 221, 315, 664, 362, 409, 597, 456, 785, 832, 651, 780, 248, 676, 421, 624, 369, 235, 222, 611, 410, 598, 705, 343, 572, 317, 786, 364, 559, 653, 601, 422, 370, 464, 659, 237, 706, 451, 680, 318, 425, 613, 412, 801, 788, 654, 399, 602, 347, 775, 243, 372, 191, 238, 567, 426, 614, 661, 359, 708, 802, 453, 896, 617, 604, 349, 792, 245, 688, 433, 591, 480, 779, 675, 662, 407, 454, 428, 376, 804, 571, 618, 665, 363, 712, 350, 457, 246, 833, 434, 781, 249, 677, 625, 223, 666, 411, 599, 458, 573, 787, 620, 365, 834, 808, 436, 782, 250, 678, 423, 626, 371, 720, 465, 707, 574, 681, 319, 668, 366, 413, 460, 789, 836, 655, 603, 252, 466, 440, 628, 373, 816, 239, 682, 427, 615, 414, 709, 803, 790, 897, 605, 793, 840, 689, 736, 374, 481, 468, 663, 710, 455, 684, 429, 898, 632, 377, 805, 619, 606, 713, 351, 794, 247, 690, 435, 482, 430, 378, 806, 472, 900, 848, 667, 714, 459, 621, 835, 809, 796, 692, 437, 484, 783, 251, 679, 627, 721, 380, 575, 622, 669, 367, 716, 810, 461, 904, 837, 438, 253, 722, 467, 696, 441, 629, 488, 817, 864, 683, 670, 415, 462, 791, 838, 812, 254, 841, 442, 630, 737, 375, 724, 818, 469, 912, 711, 685, 899, 633, 607, 496, 795, 842, 691, 738, 483, 470, 444, 820, 686, 431, 634, 379, 728, 807, 473, 901, 849, 715, 797, 844, 693, 740, 485, 928, 474, 902, 636, 381, 850, 824, 623, 717, 811, 798, 905, 694, 439, 486, 723, 697, 744, 382, 489, 476, 865, 852, 671, 718, 463, 906, 839, 813, 255, 698, 443, 631, 490, 725, 819, 866, 913, 960, 814, 908, 856, 752, 497, 843, 739, 726, 471, 700, 445, 914, 492, 821, 868, 687, 635, 729, 498, 845, 446, 741, 822, 929, 916, 730, 475, 903, 637, 851, 825, 872, 500, 799, 846, 695, 742, 487, 930, 638, 745, 383, 732, 826, 477, 920, 853, 719, 907, 504, 932, 880, 699, 746, 491, 478, 867, 854, 961, 828, 815, 909, 857, 753, 727, 701, 915, 748, 493, 962, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 884, 703, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q225_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 61, 530, 275, 108, 322, 296, 270, 166, 114, 208, 195, 62, 169, 156, 545, 532, 277, 143, 324, 91, 519, 116, 304, 170, 103, 546, 197, 291, 278, 640, 385, 93, 536, 281, 328, 177, 224, 523, 151, 198, 172, 386, 120, 548, 293, 107, 94, 201, 282, 577, 178, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 352, 158, 547, 534, 279, 641, 326, 300, 537, 584, 329, 118, 225, 212, 306, 400, 199, 173, 642, 387, 121, 549, 95, 538, 283, 330, 179, 226, 308, 174, 122, 550, 216, 295, 644, 389, 592, 337, 203, 579, 553, 540, 285, 332, 181, 228, 527, 416, 390, 124, 338, 312, 111, 554, 205, 299, 286, 648, 393, 581, 182, 769, 211, 185, 232, 561, 608, 353, 159, 340, 206, 535, 394, 582, 327, 556, 301, 770, 585, 186, 119, 562, 213, 307, 656, 354, 401, 448, 643, 302, 396, 344, 772, 240, 539, 586, 331, 227, 214, 188, 402, 564, 309, 175, 356, 123, 551, 217, 645, 593, 541, 588, 333, 776, 229, 310, 672, 417, 404, 218, 646, 391, 125, 594, 339, 568, 313, 360, 555, 542, 287, 649, 334, 183, 230, 418, 126, 233, 220, 314, 609, 408, 596, 341, 207, 784, 650, 395, 583, 557, 771, 420, 187, 368, 234, 563, 610, 657, 355, 342, 704, 449, 316, 558, 303, 652, 397, 600, 345, 773, 241, 587, 215, 189, 658, 403, 236, 450, 565, 424, 612, 357, 800, 398, 346, 774, 242, 589, 190, 777, 566, 311, 673, 660, 358, 405, 452, 219, 647, 595, 569, 616, 361, 348, 244, 543, 432, 590, 335, 778, 231, 674, 419, 406, 127, 570, 221, 315, 664, 362, 409, 597, 456, 785, 651, 832, 780, 248, 676, 421, 624, 369, 235, 222, 611, 410, 598, 343, 705, 572, 317, 786, 364, 559, 653, 601, 422, 370, 464, 659, 237, 706, 451, 318, 680, 425, 613, 412, 801, 788, 654, 399, 602, 347, 775, 243, 191, 372, 238, 567, 426, 614, 661, 359, 708, 802, 453, 896, 617, 604, 349, 792, 245, 688, 433, 591, 480, 779, 675, 662, 407, 454, 428, 376, 804, 571, 618, 665, 363, 350, 712, 457, 246, 833, 434, 781, 249, 677, 625, 223, 666, 411, 599, 458, 573, 787, 620, 365, 834, 808, 436, 782, 250, 678, 423, 626, 371, 720, 465, 707, 574, 319, 681, 668, 366, 413, 460, 789, 655, 836, 603, 252, 466, 440, 628, 373, 239, 816, 682, 427, 615, 414, 709, 803, 790, 897, 605, 793, 840, 689, 374, 736, 481, 468, 663, 710, 455, 684, 429, 898, 632, 377, 805, 619, 606, 351, 713, 794, 247, 690, 435, 482, 430, 378, 806, 472, 900, 667, 848, 714, 459, 621, 835, 809, 796, 692, 437, 484, 783, 251, 679, 627, 721, 380, 575, 622, 669, 367, 716, 810, 461, 904, 837, 438, 253, 722, 467, 696, 441, 629, 488, 817, 683, 864, 670, 415, 462, 791, 838, 812, 254, 841, 442, 630, 375, 737, 724, 818, 469, 912, 711, 685, 899, 633, 607, 496, 795, 842, 691, 738, 483, 470, 444, 820, 686, 431, 634, 379, 728, 807, 473, 901, 849, 715, 797, 844, 693, 740, 485, 928, 474, 902, 636, 381, 850, 824, 623, 717, 811, 798, 905, 694, 439, 486, 723, 697, 382, 744, 489, 476, 865, 671, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 845, 446, 741, 822, 929, 916, 730, 475, 903, 637, 851, 825, 872, 500, 799, 846, 695, 742, 487, 930, 638, 383, 745, 732, 826, 477, 920, 853, 719, 907, 504, 932, 699, 880, 746, 491, 478, 867, 854, 961, 828, 815, 909, 857, 753, 727, 701, 915, 748, 493, 962, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q226_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 61, 530, 275, 108, 322, 296, 270, 166, 114, 208, 195, 62, 169, 156, 545, 532, 277, 143, 324, 91, 519, 116, 304, 170, 103, 546, 197, 291, 278, 640, 385, 93, 536, 281, 328, 177, 224, 523, 151, 198, 172, 386, 120, 548, 293, 107, 94, 201, 282, 577, 178, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 352, 158, 547, 534, 279, 641, 326, 300, 537, 584, 329, 118, 225, 212, 306, 400, 199, 173, 642, 387, 121, 549, 95, 538, 283, 330, 179, 226, 308, 174, 122, 550, 295, 216, 644, 389, 592, 337, 203, 579, 553, 540, 285, 332, 181, 228, 527, 416, 390, 124, 338, 312, 111, 554, 205, 299, 286, 648, 393, 581, 182, 769, 211, 185, 232, 561, 608, 353, 159, 340, 206, 535, 394, 582, 327, 556, 301, 770, 585, 186, 119, 562, 213, 307, 656, 354, 401, 448, 643, 302, 396, 344, 772, 240, 539, 586, 331, 227, 214, 188, 402, 564, 309, 175, 356, 123, 551, 217, 645, 593, 541, 588, 333, 229, 776, 310, 672, 417, 404, 218, 646, 391, 125, 594, 339, 568, 313, 360, 555, 542, 287, 649, 334, 183, 230, 418, 126, 233, 220, 314, 609, 408, 596, 341, 207, 784, 650, 395, 583, 557, 771, 420, 187, 368, 234, 563, 610, 657, 355, 342, 704, 449, 316, 558, 303, 652, 397, 600, 345, 773, 241, 587, 215, 189, 658, 403, 236, 450, 565, 424, 612, 357, 800, 398, 346, 774, 242, 589, 190, 777, 566, 311, 673, 660, 358, 405, 452, 219, 647, 595, 569, 616, 361, 348, 244, 543, 590, 432, 335, 231, 778, 674, 419, 406, 127, 570, 221, 315, 664, 362, 409, 597, 456, 785, 651, 832, 780, 248, 676, 421, 624, 369, 235, 222, 611, 410, 598, 343, 705, 572, 317, 786, 364, 559, 653, 601, 422, 370, 464, 659, 237, 706, 451, 318, 680, 425, 613, 412, 801, 788, 654, 399, 602, 347, 775, 243, 191, 372, 238, 567, 426, 614, 661, 359, 708, 802, 453, 896, 617, 604, 349, 245, 792, 688, 591, 433, 480, 779, 675, 662, 407, 454, 428, 376, 804, 571, 618, 665, 363, 350, 712, 457, 246, 833, 434, 781, 249, 677, 625, 223, 666, 411, 599, 458, 573, 787, 620, 365, 834, 808, 436, 782, 250, 678, 423, 626, 371, 720, 465, 707, 574, 319, 681, 668, 366, 413, 460, 789, 655, 836, 603, 252, 466, 440, 628, 373, 239, 816, 682, 427, 615, 414, 709, 803, 790, 897, 605, 793, 840, 689, 374, 736, 481, 468, 663, 710, 455, 684, 429, 898, 632, 377, 805, 619, 606, 351, 713, 247, 794, 690, 435, 482, 430, 378, 806, 472, 900, 667, 848, 714, 459, 621, 835, 809, 796, 692, 437, 484, 783, 251, 679, 627, 721, 380, 575, 622, 669, 367, 716, 810, 461, 904, 837, 438, 253, 722, 467, 696, 441, 629, 488, 817, 683, 864, 670, 415, 462, 791, 838, 812, 254, 841, 442, 630, 375, 737, 724, 818, 469, 912, 711, 685, 899, 633, 607, 496, 795, 842, 691, 738, 483, 470, 444, 820, 686, 431, 634, 379, 807, 728, 473, 901, 849, 715, 797, 844, 693, 740, 485, 928, 474, 902, 636, 381, 850, 824, 623, 717, 811, 798, 905, 694, 439, 486, 723, 697, 382, 744, 489, 476, 865, 671, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 845, 446, 741, 822, 929, 916, 730, 475, 903, 637, 851, 825, 872, 500, 799, 846, 695, 742, 487, 930, 638, 383, 745, 732, 826, 477, 920, 853, 719, 907, 504, 932, 699, 880, 746, 491, 478, 867, 854, 961, 828, 815, 909, 857, 753, 727, 701, 915, 748, 493, 962, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q227_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 193, 60, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 61, 530, 275, 108, 322, 296, 270, 166, 114, 208, 195, 62, 169, 156, 545, 532, 277, 143, 324, 91, 519, 116, 304, 170, 103, 197, 546, 291, 278, 640, 385, 93, 536, 281, 177, 328, 224, 523, 151, 198, 172, 386, 120, 548, 293, 107, 94, 201, 282, 577, 178, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 352, 158, 547, 534, 279, 641, 326, 300, 537, 584, 329, 118, 225, 212, 306, 400, 199, 173, 642, 387, 121, 549, 95, 538, 283, 179, 330, 226, 308, 174, 122, 550, 295, 216, 644, 389, 592, 337, 203, 579, 553, 540, 285, 181, 332, 228, 527, 416, 390, 124, 338, 312, 111, 205, 554, 299, 286, 648, 393, 581, 182, 769, 211, 185, 232, 561, 608, 353, 159, 340, 206, 535, 394, 582, 327, 556, 301, 770, 585, 186, 119, 213, 562, 307, 354, 656, 401, 448, 643, 302, 396, 344, 772, 240, 539, 586, 331, 227, 214, 188, 402, 564, 309, 175, 356, 123, 551, 217, 645, 593, 541, 588, 333, 229, 776, 310, 672, 417, 404, 218, 646, 391, 125, 594, 339, 568, 313, 360, 555, 542, 287, 649, 183, 334, 230, 418, 126, 233, 220, 314, 609, 408, 596, 341, 207, 784, 650, 395, 583, 557, 771, 420, 187, 368, 234, 563, 610, 355, 657, 342, 704, 449, 316, 558, 303, 652, 397, 600, 345, 773, 241, 587, 215, 189, 658, 403, 236, 565, 450, 424, 612, 357, 800, 398, 346, 774, 242, 589, 190, 777, 566, 311, 673, 358, 660, 405, 452, 219, 647, 595, 569, 616, 361, 348, 244, 543, 590, 432, 335, 231, 778, 674, 419, 406, 127, 221, 570, 315, 362, 664, 409, 597, 456, 785, 651, 832, 780, 248, 676, 421, 624, 369, 235, 222, 611, 410, 598, 343, 705, 572, 317, 786, 364, 559, 653, 601, 422, 370, 464, 659, 237, 706, 451, 318, 680, 425, 613, 412, 801, 788, 654, 399, 602, 347, 775, 243, 191, 372, 238, 567, 426, 614, 359, 661, 708, 453, 802, 896, 617, 604, 349, 245, 792, 688, 591, 433, 480, 779, 675, 662, 407, 454, 428, 376, 804, 571, 618, 363, 665, 350, 712, 457, 246, 833, 434, 781, 249, 677, 625, 223, 666, 411, 599, 573, 458, 787, 620, 365, 834, 808, 436, 782, 250, 678, 423, 626, 371, 720, 465, 707, 574, 319, 681, 366, 668, 413, 460, 789, 655, 836, 603, 252, 466, 440, 628, 373, 239, 816, 682, 427, 615, 414, 709, 803, 790, 897, 605, 793, 689, 840, 374, 736, 481, 468, 663, 710, 455, 684, 429, 898, 632, 377, 805, 619, 606, 351, 713, 247, 794, 690, 435, 482, 430, 378, 806, 472, 900, 667, 848, 714, 459, 621, 835, 809, 796, 692, 437, 484, 783, 251, 679, 627, 721, 380, 575, 622, 367, 669, 716, 461, 810, 904, 837, 438, 253, 722, 467, 696, 441, 629, 488, 817, 683, 864, 670, 415, 462, 791, 838, 812, 254, 841, 442, 630, 375, 737, 724, 469, 818, 912, 711, 685, 899, 633, 607, 496, 795, 691, 842, 738, 483, 470, 444, 820, 686, 431, 634, 379, 807, 728, 473, 901, 849, 715, 797, 693, 844, 740, 485, 928, 474, 902, 636, 381, 850, 824, 623, 717, 811, 798, 905, 694, 439, 486, 723, 697, 382, 744, 489, 476, 865, 671, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 845, 446, 741, 822, 929, 916, 730, 475, 903, 637, 851, 825, 872, 500, 799, 695, 846, 742, 487, 930, 638, 383, 745, 732, 477, 826, 920, 853, 719, 907, 504, 932, 699, 880, 746, 491, 478, 867, 854, 961, 828, 815, 909, 857, 753, 727, 701, 915, 748, 493, 962, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 963, 830, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q228_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 60, 193, 274, 47, 141, 89, 517, 147, 194, 168, 101, 544, 289, 276, 142, 90, 518, 263, 521, 55, 102, 149, 196, 290, 384, 105, 92, 280, 176, 79, 522, 267, 163, 150, 292, 59, 106, 153, 200, 529, 576, 321, 524, 269, 165, 113, 154, 87, 61, 530, 275, 108, 322, 296, 270, 166, 114, 208, 62, 195, 169, 156, 545, 532, 277, 143, 324, 91, 519, 116, 304, 170, 103, 197, 546, 291, 278, 640, 385, 93, 536, 281, 177, 328, 224, 523, 151, 198, 172, 120, 386, 548, 293, 107, 94, 201, 282, 178, 577, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 352, 158, 547, 534, 279, 641, 326, 300, 537, 584, 329, 118, 225, 212, 306, 400, 199, 173, 642, 121, 387, 549, 95, 538, 283, 179, 330, 226, 308, 174, 122, 550, 295, 216, 644, 389, 592, 337, 203, 579, 553, 540, 285, 181, 332, 228, 527, 416, 124, 390, 338, 312, 111, 205, 554, 299, 286, 648, 393, 182, 581, 769, 211, 185, 232, 561, 608, 353, 159, 340, 206, 535, 394, 582, 327, 556, 301, 770, 186, 585, 119, 213, 562, 307, 354, 656, 401, 448, 643, 302, 396, 344, 240, 772, 539, 586, 331, 227, 214, 188, 402, 564, 309, 175, 356, 123, 551, 217, 645, 593, 541, 588, 333, 229, 776, 310, 672, 417, 404, 218, 646, 125, 391, 594, 339, 568, 313, 360, 555, 542, 287, 649, 183, 334, 230, 418, 126, 233, 220, 314, 609, 408, 596, 341, 207, 784, 650, 395, 583, 557, 771, 420, 187, 368, 234, 563, 610, 355, 657, 342, 704, 316, 449, 558, 303, 652, 397, 600, 345, 241, 773, 587, 215, 189, 658, 403, 236, 565, 450, 424, 612, 357, 800, 398, 346, 242, 774, 190, 589, 777, 566, 311, 673, 358, 660, 405, 452, 219, 647, 595, 569, 616, 361, 348, 244, 543, 590, 432, 335, 231, 778, 674, 419, 406, 127, 221, 570, 315, 362, 664, 409, 597, 456, 785, 651, 832, 248, 780, 676, 421, 624, 369, 235, 222, 611, 410, 598, 343, 572, 705, 317, 786, 364, 559, 653, 601, 422, 370, 464, 659, 237, 706, 318, 451, 680, 425, 613, 412, 801, 788, 654, 399, 602, 347, 243, 775, 191, 372, 238, 567, 426, 614, 359, 661, 708, 453, 802, 896, 617, 604, 349, 245, 792, 688, 591, 433, 480, 779, 675, 662, 407, 454, 428, 376, 804, 571, 618, 363, 665, 350, 712, 457, 246, 434, 833, 249, 781, 677, 625, 223, 666, 411, 599, 573, 458, 787, 620, 365, 834, 808, 436, 250, 782, 678, 423, 626, 371, 720, 465, 574, 707, 319, 681, 366, 668, 413, 460, 789, 655, 836, 603, 252, 466, 440, 628, 373, 239, 816, 682, 427, 615, 414, 709, 803, 790, 897, 605, 793, 689, 840, 374, 736, 481, 468, 663, 710, 455, 684, 429, 632, 898, 377, 805, 619, 606, 351, 713, 247, 794, 690, 435, 482, 430, 378, 806, 472, 900, 667, 848, 714, 459, 621, 835, 809, 796, 692, 437, 484, 251, 783, 679, 627, 721, 380, 575, 622, 367, 669, 716, 461, 810, 904, 438, 837, 253, 722, 467, 696, 441, 629, 488, 817, 683, 864, 670, 415, 462, 791, 838, 812, 254, 442, 841, 630, 375, 737, 724, 469, 818, 912, 711, 685, 633, 899, 607, 496, 795, 691, 842, 738, 483, 470, 444, 820, 686, 431, 634, 379, 807, 728, 473, 901, 849, 715, 797, 693, 844, 740, 485, 928, 474, 636, 902, 381, 850, 824, 623, 717, 811, 798, 905, 694, 439, 486, 723, 697, 382, 744, 489, 476, 865, 671, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 446, 845, 741, 822, 929, 916, 730, 475, 637, 903, 851, 825, 872, 500, 799, 695, 846, 742, 487, 930, 638, 383, 745, 732, 477, 826, 920, 853, 719, 907, 504, 932, 699, 880, 746, 491, 478, 867, 854, 828, 961, 815, 909, 857, 753, 727, 701, 915, 748, 493, 962, 936, 869, 910, 858, 754, 499, 702, 447, 494, 823, 870, 917, 964, 731, 873, 860, 756, 501, 944, 847, 743, 931, 918, 639, 733, 827, 874, 921, 968, 502, 760, 505, 933, 881, 747, 734, 479, 922, 855, 829, 876, 506, 934, 882, 976, 749, 830, 963, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q229_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 60, 193, 274, 47, 141, 89, 517, 147, 194, 168, 101, 544, 289, 276, 142, 90, 518, 263, 521, 55, 102, 149, 196, 290, 384, 105, 92, 280, 79, 176, 522, 267, 163, 150, 292, 59, 106, 153, 200, 529, 576, 321, 524, 269, 165, 113, 154, 87, 61, 530, 275, 108, 322, 296, 270, 166, 114, 208, 62, 195, 169, 156, 545, 532, 277, 143, 324, 91, 519, 116, 304, 170, 103, 197, 546, 291, 278, 640, 385, 93, 536, 281, 177, 328, 224, 523, 151, 198, 172, 120, 386, 548, 293, 107, 94, 201, 282, 178, 577, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 158, 352, 547, 534, 279, 641, 326, 300, 537, 584, 329, 118, 225, 212, 306, 400, 199, 173, 121, 642, 387, 549, 95, 538, 283, 179, 330, 226, 308, 174, 122, 550, 295, 216, 644, 389, 592, 337, 203, 579, 553, 540, 285, 181, 332, 228, 527, 416, 124, 390, 338, 312, 111, 205, 554, 299, 286, 648, 393, 182, 581, 769, 211, 185, 232, 561, 608, 159, 353, 340, 206, 535, 394, 582, 327, 556, 301, 770, 186, 585, 119, 213, 562, 307, 354, 656, 401, 448, 643, 302, 396, 344, 240, 772, 539, 586, 331, 227, 214, 188, 402, 564, 309, 175, 356, 123, 551, 217, 645, 593, 541, 588, 333, 229, 776, 310, 672, 417, 404, 218, 125, 646, 391, 594, 339, 568, 313, 360, 555, 542, 287, 649, 183, 334, 230, 418, 126, 233, 220, 314, 609, 408, 596, 341, 207, 784, 650, 395, 583, 557, 771, 420, 187, 368, 234, 563, 610, 355, 657, 342, 316, 704, 449, 558, 303, 652, 397, 600, 345, 241, 773, 587, 215, 189, 658, 403, 236, 565, 450, 424, 612, 357, 800, 398, 346, 242, 774, 190, 589, 777, 566, 311, 673, 358, 660, 405, 452, 219, 647, 595, 569, 616, 361, 348, 244, 543, 590, 335, 432, 231, 778, 674, 419, 406, 127, 221, 570, 315, 362, 664, 409, 597, 456, 785, 651, 832, 248, 780, 676, 421, 624, 369, 235, 222, 611, 410, 598, 343, 572, 317, 705, 786, 364, 559, 653, 601, 422, 370, 464, 659, 237, 318, 706, 451, 680, 425, 613, 412, 801, 788, 654, 399, 602, 347, 243, 775, 191, 372, 238, 567, 426, 614, 359, 661, 708, 453, 802, 896, 617, 604, 349, 245, 792, 591, 688, 433, 480, 779, 675, 662, 407, 454, 428, 376, 804, 571, 618, 363, 665, 350, 712, 457, 246, 434, 833, 249, 781, 677, 625, 223, 666, 411, 599, 573, 458, 787, 620, 365, 834, 808, 436, 250, 782, 678, 423, 626, 371, 720, 465, 574, 319, 707, 681, 366, 668, 413, 460, 789, 655, 836, 603, 252, 466, 440, 628, 373, 239, 816, 682, 427, 615, 414, 709, 803, 790, 897, 605, 793, 689, 840, 374, 736, 481, 468, 663, 710, 455, 684, 429, 632, 377, 898, 805, 619, 606, 351, 713, 247, 794, 690, 435, 482, 430, 378, 806, 472, 900, 667, 848, 714, 459, 621, 835, 809, 796, 692, 437, 484, 251, 783, 679, 627, 721, 380, 575, 622, 367, 669, 716, 461, 810, 904, 438, 837, 253, 722, 467, 696, 441, 629, 488, 817, 683, 670, 864, 415, 462, 791, 838, 812, 254, 442, 841, 630, 375, 737, 724, 469, 818, 912, 711, 685, 633, 899, 607, 496, 795, 691, 842, 738, 483, 470, 444, 820, 686, 431, 634, 379, 807, 728, 473, 901, 849, 715, 797, 693, 844, 740, 485, 928, 474, 636, 381, 902, 850, 824, 623, 717, 811, 798, 905, 694, 439, 486, 723, 697, 382, 744, 489, 476, 671, 865, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 446, 845, 741, 822, 929, 916, 730, 475, 637, 903, 851, 825, 872, 500, 799, 695, 846, 742, 487, 930, 638, 383, 745, 732, 477, 826, 920, 853, 719, 907, 504, 932, 699, 880, 746, 491, 478, 867, 854, 828, 961, 815, 909, 857, 753, 727, 701, 915, 748, 493, 962, 936, 869, 910, 858, 754, 499, 702, 447, 494, 823, 870, 917, 964, 731, 873, 860, 756, 501, 847, 944, 743, 931, 918, 639, 733, 827, 874, 921, 968, 502, 760, 505, 933, 881, 747, 734, 479, 922, 855, 829, 876, 506, 934, 882, 976, 749, 830, 963, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q230_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 512, 257, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 514, 259, 51, 98, 145, 192, 46, 140, 88, 516, 261, 75, 146, 53, 100, 288, 262, 77, 520, 265, 54, 161, 148, 135, 83, 57, 104, 31, 78, 266, 162, 58, 152, 85, 528, 273, 139, 320, 515, 268, 164, 112, 99, 86, 60, 193, 274, 47, 141, 89, 517, 147, 194, 168, 101, 544, 289, 276, 142, 90, 518, 263, 521, 55, 102, 149, 196, 290, 384, 105, 92, 280, 79, 176, 522, 267, 163, 150, 292, 59, 106, 153, 200, 529, 576, 321, 524, 269, 165, 113, 154, 87, 61, 530, 275, 108, 322, 296, 270, 166, 114, 208, 62, 195, 169, 156, 545, 532, 277, 143, 324, 91, 519, 116, 304, 170, 103, 197, 546, 291, 278, 640, 385, 93, 536, 281, 177, 328, 224, 523, 151, 198, 172, 120, 386, 548, 293, 107, 94, 201, 282, 178, 577, 525, 294, 388, 155, 336, 202, 531, 109, 578, 323, 552, 297, 284, 180, 526, 271, 167, 115, 209, 63, 110, 157, 204, 298, 533, 392, 580, 325, 768, 210, 184, 117, 560, 305, 171, 158, 352, 547, 534, 279, 641, 326, 300, 537, 584, 329, 118, 225, 212, 306, 400, 199, 173, 121, 642, 387, 549, 95, 538, 283, 179, 330, 226, 308, 174, 122, 550, 295, 216, 644, 389, 592, 337, 203, 579, 553, 540, 285, 181, 332, 228, 527, 416, 124, 390, 338, 312, 111, 205, 554, 299, 286, 648, 393, 182, 581, 769, 211, 185, 232, 561, 159, 608, 353, 340, 206, 535, 394, 582, 327, 556, 301, 770, 186, 585, 119, 213, 562, 307, 354, 656, 401, 448, 643, 302, 396, 344, 240, 772, 539, 586, 331, 227, 214, 188, 402, 564, 309, 175, 356, 123, 551, 217, 645, 593, 541, 588, 333, 229, 776, 310, 672, 417, 404, 218, 125, 646, 391, 594, 339, 568, 313, 360, 555, 542, 287, 649, 183, 334, 230, 418, 126, 233, 220, 314, 609, 408, 596, 341, 207, 784, 650, 395, 583, 557, 771, 420, 187, 368, 234, 563, 610, 355, 657, 342, 316, 704, 449, 558, 303, 652, 397, 600, 345, 241, 773, 587, 215, 189, 658, 403, 236, 565, 450, 424, 612, 357, 800, 398, 346, 242, 774, 190, 589, 777, 566, 311, 673, 358, 660, 405, 452, 219, 647, 595, 569, 616, 361, 348, 244, 543, 590, 335, 432, 231, 778, 674, 419, 406, 127, 221, 570, 315, 362, 664, 409, 597, 456, 785, 651, 832, 248, 780, 676, 421, 624, 369, 235, 222, 611, 410, 598, 343, 572, 317, 705, 786, 364, 559, 653, 601, 422, 370, 464, 659, 237, 318, 706, 451, 680, 425, 613, 412, 801, 788, 654, 399, 602, 347, 243, 775, 191, 372, 238, 567, 426, 614, 359, 661, 708, 453, 802, 896, 617, 604, 349, 245, 792, 591, 688, 433, 480, 779, 675, 662, 407, 454, 428, 376, 804, 571, 618, 363, 665, 350, 712, 457, 246, 434, 833, 249, 781, 677, 625, 223, 666, 411, 599, 573, 458, 787, 620, 365, 834, 808, 436, 250, 782, 678, 423, 626, 371, 720, 465, 574, 319, 707, 681, 366, 668, 413, 460, 789, 655, 836, 603, 252, 466, 440, 628, 373, 239, 816, 682, 427, 615, 414, 709, 803, 790, 897, 605, 793, 689, 840, 374, 736, 481, 468, 663, 710, 455, 684, 429, 632, 377, 898, 805, 619, 606, 351, 713, 247, 794, 690, 435, 482, 430, 378, 806, 472, 900, 667, 848, 714, 459, 621, 835, 809, 796, 692, 437, 484, 251, 783, 679, 627, 721, 380, 575, 622, 367, 669, 716, 461, 810, 904, 438, 837, 253, 722, 467, 696, 441, 629, 488, 817, 683, 670, 415, 864, 462, 791, 838, 812, 254, 442, 841, 630, 375, 737, 724, 469, 818, 912, 711, 685, 633, 899, 607, 496, 795, 691, 842, 738, 483, 470, 444, 820, 686, 431, 634, 379, 807, 728, 473, 901, 849, 715, 797, 693, 844, 740, 485, 928, 474, 636, 381, 902, 850, 824, 623, 717, 811, 798, 905, 694, 439, 486, 723, 697, 382, 744, 489, 476, 671, 865, 852, 718, 463, 906, 839, 813, 255, 698, 443, 631, 490, 725, 819, 866, 913, 960, 814, 908, 856, 752, 497, 843, 739, 726, 471, 700, 445, 914, 492, 821, 687, 868, 635, 729, 498, 446, 845, 741, 822, 929, 916, 730, 475, 637, 903, 851, 825, 872, 500, 799, 695, 846, 742, 487, 930, 638, 383, 745, 732, 477, 826, 920, 853, 719, 907, 504, 932, 699, 880, 746, 491, 478, 867, 854, 828, 961, 815, 909, 857, 753, 727, 701, 915, 748, 493, 962, 936, 869, 910, 858, 754, 499, 702, 447, 494, 823, 870, 917, 964, 731, 873, 860, 756, 501, 847, 944, 743, 931, 918, 639, 733, 827, 874, 921, 968, 502, 760, 505, 933, 881, 747, 734, 479, 922, 855, 829, 876, 506, 934, 882, 976, 749, 830, 963, 937, 924, 911, 859, 755, 508, 703, 884, 750, 495, 938, 871, 965, 861, 757, 945, 992, 919, 966, 940, 888, 875, 862, 969, 758, 503, 946, 761, 735, 923, 970, 877, 948, 762, 507, 935, 883, 977, 831, 878, 925, 972, 764, 509, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 766, 511, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q231_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 257, 512, 49, 96, 23, 70, 44, 258, 73, 50, 144, 131, 260, 27, 74, 52, 39, 133, 81, 29, 76, 264, 160, 134, 82, 56, 43, 30, 137, 513, 97, 84, 272, 138, 71, 45, 259, 514, 51, 98, 145, 192, 46, 140, 88, 261, 516, 75, 146, 53, 100, 288, 262, 77, 265, 520, 54, 161, 148, 135, 83, 57, 104, 31, 78, 266, 162, 58, 152, 85, 273, 528, 139, 320, 515, 268, 164, 112, 99, 86, 60, 193, 274, 47, 141, 89, 517, 147, 194, 168, 101, 289, 544, 276, 142, 90, 263, 518, 521, 55, 102, 149, 196, 290, 384, 105, 92, 280, 79, 176, 267, 522, 163, 150, 292, 59, 106, 153, 200, 529, 321, 576, 269, 524, 165, 113, 154, 87, 61, 275, 530, 108, 322, 296, 270, 166, 114, 208, 62, 195, 169, 156, 545, 277, 532, 143, 324, 91, 519, 116, 304, 170, 103, 197, 291, 546, 278, 385, 640, 93, 281, 536, 177, 328, 224, 523, 151, 198, 172, 120, 386, 293, 548, 107, 94, 201, 282, 178, 577, 525, 294, 388, 155, 336, 202, 531, 109, 323, 578, 297, 552, 284, 180, 271, 526, 167, 115, 209, 63, 110, 157, 204, 298, 533, 392, 325, 580, 768, 210, 184, 117, 305, 560, 171, 158, 352, 547, 279, 534, 641, 326, 300, 537, 329, 584, 118, 225, 212, 306, 400, 199, 173, 121, 387, 642, 549, 95, 283, 538, 179, 330, 226, 308, 174, 122, 295, 550, 216, 389, 644, 337, 592, 203, 579, 553, 285, 540, 181, 332, 228, 527, 416, 124, 390, 338, 312, 111, 205, 299, 554, 286, 393, 648, 182, 581, 769, 211, 185, 232, 561, 159, 353, 608, 340, 206, 535, 394, 327, 582, 301, 556, 770, 186, 585, 119, 213, 307, 562, 354, 401, 656, 448, 643, 302, 396, 344, 240, 772, 539, 331, 586, 227, 214, 188, 402, 309, 564, 175, 356, 123, 551, 217, 645, 593, 541, 333, 588, 229, 776, 310, 417, 672, 404, 218, 125, 391, 646, 339, 594, 313, 568, 360, 555, 287, 542, 649, 183, 334, 230, 418, 126, 233, 220, 314, 609, 408, 341, 596, 207, 784, 395, 650, 583, 557, 771, 420, 187, 368, 234, 563, 355, 610, 657, 342, 316, 449, 704, 303, 558, 397, 652, 345, 600, 241, 773, 587, 215, 189, 403, 658, 236, 565, 450, 424, 357, 612, 800, 398, 346, 242, 774, 190, 589, 777, 311, 566, 673, 358, 405, 660, 452, 219, 647, 595, 569, 361, 616, 348, 244, 543, 335, 590, 432, 231, 778, 419, 674, 406, 127, 221, 315, 570, 362, 409, 664, 597, 456, 785, 651, 832, 248, 780, 421, 676, 369, 624, 235, 222, 611, 410, 343, 598, 317, 572, 705, 786, 364, 559, 653, 601, 422, 370, 464, 659, 237, 318, 451, 706, 425, 680, 613, 412, 801, 788, 399, 654, 347, 602, 243, 775, 191, 372, 238, 567, 426, 359, 614, 661, 453, 708, 802, 896, 617, 349, 604, 245, 792, 591, 433, 688, 480, 779, 675, 407, 662, 454, 428, 376, 804, 571, 363, 618, 665, 350, 457, 712, 246, 434, 833, 249, 781, 677, 625, 223, 411, 666, 599, 573, 458, 787, 365, 620, 834, 808, 436, 250, 782, 423, 678, 371, 626, 465, 720, 319, 574, 707, 681, 366, 413, 668, 460, 789, 655, 836, 603, 252, 466, 440, 373, 628, 239, 816, 427, 682, 615, 414, 709, 803, 790, 897, 605, 793, 689, 840, 374, 481, 736, 468, 663, 455, 710, 429, 684, 377, 632, 898, 805, 619, 351, 606, 713, 247, 794, 435, 690, 482, 430, 378, 806, 472, 900, 667, 848, 459, 714, 621, 835, 809, 796, 437, 692, 484, 251, 783, 679, 627, 721, 380, 575, 367, 622, 669, 461, 716, 810, 904, 438, 837, 253, 467, 722, 441, 696, 629, 488, 817, 683, 415, 670, 864, 462, 791, 838, 812, 254, 442, 841, 375, 630, 737, 469, 724, 818, 912, 711, 685, 633, 899, 607, 496, 795, 691, 842, 483, 738, 470, 444, 820, 431, 686, 379, 634, 807, 473, 728, 901, 849, 715, 797, 693, 844, 485, 740, 928, 474, 381, 636, 902, 850, 824, 623, 717, 811, 798, 905, 439, 694, 486, 723, 697, 382, 489, 744, 476, 671, 865, 852, 463, 718, 906, 839, 813, 255, 443, 698, 631, 490, 725, 819, 866, 913, 960, 814, 908, 856, 497, 752, 843, 739, 471, 726, 445, 700, 914, 492, 821, 687, 868, 635, 729, 498, 446, 845, 741, 822, 929, 916, 475, 730, 637, 903, 851, 825, 872, 500, 799, 695, 846, 487, 742, 930, 383, 638, 745, 477, 732, 826, 920, 853, 719, 907, 504, 932, 699, 880, 491, 746, 478, 867, 854, 828, 961, 815, 909, 857, 753, 727, 701, 915, 493, 748, 962, 936, 869, 910, 858, 499, 754, 447, 702, 494, 823, 870, 917, 964, 731, 873, 860, 501, 756, 847, 944, 743, 931, 918, 639, 733, 827, 874, 921, 968, 502, 505, 760, 933, 881, 747, 479, 734, 922, 855, 829, 876, 506, 934, 882, 976, 749, 830, 963, 937, 924, 911, 859, 755, 508, 703, 884, 495, 750, 938, 871, 965, 861, 757, 945, 992, 919, 966, 940, 888, 875, 862, 969, 503, 758, 946, 761, 735, 923, 970, 877, 948, 507, 762, 935, 883, 977, 831, 878, 925, 972, 509, 764, 978, 952, 885, 751, 939, 926, 510, 886, 993, 980, 967, 941, 889, 863, 759, 947, 994, 942, 890, 984, 971, 949, 996, 763, 892, 879, 973, 950, 765, 979, 953, 1000, 927, 974, 511, 766, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q232_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 272, 138, 71, 45, 259, 514, 51, 98, 145, 192, 46, 140, 88, 261, 516, 75, 146, 53, 100, 288, 262, 77, 54, 265, 520, 161, 148, 135, 83, 57, 104, 31, 78, 266, 162, 58, 152, 85, 273, 528, 139, 320, 515, 268, 164, 112, 99, 86, 60, 193, 274, 47, 141, 89, 517, 147, 194, 168, 101, 289, 544, 276, 142, 90, 263, 518, 55, 521, 102, 149, 196, 290, 384, 105, 92, 280, 79, 176, 267, 522, 163, 150, 59, 292, 106, 153, 200, 529, 321, 576, 269, 524, 165, 113, 154, 87, 61, 275, 108, 530, 322, 296, 270, 166, 114, 208, 62, 195, 169, 156, 545, 277, 532, 143, 91, 324, 519, 116, 304, 170, 103, 197, 291, 546, 278, 385, 640, 93, 281, 536, 177, 328, 224, 523, 151, 198, 172, 120, 386, 293, 548, 107, 94, 201, 282, 178, 577, 525, 294, 155, 388, 336, 202, 109, 531, 323, 578, 297, 552, 284, 180, 271, 526, 167, 115, 209, 63, 110, 157, 204, 298, 533, 392, 325, 580, 768, 210, 184, 117, 305, 560, 171, 158, 352, 547, 279, 534, 641, 326, 300, 537, 118, 329, 584, 225, 212, 306, 400, 199, 173, 121, 387, 642, 549, 95, 283, 538, 179, 330, 226, 308, 174, 122, 295, 550, 216, 389, 644, 337, 592, 203, 579, 553, 285, 540, 181, 332, 228, 527, 416, 124, 390, 338, 312, 111, 205, 299, 554, 286, 182, 393, 648, 581, 769, 211, 185, 232, 561, 159, 353, 608, 340, 206, 535, 394, 327, 582, 301, 556, 770, 186, 119, 585, 213, 307, 562, 354, 401, 656, 448, 643, 302, 396, 344, 240, 539, 772, 331, 586, 227, 214, 188, 402, 309, 564, 175, 123, 356, 551, 217, 645, 593, 541, 333, 588, 229, 310, 776, 417, 672, 404, 218, 125, 391, 646, 339, 594, 313, 568, 360, 555, 287, 542, 183, 649, 334, 230, 418, 126, 233, 220, 314, 609, 408, 341, 596, 207, 784, 395, 650, 583, 557, 771, 187, 420, 368, 234, 563, 355, 610, 657, 342, 316, 449, 704, 303, 558, 397, 652, 345, 600, 241, 773, 587, 215, 189, 403, 236, 658, 565, 450, 424, 357, 612, 800, 398, 346, 242, 774, 190, 589, 311, 566, 777, 673, 358, 405, 660, 219, 452, 647, 595, 569, 361, 616, 348, 244, 543, 335, 590, 432, 231, 778, 419, 674, 406, 127, 221, 315, 570, 362, 409, 664, 597, 456, 785, 651, 832, 248, 780, 421, 676, 369, 624, 235, 222, 611, 410, 343, 598, 317, 572, 705, 364, 786, 559, 653, 601, 422, 370, 464, 237, 659, 318, 451, 706, 425, 680, 613, 412, 801, 788, 399, 654, 347, 602, 243, 775, 191, 372, 238, 567, 426, 359, 614, 661, 453, 708, 802, 896, 617, 349, 604, 245, 792, 591, 433, 688, 480, 779, 675, 407, 662, 454, 428, 376, 571, 804, 363, 618, 665, 350, 246, 457, 712, 434, 833, 249, 781, 677, 625, 223, 411, 666, 599, 573, 458, 365, 787, 620, 834, 808, 436, 250, 782, 423, 678, 371, 626, 465, 720, 319, 574, 707, 681, 366, 413, 668, 460, 789, 655, 603, 836, 252, 466, 440, 373, 628, 239, 816, 427, 682, 615, 414, 709, 803, 790, 897, 605, 793, 689, 374, 840, 481, 736, 468, 663, 455, 710, 429, 684, 377, 632, 898, 805, 619, 351, 606, 247, 713, 794, 435, 690, 482, 430, 378, 806, 472, 667, 900, 848, 459, 714, 621, 835, 809, 796, 437, 692, 251, 484, 783, 679, 627, 721, 380, 575, 367, 622, 669, 461, 716, 810, 438, 904, 837, 253, 467, 722, 441, 696, 629, 488, 817, 683, 415, 670, 864, 462, 791, 838, 812, 254, 442, 375, 630, 841, 737, 469, 724, 818, 912, 711, 685, 633, 899, 607, 496, 795, 691, 842, 483, 738, 470, 444, 820, 431, 686, 379, 634, 807, 473, 728, 901, 849, 715, 797, 693, 844, 485, 740, 928, 474, 381, 636, 902, 850, 824, 623, 717, 811, 798, 439, 694, 905, 486, 723, 697, 382, 489, 744, 476, 671, 865, 852, 463, 718, 906, 839, 813, 255, 443, 698, 631, 490, 725, 819, 866, 913, 960, 814, 908, 856, 497, 752, 843, 739, 471, 726, 445, 700, 492, 914, 821, 687, 635, 868, 729, 498, 446, 845, 741, 822, 929, 916, 475, 730, 637, 903, 851, 825, 872, 500, 799, 695, 846, 487, 742, 930, 383, 638, 745, 477, 732, 826, 920, 853, 719, 907, 504, 699, 932, 880, 491, 746, 478, 867, 854, 828, 961, 815, 909, 857, 753, 727, 701, 493, 915, 748, 962, 936, 869, 910, 858, 499, 754, 447, 702, 494, 823, 870, 917, 731, 964, 873, 860, 501, 756, 847, 944, 743, 931, 918, 639, 733, 827, 874, 921, 502, 968, 505, 760, 933, 881, 747, 479, 734, 922, 855, 829, 876, 506, 934, 882, 976, 749, 830, 963, 937, 924, 911, 859, 755, 508, 703, 884, 495, 750, 938, 871, 965, 861, 757, 945, 992, 919, 966, 940, 888, 875, 862, 503, 758, 969, 946, 761, 735, 923, 970, 877, 948, 507, 762, 935, 883, 977, 831, 878, 925, 972, 509, 764, 978, 952, 885, 751, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q233_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 272, 138, 71, 45, 259, 514, 51, 98, 145, 192, 46, 140, 88, 261, 516, 75, 146, 53, 100, 288, 262, 77, 54, 265, 520, 161, 148, 135, 83, 57, 104, 31, 78, 266, 162, 58, 152, 85, 273, 528, 139, 320, 515, 268, 164, 112, 99, 86, 60, 193, 274, 47, 141, 89, 517, 147, 194, 168, 101, 289, 544, 276, 142, 90, 263, 518, 55, 521, 102, 149, 196, 290, 384, 105, 92, 280, 79, 176, 267, 522, 163, 150, 59, 292, 106, 153, 200, 529, 321, 576, 269, 524, 165, 113, 154, 87, 61, 108, 275, 530, 322, 296, 270, 166, 114, 208, 62, 195, 169, 156, 545, 277, 532, 143, 91, 324, 519, 116, 304, 170, 103, 197, 291, 546, 278, 385, 640, 93, 281, 536, 177, 328, 224, 523, 151, 198, 172, 120, 386, 293, 548, 107, 94, 201, 282, 178, 577, 525, 294, 155, 388, 336, 202, 109, 531, 323, 578, 297, 552, 284, 180, 271, 526, 167, 115, 209, 63, 110, 157, 204, 298, 533, 392, 325, 580, 768, 210, 184, 117, 305, 560, 171, 158, 352, 547, 279, 534, 641, 326, 300, 537, 118, 329, 584, 225, 212, 306, 400, 199, 173, 121, 387, 642, 549, 95, 283, 538, 179, 330, 226, 308, 174, 122, 295, 216, 550, 389, 644, 337, 592, 203, 579, 553, 285, 540, 181, 332, 228, 527, 416, 124, 390, 338, 312, 111, 205, 299, 554, 286, 182, 393, 648, 581, 769, 211, 185, 232, 561, 159, 353, 608, 340, 206, 535, 394, 327, 582, 301, 556, 770, 186, 119, 585, 213, 307, 562, 354, 401, 656, 448, 643, 302, 396, 344, 240, 539, 772, 331, 586, 227, 214, 188, 402, 309, 564, 175, 123, 356, 217, 551, 645, 593, 541, 333, 588, 229, 310, 776, 417, 672, 404, 218, 125, 391, 646, 339, 594, 313, 568, 360, 555, 287, 542, 183, 649, 334, 230, 418, 126, 233, 220, 314, 609, 408, 341, 596, 207, 784, 395, 650, 583, 557, 771, 187, 420, 368, 234, 563, 355, 610, 657, 342, 316, 449, 704, 303, 558, 397, 652, 345, 600, 241, 773, 587, 215, 189, 236, 403, 658, 565, 450, 424, 357, 612, 800, 398, 346, 242, 774, 190, 589, 311, 566, 777, 673, 358, 405, 660, 219, 452, 647, 595, 569, 361, 616, 348, 244, 543, 335, 590, 432, 231, 778, 419, 674, 406, 127, 221, 315, 570, 362, 409, 664, 597, 456, 785, 651, 832, 248, 780, 421, 676, 369, 624, 235, 222, 611, 410, 343, 598, 317, 572, 705, 364, 786, 559, 653, 601, 422, 370, 464, 237, 659, 318, 451, 706, 425, 680, 613, 412, 801, 788, 399, 654, 347, 602, 243, 775, 191, 372, 238, 567, 426, 359, 614, 661, 453, 708, 802, 896, 617, 349, 604, 245, 792, 591, 433, 688, 480, 779, 675, 407, 662, 454, 428, 376, 571, 804, 363, 618, 665, 350, 246, 457, 712, 434, 833, 249, 781, 677, 625, 223, 411, 666, 599, 573, 458, 365, 620, 787, 834, 808, 436, 250, 782, 423, 678, 371, 626, 465, 720, 319, 574, 707, 681, 366, 413, 668, 460, 789, 655, 603, 836, 252, 466, 440, 373, 628, 239, 816, 427, 682, 615, 414, 709, 803, 790, 897, 605, 793, 689, 374, 840, 481, 736, 468, 663, 455, 710, 429, 684, 377, 632, 898, 805, 619, 351, 606, 247, 713, 794, 435, 690, 482, 430, 378, 472, 806, 667, 900, 848, 459, 714, 621, 835, 809, 796, 437, 692, 251, 484, 783, 679, 627, 721, 380, 575, 367, 622, 669, 461, 716, 810, 438, 904, 837, 253, 467, 722, 441, 696, 629, 488, 817, 683, 415, 670, 864, 462, 791, 838, 812, 254, 442, 375, 630, 841, 737, 469, 724, 818, 912, 711, 685, 633, 899, 607, 496, 795, 691, 842, 483, 738, 470, 444, 820, 431, 686, 379, 634, 473, 807, 728, 901, 849, 715, 797, 693, 844, 485, 740, 928, 474, 381, 636, 902, 850, 824, 623, 717, 811, 798, 439, 694, 905, 486, 723, 697, 382, 489, 744, 476, 671, 865, 852, 463, 718, 906, 839, 813, 255, 443, 698, 631, 490, 725, 819, 866, 913, 960, 814, 908, 856, 497, 752, 843, 739, 471, 726, 445, 700, 492, 914, 821, 687, 635, 868, 729, 498, 446, 845, 741, 822, 929, 916, 475, 730, 637, 903, 851, 825, 872, 500, 799, 695, 846, 487, 742, 930, 383, 638, 745, 477, 732, 826, 920, 853, 719, 907, 504, 699, 932, 880, 491, 746, 478, 867, 854, 828, 961, 815, 909, 857, 753, 727, 701, 493, 748, 915, 962, 936, 869, 910, 858, 499, 754, 447, 702, 494, 823, 870, 917, 731, 964, 873, 860, 501, 756, 847, 944, 743, 931, 918, 639, 733, 827, 874, 921, 502, 968, 505, 760, 933, 881, 747, 479, 734, 922, 855, 829, 876, 506, 934, 882, 976, 749, 830, 963, 937, 924, 911, 859, 755, 508, 703, 884, 495, 750, 938, 871, 965, 861, 757, 945, 992, 919, 966, 940, 888, 875, 862, 503, 758, 969, 946, 761, 735, 923, 970, 877, 948, 507, 762, 935, 883, 977, 831, 878, 925, 972, 509, 764, 978, 952, 885, 751, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q234_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 136, 69, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 272, 138, 71, 45, 259, 514, 51, 98, 145, 192, 46, 140, 88, 261, 516, 75, 146, 53, 100, 288, 262, 77, 54, 265, 520, 161, 148, 135, 83, 57, 104, 31, 78, 266, 162, 58, 152, 85, 273, 139, 528, 320, 515, 268, 164, 112, 99, 86, 60, 193, 274, 47, 141, 89, 517, 147, 194, 168, 101, 289, 544, 276, 142, 90, 263, 518, 55, 521, 102, 149, 196, 290, 384, 105, 92, 280, 79, 176, 267, 522, 163, 150, 59, 292, 106, 153, 200, 529, 321, 576, 269, 524, 165, 113, 154, 87, 61, 108, 275, 530, 322, 296, 270, 166, 114, 208, 62, 195, 169, 156, 545, 277, 143, 532, 91, 324, 519, 116, 304, 170, 103, 197, 291, 546, 278, 385, 640, 93, 281, 536, 177, 328, 224, 523, 151, 198, 172, 120, 386, 293, 548, 107, 94, 201, 282, 178, 577, 525, 294, 155, 388, 336, 202, 109, 531, 323, 578, 297, 552, 284, 180, 271, 526, 167, 115, 209, 63, 110, 157, 204, 298, 533, 392, 325, 580, 768, 210, 184, 117, 305, 171, 560, 158, 352, 547, 279, 534, 326, 641, 300, 537, 118, 329, 584, 225, 212, 306, 400, 199, 173, 121, 387, 642, 549, 95, 283, 538, 179, 330, 226, 308, 174, 122, 295, 216, 550, 389, 644, 337, 203, 592, 579, 553, 285, 540, 181, 332, 228, 527, 416, 124, 390, 338, 312, 111, 205, 299, 554, 286, 182, 393, 648, 581, 769, 211, 185, 232, 561, 159, 353, 608, 340, 206, 535, 394, 327, 582, 301, 556, 770, 186, 119, 585, 213, 307, 562, 354, 401, 656, 448, 643, 302, 396, 344, 240, 539, 772, 331, 586, 227, 214, 188, 402, 309, 175, 564, 123, 356, 217, 551, 645, 593, 541, 333, 588, 229, 310, 776, 417, 672, 404, 218, 125, 391, 646, 339, 594, 313, 568, 360, 555, 287, 542, 183, 334, 649, 230, 418, 126, 233, 220, 314, 609, 408, 341, 207, 596, 395, 784, 650, 583, 557, 771, 187, 420, 368, 234, 563, 355, 610, 342, 657, 316, 449, 704, 303, 558, 397, 652, 345, 600, 241, 773, 587, 215, 189, 236, 403, 658, 565, 450, 424, 357, 612, 800, 398, 346, 242, 774, 190, 589, 311, 566, 777, 358, 673, 405, 660, 219, 452, 647, 595, 569, 361, 616, 348, 244, 543, 335, 590, 432, 231, 778, 419, 674, 406, 127, 221, 315, 570, 362, 409, 664, 597, 456, 785, 651, 832, 248, 780, 421, 676, 369, 235, 624, 222, 611, 410, 343, 598, 317, 572, 705, 364, 786, 559, 653, 601, 422, 370, 464, 237, 659, 318, 451, 706, 425, 680, 613, 412, 801, 399, 788, 654, 347, 602, 243, 775, 191, 372, 238, 567, 426, 359, 614, 661, 453, 708, 802, 896, 617, 349, 604, 245, 792, 591, 433, 688, 480, 779, 675, 407, 662, 454, 428, 376, 571, 804, 363, 618, 350, 665, 246, 457, 712, 434, 833, 249, 781, 677, 625, 223, 411, 666, 599, 573, 458, 365, 620, 787, 834, 808, 436, 250, 782, 423, 678, 371, 626, 465, 720, 319, 574, 707, 366, 681, 413, 668, 460, 789, 655, 603, 836, 252, 466, 440, 373, 239, 628, 427, 816, 682, 615, 414, 709, 803, 790, 897, 605, 793, 374, 689, 840, 481, 736, 468, 663, 455, 710, 429, 684, 377, 632, 898, 805, 619, 351, 606, 247, 713, 794, 435, 690, 482, 430, 378, 472, 806, 667, 900, 459, 848, 714, 621, 835, 809, 796, 437, 692, 251, 484, 783, 679, 627, 721, 380, 575, 367, 622, 669, 461, 716, 810, 438, 904, 837, 253, 467, 722, 441, 696, 629, 488, 817, 683, 415, 670, 864, 462, 791, 838, 812, 254, 442, 375, 630, 841, 737, 469, 724, 818, 912, 711, 685, 633, 899, 607, 496, 795, 691, 842, 483, 738, 470, 444, 431, 820, 686, 379, 634, 473, 807, 728, 901, 849, 715, 797, 693, 844, 485, 740, 928, 474, 381, 636, 902, 850, 824, 623, 717, 811, 798, 439, 694, 905, 486, 723, 382, 697, 489, 744, 476, 671, 865, 463, 852, 718, 906, 839, 813, 255, 443, 698, 631, 490, 725, 819, 866, 913, 960, 814, 908, 856, 497, 752, 843, 739, 471, 726, 445, 700, 492, 914, 821, 687, 635, 868, 729, 498, 446, 845, 741, 822, 929, 916, 475, 730, 637, 903, 851, 825, 872, 500, 799, 695, 846, 487, 742, 930, 383, 638, 745, 477, 732, 826, 920, 853, 719, 907, 504, 699, 932, 491, 880, 746, 478, 867, 854, 828, 961, 815, 909, 857, 753, 727, 701, 493, 748, 915, 962, 936, 869, 910, 858, 499, 754, 447, 702, 494, 823, 870, 917, 731, 964, 873, 860, 501, 756, 847, 944, 743, 931, 918, 639, 733, 827, 874, 921, 502, 968, 505, 760, 933, 881, 747, 479, 734, 922, 855, 829, 876, 506, 934, 882, 976, 749, 830, 963, 937, 924, 911, 859, 755, 508, 703, 495, 884, 750, 938, 871, 965, 861, 757, 945, 992, 919, 966, 940, 888, 875, 862, 503, 758, 969, 946, 761, 735, 923, 970, 877, 948, 507, 762, 935, 883, 977, 831, 878, 925, 972, 509, 764, 978, 952, 885, 751, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 954, 887, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q235_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 272, 45, 259, 514, 51, 98, 145, 192, 46, 140, 88, 261, 516, 75, 146, 53, 100, 288, 262, 77, 54, 265, 520, 161, 148, 135, 83, 57, 104, 31, 78, 266, 162, 58, 85, 152, 139, 273, 528, 320, 515, 268, 164, 112, 99, 86, 60, 193, 274, 47, 141, 89, 517, 147, 194, 101, 168, 289, 142, 276, 544, 90, 263, 518, 55, 521, 102, 149, 196, 290, 384, 105, 92, 79, 280, 176, 267, 522, 163, 150, 59, 292, 106, 153, 200, 529, 321, 576, 269, 524, 165, 113, 87, 154, 61, 108, 275, 530, 322, 296, 270, 166, 114, 208, 62, 195, 169, 156, 143, 277, 545, 532, 91, 324, 519, 116, 103, 170, 304, 197, 291, 278, 546, 385, 640, 93, 281, 536, 177, 328, 224, 523, 151, 198, 172, 120, 386, 293, 548, 107, 94, 201, 282, 178, 577, 525, 294, 155, 388, 202, 336, 109, 531, 323, 578, 297, 284, 552, 180, 271, 526, 167, 115, 209, 63, 110, 157, 204, 298, 533, 325, 392, 580, 768, 210, 117, 184, 171, 305, 158, 560, 352, 279, 547, 534, 326, 641, 300, 537, 118, 329, 584, 225, 212, 306, 199, 400, 173, 121, 387, 642, 549, 95, 283, 538, 179, 330, 226, 174, 308, 122, 295, 216, 550, 389, 644, 203, 337, 592, 579, 285, 553, 540, 181, 332, 228, 527, 416, 124, 390, 338, 111, 312, 205, 299, 286, 554, 182, 393, 581, 648, 769, 211, 185, 232, 159, 561, 353, 206, 340, 608, 535, 327, 394, 582, 301, 556, 770, 119, 186, 585, 213, 307, 562, 354, 401, 656, 448, 643, 302, 396, 344, 240, 539, 772, 331, 586, 227, 214, 188, 402, 175, 309, 564, 123, 356, 217, 551, 645, 593, 541, 333, 588, 229, 310, 776, 417, 404, 672, 218, 125, 391, 646, 339, 594, 313, 568, 360, 287, 555, 542, 183, 334, 649, 230, 418, 126, 233, 220, 314, 207, 341, 408, 609, 596, 395, 583, 650, 784, 557, 771, 187, 420, 234, 368, 563, 355, 342, 610, 657, 316, 449, 704, 303, 558, 397, 652, 345, 600, 241, 773, 587, 215, 189, 236, 403, 658, 565, 450, 357, 424, 612, 398, 800, 346, 242, 774, 190, 589, 311, 566, 777, 358, 405, 673, 660, 219, 452, 647, 595, 569, 361, 348, 616, 244, 543, 335, 590, 231, 432, 778, 419, 406, 674, 127, 221, 315, 570, 362, 409, 597, 664, 456, 651, 785, 832, 248, 780, 421, 676, 235, 369, 222, 624, 343, 410, 611, 598, 317, 572, 705, 364, 786, 559, 653, 601, 422, 370, 464, 237, 659, 318, 451, 706, 425, 412, 613, 680, 399, 801, 654, 788, 347, 602, 243, 775, 191, 238, 372, 567, 359, 426, 614, 661, 453, 708, 802, 896, 349, 617, 604, 245, 591, 792, 433, 688, 480, 779, 407, 675, 662, 454, 428, 376, 571, 804, 363, 350, 618, 665, 246, 457, 712, 434, 833, 249, 781, 677, 223, 625, 411, 599, 666, 573, 458, 365, 620, 787, 834, 808, 436, 250, 782, 423, 678, 371, 626, 465, 720, 319, 574, 707, 366, 413, 681, 668, 460, 655, 789, 603, 836, 252, 466, 239, 373, 440, 628, 427, 414, 615, 682, 816, 709, 803, 790, 897, 605, 793, 374, 689, 840, 481, 468, 736, 663, 455, 710, 429, 684, 377, 632, 898, 805, 351, 619, 606, 247, 713, 794, 435, 690, 482, 430, 378, 472, 806, 667, 900, 459, 714, 848, 621, 835, 809, 796, 437, 692, 251, 484, 783, 679, 627, 721, 380, 575, 367, 622, 669, 461, 716, 810, 438, 837, 904, 253, 467, 722, 441, 629, 696, 488, 415, 683, 817, 670, 462, 864, 791, 838, 812, 254, 375, 442, 630, 841, 469, 737, 724, 818, 711, 912, 685, 633, 899, 607, 496, 795, 691, 842, 483, 470, 738, 444, 431, 686, 820, 379, 634, 473, 807, 728, 901, 715, 849, 797, 693, 844, 485, 740, 928, 474, 381, 636, 902, 850, 623, 824, 717, 811, 798, 439, 694, 905, 486, 723, 382, 697, 489, 476, 744, 671, 463, 865, 718, 852, 839, 906, 813, 255, 443, 631, 698, 490, 725, 819, 866, 913, 960, 814, 908, 856, 497, 752, 843, 471, 739, 726, 445, 700, 492, 914, 687, 821, 635, 868, 729, 498, 446, 845, 741, 822, 929, 916, 475, 730, 637, 903, 851, 825, 872, 500, 799, 695, 846, 487, 742, 930, 383, 638, 477, 745, 732, 826, 719, 853, 920, 907, 504, 699, 932, 491, 478, 746, 880, 867, 854, 828, 961, 815, 909, 857, 753, 727, 701, 493, 748, 915, 962, 869, 936, 910, 858, 499, 754, 447, 702, 494, 823, 870, 917, 731, 964, 873, 860, 501, 756, 847, 743, 944, 931, 918, 639, 733, 827, 874, 921, 502, 968, 505, 760, 933, 479, 747, 881, 734, 855, 922, 829, 876, 506, 934, 882, 976, 749, 830, 963, 937, 924, 911, 859, 755, 508, 703, 495, 750, 884, 871, 938, 965, 861, 757, 945, 992, 919, 966, 940, 888, 875, 862, 503, 758, 969, 946, 761, 735, 923, 970, 877, 948, 507, 762, 935, 883, 977, 831, 878, 925, 972, 509, 764, 978, 751, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q236_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 272, 45, 259, 514, 51, 98, 145, 192, 46, 140, 88, 261, 516, 75, 146, 53, 100, 288, 262, 77, 54, 265, 520, 161, 148, 135, 83, 57, 104, 31, 78, 266, 162, 58, 85, 152, 139, 273, 528, 320, 515, 268, 164, 112, 99, 86, 60, 193, 274, 47, 141, 89, 517, 147, 194, 101, 168, 289, 142, 276, 544, 90, 263, 518, 55, 521, 102, 149, 196, 290, 384, 105, 92, 79, 280, 176, 267, 522, 163, 150, 59, 292, 106, 153, 200, 529, 321, 576, 269, 524, 165, 113, 87, 154, 61, 108, 275, 530, 322, 296, 270, 166, 114, 208, 62, 195, 169, 156, 143, 277, 545, 532, 91, 324, 519, 116, 103, 170, 304, 197, 291, 278, 546, 385, 640, 93, 281, 536, 177, 328, 224, 523, 151, 198, 172, 120, 386, 293, 548, 107, 94, 201, 282, 178, 577, 525, 294, 155, 388, 202, 336, 109, 531, 323, 297, 578, 284, 552, 180, 271, 526, 167, 115, 209, 63, 110, 157, 204, 298, 533, 325, 392, 580, 768, 210, 117, 184, 171, 305, 158, 560, 352, 279, 547, 534, 326, 641, 300, 537, 118, 329, 584, 225, 212, 306, 199, 400, 173, 121, 387, 642, 549, 95, 283, 538, 179, 330, 226, 174, 308, 122, 295, 216, 550, 389, 644, 203, 337, 592, 579, 285, 553, 540, 181, 332, 228, 527, 416, 124, 390, 338, 111, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 643, 302, 396, 344, 240, 539, 772, 331, 586, 227, 214, 188, 402, 175, 309, 564, 123, 356, 217, 551, 645, 593, 541, 333, 588, 229, 310, 776, 417, 404, 672, 218, 125, 391, 646, 339, 313, 594, 568, 360, 287, 555, 542, 183, 334, 649, 230, 418, 126, 233, 220, 314, 207, 341, 408, 609, 596, 395, 583, 650, 784, 557, 771, 187, 420, 234, 368, 563, 355, 342, 610, 657, 316, 449, 704, 303, 558, 397, 652, 345, 600, 241, 773, 587, 215, 189, 236, 403, 658, 565, 450, 357, 424, 612, 398, 800, 346, 242, 774, 190, 589, 311, 566, 777, 358, 405, 673, 660, 219, 452, 647, 595, 569, 361, 348, 616, 244, 543, 335, 590, 231, 432, 778, 419, 406, 674, 127, 221, 315, 570, 362, 409, 597, 664, 456, 651, 785, 832, 248, 780, 421, 676, 235, 369, 222, 624, 343, 410, 611, 317, 598, 572, 705, 364, 786, 559, 653, 601, 422, 370, 464, 237, 659, 318, 451, 425, 706, 412, 613, 680, 399, 801, 654, 788, 347, 602, 243, 775, 191, 238, 372, 567, 359, 426, 614, 661, 453, 708, 802, 896, 349, 617, 604, 245, 591, 792, 433, 688, 480, 779, 407, 675, 662, 454, 428, 376, 571, 804, 363, 350, 618, 665, 246, 457, 712, 434, 833, 249, 781, 677, 223, 625, 411, 599, 666, 573, 458, 365, 620, 787, 834, 808, 436, 250, 782, 423, 678, 371, 626, 465, 720, 319, 574, 707, 366, 413, 681, 668, 460, 655, 789, 603, 836, 252, 466, 239, 373, 440, 628, 427, 414, 615, 682, 816, 709, 803, 790, 897, 605, 793, 374, 689, 840, 481, 468, 736, 663, 455, 429, 710, 684, 377, 632, 898, 805, 351, 619, 606, 247, 713, 794, 435, 690, 482, 430, 378, 472, 806, 667, 900, 459, 714, 848, 621, 835, 809, 796, 437, 692, 251, 484, 783, 679, 627, 721, 380, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 912, 685, 633, 899, 607, 496, 795, 691, 842, 483, 470, 738, 444, 431, 686, 820, 379, 634, 473, 807, 728, 901, 715, 849, 797, 693, 844, 485, 740, 928, 474, 381, 636, 902, 850, 623, 824, 717, 811, 798, 439, 694, 905, 486, 723, 382, 697, 489, 476, 744, 671, 463, 865, 718, 852, 839, 906, 813, 255, 443, 631, 698, 490, 725, 819, 866, 913, 960, 814, 908, 856, 497, 752, 843, 471, 739, 445, 726, 700, 492, 914, 687, 821, 635, 868, 729, 498, 446, 845, 741, 822, 929, 916, 475, 730, 637, 903, 851, 825, 872, 500, 799, 695, 846, 487, 742, 930, 383, 638, 477, 745, 732, 826, 719, 853, 920, 907, 504, 699, 932, 491, 478, 746, 880, 867, 854, 828, 961, 815, 909, 857, 753, 727, 701, 493, 748, 915, 962, 869, 936, 910, 858, 499, 754, 447, 702, 494, 823, 870, 917, 731, 964, 873, 860, 501, 756, 847, 743, 944, 931, 918, 639, 733, 827, 874, 921, 502, 968, 505, 760, 933, 479, 747, 881, 734, 855, 922, 829, 876, 506, 934, 882, 976, 749, 830, 963, 937, 924, 911, 859, 755, 508, 703, 495, 750, 884, 871, 938, 965, 861, 757, 945, 992, 919, 966, 940, 888, 875, 862, 503, 758, 969, 946, 761, 735, 923, 970, 877, 948, 507, 762, 935, 883, 977, 831, 878, 925, 972, 509, 764, 978, 751, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

Q237$_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 272, 45, 259, 514, 51, 98, 145, 192, 46, 140, 88, 261, 75, 516, 146, 53, 100, 288, 262, 77, 54, 265, 520, 161, 148, 135, 83, 57, 104, 31, 78, 266, 162, 58, 85, 152, 139, 273, 528, 320, 515, 268, 164, 112, 99, 86, 60, 193, 274, 47, 141, 89, 517, 147, 194, 101, 168, 289, 142, 276, 544, 90, 263, 518, 55, 521, 102, 149, 196, 290, 384, 105, 92, 79, 280, 176, 267, 522, 163, 150, 59, 292, 106, 153, 200, 529, 321, 576, 269, 524, 165, 113, 87, 154, 61, 108, 275, 530, 322, 296, 270, 166, 114, 208, 62, 195, 169, 156, 143, 277, 545, 91, 532, 324, 519, 116, 103, 170, 304, 197, 291, 278, 546, 385, 640, 93, 281, 536, 177, 328, 224, 523, 151, 198, 172, 120, 386, 293, 107, 548, 94, 201, 282, 178, 577, 525, 294, 155, 388, 202, 336, 109, 531, 323, 297, 578, 284, 552, 180, 271, 526, 167, 115, 209, 63, 110, 157, 204, 298, 533, 325, 392, 580, 768, 210, 117, 184, 171, 305, 158, 560, 352, 279, 547, 534, 326, 641, 300, 537, 118, 329, 584, 225, 212, 306, 199, 400, 173, 121, 387, 642, 549, 95, 283, 538, 179, 330, 226, 174, 308, 122, 295, 216, 550, 389, 203, 644, 337, 592, 579, 285, 553, 540, 181, 332, 228, 527, 416, 124, 390, 338, 111, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 643, 302, 396, 344, 240, 539, 331, 772, 586, 227, 214, 188, 402, 175, 309, 123, 564, 356, 217, 551, 645, 593, 541, 333, 588, 229, 310, 776, 417, 404, 672, 218, 125, 391, 646, 339, 313, 594, 568, 360, 287, 555, 542, 183, 334, 649, 230, 418, 126, 233, 220, 314, 207, 341, 408, 609, 596, 395, 583, 650, 784, 557, 771, 187, 420, 234, 368, 563, 355, 342, 610, 657, 316, 449, 704, 303, 558, 397, 652, 345, 600, 241, 773, 587, 215, 189, 236, 403, 658, 565, 450, 357, 424, 612, 398, 800, 346, 242, 774, 190, 589, 311, 566, 777, 358, 405, 673, 219, 660, 452, 647, 595, 569, 361, 348, 616, 244, 543, 335, 590, 231, 432, 778, 419, 406, 674, 127, 221, 315, 570, 362, 409, 597, 664, 456, 651, 785, 832, 248, 780, 421, 235, 676, 369, 222, 624, 343, 410, 611, 317, 598, 572, 705, 364, 786, 559, 653, 601, 422, 370, 464, 237, 659, 318, 451, 425, 706, 412, 613, 680, 399, 801, 654, 347, 788, 602, 243, 775, 191, 238, 372, 567, 359, 426, 614, 661, 453, 708, 802, 896, 349, 617, 604, 245, 591, 792, 433, 688, 480, 779, 407, 675, 662, 454, 428, 376, 571, 363, 804, 350, 618, 665, 246, 457, 712, 434, 833, 249, 781, 677, 223, 625, 411, 599, 666, 573, 458, 365, 620, 787, 834, 808, 436, 250, 782, 423, 678, 371, 626, 465, 720, 319, 574, 707, 366, 413, 681, 668, 460, 655, 789, 603, 836, 252, 466, 239, 373, 440, 628, 427, 414, 615, 682, 816, 709, 803, 790, 897, 605, 793, 374, 689, 840, 481, 468, 736, 663, 455, 429, 710, 684, 377, 632, 898, 805, 351, 619, 606, 247, 713, 794, 435, 690, 482, 430, 378, 472, 806, 667, 459, 900, 714, 848, 621, 835, 809, 796, 437, 251, 692, 484, 783, 679, 627, 721, 380, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 912, 685, 633, 899, 607, 496, 795, 691, 842, 483, 470, 738, 444, 431, 686, 379, 820, 634, 473, 807, 728, 901, 715, 849, 797, 693, 844, 485, 740, 928, 474, 381, 636, 902, 850, 623, 824, 717, 811, 798, 439, 694, 905, 486, 723, 382, 697, 489, 476, 744, 671, 463, 865, 718, 852, 839, 906, 813, 255, 443, 631, 698, 490, 725, 819, 866, 913, 960, 814, 908, 856, 497, 752, 843, 471, 739, 445, 726, 700, 492, 914, 687, 821, 635, 868, 729, 498, 446, 845, 741, 822, 929, 475, 916, 730, 637, 903, 851, 825, 872, 500, 799, 695, 846, 487, 742, 930, 383, 638, 477, 745, 732, 826, 719, 853, 920, 907, 504, 699, 491, 932, 478, 746, 880, 867, 854, 828, 961, 815, 909, 857, 753, 727, 701, 493, 748, 915, 962, 869, 936, 910, 858, 499, 754, 447, 702, 494, 823, 870, 917, 731, 964, 873, 860, 501, 756, 847, 743, 944, 931, 918, 639, 733, 827, 874, 921, 502, 968, 505, 760, 933, 479, 747, 881, 734, 855, 922, 829, 876, 506, 934, 882, 976, 749, 830, 963, 937, 924, 911, 859, 755, 508, 703, 495, 750, 884, 871, 938, 965, 861, 757, 945, 992, 919, 966, 940, 888, 875, 862, 503, 758, 969, 946, 761, 735, 923, 970, 877, 507, 948, 762, 935, 883, 977, 831, 878, 925, 972, 509, 764, 978, 751, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q238_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 272, 45, 259, 514, 51, 98, 145, 192, 46, 140, 88, 261, 75, 516, 146, 53, 100, 288, 262, 77, 54, 265, 520, 161, 148, 135, 83, 57, 104, 31, 78, 266, 162, 58, 85, 152, 139, 273, 528, 320, 515, 268, 164, 112, 99, 86, 60, 193, 274, 47, 141, 89, 517, 147, 194, 101, 168, 289, 142, 276, 544, 90, 263, 518, 55, 521, 102, 149, 196, 290, 384, 105, 92, 79, 280, 176, 267, 522, 163, 150, 59, 292, 106, 153, 200, 529, 321, 576, 269, 524, 165, 113, 87, 154, 61, 108, 275, 530, 322, 296, 270, 166, 114, 208, 62, 195, 169, 156, 143, 277, 545, 91, 532, 324, 519, 116, 103, 170, 304, 197, 291, 278, 546, 385, 640, 93, 281, 536, 177, 328, 224, 523, 151, 198, 172, 120, 386, 293, 107, 548, 94, 201, 282, 178, 577, 525, 294, 155, 388, 202, 336, 109, 531, 323, 297, 578, 284, 552, 180, 271, 526, 167, 115, 209, 63, 110, 157, 204, 298, 533, 325, 392, 580, 768, 210, 117, 184, 171, 305, 158, 560, 352, 279, 547, 534, 326, 300, 641, 537, 118, 329, 584, 225, 212, 306, 199, 400, 173, 121, 387, 642, 549, 95, 283, 538, 179, 330, 226, 174, 308, 122, 295, 216, 550, 389, 203, 337, 644, 592, 579, 285, 553, 540, 181, 332, 228, 527, 416, 124, 390, 338, 111, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 302, 643, 396, 344, 240, 539, 331, 772, 586, 227, 214, 188, 402, 175, 309, 123, 564, 356, 217, 551, 645, 593, 541, 333, 588, 229, 310, 776, 417, 404, 672, 218, 125, 391, 339, 646, 313, 594, 568, 360, 287, 555, 542, 183, 334, 649, 230, 418, 126, 233, 220, 314, 207, 341, 408, 609, 596, 395, 583, 650, 784, 557, 771, 187, 420, 234, 368, 563, 355, 342, 610, 316, 657, 449, 704, 303, 558, 397, 345, 652, 600, 241, 773, 587, 215, 189, 236, 403, 658, 565, 450, 357, 424, 612, 398, 800, 346, 242, 774, 190, 589, 311, 566, 777, 358, 405, 673, 219, 660, 452, 647, 595, 569, 361, 348, 616, 244, 543, 335, 590, 231, 432, 778, 419, 406, 674, 127, 221, 315, 570, 362, 409, 597, 664, 456, 651, 785, 832, 248, 780, 421, 235, 369, 676, 222, 624, 343, 410, 611, 317, 598, 572, 364, 705, 786, 559, 653, 601, 422, 370, 464, 237, 318, 659, 451, 425, 706, 412, 613, 680, 399, 801, 347, 654, 788, 602, 243, 775, 191, 238, 372, 567, 359, 426, 614, 661, 453, 708, 802, 896, 349, 617, 604, 245, 591, 792, 433, 688, 480, 779, 407, 675, 662, 454, 428, 376, 571, 363, 804, 350, 618, 665, 246, 457, 712, 434, 833, 249, 781, 677, 223, 625, 411, 599, 666, 573, 458, 365, 620, 787, 834, 808, 436, 250, 782, 423, 371, 678, 626, 465, 720, 319, 574, 366, 707, 413, 681, 668, 460, 655, 789, 603, 836, 252, 466, 239, 373, 440, 628, 427, 414, 615, 682, 816, 709, 803, 790, 897, 605, 793, 374, 689, 840, 481, 468, 736, 663, 455, 429, 710, 377, 684, 632, 898, 805, 351, 619, 606, 247, 713, 794, 435, 690, 482, 430, 378, 472, 806, 667, 459, 900, 714, 848, 621, 835, 809, 796, 437, 251, 692, 484, 783, 679, 627, 380, 721, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 912, 685, 633, 899, 607, 496, 795, 691, 842, 483, 470, 738, 444, 431, 379, 686, 820, 634, 473, 807, 728, 901, 715, 849, 797, 693, 844, 485, 740, 928, 474, 381, 636, 902, 850, 623, 824, 717, 811, 798, 439, 694, 905, 486, 382, 723, 697, 489, 476, 744, 671, 463, 865, 718, 852, 839, 906, 813, 255, 443, 631, 698, 490, 725, 819, 866, 913, 960, 814, 908, 856, 497, 752, 843, 471, 739, 445, 726, 700, 492, 914, 687, 821, 635, 868, 729, 498, 446, 845, 741, 822, 929, 475, 916, 730, 637, 903, 851, 825, 872, 500, 799, 695, 846, 487, 742, 930, 383, 638, 477, 745, 732, 826, 719, 853, 920, 907, 504, 699, 491, 932, 478, 746, 880, 867, 854, 828, 961, 815, 909, 857, 753, 727, 701, 493, 748, 915, 962, 869, 936, 910, 858, 499, 754, 447, 702, 494, 823, 870, 917, 731, 964, 873, 860, 501, 756, 847, 743, 944, 931, 918, 639, 733, 827, 874, 921, 502, 968, 505, 760, 933, 479, 747, 881, 734, 855, 922, 829, 876, 506, 934, 882, 976, 749, 830, 963, 937, 924, 911, 859, 755, 508, 703, 495, 750, 884, 871, 938, 965, 861, 757, 945, 992, 919, 966, 940, 888, 875, 862, 503, 758, 969, 946, 761, 735, 923, 970, 877, 507, 948, 762, 935, 883, 977, 831, 878, 925, 972, 509, 764, 978, 751, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q239_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 45, 272, 259, 514, 51, 98, 145, 192, 46, 140, 88, 261, 75, 516, 146, 53, 100, 288, 262, 77, 54, 265, 161, 520, 148, 135, 83, 57, 104, 31, 78, 266, 162, 58, 85, 152, 139, 273, 528, 320, 515, 268, 164, 112, 99, 86, 60, 193, 47, 274, 141, 89, 517, 147, 194, 101, 168, 289, 142, 276, 90, 544, 263, 518, 55, 521, 102, 149, 196, 290, 384, 105, 92, 79, 280, 176, 267, 163, 522, 150, 59, 292, 106, 153, 200, 529, 321, 576, 269, 165, 524, 113, 87, 154, 61, 108, 275, 530, 322, 296, 270, 166, 114, 208, 62, 195, 169, 156, 143, 277, 91, 545, 532, 324, 519, 116, 103, 170, 304, 197, 291, 278, 546, 385, 640, 93, 281, 177, 536, 328, 224, 523, 151, 198, 172, 120, 386, 293, 107, 94, 548, 201, 282, 178, 577, 525, 294, 155, 388, 202, 109, 336, 531, 323, 297, 578, 284, 552, 180, 271, 167, 526, 115, 209, 63, 110, 157, 204, 298, 533, 325, 392, 580, 768, 210, 117, 184, 171, 305, 158, 560, 352, 279, 547, 534, 326, 300, 641, 537, 118, 329, 225, 584, 212, 306, 199, 173, 400, 121, 387, 642, 95, 549, 283, 179, 538, 330, 226, 174, 308, 122, 295, 216, 550, 389, 203, 337, 644, 592, 579, 285, 553, 181, 540, 332, 228, 527, 416, 124, 390, 111, 338, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 302, 643, 396, 344, 240, 539, 331, 772, 227, 586, 214, 188, 175, 402, 309, 123, 564, 356, 217, 551, 645, 593, 541, 333, 229, 588, 310, 417, 776, 404, 218, 672, 125, 391, 339, 646, 313, 594, 568, 360, 287, 555, 183, 542, 334, 649, 230, 418, 126, 233, 220, 314, 207, 341, 408, 609, 596, 395, 583, 650, 557, 784, 771, 187, 420, 234, 368, 563, 355, 342, 610, 316, 657, 449, 704, 303, 558, 397, 345, 652, 241, 600, 773, 587, 215, 189, 236, 403, 658, 565, 450, 357, 424, 612, 398, 346, 800, 242, 774, 190, 589, 311, 566, 777, 358, 405, 219, 673, 660, 452, 647, 595, 569, 361, 348, 616, 244, 543, 335, 231, 590, 432, 419, 778, 406, 674, 127, 221, 315, 570, 362, 409, 597, 664, 456, 651, 785, 832, 248, 421, 780, 235, 369, 222, 676, 624, 343, 410, 611, 317, 598, 572, 364, 705, 559, 786, 653, 601, 422, 370, 237, 464, 318, 659, 451, 425, 706, 412, 613, 680, 399, 347, 801, 654, 788, 243, 602, 775, 191, 238, 372, 567, 359, 426, 614, 661, 453, 708, 802, 896, 349, 617, 245, 604, 591, 433, 792, 688, 480, 779, 407, 675, 662, 454, 428, 376, 571, 363, 350, 804, 618, 665, 246, 457, 712, 434, 833, 249, 781, 223, 677, 625, 411, 599, 666, 573, 458, 365, 620, 787, 834, 808, 436, 250, 423, 782, 371, 678, 626, 465, 720, 319, 574, 366, 707, 413, 681, 668, 460, 655, 789, 603, 836, 252, 239, 466, 373, 440, 628, 427, 414, 615, 682, 816, 709, 803, 790, 897, 605, 793, 374, 689, 481, 840, 468, 736, 663, 455, 429, 710, 377, 684, 632, 898, 351, 805, 619, 247, 606, 713, 435, 794, 690, 482, 430, 378, 472, 806, 667, 459, 900, 714, 621, 848, 835, 809, 437, 796, 251, 692, 484, 783, 679, 627, 380, 721, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 685, 912, 633, 899, 607, 496, 795, 691, 483, 842, 470, 738, 444, 431, 379, 686, 820, 634, 473, 807, 728, 901, 715, 849, 797, 693, 485, 844, 740, 474, 928, 381, 636, 902, 623, 850, 824, 717, 811, 439, 798, 694, 905, 486, 382, 723, 697, 489, 476, 744, 671, 463, 865, 718, 852, 839, 906, 813, 255, 443, 631, 698, 490, 725, 819, 866, 913, 960, 814, 908, 497, 856, 752, 843, 471, 739, 445, 726, 700, 492, 687, 914, 821, 635, 868, 729, 498, 446, 845, 741, 822, 475, 929, 916, 730, 637, 903, 851, 825, 872, 500, 799, 695, 487, 846, 742, 930, 383, 638, 477, 745, 732, 826, 719, 853, 920, 907, 504, 699, 491, 478, 932, 746, 880, 867, 854, 828, 961, 815, 909, 857, 753, 727, 701, 493, 748, 915, 962, 869, 936, 910, 499, 858, 754, 447, 702, 494, 823, 870, 917, 731, 964, 873, 501, 860, 756, 847, 743, 944, 931, 918, 639, 733, 827, 874, 921, 502, 968, 505, 760, 479, 933, 747, 881, 734, 855, 922, 829, 876, 506, 934, 882, 749, 976, 830, 963, 937, 924, 911, 859, 755, 508, 703, 495, 750, 884, 871, 938, 965, 861, 757, 945, 992, 919, 966, 940, 888, 875, 503, 862, 758, 969, 946, 761, 735, 923, 970, 877, 507, 948, 762, 935, 883, 977, 831, 878, 925, 972, 509, 764, 751, 978, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q240_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 45, 272, 259, 514, 51, 98, 145, 192, 46, 140, 88, 261, 75, 516, 146, 53, 100, 288, 262, 77, 54, 265, 161, 520, 148, 135, 83, 57, 104, 31, 78, 266, 162, 58, 85, 152, 139, 273, 528, 320, 515, 268, 164, 112, 99, 86, 60, 193, 47, 274, 141, 89, 517, 147, 194, 101, 168, 289, 142, 276, 90, 544, 263, 518, 55, 102, 521, 149, 196, 290, 384, 105, 92, 79, 280, 176, 267, 163, 522, 150, 59, 292, 106, 153, 200, 529, 321, 576, 269, 165, 524, 113, 87, 154, 61, 108, 275, 530, 322, 296, 270, 166, 114, 208, 62, 195, 169, 156, 143, 277, 91, 545, 532, 324, 519, 116, 103, 170, 304, 197, 291, 278, 546, 385, 640, 93, 281, 177, 536, 328, 224, 523, 151, 198, 172, 120, 386, 293, 107, 94, 548, 201, 282, 178, 577, 525, 294, 155, 388, 202, 109, 336, 531, 323, 297, 578, 284, 552, 180, 271, 167, 526, 115, 209, 63, 110, 157, 204, 298, 533, 325, 392, 580, 768, 210, 117, 184, 171, 305, 158, 560, 352, 279, 547, 534, 326, 300, 641, 118, 537, 329, 225, 584, 212, 306, 199, 173, 400, 121, 387, 642, 95, 549, 283, 179, 538, 330, 226, 174, 308, 122, 295, 216, 550, 389, 203, 337, 644, 592, 579, 285, 553, 181, 540, 332, 228, 527, 416, 124, 390, 111, 338, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 302, 643, 396, 344, 240, 539, 331, 772, 227, 586, 214, 188, 175, 402, 309, 123, 564, 356, 217, 551, 645, 593, 541, 333, 229, 588, 310, 417, 776, 404, 218, 672, 125, 391, 339, 646, 313, 594, 568, 360, 287, 555, 183, 542, 334, 230, 649, 418, 126, 233, 220, 314, 207, 341, 408, 609, 596, 395, 583, 650, 557, 784, 771, 187, 420, 234, 368, 563, 355, 342, 610, 316, 657, 449, 303, 704, 558, 397, 345, 652, 241, 600, 773, 587, 215, 189, 236, 403, 658, 565, 450, 357, 424, 612, 398, 346, 800, 242, 774, 190, 589, 311, 566, 358, 777, 405, 219, 673, 660, 452, 647, 595, 569, 361, 348, 616, 244, 543, 335, 231, 590, 432, 419, 778, 406, 674, 127, 221, 315, 570, 362, 409, 597, 664, 456, 651, 785, 832, 248, 421, 780, 235, 369, 222, 676, 624, 343, 410, 611, 317, 598, 572, 364, 705, 559, 786, 653, 601, 422, 370, 237, 464, 318, 659, 451, 425, 706, 412, 613, 680, 399, 347, 801, 654, 788, 243, 602, 775, 191, 238, 372, 567, 359, 426, 614, 661, 453, 708, 802, 896, 349, 617, 245, 604, 591, 433, 792, 688, 480, 779, 407, 675, 662, 454, 428, 376, 571, 363, 350, 804, 618, 246, 665, 457, 712, 434, 833, 249, 781, 223, 677, 625, 411, 599, 666, 573, 458, 365, 620, 787, 834, 808, 436, 250, 423, 782, 371, 678, 626, 465, 319, 720, 574, 366, 707, 413, 681, 668, 460, 655, 789, 603, 836, 252, 239, 466, 373, 440, 628, 427, 414, 615, 682, 816, 709, 803, 790, 897, 605, 374, 793, 689, 481, 840, 468, 736, 663, 455, 429, 710, 377, 684, 632, 898, 351, 805, 619, 247, 606, 713, 435, 794, 690, 482, 430, 378, 472, 806, 667, 459, 900, 714, 621, 848, 835, 809, 437, 796, 251, 692, 484, 783, 679, 627, 380, 721, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 685, 912, 633, 899, 607, 496, 795, 691, 483, 842, 470, 738, 444, 431, 379, 686, 820, 634, 473, 807, 728, 901, 715, 849, 797, 693, 485, 844, 740, 474, 928, 381, 636, 902, 623, 850, 824, 717, 811, 439, 798, 694, 486, 905, 382, 723, 697, 489, 476, 744, 671, 463, 865, 718, 852, 839, 906, 813, 255, 443, 631, 698, 490, 725, 819, 866, 913, 960, 814, 908, 497, 856, 752, 843, 471, 739, 445, 726, 700, 492, 687, 914, 821, 635, 868, 729, 498, 446, 845, 741, 822, 475, 929, 916, 730, 637, 903, 851, 825, 872, 500, 799, 695, 487, 846, 742, 930, 383, 638, 477, 745, 732, 826, 719, 853, 920, 907, 504, 699, 491, 478, 932, 746, 880, 867, 854, 828, 961, 815, 909, 857, 753, 727, 701, 493, 748, 915, 962, 869, 936, 910, 499, 858, 754, 447, 702, 494, 823, 870, 917, 731, 964, 873, 501, 860, 756, 847, 743, 944, 931, 918, 639, 733, 827, 874, 502, 921, 968, 505, 760, 479, 933, 747, 881, 734, 855, 922, 829, 876, 506, 934, 882, 749, 976, 830, 963, 937, 924, 911, 859, 755, 508, 703, 495, 750, 884, 871, 938, 965, 861, 757, 945, 992, 919, 966, 940, 888, 875, 503, 862, 758, 969, 946, 761, 735, 923, 970, 877, 507, 948, 762, 935, 883, 977, 831, 878, 925, 972, 509, 764, 751, 978, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q241_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 45, 272, 259, 514, 51, 98, 145, 192, 46, 140, 88, 261, 75, 516, 146, 53, 100, 288, 262, 77, 54, 265, 161, 520, 148, 135, 83, 57, 104, 31, 78, 266, 162, 58, 85, 152, 139, 273, 528, 320, 515, 268, 164, 112, 99, 86, 60, 193, 47, 274, 141, 89, 517, 147, 194, 101, 168, 289, 142, 276, 90, 544, 263, 518, 55, 102, 521, 149, 196, 290, 384, 105, 92, 79, 280, 176, 267, 163, 522, 150, 59, 292, 106, 153, 200, 529, 321, 576, 269, 165, 524, 113, 87, 154, 61, 108, 275, 530, 322, 296, 270, 166, 114, 208, 62, 195, 169, 156, 143, 277, 91, 545, 532, 324, 519, 116, 103, 170, 304, 197, 291, 278, 546, 385, 93, 640, 281, 177, 536, 328, 224, 523, 151, 198, 172, 120, 386, 293, 107, 94, 548, 201, 282, 178, 577, 525, 294, 155, 388, 202, 109, 336, 531, 323, 297, 578, 284, 552, 180, 271, 167, 526, 115, 209, 63, 110, 157, 204, 298, 533, 325, 392, 580, 768, 210, 117, 184, 171, 305, 158, 560, 352, 279, 547, 534, 326, 300, 641, 118, 537, 329, 225, 584, 212, 306, 199, 173, 400, 121, 387, 95, 642, 549, 283, 179, 538, 330, 226, 174, 308, 122, 295, 216, 550, 389, 203, 337, 644, 592, 579, 285, 553, 181, 540, 332, 228, 527, 416, 124, 390, 111, 338, 312, 205, 299, 286, 554, 182, 393, 581, 648, 769, 211, 185, 232, 159, 561, 353, 206, 340, 608, 535, 327, 394, 301, 582, 556, 770, 119, 186, 585, 213, 307, 562, 354, 401, 656, 448, 302, 643, 396, 344, 240, 539, 331, 772, 227, 586, 214, 188, 175, 402, 309, 123, 564, 356, 217, 551, 645, 593, 541, 333, 229, 588, 310, 417, 776, 404, 218, 125, 672, 391, 339, 646, 313, 594, 568, 360, 287, 555, 183, 542, 334, 230, 649, 418, 126, 233, 220, 314, 207, 341, 408, 609, 596, 395, 583, 650, 557, 784, 771, 187, 420, 234, 368, 563, 355, 342, 610, 316, 657, 449, 303, 704, 558, 397, 345, 652, 241, 600, 773, 587, 215, 189, 236, 403, 658, 565, 450, 357, 424, 612, 398, 346, 800, 242, 774, 190, 589, 311, 566, 358, 777, 405, 219, 673, 660, 452, 647, 595, 569, 361, 348, 616, 244, 543, 335, 231, 590, 432, 419, 778, 406, 127, 674, 221, 315, 570, 362, 409, 597, 664, 456, 651, 785, 832, 248, 421, 780, 235, 369, 222, 676, 624, 343, 410, 611, 317, 598, 572, 364, 705, 559, 786, 653, 601, 422, 370, 237, 464, 318, 659, 451, 425, 706, 412, 613, 680, 399, 347, 801, 654, 788, 243, 602, 775, 191, 238, 372, 567, 359, 426, 614, 661, 453, 708, 802, 349, 896, 617, 245, 604, 591, 433, 792, 688, 480, 779, 407, 675, 662, 454, 428, 376, 571, 363, 350, 804, 618, 246, 665, 457, 712, 434, 833, 249, 781, 223, 677, 625, 411, 599, 666, 573, 458, 365, 620, 787, 834, 808, 436, 250, 423, 782, 371, 678, 626, 465, 319, 720, 574, 366, 707, 413, 681, 668, 460, 655, 789, 603, 836, 252, 239, 466, 373, 440, 628, 427, 414, 615, 682, 816, 709, 803, 790, 897, 605, 374, 793, 689, 481, 840, 468, 736, 663, 455, 429, 710, 377, 684, 632, 351, 898, 805, 619, 247, 606, 713, 435, 794, 690, 482, 430, 378, 472, 806, 667, 459, 900, 714, 621, 848, 835, 809, 437, 796, 251, 692, 484, 783, 679, 627, 380, 721, 575, 367, 622, 669, 461, 716, 810, 438, 837, 904, 253, 467, 441, 722, 629, 696, 488, 415, 683, 817, 670, 462, 864, 791, 838, 812, 254, 375, 442, 630, 841, 469, 737, 724, 818, 711, 685, 912, 633, 899, 607, 496, 795, 691, 483, 842, 470, 738, 444, 431, 379, 686, 820, 634, 473, 807, 728, 901, 715, 849, 797, 693, 485, 844, 740, 474, 381, 928, 636, 902, 623, 850, 824, 717, 811, 439, 798, 694, 486, 905, 382, 723, 697, 489, 476, 744, 671, 463, 865, 718, 852, 839, 906, 813, 255, 443, 631, 698, 490, 725, 819, 866, 913, 960, 814, 908, 497, 856, 752, 843, 471, 739, 445, 726, 700, 492, 687, 914, 821, 635, 868, 729, 498, 446, 845, 741, 822, 475, 929, 916, 730, 637, 903, 851, 825, 872, 500, 799, 695, 487, 846, 742, 383, 930, 638, 477, 745, 732, 826, 719, 853, 920, 907, 504, 699, 491, 478, 932, 746, 880, 867, 854, 828, 961, 815, 909, 857, 753, 727, 701, 493, 748, 915, 962, 869, 936, 910, 499, 858, 754, 447, 702, 494, 823, 870, 917, 731, 964, 873, 501, 860, 756, 847, 743, 944, 931, 918, 639, 733, 827, 874, 502, 921, 968, 505, 760, 479, 933, 747, 881, 734, 855, 922, 829, 876, 506, 934, 882, 749, 976, 830, 963, 937, 924, 911, 859, 755, 508, 703, 495, 750, 884, 871, 938, 965, 861, 757, 945, 992, 919, 966, 940, 888, 875, 503, 862, 758, 969, 946, 761, 735, 923, 970, 877, 507, 948, 762, 935, 883, 977, 831, 878, 925, 972, 509, 764, 751, 978, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q242_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 45, 272, 259, 514, 51, 98, 145, 192, 46, 140, 88, 261, 75, 516, 146, 53, 100, 288, 262, 77, 54, 265, 161, 520, 148, 135, 83, 57, 104, 31, 78, 266, 162, 58, 85, 152, 139, 273, 528, 320, 515, 268, 164, 112, 99, 86, 60, 193, 47, 274, 141, 89, 517, 147, 194, 101, 168, 142, 289, 276, 90, 544, 263, 518, 55, 102, 521, 149, 196, 290, 384, 105, 92, 79, 280, 176, 267, 163, 522, 150, 59, 292, 106, 153, 200, 529, 321, 576, 269, 165, 524, 113, 87, 154, 61, 108, 275, 530, 322, 296, 270, 166, 114, 208, 62, 195, 169, 156, 143, 277, 91, 545, 532, 324, 519, 116, 103, 170, 304, 197, 291, 278, 546, 385, 93, 640, 281, 177, 536, 328, 224, 523, 151, 198, 172, 120, 386, 293, 107, 94, 548, 201, 282, 178, 577, 525, 294, 155, 388, 202, 109, 336, 531, 323, 297, 284, 578, 552, 180, 271, 167, 526, 115, 209, 63, 110, 157, 204, 298, 533, 325, 392, 580, 768, 210, 117, 184, 171, 158, 305, 560, 352, 279, 547, 534, 326, 300, 641, 118, 537, 329, 225, 584, 212, 306, 199, 173, 400, 121, 387, 95, 642, 549, 283, 179, 538, 330, 226, 174, 308, 122, 295, 216, 550, 389, 203, 337, 644, 592, 285, 579, 553, 181, 540, 332, 228, 527, 416, 124, 390, 111, 338, 312, 205, 299, 286, 554, 182, 393, 581, 648, 769, 211, 185, 232, 159, 561, 206, 353, 340, 608, 535, 327, 394, 301, 582, 556, 770, 119, 186, 585, 213, 307, 562, 354, 401, 656, 448, 302, 643, 396, 344, 240, 539, 331, 227, 772, 586, 214, 188, 175, 402, 309, 123, 564, 356, 217, 551, 645, 593, 541, 333, 229, 588, 310, 417, 776, 404, 218, 125, 672, 391, 339, 646, 313, 594, 568, 360, 287, 555, 183, 542, 334, 230, 649, 418, 126, 233, 220, 314, 207, 341, 408, 609, 596, 395, 583, 650, 557, 784, 771, 187, 420, 234, 368, 563, 355, 342, 316, 610, 657, 449, 303, 704, 558, 397, 345, 652, 241, 600, 773, 587, 215, 189, 236, 403, 658, 565, 450, 357, 424, 612, 398, 346, 800, 242, 774, 190, 589, 311, 566, 358, 777, 405, 219, 673, 660, 452, 647, 595, 569, 361, 348, 616, 244, 543, 335, 231, 590, 432, 419, 778, 406, 127, 674, 221, 315, 570, 362, 409, 597, 664, 456, 651, 785, 832, 248, 421, 235, 780, 222, 369, 676, 624, 343, 410, 317, 611, 598, 572, 364, 705, 559, 786, 653, 601, 422, 370, 237, 464, 318, 659, 451, 425, 412, 706, 613, 680, 399, 347, 654, 801, 243, 788, 602, 775, 191, 238, 372, 567, 359, 426, 614, 661, 453, 708, 802, 349, 896, 617, 245, 604, 591, 433, 792, 688, 480, 779, 407, 675, 662, 454, 428, 376, 571, 363, 350, 804, 618, 246, 665, 457, 712, 434, 833, 249, 781, 223, 677, 625, 411, 599, 666, 573, 458, 365, 620, 787, 834, 808, 436, 250, 423, 782, 371, 678, 626, 465, 319, 720, 574, 366, 413, 707, 681, 668, 460, 655, 789, 603, 836, 252, 239, 466, 373, 440, 628, 427, 414, 615, 682, 816, 709, 803, 790, 897, 605, 374, 793, 689, 481, 840, 468, 736, 663, 455, 429, 710, 377, 684, 632, 351, 898, 805, 619, 247, 606, 713, 435, 794, 690, 482, 430, 378, 472, 806, 667, 459, 900, 714, 621, 848, 835, 809, 437, 251, 796, 692, 484, 783, 679, 627, 380, 721, 575, 367, 622, 669, 461, 716, 810, 438, 837, 904, 253, 467, 441, 722, 629, 696, 488, 415, 683, 670, 817, 462, 864, 791, 838, 812, 254, 375, 442, 630, 841, 469, 737, 724, 818, 711, 685, 912, 633, 899, 607, 496, 795, 691, 483, 842, 470, 444, 738, 431, 379, 686, 820, 634, 473, 807, 728, 901, 715, 849, 797, 693, 485, 844, 740, 474, 381, 928, 636, 902, 623, 850, 824, 717, 811, 439, 798, 694, 486, 905, 382, 723, 697, 489, 476, 744, 671, 463, 718, 865, 852, 839, 906, 813, 255, 443, 631, 698, 490, 725, 819, 866, 913, 960, 814, 908, 497, 856, 752, 843, 471, 445, 739, 726, 700, 492, 687, 914, 821, 635, 868, 729, 498, 446, 845, 741, 822, 475, 929, 916, 730, 637, 903, 851, 825, 872, 500, 799, 695, 487, 846, 742, 383, 930, 638, 477, 745, 732, 826, 719, 853, 920, 907, 504, 699, 491, 478, 932, 746, 880, 867, 854, 828, 961, 815, 909, 857, 753, 727, 701, 493, 748, 915, 962, 869, 936, 910, 499, 858, 754, 447, 702, 494, 823, 870, 917, 731, 964, 873, 501, 860, 756, 847, 743, 944, 931, 918, 639, 733, 827, 874, 502, 921, 968, 505, 760, 479, 933, 747, 734, 881, 855, 922, 829, 876, 506, 934, 882, 749, 976, 830, 963, 937, 924, 911, 859, 755, 508, 703, 495, 750, 884, 871, 938, 965, 861, 757, 945, 992, 919, 966, 940, 888, 875, 503, 862, 758, 969, 946, 761, 735, 923, 970, 877, 507, 948, 762, 935, 883, 977, 831, 878, 925, 972, 509, 764, 751, 978, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q243_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 130, 37, 26, 38, 132, 80, 67, 41, 28, 15, 42, 69, 136, 257, 512, 49, 96, 23, 70, 44, 258, 73, 50, 144, 131, 27, 260, 74, 52, 39, 133, 81, 29, 76, 264, 160, 134, 82, 56, 43, 30, 137, 513, 97, 84, 71, 138, 45, 272, 259, 514, 51, 98, 145, 192, 46, 140, 88, 261, 75, 516, 146, 53, 100, 288, 262, 77, 54, 265, 161, 520, 148, 135, 83, 57, 104, 31, 78, 266, 162, 58, 85, 152, 139, 273, 528, 320, 515, 268, 164, 112, 99, 86, 60, 193, 47, 274, 141, 89, 517, 147, 194, 101, 168, 142, 289, 276, 90, 544, 263, 518, 55, 102, 521, 149, 196, 290, 384, 105, 92, 79, 280, 176, 267, 163, 522, 150, 59, 292, 106, 153, 200, 529, 321, 576, 269, 165, 524, 113, 87, 154, 61, 108, 275, 530, 322, 296, 270, 166, 114, 208, 62, 195, 169, 156, 143, 277, 91, 545, 532, 324, 519, 116, 103, 170, 304, 197, 291, 278, 546, 385, 93, 640, 281, 177, 536, 328, 224, 523, 151, 198, 172, 120, 386, 293, 107, 94, 548, 201, 282, 178, 577, 525, 294, 155, 388, 202, 109, 336, 531, 323, 297, 284, 578, 552, 180, 271, 167, 526, 115, 209, 63, 110, 157, 204, 298, 533, 325, 392, 580, 768, 210, 117, 184, 171, 158, 305, 560, 352, 279, 547, 534, 326, 300, 641, 118, 537, 329, 225, 584, 212, 306, 199, 173, 400, 121, 387, 95, 642, 549, 283, 179, 538, 330, 226, 174, 308, 122, 295, 216, 550, 389, 203, 337, 644, 592, 285, 579, 553, 181, 540, 332, 228, 527, 416, 124, 390, 111, 338, 312, 205, 299, 286, 554, 182, 393, 581, 648, 769, 211, 185, 232, 159, 561, 206, 353, 340, 608, 535, 327, 394, 301, 582, 556, 770, 119, 186, 585, 213, 307, 562, 354, 401, 656, 448, 302, 643, 396, 344, 240, 539, 331, 227, 772, 586, 214, 188, 175, 402, 309, 123, 564, 356, 217, 551, 645, 593, 541, 333, 229, 588, 310, 417, 776, 404, 218, 125, 672, 391, 339, 313, 646, 594, 568, 360, 287, 555, 183, 542, 334, 230, 649, 418, 126, 233, 220, 314, 207, 341, 408, 609, 596, 395, 583, 650, 557, 784, 771, 187, 420, 234, 368, 563, 355, 342, 316, 610, 657, 449, 303, 704, 558, 397, 345, 652, 241, 600, 773, 587, 215, 189, 236, 403, 658, 565, 450, 357, 424, 612, 398, 346, 800, 242, 774, 190, 589, 311, 566, 358, 777, 405, 219, 673, 660, 452, 647, 595, 569, 361, 348, 616, 244, 543, 335, 231, 590, 432, 419, 778, 406, 127, 674, 221, 315, 570, 362, 409, 597, 664, 456, 651, 785, 832, 248, 421, 235, 780, 222, 369, 676, 624, 343, 410, 317, 611, 598, 572, 364, 705, 559, 786, 653, 601, 422, 370, 237, 464, 318, 659, 451, 425, 412, 706, 613, 680, 399, 347, 654, 801, 243, 788, 602, 775, 191, 238, 372, 567, 359, 426, 614, 661, 453, 708, 802, 349, 896, 617, 245, 604, 591, 433, 792, 688, 480, 779, 407, 675, 662, 454, 428, 376, 571, 363, 350, 804, 618, 246, 665, 457, 712, 434, 833, 249, 781, 223, 677, 625, 411, 599, 666, 573, 458, 365, 620, 787, 834, 808, 436, 250, 423, 782, 371, 678, 626, 465, 319, 720, 574, 366, 413, 707, 681, 668, 460, 655, 789, 603, 836, 252, 239, 466, 373, 440, 628, 427, 414, 615, 682, 816, 709, 803, 790, 897, 605, 374, 793, 689, 481, 840, 468, 736, 663, 455, 429, 377, 710, 684, 632, 351, 898, 805, 619, 247, 606, 713, 435, 794, 690, 482, 430, 378, 472, 806, 667, 459, 900, 714, 621, 848, 835, 809, 437, 251, 796, 692, 484, 783, 679, 627, 380, 721, 575, 367, 622, 669, 461, 716, 810, 438, 837, 904, 253, 467, 441, 722, 629, 696, 488, 415, 683, 670, 817, 462, 864, 791, 838, 812, 254, 375, 442, 630, 841, 469, 737, 724, 818, 711, 685, 912, 633, 899, 607, 496, 795, 691, 483, 842, 470, 444, 738, 431, 379, 686, 820, 634, 473, 807, 728, 901, 715, 849, 797, 693, 485, 844, 740, 474, 381, 928, 636, 902, 623, 850, 824, 717, 811, 439, 798, 694, 486, 905, 382, 723, 697, 489, 476, 744, 671, 463, 718, 865, 852, 839, 906, 813, 255, 443, 631, 698, 490, 725, 819, 866, 913, 960, 814, 908, 497, 856, 752, 843, 471, 445, 739, 726, 700, 492, 687, 914, 821, 635, 868, 729, 498, 446, 845, 741, 822, 475, 929, 916, 730, 637, 903, 851, 825, 872, 500, 799, 695, 487, 846, 742, 383, 930, 638, 477, 745, 732, 826, 719, 853, 920, 907, 504, 699, 491, 478, 932, 746, 880, 867, 854, 828, 961, 815, 909, 857, 753, 727, 701, 493, 748, 915, 962, 869, 936, 910, 499, 858, 754, 447, 702, 494, 823, 870, 917, 731, 964, 873, 501, 860, 756, 847, 743, 944, 931, 918, 639, 733, 827, 874, 502, 921, 968, 505, 760, 479, 933, 747, 734, 881, 855, 922, 829, 876, 506, 934, 882, 749, 976, 830, 963, 937, 924, 911, 859, 755, 508, 703, 495, 750, 884, 871, 938, 965, 861, 757, 945, 992, 919, 966, 940, 888, 875, 503, 862, 758, 969, 946, 761, 735, 923, 970, 877, 507, 948, 762, 935, 883, 977, 831, 878, 925, 972, 509, 764, 751, 978, 885, 952, 939, 926, 510, 886, 993, 980, 967, 941, 889, 863, 759, 947, 994, 942, 890, 984, 971, 949, 763, 996, 892, 879, 973, 950, 765, 979, 953, 1000, 927, 974, 511, 766, 887, 954, 981, 1008, 995, 982, 956, 943, 891, 985, 997, 986, 893, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q244_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 96, 23, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 192, 46, 140, 88, 75, 261, 516, 53, 146, 100, 288, 262, 77, 54, 265, 161, 148, 520, 135, 83, 57, 104, 31, 78, 266, 162, 58, 85, 152, 139, 273, 528, 320, 515, 268, 164, 112, 99, 86, 60, 193, 47, 274, 141, 89, 517, 147, 101, 194, 168, 142, 289, 90, 276, 544, 263, 518, 55, 102, 149, 521, 196, 290, 105, 384, 92, 79, 280, 176, 267, 163, 150, 522, 59, 106, 292, 153, 200, 529, 321, 576, 269, 165, 524, 113, 87, 61, 154, 108, 275, 530, 322, 296, 270, 166, 114, 208, 62, 195, 169, 156, 143, 91, 277, 545, 532, 324, 519, 116, 103, 170, 304, 197, 291, 278, 546, 385, 93, 640, 281, 177, 536, 328, 224, 151, 523, 198, 172, 120, 107, 293, 386, 94, 548, 201, 282, 178, 577, 525, 294, 155, 109, 202, 388, 336, 531, 323, 297, 284, 578, 180, 552, 271, 167, 526, 115, 209, 63, 110, 157, 204, 298, 533, 325, 392, 580, 117, 210, 768, 184, 171, 158, 305, 560, 352, 279, 547, 534, 326, 300, 641, 118, 537, 329, 225, 212, 584, 306, 199, 173, 121, 400, 387, 95, 549, 642, 283, 179, 538, 330, 226, 174, 122, 308, 295, 216, 550, 203, 389, 337, 644, 592, 285, 579, 181, 553, 540, 332, 228, 527, 416, 124, 111, 390, 338, 312, 205, 299, 286, 182, 554, 393, 581, 648, 211, 769, 185, 232, 159, 561, 206, 353, 340, 608, 535, 327, 301, 394, 582, 556, 119, 770, 186, 213, 585, 307, 562, 354, 401, 656, 448, 302, 643, 396, 344, 240, 539, 331, 227, 214, 586, 772, 188, 175, 123, 309, 402, 564, 356, 217, 551, 645, 593, 541, 333, 229, 588, 310, 417, 125, 218, 404, 776, 672, 391, 339, 313, 646, 594, 568, 360, 287, 183, 555, 542, 334, 230, 649, 418, 126, 233, 220, 314, 207, 341, 408, 609, 596, 395, 583, 557, 650, 784, 771, 187, 234, 420, 368, 563, 355, 342, 316, 610, 657, 449, 303, 704, 558, 397, 345, 652, 241, 600, 215, 587, 773, 189, 236, 403, 565, 658, 357, 450, 424, 612, 398, 346, 242, 800, 774, 190, 589, 311, 566, 358, 219, 405, 777, 673, 660, 452, 647, 595, 569, 361, 348, 244, 616, 543, 335, 231, 590, 432, 419, 127, 406, 778, 674, 221, 315, 570, 362, 409, 597, 664, 456, 651, 785, 832, 248, 235, 421, 222, 780, 369, 676, 624, 343, 317, 410, 611, 598, 572, 364, 705, 559, 786, 653, 601, 422, 370, 237, 464, 318, 659, 451, 425, 412, 613, 706, 680, 399, 347, 654, 243, 801, 602, 788, 775, 191, 238, 372, 567, 359, 426, 614, 661, 453, 708, 802, 349, 245, 617, 896, 604, 591, 433, 792, 688, 480, 407, 779, 675, 662, 454, 428, 376, 571, 363, 350, 246, 618, 804, 665, 457, 712, 434, 833, 249, 223, 781, 677, 625, 411, 599, 573, 666, 365, 458, 620, 787, 834, 250, 436, 808, 423, 782, 371, 678, 626, 465, 319, 720, 574, 366, 413, 707, 681, 668, 460, 655, 603, 789, 836, 252, 239, 373, 466, 440, 628, 427, 414, 615, 682, 816, 709, 803, 790, 897, 605, 374, 793, 689, 481, 468, 840, 736, 663, 455, 429, 377, 710, 684, 632, 351, 247, 619, 805, 898, 606, 713, 435, 794, 690, 482, 430, 378, 472, 806, 667, 459, 621, 714, 900, 848, 835, 251, 437, 809, 796, 692, 484, 783, 679, 627, 380, 721, 575, 367, 622, 669, 461, 716, 438, 810, 837, 253, 904, 467, 441, 629, 722, 696, 488, 415, 683, 670, 817, 462, 864, 791, 838, 254, 812, 375, 442, 630, 469, 841, 737, 724, 818, 711, 685, 633, 912, 899, 607, 496, 795, 691, 483, 470, 842, 444, 738, 431, 379, 686, 634, 820, 473, 807, 728, 715, 901, 849, 797, 693, 485, 844, 740, 381, 474, 928, 636, 623, 902, 850, 824, 717, 439, 811, 798, 694, 486, 905, 382, 723, 697, 489, 476, 744, 671, 463, 718, 865, 852, 839, 255, 813, 906, 443, 631, 698, 490, 725, 819, 866, 913, 960, 814, 908, 497, 856, 752, 471, 843, 445, 739, 726, 700, 492, 687, 635, 821, 914, 868, 729, 498, 446, 845, 741, 822, 475, 929, 637, 730, 916, 903, 851, 825, 500, 872, 799, 695, 487, 846, 742, 383, 930, 638, 477, 745, 732, 826, 719, 853, 920, 907, 504, 699, 491, 478, 746, 932, 880, 867, 854, 828, 961, 815, 909, 857, 753, 727, 701, 493, 748, 915, 869, 962, 936, 910, 499, 858, 754, 447, 702, 494, 823, 870, 731, 917, 964, 501, 873, 860, 756, 847, 743, 944, 931, 639, 918, 733, 827, 502, 874, 921, 968, 505, 760, 479, 747, 933, 734, 881, 855, 829, 922, 876, 506, 934, 882, 749, 976, 830, 963, 937, 924, 911, 859, 755, 508, 703, 495, 750, 884, 871, 938, 965, 861, 757, 945, 992, 919, 966, 940, 888, 503, 875, 862, 758, 969, 946, 761, 735, 923, 877, 970, 507, 762, 948, 935, 883, 977, 831, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 1000, 927, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q245_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 96, 23, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 192, 46, 140, 88, 75, 261, 516, 53, 146, 100, 288, 262, 77, 54, 265, 161, 148, 520, 135, 83, 57, 104, 31, 78, 266, 162, 58, 85, 152, 139, 273, 528, 320, 515, 268, 164, 112, 99, 86, 60, 193, 47, 274, 141, 89, 517, 147, 101, 194, 168, 142, 289, 90, 276, 544, 263, 518, 55, 102, 149, 521, 196, 290, 105, 384, 92, 79, 280, 176, 267, 163, 150, 522, 59, 106, 292, 153, 200, 529, 321, 576, 269, 165, 113, 524, 87, 61, 154, 108, 275, 530, 322, 296, 270, 166, 114, 208, 62, 195, 169, 156, 143, 91, 277, 545, 532, 324, 519, 116, 103, 170, 304, 197, 291, 278, 546, 385, 93, 640, 281, 177, 536, 328, 224, 151, 523, 198, 172, 120, 107, 293, 386, 94, 548, 201, 282, 178, 577, 525, 294, 155, 109, 202, 388, 336, 531, 323, 297, 284, 578, 180, 552, 271, 167, 115, 526, 209, 63, 110, 157, 204, 298, 533, 325, 392, 580, 117, 210, 768, 184, 171, 158, 305, 560, 352, 279, 547, 534, 326, 300, 641, 118, 537, 329, 225, 212, 584, 306, 199, 173, 121, 400, 387, 95, 549, 642, 283, 179, 538, 330, 226, 174, 122, 308, 295, 216, 550, 203, 389, 337, 644, 592, 285, 579, 181, 553, 540, 332, 228, 527, 416, 124, 111, 390, 338, 312, 205, 299, 286, 182, 554, 393, 581, 648, 211, 769, 185, 232, 159, 561, 206, 353, 340, 608, 535, 327, 301, 394, 582, 556, 119, 770, 186, 213, 585, 307, 562, 354, 401, 656, 448, 302, 643, 396, 344, 240, 539, 331, 227, 214, 586, 772, 188, 175, 123, 309, 402, 564, 356, 217, 551, 645, 593, 541, 333, 229, 588, 310, 417, 125, 218, 404, 776, 672, 391, 339, 313, 646, 594, 568, 360, 287, 183, 555, 542, 334, 230, 649, 418, 126, 233, 220, 314, 207, 341, 408, 609, 596, 395, 583, 557, 650, 784, 771, 187, 234, 420, 368, 563, 355, 342, 316, 610, 657, 449, 303, 704, 558, 397, 345, 241, 652, 600, 215, 587, 773, 189, 236, 403, 565, 658, 357, 450, 424, 612, 398, 346, 242, 800, 774, 190, 589, 311, 566, 358, 219, 405, 777, 673, 660, 452, 647, 595, 569, 361, 348, 244, 616, 543, 335, 231, 590, 432, 419, 127, 406, 778, 674, 221, 315, 570, 362, 409, 597, 664, 456, 651, 785, 832, 248, 235, 421, 222, 369, 780, 676, 624, 343, 317, 410, 611, 598, 572, 364, 705, 559, 786, 653, 601, 422, 370, 237, 464, 318, 659, 451, 425, 412, 613, 706, 680, 399, 347, 243, 654, 801, 602, 788, 775, 191, 238, 372, 567, 359, 426, 614, 661, 453, 708, 802, 349, 245, 617, 896, 604, 591, 433, 792, 688, 480, 407, 779, 675, 662, 454, 428, 376, 571, 363, 350, 246, 618, 804, 665, 457, 712, 434, 833, 249, 223, 781, 677, 625, 411, 599, 573, 666, 365, 458, 620, 787, 834, 250, 436, 808, 423, 371, 782, 678, 626, 465, 319, 720, 574, 366, 413, 707, 681, 668, 460, 655, 603, 789, 836, 252, 239, 373, 466, 440, 628, 427, 414, 615, 682, 816, 709, 803, 790, 897, 605, 374, 793, 689, 481, 468, 840, 736, 663, 455, 429, 377, 710, 684, 632, 351, 247, 619, 805, 898, 606, 713, 435, 794, 690, 482, 430, 378, 472, 806, 667, 459, 621, 714, 900, 848, 835, 251, 437, 809, 796, 692, 484, 783, 679, 627, 380, 721, 575, 367, 622, 669, 461, 716, 438, 810, 837, 253, 904, 467, 441, 629, 722, 696, 488, 415, 683, 670, 817, 462, 864, 791, 838, 254, 812, 375, 442, 630, 469, 841, 737, 724, 818, 711, 685, 633, 912, 899, 607, 496, 795, 691, 483, 470, 842, 444, 738, 431, 379, 686, 634, 820, 473, 807, 728, 715, 901, 849, 797, 693, 485, 844, 740, 381, 474, 928, 636, 623, 902, 850, 824, 717, 439, 811, 798, 694, 486, 905, 382, 723, 697, 489, 476, 744, 671, 463, 718, 865, 852, 839, 255, 813, 906, 443, 631, 698, 490, 725, 819, 866, 913, 960, 814, 497, 908, 856, 752, 471, 843, 445, 739, 726, 700, 492, 687, 635, 821, 914, 868, 729, 498, 446, 845, 741, 822, 475, 929, 637, 730, 916, 903, 851, 825, 500, 872, 799, 695, 487, 846, 742, 383, 930, 638, 477, 745, 732, 826, 719, 853, 920, 907, 504, 699, 491, 478, 746, 932, 880, 867, 854, 828, 961, 815, 909, 857, 753, 727, 701, 493, 748, 915, 869, 962, 936, 499, 910, 858, 754, 447, 702, 494, 823, 870, 731, 917, 964, 501, 873, 860, 756, 847, 743, 944, 931, 639, 918, 733, 827, 502, 874, 921, 968, 505, 760, 479, 747, 933, 734, 881, 855, 829, 922, 876, 506, 934, 882, 749, 976, 830, 963, 937, 924, 911, 859, 755, 508, 703, 495, 750, 884, 871, 938, 965, 861, 757, 945, 992, 919, 966, 940, 888, 503, 875, 862, 758, 969, 946, 761, 735, 923, 877, 970, 507, 762, 948, 935, 883, 977, 831, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 1000, 927, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q246_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 289, 90, 276, 544, 263, 518, 55, 102, 149, 521, 196, 290, 105, 92, 384, 79, 280, 176, 267, 163, 150, 522, 59, 106, 292, 153, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 328, 151, 224, 523, 198, 172, 120, 107, 293, 94, 386, 548, 201, 282, 178, 577, 525, 294, 155, 109, 202, 388, 336, 531, 323, 297, 284, 578, 180, 552, 271, 167, 115, 526, 63, 209, 110, 157, 204, 298, 533, 325, 392, 580, 117, 210, 184, 768, 171, 158, 305, 560, 279, 352, 547, 534, 326, 300, 641, 118, 537, 329, 225, 212, 584, 306, 199, 173, 121, 400, 95, 387, 549, 642, 283, 179, 538, 330, 226, 174, 122, 308, 295, 216, 550, 203, 389, 337, 644, 592, 285, 579, 181, 553, 540, 332, 228, 527, 124, 416, 111, 390, 338, 312, 205, 299, 286, 182, 554, 393, 581, 648, 211, 185, 769, 159, 232, 561, 206, 353, 340, 535, 608, 327, 301, 394, 582, 556, 119, 186, 770, 213, 585, 307, 562, 354, 401, 656, 302, 448, 643, 396, 344, 240, 539, 331, 227, 214, 586, 188, 772, 175, 123, 309, 402, 564, 356, 217, 551, 645, 593, 541, 333, 229, 588, 310, 125, 417, 218, 404, 776, 672, 391, 339, 313, 646, 594, 568, 287, 360, 183, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 657, 303, 449, 558, 704, 397, 345, 241, 652, 600, 215, 587, 189, 773, 236, 403, 565, 658, 357, 450, 424, 612, 398, 346, 242, 800, 190, 774, 589, 311, 566, 358, 219, 405, 777, 673, 660, 452, 647, 595, 569, 361, 348, 244, 543, 616, 335, 231, 590, 432, 127, 419, 406, 778, 674, 221, 315, 570, 362, 409, 597, 664, 456, 651, 785, 248, 832, 235, 421, 222, 369, 780, 676, 624, 343, 317, 410, 611, 598, 572, 364, 559, 705, 786, 653, 601, 422, 370, 237, 318, 464, 659, 451, 425, 412, 613, 706, 680, 399, 347, 243, 654, 801, 602, 788, 191, 775, 238, 372, 567, 359, 426, 614, 661, 453, 708, 802, 349, 245, 617, 604, 896, 591, 433, 792, 688, 407, 480, 779, 675, 662, 454, 428, 376, 571, 363, 350, 246, 618, 804, 665, 457, 712, 434, 249, 833, 223, 781, 677, 625, 411, 599, 573, 666, 365, 458, 620, 787, 250, 834, 436, 808, 423, 371, 782, 678, 626, 319, 465, 574, 720, 366, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 840, 663, 736, 455, 429, 377, 710, 684, 632, 351, 247, 619, 805, 606, 898, 713, 435, 794, 690, 482, 430, 378, 472, 806, 667, 459, 621, 714, 900, 848, 251, 835, 437, 809, 796, 692, 484, 783, 679, 627, 380, 575, 721, 367, 622, 669, 461, 716, 438, 810, 253, 837, 904, 467, 441, 629, 722, 696, 415, 488, 683, 670, 817, 462, 791, 864, 254, 838, 812, 375, 442, 630, 469, 841, 737, 724, 818, 711, 685, 633, 912, 607, 899, 496, 795, 691, 483, 470, 842, 444, 738, 431, 379, 686, 634, 820, 473, 807, 728, 715, 901, 849, 797, 693, 485, 844, 740, 381, 474, 636, 928, 623, 902, 850, 824, 717, 439, 811, 798, 694, 486, 905, 382, 723, 697, 489, 476, 671, 744, 463, 718, 865, 852, 255, 839, 813, 906, 443, 631, 698, 490, 725, 819, 866, 913, 814, 960, 497, 908, 856, 752, 471, 843, 445, 739, 726, 700, 492, 687, 635, 821, 914, 868, 729, 498, 446, 845, 741, 822, 475, 637, 929, 730, 916, 903, 851, 825, 500, 799, 872, 695, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 870, 731, 917, 964, 501, 873, 860, 756, 847, 743, 944, 639, 931, 918, 733, 827, 502, 874, 921, 968, 505, 760, 479, 747, 933, 734, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q247_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 544, 263, 518, 55, 102, 149, 521, 196, 290, 105, 92, 384, 79, 280, 176, 267, 163, 150, 522, 59, 106, 292, 153, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 328, 151, 224, 523, 198, 172, 120, 107, 94, 293, 386, 548, 201, 282, 178, 577, 525, 294, 155, 109, 202, 388, 336, 531, 323, 297, 284, 180, 578, 552, 271, 167, 115, 526, 63, 209, 110, 157, 204, 298, 533, 325, 392, 580, 117, 210, 184, 768, 171, 158, 305, 560, 279, 352, 547, 534, 326, 300, 641, 118, 537, 329, 225, 212, 584, 306, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 561, 206, 353, 340, 535, 608, 327, 301, 394, 582, 556, 119, 186, 770, 213, 585, 307, 562, 354, 401, 656, 302, 448, 643, 396, 344, 240, 539, 331, 227, 214, 188, 586, 772, 175, 123, 309, 402, 564, 356, 217, 551, 645, 593, 541, 333, 229, 588, 310, 125, 218, 417, 404, 776, 672, 391, 339, 313, 646, 594, 568, 287, 360, 183, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 657, 303, 449, 558, 704, 397, 345, 241, 652, 600, 215, 189, 587, 773, 236, 403, 565, 658, 357, 450, 424, 612, 398, 346, 242, 800, 190, 774, 589, 311, 566, 358, 219, 405, 777, 673, 660, 452, 647, 595, 569, 361, 348, 244, 543, 616, 335, 231, 590, 432, 127, 419, 406, 778, 674, 221, 315, 570, 362, 409, 597, 664, 456, 651, 785, 248, 832, 235, 222, 421, 369, 780, 676, 624, 343, 317, 410, 611, 598, 572, 364, 559, 705, 786, 653, 601, 422, 370, 237, 318, 464, 659, 451, 425, 412, 613, 706, 680, 399, 347, 243, 654, 602, 801, 788, 191, 775, 238, 372, 567, 359, 426, 614, 661, 453, 708, 802, 349, 245, 617, 604, 896, 591, 433, 792, 688, 407, 480, 779, 675, 662, 454, 428, 376, 571, 363, 350, 246, 618, 804, 665, 457, 712, 434, 249, 833, 223, 781, 677, 625, 411, 599, 573, 666, 365, 458, 620, 787, 250, 436, 834, 808, 423, 371, 782, 678, 626, 319, 465, 574, 720, 366, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 840, 663, 736, 455, 429, 377, 710, 684, 632, 351, 247, 619, 606, 805, 898, 713, 435, 794, 690, 482, 430, 378, 472, 806, 667, 459, 621, 714, 900, 848, 251, 437, 835, 809, 796, 692, 484, 783, 679, 627, 380, 575, 721, 367, 622, 669, 461, 716, 438, 810, 253, 837, 904, 467, 441, 629, 722, 696, 415, 488, 683, 670, 817, 462, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 717, 439, 811, 798, 694, 486, 905, 382, 723, 697, 489, 476, 671, 744, 463, 718, 865, 852, 255, 839, 813, 906, 443, 631, 698, 490, 725, 819, 866, 913, 814, 960, 497, 908, 856, 752, 471, 445, 843, 739, 726, 700, 492, 687, 635, 821, 914, 868, 729, 498, 446, 845, 741, 822, 475, 637, 730, 929, 916, 903, 851, 825, 500, 799, 872, 695, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 870, 731, 917, 964, 501, 873, 860, 756, 847, 743, 944, 639, 931, 918, 733, 827, 502, 874, 921, 968, 505, 760, 479, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q248_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 544, 263, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 328, 151, 224, 523, 198, 172, 120, 107, 94, 293, 386, 548, 201, 282, 178, 577, 525, 155, 294, 109, 202, 388, 336, 531, 323, 297, 284, 180, 578, 552, 271, 167, 115, 526, 63, 209, 110, 157, 204, 298, 533, 325, 392, 580, 117, 210, 184, 768, 171, 158, 305, 560, 279, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 561, 206, 353, 340, 535, 608, 327, 301, 394, 582, 556, 119, 186, 770, 213, 307, 585, 562, 354, 401, 656, 302, 448, 643, 396, 344, 240, 539, 331, 227, 214, 188, 586, 772, 175, 123, 309, 402, 564, 217, 356, 551, 645, 593, 541, 333, 229, 310, 588, 125, 218, 417, 404, 776, 672, 391, 339, 313, 646, 594, 568, 287, 360, 183, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 657, 303, 449, 558, 704, 397, 345, 241, 652, 600, 215, 189, 587, 773, 236, 403, 565, 658, 357, 450, 424, 612, 398, 346, 242, 800, 190, 774, 311, 589, 566, 219, 358, 405, 777, 673, 660, 452, 647, 595, 569, 361, 348, 244, 543, 616, 335, 231, 590, 432, 127, 419, 406, 778, 674, 221, 315, 570, 362, 409, 597, 664, 456, 651, 785, 248, 832, 235, 222, 421, 369, 780, 676, 624, 343, 317, 410, 611, 598, 572, 364, 559, 705, 786, 653, 601, 422, 370, 237, 318, 464, 659, 451, 425, 412, 613, 706, 680, 399, 347, 243, 654, 602, 801, 788, 191, 775, 238, 372, 567, 359, 426, 614, 661, 453, 708, 802, 349, 245, 617, 604, 896, 591, 433, 792, 688, 407, 480, 779, 675, 662, 454, 428, 376, 571, 363, 350, 246, 618, 665, 804, 457, 434, 712, 249, 833, 223, 781, 677, 625, 411, 599, 573, 666, 365, 458, 620, 787, 250, 436, 834, 808, 423, 371, 782, 678, 626, 319, 465, 574, 720, 366, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 840, 663, 736, 455, 429, 377, 710, 684, 632, 351, 247, 619, 606, 805, 898, 435, 713, 794, 690, 482, 430, 378, 472, 667, 806, 459, 621, 714, 900, 848, 251, 437, 835, 809, 796, 692, 484, 783, 679, 627, 380, 575, 721, 367, 622, 669, 461, 438, 716, 810, 253, 837, 904, 467, 441, 629, 722, 696, 415, 488, 683, 670, 817, 462, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 744, 463, 718, 865, 852, 255, 839, 813, 906, 443, 631, 698, 490, 725, 819, 866, 913, 814, 960, 497, 908, 856, 752, 471, 445, 843, 739, 726, 700, 492, 687, 635, 821, 914, 729, 868, 498, 446, 845, 741, 822, 475, 637, 730, 929, 916, 903, 851, 825, 500, 799, 872, 695, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 760, 479, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q249_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 544, 263, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 328, 151, 224, 523, 198, 172, 120, 107, 94, 293, 386, 548, 201, 282, 178, 577, 525, 155, 294, 109, 202, 388, 336, 531, 323, 297, 284, 180, 578, 552, 271, 167, 115, 526, 63, 209, 110, 157, 204, 298, 533, 325, 392, 580, 117, 210, 184, 768, 171, 158, 305, 560, 279, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 206, 561, 353, 340, 535, 608, 327, 301, 394, 582, 556, 119, 186, 770, 213, 307, 585, 562, 354, 401, 656, 302, 448, 643, 396, 344, 240, 539, 331, 227, 214, 188, 586, 772, 175, 123, 309, 402, 564, 217, 356, 551, 645, 593, 541, 333, 229, 310, 588, 125, 218, 417, 404, 776, 672, 391, 339, 313, 646, 594, 568, 287, 360, 183, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 657, 303, 449, 558, 704, 397, 345, 241, 652, 600, 215, 189, 587, 773, 236, 403, 565, 658, 357, 450, 424, 612, 398, 346, 242, 800, 190, 774, 311, 589, 566, 219, 358, 405, 777, 673, 660, 452, 647, 595, 569, 361, 348, 244, 543, 616, 335, 231, 590, 432, 127, 419, 406, 778, 674, 221, 315, 570, 362, 409, 597, 664, 456, 651, 785, 248, 832, 235, 222, 421, 369, 780, 676, 624, 343, 317, 410, 611, 598, 572, 364, 559, 705, 786, 653, 601, 422, 370, 237, 318, 464, 659, 451, 425, 412, 613, 706, 680, 399, 347, 243, 654, 602, 801, 788, 191, 775, 238, 372, 567, 359, 426, 614, 661, 453, 708, 802, 349, 245, 617, 604, 896, 591, 433, 792, 688, 407, 480, 779, 675, 662, 454, 428, 376, 571, 363, 350, 246, 618, 665, 804, 457, 434, 712, 249, 833, 223, 781, 677, 625, 411, 599, 573, 666, 365, 458, 620, 787, 250, 436, 834, 808, 423, 371, 782, 678, 626, 319, 465, 574, 720, 366, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 840, 663, 736, 455, 429, 377, 710, 684, 632, 351, 247, 619, 606, 805, 898, 435, 713, 794, 690, 482, 430, 378, 472, 667, 806, 459, 621, 714, 900, 848, 251, 437, 835, 809, 796, 692, 484, 783, 679, 627, 380, 575, 721, 367, 622, 669, 461, 438, 716, 810, 253, 837, 904, 467, 441, 629, 722, 696, 415, 488, 683, 670, 462, 817, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 744, 463, 718, 865, 852, 255, 839, 813, 906, 443, 631, 698, 490, 725, 819, 866, 913, 814, 960, 497, 908, 856, 752, 471, 445, 843, 739, 726, 700, 492, 687, 635, 821, 914, 729, 868, 498, 446, 845, 741, 822, 475, 637, 730, 929, 916, 903, 851, 825, 500, 799, 872, 695, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 760, 479, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q250_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 544, 263, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 578, 552, 271, 167, 115, 526, 63, 209, 110, 157, 204, 298, 533, 325, 392, 580, 117, 210, 184, 768, 171, 158, 305, 560, 279, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 206, 561, 353, 340, 535, 608, 327, 301, 394, 582, 556, 119, 186, 770, 213, 307, 585, 562, 354, 401, 302, 656, 448, 643, 396, 344, 240, 539, 331, 227, 214, 188, 586, 772, 175, 123, 309, 402, 564, 217, 356, 551, 645, 593, 541, 333, 229, 310, 588, 125, 218, 417, 404, 776, 672, 391, 339, 313, 646, 594, 568, 287, 183, 360, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 303, 657, 449, 558, 704, 397, 345, 241, 652, 600, 215, 189, 587, 773, 236, 403, 565, 658, 357, 450, 424, 612, 398, 346, 242, 800, 190, 774, 311, 589, 566, 219, 358, 405, 777, 673, 660, 452, 647, 595, 569, 361, 348, 244, 543, 616, 335, 231, 590, 432, 127, 419, 406, 778, 674, 221, 315, 570, 362, 409, 597, 664, 456, 651, 785, 248, 832, 235, 222, 421, 369, 780, 676, 624, 343, 317, 410, 611, 598, 572, 364, 559, 705, 786, 653, 601, 422, 370, 237, 318, 464, 659, 451, 425, 412, 613, 706, 680, 399, 347, 243, 654, 602, 801, 788, 191, 775, 238, 372, 567, 359, 426, 614, 661, 453, 708, 802, 349, 245, 617, 604, 896, 591, 433, 792, 688, 407, 480, 779, 675, 662, 454, 428, 376, 571, 363, 350, 246, 618, 665, 804, 457, 434, 712, 249, 833, 223, 781, 677, 625, 411, 599, 573, 666, 365, 458, 620, 787, 250, 436, 834, 808, 423, 371, 782, 678, 626, 319, 465, 574, 366, 720, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 663, 840, 736, 455, 429, 377, 710, 684, 632, 351, 247, 619, 606, 805, 898, 435, 713, 794, 690, 482, 430, 378, 472, 667, 806, 459, 621, 714, 900, 848, 251, 437, 835, 809, 796, 692, 484, 783, 679, 627, 380, 575, 367, 721, 622, 669, 461, 438, 716, 810, 253, 837, 904, 467, 441, 629, 722, 696, 415, 488, 683, 670, 462, 817, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 744, 463, 718, 865, 852, 255, 839, 813, 906, 443, 631, 698, 490, 725, 819, 866, 913, 814, 960, 497, 908, 856, 752, 471, 445, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 760, 479, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q251_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 578, 271, 552, 167, 115, 526, 63, 209, 110, 157, 204, 298, 533, 325, 392, 580, 117, 210, 184, 768, 171, 158, 305, 279, 560, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 206, 561, 353, 340, 535, 327, 608, 301, 394, 582, 556, 119, 186, 770, 213, 307, 585, 562, 354, 401, 302, 656, 448, 643, 396, 344, 240, 539, 331, 227, 214, 188, 586, 772, 175, 123, 309, 402, 564, 217, 356, 551, 645, 593, 541, 333, 229, 310, 588, 125, 218, 417, 404, 776, 391, 672, 339, 313, 646, 594, 287, 568, 183, 360, 555, 542, 334, 230, 649, 126, 418, 233, 220, 314, 207, 341, 408, 609, 596, 395, 583, 557, 650, 784, 187, 771, 234, 420, 368, 563, 355, 342, 316, 610, 303, 657, 449, 558, 704, 397, 345, 241, 652, 600, 215, 189, 587, 773, 236, 403, 565, 658, 357, 450, 424, 612, 398, 346, 242, 800, 190, 774, 311, 589, 566, 219, 358, 405, 777, 673, 660, 452, 647, 595, 569, 361, 348, 244, 543, 335, 616, 231, 590, 432, 127, 419, 406, 778, 674, 221, 315, 570, 362, 409, 597, 664, 456, 651, 785, 248, 832, 235, 222, 421, 369, 780, 676, 343, 624, 317, 410, 611, 598, 572, 364, 559, 705, 786, 653, 601, 422, 370, 237, 318, 464, 659, 451, 425, 412, 613, 706, 399, 680, 347, 243, 654, 602, 801, 788, 191, 775, 238, 372, 567, 359, 426, 614, 661, 453, 708, 802, 349, 245, 617, 604, 896, 591, 433, 792, 407, 688, 480, 779, 675, 662, 454, 428, 376, 571, 363, 350, 246, 618, 665, 804, 457, 434, 712, 249, 833, 223, 781, 677, 625, 411, 599, 573, 666, 365, 458, 620, 787, 250, 436, 834, 808, 423, 371, 782, 678, 626, 319, 465, 574, 366, 720, 413, 707, 681, 668, 460, 655, 603, 789, 252, 836, 239, 373, 466, 440, 628, 427, 414, 615, 682, 816, 709, 803, 790, 605, 897, 374, 793, 689, 481, 468, 663, 840, 455, 736, 429, 377, 710, 684, 351, 632, 247, 619, 606, 805, 898, 435, 713, 794, 690, 482, 430, 378, 472, 667, 806, 459, 621, 714, 900, 848, 251, 437, 835, 809, 796, 692, 484, 783, 679, 627, 380, 575, 367, 721, 622, 669, 461, 438, 716, 810, 253, 837, 904, 467, 441, 629, 722, 415, 696, 488, 683, 670, 462, 817, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 463, 744, 718, 865, 852, 255, 839, 813, 906, 443, 631, 698, 490, 725, 819, 866, 913, 814, 960, 497, 908, 856, 471, 752, 445, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q252_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 546, 93, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 578, 271, 552, 167, 115, 526, 63, 209, 110, 157, 204, 298, 533, 325, 392, 580, 117, 210, 184, 171, 768, 158, 305, 279, 560, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 206, 561, 353, 340, 535, 327, 608, 301, 394, 582, 556, 119, 186, 770, 213, 307, 585, 562, 354, 401, 302, 656, 448, 643, 396, 344, 240, 539, 331, 227, 214, 188, 586, 175, 772, 123, 309, 402, 564, 217, 356, 551, 645, 593, 541, 333, 229, 310, 588, 125, 218, 417, 404, 776, 391, 672, 339, 313, 646, 594, 287, 568, 183, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 610, 303, 657, 449, 558, 704, 397, 345, 241, 652, 600, 215, 189, 587, 773, 236, 403, 565, 658, 357, 450, 424, 612, 398, 346, 242, 800, 190, 774, 311, 589, 566, 219, 358, 405, 777, 673, 660, 452, 647, 595, 569, 361, 348, 244, 543, 335, 616, 231, 590, 432, 127, 419, 406, 778, 674, 221, 315, 570, 362, 409, 597, 664, 456, 651, 785, 248, 235, 832, 222, 421, 369, 780, 676, 343, 624, 317, 410, 611, 598, 572, 364, 559, 705, 786, 653, 601, 422, 370, 237, 318, 464, 659, 451, 425, 412, 613, 706, 399, 680, 347, 243, 654, 602, 801, 191, 788, 775, 238, 372, 567, 359, 426, 614, 661, 453, 708, 802, 349, 245, 617, 604, 896, 591, 433, 792, 407, 688, 480, 779, 675, 662, 454, 428, 376, 571, 363, 350, 246, 618, 665, 804, 457, 434, 712, 249, 833, 223, 781, 677, 625, 411, 599, 573, 666, 365, 458, 620, 787, 250, 436, 834, 808, 423, 371, 782, 678, 626, 319, 465, 574, 366, 720, 413, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 840, 455, 736, 429, 377, 710, 684, 351, 632, 247, 619, 606, 805, 898, 435, 713, 794, 690, 482, 430, 378, 472, 667, 806, 459, 621, 714, 900, 251, 848, 437, 835, 809, 796, 692, 484, 783, 679, 627, 380, 575, 367, 721, 622, 669, 461, 438, 716, 810, 253, 837, 904, 467, 441, 629, 722, 415, 696, 488, 683, 670, 462, 817, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 463, 744, 718, 865, 255, 852, 839, 813, 906, 443, 631, 698, 490, 725, 819, 866, 913, 814, 960, 497, 908, 856, 471, 752, 445, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 930, 477, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q253_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 384, 79, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 578, 271, 552, 167, 115, 526, 63, 209, 110, 157, 204, 298, 533, 325, 392, 580, 117, 210, 184, 171, 768, 158, 305, 279, 560, 352, 547, 534, 326, 300, 641, 118, 537, 329, 225, 212, 306, 584, 199, 173, 121, 400, 95, 387, 549, 642, 283, 179, 538, 330, 226, 174, 122, 308, 295, 216, 550, 203, 389, 337, 644, 592, 285, 181, 579, 553, 540, 332, 228, 527, 124, 416, 111, 390, 338, 312, 205, 299, 286, 182, 554, 393, 581, 648, 211, 185, 769, 159, 232, 206, 561, 353, 340, 535, 327, 608, 301, 394, 582, 556, 119, 186, 770, 213, 307, 585, 562, 354, 401, 302, 656, 448, 643, 396, 344, 240, 539, 331, 227, 214, 188, 586, 175, 772, 123, 309, 402, 564, 217, 356, 551, 645, 593, 541, 333, 229, 310, 588, 125, 218, 417, 404, 776, 391, 672, 339, 313, 646, 594, 287, 568, 183, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 610, 303, 657, 449, 558, 704, 397, 345, 241, 652, 600, 215, 189, 587, 773, 236, 403, 565, 357, 658, 450, 424, 612, 398, 346, 242, 800, 190, 774, 311, 589, 566, 219, 358, 405, 777, 673, 660, 452, 647, 595, 569, 361, 348, 244, 543, 335, 616, 231, 590, 432, 127, 419, 406, 778, 221, 674, 315, 570, 362, 409, 597, 664, 456, 651, 785, 248, 235, 832, 222, 421, 369, 780, 676, 343, 624, 317, 410, 611, 598, 572, 364, 559, 705, 786, 653, 601, 422, 370, 237, 318, 464, 659, 451, 425, 412, 613, 706, 399, 680, 347, 243, 654, 602, 801, 191, 788, 775, 238, 372, 567, 359, 426, 614, 661, 453, 708, 349, 802, 245, 617, 604, 896, 591, 433, 792, 407, 688, 480, 779, 675, 662, 454, 428, 376, 571, 363, 350, 246, 618, 665, 804, 457, 434, 712, 249, 833, 223, 781, 677, 625, 411, 599, 573, 365, 666, 458, 620, 787, 250, 436, 834, 808, 423, 371, 782, 678, 626, 319, 465, 574, 366, 720, 413, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 840, 455, 736, 429, 377, 710, 684, 351, 632, 247, 619, 606, 805, 898, 435, 713, 794, 690, 482, 430, 378, 472, 667, 806, 459, 621, 714, 900, 251, 848, 437, 835, 809, 796, 692, 484, 783, 679, 627, 380, 575, 367, 721, 622, 669, 461, 438, 716, 810, 253, 837, 904, 467, 441, 629, 722, 415, 696, 488, 683, 670, 462, 817, 791, 864, 254, 838, 812, 375, 442, 630, 469, 841, 737, 724, 818, 711, 685, 633, 912, 607, 899, 496, 795, 691, 483, 470, 444, 842, 738, 431, 379, 686, 634, 820, 473, 807, 728, 715, 901, 849, 797, 693, 485, 844, 740, 381, 474, 636, 928, 623, 902, 850, 824, 439, 717, 811, 798, 694, 486, 905, 382, 723, 697, 489, 476, 671, 463, 744, 718, 865, 255, 852, 839, 813, 906, 443, 631, 698, 490, 725, 819, 866, 913, 814, 960, 497, 908, 856, 471, 752, 445, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 944, 639, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q254_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 576, 269, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 578, 271, 552, 167, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 584, 199, 173, 121, 95, 400, 387, 549, 642, 283, 179, 538, 330, 226, 174, 122, 308, 295, 216, 550, 203, 389, 337, 644, 592, 285, 181, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 608, 301, 394, 582, 556, 119, 186, 770, 213, 307, 585, 562, 354, 401, 302, 656, 448, 643, 396, 344, 240, 539, 331, 227, 214, 188, 586, 175, 772, 123, 309, 402, 564, 217, 356, 551, 645, 593, 541, 333, 229, 310, 588, 125, 218, 417, 404, 776, 391, 672, 339, 313, 646, 594, 287, 568, 183, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 610, 303, 657, 449, 558, 704, 397, 345, 241, 652, 600, 215, 189, 587, 773, 236, 403, 565, 357, 658, 450, 424, 612, 398, 346, 242, 190, 800, 774, 311, 589, 566, 219, 358, 405, 777, 673, 660, 452, 647, 595, 569, 361, 348, 244, 543, 335, 616, 231, 590, 127, 432, 419, 406, 778, 221, 674, 315, 570, 362, 409, 597, 664, 456, 651, 785, 248, 235, 222, 832, 421, 369, 780, 676, 343, 624, 317, 410, 611, 598, 572, 364, 559, 705, 786, 653, 601, 422, 370, 237, 318, 464, 659, 451, 425, 412, 613, 706, 399, 680, 347, 243, 654, 602, 191, 801, 788, 775, 238, 372, 567, 359, 426, 614, 661, 453, 708, 349, 802, 245, 617, 604, 591, 896, 433, 792, 407, 688, 480, 779, 675, 662, 454, 428, 376, 571, 363, 350, 246, 618, 665, 804, 457, 434, 712, 249, 223, 833, 781, 677, 625, 411, 599, 573, 365, 666, 458, 620, 787, 250, 436, 834, 808, 423, 371, 782, 678, 626, 319, 465, 574, 366, 720, 413, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 840, 455, 736, 429, 377, 710, 684, 351, 632, 247, 619, 606, 805, 898, 435, 713, 794, 690, 482, 430, 378, 472, 667, 806, 459, 621, 714, 900, 251, 848, 437, 835, 809, 796, 692, 484, 783, 679, 627, 380, 575, 367, 721, 622, 669, 461, 438, 716, 810, 253, 837, 904, 467, 441, 629, 722, 415, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 842, 738, 431, 379, 686, 634, 820, 473, 807, 728, 715, 901, 849, 797, 693, 485, 844, 740, 381, 474, 636, 623, 928, 902, 850, 824, 439, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 856, 471, 752, 445, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 754, 447, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q255_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 520, 135, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 576, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 536, 151, 328, 224, 523, 198, 172, 120, 107, 94, 293, 386, 548, 201, 282, 178, 577, 525, 155, 294, 109, 202, 388, 336, 531, 323, 297, 284, 180, 271, 578, 552, 167, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 584, 199, 173, 121, 95, 400, 387, 549, 642, 283, 179, 538, 330, 226, 174, 122, 308, 295, 216, 550, 203, 389, 337, 644, 285, 592, 181, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 301, 608, 394, 582, 556, 119, 186, 770, 213, 307, 585, 562, 354, 401, 302, 656, 448, 643, 396, 344, 240, 539, 331, 227, 214, 188, 586, 175, 123, 772, 309, 402, 564, 217, 356, 551, 645, 593, 541, 333, 229, 310, 588, 125, 218, 417, 404, 776, 391, 672, 339, 313, 646, 287, 594, 568, 183, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 303, 610, 657, 449, 558, 397, 704, 345, 241, 652, 600, 215, 189, 587, 773, 236, 403, 565, 357, 658, 450, 424, 612, 398, 346, 242, 190, 800, 774, 311, 589, 566, 219, 358, 405, 777, 673, 660, 452, 647, 595, 569, 361, 348, 244, 543, 335, 616, 231, 590, 127, 432, 419, 406, 778, 221, 674, 315, 570, 362, 409, 597, 664, 456, 651, 785, 248, 235, 222, 832, 421, 369, 780, 676, 343, 317, 624, 410, 611, 598, 572, 364, 559, 705, 786, 653, 601, 422, 370, 237, 318, 464, 659, 451, 425, 412, 613, 399, 706, 680, 347, 243, 654, 602, 191, 801, 788, 775, 238, 372, 567, 359, 426, 614, 661, 453, 708, 349, 802, 245, 617, 604, 591, 896, 433, 792, 407, 688, 480, 779, 675, 662, 454, 428, 376, 571, 363, 350, 246, 618, 665, 804, 457, 434, 712, 249, 223, 833, 781, 677, 625, 411, 599, 573, 365, 666, 458, 620, 787, 250, 436, 834, 808, 423, 371, 782, 678, 319, 626, 465, 574, 366, 413, 720, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 840, 455, 429, 736, 377, 710, 684, 351, 632, 247, 619, 606, 805, 898, 435, 713, 794, 690, 482, 430, 378, 472, 667, 806, 459, 621, 714, 251, 900, 848, 437, 835, 809, 796, 692, 484, 783, 679, 627, 380, 575, 367, 721, 622, 669, 461, 438, 716, 810, 253, 837, 904, 467, 441, 629, 415, 722, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 842, 431, 738, 379, 686, 634, 820, 473, 807, 728, 715, 901, 849, 797, 693, 485, 844, 740, 381, 474, 636, 623, 928, 902, 850, 824, 439, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 856, 471, 445, 752, 843, 739, 726, 700, 492, 687, 635, 821, 914, 729, 868, 498, 446, 845, 741, 822, 475, 637, 730, 929, 916, 903, 851, 825, 500, 799, 695, 872, 487, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 447, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 888, 503, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q256_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 135, 520, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 576, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 151, 536, 328, 224, 523, 198, 172, 120, 107, 94, 293, 386, 548, 201, 282, 178, 577, 525, 155, 294, 109, 202, 388, 336, 531, 323, 297, 284, 180, 271, 578, 167, 552, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 199, 584, 173, 121, 95, 400, 387, 549, 642, 283, 179, 538, 330, 226, 174, 122, 308, 295, 216, 550, 203, 389, 337, 644, 285, 592, 181, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 301, 608, 394, 582, 556, 119, 186, 770, 213, 307, 585, 562, 354, 401, 302, 656, 448, 643, 396, 344, 240, 539, 331, 227, 214, 188, 586, 175, 123, 772, 309, 402, 564, 217, 356, 551, 645, 593, 541, 333, 229, 310, 588, 125, 218, 417, 404, 391, 776, 339, 672, 313, 646, 287, 594, 183, 568, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 303, 610, 657, 449, 558, 397, 704, 345, 241, 652, 215, 600, 189, 587, 773, 236, 403, 565, 357, 658, 450, 424, 612, 398, 346, 242, 190, 800, 774, 311, 589, 566, 219, 358, 405, 777, 673, 660, 452, 647, 595, 569, 361, 348, 244, 543, 335, 231, 616, 590, 127, 432, 419, 406, 778, 221, 674, 315, 570, 362, 409, 597, 664, 456, 651, 785, 248, 235, 222, 832, 421, 369, 780, 343, 676, 317, 624, 410, 611, 598, 572, 364, 559, 705, 786, 653, 601, 422, 370, 237, 318, 464, 659, 451, 425, 412, 613, 399, 706, 347, 680, 243, 654, 602, 191, 801, 788, 775, 238, 372, 567, 359, 426, 614, 661, 453, 708, 349, 802, 245, 617, 604, 591, 896, 433, 407, 792, 688, 480, 779, 675, 662, 454, 428, 376, 571, 363, 350, 246, 618, 665, 804, 457, 434, 712, 249, 223, 833, 781, 677, 625, 411, 599, 573, 365, 666, 458, 620, 787, 250, 436, 834, 423, 808, 371, 782, 678, 319, 626, 465, 574, 366, 413, 720, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 455, 840, 429, 736, 377, 710, 351, 684, 247, 632, 619, 606, 805, 898, 435, 713, 794, 690, 482, 430, 378, 472, 667, 806, 459, 621, 714, 251, 900, 848, 437, 835, 809, 796, 692, 484, 783, 679, 627, 380, 575, 367, 721, 622, 669, 461, 438, 716, 810, 253, 837, 904, 467, 441, 629, 415, 722, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 842, 431, 738, 379, 686, 634, 820, 473, 807, 728, 715, 901, 849, 797, 693, 485, 844, 740, 381, 474, 636, 623, 928, 902, 850, 439, 824, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 471, 856, 445, 752, 843, 739, 726, 700, 492, 687, 635, 821, 914, 729, 868, 498, 446, 845, 741, 822, 475, 637, 730, 929, 916, 903, 851, 825, 500, 799, 695, 487, 872, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 447, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 503, 888, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q257_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 135, 520, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 576, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 151, 536, 328, 224, 523, 198, 172, 120, 107, 94, 293, 386, 548, 201, 282, 178, 577, 525, 155, 294, 109, 202, 388, 336, 531, 323, 297, 284, 180, 271, 578, 167, 552, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 199, 584, 173, 121, 95, 400, 387, 549, 642, 283, 179, 538, 330, 226, 174, 122, 308, 295, 216, 550, 203, 389, 337, 644, 285, 592, 181, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 301, 608, 394, 582, 556, 119, 186, 213, 770, 307, 585, 562, 354, 401, 302, 656, 448, 643, 396, 344, 240, 539, 331, 227, 214, 188, 586, 175, 123, 772, 309, 402, 564, 217, 356, 551, 645, 593, 541, 333, 229, 310, 588, 125, 218, 417, 404, 391, 776, 339, 672, 313, 646, 287, 594, 183, 568, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 303, 610, 657, 449, 558, 397, 704, 345, 241, 652, 215, 600, 189, 587, 773, 236, 403, 565, 357, 658, 450, 424, 612, 398, 346, 242, 190, 800, 774, 311, 589, 566, 219, 358, 405, 777, 673, 660, 452, 647, 595, 569, 361, 348, 244, 543, 335, 231, 616, 590, 127, 432, 419, 406, 221, 778, 674, 315, 570, 362, 409, 597, 664, 456, 651, 785, 248, 235, 222, 832, 421, 369, 780, 343, 676, 317, 624, 410, 611, 598, 572, 364, 559, 705, 786, 653, 601, 422, 370, 237, 318, 464, 659, 451, 425, 412, 613, 399, 706, 347, 680, 243, 654, 602, 191, 801, 788, 775, 238, 372, 567, 359, 426, 614, 661, 453, 708, 349, 245, 802, 617, 604, 591, 896, 433, 407, 792, 688, 480, 779, 675, 662, 454, 428, 376, 571, 363, 350, 246, 618, 665, 804, 457, 434, 712, 249, 223, 833, 781, 677, 625, 411, 599, 573, 365, 666, 458, 620, 787, 250, 436, 834, 423, 808, 371, 782, 678, 319, 626, 465, 574, 366, 413, 720, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 455, 840, 429, 736, 377, 710, 351, 684, 247, 632, 619, 606, 805, 898, 435, 713, 794, 690, 482, 430, 378, 472, 667, 806, 459, 621, 714, 251, 900, 848, 437, 835, 809, 796, 692, 484, 783, 679, 627, 380, 575, 367, 721, 622, 669, 461, 438, 716, 253, 810, 837, 904, 467, 441, 629, 415, 722, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 842, 431, 738, 379, 686, 634, 820, 473, 807, 728, 715, 901, 849, 797, 693, 485, 844, 740, 381, 474, 636, 623, 928, 902, 850, 439, 824, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 471, 856, 445, 752, 843, 739, 726, 700, 492, 687, 635, 821, 914, 729, 868, 498, 446, 845, 741, 822, 475, 637, 730, 929, 916, 903, 851, 825, 500, 799, 695, 487, 872, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 447, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 503, 888, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q258_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 135, 520, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 576, 165, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 640, 281, 177, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 578, 167, 552, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 199, 584, 173, 121, 95, 400, 387, 549, 642, 283, 179, 538, 330, 226, 174, 122, 308, 295, 216, 203, 550, 389, 337, 644, 285, 592, 181, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 301, 608, 394, 582, 556, 119, 186, 213, 770, 307, 585, 562, 354, 401, 302, 656, 448, 643, 396, 344, 240, 539, 331, 227, 214, 188, 586, 175, 123, 772, 309, 402, 217, 564, 356, 551, 645, 593, 541, 333, 229, 310, 588, 125, 218, 417, 404, 391, 776, 339, 672, 313, 646, 287, 594, 183, 568, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 303, 610, 657, 449, 558, 397, 704, 345, 241, 652, 215, 600, 189, 587, 773, 236, 403, 565, 357, 658, 450, 424, 612, 398, 346, 242, 190, 800, 774, 311, 589, 219, 566, 358, 405, 777, 673, 660, 452, 647, 595, 569, 361, 348, 244, 543, 335, 231, 616, 590, 127, 432, 419, 406, 221, 778, 674, 315, 570, 362, 409, 597, 664, 456, 651, 785, 248, 235, 222, 832, 421, 369, 780, 343, 676, 317, 624, 410, 611, 598, 572, 364, 559, 705, 786, 653, 601, 422, 370, 237, 318, 464, 659, 451, 425, 412, 613, 399, 706, 347, 680, 243, 654, 602, 191, 801, 788, 775, 238, 372, 567, 359, 426, 614, 661, 453, 708, 349, 245, 802, 617, 604, 591, 896, 433, 407, 792, 688, 480, 779, 675, 662, 454, 428, 376, 571, 363, 350, 246, 618, 665, 457, 804, 434, 712, 249, 223, 833, 781, 677, 625, 411, 599, 573, 365, 666, 458, 620, 787, 250, 436, 834, 423, 808, 371, 782, 678, 319, 626, 465, 574, 366, 413, 720, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 455, 840, 429, 736, 377, 710, 351, 684, 247, 632, 619, 606, 805, 898, 435, 713, 794, 690, 482, 430, 378, 472, 667, 459, 806, 621, 714, 251, 900, 848, 437, 835, 809, 796, 692, 484, 783, 679, 627, 380, 575, 367, 721, 622, 669, 461, 438, 716, 253, 810, 837, 904, 467, 441, 629, 415, 722, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 842, 431, 738, 379, 686, 634, 473, 820, 807, 728, 715, 901, 849, 797, 693, 485, 844, 740, 381, 474, 636, 623, 928, 902, 850, 439, 824, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 471, 856, 445, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 846, 742, 383, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 858, 447, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 503, 888, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q259_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 135, 520, 83, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 165, 576, 113, 524, 87, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 640, 177, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 578, 552, 115, 526, 63, 209, 110, 157, 204, 298, 533, 325, 392, 580, 117, 210, 184, 171, 158, 768, 305, 279, 560, 352, 547, 534, 326, 300, 641, 118, 537, 329, 225, 212, 306, 199, 173, 584, 121, 95, 400, 387, 549, 283, 642, 179, 538, 330, 226, 174, 122, 308, 295, 216, 203, 550, 389, 337, 285, 644, 181, 592, 579, 553, 540, 332, 228, 527, 124, 111, 416, 390, 338, 312, 205, 299, 286, 182, 554, 393, 581, 648, 211, 185, 159, 769, 232, 206, 561, 353, 340, 535, 327, 301, 608, 394, 582, 556, 119, 186, 213, 770, 307, 585, 562, 354, 401, 302, 656, 448, 643, 396, 344, 240, 539, 331, 227, 214, 188, 175, 586, 123, 772, 309, 402, 217, 564, 356, 551, 645, 593, 541, 333, 229, 310, 588, 125, 218, 417, 404, 391, 776, 339, 313, 672, 287, 646, 183, 594, 568, 360, 555, 542, 334, 230, 649, 126, 418, 233, 220, 314, 207, 341, 408, 609, 596, 395, 583, 557, 650, 187, 784, 771, 234, 420, 368, 563, 355, 342, 316, 303, 610, 657, 449, 558, 397, 345, 704, 241, 652, 215, 189, 600, 587, 773, 236, 403, 565, 357, 658, 450, 424, 612, 398, 346, 242, 190, 800, 774, 311, 589, 219, 566, 358, 405, 777, 673, 660, 452, 647, 595, 569, 361, 348, 244, 543, 335, 231, 616, 590, 127, 432, 419, 406, 221, 778, 315, 674, 570, 362, 409, 597, 664, 456, 651, 785, 248, 235, 222, 421, 832, 369, 780, 343, 317, 676, 624, 410, 611, 598, 572, 364, 559, 705, 786, 653, 601, 422, 370, 237, 318, 464, 659, 451, 425, 412, 613, 399, 347, 706, 680, 243, 654, 191, 602, 801, 788, 775, 238, 372, 567, 359, 426, 614, 661, 453, 349, 708, 245, 802, 617, 604, 591, 896, 433, 407, 792, 688, 480, 779, 675, 662, 454, 428, 376, 571, 363, 350, 246, 618, 665, 457, 804, 434, 712, 249, 223, 833, 781, 677, 625, 411, 599, 573, 365, 666, 458, 620, 787, 250, 436, 423, 834, 808, 371, 782, 319, 678, 626, 465, 574, 366, 413, 720, 707, 681, 668, 460, 655, 603, 789, 252, 239, 836, 373, 466, 440, 628, 427, 414, 615, 682, 816, 709, 803, 790, 605, 897, 374, 793, 689, 481, 468, 663, 455, 429, 840, 377, 736, 351, 710, 684, 247, 632, 619, 606, 805, 898, 435, 713, 794, 690, 482, 430, 378, 472, 667, 459, 806, 621, 714, 251, 900, 437, 848, 835, 809, 796, 692, 484, 783, 679, 627, 380, 575, 367, 721, 622, 669, 461, 438, 716, 253, 810, 837, 904, 467, 441, 629, 415, 722, 696, 488, 683, 670, 462, 817, 791, 254, 864, 838, 812, 375, 442, 630, 469, 841, 737, 724, 818, 711, 685, 633, 607, 912, 899, 496, 795, 691, 483, 470, 444, 431, 842, 379, 738, 686, 634, 473, 820, 807, 728, 715, 901, 849, 797, 693, 485, 844, 381, 740, 474, 636, 623, 928, 902, 439, 850, 824, 717, 811, 798, 694, 486, 905, 382, 723, 697, 489, 476, 671, 463, 744, 718, 255, 865, 852, 839, 813, 906, 443, 631, 698, 490, 725, 819, 866, 913, 814, 960, 497, 908, 471, 445, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 846, 383, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 936, 499, 910, 447, 858, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 940, 503, 888, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q260_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 512, 49, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 514, 51, 98, 145, 46, 192, 140, 88, 75, 261, 516, 53, 146, 100, 288, 262, 77, 54, 265, 161, 148, 135, 83, 520, 57, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 518, 55, 102, 149, 521, 196, 290, 105, 92, 79, 384, 280, 176, 267, 163, 150, 522, 59, 106, 153, 292, 200, 529, 321, 269, 165, 576, 113, 87, 524, 61, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 640, 177, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 578, 115, 552, 526, 63, 209, 110, 157, 204, 298, 533, 325, 392, 580, 117, 210, 184, 171, 158, 768, 305, 279, 560, 352, 547, 534, 326, 300, 118, 641, 537, 329, 225, 212, 306, 199, 173, 584, 121, 95, 400, 387, 549, 283, 642, 179, 538, 330, 226, 174, 122, 308, 295, 216, 203, 550, 389, 337, 285, 644, 181, 592, 579, 553, 540, 332, 228, 527, 124, 111, 416, 390, 338, 312, 205, 299, 286, 182, 554, 393, 581, 211, 648, 185, 159, 769, 232, 206, 561, 353, 340, 535, 327, 301, 608, 394, 582, 119, 556, 186, 213, 770, 307, 585, 562, 354, 401, 302, 656, 448, 643, 396, 344, 240, 539, 331, 227, 214, 188, 175, 586, 123, 772, 309, 402, 217, 564, 356, 551, 645, 593, 541, 333, 229, 310, 588, 125, 218, 417, 404, 391, 339, 776, 313, 672, 287, 646, 183, 594, 568, 360, 555, 542, 334, 230, 126, 649, 418, 233, 220, 314, 207, 341, 408, 609, 596, 395, 583, 557, 650, 187, 784, 771, 234, 420, 368, 563, 355, 342, 316, 303, 610, 657, 449, 558, 397, 345, 704, 241, 215, 652, 189, 600, 587, 773, 236, 403, 565, 357, 658, 450, 424, 612, 398, 346, 242, 190, 800, 774, 311, 589, 219, 566, 358, 405, 777, 673, 660, 452, 647, 595, 569, 361, 348, 244, 543, 335, 231, 616, 590, 127, 432, 419, 406, 221, 778, 315, 674, 570, 362, 409, 597, 664, 456, 651, 785, 248, 235, 222, 421, 832, 369, 343, 780, 317, 676, 624, 410, 611, 598, 572, 364, 559, 705, 786, 653, 601, 422, 370, 237, 318, 464, 659, 451, 425, 412, 613, 399, 347, 706, 243, 680, 654, 191, 602, 801, 788, 775, 238, 372, 567, 359, 426, 614, 661, 453, 349, 708, 245, 802, 617, 604, 591, 896, 433, 407, 792, 688, 480, 779, 675, 662, 454, 428, 376, 571, 363, 350, 246, 618, 665, 457, 804, 434, 712, 249, 223, 833, 781, 677, 625, 411, 599, 573, 365, 666, 458, 620, 787, 250, 436, 423, 834, 371, 808, 782, 319, 678, 626, 465, 574, 366, 413, 720, 707, 681, 668, 460, 655, 603, 789, 252, 239, 836, 373, 466, 440, 628, 427, 414, 615, 682, 816, 709, 803, 790, 605, 374, 897, 793, 689, 481, 468, 663, 455, 429, 840, 377, 736, 351, 710, 247, 684, 632, 619, 606, 805, 898, 435, 713, 794, 690, 482, 430, 378, 472, 667, 459, 806, 621, 714, 251, 900, 437, 848, 835, 809, 796, 692, 484, 783, 679, 627, 380, 575, 367, 721, 622, 669, 461, 438, 716, 253, 810, 837, 467, 904, 441, 629, 415, 722, 696, 488, 683, 670, 462, 817, 791, 254, 864, 838, 375, 812, 442, 630, 469, 841, 737, 724, 818, 711, 685, 633, 607, 912, 899, 496, 795, 691, 483, 470, 444, 431, 842, 379, 738, 686, 634, 473, 820, 807, 728, 715, 901, 849, 797, 693, 485, 844, 381, 740, 474, 636, 623, 928, 902, 439, 850, 824, 717, 811, 798, 694, 486, 382, 905, 723, 697, 489, 476, 671, 463, 744, 718, 255, 865, 852, 839, 813, 906, 443, 631, 698, 490, 725, 819, 866, 913, 814, 960, 497, 471, 908, 445, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 846, 383, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 962, 499, 936, 910, 447, 858, 754, 702, 494, 823, 731, 870, 917, 964, 501, 873, 860, 756, 847, 743, 639, 944, 931, 918, 733, 827, 502, 874, 921, 968, 505, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 966, 503, 940, 888, 875, 862, 758, 969, 946, 761, 735, 923, 877, 970, 507, 762, 948, 935, 883, 831, 977, 878, 925, 972, 509, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 974, 511, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q261_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 512, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 520, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 55, 518, 102, 149, 521, 196, 290, 105, 92, 79, 384, 280, 176, 267, 163, 150, 59, 522, 106, 153, 292, 200, 529, 321, 269, 165, 113, 576, 87, 61, 524, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 177, 640, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 552, 63, 526, 209, 110, 157, 204, 298, 533, 325, 392, 117, 580, 210, 184, 171, 158, 305, 768, 279, 560, 352, 547, 534, 326, 300, 118, 641, 537, 329, 225, 212, 306, 199, 173, 121, 584, 95, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 312, 205, 299, 286, 182, 554, 393, 581, 211, 185, 648, 159, 769, 232, 206, 561, 353, 340, 535, 327, 301, 608, 394, 119, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 776, 672, 287, 183, 646, 594, 568, 360, 555, 542, 334, 230, 126, 649, 418, 233, 220, 314, 207, 341, 408, 609, 596, 395, 583, 557, 187, 650, 784, 771, 234, 420, 368, 563, 355, 342, 316, 303, 610, 657, 449, 558, 397, 345, 241, 704, 215, 189, 652, 600, 587, 773, 236, 403, 565, 357, 658, 450, 424, 612, 398, 346, 242, 190, 800, 311, 774, 589, 219, 566, 358, 405, 777, 673, 660, 452, 647, 595, 569, 361, 348, 244, 543, 335, 231, 616, 127, 590, 432, 419, 406, 221, 315, 778, 674, 570, 362, 409, 597, 664, 456, 651, 785, 248, 235, 222, 421, 369, 832, 343, 317, 780, 676, 624, 410, 611, 598, 572, 364, 559, 705, 786, 653, 601, 422, 370, 237, 318, 464, 659, 451, 425, 412, 613, 399, 347, 243, 706, 680, 191, 654, 602, 801, 788, 775, 238, 372, 567, 359, 426, 614, 661, 453, 349, 245, 708, 802, 617, 604, 591, 433, 896, 407, 792, 688, 480, 779, 675, 662, 454, 428, 376, 571, 363, 350, 246, 618, 665, 457, 804, 434, 249, 712, 223, 833, 781, 677, 625, 411, 599, 573, 365, 666, 458, 620, 787, 250, 436, 423, 371, 834, 808, 319, 782, 678, 626, 465, 574, 366, 413, 720, 707, 681, 668, 460, 655, 603, 789, 252, 239, 373, 836, 466, 440, 628, 427, 414, 615, 682, 816, 709, 803, 790, 605, 374, 897, 793, 689, 481, 468, 663, 455, 429, 377, 840, 736, 351, 247, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 904, 629, 415, 722, 696, 488, 683, 670, 462, 817, 791, 254, 864, 375, 838, 812, 442, 630, 469, 841, 737, 724, 818, 711, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 928, 439, 902, 850, 824, 717, 811, 798, 694, 486, 382, 905, 723, 697, 489, 476, 671, 463, 744, 255, 718, 865, 852, 839, 813, 443, 906, 631, 698, 490, 725, 819, 866, 913, 814, 497, 960, 471, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 383, 846, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 499, 962, 936, 447, 910, 858, 754, 702, 494, 823, 731, 870, 917, 501, 964, 873, 860, 756, 847, 743, 639, 944, 931, 918, 733, 827, 502, 874, 921, 505, 968, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 503, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 511, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q262_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 512, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 520, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 55, 518, 102, 149, 521, 196, 290, 105, 92, 79, 384, 280, 176, 267, 163, 150, 59, 522, 106, 153, 292, 200, 529, 321, 269, 165, 113, 576, 87, 61, 524, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 177, 640, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 552, 63, 526, 209, 110, 157, 204, 298, 533, 325, 392, 117, 580, 210, 184, 171, 158, 305, 768, 279, 560, 352, 547, 534, 326, 300, 118, 641, 537, 329, 225, 212, 306, 199, 173, 121, 584, 95, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 312, 205, 299, 286, 182, 554, 393, 581, 211, 185, 648, 159, 232, 769, 206, 561, 353, 340, 535, 327, 301, 608, 394, 119, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 776, 672, 287, 183, 646, 594, 568, 360, 555, 542, 334, 230, 126, 649, 418, 233, 220, 314, 207, 341, 408, 609, 596, 395, 583, 557, 187, 650, 784, 234, 771, 420, 368, 563, 355, 342, 316, 303, 610, 657, 449, 558, 397, 345, 241, 704, 215, 189, 652, 600, 587, 236, 773, 403, 565, 357, 658, 450, 424, 612, 398, 346, 242, 190, 800, 311, 774, 589, 219, 566, 358, 405, 777, 673, 660, 452, 647, 595, 569, 361, 348, 244, 543, 335, 231, 616, 127, 590, 432, 419, 406, 221, 315, 778, 674, 570, 362, 409, 597, 664, 456, 651, 248, 785, 235, 222, 421, 369, 832, 343, 317, 780, 676, 624, 410, 611, 598, 572, 364, 559, 705, 786, 653, 601, 422, 370, 237, 318, 464, 659, 451, 425, 412, 613, 399, 347, 243, 706, 680, 191, 654, 602, 801, 788, 238, 775, 372, 567, 359, 426, 614, 661, 453, 349, 245, 708, 802, 617, 604, 591, 433, 896, 407, 792, 688, 480, 779, 675, 662, 454, 428, 376, 571, 363, 350, 246, 618, 665, 457, 804, 434, 249, 712, 223, 833, 781, 677, 625, 411, 599, 573, 365, 666, 458, 620, 250, 787, 436, 423, 371, 834, 808, 319, 782, 678, 626, 465, 574, 366, 413, 720, 707, 681, 668, 460, 655, 603, 252, 789, 239, 373, 836, 466, 440, 628, 427, 414, 615, 682, 816, 709, 803, 790, 605, 374, 897, 793, 689, 481, 468, 663, 455, 429, 377, 840, 736, 351, 247, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 904, 629, 415, 722, 696, 488, 683, 670, 462, 817, 254, 791, 864, 375, 838, 812, 442, 630, 469, 841, 737, 724, 818, 711, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 928, 439, 902, 850, 824, 717, 811, 798, 694, 486, 382, 905, 723, 697, 489, 476, 671, 463, 744, 255, 718, 865, 852, 839, 813, 443, 906, 631, 698, 490, 725, 819, 866, 913, 814, 497, 960, 471, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 383, 846, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 499, 962, 936, 447, 910, 858, 754, 702, 494, 823, 731, 870, 917, 501, 964, 873, 860, 756, 847, 743, 639, 944, 931, 918, 733, 827, 502, 874, 921, 505, 968, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 503, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 511, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q263_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 512, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 520, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 55, 518, 102, 149, 521, 196, 290, 105, 92, 79, 384, 280, 176, 267, 163, 150, 59, 522, 106, 153, 292, 200, 529, 321, 269, 165, 113, 576, 87, 61, 524, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 177, 640, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 552, 63, 526, 209, 110, 157, 204, 298, 533, 325, 392, 117, 580, 210, 184, 171, 158, 305, 768, 279, 560, 352, 547, 534, 326, 300, 118, 641, 537, 329, 225, 212, 306, 199, 173, 121, 584, 95, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 312, 205, 299, 286, 182, 554, 393, 581, 211, 185, 648, 159, 232, 769, 206, 561, 353, 340, 535, 327, 301, 608, 394, 119, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 776, 672, 287, 183, 646, 594, 568, 360, 555, 542, 334, 230, 126, 649, 418, 233, 220, 314, 207, 341, 408, 609, 395, 596, 583, 557, 187, 650, 784, 234, 771, 420, 368, 563, 355, 342, 316, 303, 610, 657, 449, 558, 397, 345, 241, 704, 215, 189, 652, 600, 587, 236, 773, 403, 565, 357, 658, 450, 424, 612, 398, 346, 242, 190, 800, 311, 774, 589, 219, 566, 358, 405, 777, 673, 660, 452, 647, 595, 569, 361, 348, 244, 543, 335, 231, 616, 127, 590, 432, 419, 406, 221, 315, 778, 674, 570, 362, 409, 597, 664, 456, 651, 248, 785, 235, 222, 421, 369, 832, 343, 317, 780, 676, 624, 410, 611, 598, 572, 364, 559, 705, 786, 653, 601, 422, 370, 237, 318, 464, 659, 451, 425, 412, 613, 399, 347, 243, 706, 680, 191, 654, 602, 801, 788, 238, 775, 372, 567, 359, 426, 614, 661, 453, 349, 245, 708, 802, 617, 604, 591, 433, 896, 407, 792, 688, 480, 779, 675, 662, 454, 428, 376, 571, 363, 350, 246, 618, 665, 457, 804, 434, 249, 712, 223, 833, 781, 677, 625, 411, 599, 573, 365, 666, 458, 620, 250, 787, 436, 423, 371, 834, 808, 319, 782, 678, 626, 465, 574, 366, 413, 720, 707, 681, 668, 460, 655, 603, 252, 789, 239, 373, 836, 466, 440, 427, 628, 414, 615, 682, 816, 709, 803, 790, 605, 374, 897, 793, 689, 481, 468, 663, 455, 429, 377, 840, 736, 351, 247, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 904, 629, 415, 722, 696, 488, 683, 670, 462, 817, 254, 791, 864, 375, 838, 812, 442, 630, 469, 841, 737, 724, 818, 711, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 928, 439, 902, 850, 824, 717, 811, 798, 694, 486, 382, 905, 723, 697, 489, 476, 671, 463, 744, 255, 718, 865, 852, 839, 813, 443, 906, 631, 698, 490, 725, 819, 866, 913, 814, 497, 960, 471, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 383, 846, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 499, 962, 936, 447, 910, 858, 754, 702, 494, 823, 731, 870, 917, 501, 964, 873, 860, 756, 847, 743, 639, 944, 931, 918, 733, 827, 502, 874, 921, 505, 968, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 503, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 511, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q264_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 512, 23, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 520, 31, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 544, 55, 518, 102, 149, 521, 196, 290, 105, 92, 79, 384, 280, 176, 267, 163, 150, 59, 522, 106, 153, 292, 200, 529, 321, 269, 165, 113, 576, 87, 61, 524, 154, 108, 275, 530, 322, 296, 270, 166, 114, 62, 208, 195, 169, 156, 143, 91, 277, 545, 532, 324, 519, 116, 103, 170, 304, 197, 291, 278, 93, 546, 385, 281, 177, 640, 151, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 552, 63, 526, 209, 110, 157, 204, 298, 533, 325, 392, 117, 580, 210, 184, 171, 158, 305, 768, 279, 560, 352, 547, 534, 326, 300, 118, 641, 537, 329, 225, 212, 306, 199, 173, 121, 584, 95, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 312, 205, 299, 286, 182, 554, 393, 581, 211, 185, 648, 159, 232, 769, 206, 561, 353, 340, 535, 327, 301, 608, 394, 119, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 776, 287, 672, 183, 646, 594, 568, 360, 555, 542, 334, 230, 126, 649, 418, 233, 220, 314, 207, 341, 408, 609, 395, 596, 583, 557, 187, 650, 784, 234, 771, 420, 368, 563, 355, 342, 316, 303, 610, 657, 449, 558, 397, 345, 241, 704, 215, 189, 652, 600, 587, 236, 773, 403, 565, 357, 658, 450, 424, 612, 398, 346, 242, 190, 800, 311, 774, 589, 219, 566, 358, 405, 777, 673, 660, 452, 647, 595, 569, 361, 348, 244, 543, 335, 231, 616, 127, 590, 432, 419, 406, 221, 315, 778, 674, 570, 362, 409, 597, 664, 456, 651, 248, 785, 235, 222, 421, 369, 832, 343, 317, 780, 676, 624, 410, 611, 598, 572, 364, 559, 705, 786, 653, 601, 422, 370, 237, 318, 464, 659, 451, 425, 412, 613, 399, 347, 243, 706, 680, 191, 654, 602, 801, 788, 238, 775, 372, 567, 359, 426, 614, 661, 453, 349, 245, 708, 802, 617, 604, 591, 433, 896, 407, 792, 688, 480, 779, 675, 662, 454, 428, 376, 571, 363, 350, 246, 618, 665, 457, 804, 434, 249, 712, 223, 833, 781, 677, 625, 411, 599, 573, 365, 666, 458, 620, 250, 787, 436, 423, 371, 834, 808, 319, 782, 678, 626, 465, 574, 366, 413, 720, 707, 681, 668, 460, 655, 603, 252, 789, 239, 373, 836, 466, 440, 427, 628, 414, 615, 682, 816, 709, 803, 790, 605, 374, 897, 793, 689, 481, 468, 663, 455, 429, 377, 840, 351, 736, 247, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 904, 629, 415, 722, 696, 488, 683, 670, 462, 817, 254, 791, 864, 375, 838, 812, 442, 630, 469, 841, 737, 724, 818, 711, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 928, 439, 902, 850, 824, 717, 811, 798, 694, 486, 382, 905, 723, 697, 489, 476, 671, 463, 744, 255, 718, 865, 852, 839, 813, 443, 906, 631, 698, 490, 725, 819, 866, 913, 814, 497, 960, 471, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 872, 383, 846, 742, 638, 477, 930, 745, 732, 826, 719, 853, 920, 907, 504, 699, 491, 478, 746, 932, 880, 867, 854, 828, 815, 961, 909, 857, 753, 727, 701, 493, 748, 915, 869, 499, 962, 936, 447, 910, 858, 754, 702, 494, 823, 731, 870, 917, 501, 964, 873, 860, 756, 847, 743, 639, 944, 931, 918, 733, 827, 502, 874, 921, 505, 968, 479, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 992, 503, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 1000, 511, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q265_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 31, 520, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 55, 544, 518, 102, 149, 521, 196, 290, 105, 92, 79, 384, 280, 176, 267, 163, 150, 59, 522, 106, 153, 292, 200, 529, 321, 269, 165, 113, 87, 576, 61, 524, 154, 108, 275, 530, 322, 296, 270, 166, 114, 62, 208, 195, 169, 156, 143, 91, 277, 545, 532, 324, 519, 116, 103, 170, 197, 304, 291, 278, 93, 546, 385, 281, 177, 151, 640, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 63, 552, 526, 209, 110, 157, 204, 298, 533, 325, 392, 117, 580, 210, 184, 171, 158, 305, 279, 768, 560, 352, 547, 534, 326, 300, 118, 641, 537, 329, 225, 212, 199, 306, 173, 121, 95, 584, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 205, 312, 299, 286, 182, 554, 393, 581, 211, 185, 159, 648, 232, 769, 206, 561, 353, 340, 535, 327, 301, 394, 119, 608, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 287, 776, 183, 672, 646, 594, 568, 360, 555, 542, 334, 230, 126, 649, 418, 233, 220, 207, 314, 341, 408, 395, 609, 596, 583, 557, 187, 650, 784, 234, 771, 420, 368, 563, 355, 342, 316, 303, 610, 657, 449, 558, 397, 345, 241, 215, 704, 189, 652, 600, 587, 236, 773, 403, 565, 357, 658, 450, 424, 398, 612, 346, 242, 190, 311, 800, 774, 589, 219, 566, 358, 405, 777, 673, 660, 452, 647, 595, 569, 361, 348, 244, 543, 335, 231, 127, 616, 590, 432, 419, 406, 221, 315, 778, 674, 570, 362, 409, 597, 664, 456, 651, 248, 785, 235, 222, 421, 369, 343, 832, 317, 780, 676, 410, 624, 611, 598, 572, 364, 559, 705, 786, 653, 601, 422, 370, 237, 318, 464, 659, 451, 425, 412, 399, 613, 347, 243, 706, 191, 680, 654, 602, 801, 788, 238, 775, 372, 567, 359, 426, 614, 661, 453, 349, 245, 708, 802, 617, 604, 591, 433, 407, 896, 792, 688, 480, 779, 675, 662, 454, 428, 376, 571, 363, 350, 246, 618, 665, 457, 804, 434, 249, 223, 712, 833, 781, 677, 411, 625, 599, 573, 365, 666, 458, 620, 250, 787, 436, 423, 371, 834, 319, 808, 782, 678, 626, 465, 574, 366, 413, 720, 707, 681, 668, 460, 655, 603, 252, 789, 239, 373, 836, 466, 440, 427, 414, 628, 615, 682, 709, 816, 803, 790, 605, 374, 897, 793, 689, 481, 468, 663, 455, 429, 377, 351, 840, 247, 736, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 415, 904, 629, 722, 696, 488, 683, 670, 462, 817, 254, 791, 375, 864, 838, 812, 442, 630, 469, 841, 737, 724, 711, 818, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 439, 928, 902, 850, 717, 824, 811, 798, 694, 486, 382, 905, 723, 697, 489, 476, 671, 463, 255, 744, 718, 865, 852, 839, 813, 443, 906, 631, 698, 490, 725, 819, 866, 913, 814, 497, 471, 960, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 383, 872, 846, 742, 638, 477, 930, 745, 732, 719, 826, 853, 920, 907, 504, 699, 491, 478, 746, 932, 880, 867, 854, 828, 815, 961, 909, 857, 753, 727, 701, 493, 748, 915, 869, 499, 962, 447, 936, 910, 858, 754, 702, 494, 823, 731, 870, 917, 501, 964, 873, 860, 756, 847, 743, 639, 944, 931, 918, 733, 827, 502, 874, 921, 505, 479, 968, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 503, 992, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q266_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 31, 520, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 55, 544, 518, 102, 149, 521, 196, 290, 105, 92, 79, 384, 280, 176, 267, 163, 150, 59, 522, 106, 153, 292, 200, 529, 321, 269, 165, 113, 87, 576, 61, 524, 154, 108, 275, 530, 322, 296, 270, 166, 114, 62, 208, 195, 169, 156, 143, 91, 277, 545, 532, 324, 519, 116, 103, 170, 197, 304, 291, 278, 93, 546, 385, 281, 177, 151, 640, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 578, 63, 552, 526, 209, 110, 157, 204, 298, 533, 325, 117, 392, 580, 210, 184, 171, 158, 305, 279, 768, 560, 352, 547, 534, 326, 300, 118, 641, 537, 329, 225, 212, 199, 306, 173, 121, 95, 584, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 205, 312, 299, 286, 182, 554, 393, 581, 211, 185, 159, 648, 232, 769, 206, 561, 353, 340, 535, 327, 301, 119, 394, 608, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 287, 776, 183, 672, 646, 594, 568, 360, 555, 542, 334, 230, 126, 649, 418, 233, 220, 207, 314, 341, 408, 395, 609, 596, 583, 557, 187, 650, 234, 784, 771, 420, 368, 563, 355, 342, 316, 303, 610, 657, 449, 558, 397, 345, 241, 215, 704, 189, 652, 600, 587, 236, 773, 403, 565, 357, 658, 450, 424, 398, 612, 346, 242, 190, 311, 800, 774, 589, 219, 566, 358, 405, 777, 673, 660, 452, 647, 595, 569, 361, 348, 244, 543, 335, 231, 127, 616, 590, 432, 419, 406, 221, 315, 778, 674, 570, 362, 409, 597, 664, 456, 651, 248, 235, 785, 222, 421, 369, 343, 832, 317, 780, 676, 410, 624, 611, 598, 572, 364, 559, 705, 786, 653, 601, 422, 370, 237, 318, 464, 659, 451, 425, 412, 399, 613, 347, 243, 706, 191, 680, 654, 602, 801, 238, 788, 775, 372, 567, 359, 426, 614, 661, 453, 349, 245, 708, 802, 617, 604, 591, 433, 407, 896, 792, 688, 480, 779, 675, 662, 454, 428, 376, 571, 363, 350, 246, 618, 665, 457, 804, 434, 249, 223, 712, 833, 781, 677, 411, 625, 599, 573, 365, 666, 458, 620, 250, 787, 436, 423, 371, 834, 319, 808, 782, 678, 626, 465, 574, 366, 413, 720, 707, 681, 668, 460, 655, 603, 252, 239, 789, 373, 836, 466, 440, 427, 414, 628, 615, 682, 709, 816, 803, 790, 605, 374, 897, 793, 689, 481, 468, 663, 455, 429, 377, 351, 840, 247, 736, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 415, 629, 904, 722, 696, 488, 683, 670, 462, 817, 254, 791, 375, 864, 838, 812, 442, 630, 469, 841, 737, 724, 711, 818, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 439, 928, 902, 850, 717, 824, 811, 798, 694, 486, 382, 905, 723, 697, 489, 476, 671, 463, 255, 744, 718, 865, 852, 839, 813, 443, 631, 906, 698, 490, 725, 819, 866, 913, 814, 497, 471, 960, 445, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 383, 872, 846, 742, 638, 477, 930, 745, 732, 719, 826, 853, 920, 907, 504, 699, 491, 478, 746, 932, 880, 867, 854, 828, 815, 961, 909, 857, 753, 727, 701, 493, 748, 915, 869, 499, 962, 447, 936, 910, 858, 754, 702, 494, 823, 731, 870, 917, 501, 964, 873, 860, 756, 847, 743, 639, 944, 931, 918, 733, 827, 502, 874, 921, 505, 479, 968, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 503, 992, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q267_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 31, 520, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 55, 544, 518, 102, 149, 521, 196, 290, 105, 92, 79, 384, 280, 176, 267, 163, 150, 59, 522, 106, 153, 292, 200, 529, 321, 269, 165, 113, 87, 61, 576, 524, 154, 108, 275, 530, 322, 296, 270, 166, 114, 62, 208, 195, 169, 156, 143, 91, 277, 545, 532, 324, 519, 116, 103, 170, 197, 304, 291, 278, 93, 546, 385, 281, 177, 151, 640, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 63, 578, 552, 526, 209, 110, 157, 204, 298, 533, 325, 117, 392, 580, 210, 184, 171, 158, 305, 279, 768, 560, 352, 547, 534, 326, 300, 118, 641, 537, 329, 225, 212, 199, 306, 173, 121, 95, 584, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 205, 312, 299, 286, 182, 554, 393, 581, 211, 185, 159, 648, 232, 206, 769, 561, 353, 340, 535, 327, 301, 119, 394, 608, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 287, 183, 776, 672, 646, 594, 568, 360, 555, 542, 334, 230, 126, 649, 418, 233, 220, 207, 314, 341, 408, 395, 609, 596, 583, 557, 187, 650, 234, 784, 771, 420, 368, 563, 355, 342, 316, 303, 610, 657, 449, 558, 397, 345, 241, 215, 189, 704, 652, 600, 587, 236, 773, 403, 565, 357, 658, 450, 424, 398, 612, 346, 242, 190, 311, 800, 774, 589, 219, 566, 358, 405, 777, 673, 660, 452, 647, 595, 569, 361, 348, 244, 543, 335, 231, 127, 616, 590, 432, 419, 406, 221, 315, 778, 674, 570, 362, 409, 597, 664, 456, 651, 248, 235, 222, 785, 421, 369, 343, 317, 832, 780, 676, 410, 624, 611, 598, 572, 364, 559, 705, 786, 653, 601, 422, 370, 237, 318, 464, 659, 451, 425, 412, 399, 613, 347, 243, 191, 706, 680, 654, 602, 238, 801, 788, 775, 372, 567, 359, 426, 614, 661, 453, 349, 245, 708, 802, 617, 604, 591, 433, 407, 896, 792, 688, 480, 779, 675, 662, 454, 428, 376, 571, 363, 350, 246, 618, 665, 457, 804, 434, 249, 223, 712, 833, 781, 677, 411, 625, 599, 573, 365, 666, 458, 620, 250, 787, 436, 423, 371, 319, 834, 808, 782, 678, 626, 465, 574, 366, 413, 720, 707, 681, 668, 460, 655, 603, 252, 239, 789, 373, 836, 466, 440, 427, 414, 628, 615, 682, 709, 816, 803, 790, 605, 374, 897, 793, 689, 481, 468, 663, 455, 429, 377, 351, 247, 840, 736, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 415, 629, 904, 722, 696, 488, 683, 670, 462, 254, 817, 791, 375, 864, 838, 812, 442, 630, 469, 841, 737, 724, 711, 818, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 439, 928, 902, 850, 717, 824, 811, 798, 694, 486, 382, 905, 723, 697, 489, 476, 671, 463, 255, 744, 718, 865, 852, 839, 813, 443, 631, 906, 698, 490, 725, 819, 866, 913, 814, 497, 471, 445, 960, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 383, 872, 846, 742, 638, 477, 930, 745, 732, 719, 826, 853, 920, 907, 504, 699, 491, 478, 746, 932, 880, 867, 854, 828, 815, 961, 909, 857, 753, 727, 701, 493, 748, 915, 869, 499, 447, 962, 936, 910, 858, 754, 702, 494, 823, 731, 870, 917, 501, 964, 873, 860, 756, 847, 743, 639, 944, 931, 918, 733, 827, 502, 874, 921, 505, 479, 968, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 503, 992, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q268_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 31, 520, 104, 78, 266, 162, 58, 85, 152, 139, 273, 528, 320, 515, 268, 164, 112, 99, 86, 60, 47, 193, 274, 141, 89, 517, 147, 101, 194, 168, 142, 90, 289, 276, 263, 55, 544, 518, 102, 149, 521, 196, 290, 105, 92, 79, 384, 280, 176, 267, 163, 150, 59, 522, 106, 153, 292, 200, 529, 321, 269, 165, 113, 87, 61, 576, 524, 154, 108, 275, 530, 322, 296, 270, 166, 114, 62, 208, 195, 169, 156, 143, 91, 277, 545, 532, 324, 519, 116, 103, 170, 197, 304, 291, 278, 93, 546, 385, 281, 177, 151, 640, 536, 328, 224, 523, 198, 172, 120, 107, 94, 293, 386, 201, 548, 282, 178, 577, 525, 155, 294, 109, 202, 388, 336, 531, 323, 297, 284, 180, 271, 167, 115, 63, 578, 552, 526, 209, 110, 157, 204, 298, 533, 325, 117, 392, 580, 210, 184, 171, 158, 305, 279, 768, 560, 352, 547, 534, 326, 300, 118, 641, 537, 329, 225, 212, 199, 306, 173, 121, 95, 584, 400, 387, 549, 283, 179, 642, 538, 330, 226, 174, 122, 308, 295, 216, 203, 550, 389, 337, 285, 181, 644, 592, 579, 553, 540, 332, 228, 527, 124, 111, 416, 390, 338, 205, 312, 299, 286, 182, 554, 393, 581, 211, 185, 159, 648, 232, 206, 769, 561, 353, 340, 535, 327, 301, 119, 394, 608, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 287, 183, 776, 672, 646, 594, 568, 360, 555, 542, 334, 230, 126, 649, 418, 233, 220, 207, 314, 341, 408, 395, 609, 596, 583, 557, 187, 650, 234, 784, 771, 420, 368, 563, 355, 342, 316, 303, 610, 657, 558, 449, 397, 345, 241, 215, 189, 704, 652, 600, 587, 236, 773, 403, 565, 357, 658, 450, 424, 398, 612, 346, 242, 190, 311, 800, 774, 589, 219, 566, 358, 405, 777, 673, 660, 452, 647, 595, 569, 361, 348, 244, 543, 335, 231, 127, 616, 590, 432, 419, 406, 221, 315, 778, 674, 570, 362, 409, 597, 664, 456, 651, 248, 235, 222, 785, 421, 369, 343, 317, 832, 780, 676, 410, 624, 611, 598, 572, 364, 559, 705, 786, 653, 601, 422, 370, 237, 318, 464, 659, 451, 425, 412, 399, 613, 347, 243, 191, 706, 680, 654, 602, 238, 801, 788, 775, 372, 567, 359, 426, 614, 661, 453, 349, 245, 708, 802, 617, 604, 591, 433, 407, 896, 792, 688, 480, 779, 675, 662, 454, 428, 376, 571, 363, 350, 246, 618, 665, 457, 804, 434, 249, 223, 712, 833, 781, 677, 411, 625, 599, 573, 365, 666, 458, 620, 250, 787, 436, 423, 371, 319, 834, 808, 782, 678, 626, 574, 465, 366, 413, 720, 707, 681, 668, 460, 655, 603, 252, 239, 789, 373, 836, 466, 440, 427, 414, 628, 615, 682, 709, 816, 803, 790, 605, 374, 897, 793, 689, 481, 468, 663, 455, 429, 377, 351, 247, 840, 736, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 415, 629, 904, 722, 696, 488, 683, 670, 462, 254, 817, 791, 375, 864, 838, 812, 442, 630, 469, 841, 737, 724, 711, 818, 685, 633, 607, 912, 899, 496, 795, 691, 483, 470, 444, 431, 379, 842, 738, 686, 634, 473, 820, 807, 728, 715, 901, 849, 797, 693, 485, 381, 844, 740, 474, 636, 623, 439, 928, 902, 850, 717, 824, 811, 798, 694, 486, 382, 905, 723, 697, 489, 476, 671, 463, 255, 744, 718, 865, 852, 839, 813, 443, 631, 906, 698, 490, 725, 819, 866, 913, 814, 497, 471, 445, 960, 908, 856, 752, 843, 739, 726, 700, 492, 687, 635, 821, 914, 729, 868, 498, 446, 845, 741, 475, 822, 637, 730, 929, 916, 903, 851, 825, 500, 799, 695, 487, 383, 872, 846, 742, 638, 477, 930, 745, 732, 719, 826, 853, 920, 907, 504, 699, 491, 478, 746, 932, 880, 867, 854, 828, 815, 961, 909, 857, 753, 727, 701, 493, 748, 915, 869, 499, 447, 962, 936, 910, 858, 754, 702, 494, 823, 731, 870, 917, 501, 964, 873, 860, 756, 847, 743, 639, 944, 931, 918, 733, 827, 502, 874, 921, 505, 479, 968, 760, 747, 734, 933, 881, 855, 829, 922, 876, 506, 934, 882, 749, 830, 976, 963, 937, 924, 911, 859, 755, 508, 703, 495, 750, 884, 871, 938, 965, 861, 757, 945, 919, 503, 992, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023,];

$Q269_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 258, 73, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 516, 146, 100, 288, 262, 77, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 274, 89, 517, 147, 101, 194, 168, 142, 90, 289, 276, 263, 55, 544, 518, 102, 149, 521, 196, 290, 105, 92, 79, 384, 280, 176, 267, 163, 150, 59, 522, 106, 153, 292, 200, 529, 321, 269, 165, 113, 87, 61, 576, 524, 154, 108, 275, 530, 322, 296, 270, 166, 114, 62, 208, 195, 169, 156, 143, 91, 277, 545, 532, 324, 519, 116, 103, 170, 197, 304, 291, 278, 93, 546, 385, 281, 177, 151, 640, 536, 328, 224, 523, 198, 172, 120, 107, 94, 293, 386, 201, 282, 548, 178, 577, 525, 155, 294, 109, 202, 388, 336, 531, 323, 297, 284, 180, 271, 167, 115, 63, 578, 552, 526, 209, 110, 157, 204, 298, 533, 325, 117, 392, 580, 210, 184, 171, 158, 305, 279, 768, 560, 352, 547, 534, 326, 300, 118, 641, 537, 329, 225, 212, 199, 173, 306, 121, 95, 584, 400, 387, 283, 549, 179, 642, 538, 330, 226, 174, 122, 308, 295, 216, 203, 550, 389, 337, 285, 181, 644, 592, 579, 553, 540, 332, 228, 527, 124, 111, 416, 390, 205, 338, 312, 299, 286, 182, 554, 393, 581, 211, 185, 159, 648, 232, 206, 769, 561, 353, 340, 535, 327, 301, 119, 394, 608, 582, 556, 186, 213, 307, 770, 585, 562, 354, 401, 302, 656, 448, 643, 396, 344, 240, 539, 331, 227, 214, 188, 175, 123, 586, 309, 772, 402, 217, 564, 356, 551, 645, 593, 541, 333, 229, 310, 125, 588, 218, 417, 404, 391, 339, 313, 287, 183, 776, 672, 646, 594, 568, 360, 555, 542, 334, 230, 126, 649, 418, 233, 220, 207, 314, 341, 408, 395, 609, 596, 583, 557, 187, 650, 234, 784, 771, 420, 368, 563, 355, 342, 316, 303, 610, 657, 558, 449, 397, 345, 241, 215, 189, 704, 652, 600, 587, 236, 773, 403, 565, 357, 658, 450, 424, 398, 346, 612, 242, 190, 311, 800, 774, 589, 219, 566, 358, 405, 777, 673, 660, 452, 647, 595, 569, 361, 348, 244, 543, 335, 231, 127, 616, 590, 432, 419, 406, 221, 315, 778, 674, 570, 362, 409, 597, 664, 456, 651, 248, 235, 222, 785, 421, 369, 343, 317, 832, 780, 410, 676, 624, 611, 598, 572, 364, 559, 705, 653, 786, 601, 422, 237, 370, 318, 464, 659, 451, 425, 412, 399, 347, 613, 243, 191, 706, 680, 654, 602, 238, 801, 788, 775, 372, 567, 359, 426, 614, 661, 453, 349, 245, 708, 802, 617, 604, 591, 433, 407, 896, 792, 688, 480, 779, 675, 662, 454, 428, 376, 571, 363, 350, 246, 618, 665, 457, 804, 434, 249, 223, 712, 833, 781, 411, 677, 625, 599, 573, 365, 666, 458, 620, 250, 787, 436, 423, 371, 319, 834, 808, 782, 678, 626, 574, 465, 366, 413, 720, 707, 681, 668, 460, 655, 603, 252, 239, 789, 373, 836, 466, 440, 427, 414, 628, 615, 682, 709, 816, 803, 790, 605, 374, 897, 793, 689, 481, 468, 663, 455, 429, 377, 351, 247, 840, 736, 710, 684, 632, 619, 606, 805, 435, 898, 713, 794, 690, 482, 430, 378, 472, 667, 459, 806, 621, 251, 714, 437, 900, 848, 835, 809, 796, 692, 484, 783, 679, 627, 380, 575, 367, 721, 622, 669, 461, 438, 253, 716, 810, 837, 467, 441, 415, 629, 904, 722, 696, 488, 683, 670, 462, 254, 817, 791, 375, 864, 838, 812, 442, 630, 469, 841, 737, 724, 711, 685, 818, 633, 607, 912, 899, 496, 795, 691, 483, 470, 444, 431, 379, 842, 738, 686, 634, 473, 820, 807, 728, 715, 901, 849, 797, 693, 485, 381, 844, 474, 740, 636, 623, 439, 928, 902, 717, 850, 824, 811, 798, 694, 486, 382, 905, 723, 697, 489, 476, 671, 463, 255, 744, 718, 865, 852, 839, 813, 443, 631, 906, 698, 490, 725, 819, 866, 913, 814, 497, 471, 445, 960, 908, 856, 752, 843, 739, 726, 700, 492, 687, 635, 821, 914, 729, 868, 498, 446, 845, 475, 741, 822, 637, 730, 929, 916, 903, 851, 825, 500, 799, 695, 487, 383, 872, 846, 742, 638, 477, 930, 745, 732, 719, 826, 853, 920, 907, 504, 699, 491, 478, 746, 932, 880, 867, 854, 828, 815, 961, 909, 857, 753, 727, 701, 493, 748, 915, 869, 499, 447, 962, 936, 910, 858, 754, 702, 494, 823, 731, 870, 917, 501, 964, 873, 860, 756, 847, 743, 639, 944, 931, 918, 733, 827, 502, 874, 921, 505, 479, 968, 760, 747, 734, 933, 881, 855, 829, 922, 876, 506, 934, 749, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 946, 761, 735, 923, 877, 507, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 950, 765, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q270_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 145, 46, 192, 140, 88, 75, 261, 53, 146, 516, 100, 288, 77, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 290, 92, 79, 384, 280, 176, 267, 163, 150, 59, 522, 106, 153, 292, 200, 529, 321, 269, 165, 113, 87, 61, 576, 154, 524, 108, 275, 530, 322, 296, 270, 166, 114, 62, 208, 195, 169, 156, 143, 91, 277, 545, 532, 324, 519, 116, 103, 170, 197, 304, 291, 93, 278, 546, 385, 281, 177, 151, 640, 536, 328, 224, 523, 198, 172, 120, 107, 94, 293, 201, 386, 282, 178, 548, 577, 155, 525, 109, 294, 202, 388, 336, 531, 323, 297, 284, 180, 271, 167, 115, 63, 578, 552, 526, 209, 110, 157, 204, 298, 533, 325, 117, 392, 210, 580, 184, 171, 158, 305, 279, 768, 560, 352, 547, 534, 326, 300, 118, 641, 537, 329, 225, 212, 199, 173, 121, 306, 95, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 416, 205, 390, 338, 312, 299, 286, 182, 554, 393, 211, 581, 185, 159, 648, 232, 206, 769, 561, 353, 340, 535, 327, 301, 119, 394, 608, 582, 186, 556, 213, 307, 585, 770, 562, 354, 401, 302, 656, 448, 643, 396, 344, 240, 539, 331, 227, 214, 188, 175, 123, 586, 309, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 418, 220, 207, 314, 341, 408, 395, 609, 596, 583, 187, 557, 650, 234, 784, 771, 420, 368, 563, 355, 342, 316, 303, 610, 657, 558, 449, 397, 345, 241, 215, 189, 704, 652, 600, 587, 236, 403, 773, 565, 357, 658, 450, 424, 398, 346, 242, 612, 190, 311, 800, 219, 589, 774, 566, 358, 405, 777, 673, 660, 452, 647, 595, 569, 361, 348, 244, 543, 335, 231, 127, 616, 590, 432, 419, 221, 406, 315, 778, 674, 570, 362, 409, 597, 664, 456, 651, 248, 235, 222, 785, 421, 369, 343, 317, 832, 410, 780, 676, 624, 611, 598, 572, 364, 559, 705, 653, 601, 786, 237, 422, 370, 318, 464, 659, 451, 425, 412, 399, 347, 243, 613, 191, 706, 680, 654, 602, 238, 801, 788, 775, 372, 567, 359, 426, 614, 661, 453, 349, 245, 708, 617, 802, 604, 591, 433, 407, 896, 792, 688, 480, 779, 675, 662, 454, 428, 376, 571, 363, 350, 246, 618, 665, 457, 249, 434, 804, 223, 712, 833, 411, 781, 677, 625, 599, 573, 365, 666, 458, 250, 620, 787, 436, 423, 371, 319, 834, 808, 782, 678, 626, 574, 465, 366, 413, 720, 707, 681, 668, 460, 655, 603, 252, 239, 789, 373, 466, 836, 440, 427, 414, 628, 615, 682, 709, 816, 803, 605, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 714, 437, 900, 848, 835, 809, 796, 692, 484, 783, 679, 627, 380, 575, 367, 721, 622, 669, 461, 253, 438, 716, 810, 467, 837, 441, 415, 629, 904, 722, 696, 488, 683, 670, 462, 254, 817, 791, 375, 864, 838, 442, 812, 630, 469, 841, 737, 724, 711, 685, 633, 818, 607, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 928, 717, 902, 850, 824, 811, 798, 694, 486, 382, 905, 723, 697, 489, 476, 671, 463, 255, 744, 718, 865, 852, 839, 443, 813, 631, 906, 698, 490, 725, 819, 866, 913, 814, 497, 471, 445, 960, 908, 856, 752, 843, 739, 726, 700, 492, 687, 635, 821, 729, 914, 498, 868, 446, 475, 845, 741, 637, 822, 730, 929, 916, 903, 851, 825, 500, 799, 695, 487, 383, 872, 846, 742, 638, 477, 745, 930, 732, 719, 826, 853, 920, 907, 504, 699, 491, 478, 746, 932, 880, 867, 854, 828, 815, 961, 909, 857, 753, 727, 701, 493, 748, 915, 499, 869, 447, 962, 936, 910, 858, 754, 702, 494, 823, 731, 870, 917, 501, 964, 873, 860, 756, 847, 743, 639, 944, 931, 733, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 946, 735, 923, 507, 877, 970, 762, 948, 935, 883, 831, 977, 878, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q271_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 46, 145, 192, 140, 88, 75, 261, 53, 146, 516, 100, 288, 77, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 92, 290, 79, 384, 280, 176, 267, 163, 150, 59, 522, 106, 153, 292, 200, 529, 321, 269, 165, 113, 87, 61, 576, 154, 524, 108, 275, 530, 322, 296, 270, 166, 114, 62, 208, 195, 169, 156, 143, 91, 277, 545, 532, 324, 519, 116, 103, 170, 197, 304, 93, 291, 278, 546, 385, 281, 177, 151, 640, 536, 328, 224, 523, 198, 172, 120, 107, 94, 293, 201, 386, 282, 178, 548, 577, 155, 525, 109, 294, 202, 388, 336, 531, 323, 297, 284, 180, 271, 167, 115, 63, 578, 552, 526, 110, 209, 157, 204, 298, 533, 325, 117, 392, 210, 184, 580, 171, 158, 305, 279, 768, 560, 352, 547, 534, 326, 300, 118, 641, 537, 329, 225, 212, 199, 173, 121, 306, 95, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 416, 205, 390, 338, 312, 299, 286, 182, 554, 393, 211, 185, 581, 159, 648, 232, 206, 769, 561, 353, 340, 535, 327, 301, 119, 394, 608, 186, 582, 556, 213, 307, 585, 770, 562, 354, 302, 401, 656, 448, 643, 396, 344, 240, 539, 331, 227, 214, 188, 175, 123, 586, 309, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 220, 418, 207, 314, 341, 408, 395, 609, 596, 187, 583, 557, 650, 234, 784, 771, 420, 368, 563, 355, 342, 316, 303, 610, 558, 657, 449, 397, 345, 241, 215, 189, 704, 652, 600, 587, 236, 403, 773, 565, 357, 658, 450, 424, 398, 346, 242, 612, 190, 311, 800, 219, 589, 774, 566, 358, 405, 777, 673, 660, 452, 647, 595, 569, 361, 348, 244, 543, 335, 231, 127, 616, 590, 432, 221, 419, 406, 315, 778, 674, 570, 362, 409, 597, 664, 456, 651, 248, 235, 222, 785, 421, 369, 343, 317, 832, 410, 780, 676, 624, 611, 598, 572, 364, 559, 705, 653, 601, 786, 237, 422, 370, 318, 464, 659, 451, 425, 412, 399, 347, 243, 613, 191, 706, 680, 654, 602, 238, 801, 788, 775, 372, 567, 359, 426, 614, 661, 453, 349, 245, 708, 617, 604, 802, 591, 433, 407, 896, 792, 688, 480, 779, 675, 662, 454, 428, 376, 571, 363, 350, 246, 618, 665, 457, 249, 434, 804, 223, 712, 833, 411, 781, 677, 625, 599, 573, 365, 666, 458, 250, 620, 787, 436, 423, 371, 319, 834, 808, 782, 678, 626, 574, 366, 465, 413, 720, 707, 681, 668, 460, 655, 603, 252, 239, 789, 373, 466, 440, 836, 427, 414, 628, 615, 682, 709, 816, 605, 803, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 714, 437, 900, 848, 835, 809, 796, 692, 484, 783, 679, 627, 380, 575, 367, 622, 721, 669, 461, 253, 438, 716, 810, 467, 441, 837, 415, 629, 904, 722, 696, 488, 683, 670, 462, 254, 817, 791, 375, 864, 442, 838, 812, 630, 469, 841, 737, 724, 711, 685, 633, 818, 607, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 928, 717, 902, 850, 824, 811, 798, 694, 486, 382, 905, 723, 697, 489, 476, 671, 463, 255, 744, 718, 865, 852, 443, 839, 813, 631, 906, 698, 490, 725, 819, 866, 814, 913, 497, 471, 445, 960, 908, 856, 752, 843, 739, 726, 700, 492, 687, 635, 821, 729, 914, 498, 868, 446, 475, 845, 741, 637, 822, 730, 929, 916, 903, 851, 825, 500, 799, 695, 487, 383, 872, 846, 742, 638, 477, 745, 732, 930, 719, 826, 853, 920, 907, 504, 699, 491, 478, 746, 932, 880, 867, 854, 828, 815, 961, 909, 857, 753, 727, 701, 493, 748, 915, 499, 869, 447, 962, 936, 910, 858, 754, 702, 494, 823, 731, 870, 917, 501, 964, 873, 860, 756, 847, 743, 639, 944, 733, 931, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 946, 735, 923, 507, 877, 970, 762, 948, 935, 883, 831, 878, 977, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q272_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 46, 145, 192, 140, 88, 75, 261, 53, 146, 516, 100, 288, 77, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 92, 290, 79, 384, 280, 176, 267, 163, 150, 59, 522, 106, 153, 292, 200, 529, 321, 269, 165, 113, 87, 61, 576, 154, 524, 108, 275, 530, 322, 296, 270, 166, 114, 62, 208, 195, 169, 156, 143, 91, 277, 545, 532, 324, 519, 116, 103, 170, 197, 304, 93, 291, 278, 546, 385, 281, 177, 151, 640, 536, 328, 224, 523, 198, 172, 120, 107, 94, 293, 201, 386, 282, 178, 548, 577, 155, 525, 109, 294, 202, 388, 336, 531, 323, 297, 284, 180, 271, 167, 115, 63, 578, 552, 526, 110, 209, 157, 204, 298, 533, 325, 117, 392, 210, 184, 580, 171, 158, 305, 279, 768, 560, 352, 547, 534, 326, 300, 118, 641, 537, 329, 225, 212, 199, 173, 121, 306, 95, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 416, 205, 390, 338, 312, 299, 286, 182, 554, 393, 211, 185, 581, 159, 648, 232, 206, 769, 561, 353, 340, 535, 327, 301, 119, 394, 608, 186, 582, 556, 213, 307, 585, 770, 562, 354, 302, 401, 656, 448, 643, 396, 344, 240, 539, 331, 227, 214, 188, 175, 123, 586, 309, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 220, 418, 207, 314, 341, 408, 395, 609, 596, 187, 583, 557, 650, 234, 784, 771, 420, 368, 563, 355, 342, 316, 303, 610, 558, 657, 449, 397, 345, 241, 215, 189, 704, 652, 600, 587, 236, 403, 773, 565, 357, 658, 450, 424, 398, 346, 242, 612, 190, 311, 219, 800, 589, 774, 566, 358, 405, 777, 673, 660, 452, 647, 595, 569, 361, 348, 244, 543, 335, 231, 127, 616, 590, 432, 221, 419, 406, 315, 778, 674, 570, 362, 409, 597, 664, 456, 651, 248, 235, 222, 785, 421, 369, 343, 317, 832, 410, 780, 676, 624, 611, 598, 572, 364, 559, 705, 653, 601, 786, 237, 422, 370, 318, 464, 659, 451, 425, 412, 399, 347, 243, 613, 191, 706, 680, 654, 602, 238, 801, 788, 775, 372, 567, 359, 426, 614, 661, 453, 349, 245, 708, 617, 604, 802, 591, 433, 407, 896, 792, 688, 480, 779, 675, 662, 454, 428, 376, 571, 363, 350, 246, 618, 665, 457, 249, 434, 223, 804, 712, 833, 411, 781, 677, 625, 599, 573, 365, 666, 458, 250, 620, 787, 436, 423, 371, 319, 834, 808, 782, 678, 626, 574, 366, 465, 413, 720, 707, 681, 668, 460, 655, 603, 252, 239, 789, 373, 466, 440, 836, 427, 414, 628, 615, 682, 709, 816, 605, 803, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 714, 437, 900, 848, 835, 809, 796, 692, 484, 783, 679, 627, 380, 575, 367, 622, 721, 669, 461, 253, 438, 716, 810, 467, 441, 837, 415, 629, 904, 722, 696, 488, 683, 670, 462, 254, 817, 791, 375, 864, 442, 838, 812, 630, 469, 841, 737, 724, 711, 685, 633, 818, 607, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 928, 717, 902, 850, 824, 811, 798, 694, 486, 382, 905, 723, 697, 489, 476, 671, 463, 255, 744, 718, 865, 852, 443, 839, 813, 631, 906, 698, 490, 725, 819, 866, 814, 913, 497, 471, 445, 960, 908, 856, 752, 843, 739, 726, 700, 492, 687, 635, 821, 729, 914, 498, 868, 446, 475, 845, 741, 637, 822, 730, 929, 916, 903, 851, 825, 500, 799, 695, 487, 383, 872, 846, 742, 638, 477, 745, 732, 930, 719, 826, 853, 920, 907, 504, 699, 491, 478, 746, 932, 880, 867, 854, 828, 815, 961, 909, 857, 753, 727, 701, 493, 748, 915, 499, 869, 447, 962, 936, 910, 858, 754, 702, 494, 823, 731, 870, 917, 501, 964, 873, 860, 756, 847, 743, 639, 944, 733, 931, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 946, 735, 923, 507, 877, 970, 762, 948, 935, 883, 831, 878, 977, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q273_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 46, 145, 192, 140, 88, 75, 261, 53, 146, 516, 100, 288, 77, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 92, 290, 79, 384, 280, 176, 267, 163, 150, 59, 522, 106, 153, 292, 200, 529, 321, 269, 165, 113, 87, 61, 576, 154, 524, 108, 275, 530, 322, 296, 270, 166, 114, 62, 208, 195, 169, 156, 143, 91, 277, 545, 532, 324, 519, 116, 103, 170, 197, 304, 93, 291, 278, 546, 385, 281, 177, 151, 640, 536, 328, 224, 523, 198, 172, 120, 107, 94, 293, 201, 386, 282, 178, 548, 577, 155, 525, 109, 294, 202, 388, 336, 531, 323, 297, 284, 180, 271, 167, 115, 63, 578, 552, 526, 110, 209, 157, 204, 298, 533, 325, 117, 392, 210, 184, 171, 580, 158, 305, 279, 768, 560, 352, 547, 534, 326, 300, 118, 641, 537, 329, 225, 212, 199, 173, 121, 306, 95, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 416, 205, 390, 338, 312, 299, 286, 182, 554, 393, 211, 185, 581, 159, 648, 232, 206, 769, 561, 353, 340, 535, 327, 301, 119, 394, 608, 186, 582, 556, 213, 307, 585, 770, 562, 354, 302, 401, 656, 448, 643, 396, 344, 240, 539, 331, 227, 214, 188, 175, 123, 586, 309, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 220, 418, 207, 314, 341, 408, 395, 609, 187, 596, 583, 557, 650, 234, 784, 771, 420, 368, 563, 355, 342, 316, 303, 610, 558, 657, 449, 397, 345, 241, 215, 189, 704, 652, 600, 587, 236, 403, 773, 565, 357, 658, 450, 424, 398, 346, 242, 612, 190, 311, 219, 800, 589, 774, 566, 358, 405, 777, 673, 660, 452, 647, 595, 569, 361, 348, 244, 543, 335, 231, 127, 616, 590, 432, 221, 419, 406, 315, 778, 674, 570, 362, 409, 597, 664, 456, 651, 248, 235, 222, 785, 421, 369, 343, 317, 832, 410, 780, 676, 624, 611, 598, 572, 364, 559, 705, 653, 601, 786, 237, 422, 370, 318, 464, 659, 451, 425, 412, 399, 347, 243, 613, 191, 706, 680, 654, 602, 238, 801, 788, 775, 372, 567, 359, 426, 614, 661, 453, 349, 245, 708, 617, 604, 802, 591, 433, 407, 896, 792, 688, 480, 779, 675, 662, 454, 428, 376, 571, 363, 350, 246, 618, 665, 457, 249, 434, 223, 804, 712, 833, 411, 781, 677, 625, 599, 573, 365, 666, 458, 250, 620, 787, 436, 423, 371, 319, 834, 808, 782, 678, 626, 574, 366, 465, 413, 720, 707, 681, 668, 460, 655, 603, 252, 239, 789, 373, 466, 440, 427, 836, 414, 628, 615, 682, 709, 816, 605, 803, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 714, 437, 900, 848, 835, 809, 796, 692, 484, 783, 679, 627, 380, 575, 367, 622, 721, 669, 461, 253, 438, 716, 810, 467, 441, 837, 415, 629, 904, 722, 696, 488, 683, 670, 462, 254, 817, 791, 375, 864, 442, 838, 812, 630, 469, 841, 737, 724, 711, 685, 633, 818, 607, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 928, 717, 902, 850, 824, 811, 798, 694, 486, 382, 905, 723, 697, 489, 476, 671, 463, 255, 744, 718, 865, 443, 852, 839, 813, 631, 906, 698, 490, 725, 819, 866, 814, 913, 497, 471, 445, 960, 908, 856, 752, 843, 739, 726, 700, 492, 687, 635, 821, 729, 914, 498, 868, 446, 475, 845, 741, 637, 822, 730, 929, 916, 903, 851, 825, 500, 799, 695, 487, 383, 872, 846, 742, 638, 477, 745, 732, 930, 719, 826, 853, 920, 907, 504, 699, 491, 478, 746, 932, 880, 867, 854, 828, 815, 961, 909, 857, 753, 727, 701, 493, 748, 915, 499, 869, 447, 962, 936, 910, 858, 754, 702, 494, 823, 731, 870, 917, 501, 964, 873, 860, 756, 847, 743, 639, 944, 733, 931, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 946, 735, 923, 507, 877, 970, 762, 948, 935, 883, 831, 878, 977, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q274_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 46, 145, 192, 140, 88, 75, 261, 53, 146, 516, 100, 77, 288, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 92, 79, 290, 384, 280, 176, 267, 163, 150, 59, 522, 106, 153, 292, 200, 529, 321, 269, 165, 113, 87, 61, 154, 576, 524, 108, 275, 530, 322, 296, 270, 166, 114, 62, 208, 195, 169, 156, 143, 91, 277, 545, 532, 324, 519, 116, 103, 170, 197, 93, 304, 291, 278, 546, 385, 281, 177, 151, 640, 536, 328, 224, 523, 198, 172, 120, 107, 94, 293, 201, 386, 282, 178, 548, 155, 577, 525, 109, 294, 202, 388, 336, 531, 323, 297, 284, 180, 271, 167, 115, 63, 578, 552, 526, 110, 209, 157, 204, 298, 533, 325, 117, 392, 210, 184, 171, 158, 580, 305, 279, 768, 560, 352, 547, 534, 326, 300, 118, 641, 537, 329, 225, 212, 199, 173, 121, 95, 306, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 205, 416, 390, 338, 312, 299, 286, 182, 554, 393, 211, 185, 159, 581, 648, 232, 206, 769, 561, 353, 340, 535, 327, 301, 119, 394, 186, 608, 582, 556, 213, 307, 585, 770, 562, 354, 302, 401, 656, 448, 643, 396, 344, 240, 539, 331, 227, 214, 188, 175, 123, 309, 586, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 220, 207, 418, 314, 341, 408, 395, 187, 609, 596, 583, 557, 650, 234, 784, 771, 420, 368, 563, 355, 342, 316, 303, 610, 558, 657, 449, 397, 345, 241, 215, 189, 704, 652, 600, 587, 236, 403, 773, 565, 357, 658, 450, 424, 398, 346, 242, 190, 612, 311, 219, 589, 800, 774, 566, 358, 405, 777, 673, 660, 452, 647, 595, 569, 361, 348, 244, 543, 335, 231, 127, 616, 590, 221, 432, 419, 406, 315, 778, 674, 570, 362, 409, 597, 664, 456, 651, 248, 235, 222, 785, 421, 369, 343, 317, 410, 832, 780, 676, 624, 611, 598, 572, 364, 559, 705, 653, 601, 786, 237, 422, 370, 318, 464, 659, 451, 425, 412, 399, 347, 243, 191, 613, 706, 680, 654, 602, 238, 801, 788, 775, 372, 567, 359, 426, 614, 661, 453, 349, 245, 708, 617, 604, 591, 802, 433, 407, 896, 792, 688, 480, 779, 675, 662, 454, 428, 376, 571, 363, 350, 246, 618, 665, 457, 249, 223, 434, 804, 712, 411, 833, 781, 677, 625, 599, 573, 365, 666, 458, 250, 620, 787, 436, 423, 371, 319, 834, 808, 782, 678, 626, 574, 366, 465, 413, 720, 707, 681, 668, 460, 655, 603, 252, 239, 789, 373, 466, 440, 427, 414, 836, 628, 615, 682, 709, 605, 816, 803, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 437, 714, 900, 848, 835, 809, 796, 692, 484, 783, 679, 627, 380, 575, 367, 622, 721, 669, 461, 253, 438, 716, 810, 467, 441, 415, 837, 629, 904, 722, 696, 488, 683, 670, 462, 254, 817, 791, 375, 442, 864, 838, 812, 630, 469, 841, 737, 724, 711, 685, 633, 607, 818, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 717, 928, 902, 850, 824, 811, 798, 694, 486, 382, 905, 723, 697, 489, 476, 671, 463, 255, 744, 718, 443, 865, 852, 839, 813, 631, 906, 698, 490, 725, 819, 866, 814, 913, 497, 471, 445, 960, 908, 856, 752, 843, 739, 726, 700, 492, 687, 635, 821, 729, 914, 498, 446, 868, 475, 845, 741, 637, 822, 730, 929, 916, 903, 851, 825, 500, 799, 695, 487, 383, 872, 846, 742, 638, 477, 745, 732, 719, 930, 826, 853, 920, 907, 504, 699, 491, 478, 746, 932, 880, 867, 854, 828, 815, 961, 909, 857, 753, 727, 701, 493, 748, 915, 499, 447, 869, 962, 936, 910, 858, 754, 702, 494, 823, 731, 870, 917, 501, 964, 873, 860, 756, 847, 743, 639, 733, 944, 931, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 735, 946, 923, 507, 877, 970, 762, 948, 935, 883, 831, 878, 977, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023];

$Q275_1^{1024}$=[0, 1, 2, 4, 8, 16, 3, 5, 32, 6, 9, 10, 17, 64, 12, 18, 33, 20, 7, 34, 128, 24, 11, 36, 65, 13, 19, 66, 40, 14, 21, 68, 256, 48, 35, 22, 129, 25, 72, 37, 130, 26, 38, 132, 80, 67, 41, 28, 15, 42, 69, 136, 257, 49, 23, 512, 96, 70, 44, 73, 258, 50, 144, 131, 27, 74, 260, 52, 39, 133, 81, 29, 76, 264, 160, 134, 82, 56, 43, 30, 137, 513, 97, 84, 71, 45, 138, 272, 259, 51, 514, 98, 46, 145, 192, 140, 88, 75, 261, 53, 146, 516, 100, 77, 288, 262, 54, 265, 161, 148, 135, 83, 57, 31, 520, 104, 78, 266, 162, 58, 85, 152, 139, 273, 528, 320, 515, 268, 164, 112, 99, 86, 60, 47, 193, 141, 89, 274, 147, 517, 101, 194, 168, 142, 90, 289, 276, 263, 55, 544, 518, 102, 149, 521, 196, 105, 92, 79, 290, 384, 280, 176, 267, 163, 150, 59, 522, 106, 153, 292, 200, 529, 321, 269, 165, 113, 87, 61, 154, 576, 524, 108, 275, 530, 322, 296, 270, 166, 114, 62, 208, 195, 169, 156, 143, 91, 277, 545, 532, 324, 519, 116, 103, 170, 197, 93, 304, 291, 278, 546, 385, 281, 177, 151, 640, 536, 328, 224, 523, 198, 172, 120, 107, 94, 293, 201, 386, 282, 178, 548, 155, 577, 525, 109, 294, 202, 388, 336, 531, 323, 297, 284, 180, 271, 167, 115, 63, 578, 552, 526, 110, 209, 157, 204, 298, 533, 325, 117, 392, 210, 184, 171, 158, 580, 305, 279, 768, 560, 352, 547, 534, 326, 300, 118, 641, 537, 329, 225, 212, 199, 173, 121, 95, 306, 584, 400, 387, 283, 179, 549, 642, 538, 330, 226, 174, 122, 308, 295, 216, 203, 550, 389, 337, 285, 181, 644, 592, 579, 553, 540, 332, 228, 527, 124, 111, 205, 416, 390, 338, 312, 299, 286, 182, 554, 393, 211, 185, 159, 581, 648, 232, 206, 769, 561, 353, 340, 535, 327, 301, 119, 394, 186, 608, 582, 556, 213, 307, 585, 770, 562, 354, 302, 401, 656, 448, 643, 396, 344, 240, 539, 331, 227, 214, 188, 175, 123, 309, 586, 217, 402, 772, 564, 356, 551, 645, 593, 541, 333, 229, 125, 310, 218, 588, 417, 404, 391, 339, 313, 287, 183, 776, 672, 646, 594, 568, 360, 555, 542, 334, 230, 126, 649, 233, 220, 207, 418, 314, 341, 408, 395, 187, 609, 596, 583, 557, 650, 234, 784, 771, 420, 368, 563, 355, 342, 316, 303, 610, 558, 657, 449, 397, 345, 241, 215, 189, 704, 652, 600, 587, 236, 403, 773, 565, 357, 658, 450, 424, 398, 346, 242, 190, 612, 311, 219, 589, 800, 774, 566, 358, 405, 777, 673, 660, 452, 647, 595, 569, 361, 348, 244, 543, 335, 231, 127, 616, 590, 221, 432, 419, 406, 315, 778, 674, 570, 362, 409, 597, 664, 456, 651, 248, 235, 222, 785, 421, 369, 343, 317, 410, 832, 780, 676, 624, 611, 598, 572, 364, 559, 705, 653, 601, 237, 786, 422, 370, 318, 464, 659, 451, 425, 412, 399, 347, 243, 191, 613, 706, 680, 654, 602, 238, 801, 788, 775, 372, 567, 359, 426, 614, 661, 453, 349, 245, 708, 617, 604, 591, 802, 433, 407, 896, 792, 688, 480, 779, 675, 662, 454, 428, 376, 571, 363, 350, 246, 618, 665, 457, 249, 223, 434, 804, 712, 411, 833, 781, 677, 625, 599, 573, 365, 666, 458, 250, 620, 787, 436, 423, 371, 319, 834, 808, 782, 678, 626, 574, 366, 465, 413, 720, 707, 681, 668, 460, 655, 603, 252, 239, 789, 373, 466, 440, 427, 414, 836, 628, 615, 682, 709, 605, 816, 803, 790, 374, 897, 793, 689, 481, 468, 663, 455, 429, 377, 351, 247, 840, 736, 710, 684, 632, 619, 606, 435, 805, 713, 898, 794, 690, 482, 430, 378, 472, 667, 459, 251, 621, 806, 437, 714, 900, 848, 835, 809, 796, 692, 484, 783, 679, 627, 380, 575, 367, 622, 721, 669, 461, 253, 438, 716, 810, 467, 441, 415, 837, 629, 904, 722, 696, 488, 683, 670, 462, 254, 817, 791, 375, 442, 864, 838, 812, 630, 469, 841, 737, 724, 711, 685, 633, 607, 818, 912, 899, 496, 795, 691, 483, 470, 444, 431, 379, 842, 738, 686, 634, 473, 820, 807, 728, 715, 901, 849, 797, 693, 485, 381, 474, 844, 740, 636, 623, 439, 717, 928, 902, 850, 824, 811, 798, 694, 486, 382, 905, 723, 697, 489, 476, 671, 463, 255, 744, 718, 443, 865, 852, 839, 813, 631, 906, 698, 490, 725, 819, 866, 814, 913, 497, 471, 445, 960, 908, 856, 752, 843, 739, 726, 700, 492, 687, 635, 821, 729, 914, 498, 446, 868, 475, 845, 741, 637, 822, 730, 929, 916, 903, 851, 825, 500, 799, 695, 487, 383, 872, 846, 742, 638, 477, 745, 732, 719, 930, 826, 853, 920, 907, 504, 699, 491, 478, 746, 932, 880, 867, 854, 828, 815, 961, 909, 857, 753, 727, 701, 493, 748, 915, 499, 447, 869, 962, 936, 910, 858, 754, 702, 494, 823, 731, 870, 917, 501, 964, 873, 860, 756, 847, 743, 639, 733, 944, 931, 918, 827, 502, 874, 921, 505, 479, 968, 760, 747, 734, 933, 881, 855, 829, 922, 506, 876, 749, 934, 882, 830, 976, 963, 937, 924, 911, 859, 755, 508, 703, 495, 750, 884, 871, 938, 965, 861, 757, 945, 919, 503, 992, 966, 940, 888, 875, 862, 758, 969, 761, 735, 946, 923, 507, 877, 970, 762, 948, 935, 883, 831, 878, 977, 925, 509, 972, 764, 751, 885, 978, 952, 939, 926, 510, 886, 993, 980, 967, 941, 889, 863, 759, 947, 994, 942, 890, 984, 971, 763, 949, 996, 892, 879, 973, 765, 950, 979, 953, 927, 511, 1000, 974, 766, 887, 954, 981, 1008, 995, 982, 956, 943, 891, 985, 997, 893, 986, 951, 998, 894, 1001, 988, 975, 767, 955, 1002, 1009, 983, 957, 1004, 1010, 958, 987, 1012, 999, 895, 989, 1016, 1003, 990, 1005, 1011, 959, 1006, 1013, 1014, 1017, 991, 1018, 1020, 1007, 1015, 1019, 1021, 1022, 1023]; or $Q276_1^{1024}$=[0, 1, 2, 4, 8, 3, 16, 5, 6, 32, 9, 10, 17, 12, 64, 18, 7, 20, 33, 34, 11, 24, 128, 36, 13, 65, 19, 14, 40, 66, 21, 68, 22, 35, 48, 256, 25, 129, 72, 37, 26, 130, 38, 15, 28, 41, 67, 80, 132, 42, 69, 136, 23, 49, 257, 44, 70, 96, 512, 73, 50, 258, 27, 131, 144, 74, 39, 52, 260, 29, 81, 133, 76, 30, 43, 56, 82, 134, 160, 264, 137, 45, 71, 84, 97, 513, 138, 51, 259, 272, 46, 98, 514, 145, 75, 88, 140, 192, 53, 261, 146, 100, 516, 77, 54, 262, 288, 31, 57, 83, 135, 148, 161, 265, 78, 104, 520, 58, 162, 266, 85, 139, 152, 273, 47, 60, 86, 99, 112, 164, 268, 515, 320, 528, 89, 141, 193, 274, 147, 101, 517, 90, 142, 168, 194, 55, 263, 276, 289, 102, 518, 544, 149, 79, 92, 105, 196, 521, 290, 59, 150, 163, 267, 176, 280, 384, 106, 522, 153, 292, 200, 61, 87, 113, 165, 269, 321, 529, 154, 108, 524, 576, 275, 62, 114, 166, 270, 296, 322, 530, 91, 143, 156, 169, 195, 208, 277, 103, 116, 519, 324, 532, 545, 170, 93, 197, 278, 291, 304, 546, 151, 177, 281, 385, 94, 107, 120, 172, 198, 523, 224, 328, 536, 640, 293, 201, 178, 282, 386, 548, 155, 109, 525, 577, 294, 202, 63, 115, 167, 271, 180, 284, 297, 323, 531, 336, 388, 110, 526, 552, 578, 157, 209, 204, 298, 117, 325, 533, 158, 171, 184, 210, 392, 580, 279, 305, 118, 300, 326, 534, 547, 352, 560, 768, 95, 121, 173, 199, 212, 225, 329, 537, 641, 306, 584, 179, 283, 387, 400, 549, 122, 174, 226, 330, 538, 642, 295, 308, 203, 216, 550, 181, 285, 337, 389, 111, 124, 527, 228, 332, 540, 553, 579, 592, 644, 205, 182, 286, 299, 312, 338, 390, 416, 554, 159, 185, 211, 393, 581, 206, 232, 648, 119, 301, 327, 535, 340, 353, 561, 769, 186, 394, 556, 582, 608, 213, 307, 585, 302, 354, 562, 770, 401, 123, 175, 188, 214, 227, 331, 539, 240, 344, 396, 643, 448, 656, 309, 586, 217, 402, 551, 356, 564, 772, 125, 229, 333, 541, 593, 645, 310, 218, 588, 183, 287, 313, 339, 391, 404, 417, 126, 230, 334, 542, 555, 360, 568, 594, 646, 672, 776, 207, 220, 233, 649, 314, 418, 341, 187, 395, 408, 557, 583, 596, 609, 234, 650, 303, 316, 342, 355, 563, 368, 420, 771, 784, 558, 610, 189, 215, 241, 345, 397, 449, 657, 236, 587, 600, 652, 704, 403, 357, 565, 773, 190, 242, 346, 398, 424, 450, 658, 612, 311, 219, 589, 358, 566, 774, 800, 405, 127, 231, 335, 543, 244, 348, 361, 569, 595, 647, 452, 660, 673, 777, 590, 616, 221, 315, 406, 419, 432, 362, 570, 674, 778, 409, 597, 222, 235, 248, 651, 456, 664, 317, 343, 369, 421, 785, 410, 559, 364, 572, 598, 611, 624, 676, 780, 832, 237, 601, 653, 705, 318, 370, 422, 786, 191, 243, 347, 399, 412, 425, 451, 659, 464, 613, 238, 602, 654, 680, 706, 359, 567, 372, 775, 788, 801, 426, 614, 245, 349, 453, 661, 591, 604, 617, 708, 802, 407, 433, 246, 350, 363, 571, 376, 428, 454, 662, 675, 779, 480, 688, 792, 896, 618, 223, 249, 457, 665, 434, 804, 712, 411, 365, 573, 599, 625, 677, 781, 833, 250, 458, 666, 620, 319, 371, 423, 436, 787, 366, 574, 626, 678, 782, 808, 834, 413, 465, 239, 252, 603, 655, 460, 668, 681, 707, 720, 373, 789, 414, 427, 440, 466, 615, 628, 836, 682, 605, 709, 374, 790, 803, 816, 247, 351, 377, 429, 455, 663, 468, 481, 689, 793, 897, 606, 619, 632, 684, 710, 736, 840, 435, 805, 713, 378, 430, 482, 690, 794, 898, 251, 459, 667, 472, 621, 806, 437, 714, 367, 575, 380, 627, 679, 783, 484, 692, 796, 809, 835, 848, 900, 622, 253, 461, 669, 721, 438, 716, 810, 415, 441, 467, 629, 837, 254, 462, 670, 683, 488, 696, 722, 904, 375, 791, 817, 442, 630, 812, 838, 864, 469, 607, 633, 685, 711, 724, 737, 841, 818, 379, 431, 444, 470, 483, 691, 795, 496, 899, 912, 634, 686, 738, 842, 473, 807, 820, 715, 728, 381, 485, 693, 797, 849, 901, 474, 623, 636, 740, 844, 439, 717, 382, 486, 694, 798, 811, 824, 850, 902, 928, 255, 463, 671, 476, 489, 697, 723, 905, 718, 744, 443, 631, 813, 839, 852, 865, 490, 698, 906, 725, 819, 814, 866, 445, 471, 497, 913, 635, 687, 492, 700, 726, 739, 843, 752, 856, 908, 960, 821, 729, 446, 498, 914, 868, 475, 637, 741, 845, 822, 730, 383, 487, 695, 799, 500, 825, 851, 903, 916, 929, 638, 742, 846, 872, 477, 719, 732, 745, 826, 930, 853, 478, 491, 699, 504, 907, 920, 746, 815, 828, 854, 867, 880, 932, 493, 701, 727, 753, 857, 909, 961, 748, 447, 499, 915, 869, 494, 702, 754, 858, 910, 936, 962, 823, 731, 870, 501, 917, 639, 743, 847, 756, 860, 873, 964, 733, 502, 827, 918, 931, 944, 874, 479, 505, 921, 734, 747, 760, 968, 829, 855, 881, 933, 506, 922, 876, 749, 830, 882, 934, 495, 703, 508, 755, 859, 911, 924, 937, 963, 976, 750, 871, 884, 938, 757, 861, 965, 503, 919, 945, 758, 862, 875, 888, 940, 966, 992, 735, 761, 969, 946, 507, 923, 877, 762, 970, 831, 883, 935, 948, 878, 509, 925, 977, 751, 764, 972, 885, 510, 926, 939, 952, 978, 886, 759, 863, 889, 941, 967, 980, 993, 947, 890, 942, 994, 763, 971, 984, 949, 879, 892, 996, 765, 973, 950, 511, 927, 953, 979, 766, 974, 1000, 887, 954, 981, 891, 943, 956, 982, 995, 1008, 985, 893, 997, 986, 951, 894, 998, 767, 975, 988, 1001, 955, 1002, 957, 983, 1009, 1004, 958, 1010, 987, 895, 999, 1012, 989, 990, 1003, 1016, 1005, 959, 1011, 1006, 1013, 1014, 991, 1017, 1018, 1007, 1020, 1015, 1019, 1021, 1022, 1023].

The numbers 1, 2, 3, . . . , 275, and 276 after the letter "Q" are merely used to indicate different sequences, and have no special meanings.

It can be learned from the foregoing sequences that, if the mother code length is 1024 and there are 1024 channels, a channel whose sequence number is 0, a channel whose sequence number is 1, and a channel whose sequence number is 2 are ordered in ascending order of channel reliability, a channel whose sequence number is 0 has the smallest channel reliability. In addition, some of the 1024 channels further comply with one or more of the following rules:

a channel whose sequence number is 4 in the sorted sequence is the fourth one of channel reliability in ascending order; or a channel whose sequence number is 9 in the sorted sequence is the eleventh one of channel reliability in ascending order; or a channel whose sequence number is 1005 in the sorted sequence is the sixteenth one of channel reliability in descending order; or a channel whose sequence number is 1014 in the sorted sequence is the eleventh one of channel reliability in descending order; or a channel whose sequence number is 1015 in the sorted sequence is the fifth one in the of channel reliability in descending order; or a channel whose sequence number is 1019 in the sorted sequence is the fourth one of channel reliability in descending order; or a channel whose sequence number is 1021 in the sorted sequence is the third one of channel reliability in descending order; or a channel whose sequence number is 1022 in the sorted sequence is the second one of channel reliability in descending order a channel whose sequence number is 1023 in the sorted sequence is the first one of channel reliability in descending order.

It should be noted that the channels are numbered from 0 herein. In actual application, the channels may be numbered from 1. Certainly, the channels may also be numbered from another number. This is not limited in this embodiment.

Figure 5:
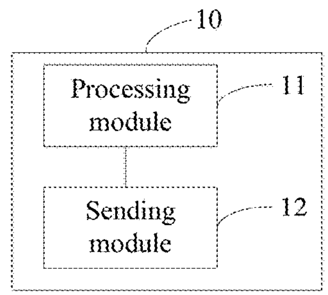
FIG. 5 is a schematic structural diagram of an encoding apparatus according to embodiments of this application.

FIG. 5 is a schematic structural diagram of an encoding apparatus 10 according to embodiments of this application. As shown in FIG. 5, the encoding apparatus 10 includes:

a processing module 11, configured to obtain a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted; where the processing module 11 is further configured to determine a position set based on the target construction sequence, where the position set is used to indicate positions of an information bit sequence on the channels; and the processing module 11 is further configured to encode a the information bit sequence based on the position set, to obtain an encoded bit sequence; and the sending module 12, configured to send the encoded bit sequence to a receive device.

The encoding apparatus provided in this embodiment is configured to implement the transmit device side technical solution provided in any one of the foregoing method embodiments. An implementation principle and a technical effect of the encoding apparatus are similar to those of the method embodiments, and details are not described herein again.

Based on the foregoing embodiments, the target construction sequence is a construction sequence obtained from a plurality of construction sequences.

Optionally, the plurality of construction sequences are sequences determined based on reliability of a plurality of channels that is calculated based on a mother code length and a preset coding parameter.

Optionally, the reliability is calculated based on a formula $$W_i = \sum_{j=0}^{n-1} \beta_j * \beta^j,$$

where $W_i$ is reliability of an $i^{th}$ channel, $j \in \{0,1, \ldots n-1\}$, $n=\log_2 N$, N is the mother code length, $B_j \in \{0,1\}$, β is a constant, and a value range of β is 1 to 1.62.

Optionally, the position set is P channels with highest reliability that are selected from the sorted sequence, and P is greater than or equal to a bit quantity of the information bits.

Optionally, the position set is L channels with highest reliability that are selected from the quantized sequence, and L is greater than or equal to a bit quantity of the information bits.

Optionally, if the mother code length is 64, the sorted sequence may be any one of $Q1_1^{64}$, $Q2_1^{64}$, $Q3_1^{64}$, $Q4_1^{64}$, $Q5_1^{64}$, and $Q6_1^{64}$, and for a specific form of the sorted sequence, refer to the description in the foregoing method embodiment.

If the quantized sequence is used as the construction sequence, when the mother code length is 64, the quantized sequence is any one of $Z1_1^{64}$, $Z2_1^{64}$, $Z3_1^{64}$, $Z4_1^{64}$, $Z5_1^{64}$, and $Z6_1^{64}$, and for a specific form of the quantized sequence, refer to the description in the foregoing method embodiment.

Optionally, if the mother code length is 1024 and there are 1024 channels, reliability of a channel whose sequence number is 0, reliability of a channel whose sequence number is 1, and reliability of a channel whose sequence number is 2 are arranged in normal order in the sorted sequence, with the first channel in the sorted sequence corresponding to the smallest reliability value.

Optionally, some of the 1024 channels further comply with one or more of the following rules:

a channel whose sequence number in the sorted sequence is 4 is the fourth one of channel reliability in ascending order; or a channel whose sequence number in the sorted sequence is 9 is the eleventh one of channel reliability in ascending order; or a channel whose sequence number in the sorted sequence is 1005 is the sixteenth one of channel reliability in descending order; or a channel whose sequence number in the sorted sequence is 1014 is the eleventh one of channel reliability in descending order; or a channel whose sequence number in the sorted sequence is 1015 is the fifth one of channel reliability in descending order; or a channel whose sequence number in the sorted sequence is 1019 is the fourth one of channel reliability in descending order; or a channel whose sequence number in the sorted sequence is 1021 is the third one of channel reliability in descending order; or a channel whose sequence number in the sorted sequence is 1022 is the second one of channel reliability in the sorted sequence in descending order; or a channel whose sequence number in the sorted sequence is 1023 is the first one of channel reliability in descending order.

The encoding apparatus provided in any one of the foregoing embodiments is configured to implement a technical solution of a transmit device side provided in any one of the foregoing method embodiments. An implementation principle and a technical effect of the encoding apparatus are similar to those of the method embodiments, and details are not described herein again.

Figure 6:
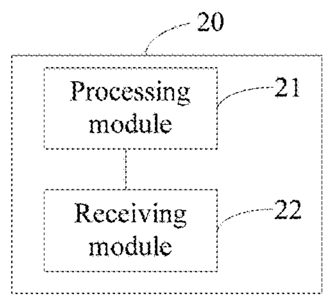
FIG. 6 is a schematic structural diagram of a decoding apparatus according to embodiments of this application.

FIG. 6 is a schematic structural diagram of a decoding apparatus 20 according to embodiments of this application. As shown in FIG. 6, the decoding apparatus 20 includes:

a processing module 21, configured to obtain a target construction sequence, where the target construction sequence includes a sorted sequence and/or a quantized sequence, the sorted sequence is a sequence obtained after sequence numbers of channels are sorted based on channel reliability, and the quantized sequence is obtained after results of channel reliability normalization are sorted; where the processing module 21 is further configured to determine a position set based on the target construction sequence, where the position set is used to indicate positions of an information bit sequence on the channels; and a receiving module 22, configured to receive an encoded bit sequence; where the processing module 21 is further configured to decode the encoded bit sequence based on the position set, to obtain an information bit sequence.

The decoding apparatus provided in this embodiment is configured to implement a technical solution of a receive device side provided in any one of the foregoing method embodiments. An implementation principle and a technical effect of the decoding apparatus are similar to those of the method embodiments, and details are not described herein again.

Based on the foregoing embodiments, the target construction sequence is a construction sequence obtained from a plurality of construction sequences.

Optionally, the plurality of construction sequences are sequences determined based on reliability of a plurality of channels that is calculated based on a mother code length and a preset coding parameter.

Optionally, the reliability is calculated based on a formula $$W_i = \sum_{j=0}^{n-1} \beta_j * \beta^j,$$

where $W_i$ is reliability of an $i^{th}$ channel, $j \in \{0,1, \ldots n-1\}$, $n=\log_2 N$, N is the mother code length, $B_j \in \{0,1\}$, β is a constant, and a value range of β is 1 to 1.62.

Optionally, the position set is P channels with highest reliability that are selected from the sorted sequence, and P is greater than or equal to a bit quantity of the information bits.

Optionally, the position set is L channels with highest reliability that are selected from the quantized sequence, and L is greater than or equal to a bit quantity of the information bits.

Optionally, if the mother code length is 64, the sorted sequence is any one of $Q1_1^{64}$, $Q2_1^{64}$, $Q3_1^{64}$, $Q4_1^{64}$, $Q5_1^{64}$, and $Q6_1^{64}$, and for a specific form of the sorted sequence, refer to the description in the foregoing method embodiment.

Optionally, if the mother code length is 64, the quantized sequence is any one of $Z1_1^{64}$, $Z2_1^{64}$, $Z3_1^{64}$, $Z4_1^{64}$, $Z5_1^{64}$, and $Z6_1^{64}$, and for a specific form of the quantized sequence, refer to the description in the foregoing method embodiment.

Optionally, if the mother code length is 1024 and there are 1024 channels, a channel whose sequence number is 0, a channel whose sequence number is 1, and a channel whose sequence number is 2 are ordered in normal order of channel reliability, wherein the channel whose sequence number is 0 has the smallest channel reliability.

Optionally, some of the 1024 channels further comply with one or more of the following rules:

a channel whose sequence number is 4 in the sorted sequence is the fourth one of channel reliability in ascending order; or a channel whose sequence number is 9 in the sorted sequence is the eleventh one of channel reliability in ascending order; or a channel whose sequence number is 1005 in the sorted sequence is the sixteenth one of channel reliability in descending order; or a channel whose sequence number is 1014 in the sorted sequence is the eleventh one of channel reliability in descending order; or a channel whose sequence number is 1015 in the sorted sequence is the fifth one of channel reliability in descending order; or a channel whose sequence number is 1019 in the sorted sequence is the fourth one of channel reliability in descending order; or a channel whose sequence number is 1021 in the sorted sequence is the third one in descending order; or a channel whose sequence number is 1022 in the sorted sequence is the second one of channel reliability in descending order; or a channel whose sequence number is 1023 in the sorted sequence is the first one of channel reliability in descending order.

The decoding apparatus provided in any one of the foregoing embodiments is configured to implement the receive device side technical solution provided in any one of the foregoing method embodiments. An implementation principle and a technical effect of the decoding apparatus are similar to those of the method embodiments, and details are not described herein again.

Figure 7:
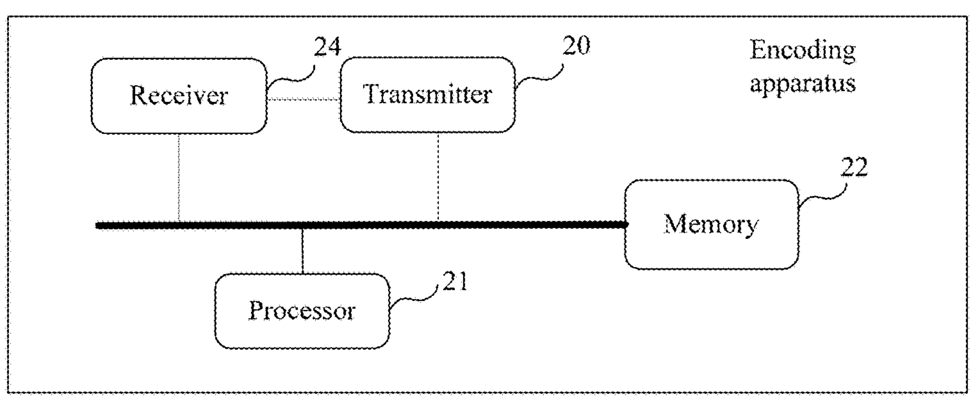
FIG. 7 is a schematic structural diagram of an encoding apparatus.

FIG. 7 is a schematic structural diagram of an encoding apparatus. A structure of a decoding apparatus is similar to a structure of the encoding apparatus. Referring to FIG. 7, it should be understood that the processing module in the foregoing encoding apparatus or decoding apparatus may be a processor 21 during specific implementation, and the processor 21 may be implemented by using hardware or software. When the processor is implemented by using hardware, the processor may be a logic circuit, and when the processor is implemented by using software, a computer program stored inside the processor may be read by using a general-purpose processor, or the function of the processing module may be implemented by reading a computer program stored in an external memory. A memory 22 may store various programs, to implement various processing functions and perform method steps in this embodiment.

The foregoing sending module may be a transmitter 20 during specific implementation, and the receiving module may be a receiver 24 during specific implementation.

Embodiments of this application further provides a storage medium, and the storage medium includes a readable storage medium and a computer program. The readable storage medium is configured to store the computer program, and the computer program includes code, to implement the encoding method provided in any one of the foregoing embodiments.

Embodiments of this application further provides a storage medium, and the storage medium includes a readable storage medium and a computer program. The readable storage medium is configured to store the computer program, and the computer program includes code, to implement the decoding method provided in any one of the foregoing embodiments.

Embodiments of this application further provides a program product, and the program product includes a computer program (that is, an executable instruction). The computer program includes code, to perform the encoding method provided in any one of the foregoing embodiments. At least one processor of a transmit device may read the computer program from the readable storage medium, and the at least one processor executes the computer program, so that the transmit device implements the encoding method provided in the foregoing implementations.

Embodiments of this application further provides a program product, and the program product includes a computer program (that is, an executable instruction). The computer program includes code, to perform the decoding method provided in any one of the foregoing embodiments. At least one processor of a receive device may read the computer program from the readable storage medium, and the at least one processor executes the computer program, so that the receive device implements the decoding method provided in the foregoing implementations.

During specific implementation of the transmit device or the receive device, it should be understood that the processor may be a central processing unit (CPU), or may be another general purpose processor, a digital signal processor (DSP), an application-specific integrated circuit ASIC), or the like. The general purpose processor may be a microprocessor or the processor may be any conventional processor, or the like. All or some steps for implementing the foregoing method embodiments may be completed by using program instruction-related hardware. The program may be stored in a readable memory. When the program runs, the steps of the foregoing method embodiments are performed. The foregoing memory (storage medium) includes: a read-only memory ROM), a RAM, a flash memory, a hard disk, a solid-state drive, a magnetic tape, a floppy disk, an optical disc, or any combination thereof.

The invention claimed is:

1. A method for polar coding, performed by a device in a wireless communication network, comprising:

obtaining an information bit sequence comprising K information bits;

polar encoding the information bit sequence based on a first sequence to obtain an encoded bit sequence, wherein the first sequence comprising sequence numbers of 1024 channels ordered in ascending order of channel reliability, wherein a channel whose sequence number is 0 is ranked first in channel reliability in the ascending order of channel reliability and has the least channel reliability among the 1024 channels, a channel whose sequence number is 1 is ranked second in channel reliability in the ascending order of channel reliability, and a channel whose sequence number is 2is ranked third in channel reliability in the ascending order of channel reliability; and outputting the encoded bit sequence.

2. The method according to claim 1, wherein polar encoding the information bit sequence based on a first sequence to obtain an encoded bit sequence comprises:

obtaining a second bit sequence according to the first sequence, wherein the second bit sequence has a length of N, and N>K;

determining positions of the K information bits according to the second bit sequence; and polar encoding the information bit sequence based on the position of the K information bits.

3. The method according to claim 2, wherein obtaining a second bit sequence according to the first sequence comprises:

identifying a subsequence of the first sequence, wherein the subsequence comprises N sequence numbers of channels whose sequence numbers are less than or equal to 1024.

4. The method according to claim 1, wherein the first sequence indicates that:

a channel whose sequence number is 4 is ranked fourth in channel reliability in the ascending order of channel reliability;

a channel whose sequence number is 9 is ranked eleventh in channel reliability in the ascending order of channel reliability;

a channel whose sequence number is 1014 is ranked $1014^{th}$ in channel reliability in the ascending order of channel reliability;

a channel whose sequence number is 1015 is ranked $1020^{th}$ in channel reliability in the ascending order of channel reliability;

a channel whose sequence number is 1019 is ranked $1021^{th}$ in channel reliability in the ascending order of channel reliability;

a channel whose sequence number is 1021 is ranked $1022^{nd}$ in channel reliability in the ascending order of channel reliability;

a channel whose sequence number is 1022 is ranked $1023^{rd}$ in channel reliability in the ascending order of channel reliability; and a channel whose sequence number is 1023 is ranked $1024^{th}$ in channel reliability in the ascending order of channel reliability.

5. The method according to claim 1, wherein polar encoding the information bit sequence comprises:

generating a binary row vector $u_1^N$, wherein $u_1^N=(u_1, u_2, \ldots, u_N)$, and wherein information bit-positions of the binary row vector $u_1^N$ are occupied by the information bit sequence; and encoding the binary row vector $u_1^N$, according to an encoding formula to obtain the encoded bit sequence, wherein the encoding formula is:

$$x_1^N=u_1^N G_N,$$

wherein $x_1^N=(x_1, x_2, \ldots, x_N)$ is the encoded bit sequence, and wherein $G_N$ is a polar code generating matrix of N row and N columns.

6. A device in a wireless communication network, comprising:

at least one processor; and a memory storing program instructions which, when executed by the at least one processor, cause the at least one processor to perform operations comprising:

obtaining an information bit sequence comprising K information bits;

polar encoding the information bit sequence based on a first sequence to obtain an encoded bit sequence, wherein the first sequence comprising sequence numbers of 1024 channels ordered in ascending order of channel reliability, wherein a channel whose sequence number is 0 is ranked first in channel reliability in the ascending order of channel reliability and has the least channel reliability among the 1024 channels, a channel whose sequence number is 1 is ranked second in channel reliability in the ascending order of channel reliability, and a channel whose sequence number is 2 is ranked third in channel reliability in the ascending order of channel reliability; and outputting the encoded bit sequence.

7. The device according to claim 6, wherein polar encoding the information bit sequence based on a first sequence to obtain an encoded bit sequence comprises:

obtaining a second bit sequence according to the first sequence, wherein the second bit sequence has a length of N, and N>K;

determining positions of the K information bits according to the second bit sequence; and polar encoding the information bit sequence based on the position of the K information bits.

8. The device according to claim 7, wherein, obtaining a second bit sequence according to the first sequence comprises:

identifying a subsequence of the first sequence, wherein the subsequence comprises N sequence numbers of channels whose sequence numbers are less than or equal to 1024.

9. The device according to claim 7, wherein the polar encoding comprises:

generating a binary row vector $u_1^N$, wherein $u_1^N=(u_1, u_2, \ldots, u_N$ and wherein information bit-positions of the binary row vector $u_1^N$ are occupied by the information bit sequence; and encoding the binary row vector $u_1^N$ according to an encoding formula to obtain the encoded bit sequence, wherein the encoding formula is:

$$x_1^N=u_1^NG_N,$$

wherein $x_1^N=(x_1,x_2, \ldots, x_N)$ is the encoded bit sequence, and wherein $G_N$ is a polar code generating matrix of N row and N columns.

10. The device according to claim 6, wherein: a channel whose sequence number is 4 is ranked fourth in channel reliability in the ascending order of channel reliability;

a channel whose sequence number is 9 is ranked eleventh in channel reliability in the ascending order of channel reliability;

a channel whose sequence number is 1014 is ranked $1014^{th}$ in channel reliability in the ascending order of channel reliability;

a channel whose sequence number is 1015 is ranked $1020^{th}$ in channel reliability in the ascending order of channel reliability;

a channel whose sequence number is 1019 is ranked $1021^{st}$ in channel reliability in the ascending order of channel reliability;

a channel whose sequence number is 1021 is ranked $1022^{nd}$ in channel reliability in the ascending order of channel reliability;

a channel whose sequence number is 1022 is ranked $1023^{rd}$ in channel reliability in the ascending order of channel reliability; and a channel whose sequence number is 1023 is ranked $1024^{th}$ in channel reliability in the ascending order of channel reliability.

11. The device according to claim 6, wherein the device is a base station or a user terminal.

12. A non-transitory computer readable medium storing program codes thereon for execution by at least one processor in a communication device, wherein the program codes comprise instructions for:

obtaining an information bit sequence comprising K information bits;

polar encoding the information bit sequence based on a first sequence to obtain an encoded bit sequence, wherein the first sequence comprises sequence numbers of 1024 channels ordered in ascending order of channel reliability, wherein a channel whose sequence number is 0 is ranked first in channel reliability in the ascending order of channel reliability and has the least channel reliability among the 1024 channels, a channel whose sequence number is 1 is ranked second in channel reliability in the ascending order of channel reliability, and a channel whose sequence number is 2 is ranked third in channel reliability in the ascending order of channel reliability;

and outputting the encoded bit sequence.

13. The non-transitory computer readable medium according to claim 12, wherein polar encoding the information bit sequence based on a first sequence to obtain an encoded bit sequence comprises:

obtaining a second bit sequence according to the first sequence, wherein the second bit sequence has a length of N, and N>K;

determining positions of the K information bits according to the second bit sequence; and polar encoding the information bit sequence based on the position of the K information bits.

14. The non-transitory computer readable medium according to claim 13, wherein obtaining a second bit sequence according to the first sequence comprises:

identifying a subsequence of the first sequence, wherein the subsequence comprises N sequence numbers of channels whose sequence numbers are less than or equal to 1024.

15. The non-transitory computer readable medium according to claim 12, wherein: a channel whose sequence number is 4 is ranked fourth in channel reliability in the ascending order of channel reliability;

a channel whose sequence number is 9 is ranked eleventh in channel reliability in the ascending order of channel reliability;

a channel whose sequence number is 1014 is ranked $1014^{th}$ in channel reliability in the ascending order of channel reliability;

a channel whose sequence number is 1015 is ranked $1020^{th}$ in channel reliability in the ascending order of channel reliability;

a channel whose sequence number is 1019 is ranked $1021^{st}$ in channel reliability in the ascending order of channel reliability;

a channel whose sequence number is 1021 is ranked 1022$^{nd}$ in channel reliability in the ascending order of channel reliability;

a channel whose sequence number is 1022 is ranked 1023$^{rd}$ in channel reliability in the ascending order of channel reliability; and a channel whose sequence number is 1023 is ranked 1024$^{th}$ in channel reliability in the ascending order of channel reliability.

16. The non-transitory computer readable medium according to claim 12, wherein the program codes comprise instructions for:

generating a binary row vector $u_1^N$, wherein $u_1^N=(u_1, u_2, \ldots, u_N)$, and wherein information bit-positions of the binary row vector $u_1^N$ are occupied by the information bit sequence; and encoding the binary row vector $u_1^N$ according to an encoding formula to obtain the encoded bit sequence, wherein the encoding formula is:

$$x_1^N=u_1^N G_N,$$

wherein $x_1^N=(x_1,x_2, \ldots, x_N)$ is the encoded bit sequence, and wherein $G_N$ is a polar code generating matrix of N row and N columns.

* * * * *